US007158050B2

(12) United States Patent
Lightbody et al.

(10) Patent No.: US 7,158,050 B2
(45) Date of Patent: Jan. 2, 2007

(54) REVENUE METER WITH FIBER CONNECTION

(75) Inventors: Simon H. Lightbody, British Columbia (CA); Peter C. Cowan, British Columbia (CA); David W. Giles, British Columbia (CA); Rene T. Jonker, British Columbia (CA); Markus F. Hirschbold, British Columbia (CA)

(73) Assignee: Power Measurement Ltd., Saanichton (CA)

(*) Notice: Subject to any disclaimer, the term of this patent is extended or adjusted under 35 U.S.C. 154(b) by 91 days.

(21) Appl. No.: 10/860,227

(22) Filed: Jun. 2, 2004

(65) Prior Publication Data

US 2005/0017874 A1 Jan. 27, 2005

Related U.S. Application Data

(63) Continuation of application No. 09/370,696, filed on Aug. 9, 1999, now Pat. No. 6,825,776.

(51) Int. Cl.
*G08B 23/00* (2006.01)

(52) U.S. Cl. .................... 340/870.02; 361/659; 702/57

(58) Field of Classification Search ........... 340/870.02; 361/659, 668; 702/57, 62
See application file for complete search history.

(56) References Cited

U.S. PATENT DOCUMENTS 4,077,061 A 2/1978 Johnston et al.
4,156,280 A 5/1979 Griess
4,240,149 A 12/1980 Fletcher et al.
4,259,746 A * 3/1981 Sandstedt ................... 398/115
4,298,839 A 11/1981 Johnston
4,345,311 A 8/1982 Fielden
4,365,302 A 12/1982 Elms
4,388,611 A 6/1983 Haferd
4,455,612 A 6/1984 Girgis et al.
4,459,546 A 7/1984 Arrington et al.
4,463,311 A 7/1984 Kobayashi
RE31,774 E 12/1984 Fletcher et al.
4,542,469 A 9/1985 Brandyberry et al.
4,568,934 A 2/1986 Allgood
4,612,617 A 9/1986 Laplace, Jr. et al.
4,642,564 A 2/1987 Hurley
4,663,587 A 5/1987 Mackenzie
4,672,555 A 6/1987 Hart et al.
4,715,000 A 12/1987 Premerlani
4,783,748 A 11/1988 Swarztrauber et al.
4,794,369 A 12/1988 Haferd
4,837,504 A 6/1989 Baer et al.

(Continued)

FOREIGN PATENT DOCUMENTS

WO WO 01/01079 1/2001

OTHER PUBLICATIONS

"7700 ION® 3-Phase Power Meter, Analyzer and Controller," *7700 ION™*, Power Measurement, Bulletin (Apr. 22, 1998).

(Continued)

*Primary Examiner*—Timothy Edwards, Jr.
(74) *Attorney, Agent, or Firm*—Brinks Hofer Gilson & Lione

(57) ABSTRACT

A revenue meter includes electronics for measuring the delivery of electrical energy from an energy supplier to a consumer through an electric circuit, a display and a cover. The electronics includes at least transducers, an analog to digital converter and logic. A meter cover encloses the revenue meter. Communications of data to and from the revenue meter may be done via a fiber optic communications link.

28 Claims, 282 Drawing Sheets

U.S. PATENT DOCUMENTS

| | | | |
|---|---|---|---|
| 4,839,819 A | 6/1989 | Begin et al. | |
| 4,843,311 A | 6/1989 | Rozman et al. | |
| 4,878,142 A | 10/1989 | Bergman et al. | |
| 4,878,185 A | 10/1989 | Brand et al. | |
| 4,884,021 A | 11/1989 | Hammond et al. | |
| 4,901,221 A | 2/1990 | Kodosky et al. | |
| 4,914,568 A | 4/1990 | Kodosky et al. | |
| 4,959,607 A | 9/1990 | Coryea et al. | |
| 4,979,122 A | 12/1990 | Davis et al. | |
| 5,017,860 A | 5/1991 | Germer et al. | |
| 5,059,896 A | 10/1991 | Germer et al. | |
| 5,061,890 A | 10/1991 | Langini | |
| 5,081,413 A | 1/1992 | Yamada et al. | |
| 5,122,735 A | 6/1992 | Porter et al. | |
| 5,132,610 A | 7/1992 | Ying-Chang | |
| 5,151,866 A | 9/1992 | Glaser et al. | |
| 5,155,836 A | 10/1992 | Jordan et al. | |
| 5,207,595 A | 5/1993 | Learmont et al. | |
| 5,212,441 A | 5/1993 | McEachern et al. | |
| 5,224,011 A | 6/1993 | Yalla et al. | |
| 5,224,054 A | 6/1993 | Wallis | |
| 5,233,538 A | 8/1993 | Wallis | |
| 5,243,536 A | 9/1993 | Bradford | |
| 5,243,537 A | 9/1993 | Neumann | |
| 5,245,275 A | 9/1993 | Germer et al. | |
| 5,247,454 A | 9/1993 | Farrington et al. | |
| 5,258,704 A | 11/1993 | Germer et al. | |
| 5,262,715 A | 11/1993 | King et al. | |
| 5,270,640 A | 12/1993 | Kohler et al. | |
| 5,301,121 A | 4/1994 | Garverich et al. | |
| 5,391,983 A | 2/1995 | Lusigman et al. | |
| 5,414,812 A | 5/1995 | Filip et al. | |
| 5,426,780 A | 6/1995 | Gerull et al. | |
| 5,481,700 A | 1/1996 | Thuraisingham | |
| 5,498,956 A | 3/1996 | Kinney et al. | |
| 5,514,959 A | 5/1996 | Horan et al. | |
| 5,537,029 A | 7/1996 | Hemminger et al. | |
| 5,548,527 A | 8/1996 | Hemminger et al. | |
| 5,549,089 A | 8/1996 | Snell et al. | |
| 5,555,508 A | 9/1996 | Munday et al. | |
| 5,627,759 A | 5/1997 | Bearden et al. | |
| 5,631,843 A | 5/1997 | Munday et al. | |
| 5,650,936 A | 7/1997 | Loucks et al. | |
| 5,736,847 A | 4/1998 | Van Doorn et al. | |
| 5,745,114 A | 4/1998 | King et al. | |
| 5,828,576 A | 10/1998 | Loucks et al. | |
| 6,000,034 A | 12/1999 | Lightbody et al. | |
| 6,018,700 A * | 1/2000 | Edel | 702/60 |
| 6,124,806 A | 9/2000 | Cunningham et al. | |
| 6,271,523 B1 * | 8/2001 | Weaver et al. | 250/341.8 |
| 6,429,785 B1 | 8/2002 | Griffin | |

OTHER PUBLICATIONS

"American National Standard for Electric Meters—Code for Electricity Metering," *American National Standard*, Document ANSI C12.1 (1995).

"American National Standard for Electromechanical Watthour Meters," *The Institute of Electrical and Electronics Engineers, Inc.*, ANSI C12 (1987) (Revision of ANSI C12-10-1987).

"American National Standard for Electronic Time-of-Use Registers for Electricity Meters," *The Institute of Electrical and Electronics Engineers, Inc.*, ANSI C12 (Revision of ANSI C12 13-1985) (1991).

"American National Standard for Solid-State Electricity Meters," *The Institute of Electrical and Electronics Engineers, Inc.*, ANSI C12.16 (1991).

"American National Standard for Electricity Meters 0.2 and 0.5 Accuracy Classes," *American National Standards*, ANSI C12.20 (1998).

"ISO—Specification MTR1-96, Engineering Specification For Polyphase Solid-State Electricity Meters For Use On The ISO Grid," Exhibit A, pp. 1-42 (1997).

"Specifications For Approval Of Type of Electricity Meters, Instrument Transformers And Auxiliary Devices," *Consumer and Corporate Affairs Canada*.

International Standard, Alternating current static watt-hour meters for active energy (classes 0,2 S and 0,5 S), *International Electrotechnical Commission*, second edition (1992).

"Meter-Mounting Devices, Industrial Products," *Canadian Standards Association*, C22.2 No. 115-M (1989).

"Alternating-Current Electricity Metering, Electric Power Systems and Equipment," *Canadian Standards Association*, CAN3-C17-M (1984).

International Standard, Amendment 1 to Publication 868 (1986), *International Electrotechnical Commission*, Modification 1 (1986).

"International Standard, Electromagnetic Compatibility (EMC)—Part 4: Testing and measurement techniques—Section 15: Flickermeter—Functional and design specifications," *International Electrotechnical Commission*, 61000 4-15 (1997).

"Measurement Guide for Voltage Characteristics—Electricity Product Characteristics and Electromagnetic Compatibility," 230.02 *Norcomp, Unipede* (1995).

"Voltage characteristics of electricity supplied by public distribution systems," *BSI Standards*, 50160 (1995).

"Minutes of the 7th Meeting, Distribution Committee," *EEI*, 1998.

Quantum® Q1000 "Sandy Creek Plant Lonworks® Communication" brochure, © Copyright 1997 Schlumberger Industries, Inc., MK/1662/9-97, pp. 1-4.

Schlumberger Electricity "One of your largest customers is concerned about power quality . . . " brochure, © Copyright 1996 Schlumberger Industries, Inc., PP1633/6-96m pp. 1-5.

Schlumberger "Quantum® Q100 Multimeasurement Meter Technical Reference Guide," Effective Oct. 1999, © Copyright 1999, Schlumberger Resource Management Services, Inc.

"QUAD4® Plus and MAXsys™ Multifunction Electronic Meters and IEDS," On-Line User Guide, *QUAD4 Plus/MAXsys Products User's Guide*, Rev 1.01, pp. 1-1-1-4; 1-13-1-15; 4-100, 4-107-4-108.

"QUAD4® Plus and MAXsys™ Multifunction Electronic Meters and IEDS", On-Line User Guide Product Definitions, *QUAD4 Plus/MAXsys Products User's Guide*, Rev 1.01, pp. DEF-1-DEF-13.

GE kV2™ Malfunction Meter, Product Description, Operating Instructions, Maintenance Instructions, Upgrading, Site Analysis Guides, Diagrams, pp. 1-1-2-32, Dec. 2000.

"Protective Relaying Theory and Applications," edited by Walter A. Elmore, pp. 17-37 (1994).

"The world is changing. The old answers no longer apply," *Schlumberger*, Bulletin.

"Series PM170 Powermeters," *SATEC*, Bulletin.

"System 270 Powermeter," *SATEC*, Bulletin.

"RPM090 Digital Transducer," *SATEC*, Bulletin.

"Series 290 Power Monitoring System," *SATEC*, Bulletin.

"PM290HD Powermeter With Harmonic Analysis," *SATEC*, Bulletin.

"AX-7 Analog Expander," *SATEC*, Bulletin.

"Application Software, Professional Systems For Energy Control And Management," *SATEC*, Bulletin.

"Power Monitoring And Analysis Systems," *SATEC*, Bulletin.

"PM—295 Powermeter / Harmonic Analyzer," *SATEC*, Bulletin.

"PM 295 Power Monitoring System with Harmonic Analysis," *SATEC*, Bulletin.

"PM 170M Powermeter—with KVA Measurements," *SATEC*, Bulletin.

"Vector Electricity Meter with the Site Genie™ Monitor," *General Electric*.

"VECTRON® SVX Solid-State Polyphase Meters," *Schlumberger*, Bulletin 11314 (Mar. 1996).

"MAXsys® 2510 Substation/High-End Direct Access Meter," *Siemens*, Bulletin.

"MAXsys® 2410 Direct Access Meter," *Siemens*, Bulletin.

"AIN ALPHA® Meter For IEC Standards," *ABB Information Systems*, Bulletin.
"ALPHA Stars™, National Wireless Communications for Remote Metering," *ABB Information Systems*, Bulletin.
"AIN Alpha, High Function Multi-Tariff Solid State Electricity Meter," *ABB Networker Partner*, PB 42-280-lb, pp. 1-20.
"MARK-V Digital True RMS Energy Meter," *TransData, Inc.*, Bulletin.
"MAXsys®—PSI," *Siemens*, Bulletin.
"MeterView™ Software Environment . . . , . . . Instant Access to Maxsys™ Meter Information," *Siemens*, D00024D (1997).
"MAXsys®—Multi-Access Metering And Control," *Siemens*, Bulletin.
"MAXsys® For Energy Providers," *Siemens*, Bulletin.
QUAD4® Plus and MAXsys® Meters and IEDs, *Siemens*, QUAD2DSQ (1998).
The QUAD4® *Plus* Solid-State Meter, *PSI*, Bulletin.
"kV Telephone Modem," *General Electric*, Bulletin.
"kV A-Base Meters," *General Electric*, Bulletin.
"kV Class 320 Meters," *General Electric*, Bulletin.
"EnergyAxis™ Customer Site Metering System For On-Site Metering and Power Analysis,", *ABB Information Systems*, Bulletin (1998).
"8500 ION® Direct Access Billing Meter," *8500 ION™*, Power Measurement, Bulletin (Aug. 11, 1998).
"7700 ION® 3-Phase Power Meter, Analyzer and Controller," *7700 ION™*, Power Measurement, Bulletin (Apr. 22, 1998).
"American National Standard for Electric Meters—Code for Electricity Metering," *American National Standard*, Document ANSI C12.1 (1995).
"American National Standard for Electromechanical Watthour Meters," *The Institute of Electrical and Electronics Engineers, Inc.*, ANSI C12 (1987) (Revision of ANSI C12-10-1987).
"American National Standard for Electronic Time-of-Use Registers for Electricity Meters," *The Institute of Electrical and Electronics Engineers, Inc.*, ANSI C12 (Revision of ANSI C12 13-1985) (1991).
"American National Standard for Solid-State Electricity Meters," *The Institute of Electrical and Electronics Engineers, Inc.*, ANSI C12.16 (1991).
"American National Standard for Electricity Meters 0.2 and 0.5 Accuracy Classes," *American National Standards*, ANSI C12.20 (1998).
"ISO—Specification MTR1-96, Engineering Specification For Polyphase Solid-State Electricity Meters For Use On The ISO Grid," Exhibit A, pp. 1-42 (1997).
"Specifications For Approval Of Type of Electricity Meters, Instrument Transformers And Auxiliary Devices," *Consumer and Corporate Affairs Canada*.
International Standard, Alternating current static watt-hour meters for active energy (classes 0,2 S and 0,5 S), *International Electrotechnical Commission*, second edition (1992).
"Meter-Mounting Devices, Industrial Products," *Canadian Standards Association*, C22.2 No. 115-M (1989).
"Alternating-Current Electricity Metering, Electric Power Systems and Equipment," *Canadian Standards Association*, CAN3-C17-M (1984).
International Standard, Amendment 1 to Publication 868 (1986), *International Electrotechnical Commission*, Modification 1 (1986).
"International Standard, Electromagnetic Compatibility (EMC)—Part 4: Testing and measurement techniques—Section 15: Flickermeter—Functional and design specifications," *International Electrotechnical Commission*, 61000 4-15 (1997).
"Measurement Guide for Voltage Characteristics—Electricity Product Characteristics and Electromagnetic Compatibility," 230.02 *Norcomp, Unipede* (1995).
"Voltage characteristics of electricity supplied by public distribution systems," *BSI Standards*, 50160 (1995).
"Minutes of the 7th Meeting, Distribution Committee," *EEI*, 1998.

* cited by examiner

FIG. 28d
To Fig. 28e
S-053C
S-053C.
To Fig. 28a
To Fig. 28g

To Fig. 30f
To Fig. 30b
To Fig. 30d
To Fig. 30h
MAIN PROCESSOR'S RESETS AND BACK
DRAM.1MX16.EDO.5V.SOJ-42
DRAM.1MX16.EDO.5V.SOJ-42
Bypass caps. One per power pin
Bypass caps. One per power pin
VCC
VCC
VCPU
C7
C8
C9
C10
C11
C12
100NF.50V.C.SM
100NF.50V.C.SM
/BS A0
/BS A1
/CS DRM1
/WE DRM To Fig. 30e To Fig. 30k To Fig. 30g To Fig. 30l To Fig. 30j To Fig. 31h To Fig. 31h To Fig. 32b To Fig. 32c To Fig. 32e To Fig. 32a To Fig. 32b To Fig. 32f To Fig. 32l To Fig. 32h To Fig. 32k To Fig. 32g To Fig. 32l To Fig. 32h To Fig. 32j To Fig. 32i To Fig. 32k To Fig. 33b To Fig. 33c To Fig. 33e To Fig. 33a To Fig. 33f To Fig. 33b To Fig. 33k To Fig. 33g To Fig. 33l To Fig. 33h To Fig. 33j To Fig. 33j To Fig. 33k To Fig. 34c To Fig. 34a To Fig. 34e To Fig. 34i To Fig. 34g To Fig. 34l To Fig. 34j To Fig. 34k To Fig. 35b To Fig. 36b To Fig. 36d To Fig. 36b To Fig. 36i To Fig. 36e To Fig. 36k To Fig. 36g To Fig. 36l To Fig. 36h To Fig. 36j To Fig. 37b To Fig. 37h To Fig. 37k To Fig. 37l To Fig. 37h To Fig. 37j To Fig. 37k To Fig. 38b To Fig. 38b To Fig. 38k To Fig. 38g To Fig. 38l To Fig. 38h To Fig. 38j To Fig. 38i To Fig. 38k To Fig. 39b To Fig. 39d To Fig. 39b To Fig. 39e To Fig. 39h To Fig. 39k To Fig. 39g To Fig. 39l To Fig. 39h To Fig. 39j To Fig. 39k To Fig. 40b To Fig. 40d To Fig. 40c To Fig. 40a To Fig. 40f To Fig. 40d To Fig. 40e To Fig. 40k To Fig. 40l To Fig. 40h To Fig. 40j

REVENUE METER WITH FIBER CONNECTION

CROSS REFERENCE TO RELATED APPLICATIONS

This application is a continuation of U.S. patent application Ser. No. 09/370,696 filed Aug. 9, 1999, now U.S. Pat. No. 6,825,776 entitled "External I/O and Communications Interface for a Revenue Meter" the entire disclosure of which including the appendices is hereby incorporated by reference. U.S. patent application Ser. No. 09/370,696 incorporated by reference the following U.S. patent applications which were filed on same date as that Application, and which are also hereby incorporated by reference:

U.S. patent application Ser. No. 09/370,317, "REVENUE METER WITH POWER QUALITY FEATURES", filed Aug. 9, 1999, now U.S. Pat. No. 6,615,147.

U.S. patent application Ser. No. 09/371,883, "A-BASE REVENUE METER WITH POWER QUALITY FEATURES", filed Aug. 9, 1999, now U.S. Pat. No. 6,493,644.

U.S. patent application Ser. No. 09/370,695, "REVENUE METER WITH GRAPHIC USER INTERFACE", filed Aug. 9, 1999 (abandoned).

U.S. patent application Ser. No. 09/370,686, "REVENUE METER BLADE ASSEMBLY AND METHOD OF ATTACHMENT", filed Aug. 9, 1999, now U.S. Pat. No. 6,186,842.

U.S. patent application Ser. No. 09/370,863, "A POWER SYSTEM TIME SYNCHRONIZATION DEVICE AND METHOD FOR SEQUENCE OF EVENT RECORDING", filed Aug. 9, 1999, now U.S. Pat. No. 6,611,922.

U.S. patent application Ser. No. 09/369,870, "METHOD AND APPARATUS FOR AUTOMATICALLY CONTROLLED GAIN SWITCHING OF POWER MONITORS", filed Aug. 9, 1999, now U.S. Pat. No. 6,397,155.

U.S. patent application Ser. No. 09/370,757, "A KEYPAD FOR A REVENUE METER", filed Aug. 9, 1999 (pending).

REFERENCE TO MICROFICHE APPENDIX

A microfiche appendix, Appendix A, is incorporated by reference above of a computer program listing. The total number of microfiche is 6. The total number of frames is 186. A second microfiche appendix, Appendix B, is also incorporated by reference above of schematic diagrams. The total number of microfiche is 1 and the total number of frames is 23.

REFERENCE TO COMPUTER PROGRAM LISTINGS SUBMITTED ON COMPACT DISK

A compact disk appendix is included containing computer program code listings pursuant to 37 C.F.R. 1.52(e) and is hereby incorporated by reference. The compact disk contains program code files in ASCII format. The total number of compact disks is 1 and the files included on the compact disk are as follows:

| Creation Date | Creation Time | File Size (Bytes) | File Name |
|---|---|---|---|
| Jun. 1, 2004 | 4:20 pm | 3,911 kb | v202fin.txt |

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

Generally, this invention relates to revenue meters of the type used by energy suppliers to accurately measure electrical energy delivered to consumers. More particularly, this invention relates to improved interfacing of the revenue meters.

BACKGROUND OF THE INVENTION

In a typical electrical distribution system, an electrical supplier or utility company generates electrical energy and distributes the electrical energy to consumers via a power distribution network. The power distribution network is the network of electrical distribution wires which link the electrical supplier to its consumers. At the consumer's facility, there will typically be an electrical energy meter (revenue meter) connected between the consumer and the power distribution network to measure the consumer's electrical demand. The revenue meter is an electrical energy measurement device which accurately measures the amount of electrical energy flowing to the consumer from the supplier. The amount of electrical energy measured by the meter is then used to determine the amount required to compensate the energy supplier.

Typically, the electrical energy is delivered to the customers as an alternating current ("AC") voltage that approximates a sine wave over a time period. The term "alternating waveform" generally describes any symmetrical waveform, including square, sawtooth, triangular, and sinusoidal waves, whose polarity varies regularly with time. The term "AC" (i.e., alternating current), however, almost always means that the current is produced from the application of a sinusoidal voltage, i.e., AC voltage. The expected frequency of the AC voltage, e.g., 50 Hertz ("Hz"), 60 Hz, or 400 Hz, is usually referred to as the "fundamental" frequency. Integer multiples of this fundamental frequency are usually referred to as harmonic frequencies.

While the fundamental frequency is the frequency that the electrical energy is expected to arrive with, various distribution system and environmental factors can distort the fundamental frequency, i.e., harmonic distortion, can cause spikes, surges, or sags, and can cause blackouts, brownouts, or other distribution system problems. These problems can greatly affect the quality of power received by the power customer at its facility or residence as well as make accurate determination of the actual energy delivered to the customer very difficult.

In order to solve these problems, socket based revenue meters have been developed to provide improved techniques for accurately measuring the amount of power used by the customer so that the customer is charged an appropriate amount and so that the utility company receives appropriate compensation for the power delivered and used by the customer.

To provide user input to the revenue meter, known meters typically utilize cumbersome keys or buttons located within a sealed cover of the revenue meter, or keys which are accessible from the outside but are sealed and cannot be activated without removing the seal. In both cases, at least one security seal is installed to prevent or indicate unauthorized access. Thus, the seal must be replaced every time the meter is accessed via the keys or buttons.

In addition, a problem exists when keys are added to the meter cover to mechanically actuate the interface of the revenue meter since tolerances in both the manufactured parts and the assembly process can cause an internal structure of the assembled revenue meter to misalign with the cover, for example, lean and twist with relation to the cover, resulting in misalignment of the mechanical actuators with the actual interface of the meter. Therefore, it is important to line up the keys/mechanical actuators on the cover with the appropriate buttons on the revenue meter.

Also, with the increasing complexity of revenue meters, usability has often been restricted by the user interface. Available systems permit the user to customize the data which can be viewed from the meter only with auxiliary devices. In available meters, a user can program the viewed data with an auxiliary device, such as a computer or calibration equipment. Such modifications often cannot be done easily in the field.

Accordingly, there is a need to provide a device with a user interface that allows the user to easily program various desired features for the device and provides a means to display various selected calculations and results generated by the meter.

In addition there is a need for an improved revenue meter that provides easily accessible and easy to use interfaces.

SUMMARY OF THE INVENTION

The present invention is defined by the following claims, and nothing in this section should be taken as a limitation on those claims. By way of introduction, one embodiment described below relate to a revenue meter for measuring the delivery of electrical energy from an energy supplier to a consumer through an electric circuit. The revenue meter includes bayonet terminals disposed on the meter, the terminals being mateable with matching jaws of a detachable meter mounting device. The revenue meter further includes a base coupled with the bayonet terminals and a cover coupled with the base, thereby preventing physical access to the meter. The revenue meter further includes at least one sensor operative to be coupled with the electric circuit and operative to sense at least current in the electric circuit and generate at least one analog signal indicative thereof. The revenue meter further includes a microprocessor coupled with the current sensor and operative to receive the at least one digital sample and compute at least one value therefrom. The revenue meter further includes a fiber optic communications link, coupled to the microprocessor.

Further aspects and advantages of the invention are discussed below in conjunction with the preferred embodiments.

DETAILED DESCRIPTION OF THE INVENTION

The disclosed embodiments provide easily accessible and easy to use interfaces that include a front panel keypad, and I/O and communications connections. The keypad allows a user to interact with the meter without requiring a breach to a security seal. For example, the user may need to access a central processing unit (CPU) of the revenue meter to program the meter, to retrieve revenue data, and to retrieve power quality data. In addition, the interface provides an external I/O and communication interface that is expandable and not limited to the number of conductors leaving the revenue meter. Moreover, connection to, and detachment from, the interface is simplified through the use of a single cable protruding from the revenue meter to create the connection.

The disclosed embodiments relate to revenue accurate electrical meters, including revenue meters with highly accurate and detailed power quality event detection, monitoring and quantification. It will be recognized by those skilled in the art that, although preferred, the highly accurate and detailed power quality event detection, monitoring and quantification are not necessary for the disclosed embodiments. Herein, the phrase "coupled with" is defined to mean directly coupled with or indirectly coupled with through one or more intermediate components.

Revenue meters must comply with American National Standards Institute's (ANSI) Standards for electric meters which include, but are not limited to, the following:

ANSI C12.1 (1995): American National Standard for Electric Meters-Code for Electricity Metering ANSI C12.10 (1987): American National Standard for Electromechanical Watthour Meters ANSI C12.13 (1991): American National Standard for Electronic Time of Use Registers for Electricity Meters ANSI C12.16 (1991): American National Standard for Solid-State Electricity Meters ANSI C12.20 (1998): American National Standard for Electricity Meters 0.2 and 0.5 Accuracy Classes All of which are known in the art and are herein incorporated by reference.

Other specification/standards which apply to revenue meters include ISO Specification MTR1-96, "Engineering Specification for Polyphase Solid State Electricity Meters for Use on the ISO Grid," herein incorporated by reference.

Figure 1:
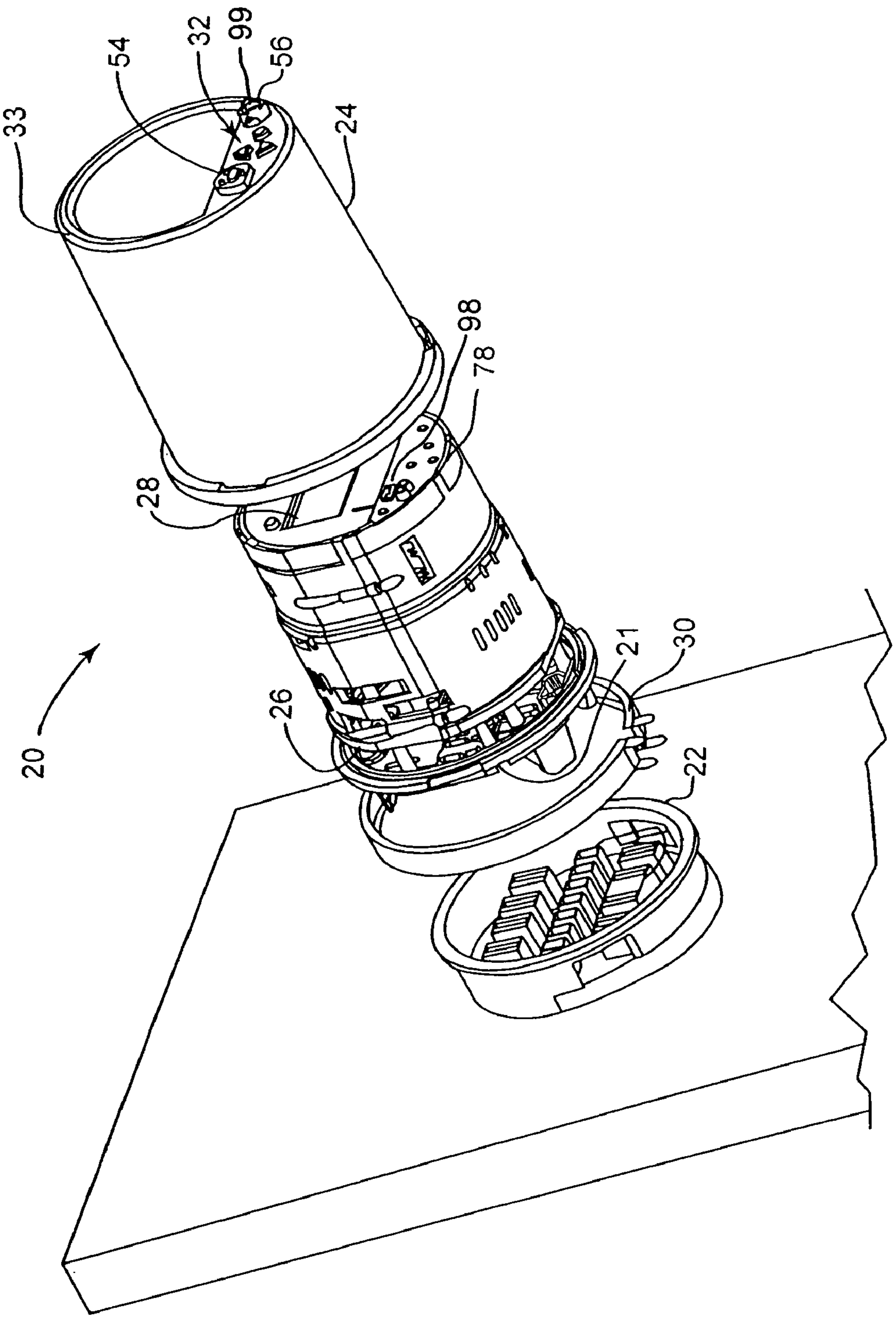
FIG. 1 depicts an exploded view of an exemplary S-Base revenue meter, and meter cover, which includes the interfaces of the present invention.
Figure 2:
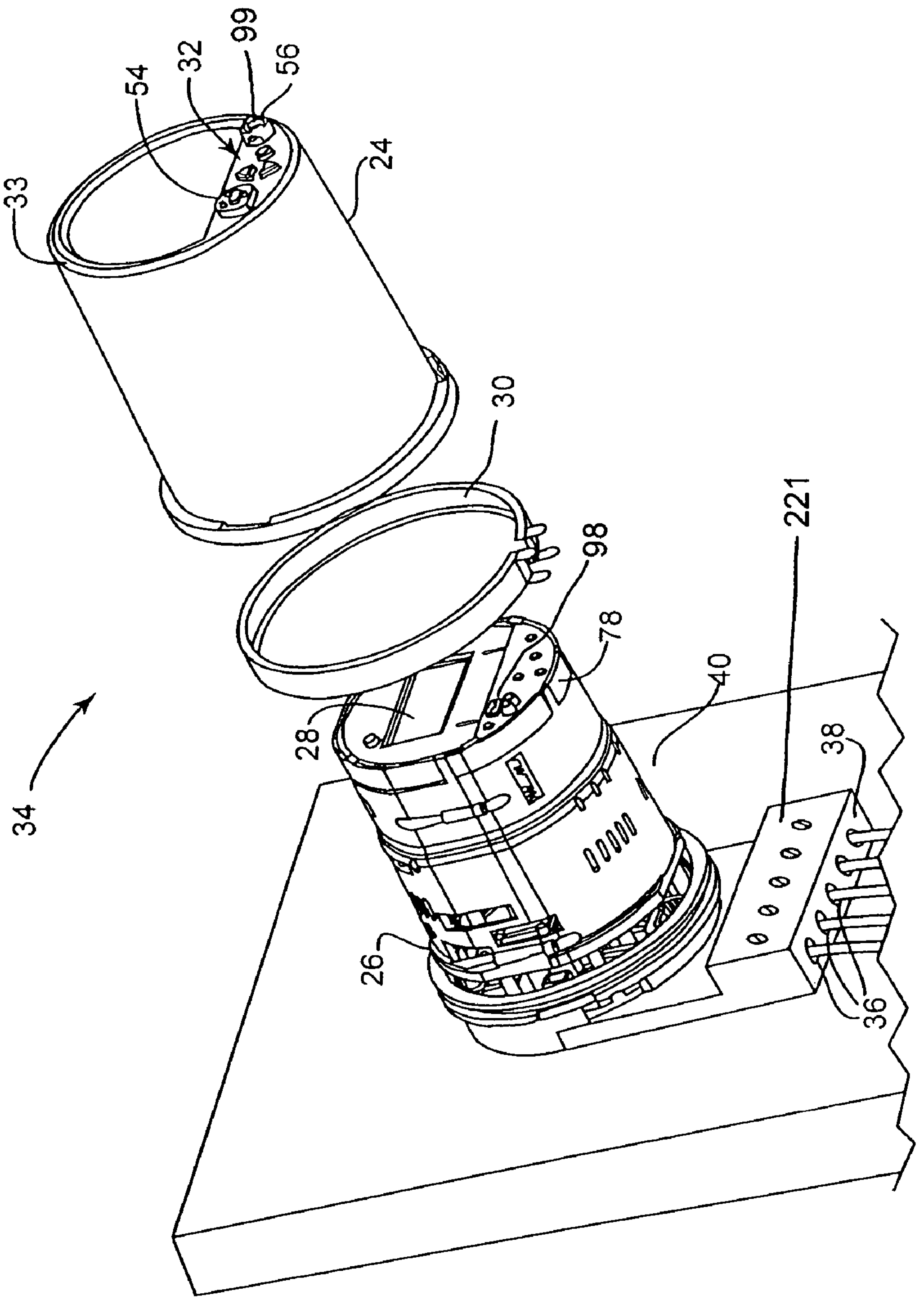
FIG. 2 shows an exploded view of an exemplary A-Base revenue meter, and meter cover, which includes the interfaces of the present invention.
Figure 3:
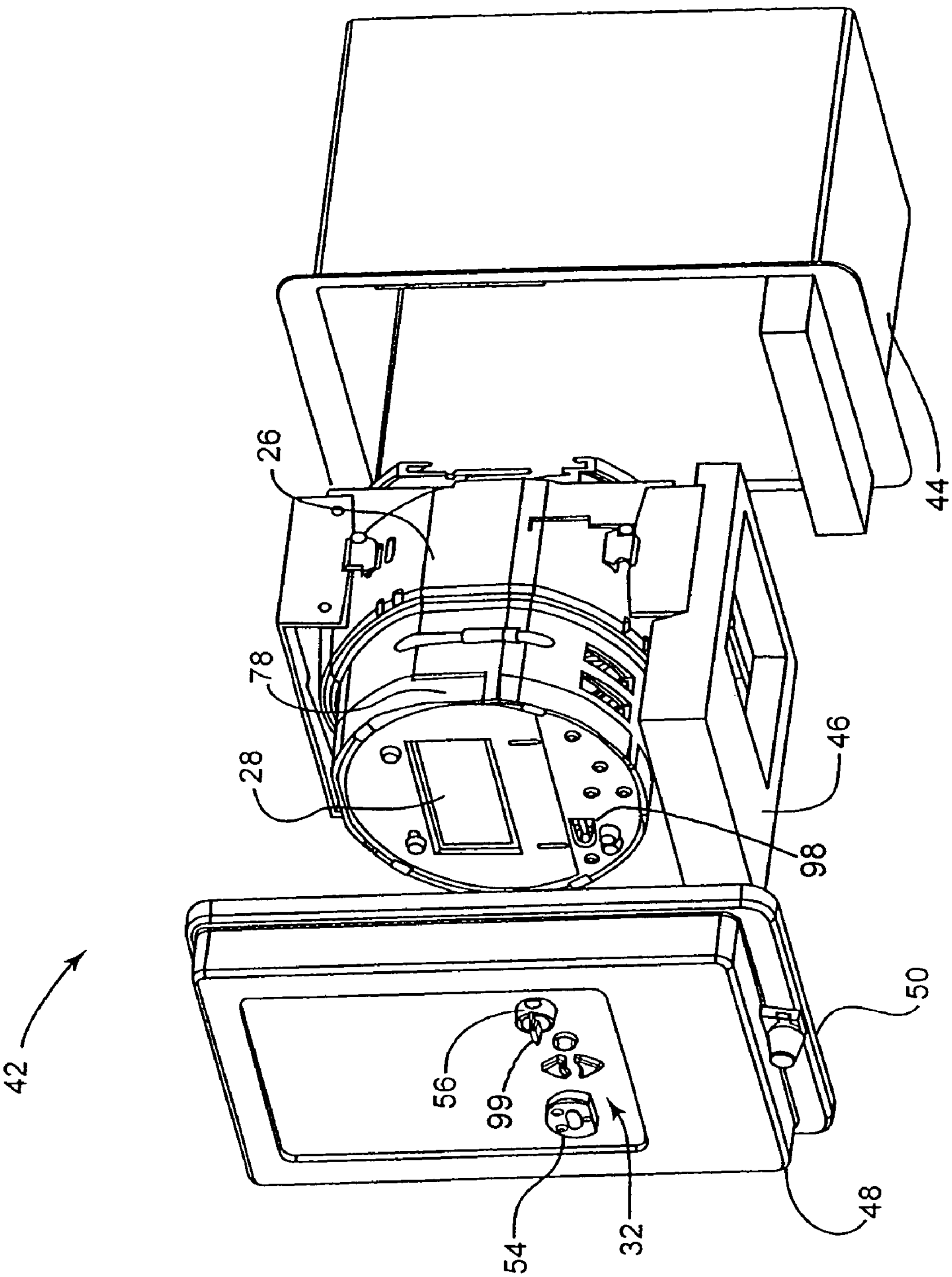
FIG. 3 depicts an exploded view of an exemplary Switchboard revenue meter, and meter cover, which includes the interfaces of the present invention.

Referring to the drawings, and particularly FIG. 1–3, the ANSI standards define two general types of revenue meters, socket based ("S-base" or "Type S") (shown in FIG. 1) and bottom connected ("A-base" or "Type A") (shown in FIG. 2). A third type of revenue meter, known as a "Switchboard Meter" or "Draw-out Meter", is also commonly used in the industry (shown in FIG. 3). These types of revenue meters are distinguished, in at least one respect, by the method in which they are connected with the electric circuit that they are monitoring. Herein, the phrase "connected with" is defined to mean directly coupled with or indirectly coupled to through one or more intermediate components.

Referring to FIG. 1, the S-base revenue meter is shown, designated generally as 20. An exemplary S-base revenue meter is the 8500 ION Revenue Meter manufactured by Power Measurement Limited, Saanichton, British Columbia, Canada. S-base meters feature blade type terminals 215*a*, 215*b*, 215*c* (FIG. 18) disposed on a base 21 of the meter. These blade terminals are designed to mate with matching jaws of a detachable meter mounting device such as a revenue meter socket 22. The socket 22 is hard wired to an electrical circuit (not shown) and is not meant to be removed. An exemplary meter socket is the 3000 Series manufactured by Meter Devices Co., Inc., Canton, Ohio.

S-base meters include a cover 24 which encloses the meter's electronics 26 and display 28. A sealing mechanism 30 secures the cover 24 to prevent unauthorized access to the meter electronics 26. Removal of the meter necessitates disengaging a t-seal (not shown) that seals the cover 24 and the revenue meter 20, which would indicate unauthorized tampering. A context adaptable input device, such as a keypad 32, is provided on a top portion 33 of the cover to allow access to the meter's electronics without requiring removal of the cover 24, described below. Artisans will appreciate that the keypad 32 can be replaced with other input devices, such as a touch screen, a mouse, a track ball, a light pen, a membrane switch, or other similar devices.

Figure 18:
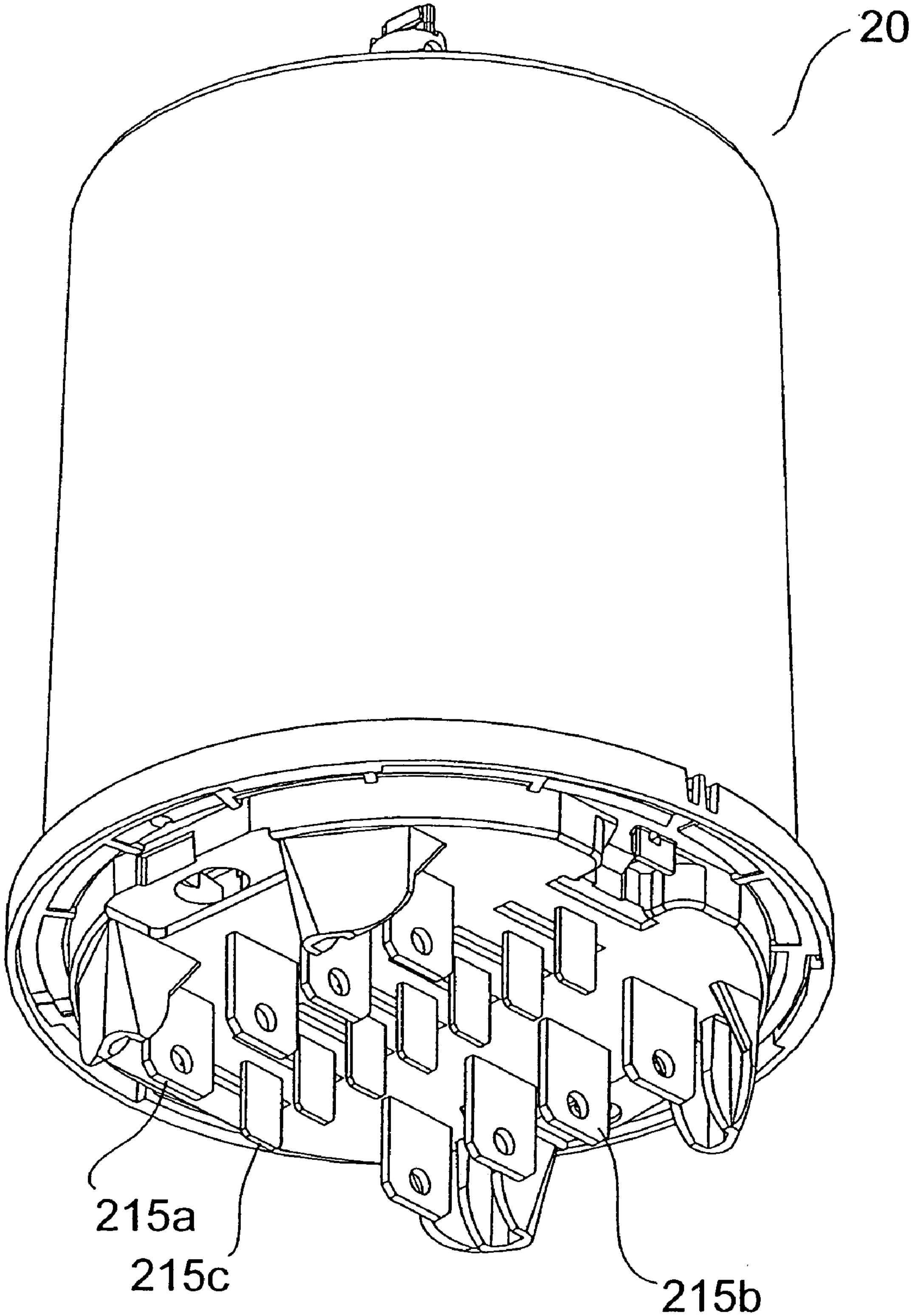
FIG. 18 is a bottom perspective view of the revenue meter of FIG. 1.

Referring now to FIG. 1 and FIG. 18, the S-base meter 20 features blade type terminals 215*a*, 215*b* and 215*c* disposed on back side of the meter. In the embodiment illustrated, the meter 20 includes a row of terminals 215*a* and a row of terminals 215*b* used as voltage or current terminals. In the illustrated embodiment some of the terminals in the row of terminals 215*c* are used as voltage terminals. These blade terminals 215*a*, 215*b* and 215*c* are designed to mate with matching jaws of a detachable meter mounting device such as a revenue meter socket 22. The socket 22 is hard wired to the electrical circuit and is not meant to be removed. A socket sealing ring 30 is used as a seal between the meter 20 and the meter socket 22 to prevent removal of the meter and to indicate tampering with the meter. To install an S-base meter, the utility need only plug in the meter into the socket 22. This makes installation of new meters and especially replacement of defective meters extremely simple. Once installed, the installer need only secure the sealing ring 30 which ensures that the meter will not be tampered with (as detailed in the ANSI standards). To remove the meter 20, the installer need only pull it out of the socket 22. Alternatively, the meter may be sealed with a ringless-type seal as described in more detail in the U.S. patent application Ser. No. 09/370,317 entitled "Revenue Meter With Power Quality Features". For a more detailed description of S based revenue meters, the reader is referred to this and the other applications referenced in the first paragraph of this disclosure, which are incorporated herein by reference.

Referring to FIG. 2, an A-base revenue meter is shown, designated generally as 34. The A-base meter 34 features bottom connected terminals 36 on the bottom side 38 of the meter. The terminals 36 are typically screw terminals for receiving the conductors of the electric circuit. A-base meters 34 are directly connected to the electric circuit and can only be installed or removed by connecting or disconnecting the conductors of the electric circuit. Typically, this means tightening or loosening each terminal 36 to secure or free the end of the conductor. A-base meters 34 utilize cover 24 to enclose the meter electronics and the display. As described with regard to the S-base revenue meter 20, the A-base meter typically utilizes a t-seal to prevent unauthorized tampering with the meter electronics 26. For the purposes of this disclosure, A-base meters also include S-base meters in combination with A-base adapters 40. An exemplary A-base adapter is the Polyphase Transformer Rated A to S Adapter manufactured by Ekstrom Industries, Incorporated, Farmington Hills, Mich.

The transparent meter cover 24 permits the viewing of the meter display 28 without having to remove the meter cover 24. Further, the meter cover 24 may also provide mechanisms for interacting with the meter 20 with the meter cover 24 in place. Such mechanisms include scroll buttons, reset switches or other input devices, and optical couplers, infrared emitters or other output devices as described in more detail below. All of these mechanisms are able to function with the meter cover 24 in place as specified in the ANSI standards. The meter cover 24 is held in place by the sealing mechanism 30 which locks the cover 24 to the meter and indicates when there has been unauthorized tampering with the cover. Typically, the sealing mechanism 30 also serves to lock the meter to the electrical circuit connection. As shown in FIG. 1, in the case of the S-base meter, the sealing mechanism 30 also seals the meter to the meter socket 22. Removal of the meter necessitates disengaging the sealing mechanism 30, which would indicate unauthorized tampering.

As shown in FIG. 2, in the case of the A-base meter, the sealing mechanism 30 also seals a separate (possibly joined) terminal cover 221 which prevents disconnection of the conductors from the terminals without disengaging the sealing mechanism. It should be understood that separate sealing mechanisms can be provided to seal the meter cover and seal the meter to the electrical connection and that other methods of tamper detection and environmental protection are well known in the art.

Preferably, the meter also includes a demand reset switch seal for the demand reset button 99 located on the front panel of the meter 20. This seal may comprise, for example, a wire seal or lock inserted through the side of the button 99. The demand reset button 99 clears all the basic maximum demand measurement accumulators, such as kW, kVAR, and kVA measurements or may reset peak demand measurements or other functions as defined by the operator. Additional measurements can also be configured to be reset by activation of the reset button 99.

Referring to FIG. 3, there is shown a Switchboard Meter, designated generally as 42. The Switchboard meter 42 consists of a switchboard enclosure 44 which is physically mounted and connected with the electrical circuitry. Exemplary enclosures are the ABB FT-21 and ABB-FT-32 manufactured by ABB, Raleigh, N.C. The switchboard meter 42, which includes the meter electronics 26 and display 28, is mounted on a draw-out chassis 46 which is removable from the switchboard enclosure 44. The draw-out chassis 46 interconnects the meter electronics 26 with the electrical circuit. The enclosure 44 also has a cover 48 which completely seals the meter inside the enclosure. The cover 48 includes the keypad 32 or input device for accessing the meter's electronics 26. The cover 48 has a sealing mechanism 50 which prevents removal of the cover 48 and indicates when the cover 48 has been tampered with.

Figure 11:
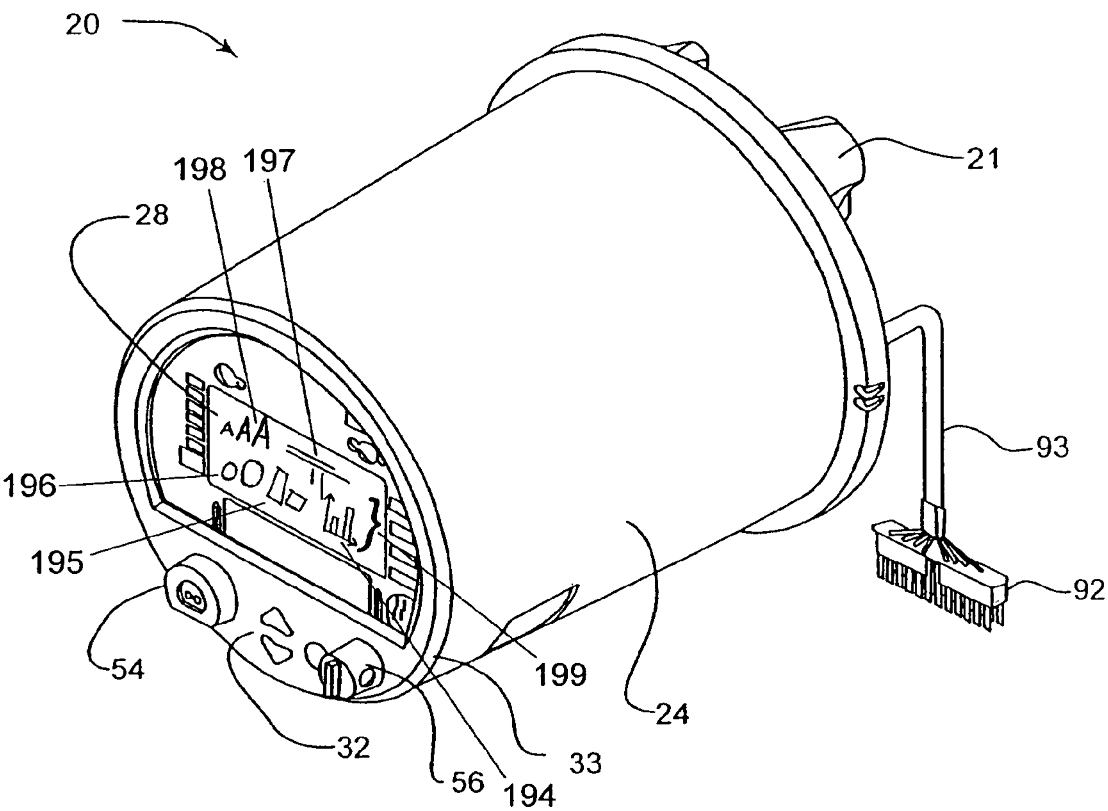
FIG. 11 shows the revenue meter of FIGS. 1–3, with an exemplary serial link interface of a preferred embodiment of the present invention.
Figure 11A:
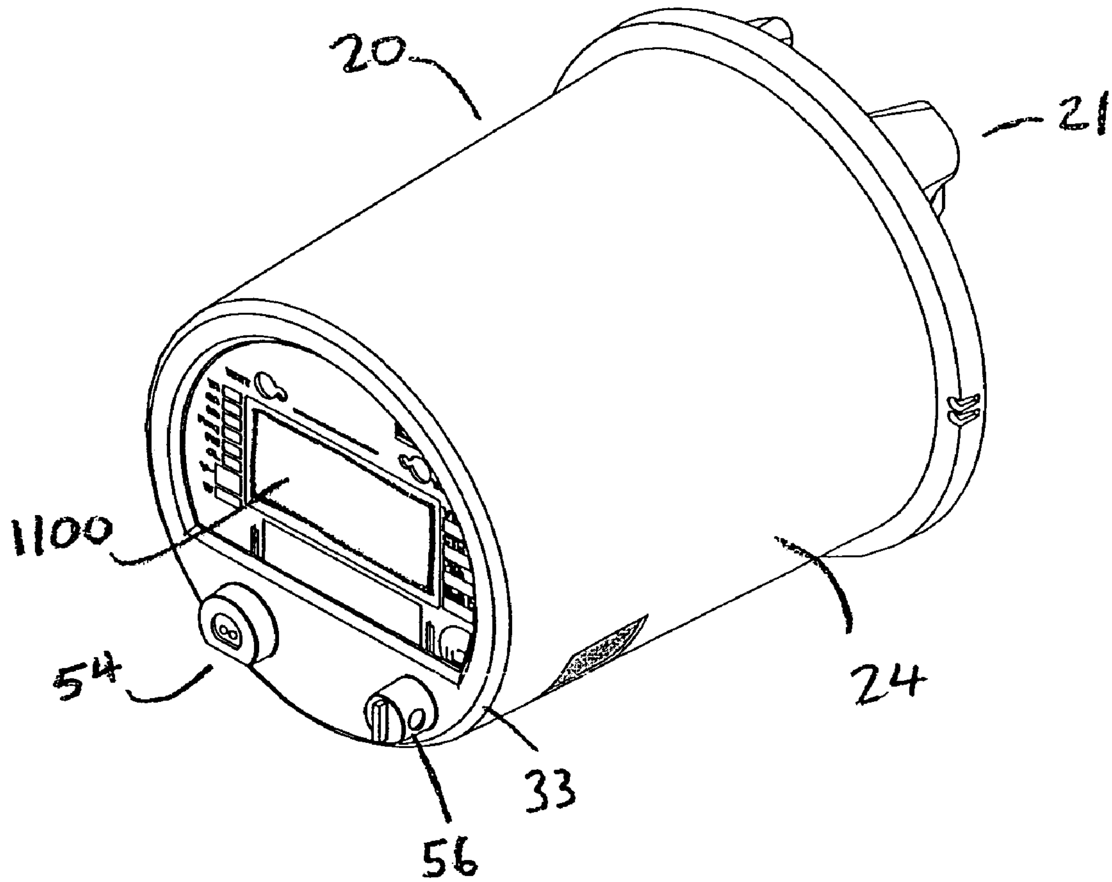
FIG. 11*a* shows the revenue meter of FIGS. 1–3 with a touch screen input device coupled to the meter.
Figure 11B:
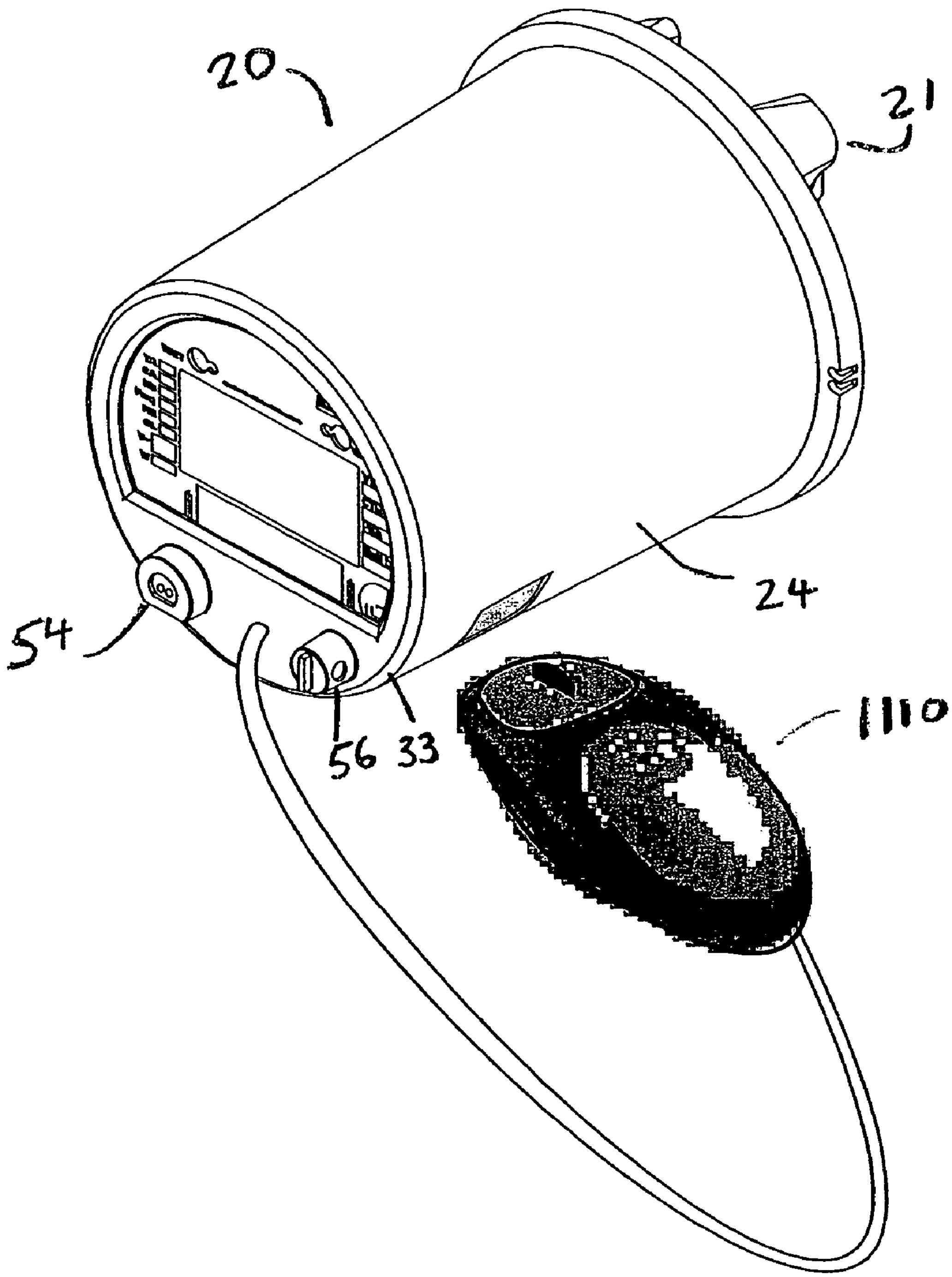
FIG. 11*b* shows the revenue meter of FIGS. 1–3 with a mouse input device coupled to the meter.
Figure 11C:
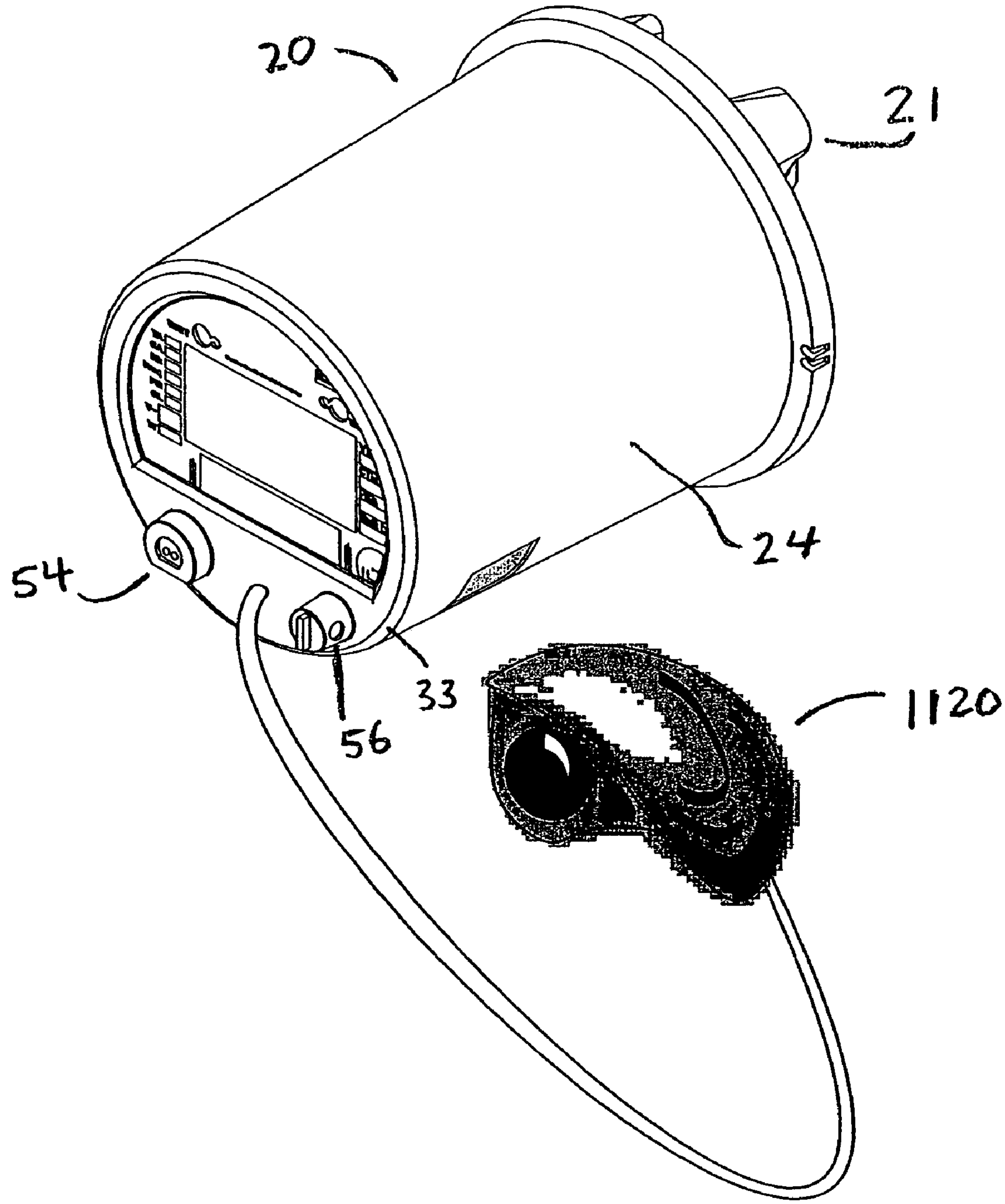
FIG. 11*c* shows the revenue meter of FIGS. 1–3 with a track ball input device coupled to the meter.
Figure 11D:
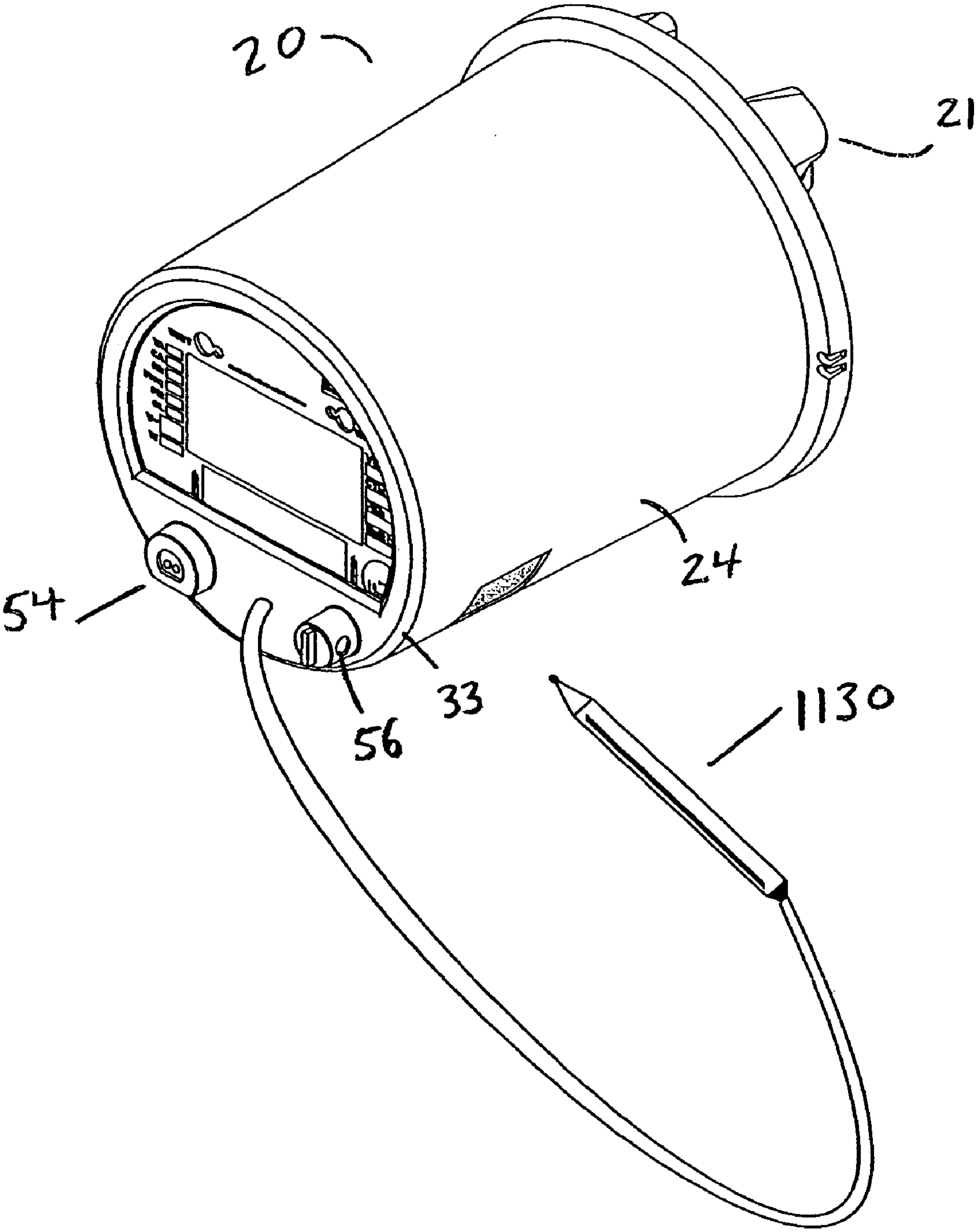
FIG. 11*d* shows the revenue meter of FIGS. 1–3 with a light pen input device coupled to the meter.
Figure 11E:
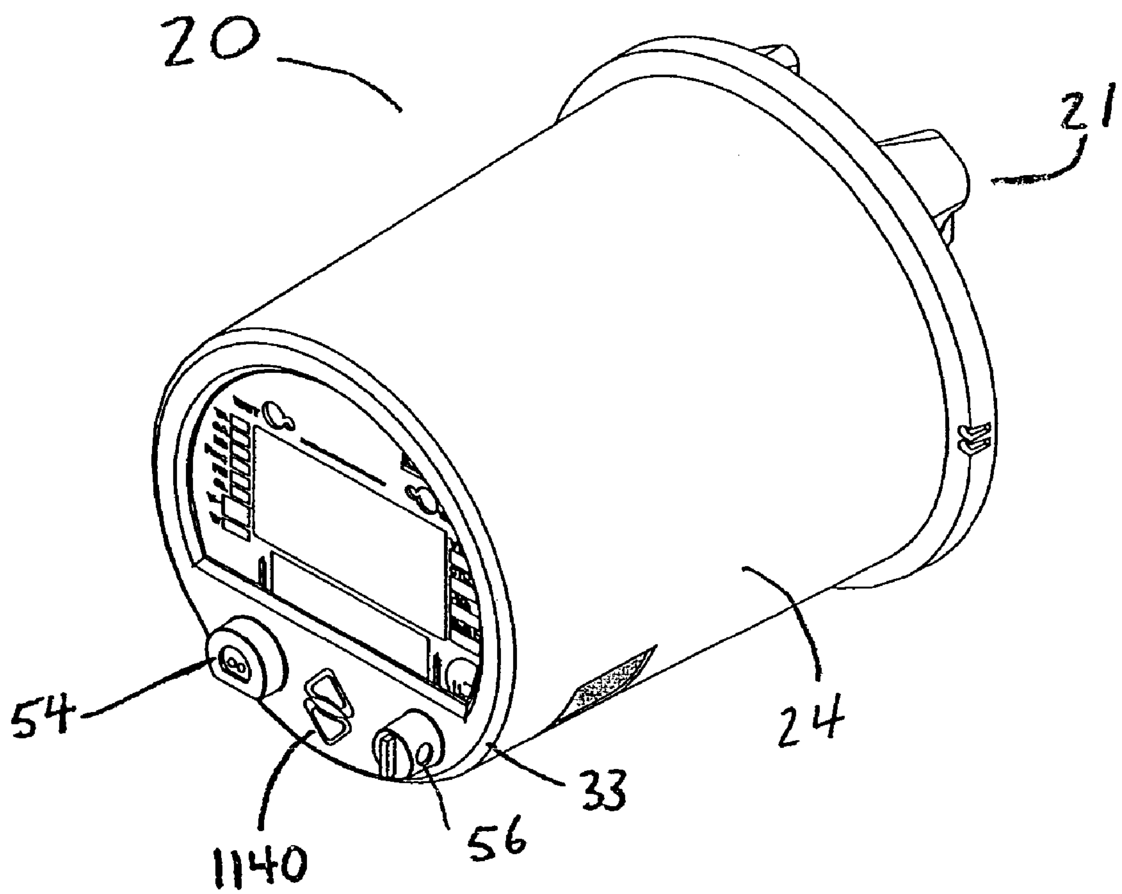
FIG. 11*e* shows the revenue meter of FIGS. 1–3 with a membrane switch input device coupled to the meter.
Figure 11F:
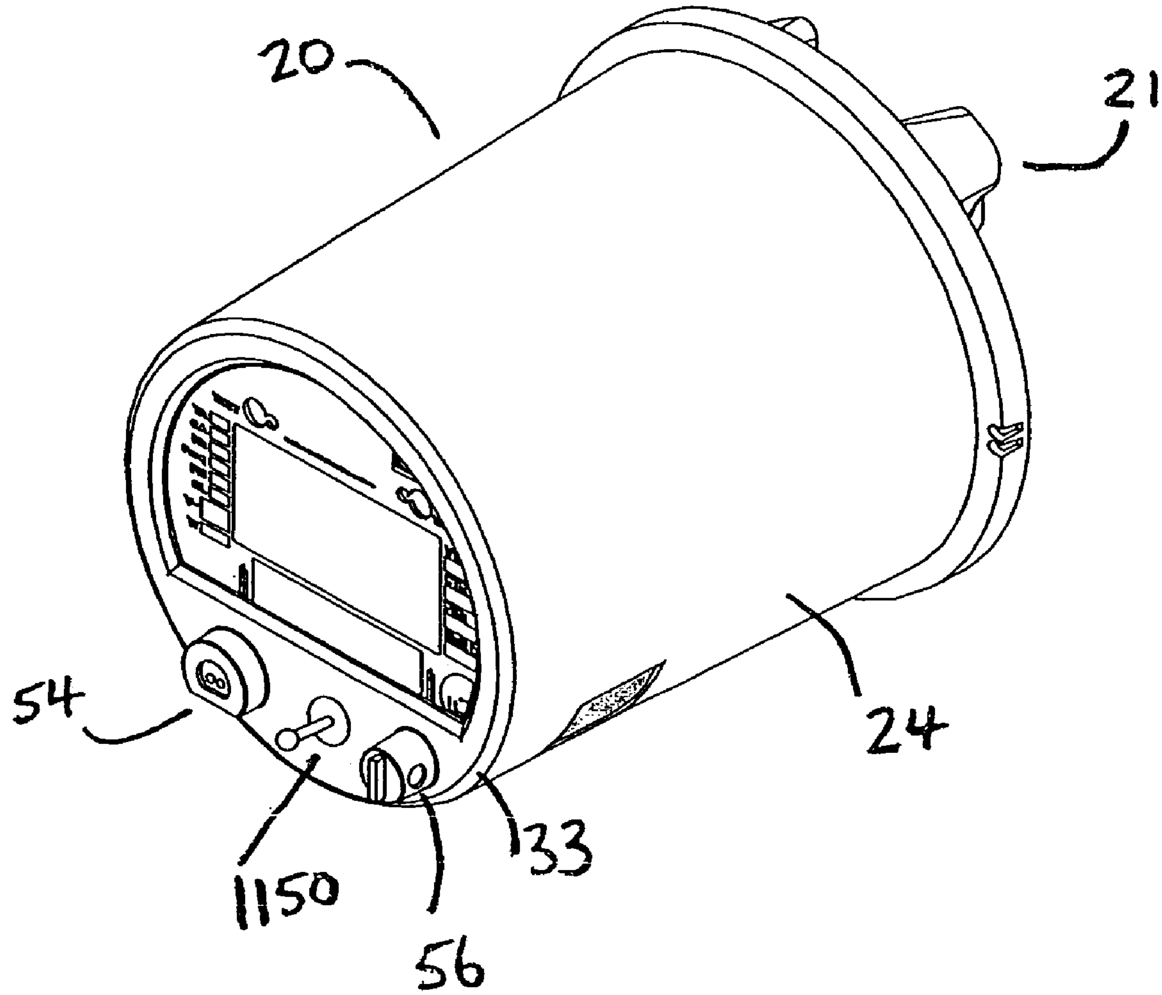
FIG. 11*f* shows the revenue meter of FIGS. 1–3 with a joystick input device coupled to the meter.
Figure 11G:
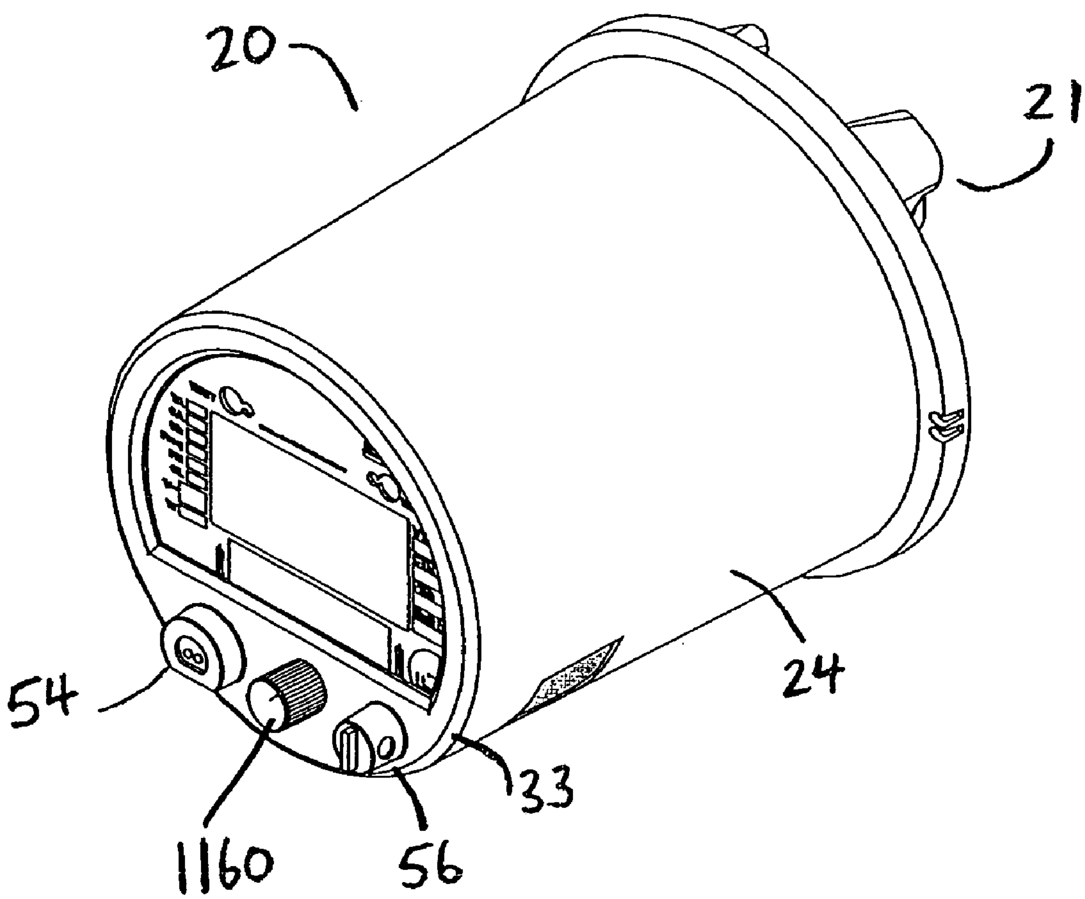
FIG. 11*g* shows the revenue meter of FIGS. 1–3 with a dial input device coupled to the meter.

Referring to FIGS. 1–3, the S-base and A-base revenue meters' cover 24, and the Switchboard revenue meter's cover 48, are at least partially transparent. The transparency permits viewing of the meter's display 28 including a graphic user interface (GUI) 199 (FIG. 11) without having to remove the cover 24. As mentioned above, the meter cover 24 provides the context adaptable input device such as the keypad 32 for interacting with the revenue meter while the meter cover 24, 48 remains in place. Artisans will appreciate that the keypad 32 can be replaced with other context adaptable input devices, such as a touch screen 1100, a mouse 1110, a track ball 1120, a light pen 1130, a membrane switch 1140, joystick 1150, dial 1160 or other similar device (see FIGS. 11*a*–*g*).

Figure 4A:
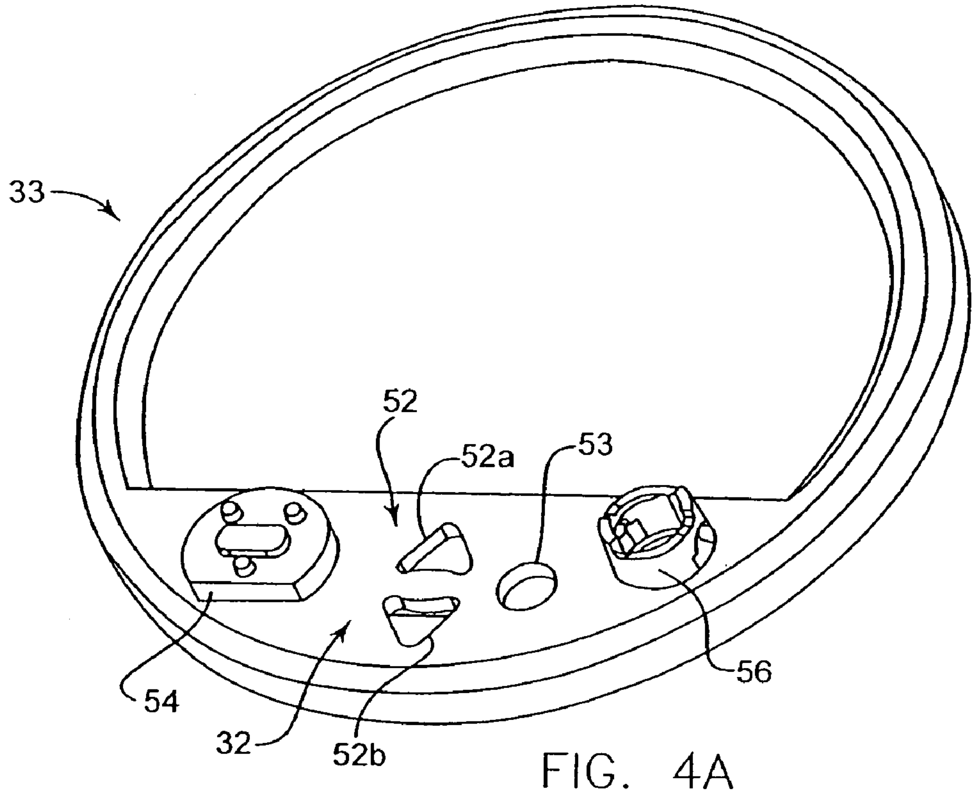
FIG. 4A shows a front side perspective view of an upper portion of the meter cover for an S-base and A-base revenue meters shown in FIGS. 1 and 2, including receptacles for a keypad according to the present invention.
Figure 4B:
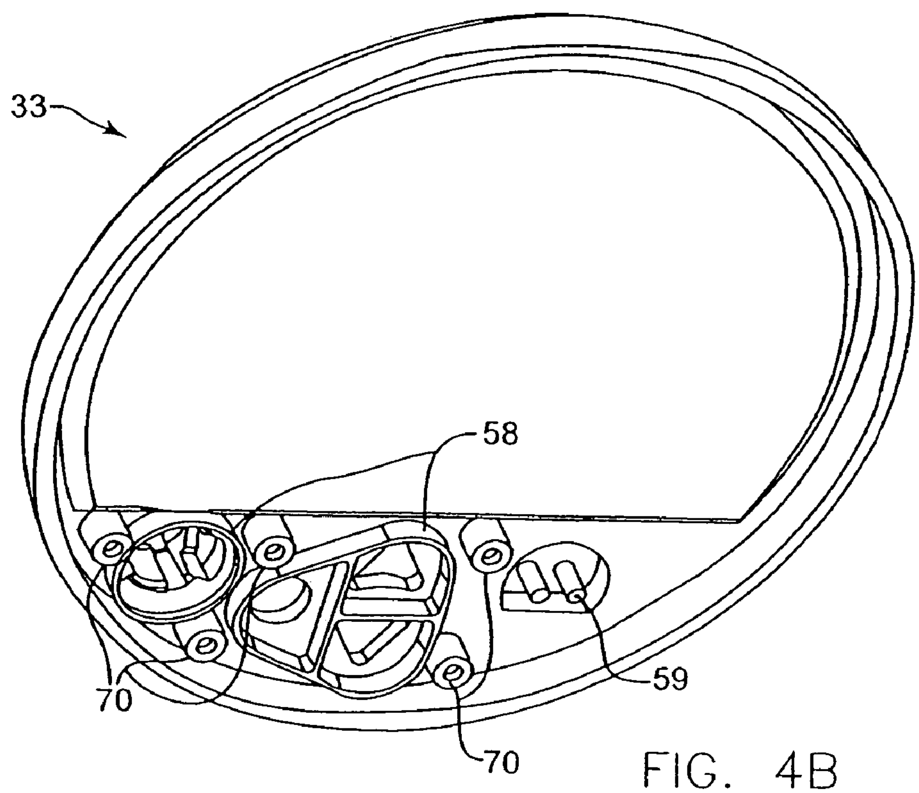
FIG. 4B depicts a backside perspective view of the upper portion of the meter cover for an S-base and A-base revenue meter according to FIG. 4A.
Figure 5A:
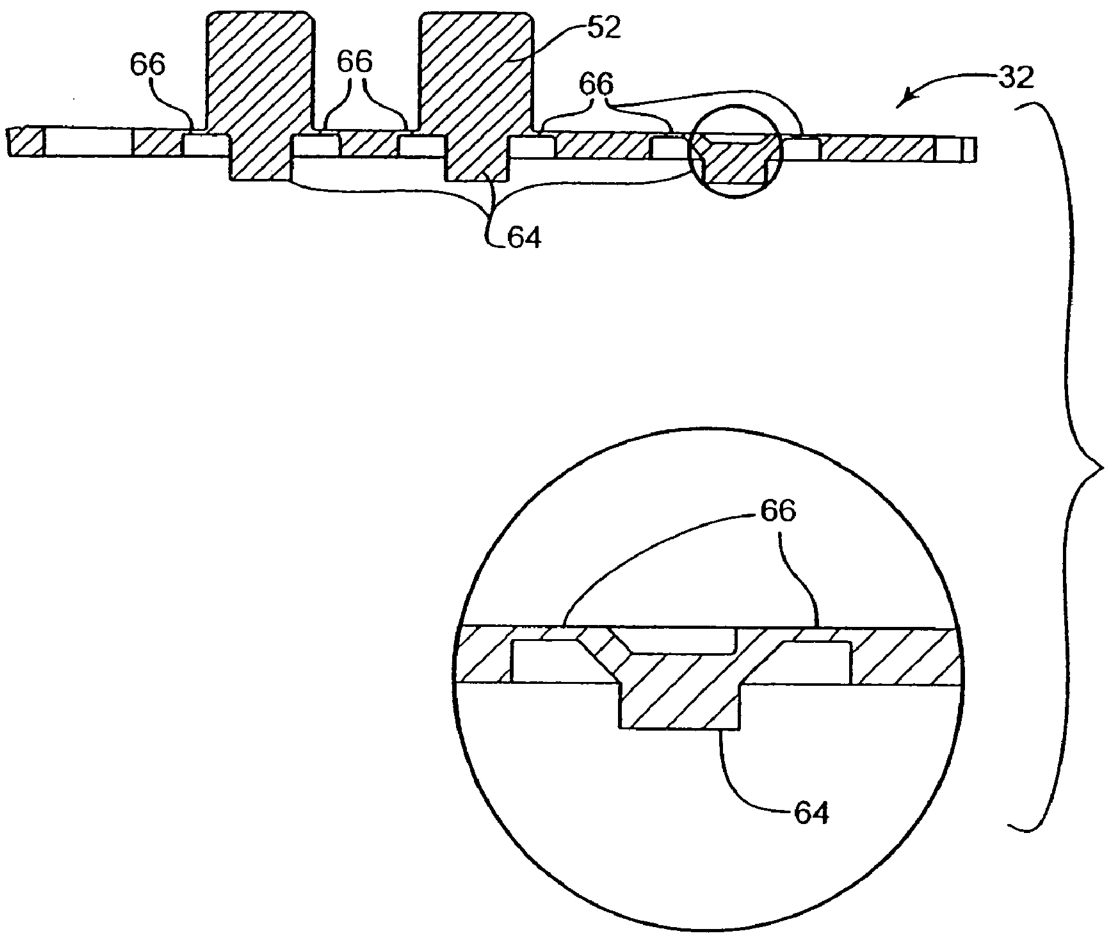
FIG. 5A depicts a cross-sectional view of an exemplary elastomer keypad according to a preferred embodiment of the present invention.
Figure 5B:
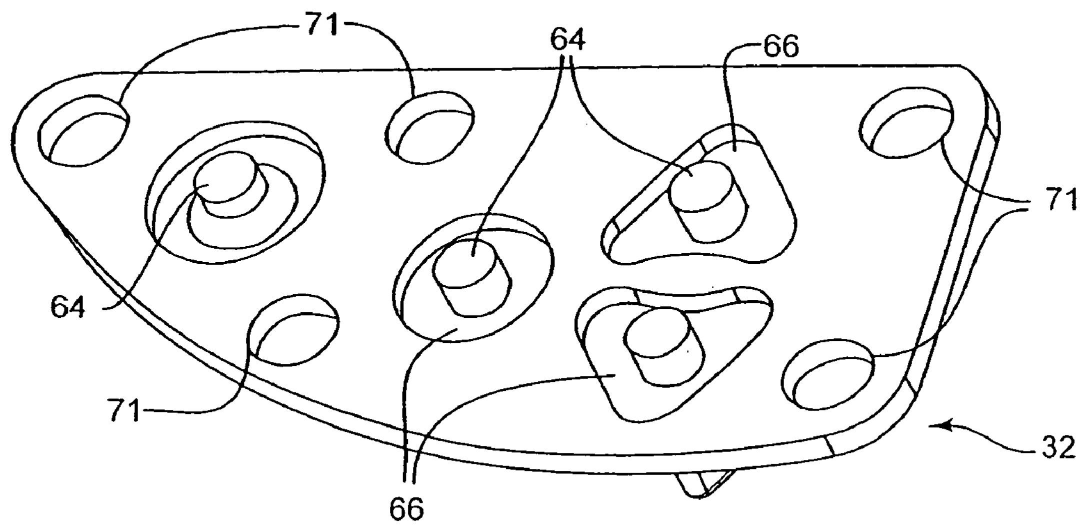
FIG. 5B shows a bottom perspective view of the elastomer keypad depicted in FIG. 5A.
Figure 5C:
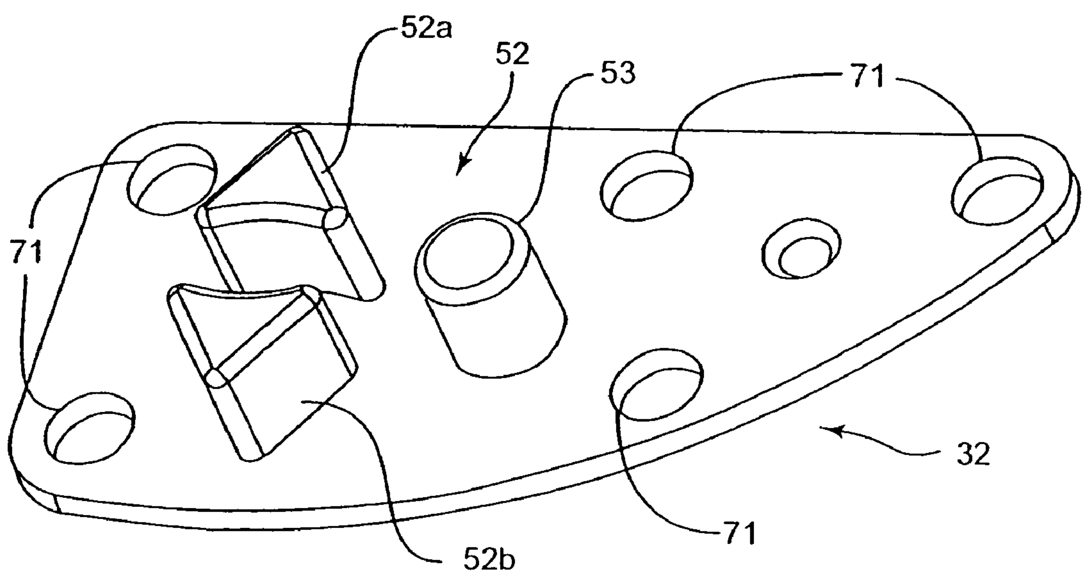
FIG. 5C depicts a top perspective view of the elastomer keypad shown in FIG. 5A.

Referring also to FIG. 4A, the top portion 33 of the cover preferably includes openings to accommodate scroll buttons 52 and an enter button 53 of the keypad 32. In addition, the top portion 33 of the cover includes an infrared locating member 54 which allows optical couplers (not shown) to access infrared emitters (not shown). Moreover, the top portion 33 of the cover provides a reset demand key wall 56 to sealingly accommodate a known reset demand key of the revenue meter. The top portion 33 also provides water proofing keypad sealing walls 58.

The keypad 32 presents information (i.e., the state of the input hardware such as buttons) or messages to a microprocessor, microcontroller or other central control device via the GUI, which in turn performs actions depending on the type of input and the current operating mode of the revenue meter 20, 34, 42. The GUI and a description of the operating modes is discussed below.

Figure 19:
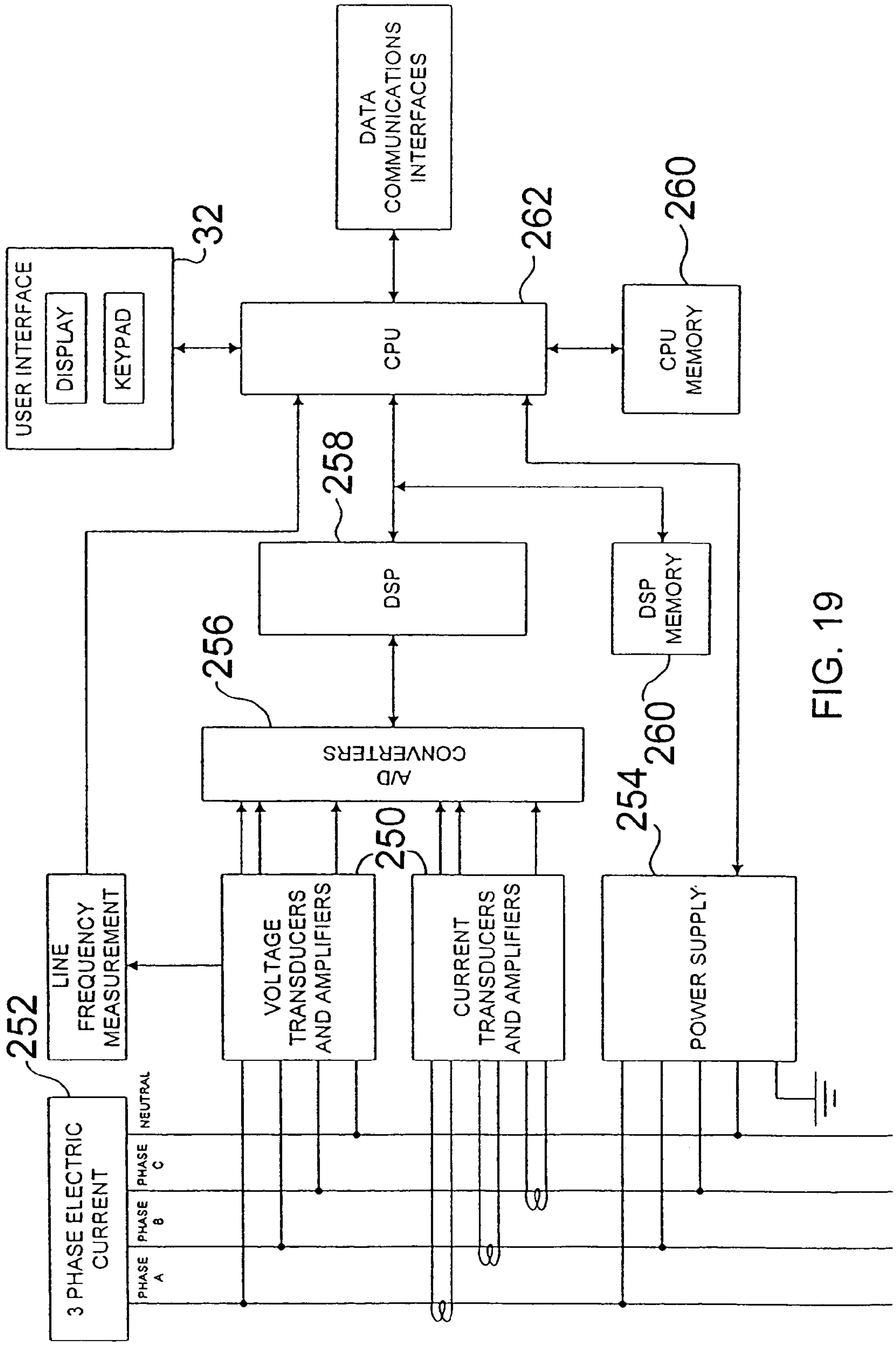
FIG. 19 is a block diagram illustration of some of the components of the revenue meter of the present invention.
Figure 20A:
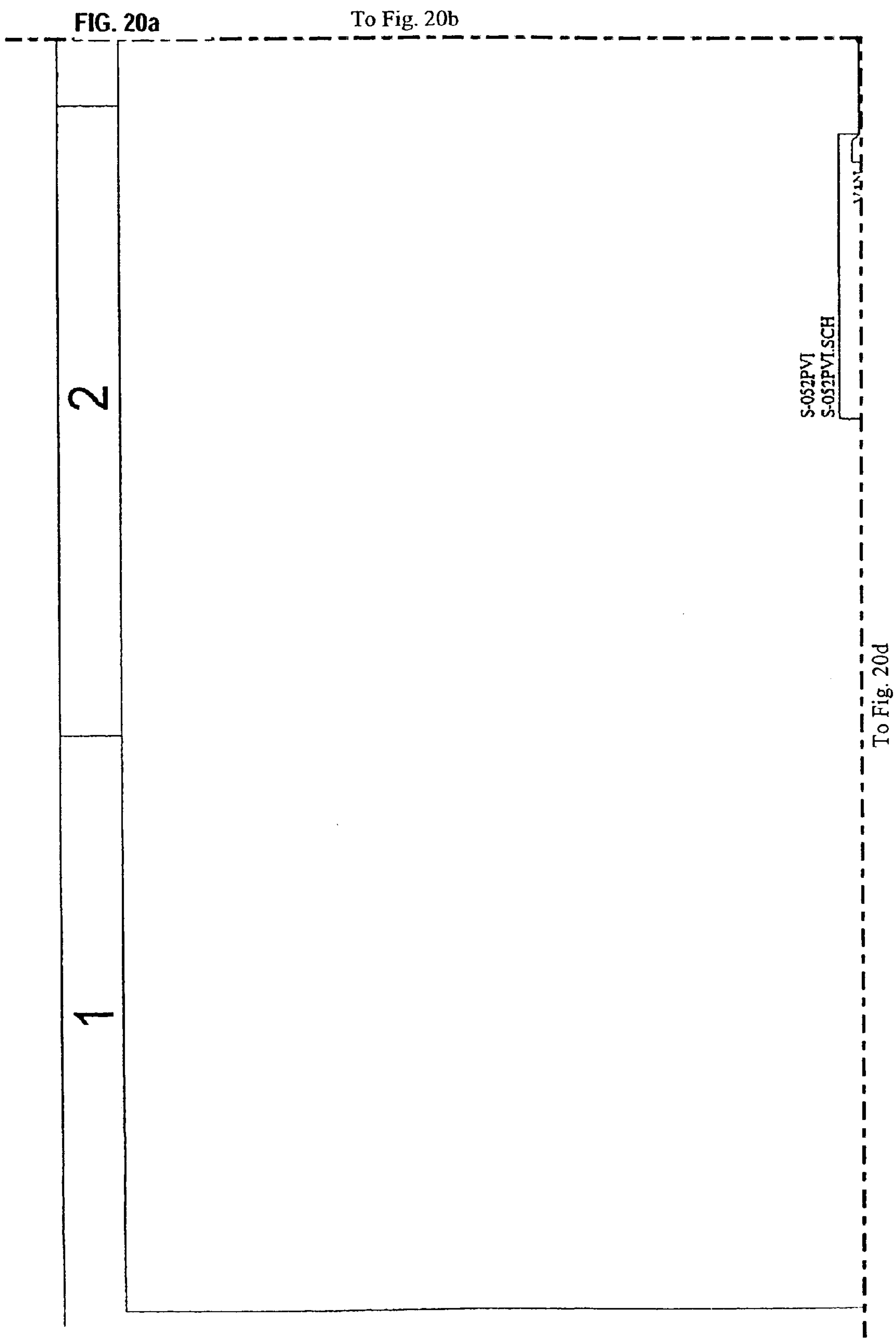
FIGS. 20A–27L depict schematic diagrams of an exemplary measurement board of one preferred embodiment.
Figure 20B:
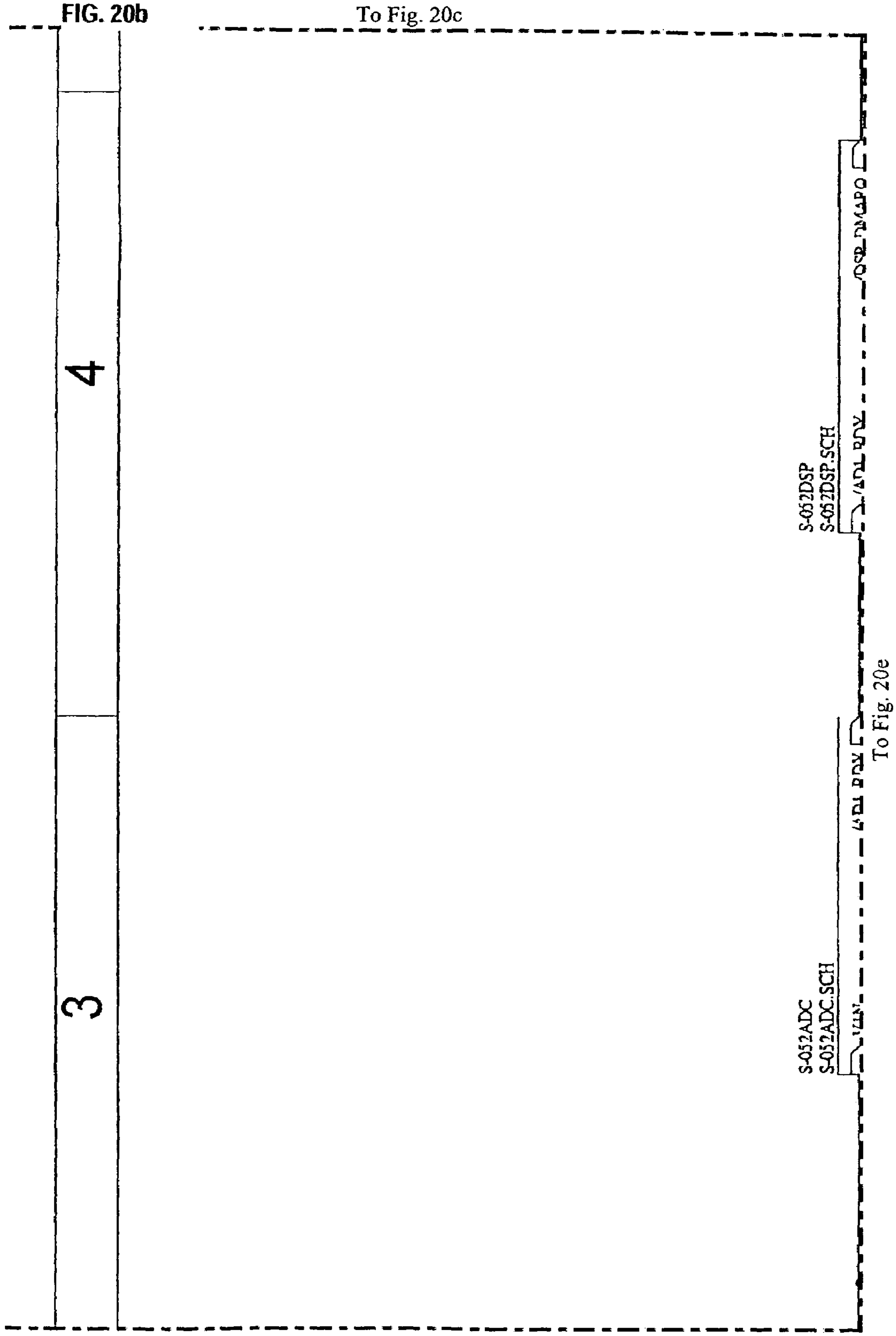
Figure 20C:
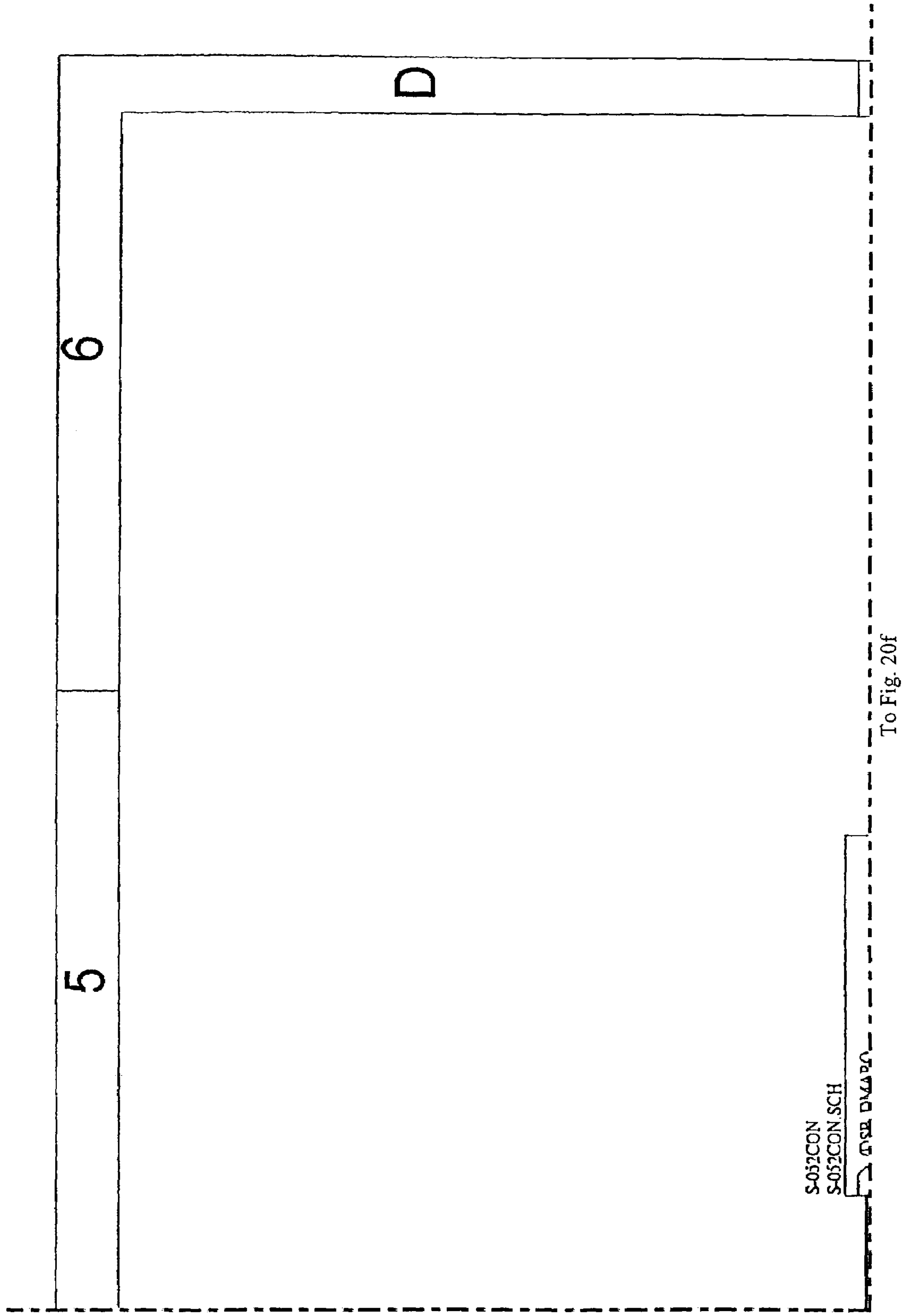
Figure 20D:
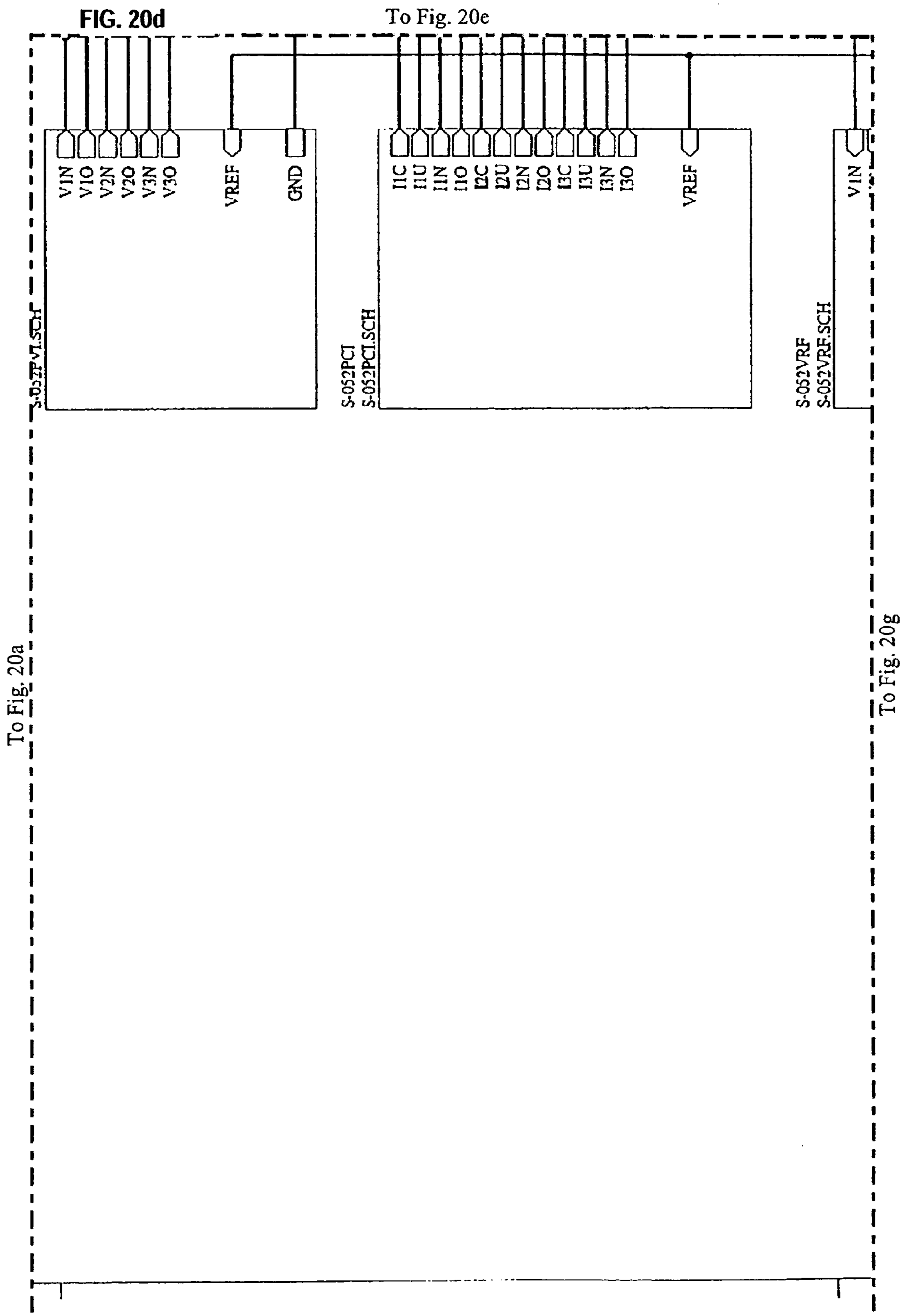
Figure 20E:
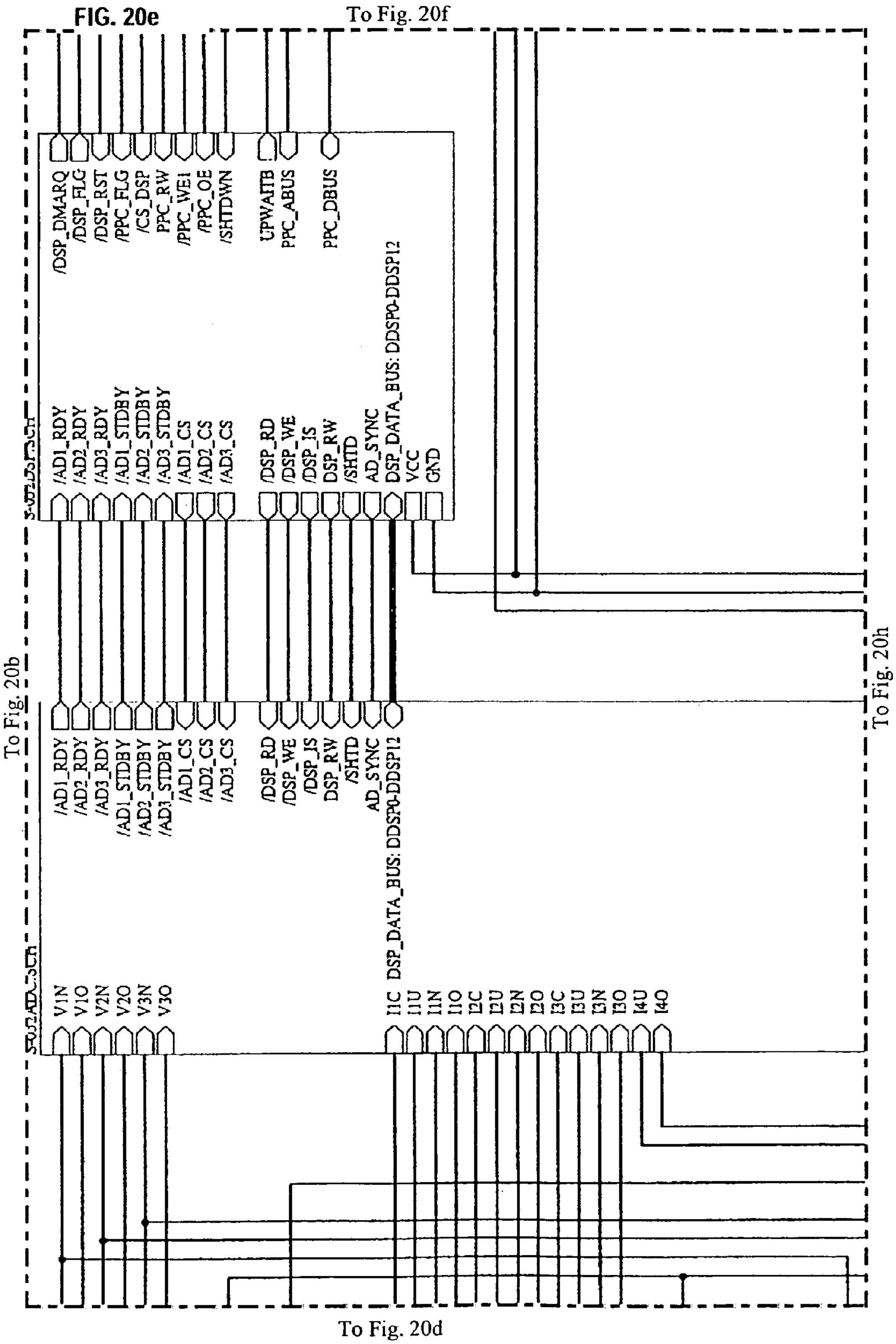
Figure 20F:
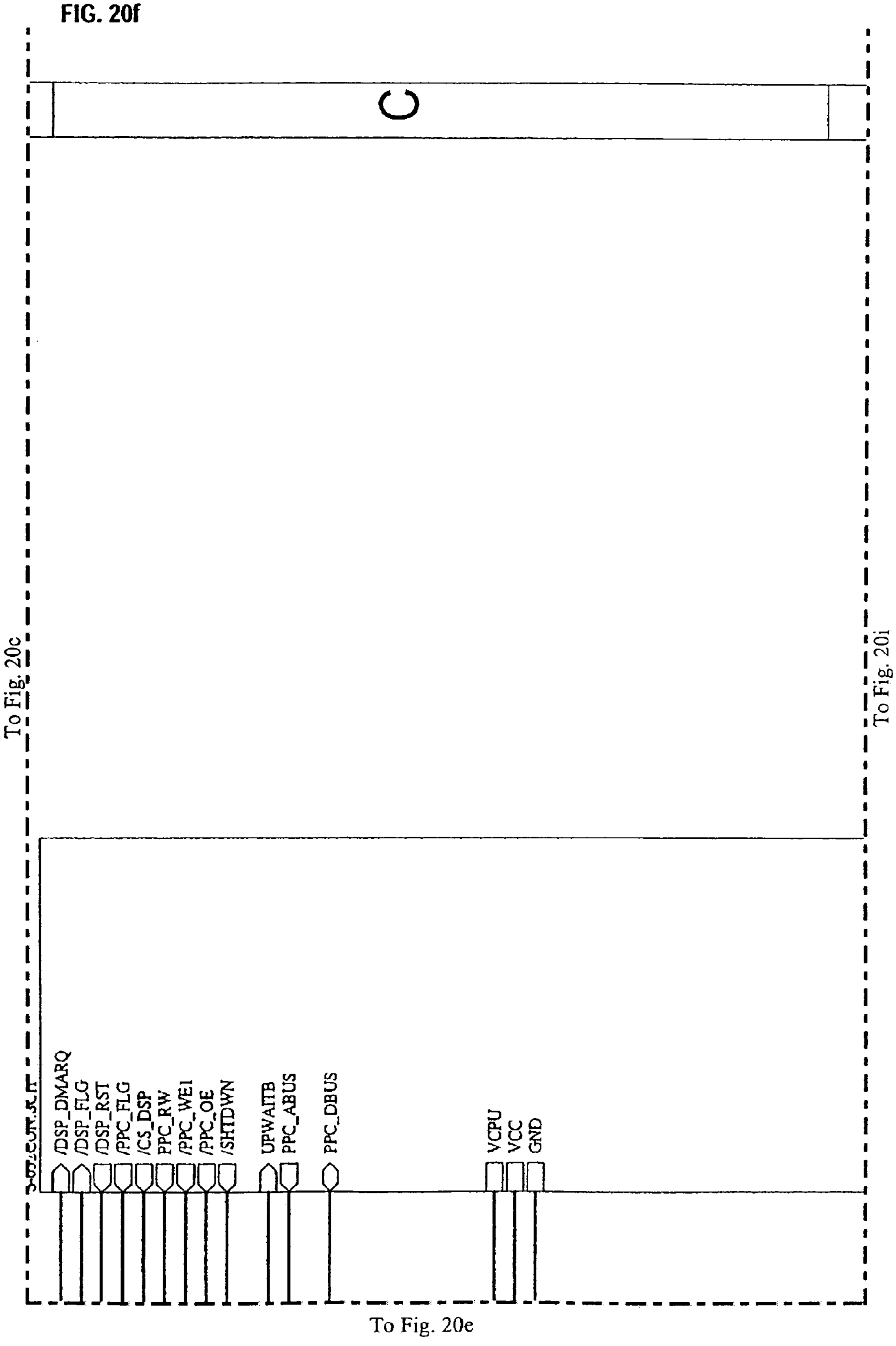
Figure 20G:
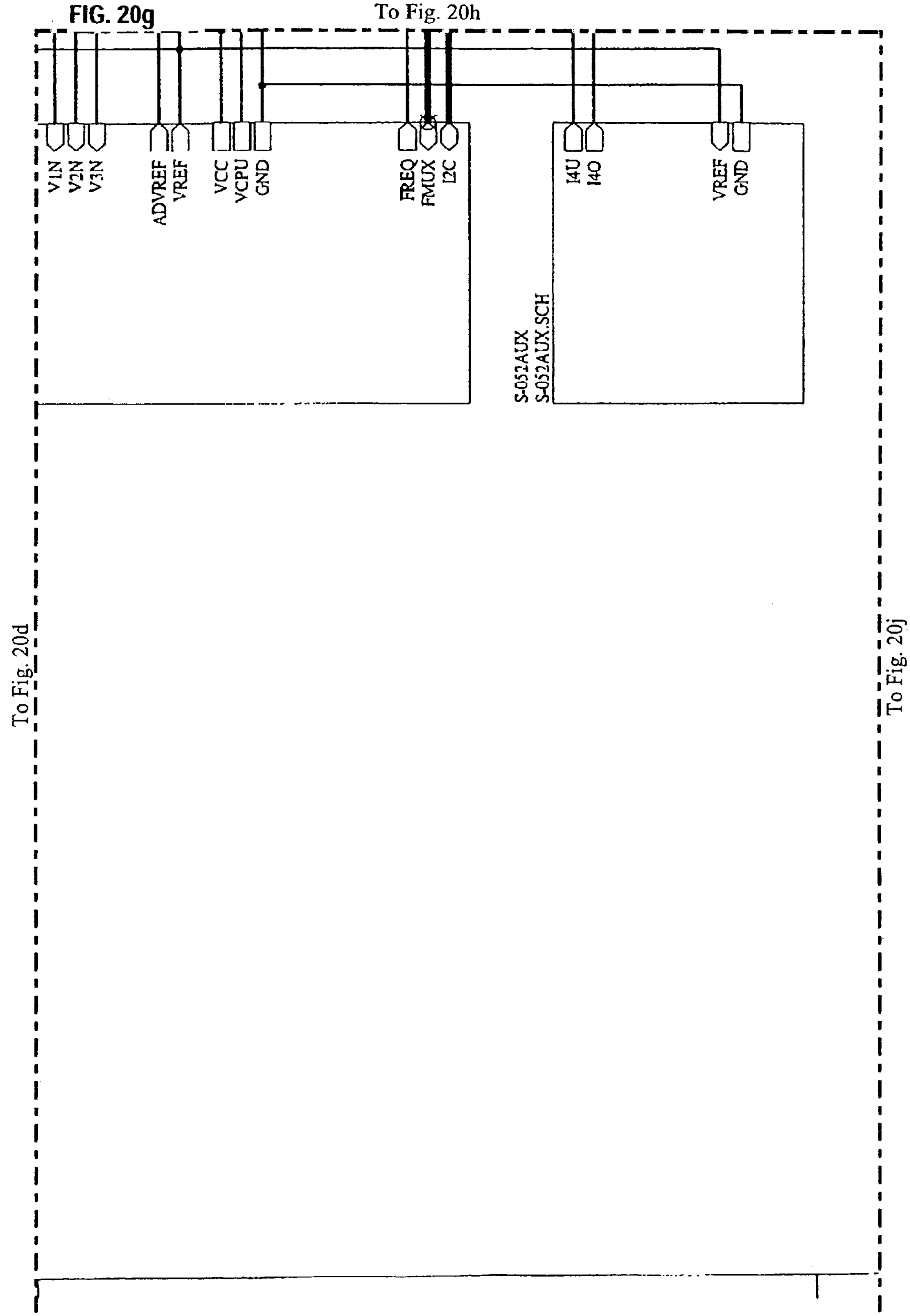
Figure 20H:
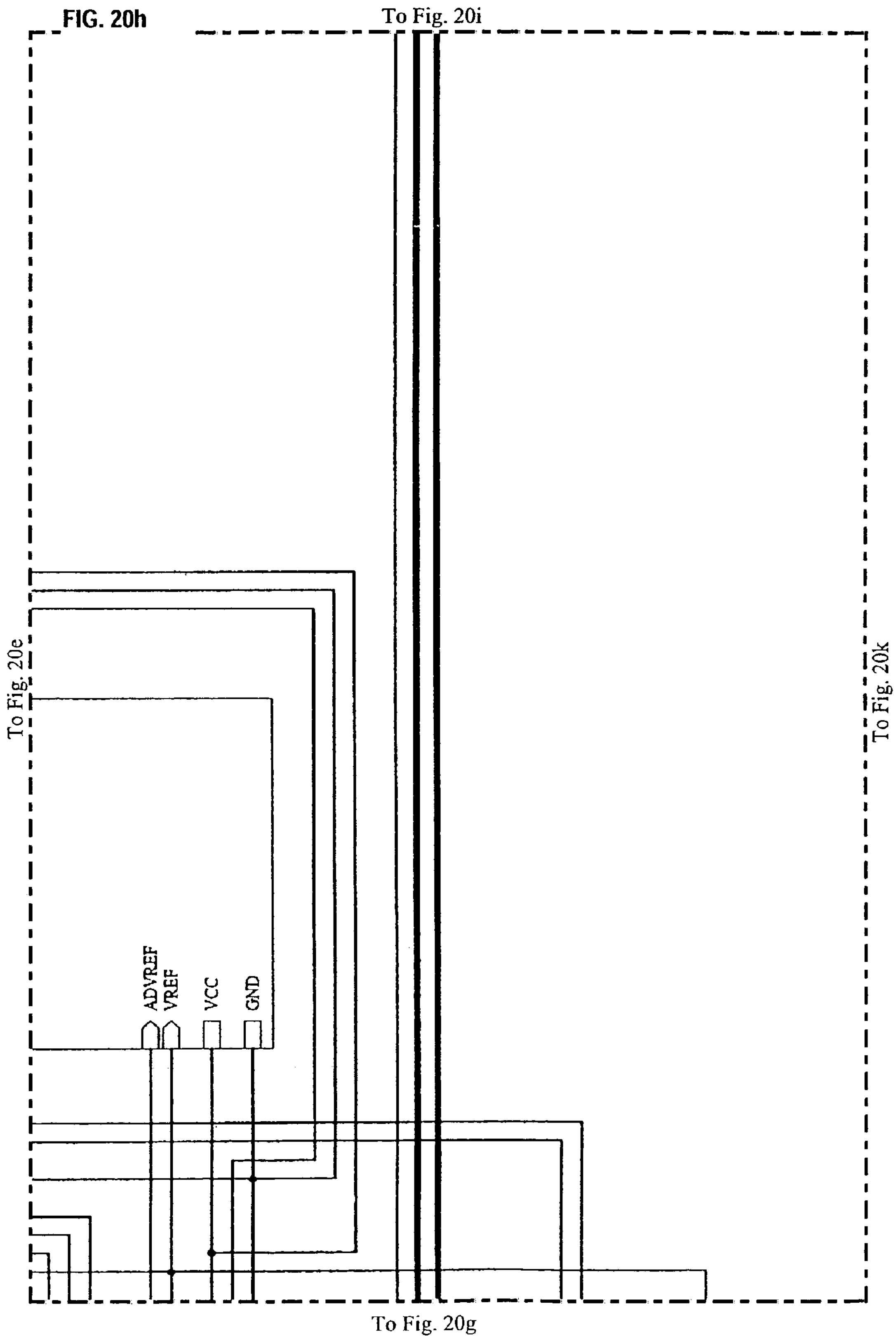
Figure 20I:
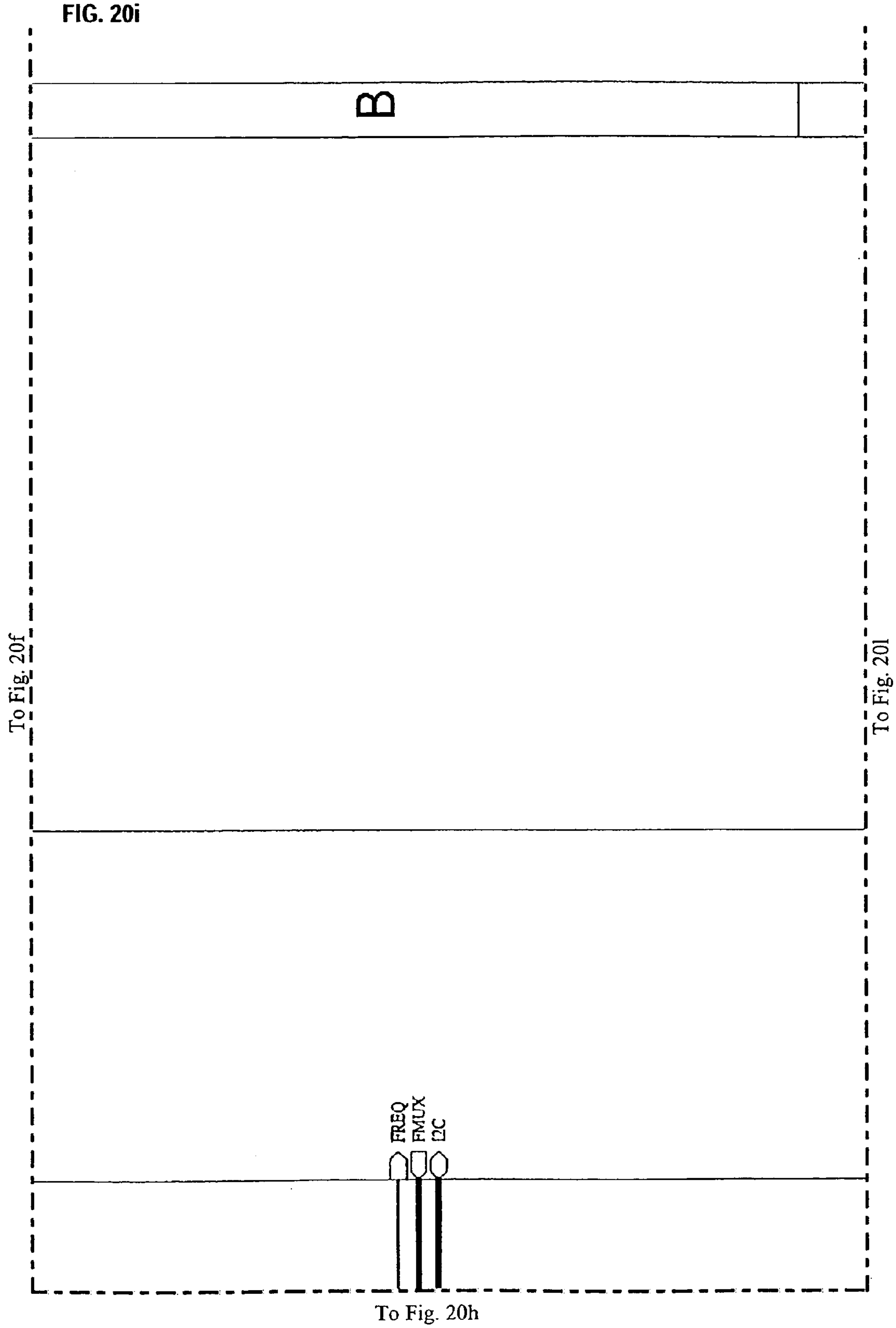
Figure 20J:
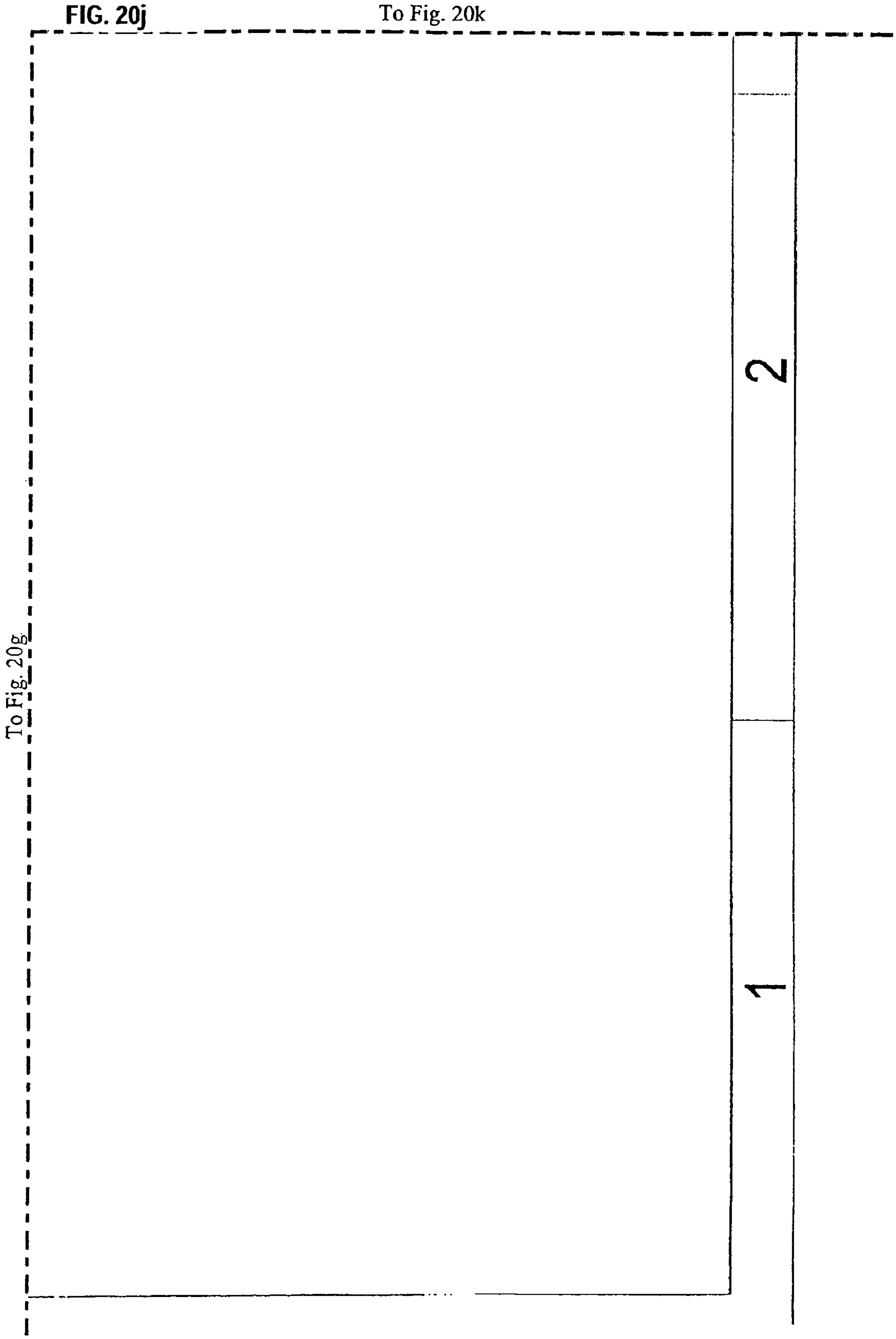
Figure 20K:
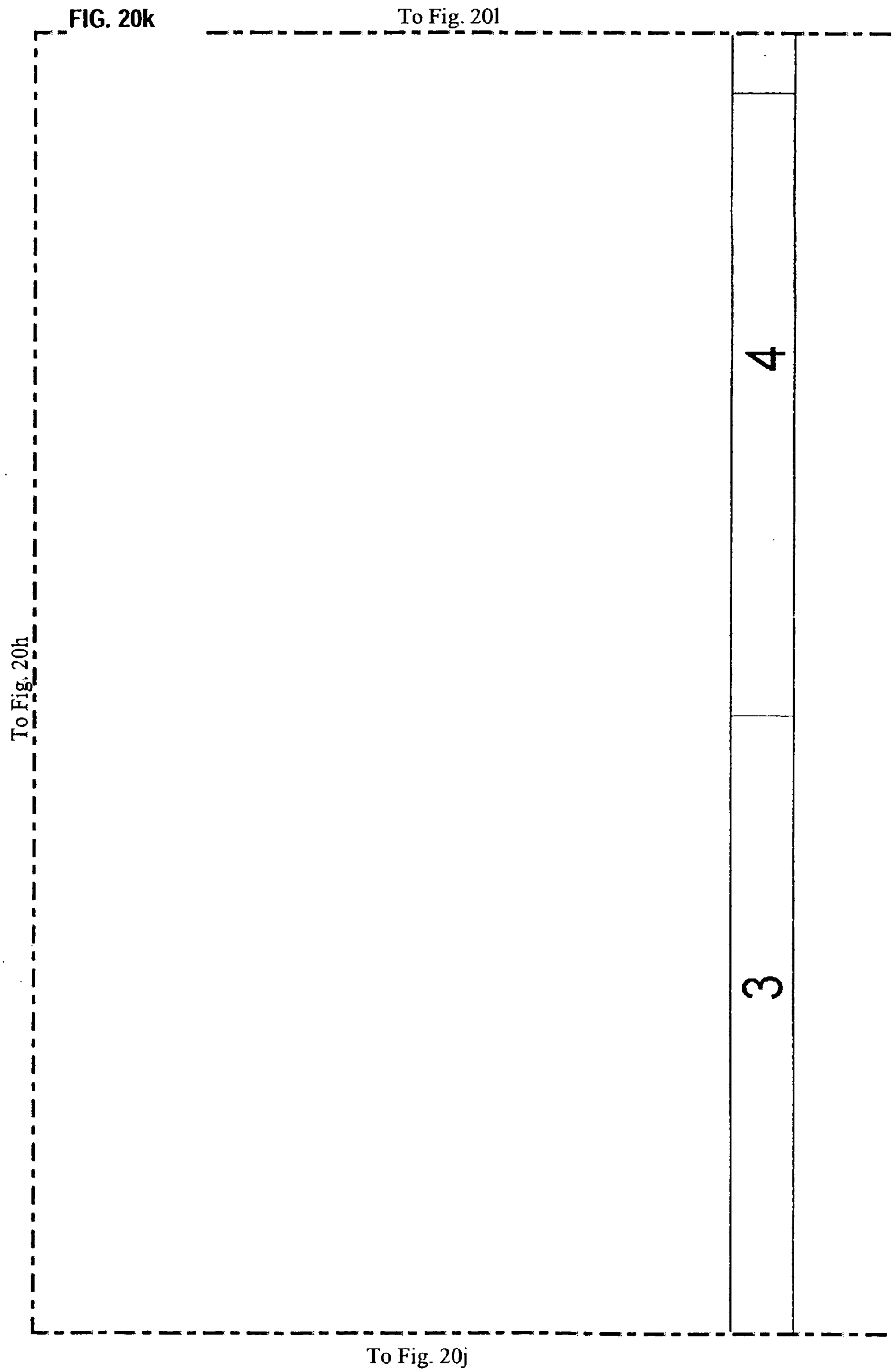
Figure 20L:
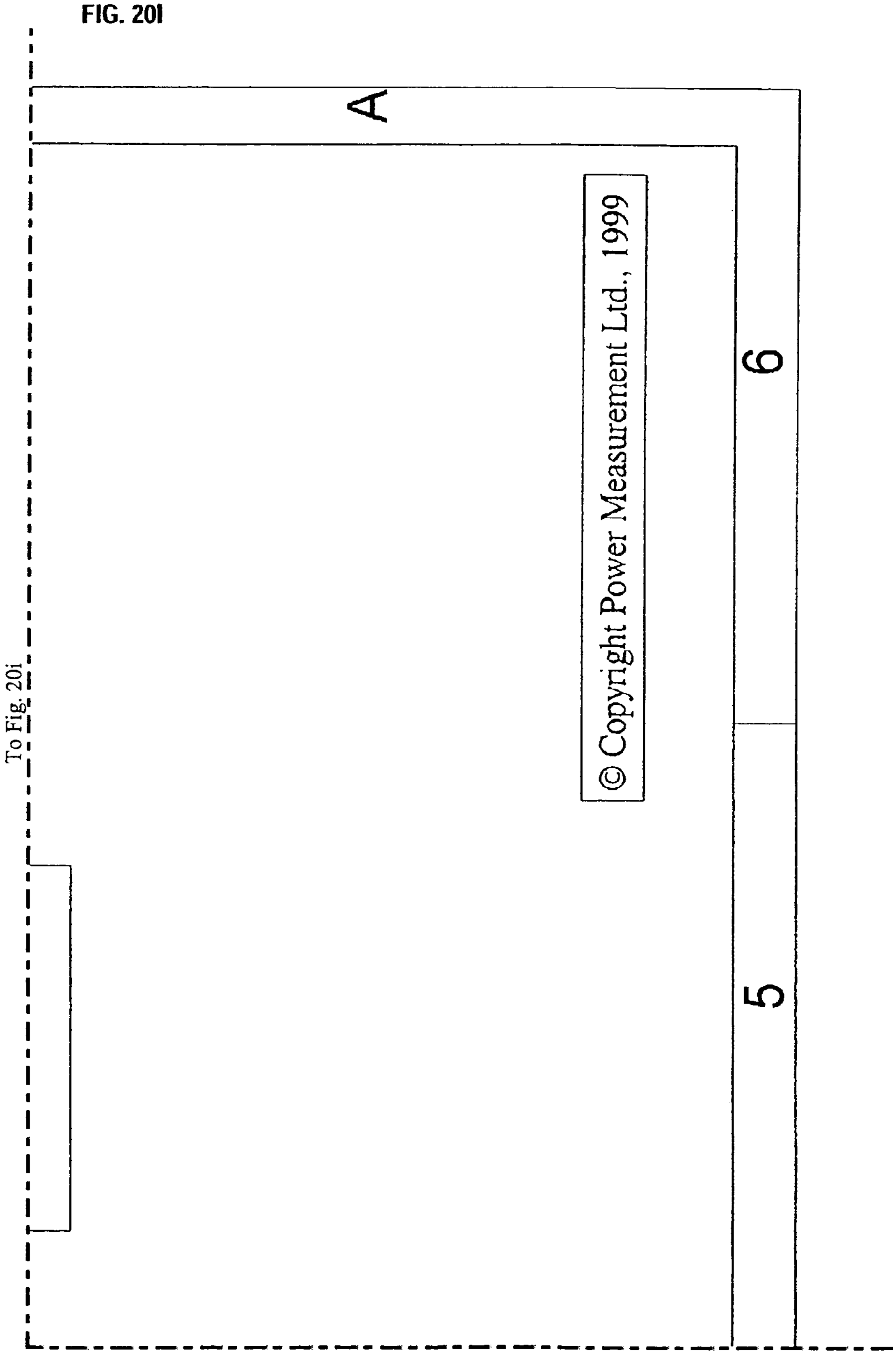
Figure 21A:
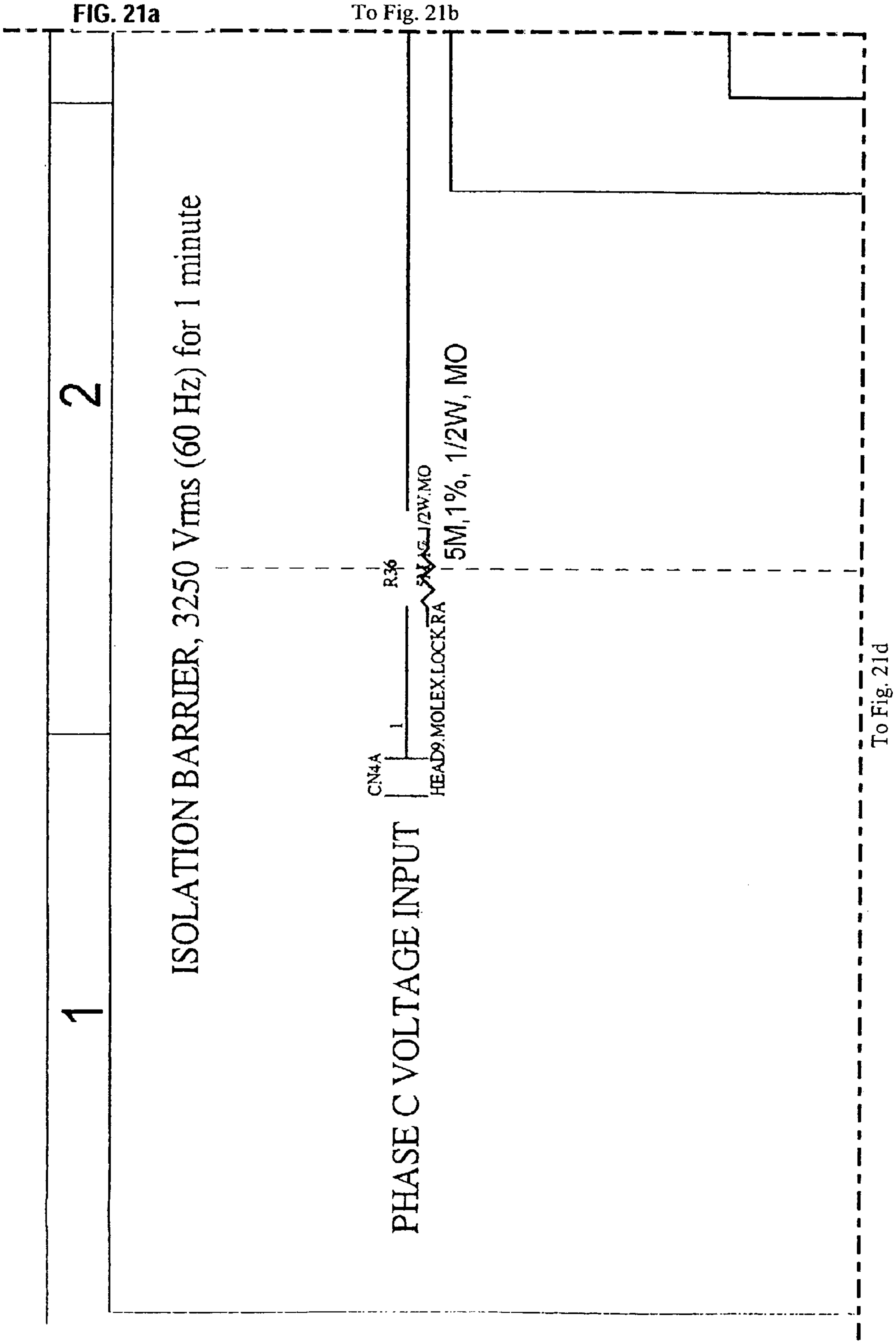
Figure 21B:
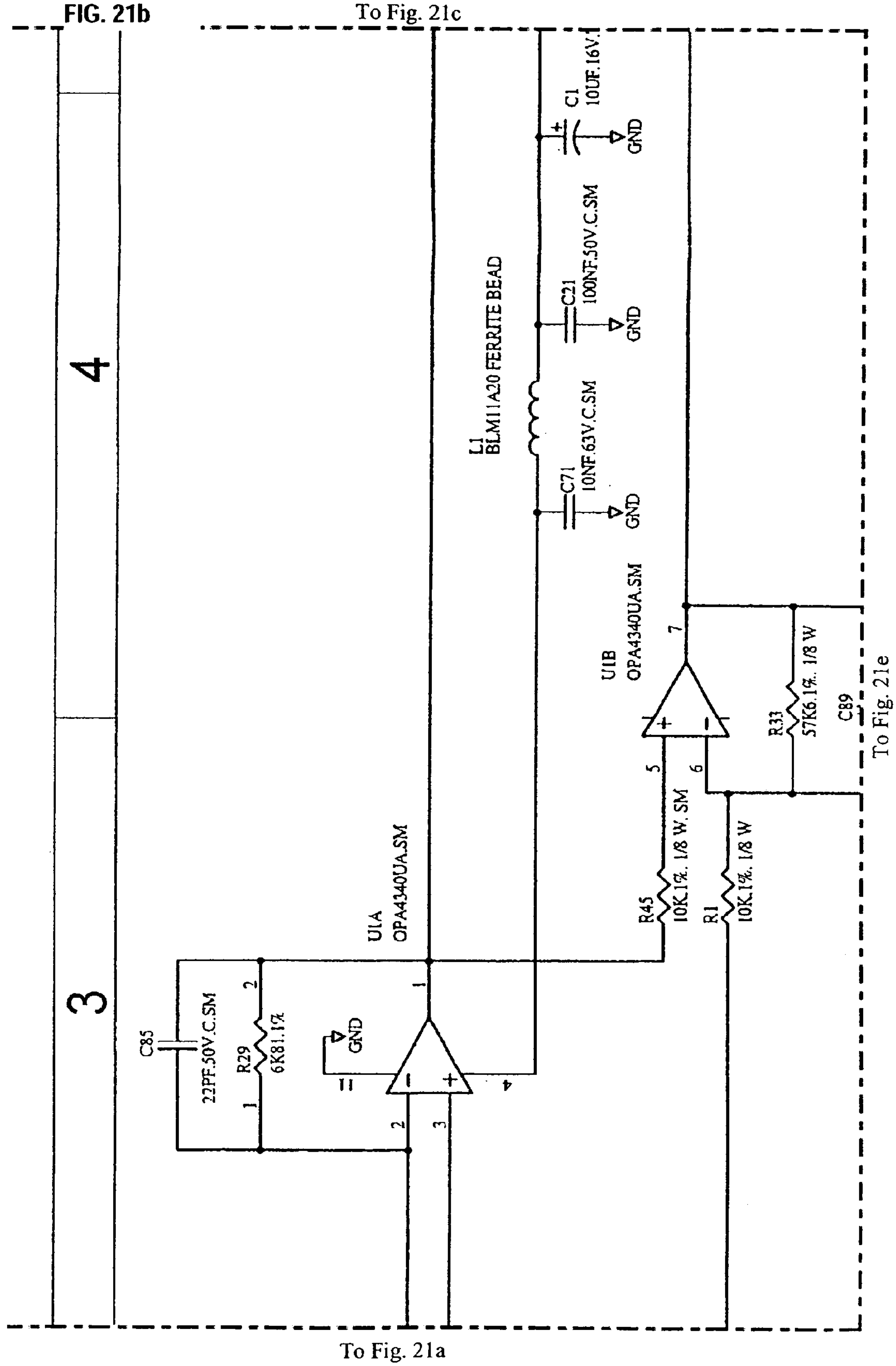
Figure 21C:
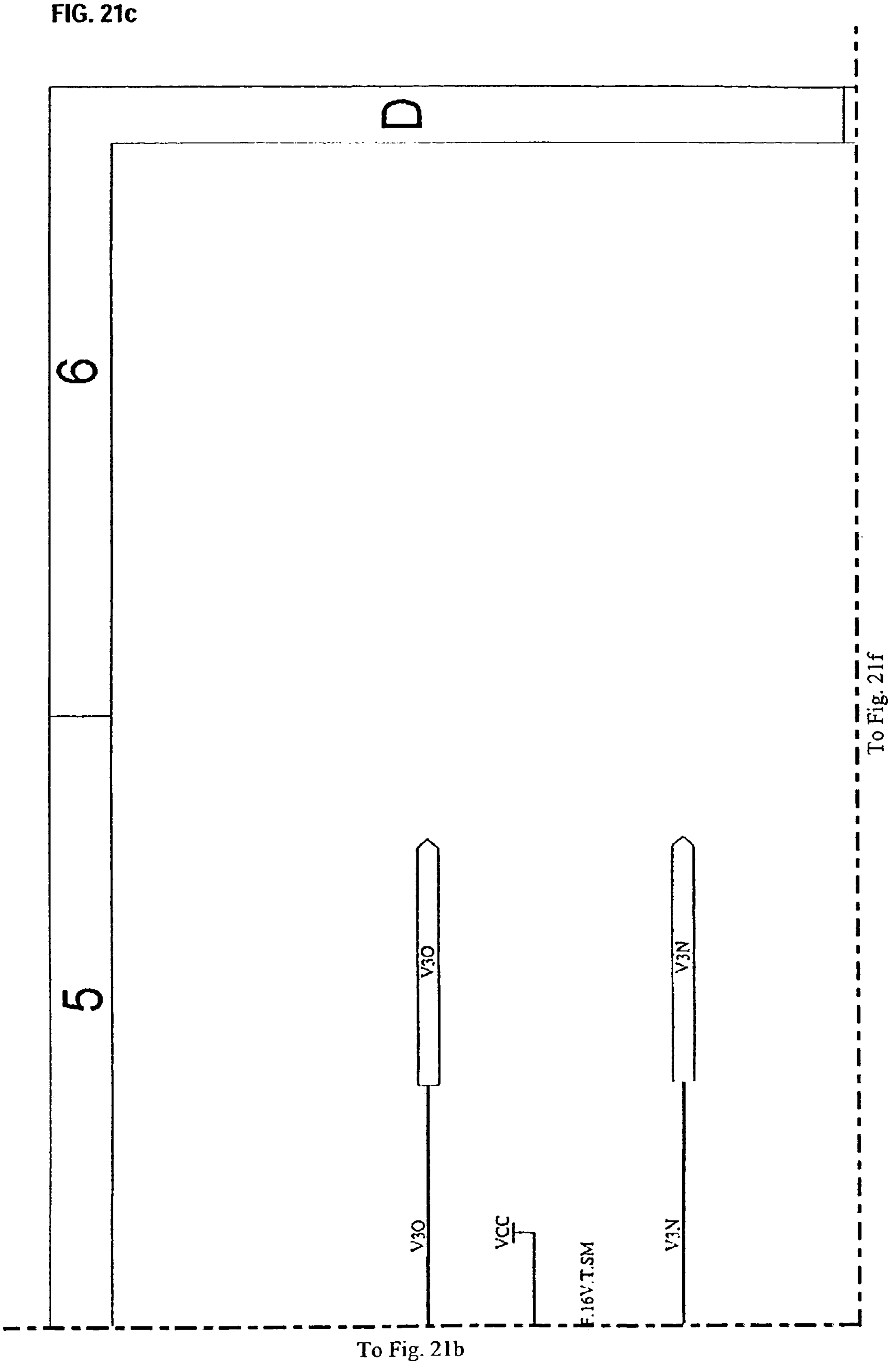
Figure 21D:
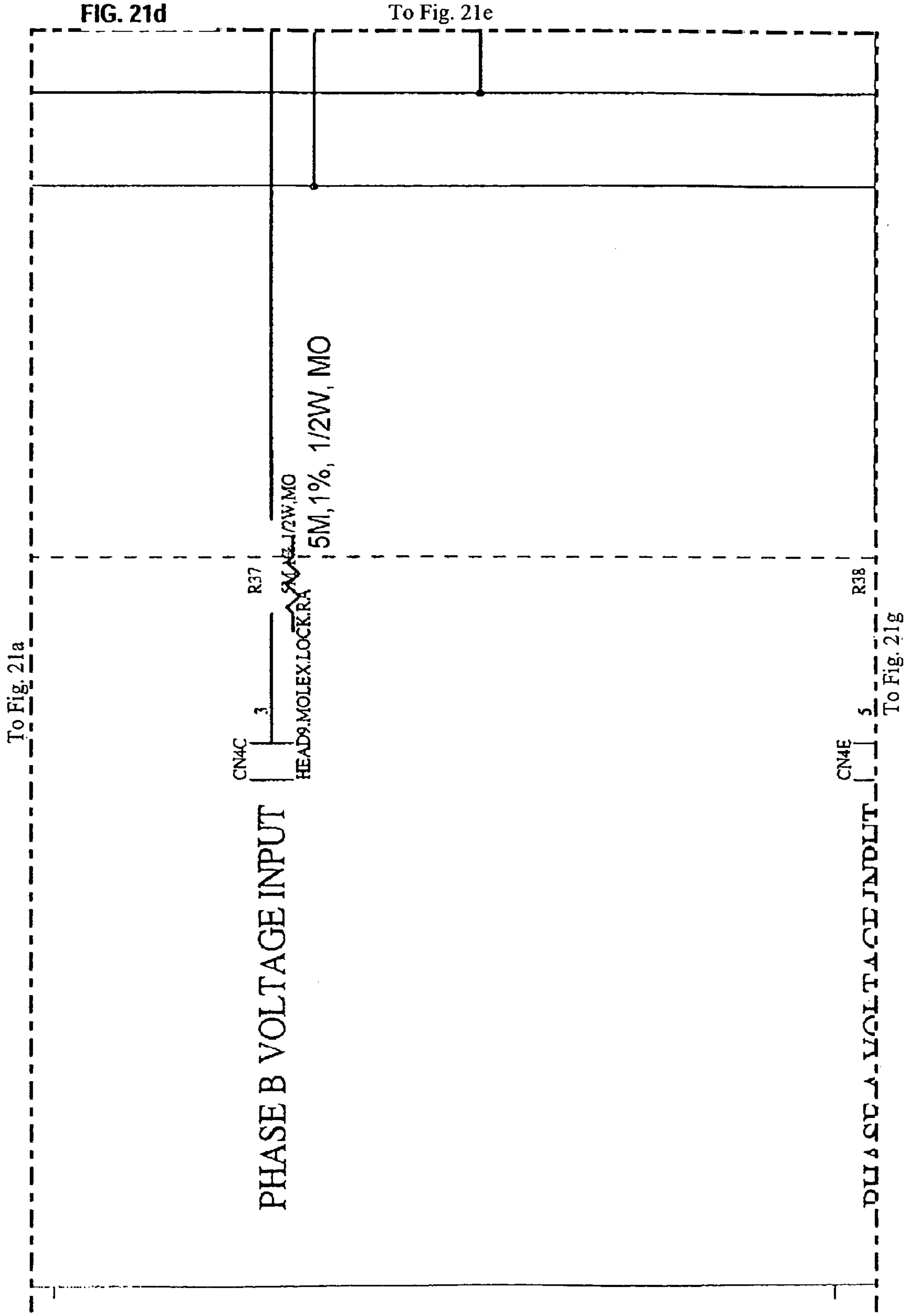
Figure 21E:
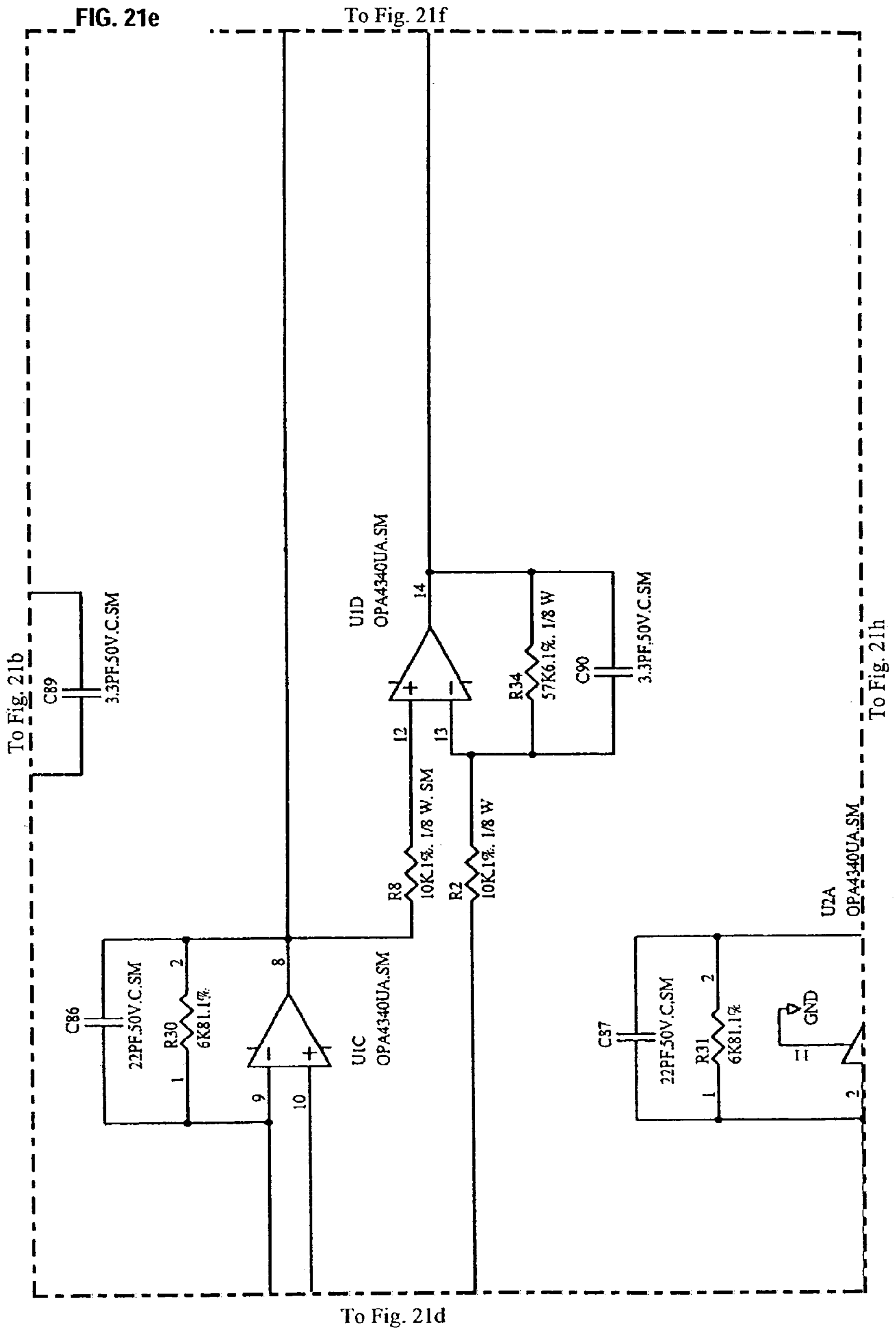
Figure 21F:
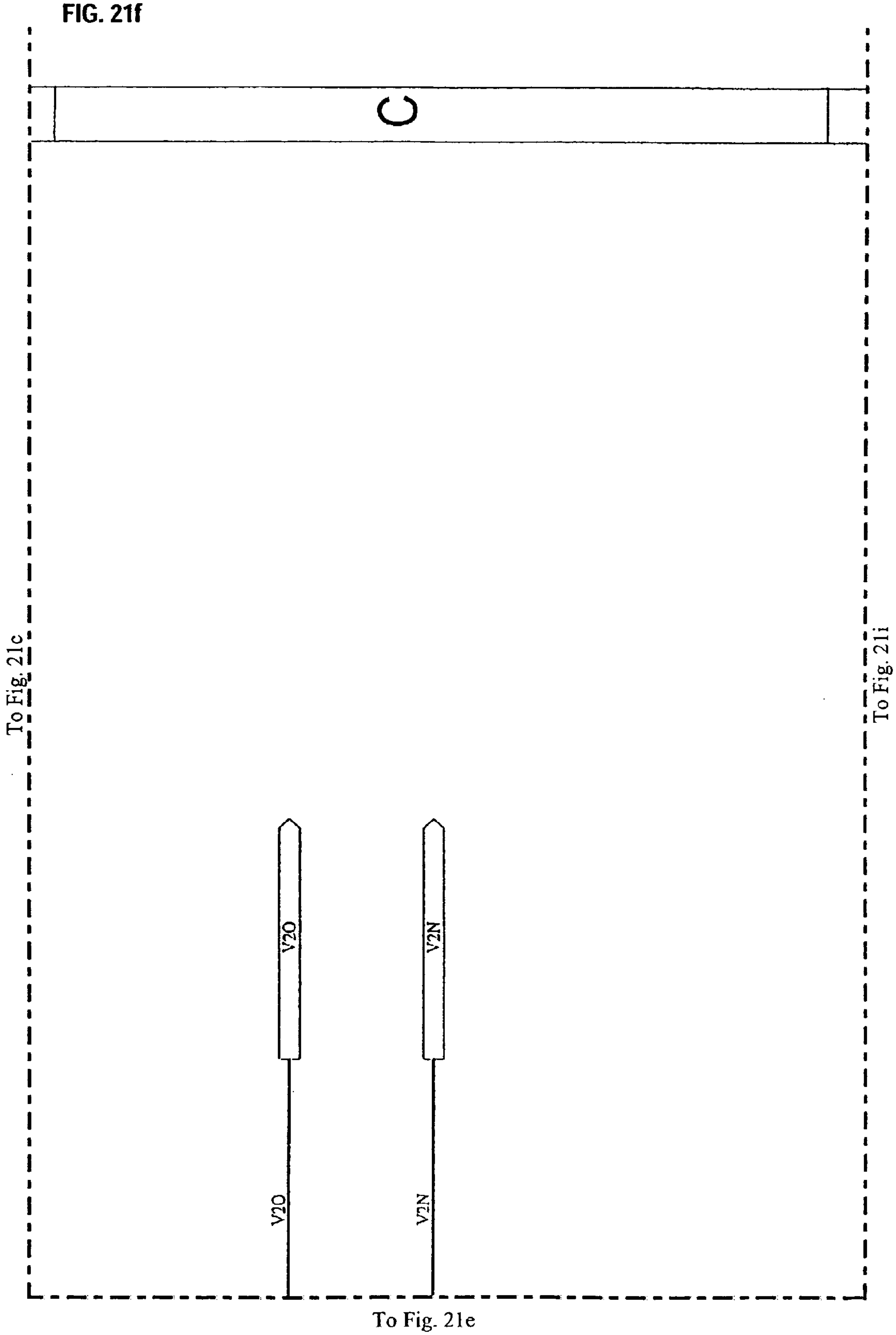
Figure 21G:
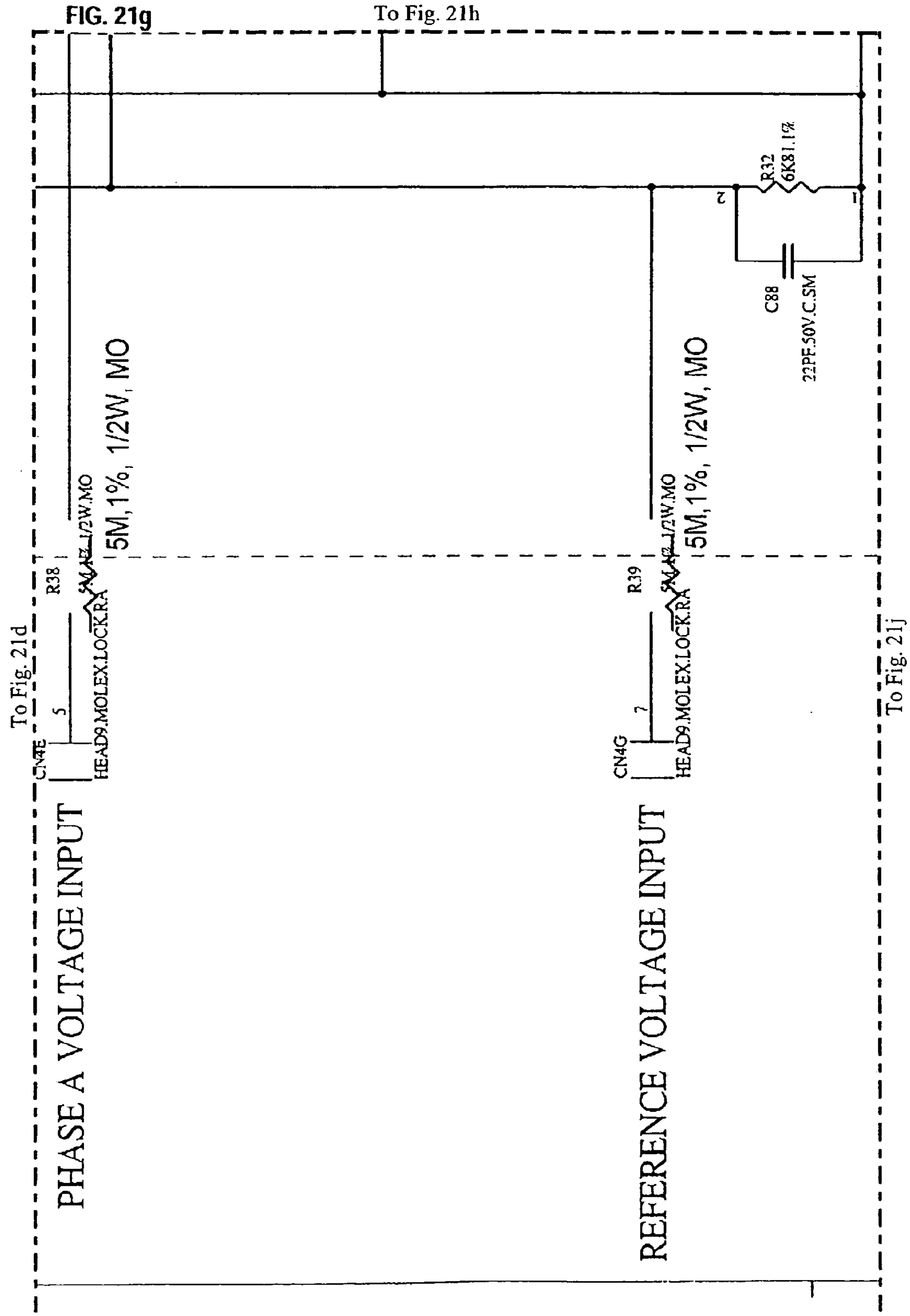
Figure 21H:
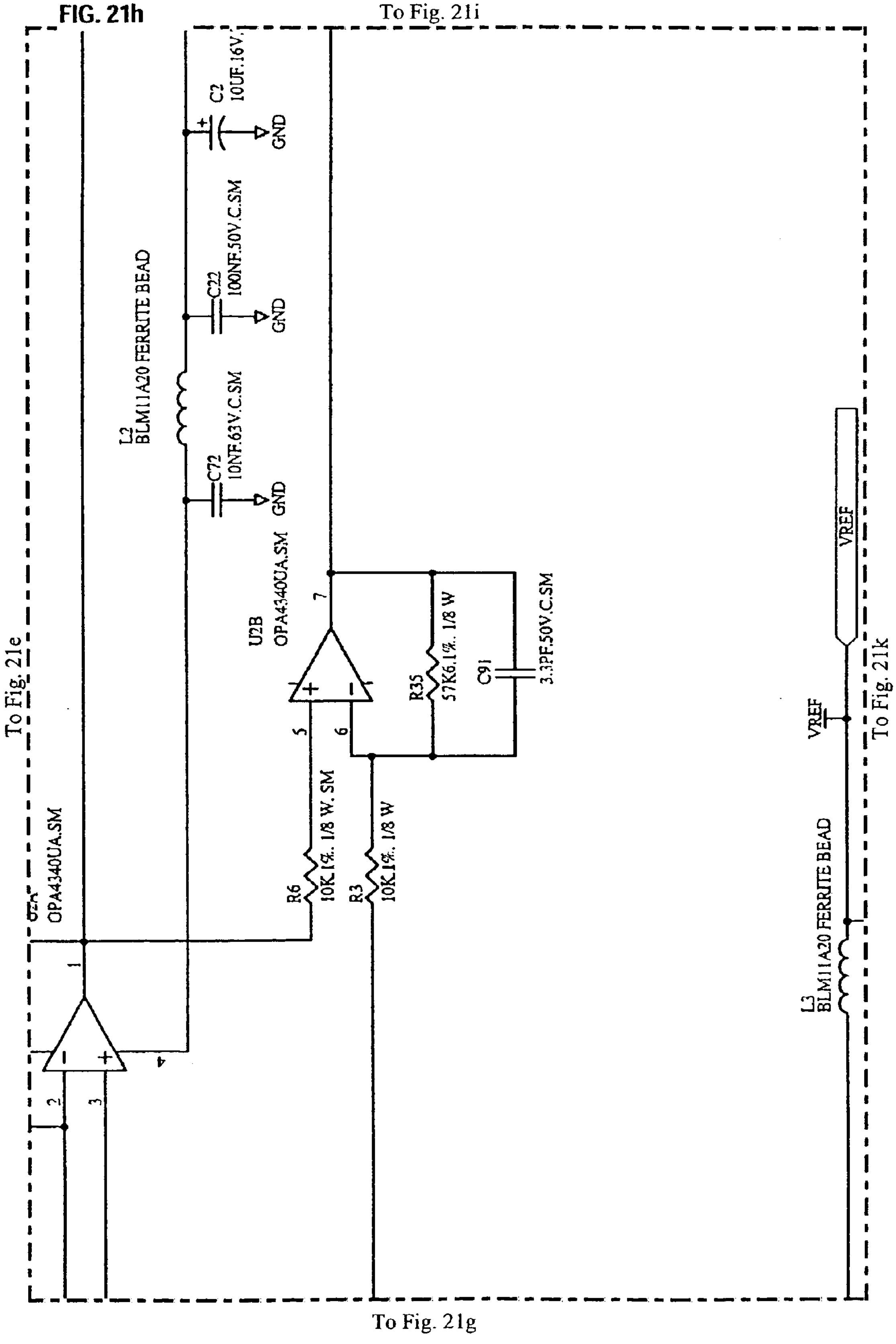
Figure 21I:
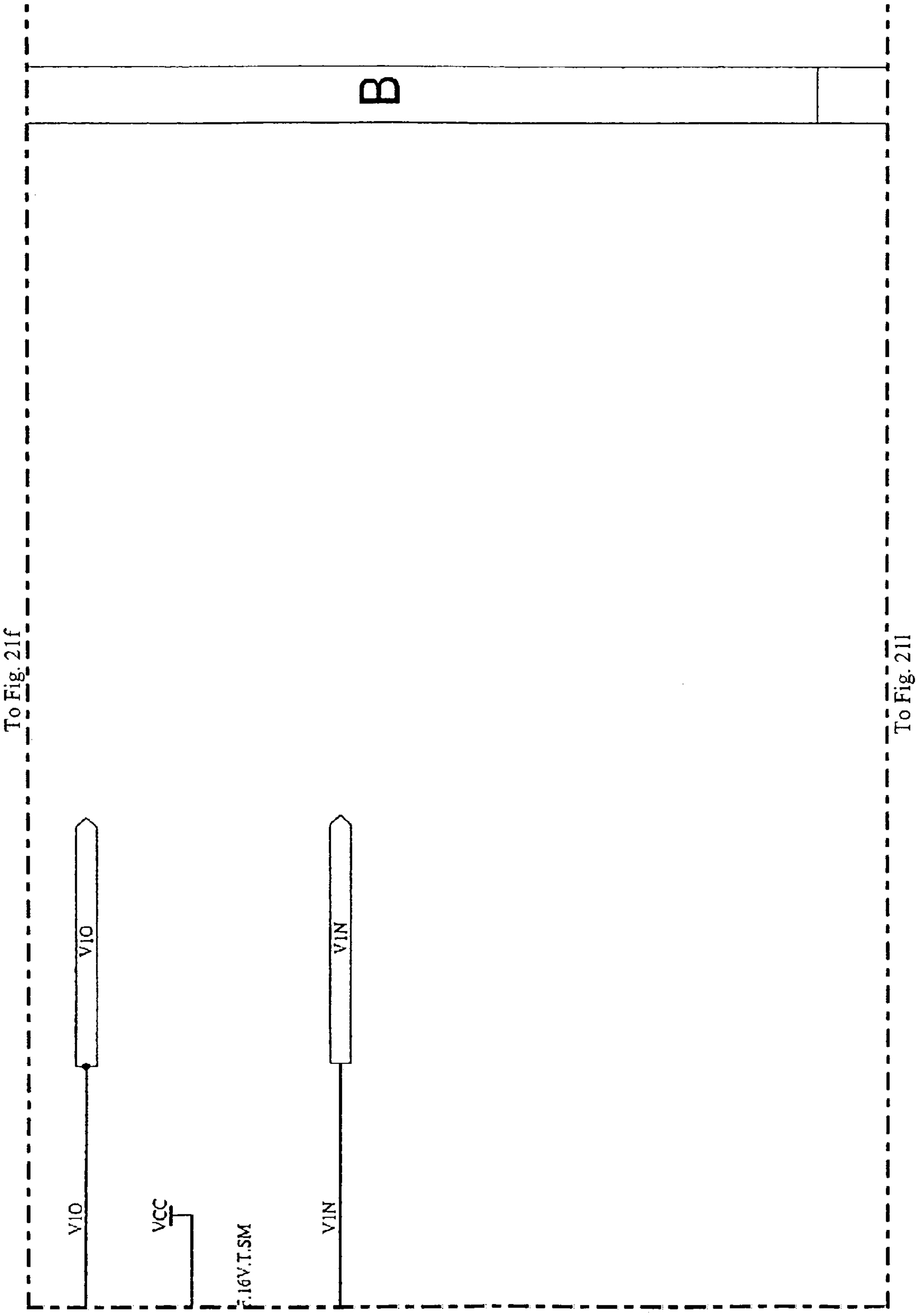
Figure 21J:
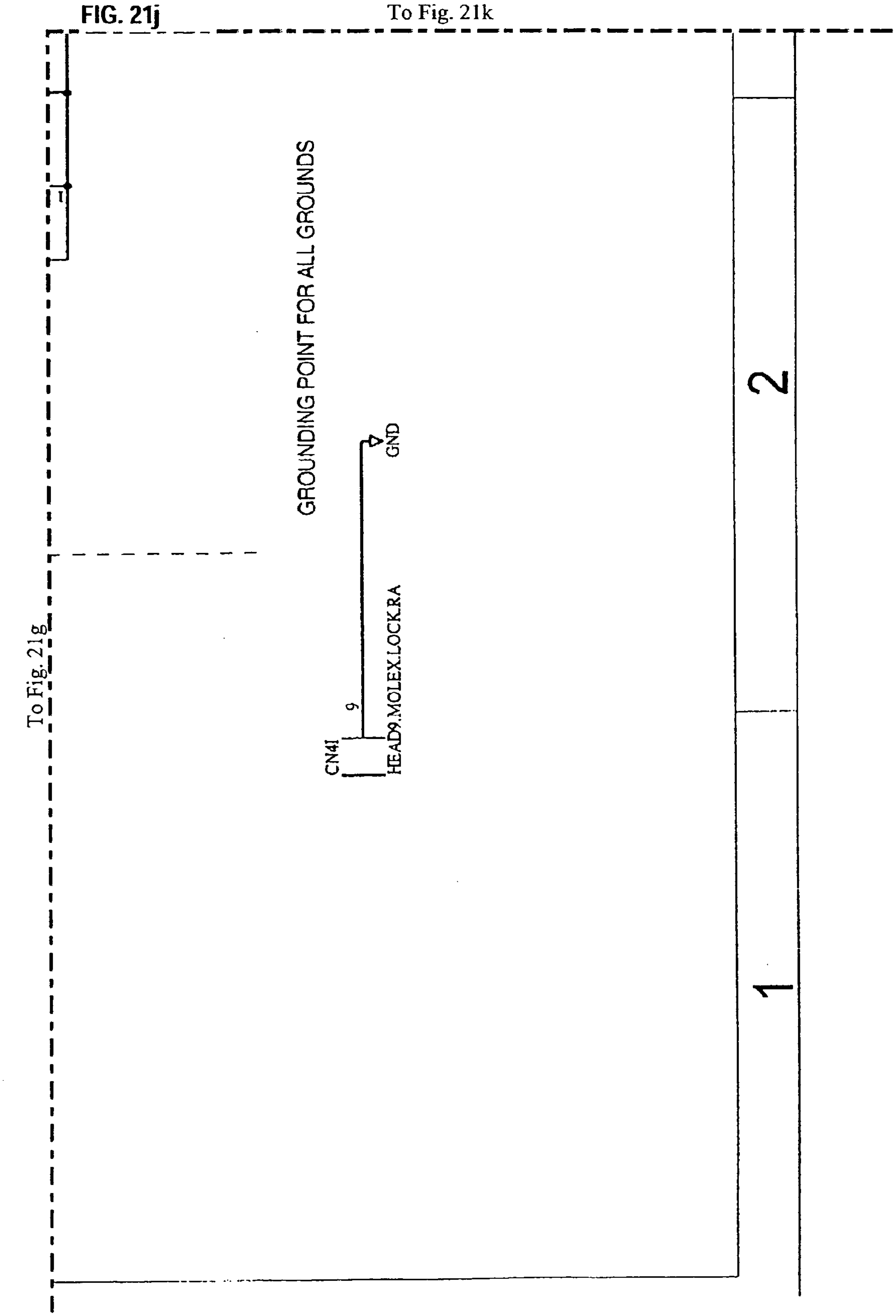
Figure 21K:
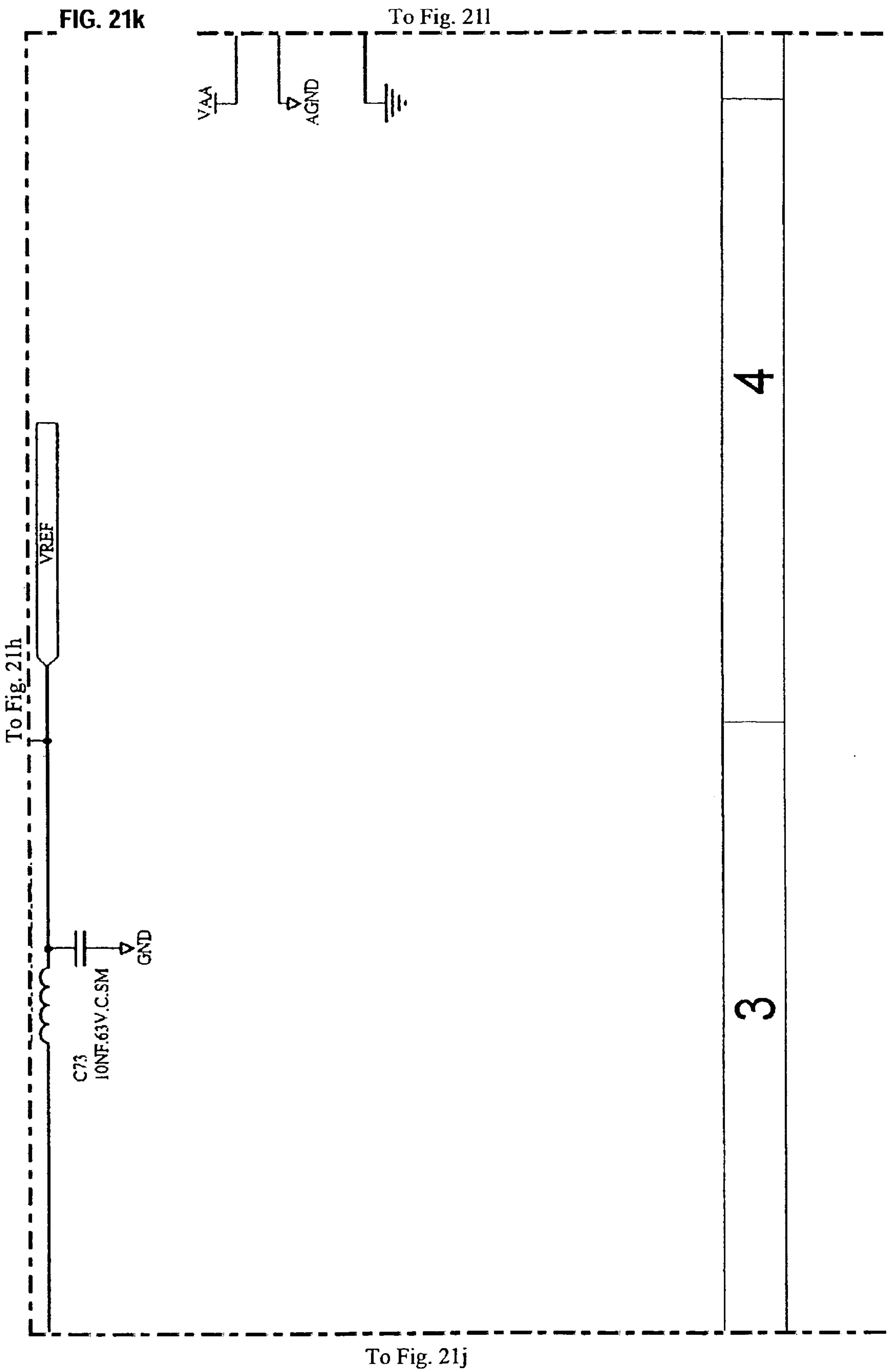
Figure 21L:
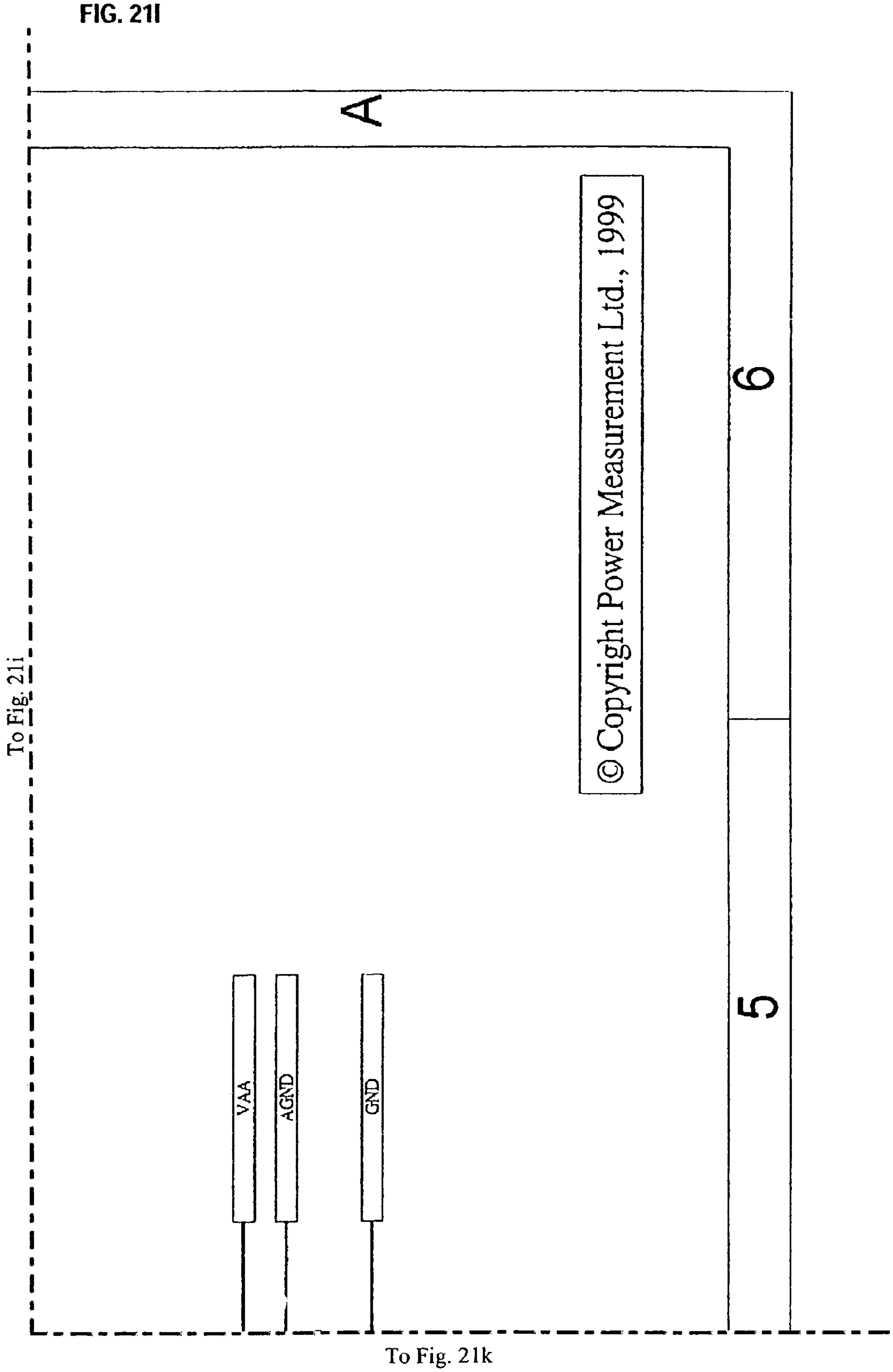
Figure 22A:
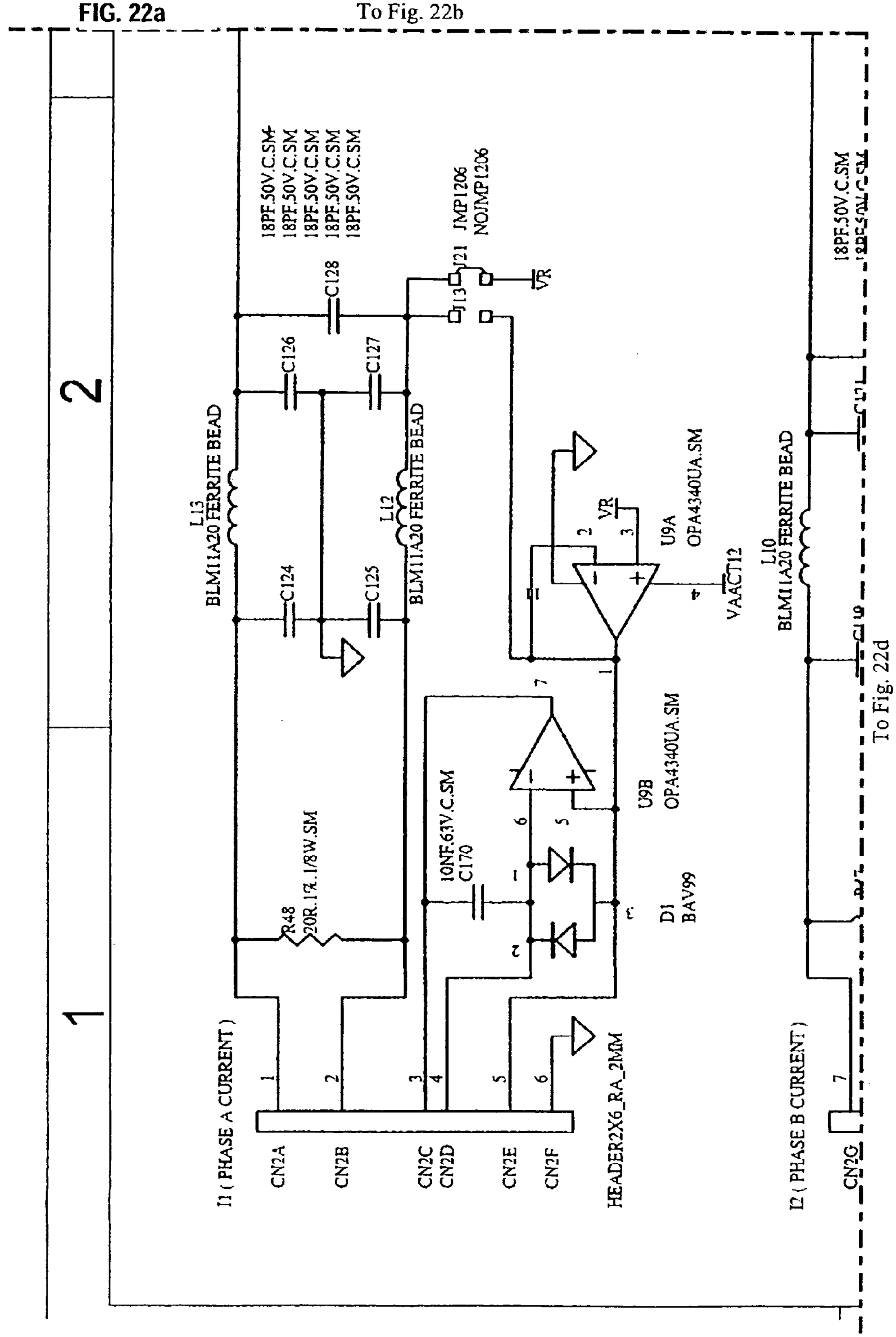
Figure 22B:
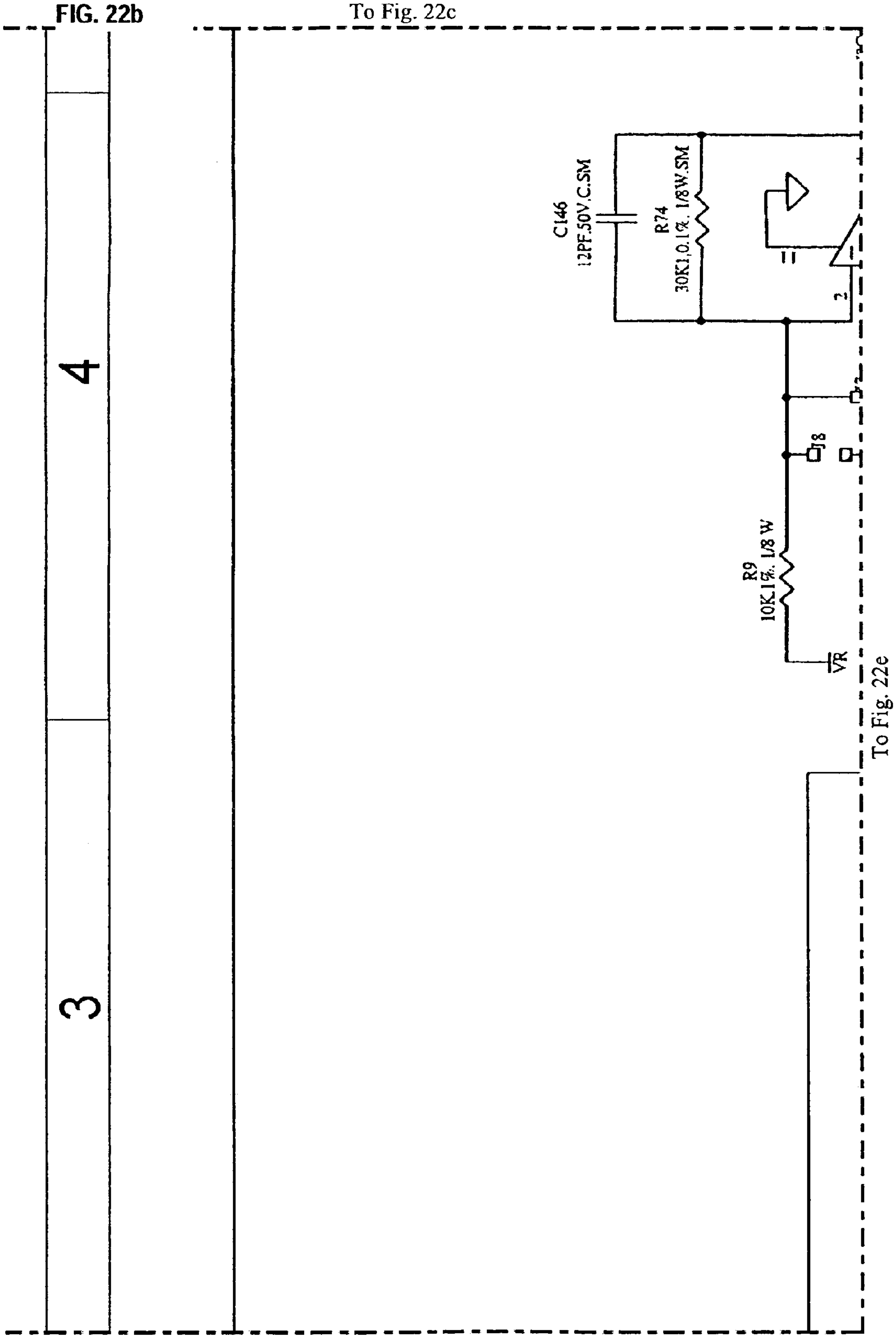
Figure 22C:
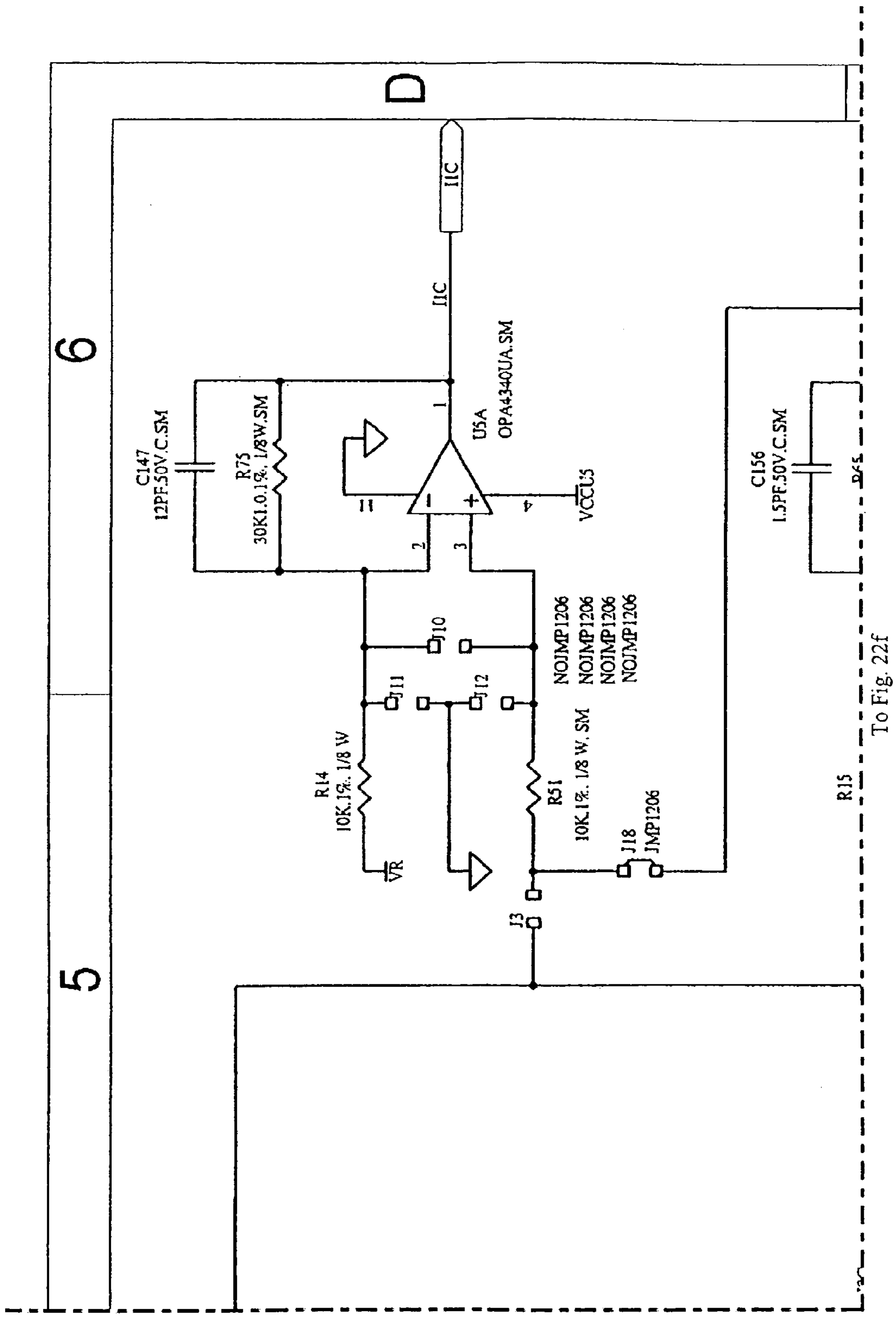
Figure 22D:
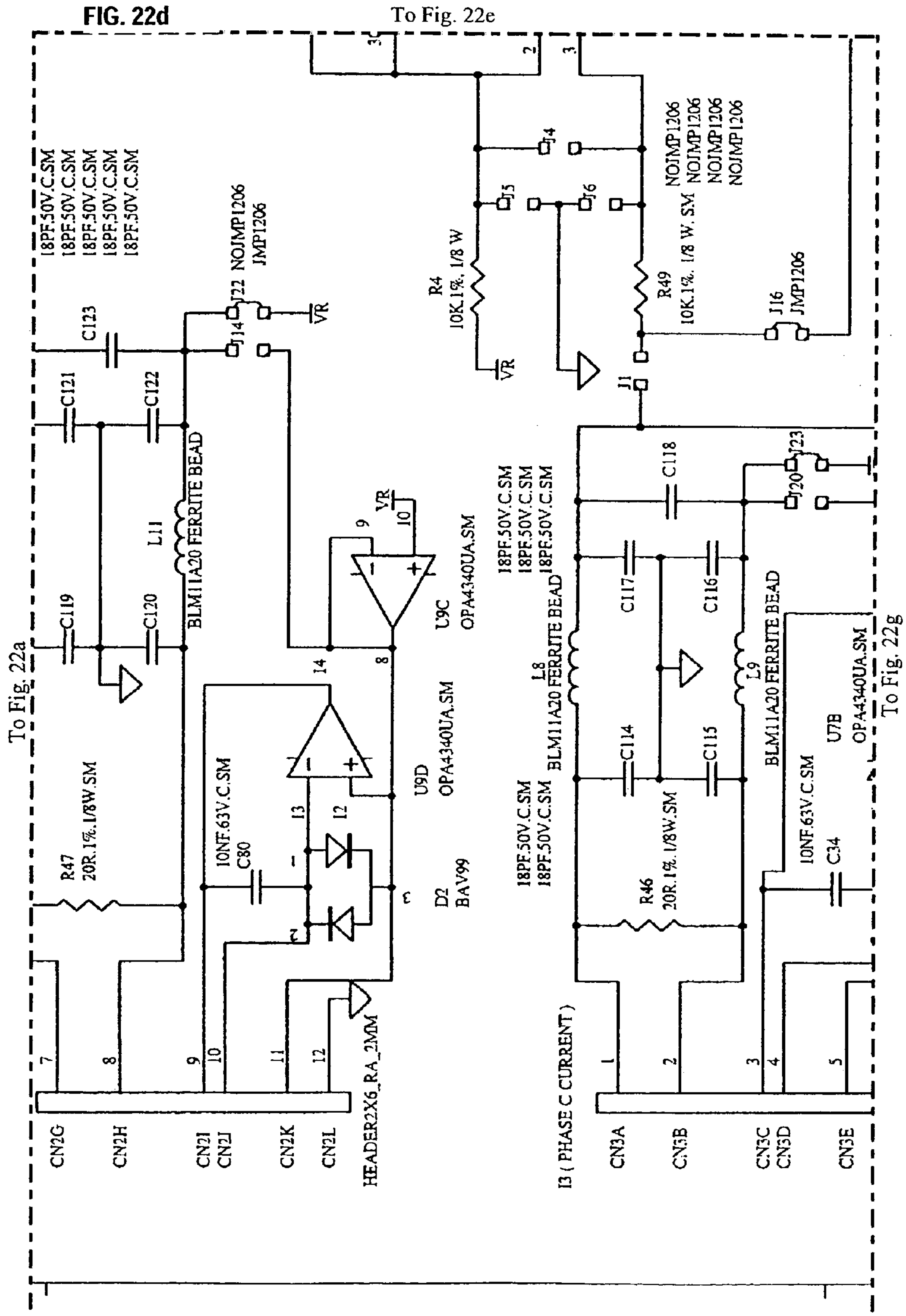
Figure 22E:
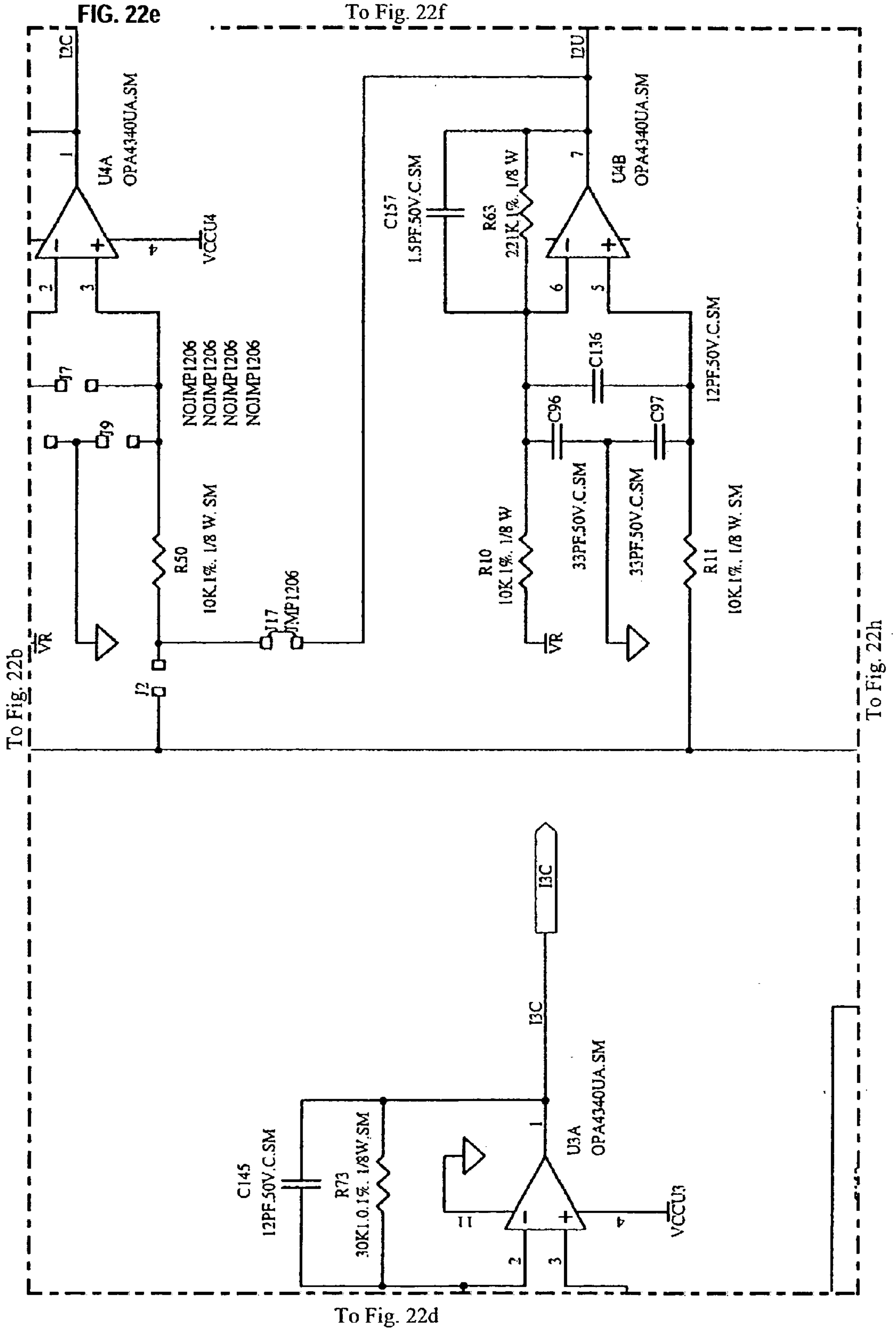
Figure 22F:
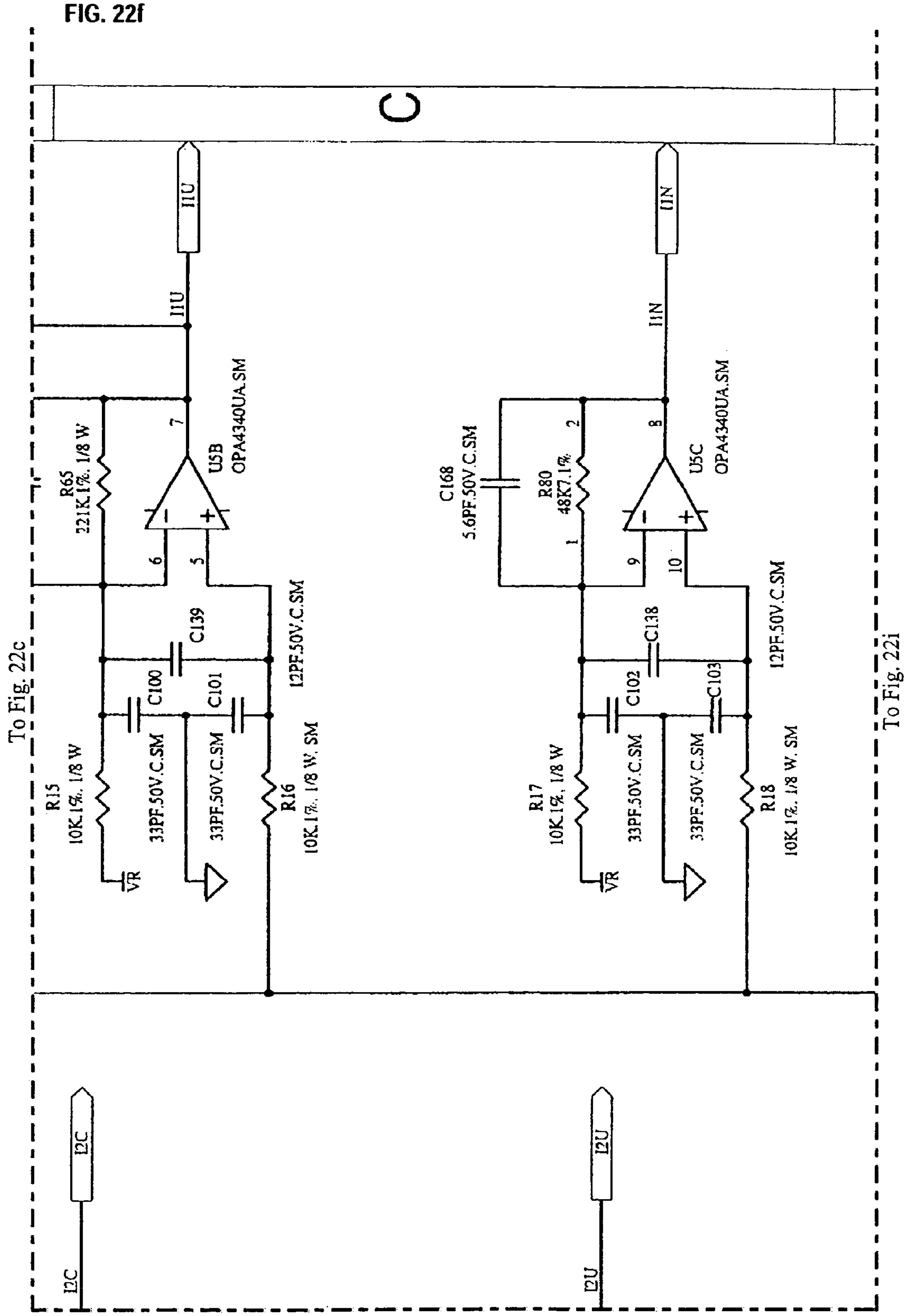
Figure 22G:
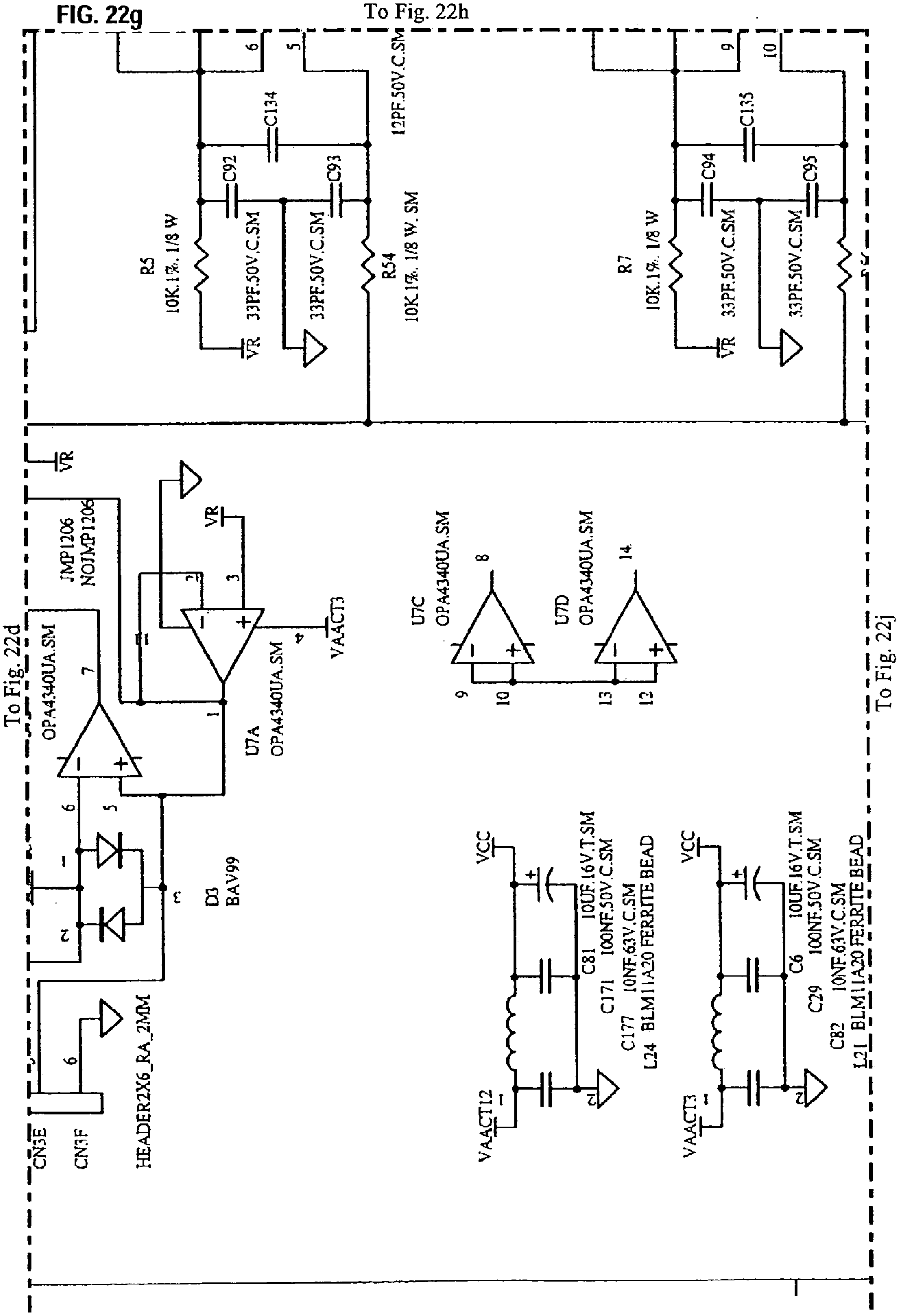
Figure 22H:
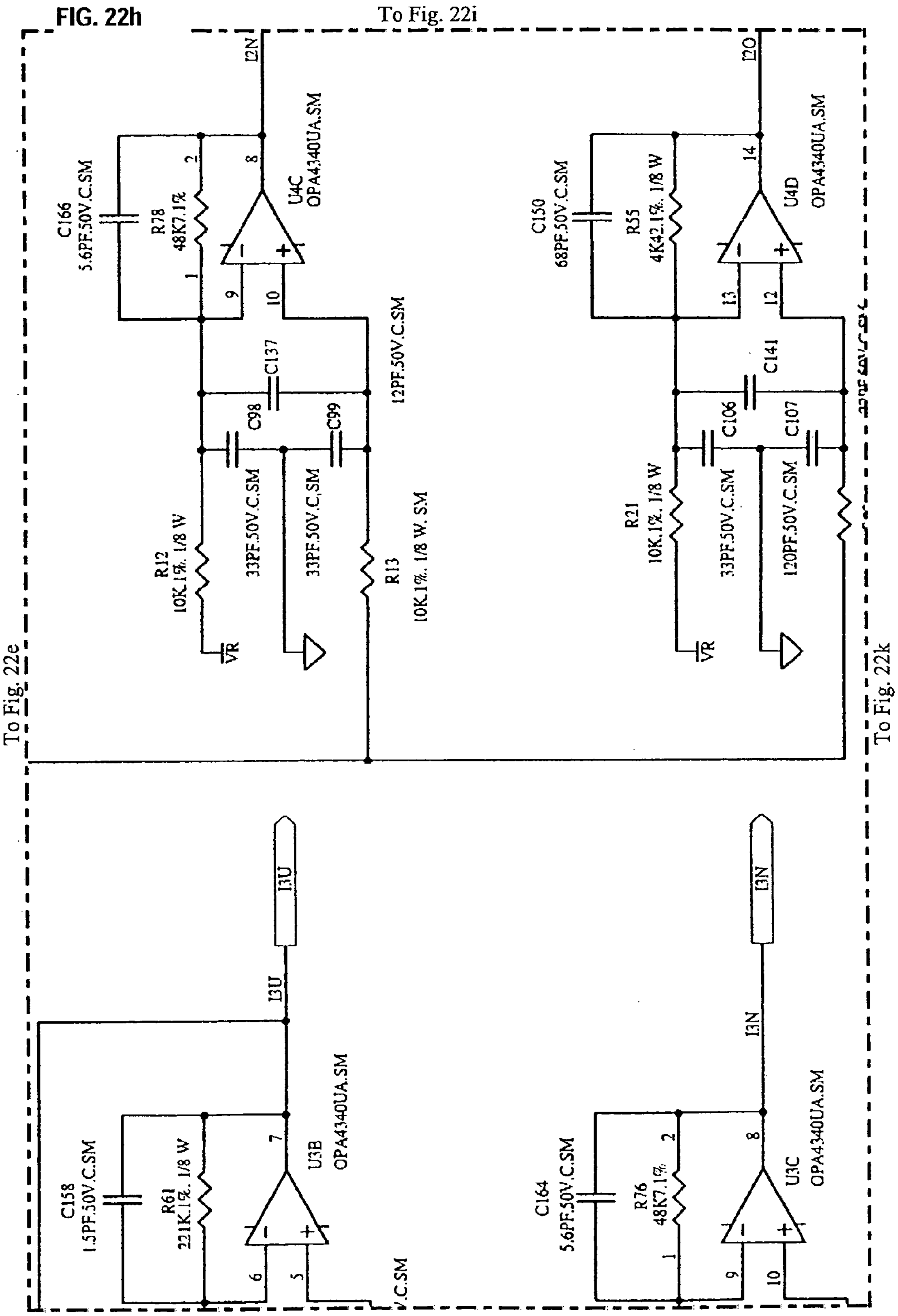
Figure 22I:
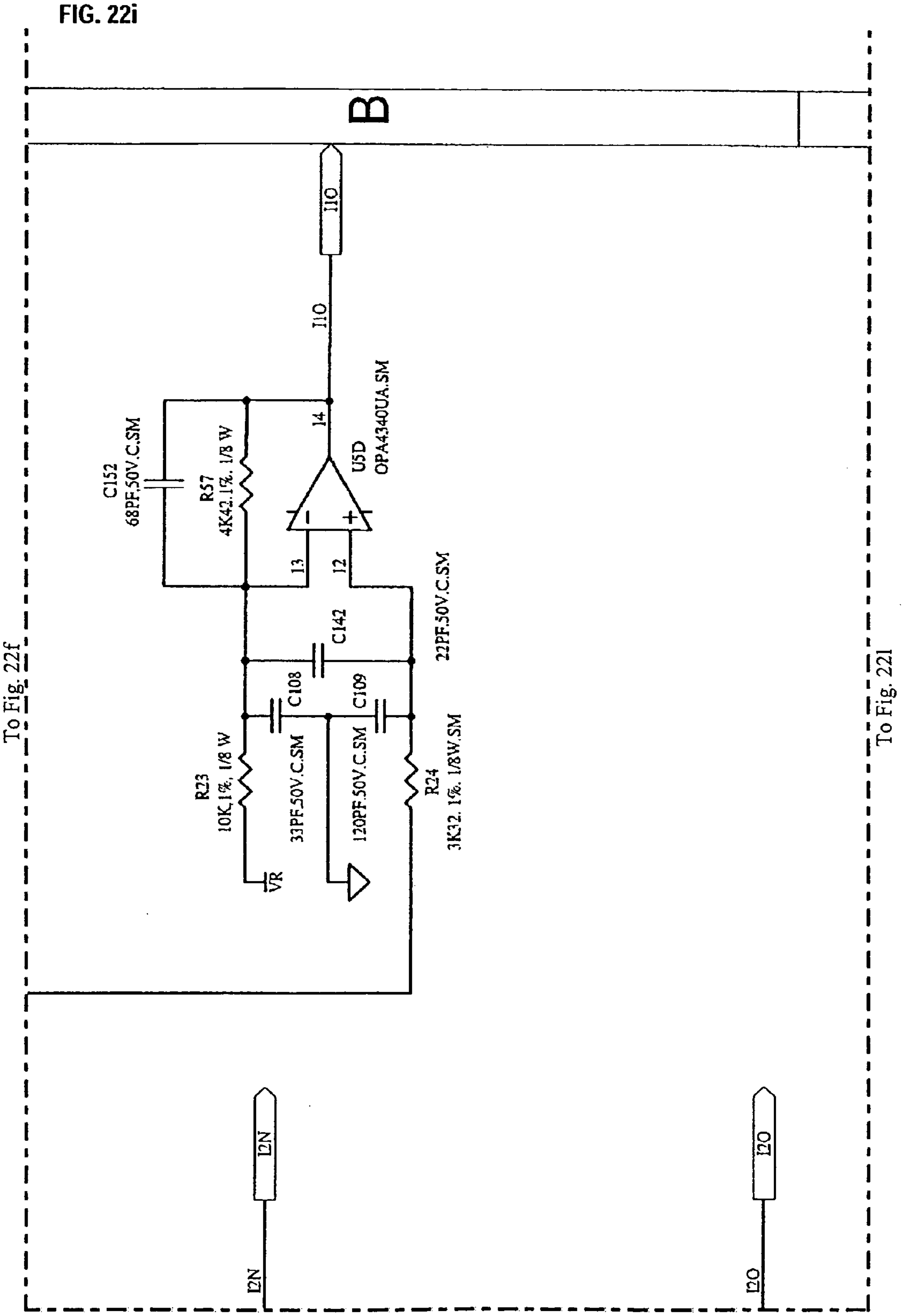
Figure 22J:
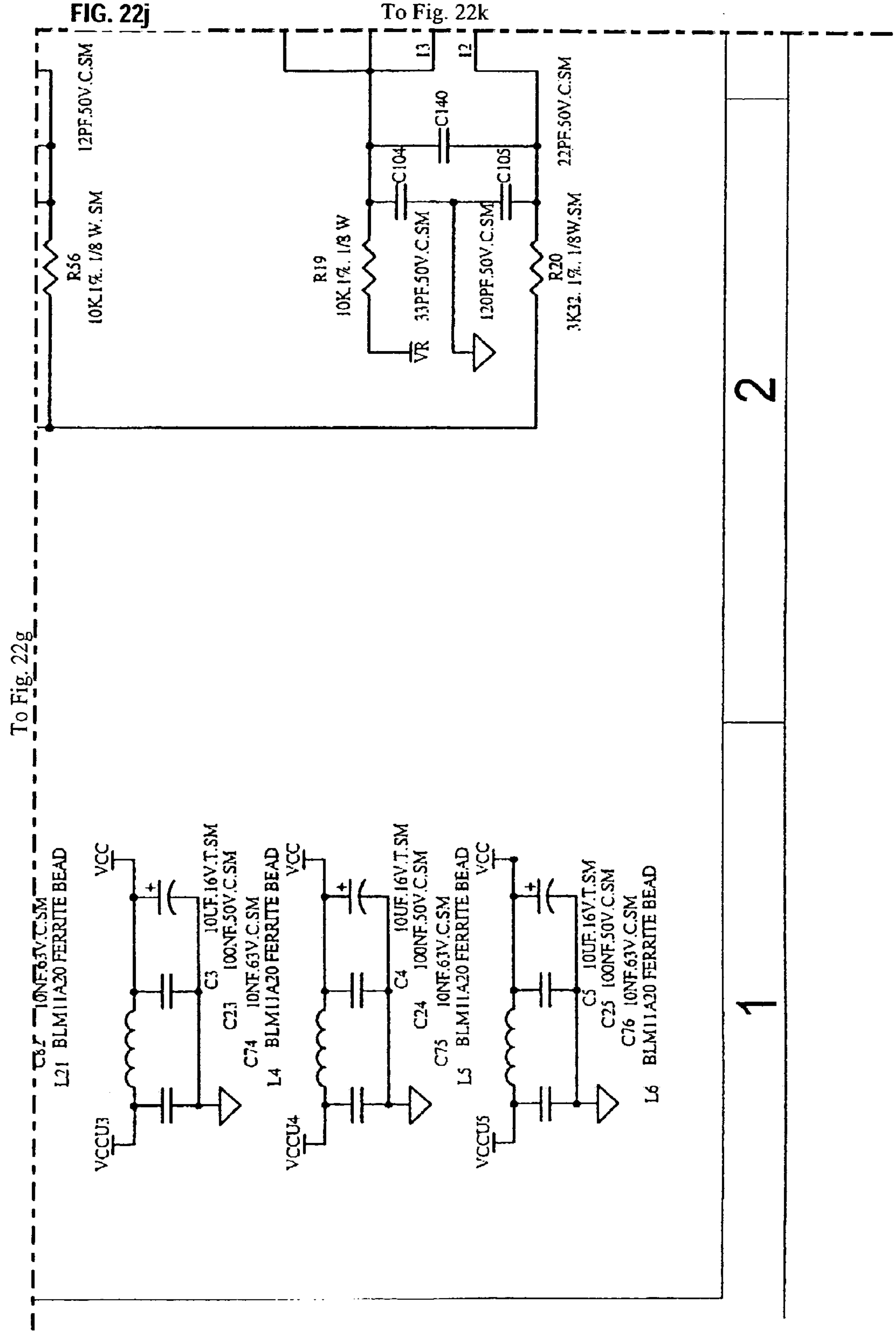
Figure 22K:
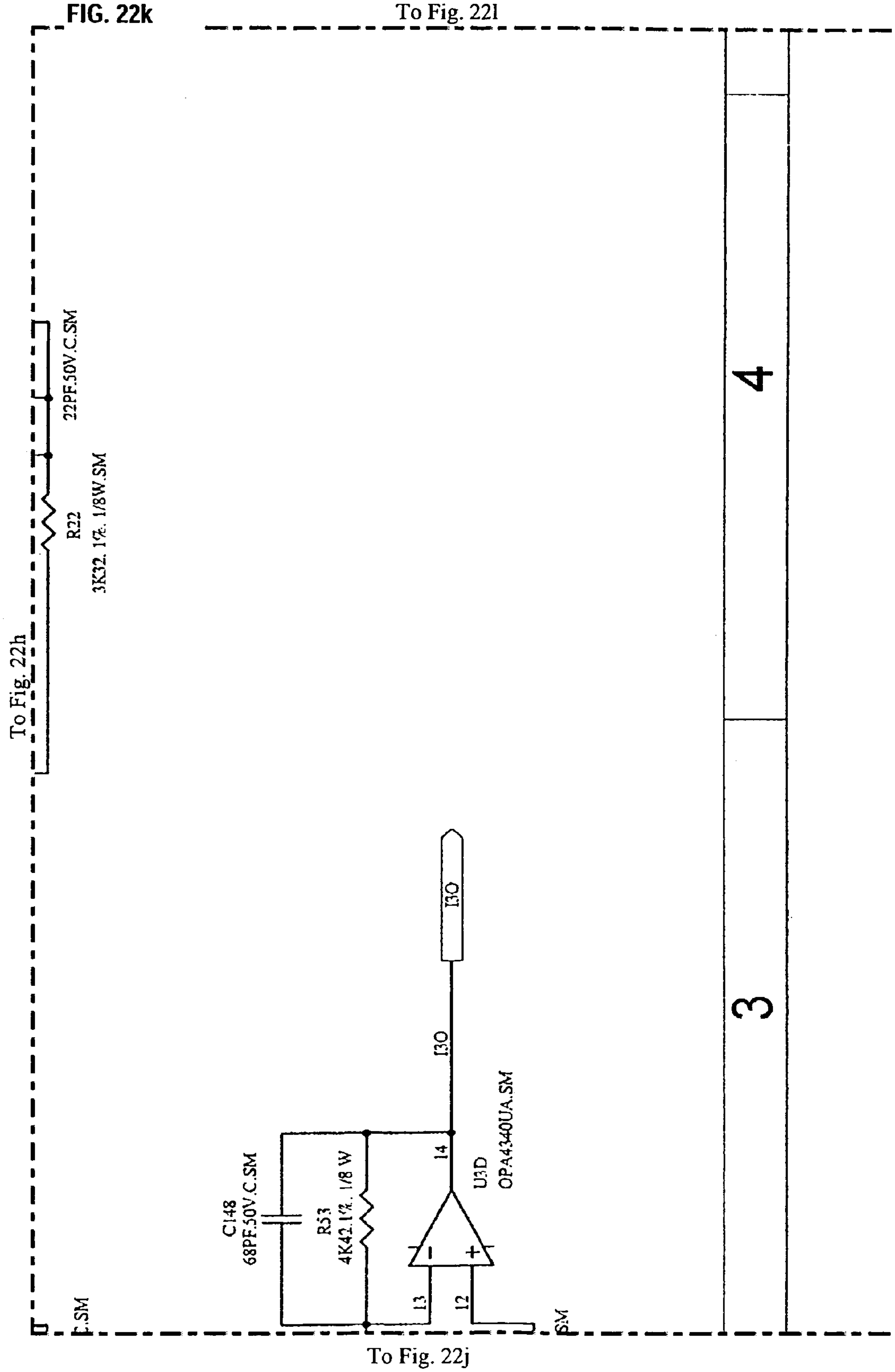
Figure 22L:
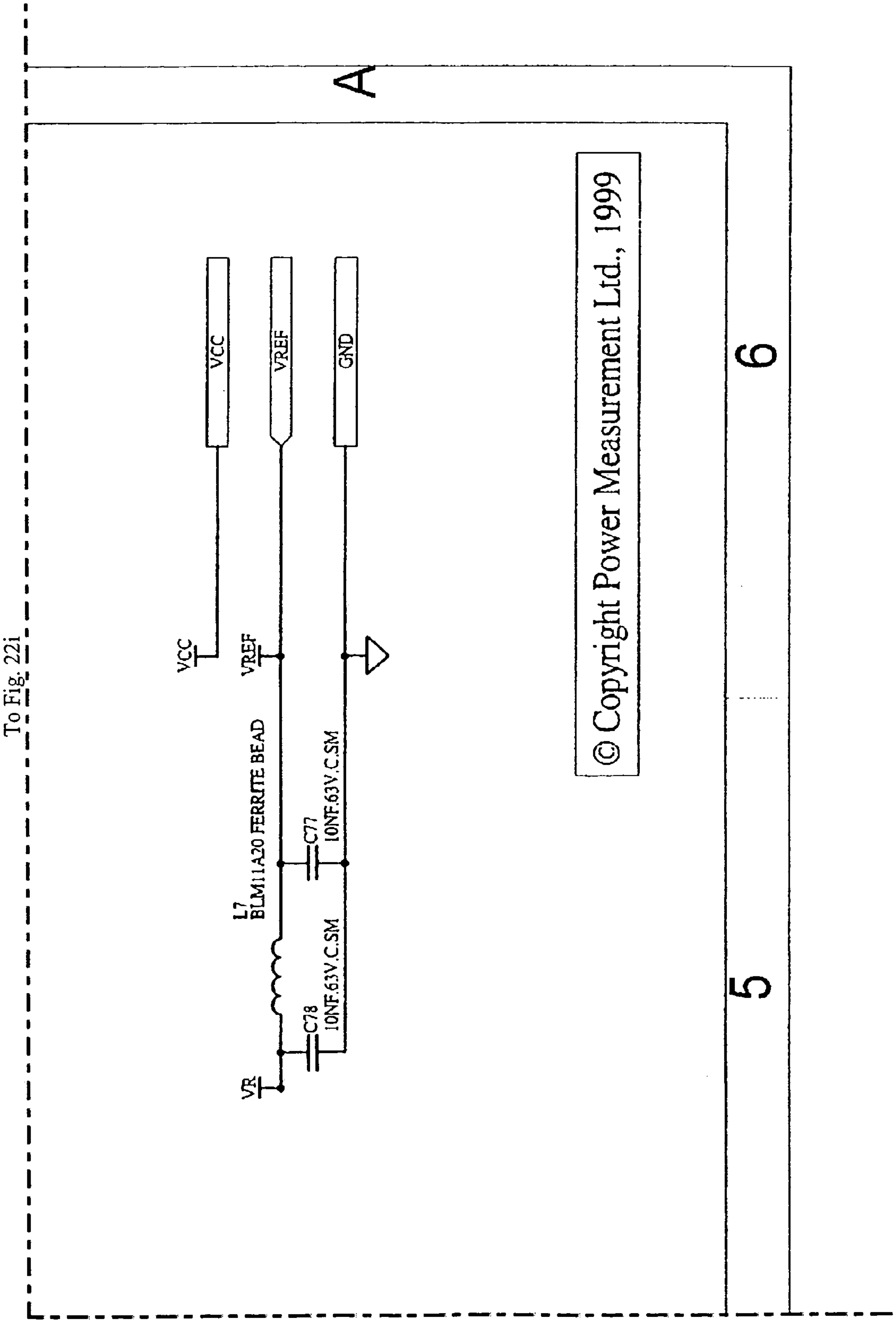
Figure 23A:
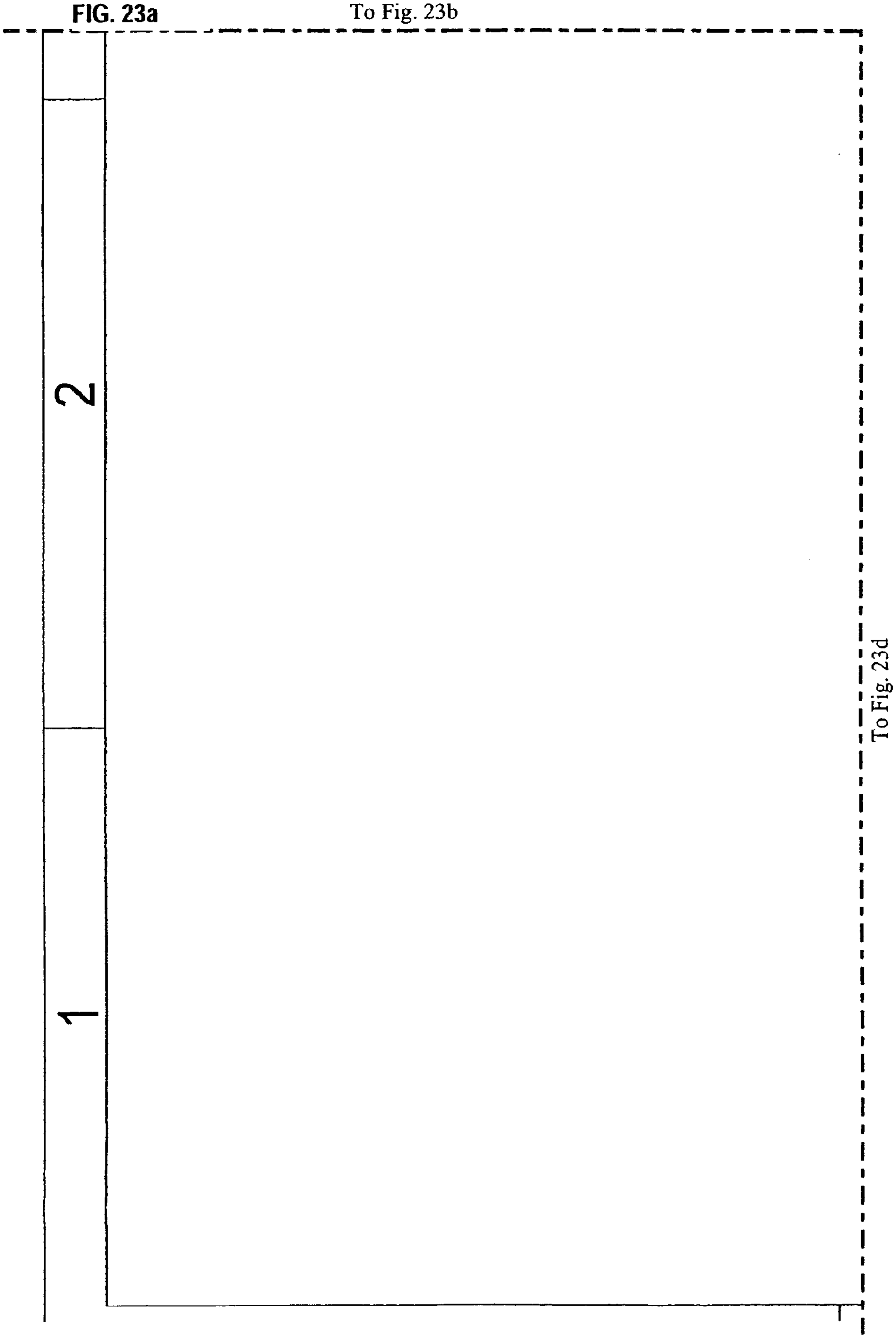
Figure 23B:
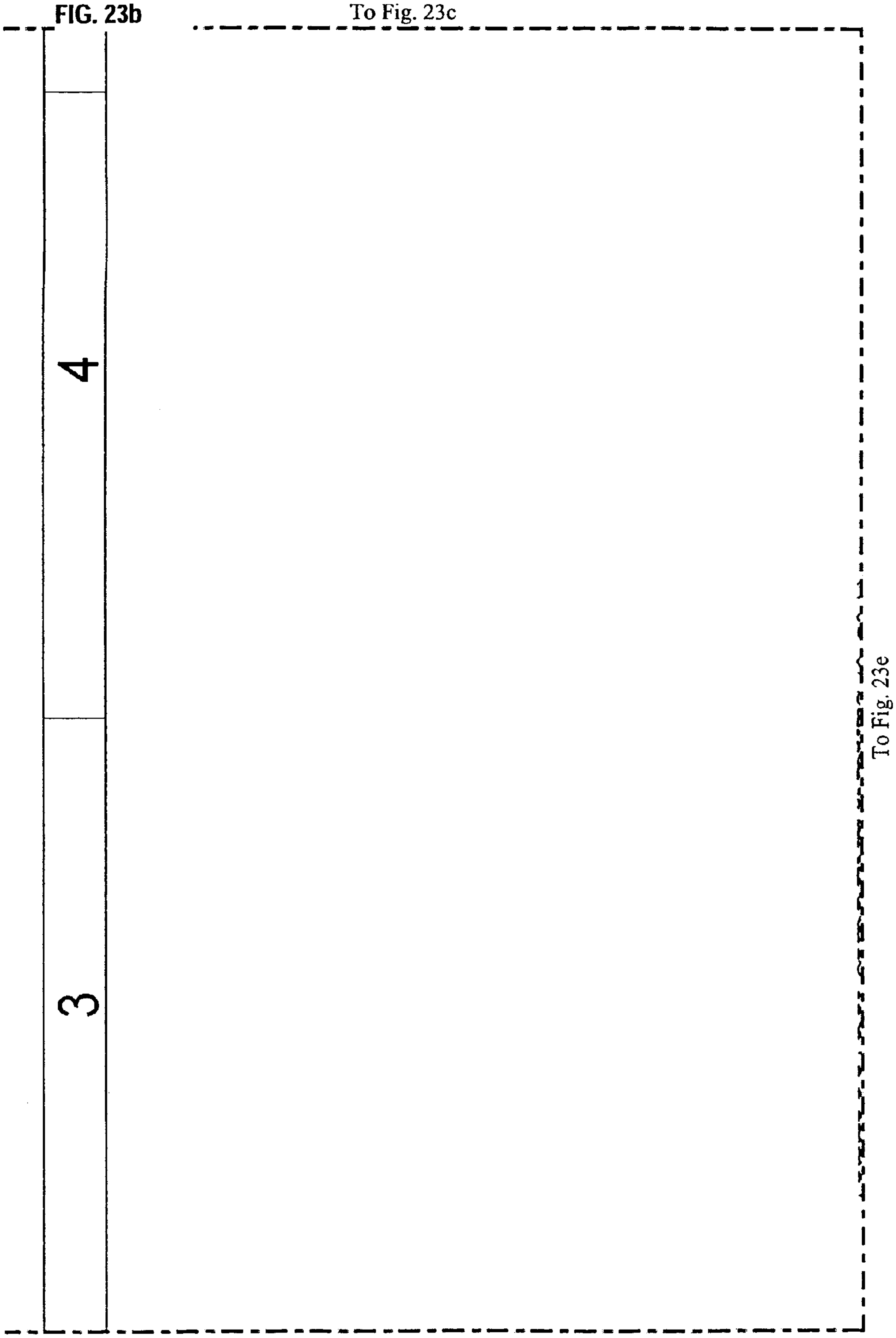
Figure 23C:
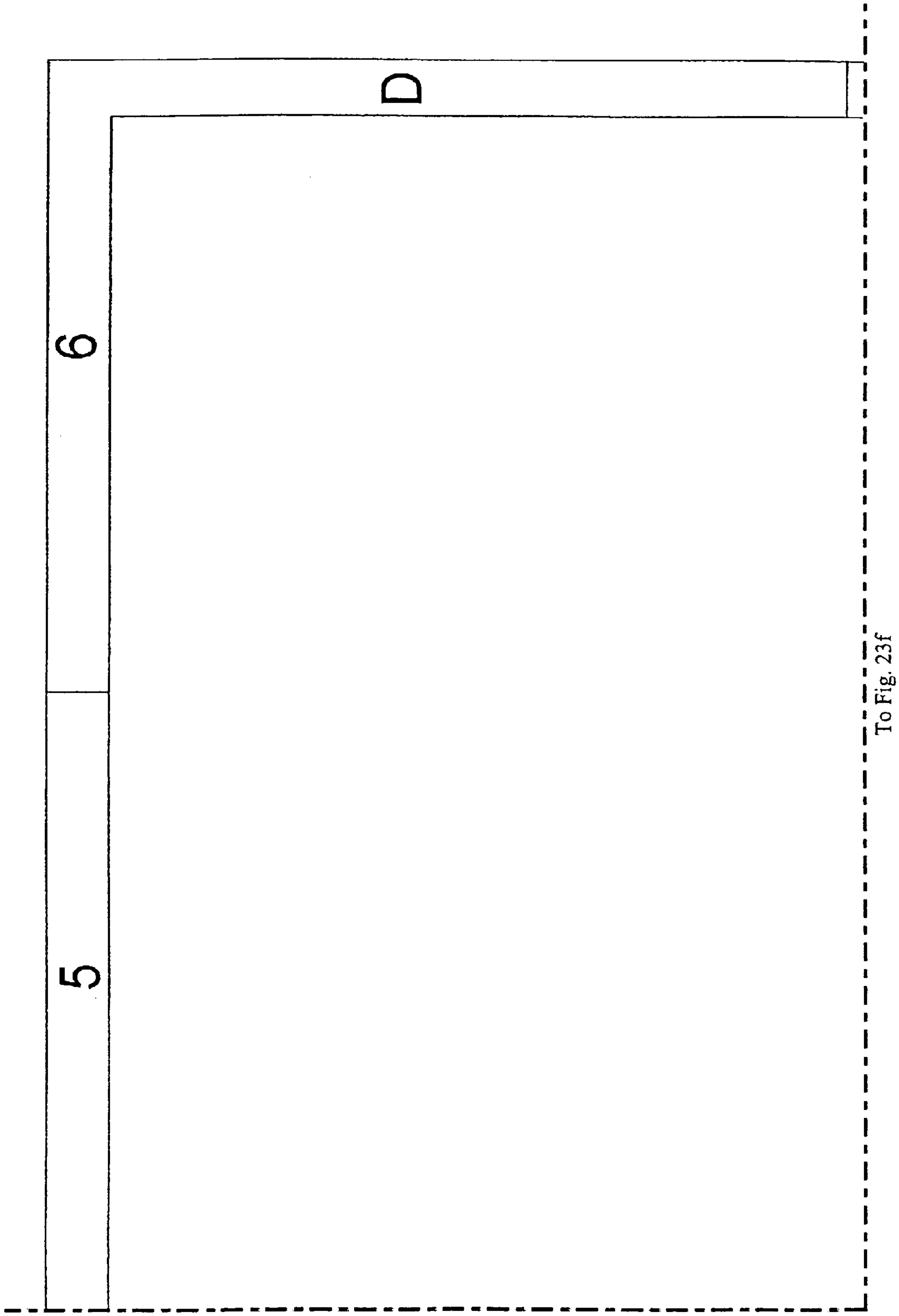
Figure 23D:
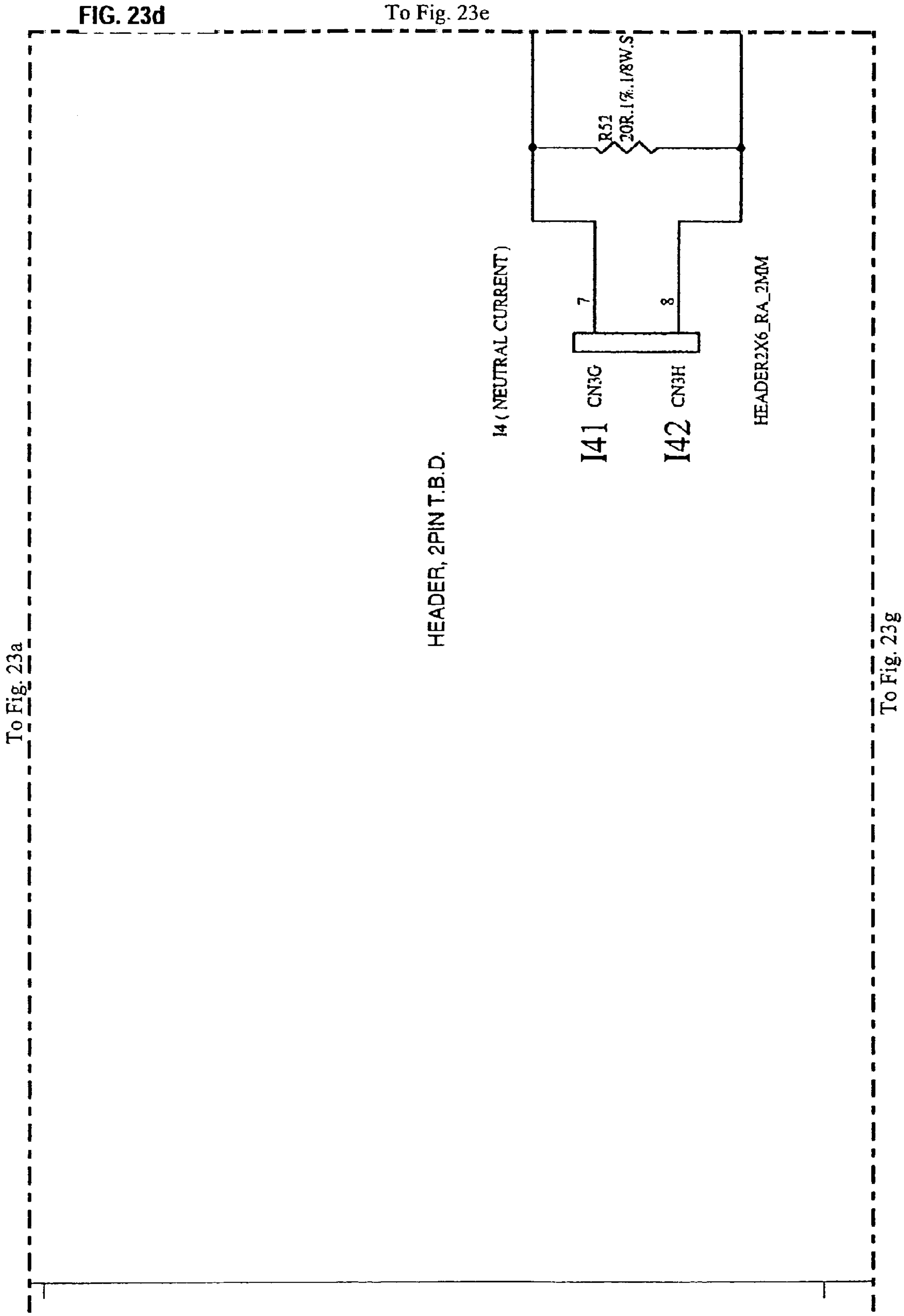
Figure 23E:
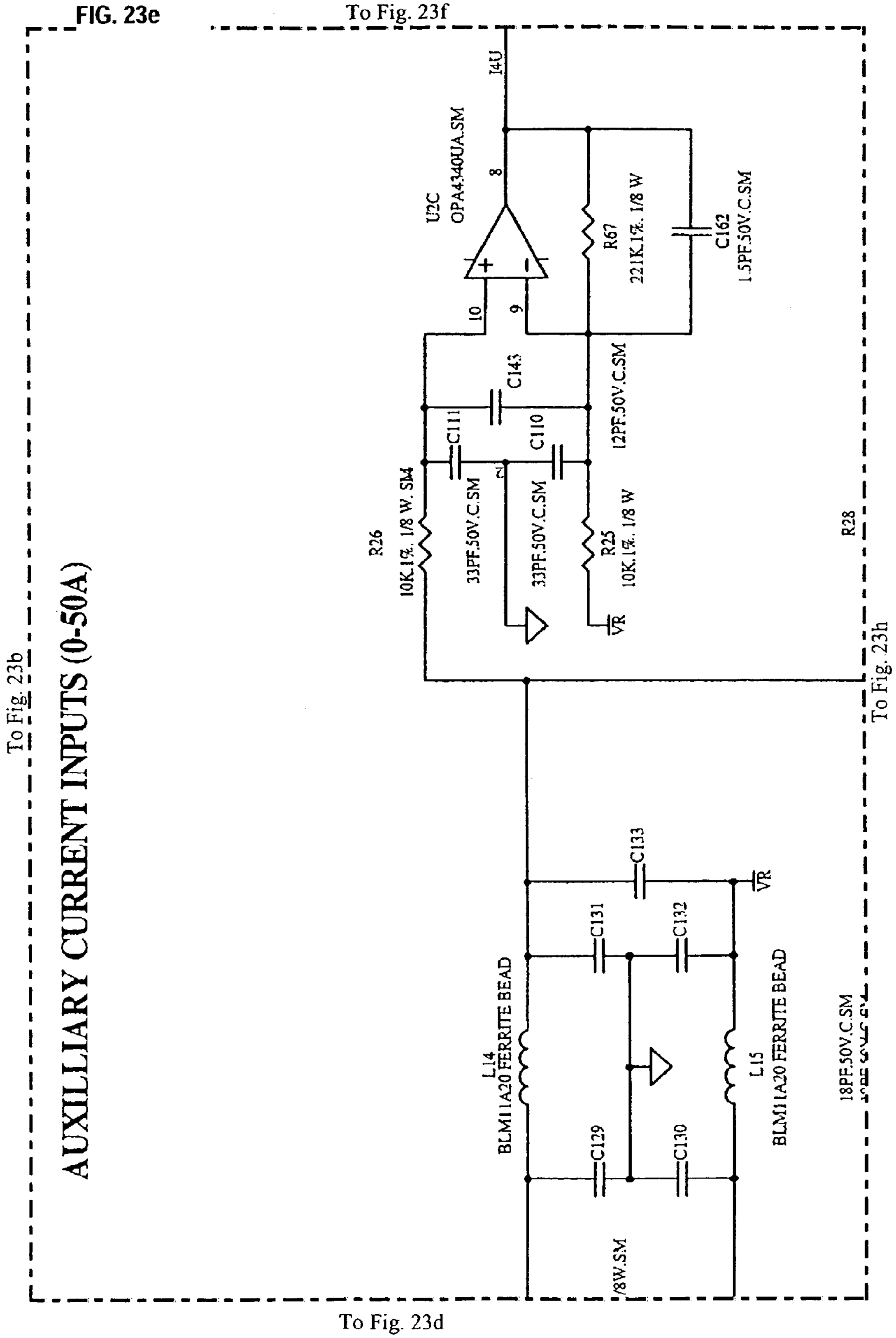
Figure 23F:
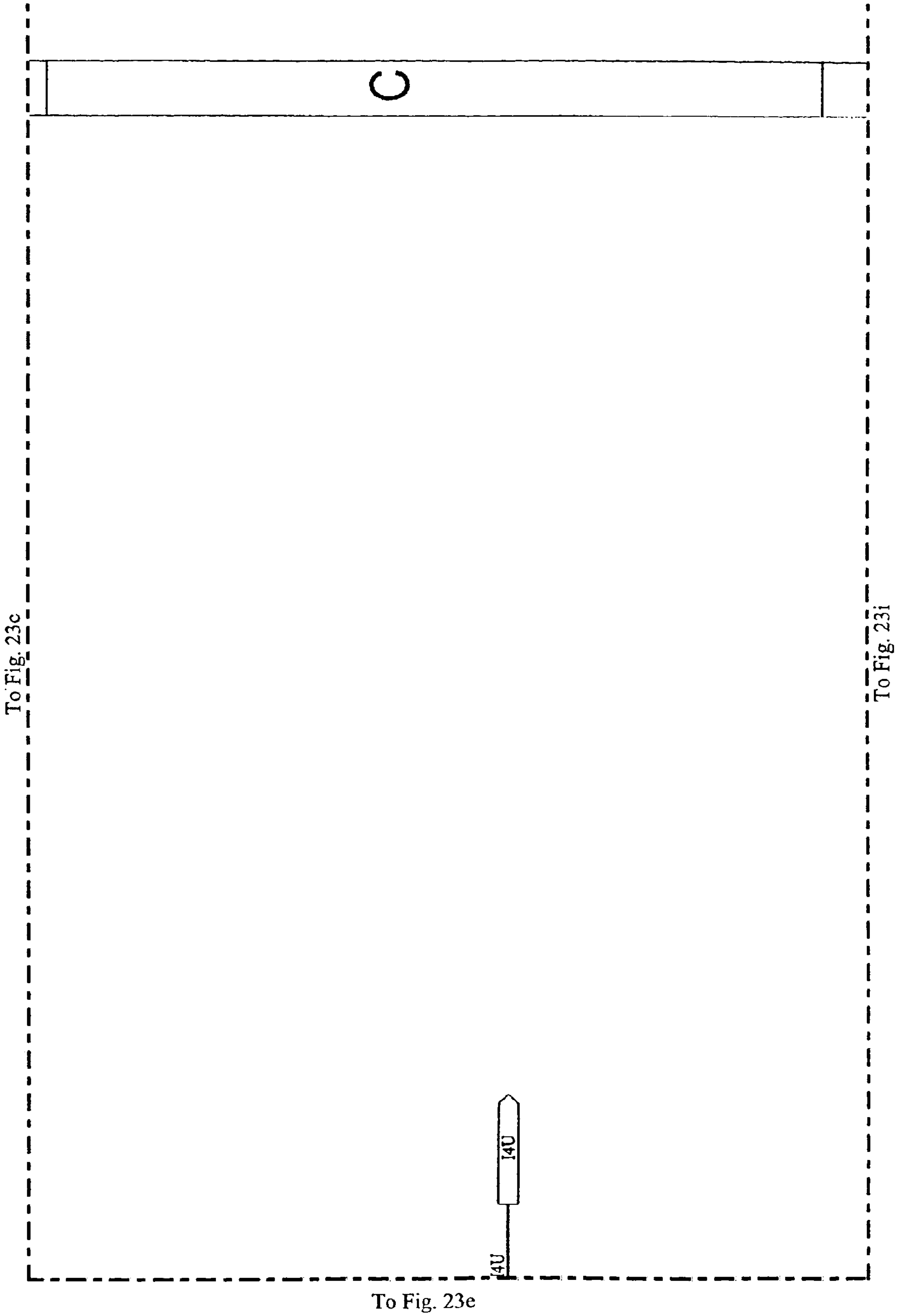
Figure 23G:
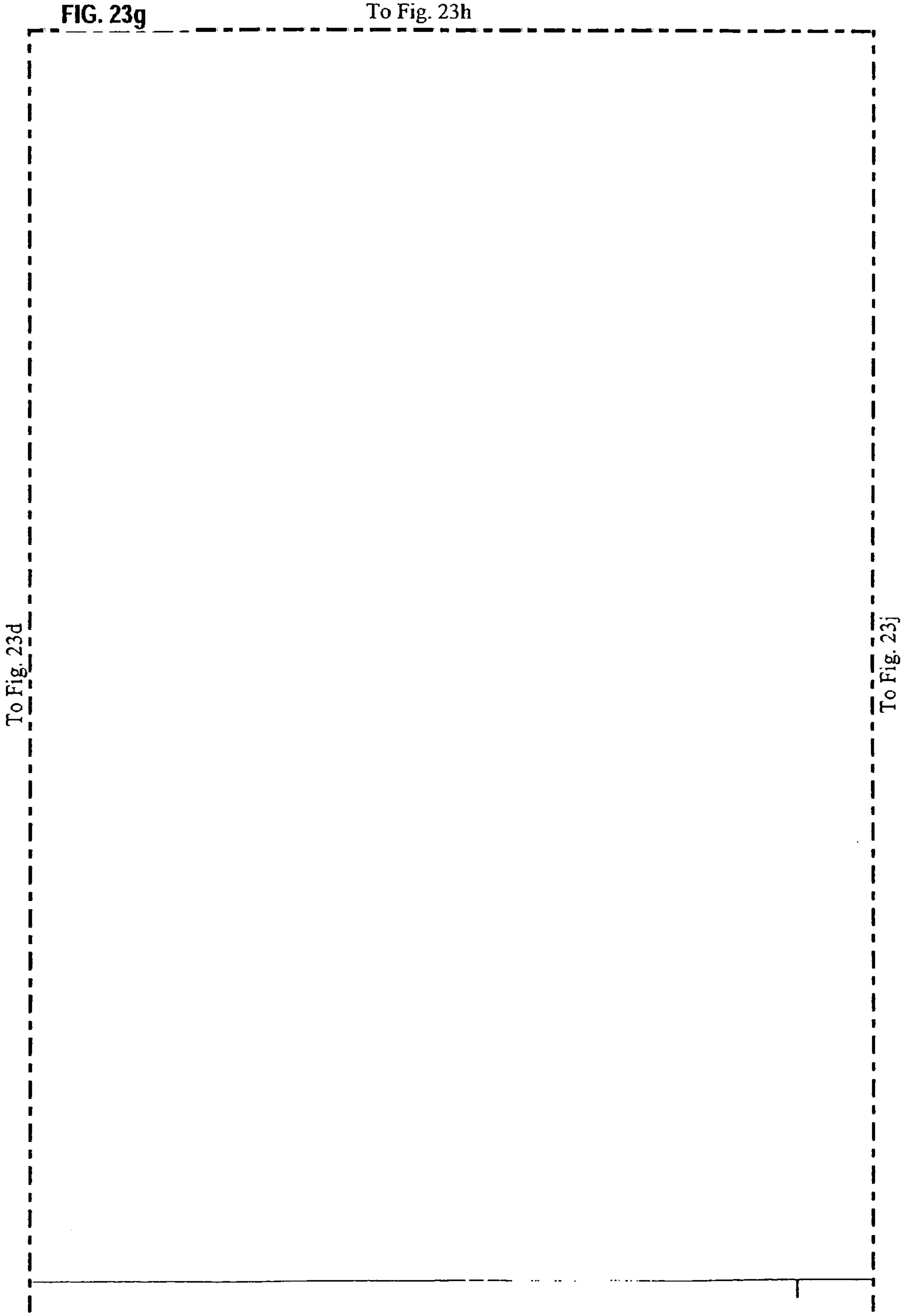
Figure 23H:
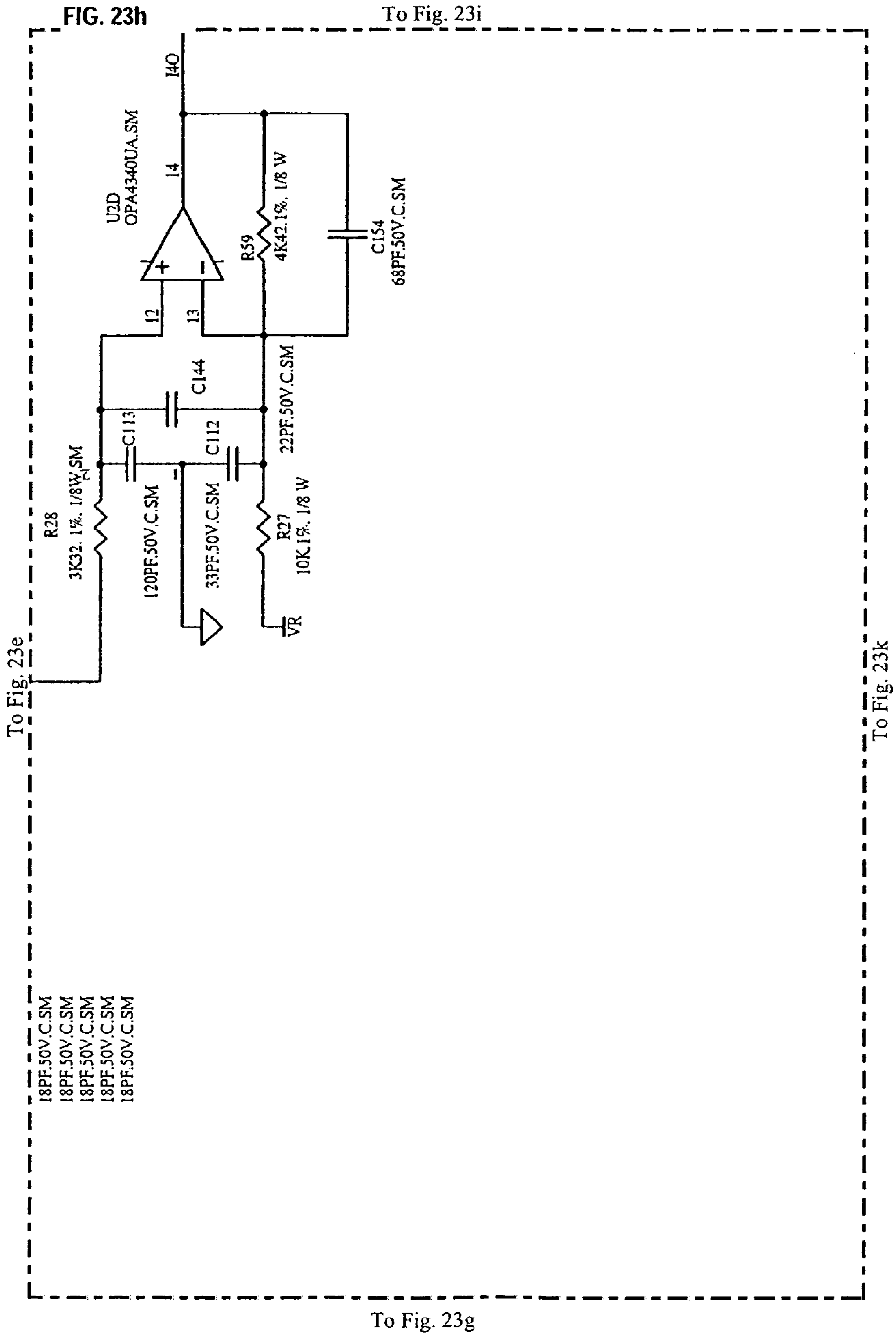
Figure 23I:
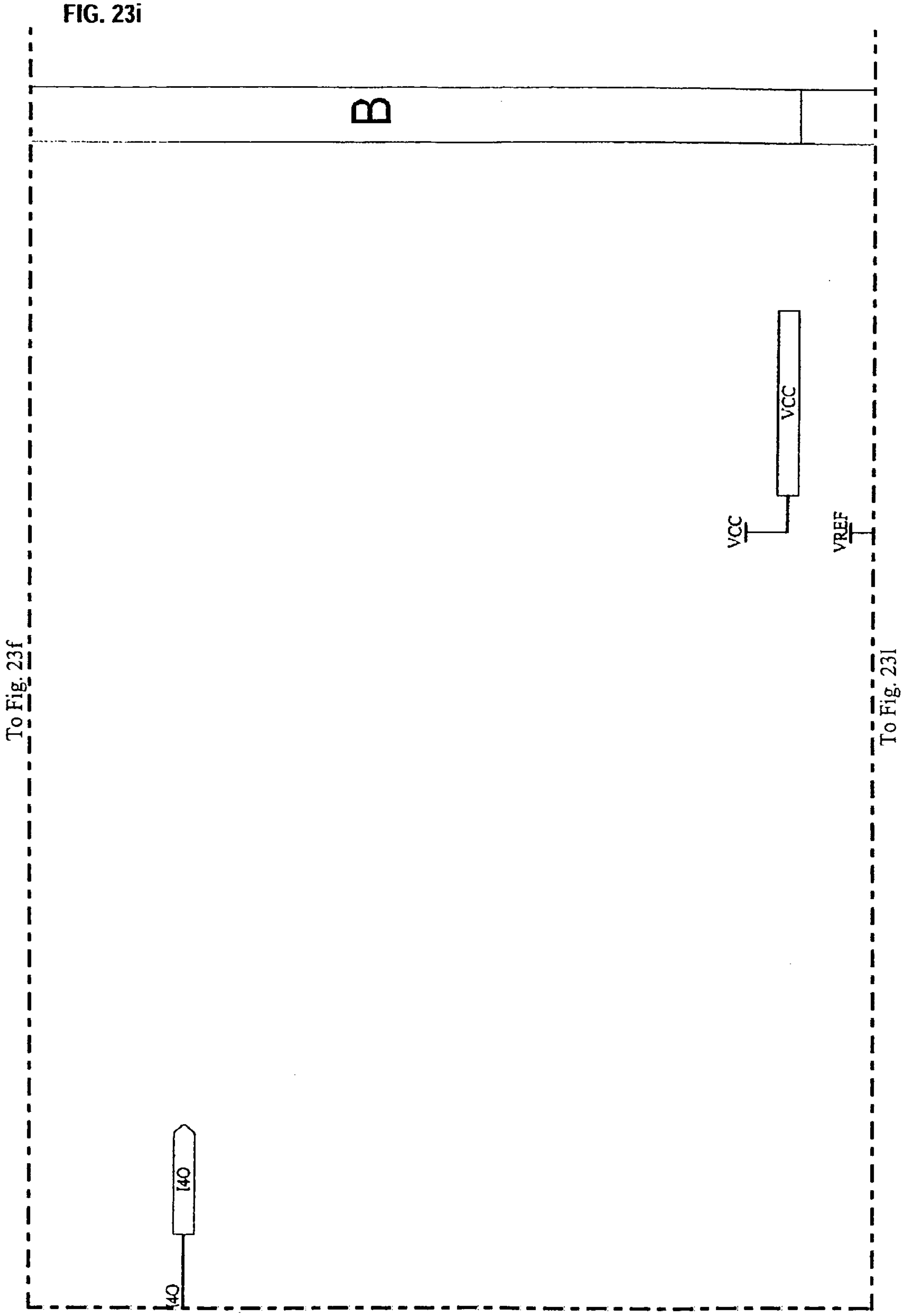
Figure 23J:
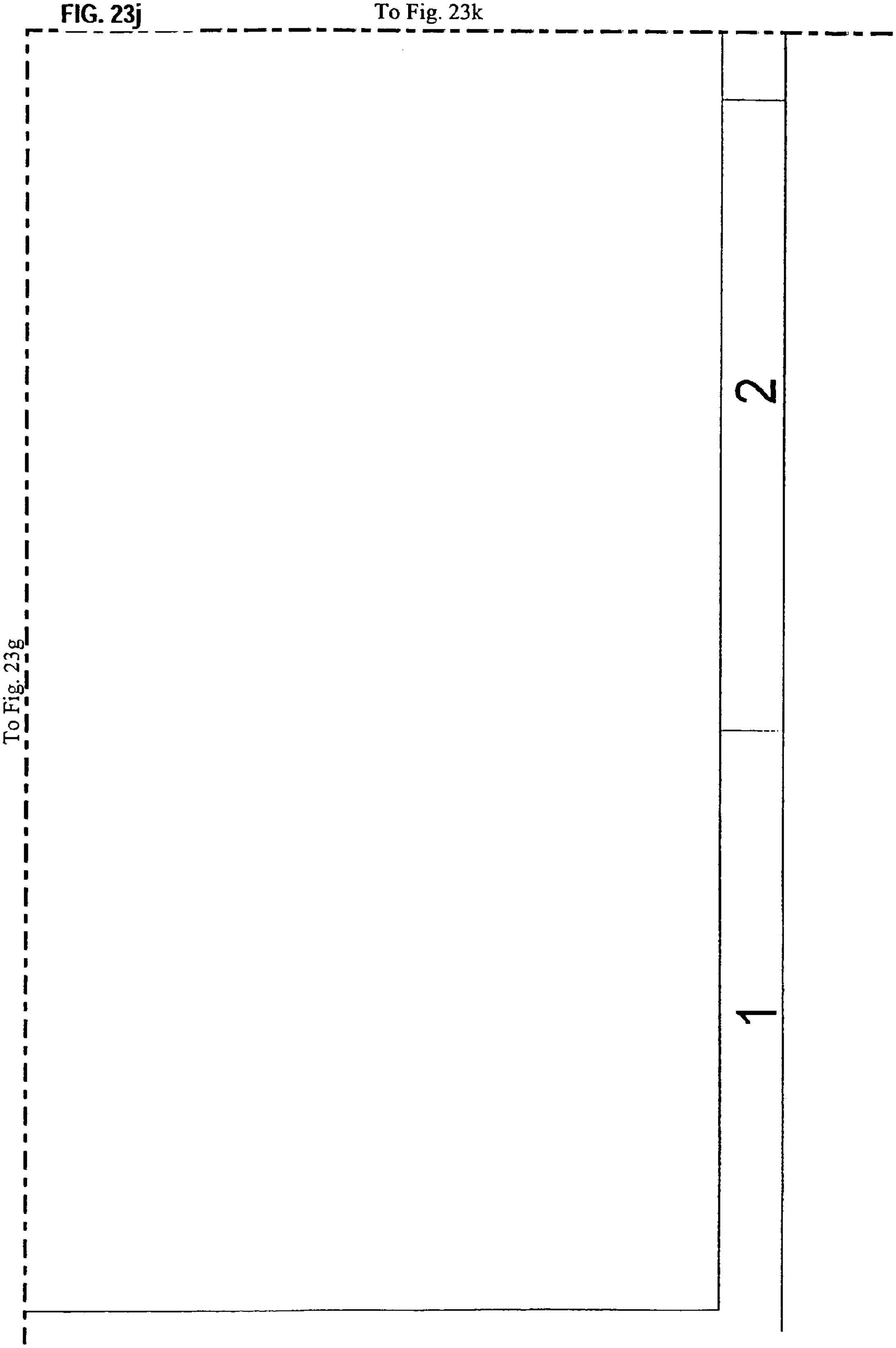
Figure 23K:
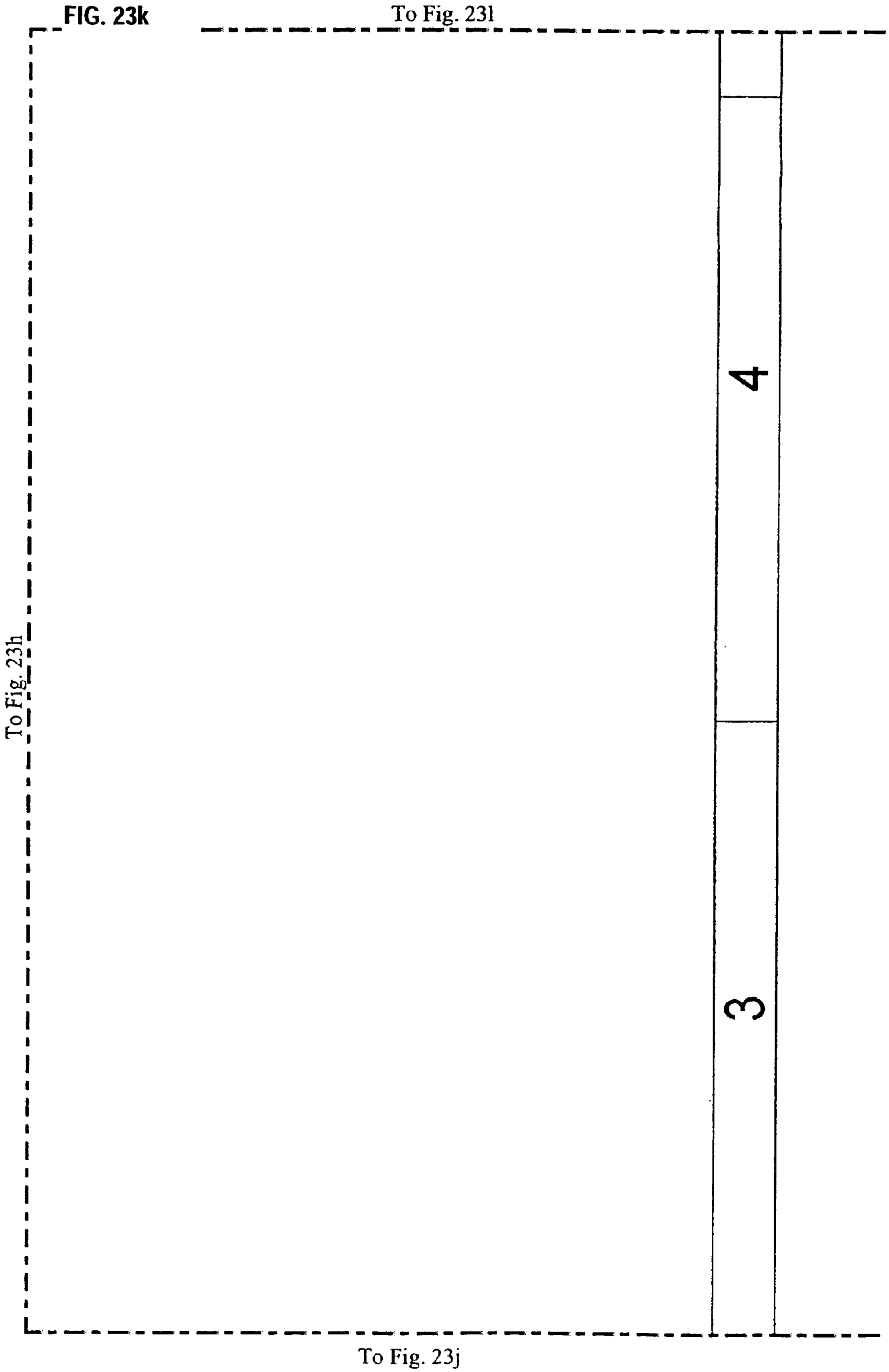
Figure 23L:
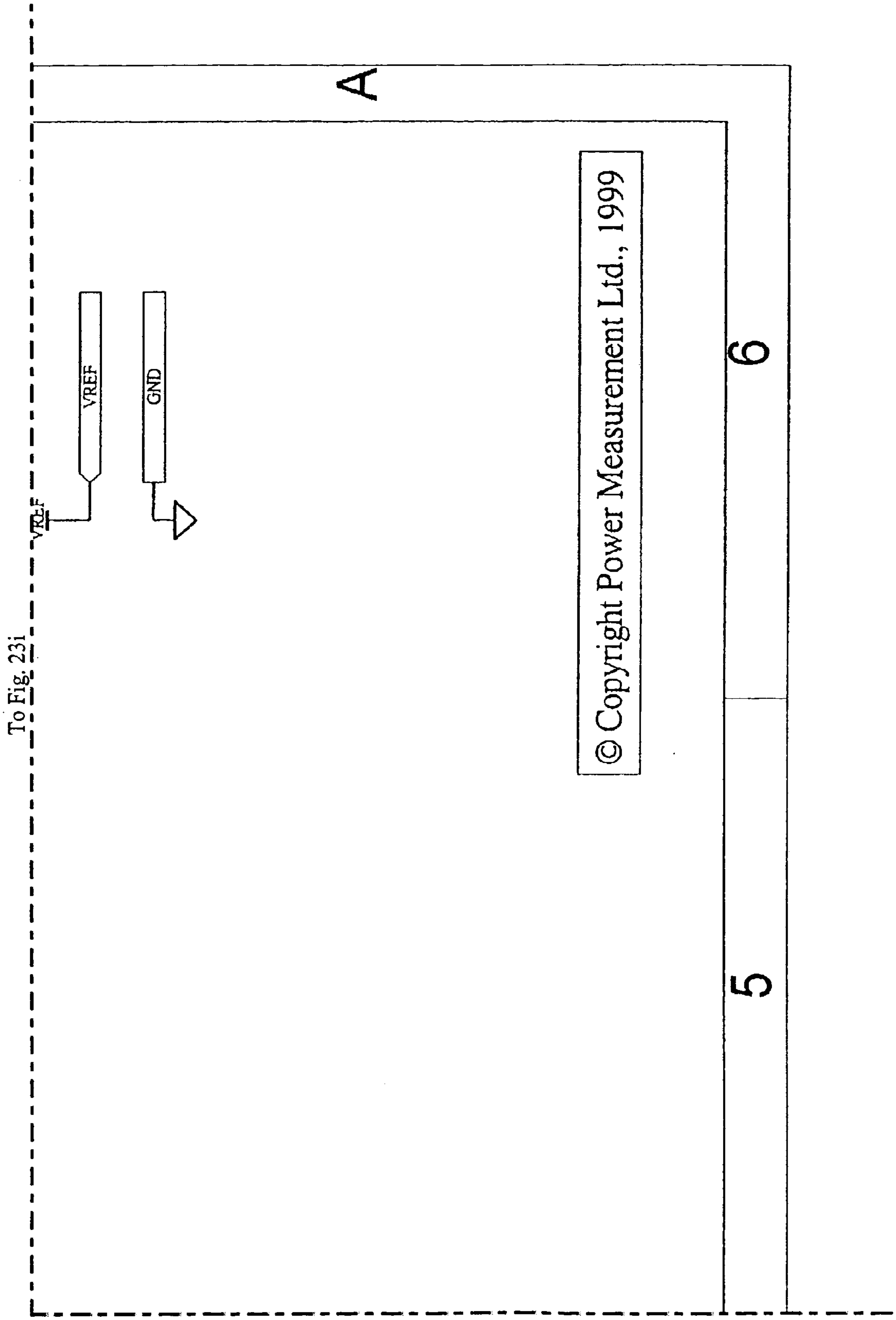
Figure 24A:
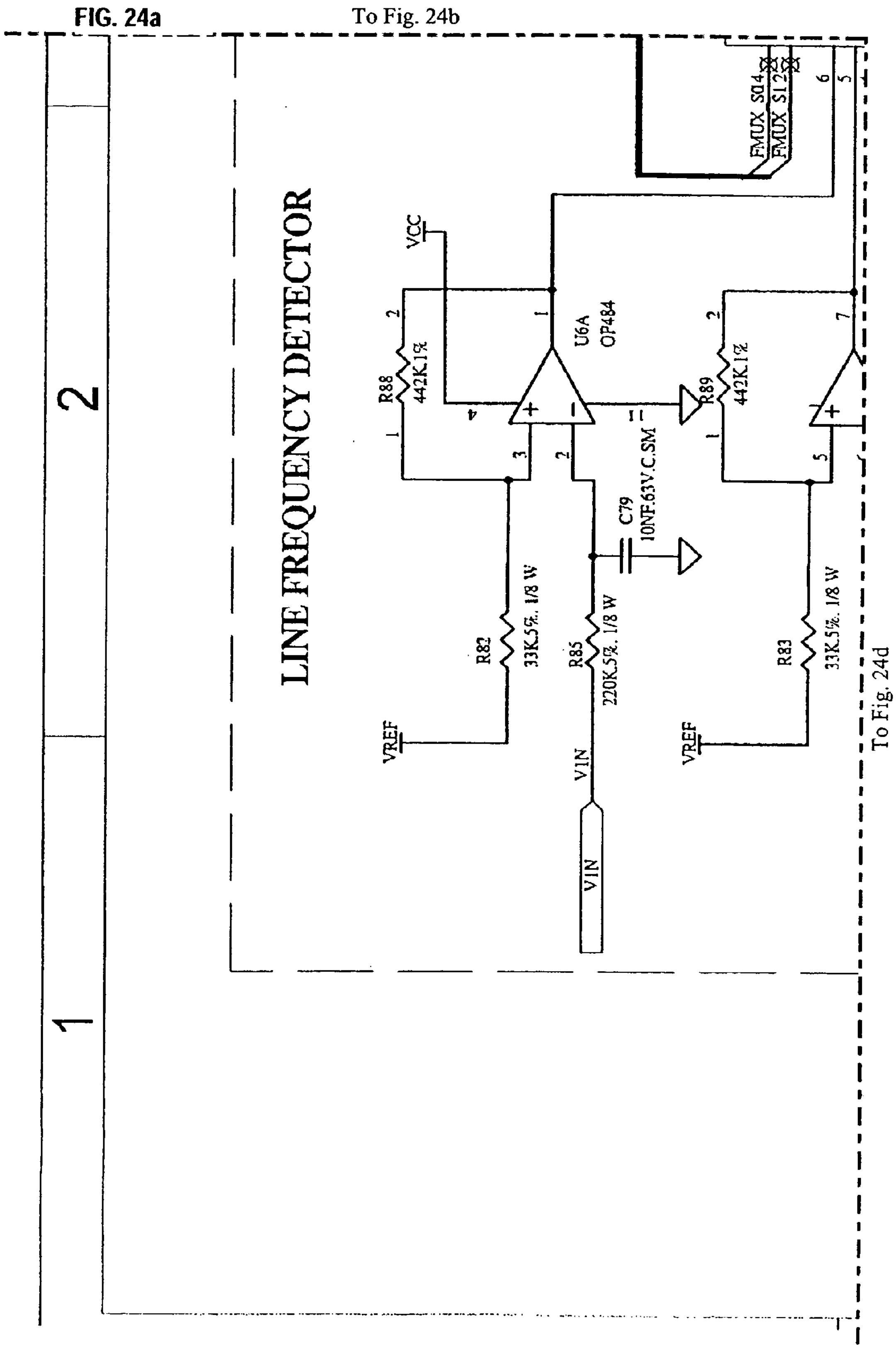
Figure 24B:
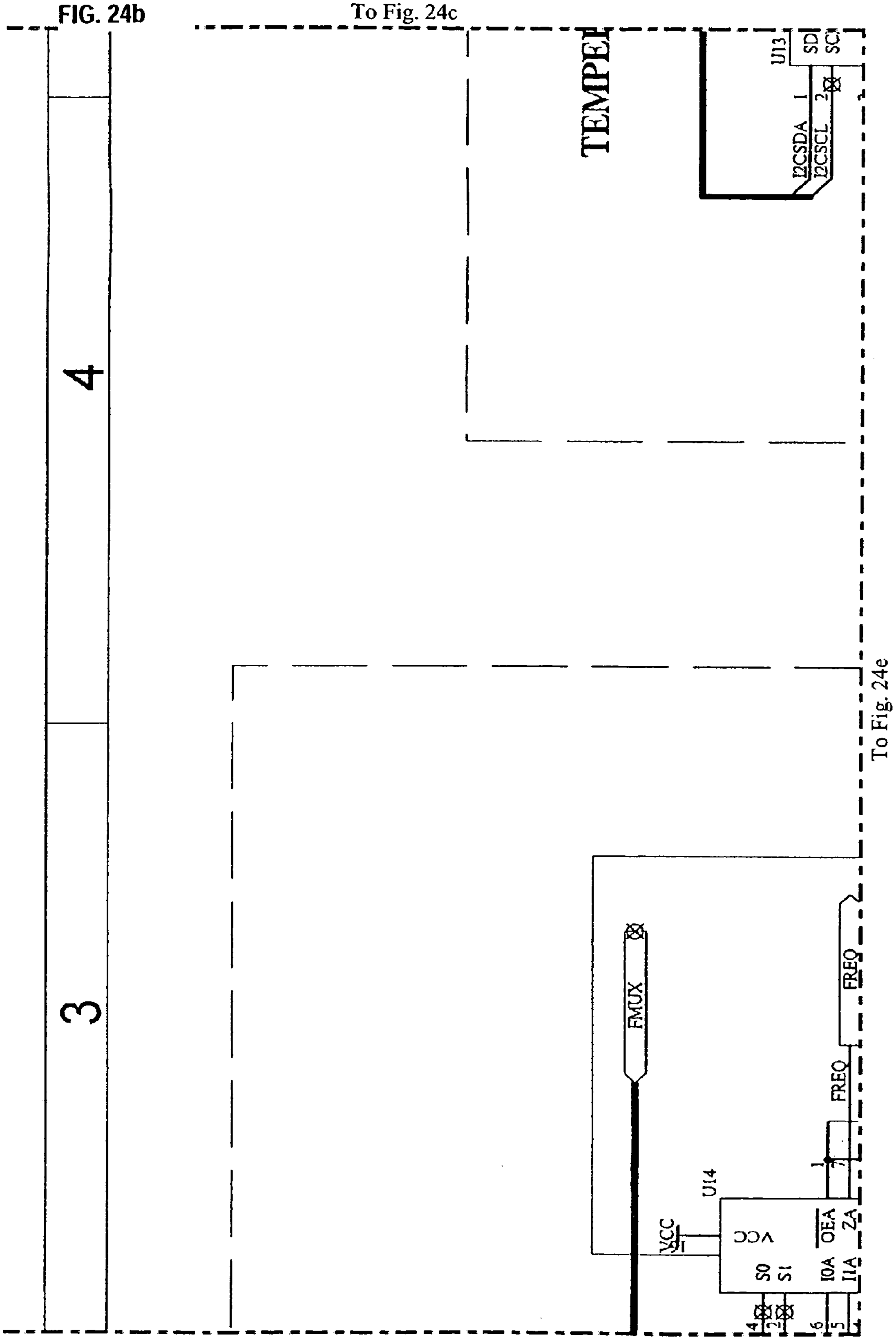
Figure 24C:
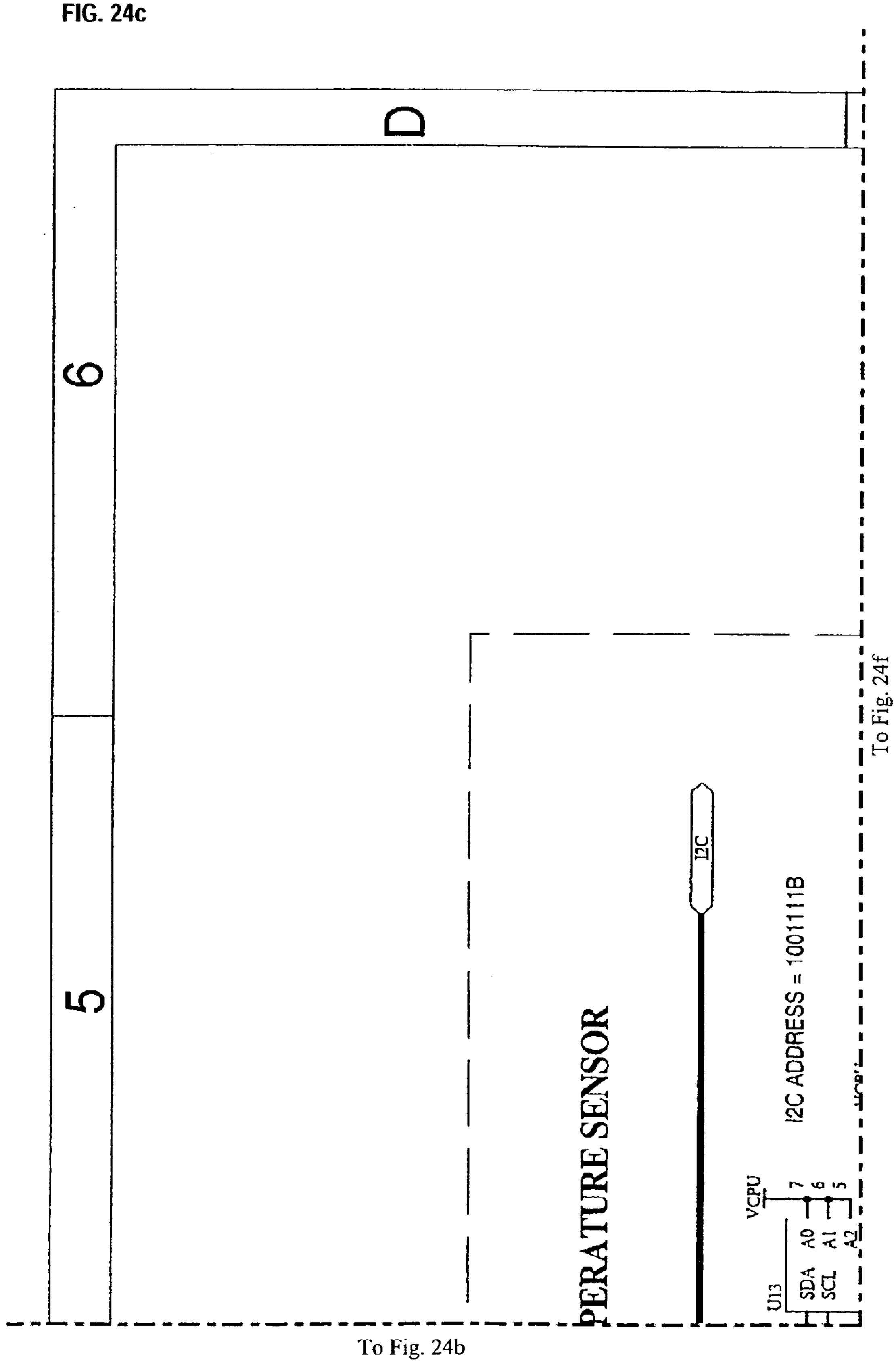
Figure 24D:
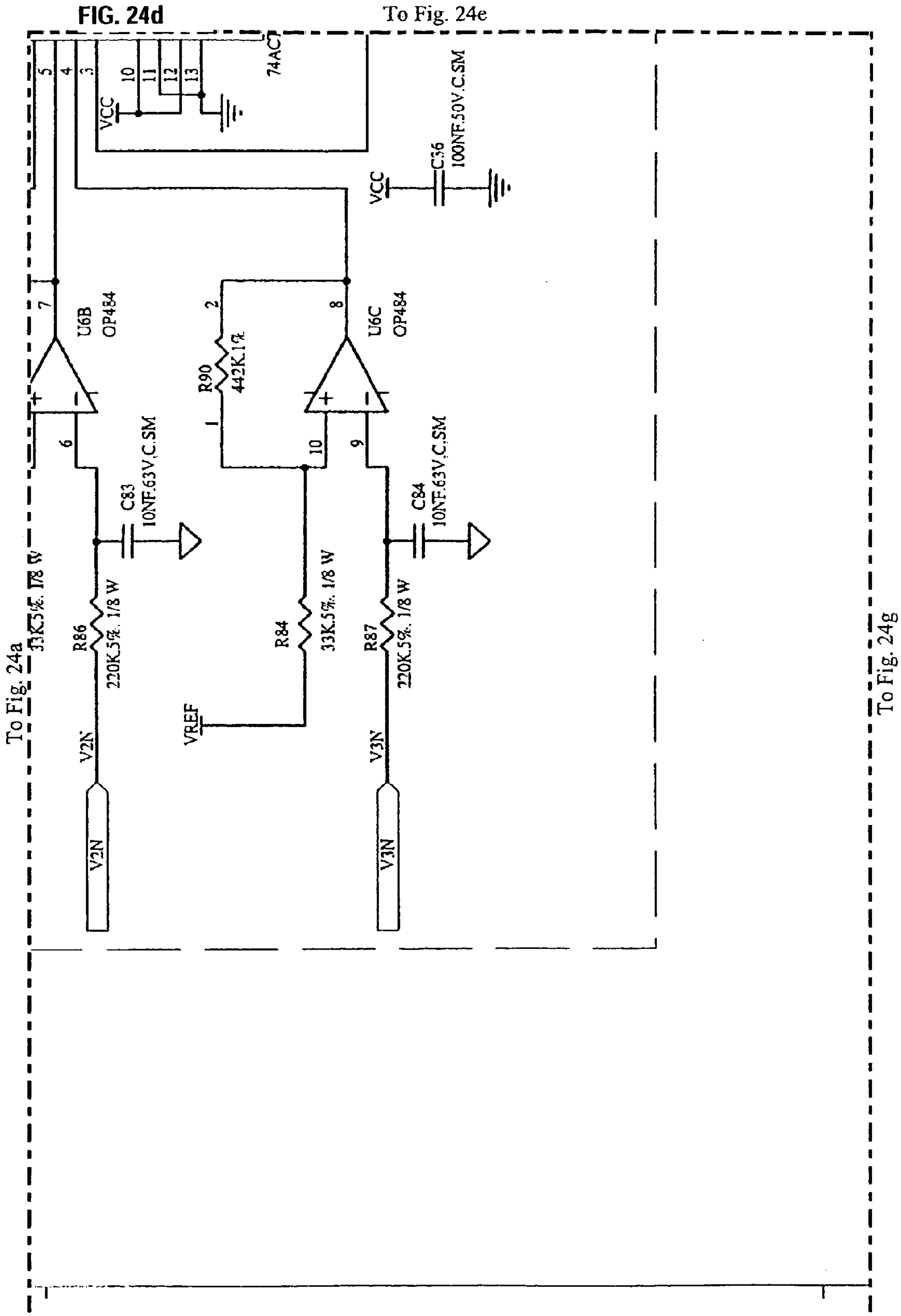
Figure 24E:
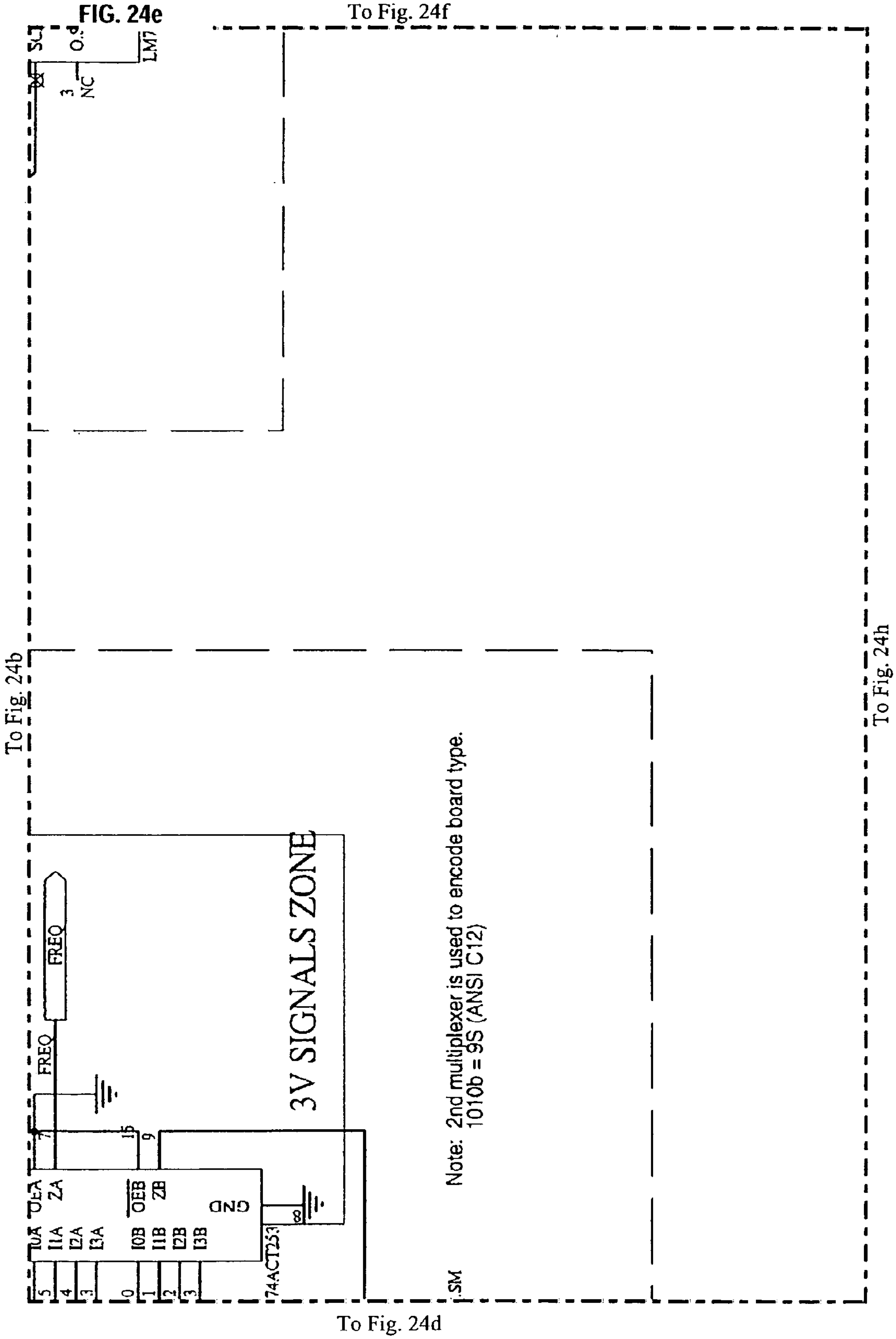
Figure 24F:
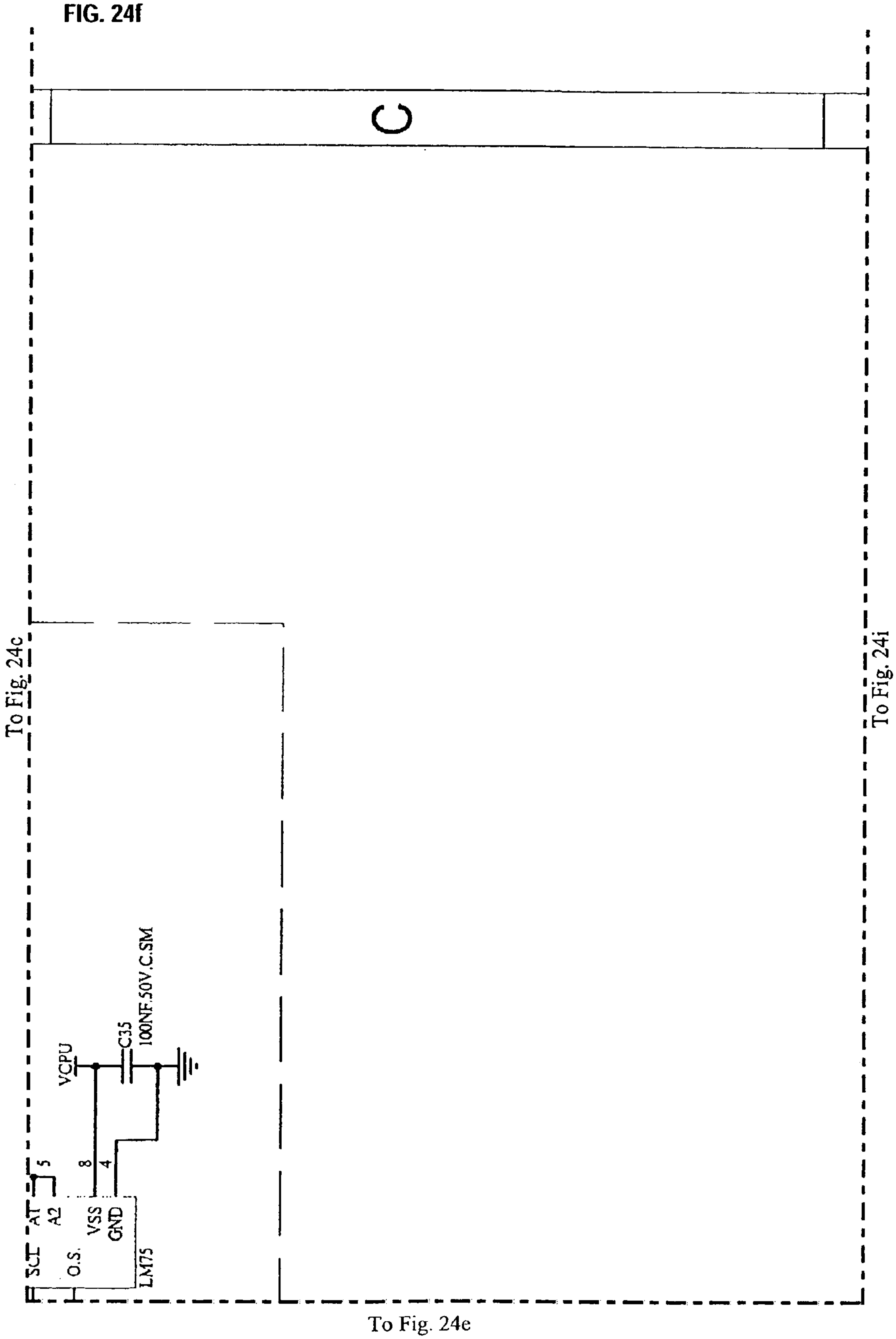
Figure 24G:
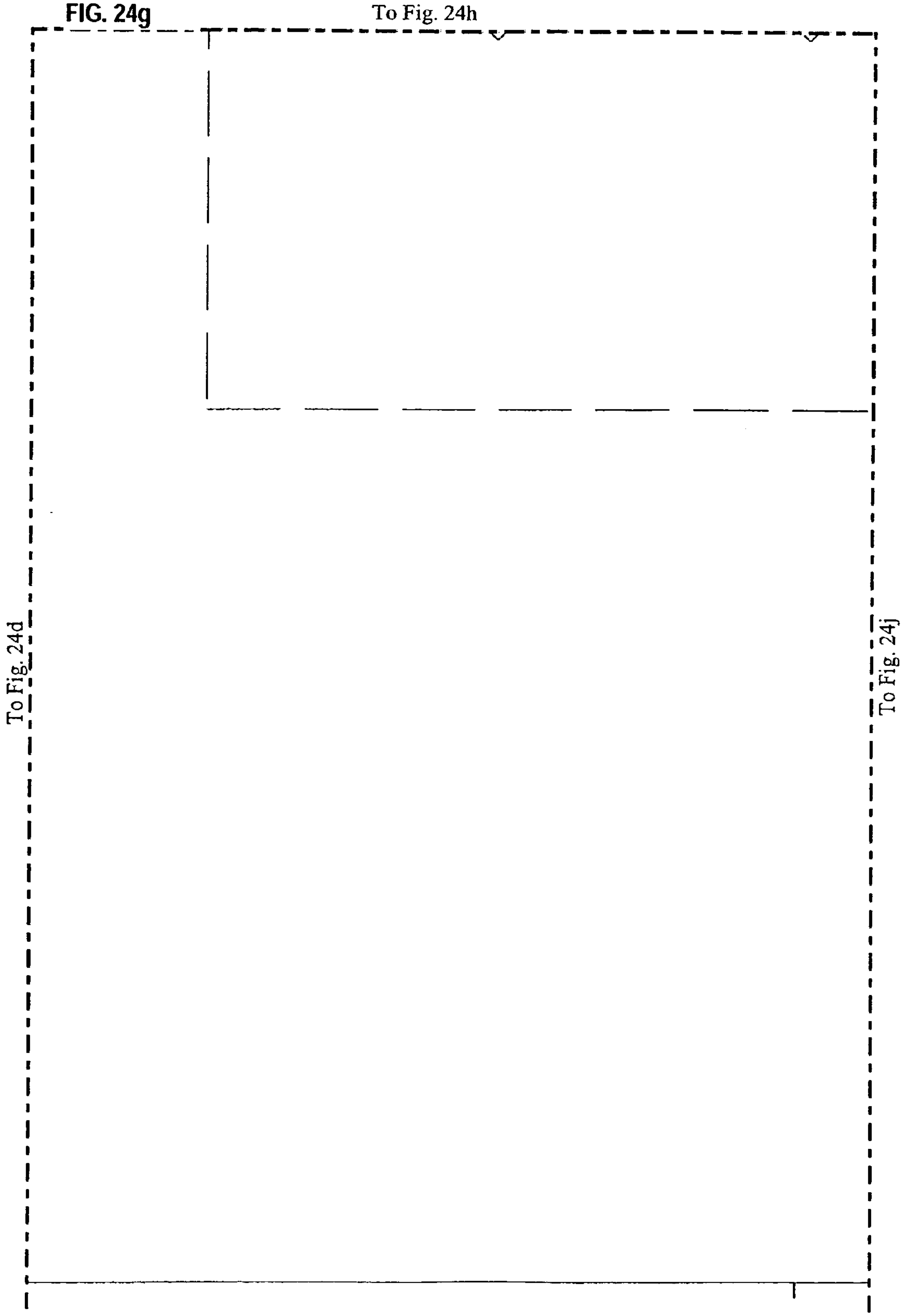
Figure 24H:
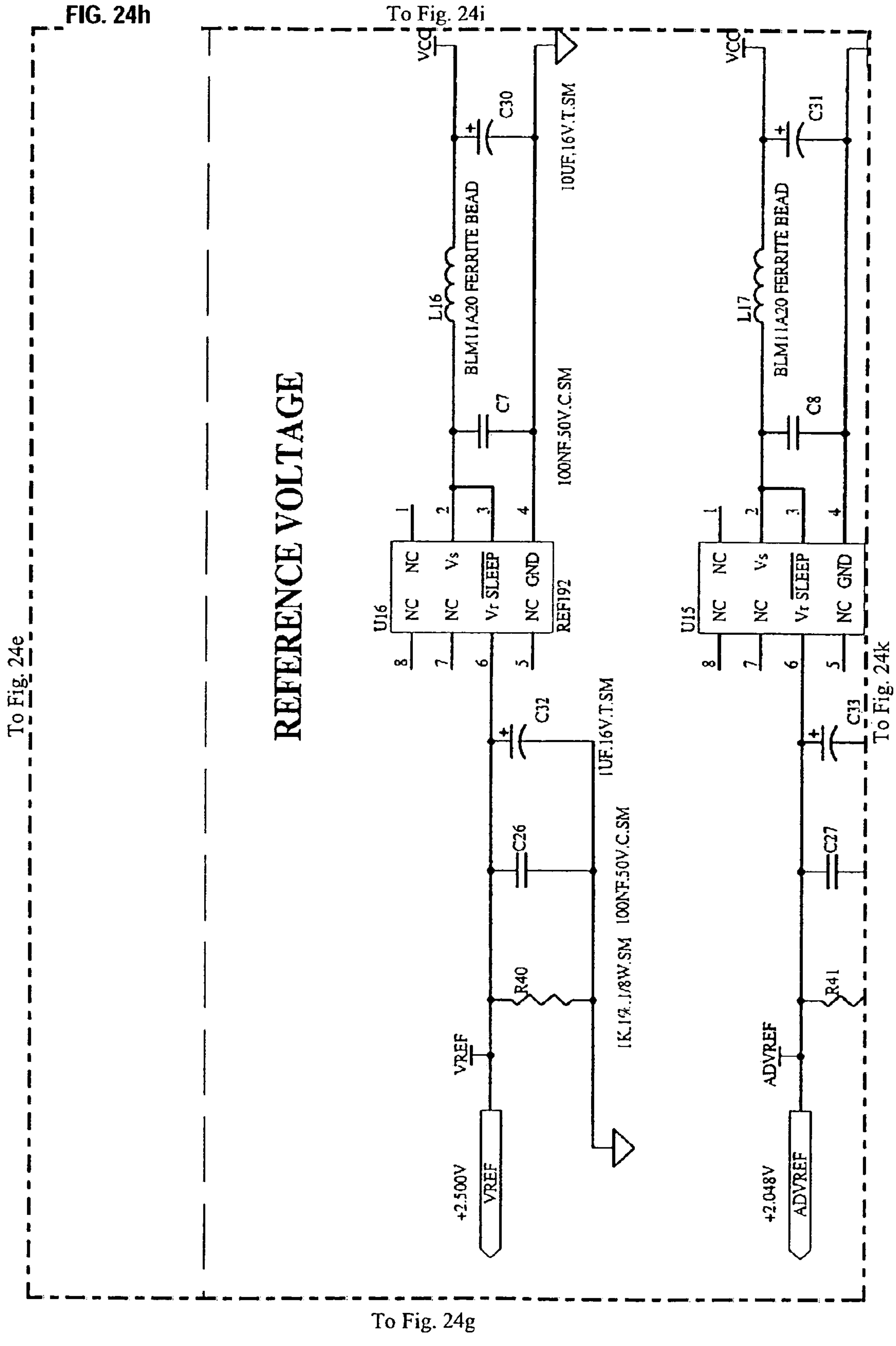
Figure 24I:
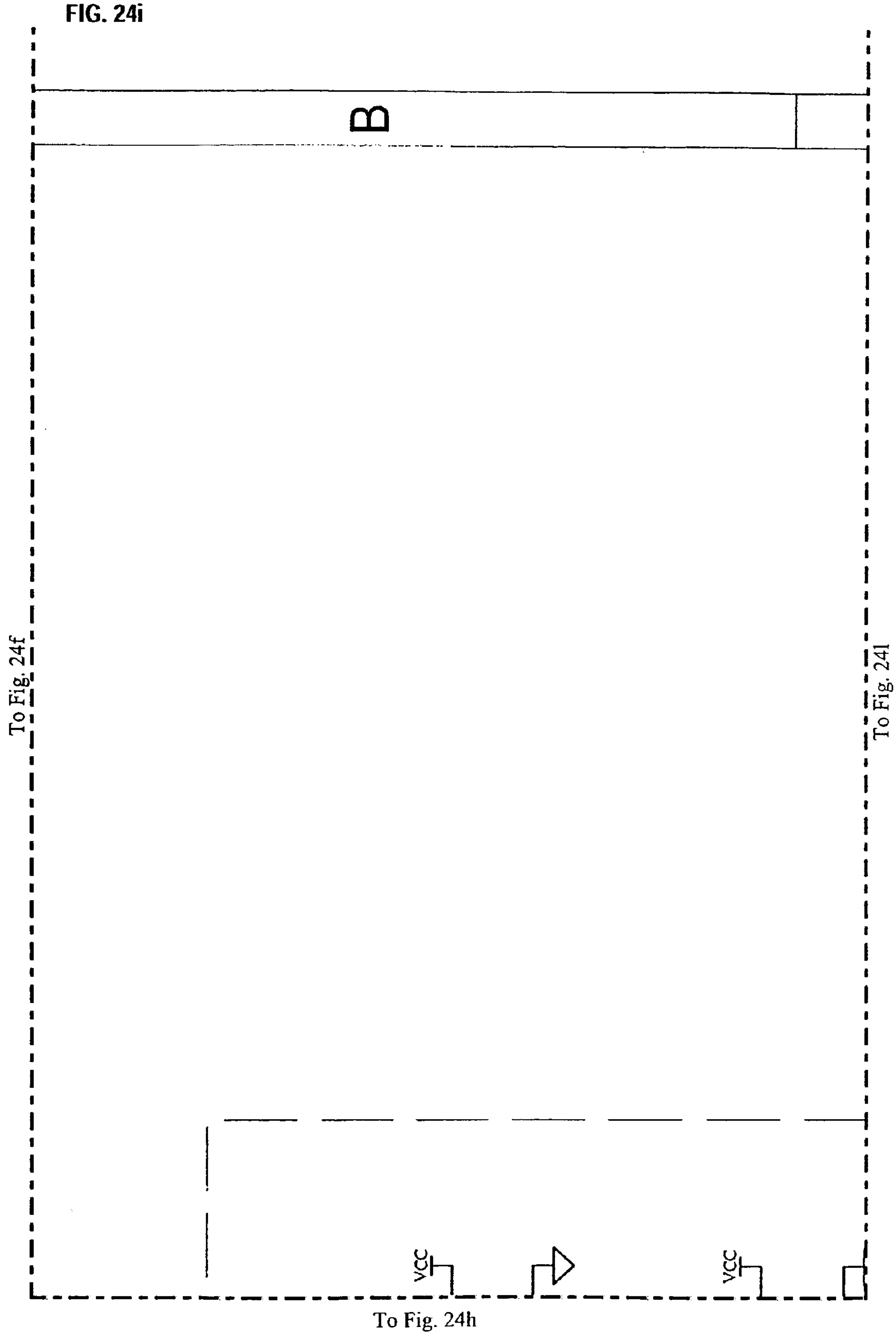
Figure 24J:
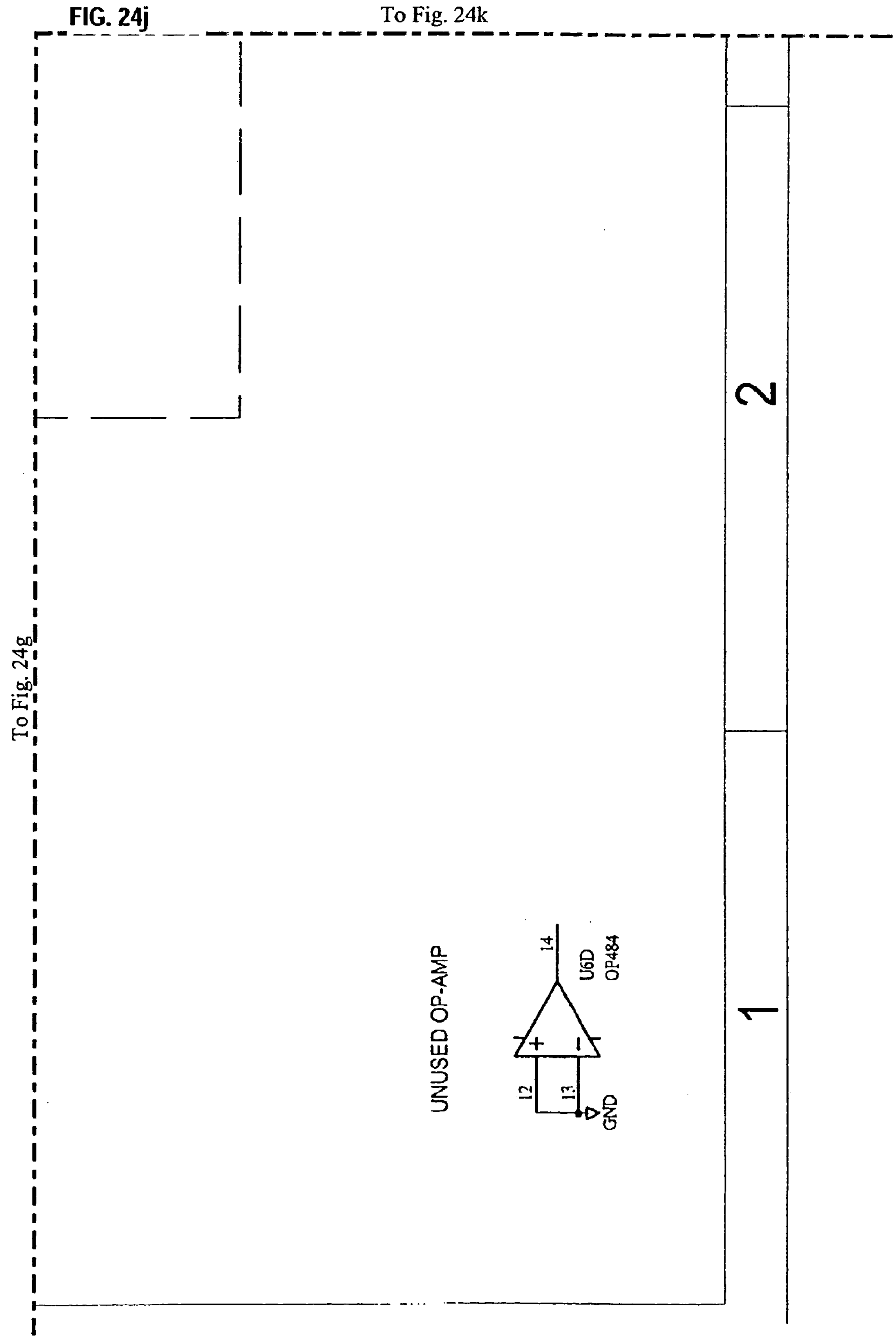
Figure 24K:
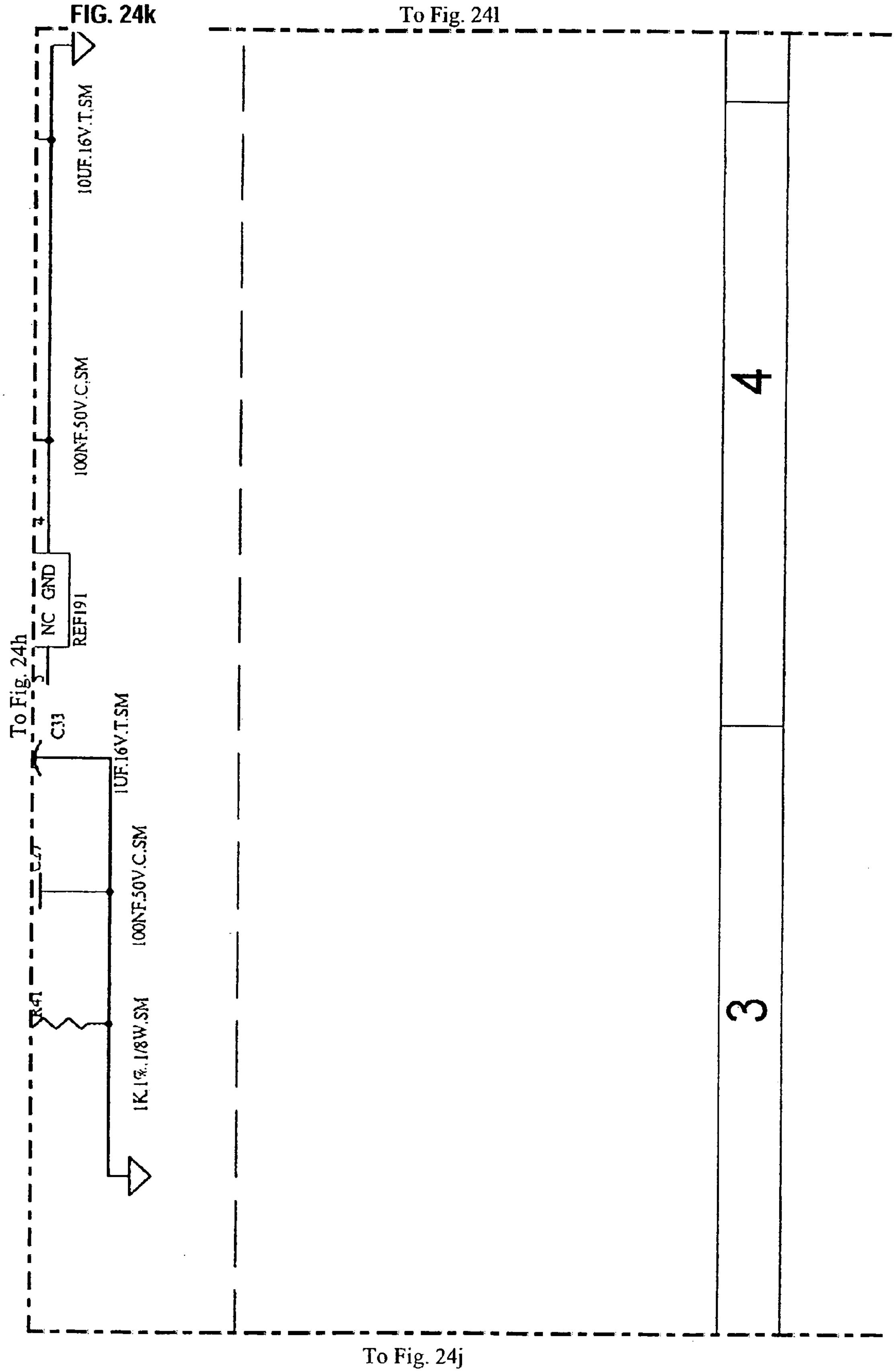
Figure 24L:
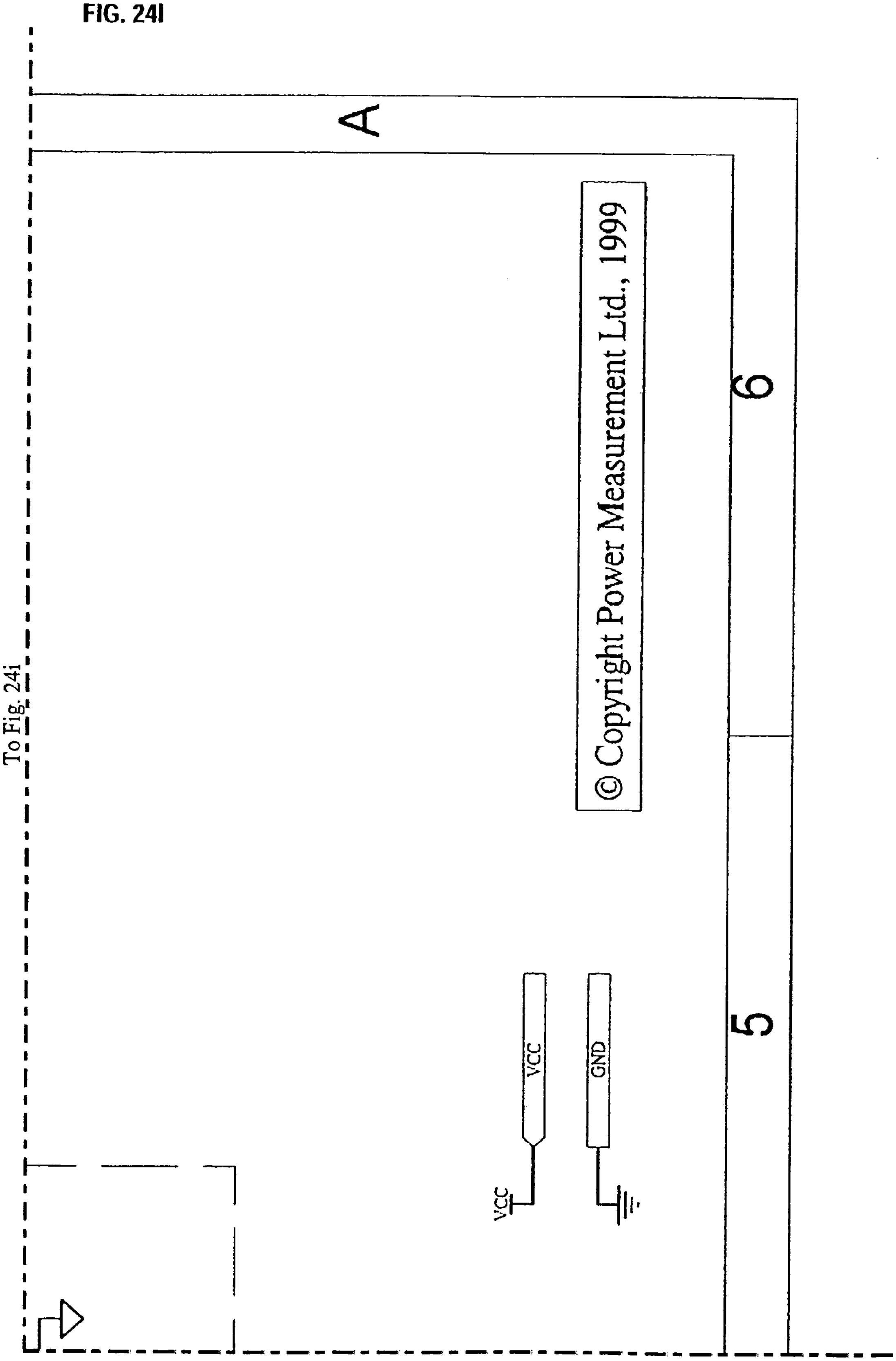
Figure 25A:
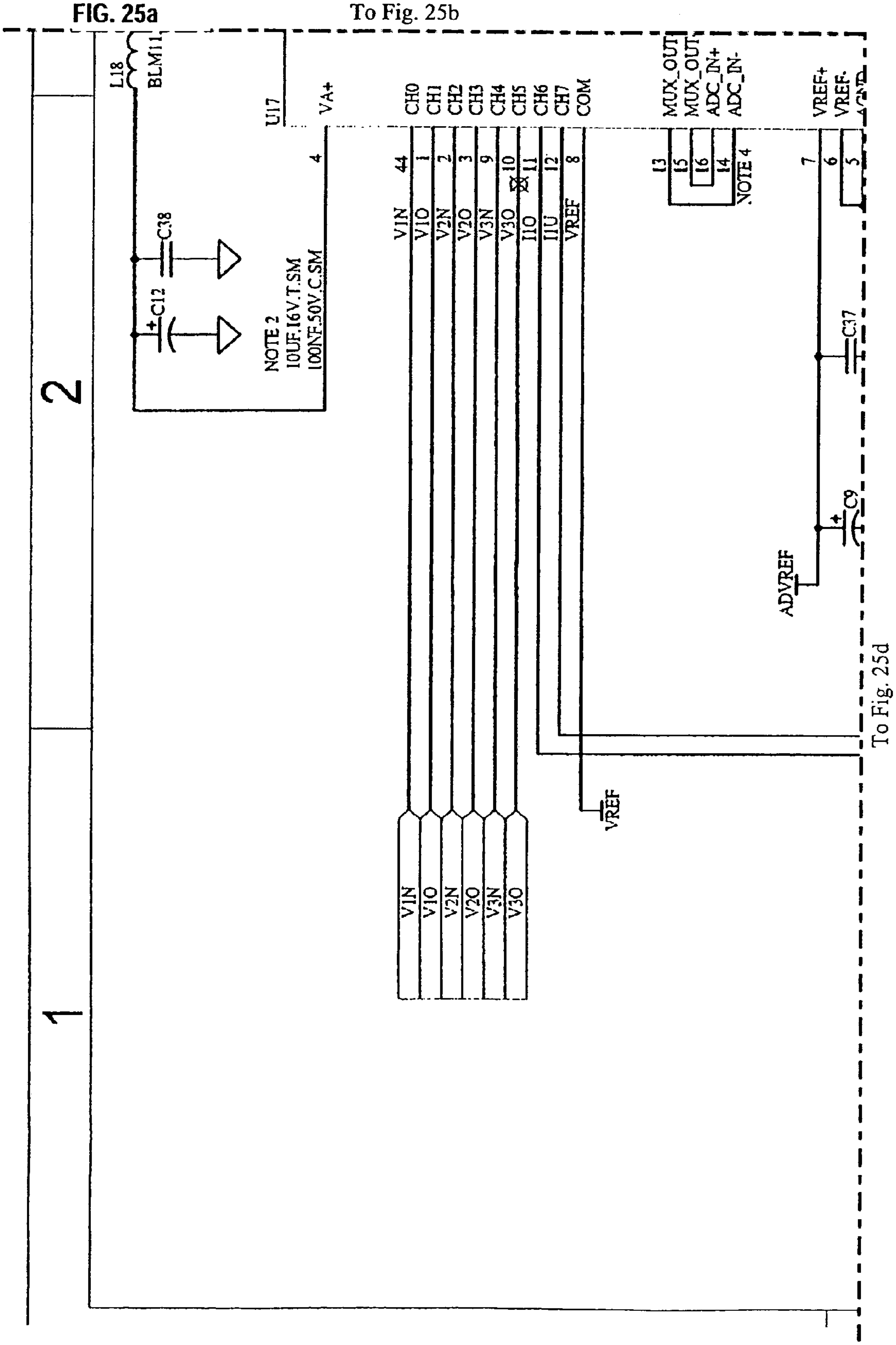
Figure 25B:
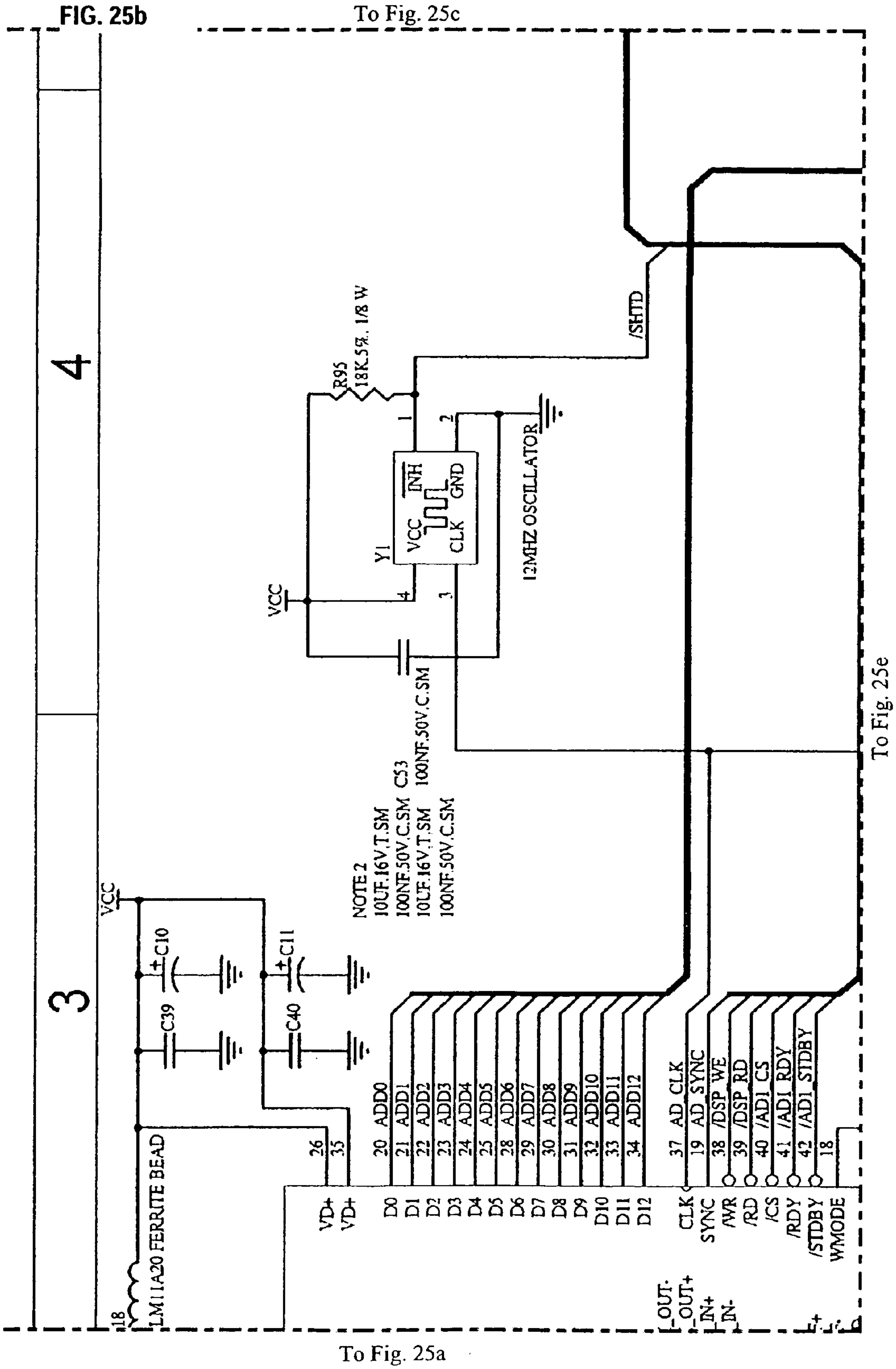
Figure 25C:
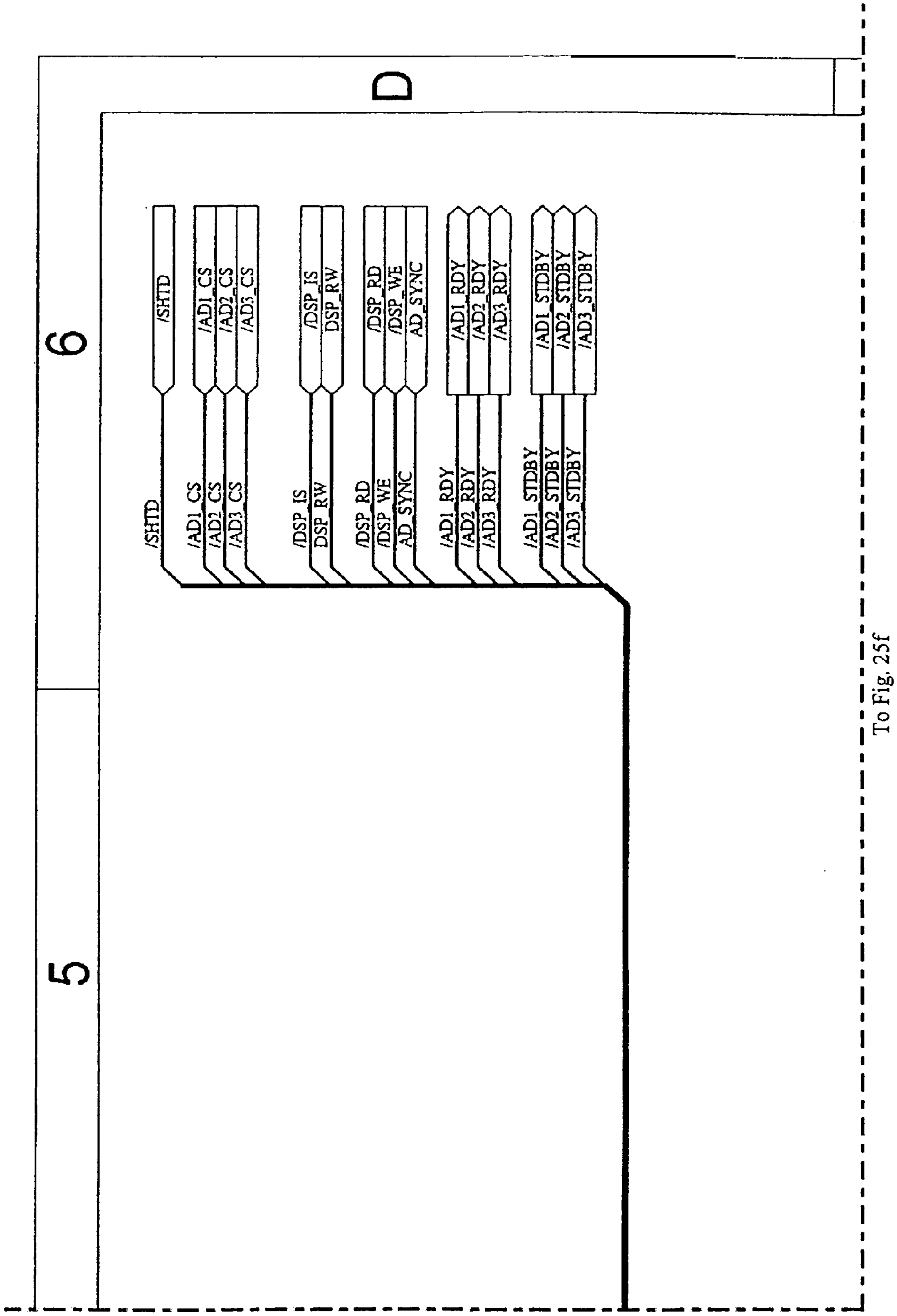
Figure 25D:
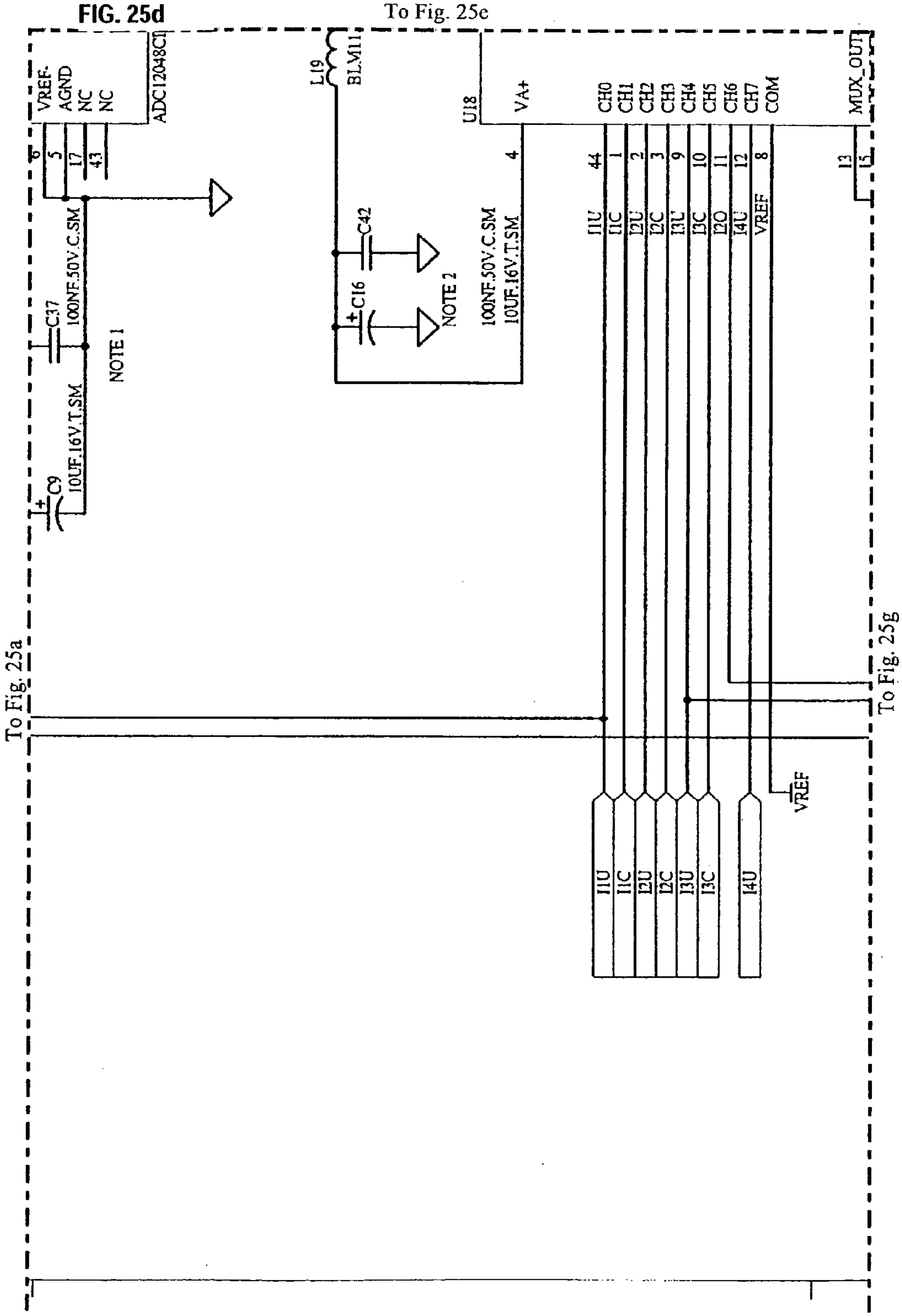
Figure 25E:
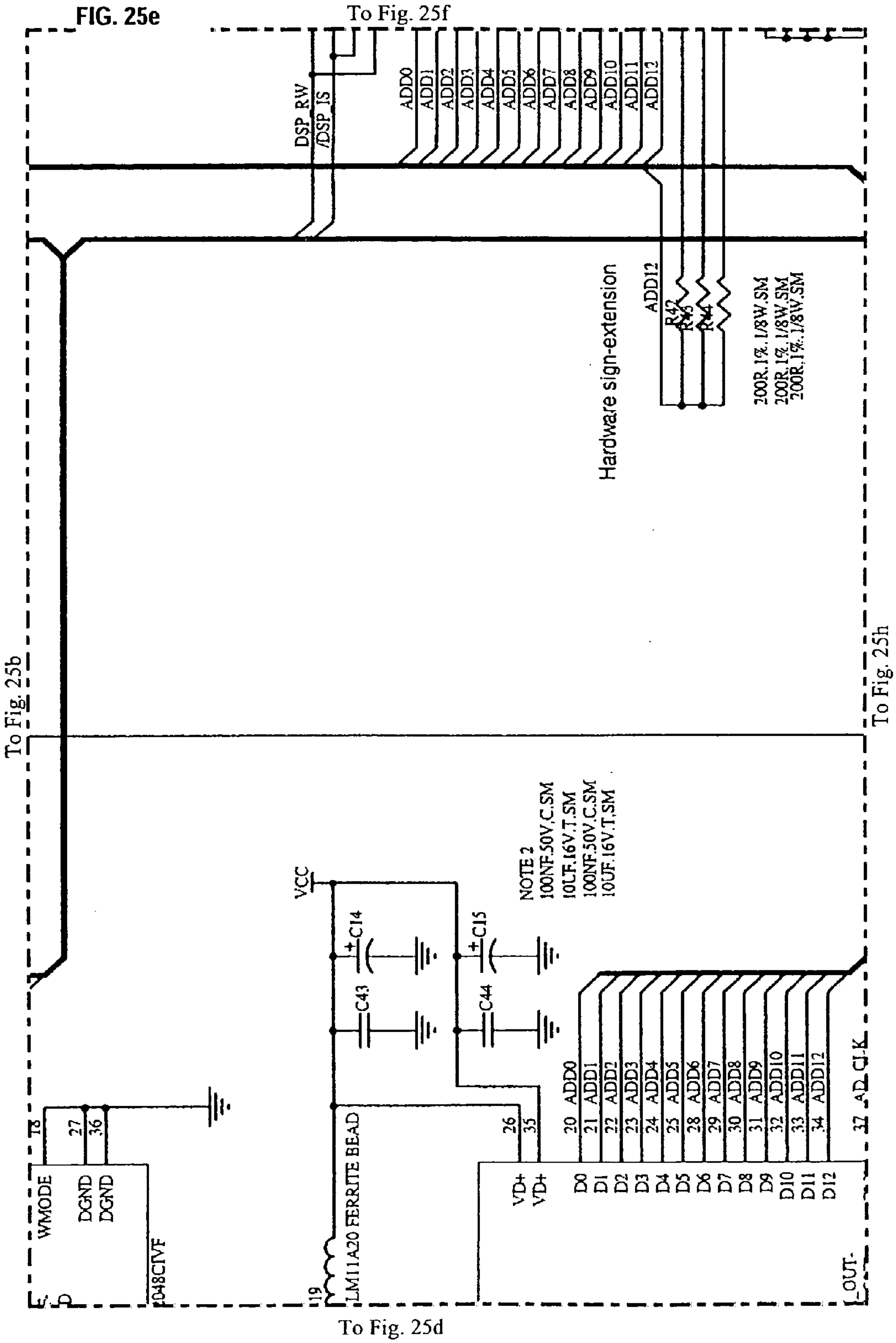
Figure 25F:
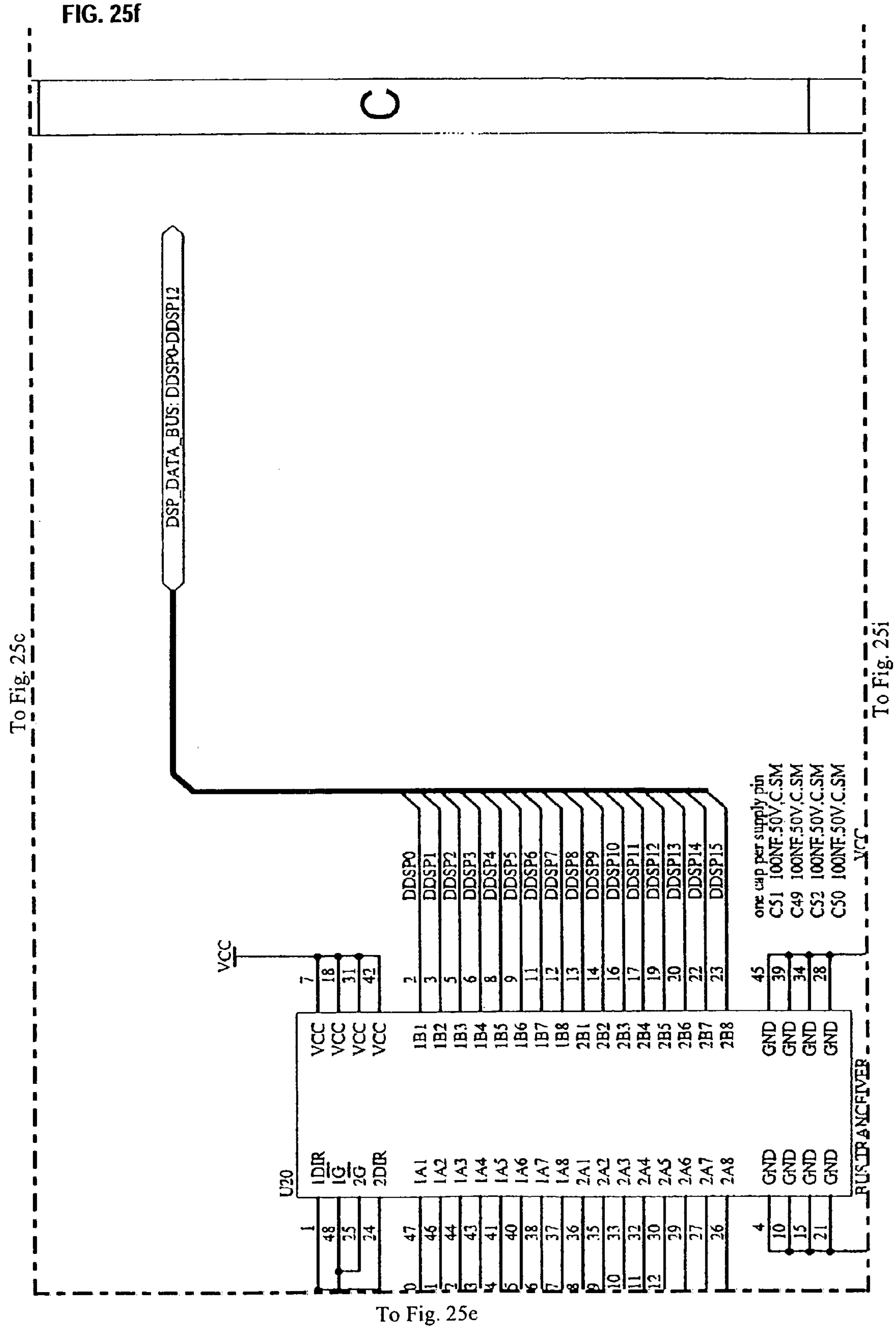
Figure 25G:
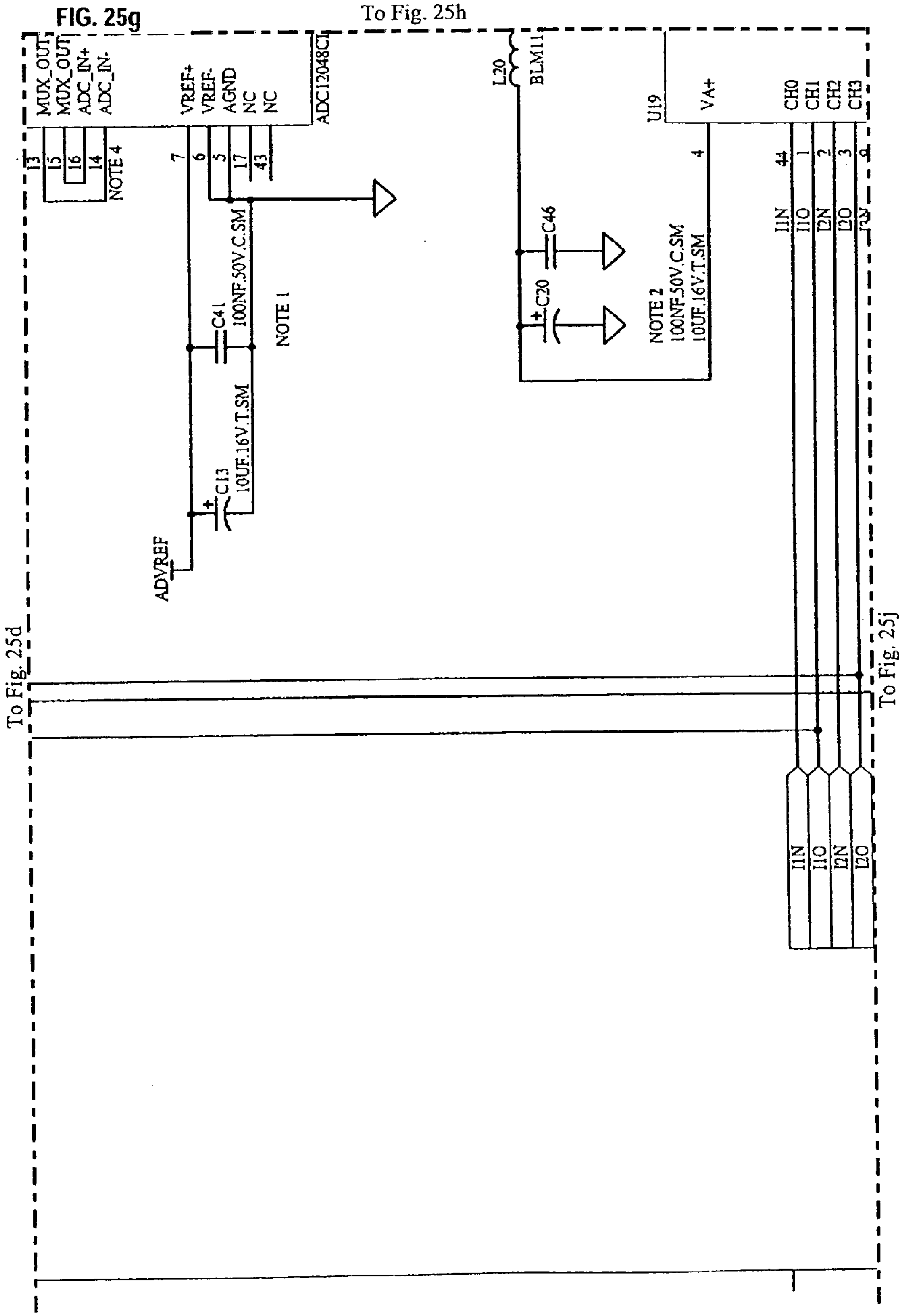
Figure 25H:
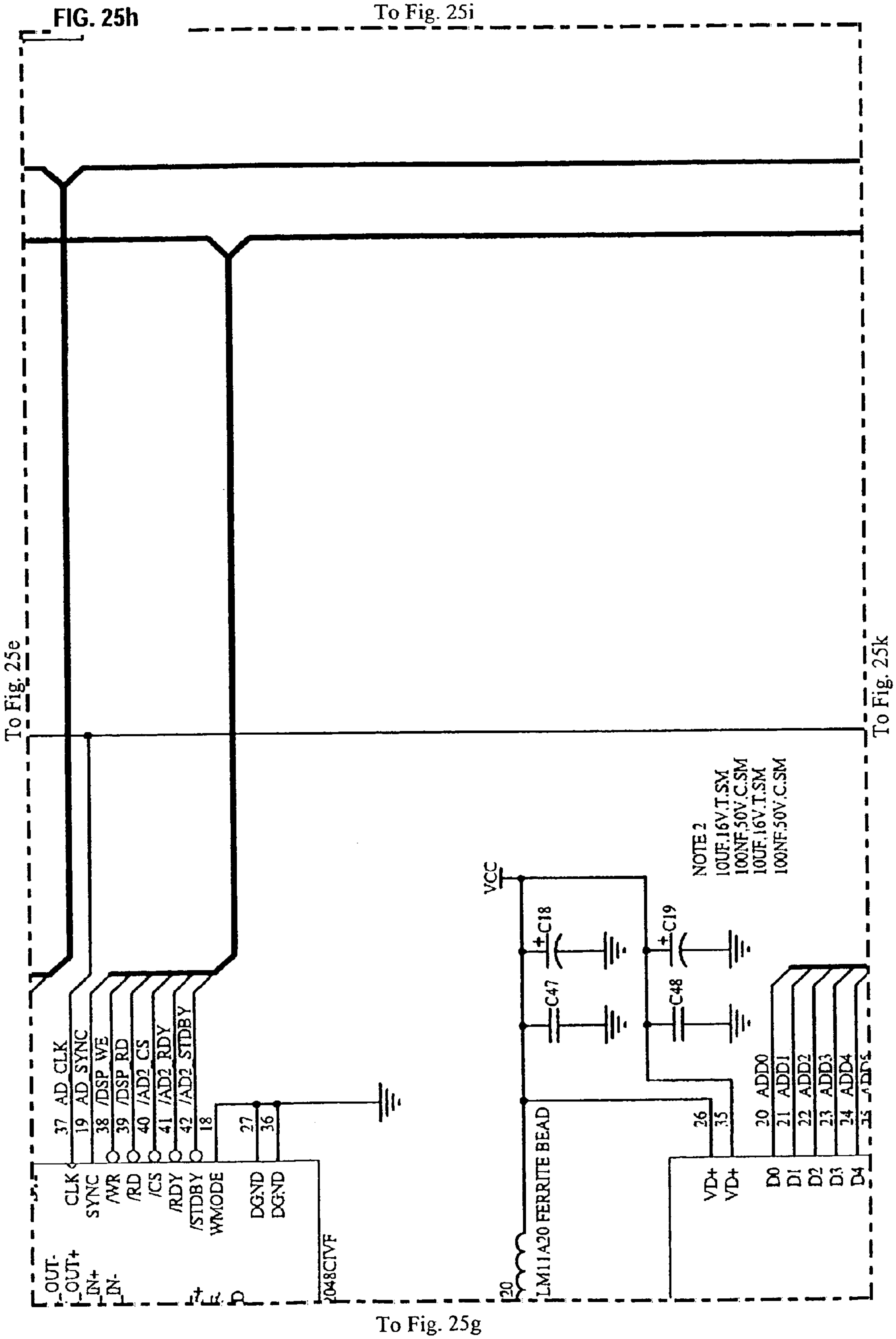
Figure 25I:
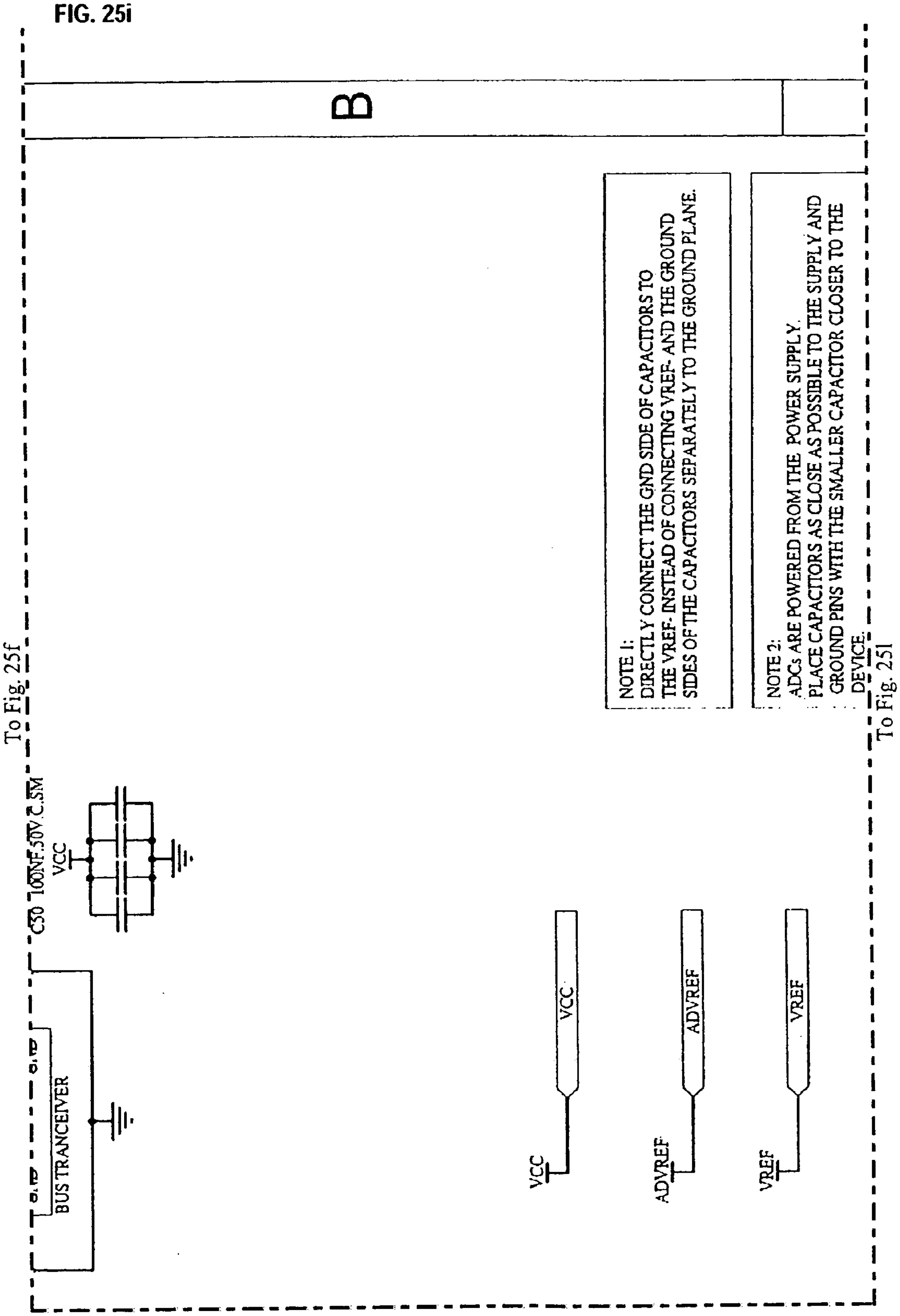
Figure 25J:
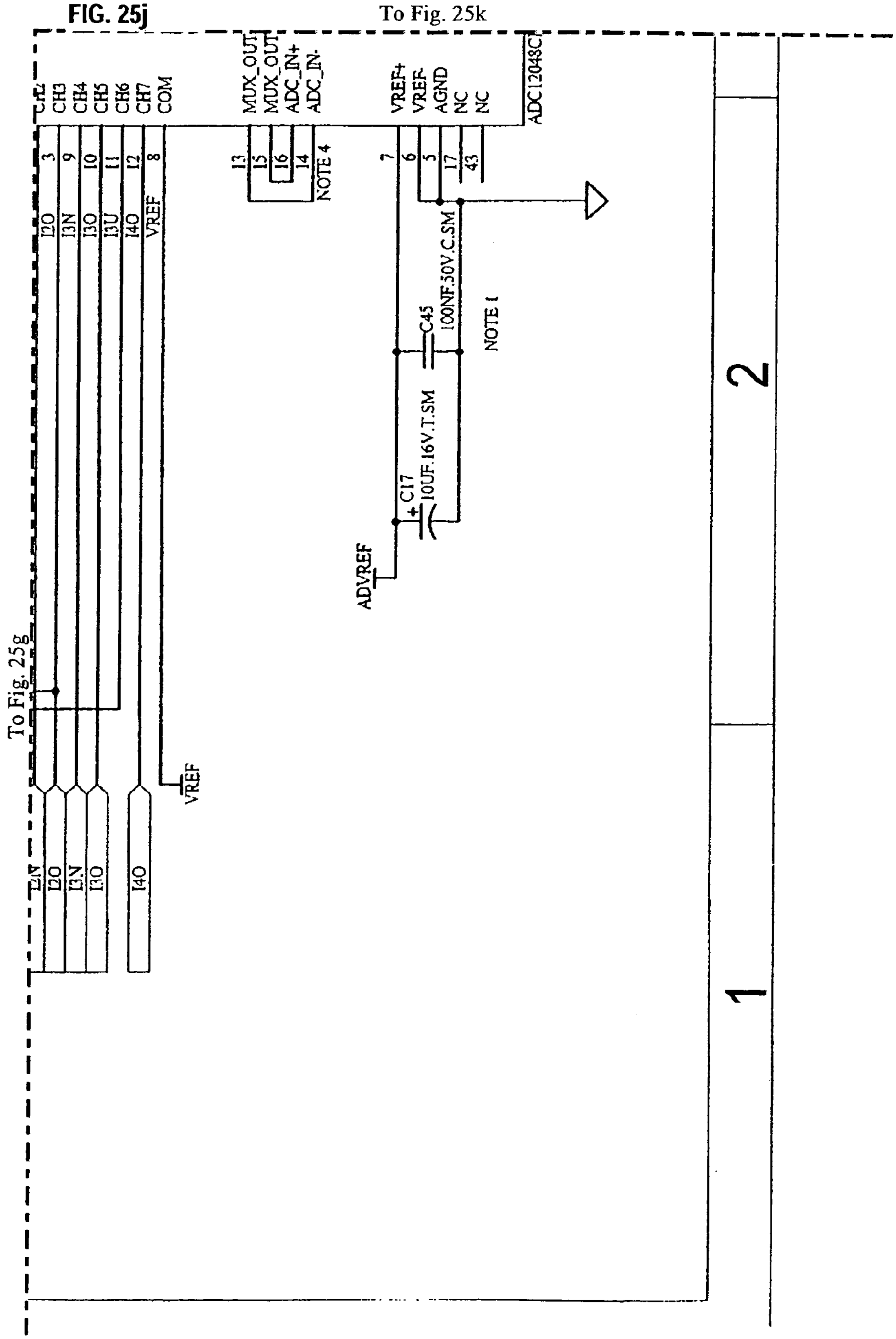
Figure 25K:
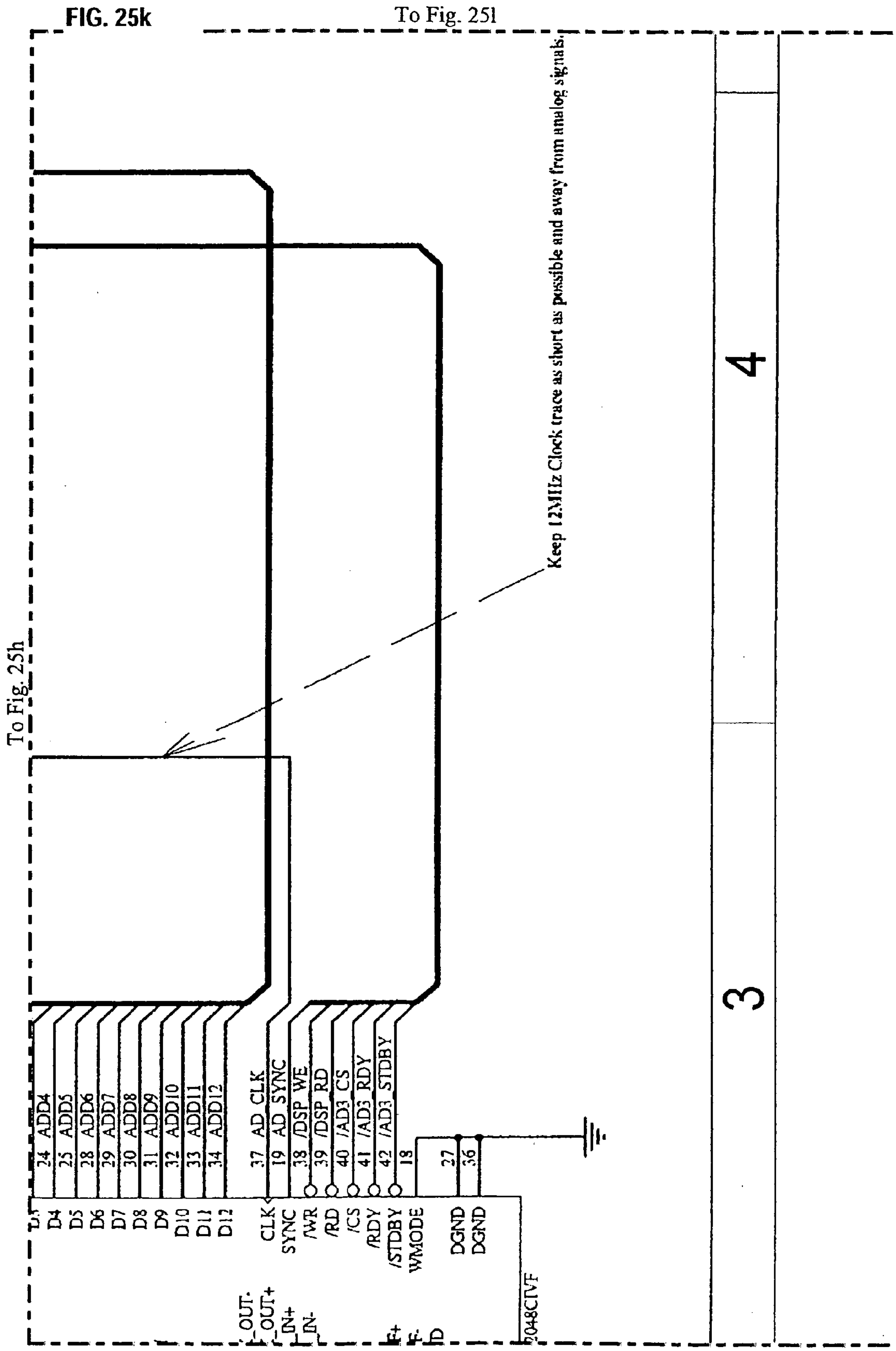
Figure 25L:
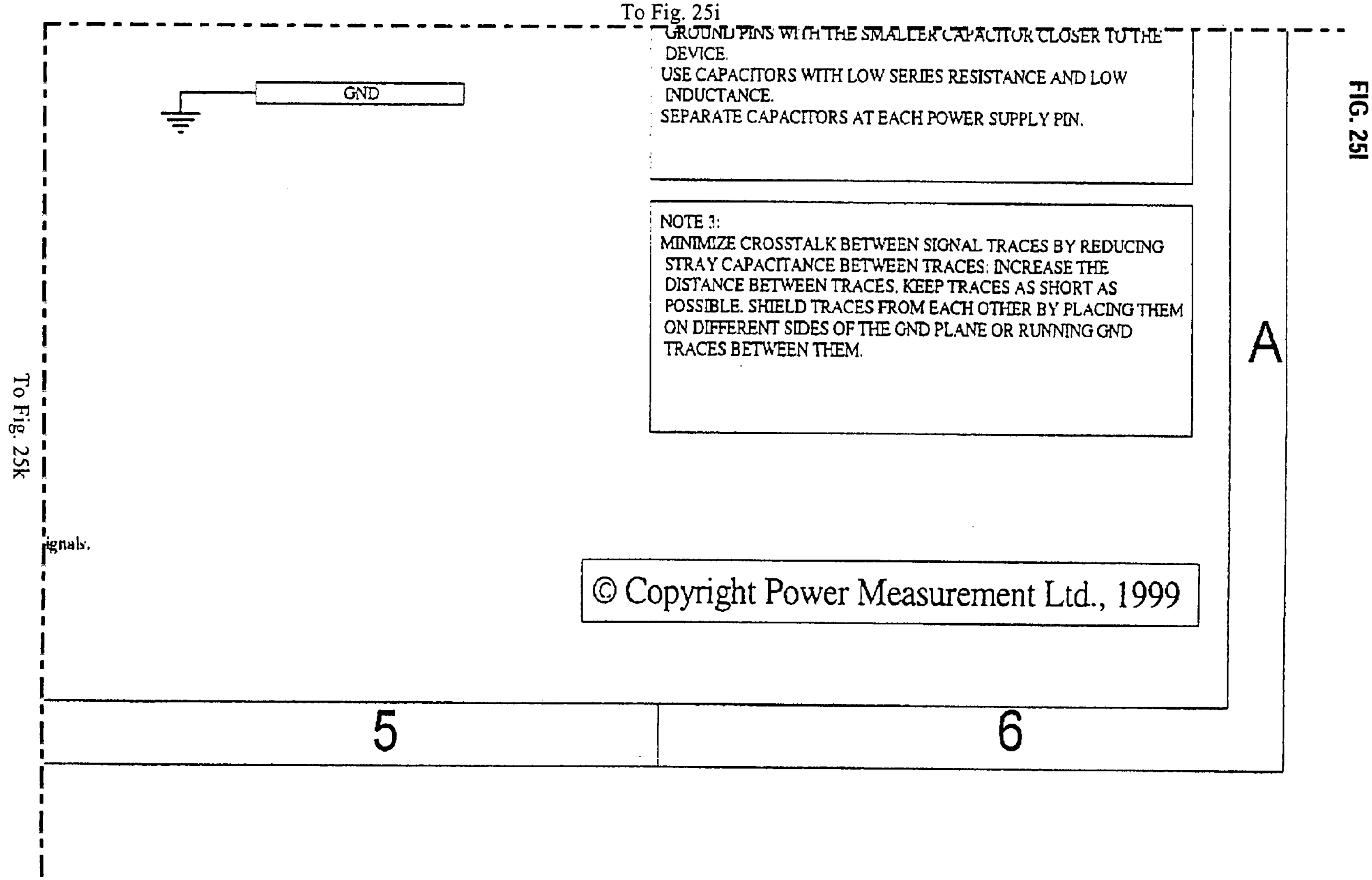
Figure 26A:
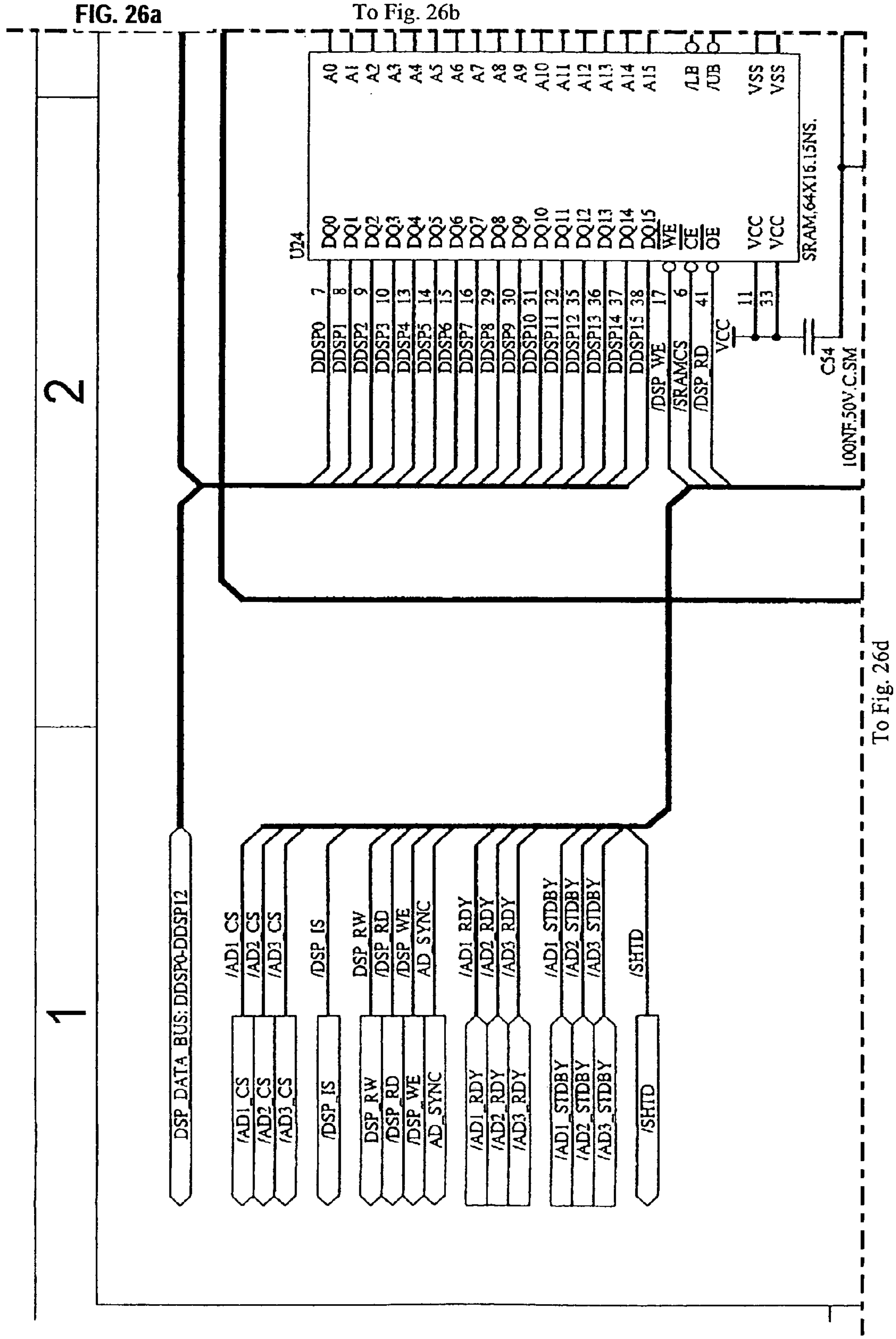
Figure 26B:
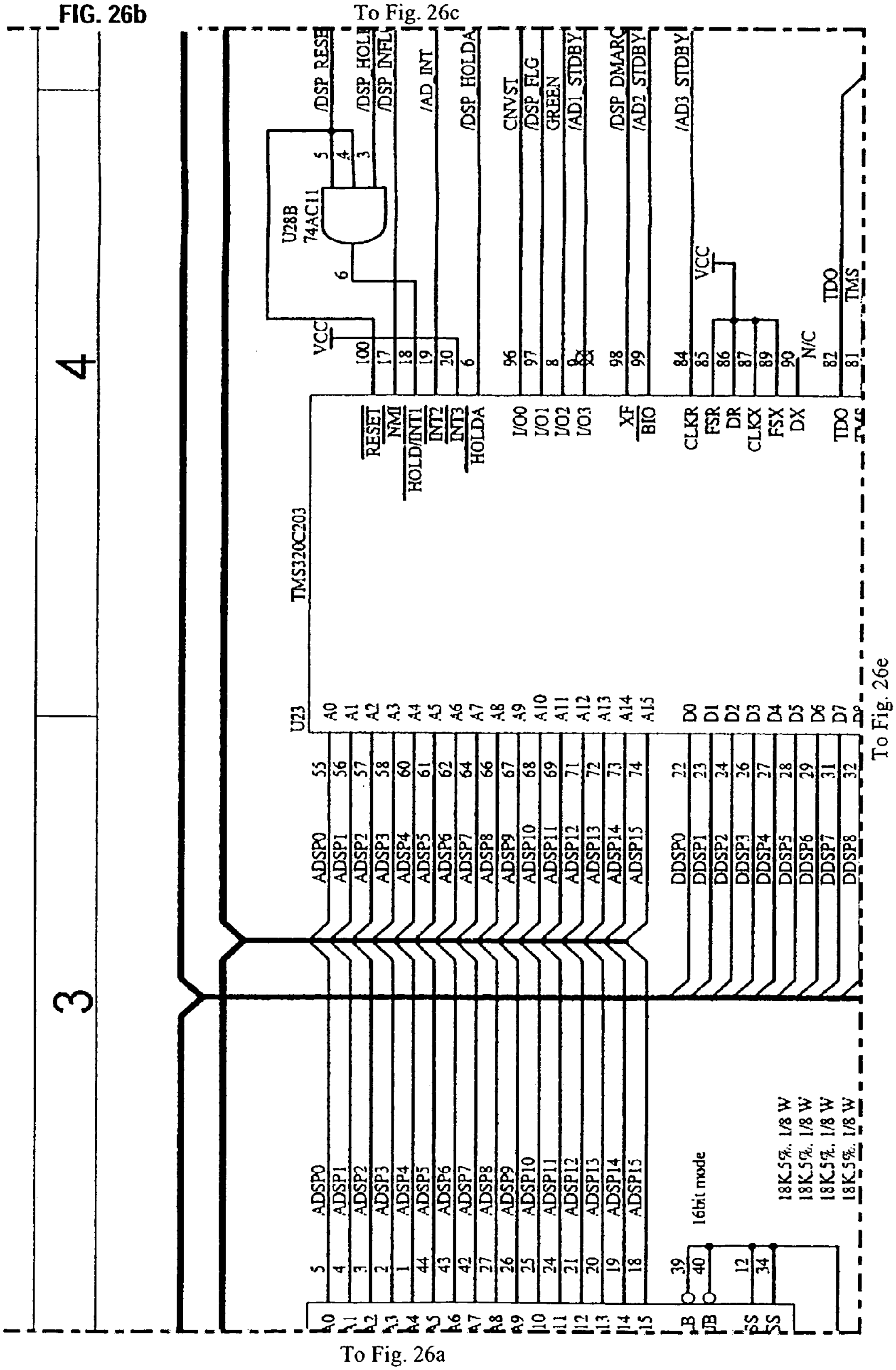
Figure 26C:
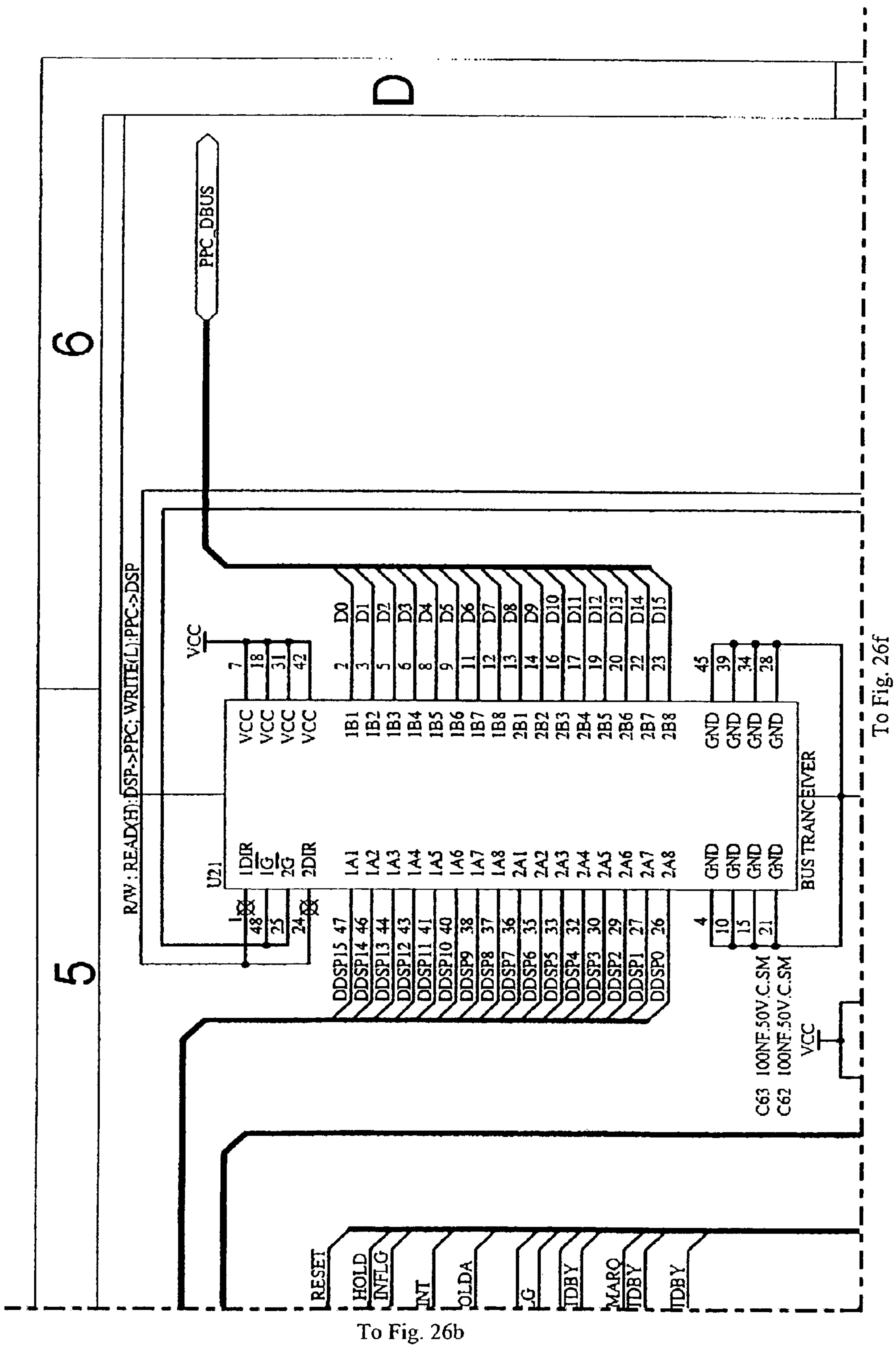
Figure 26D:
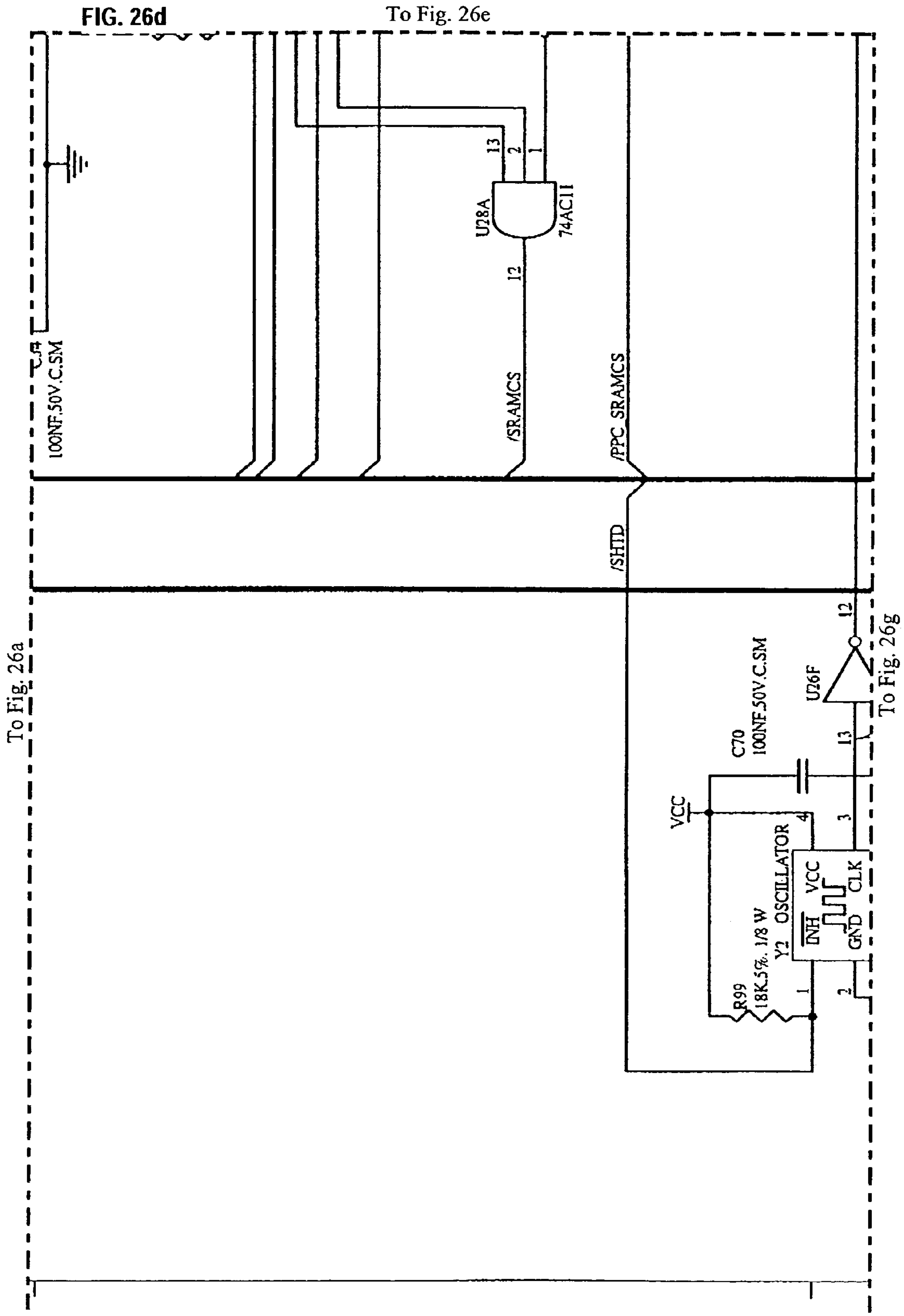
Figure 26E:
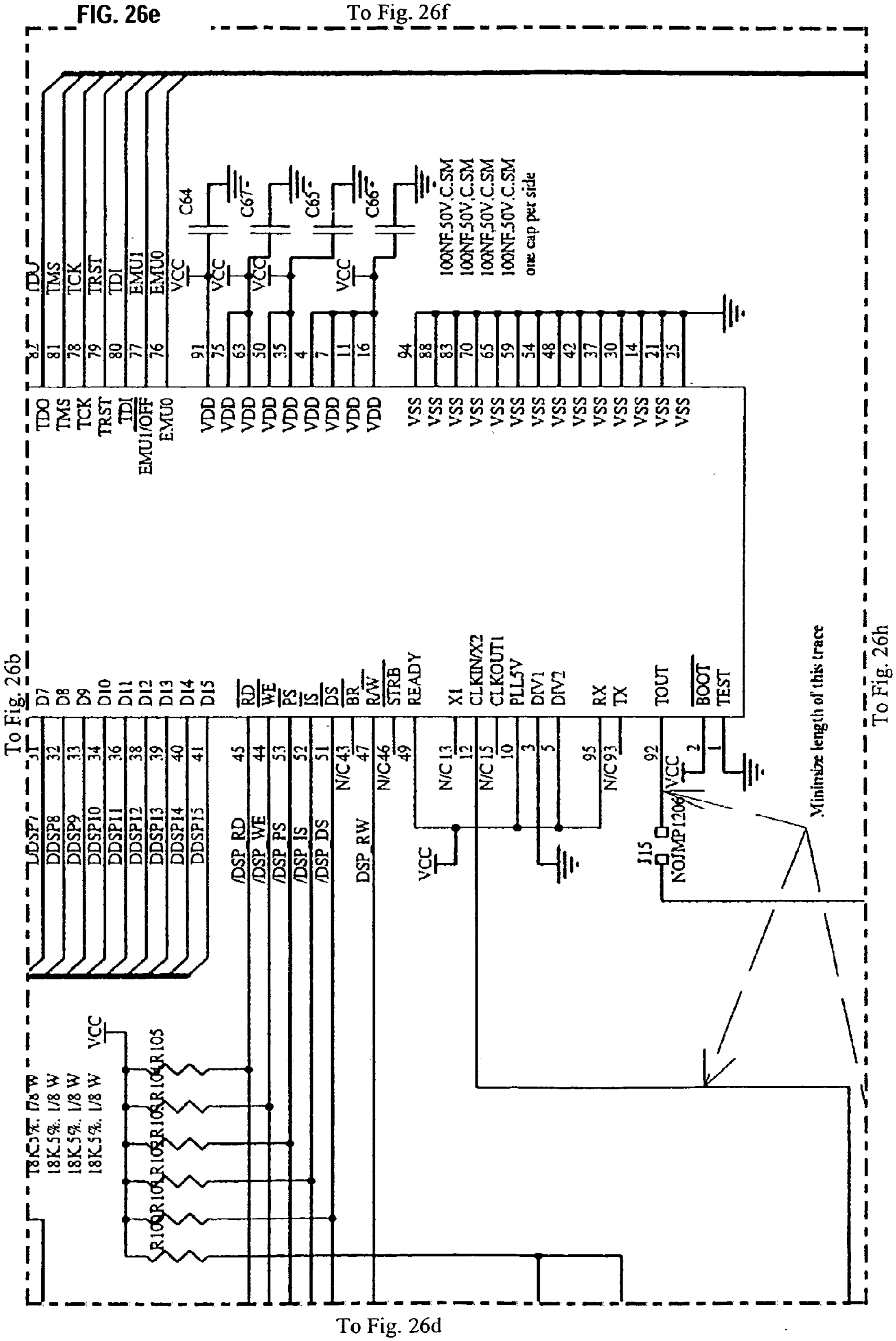
Figure 26F:
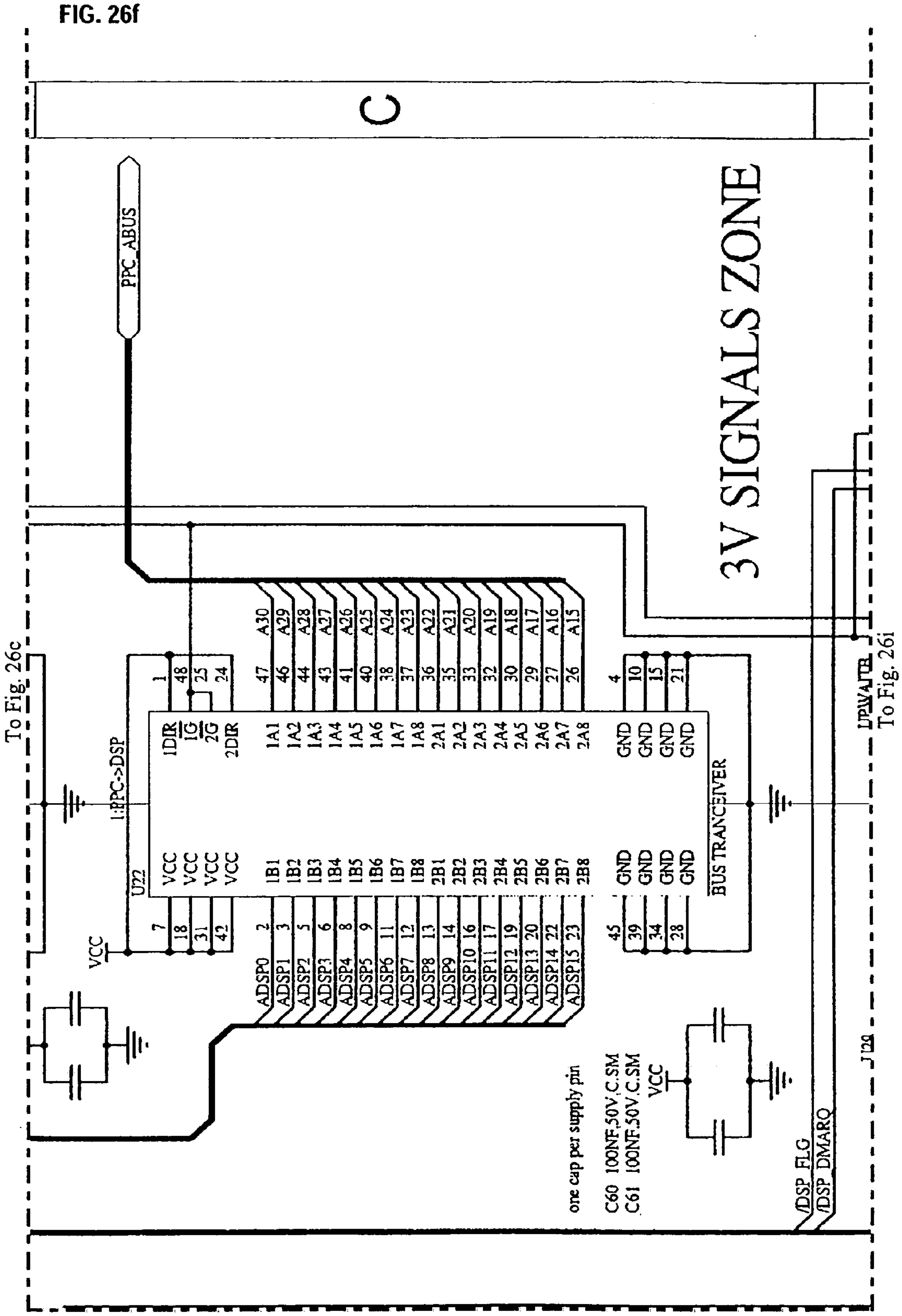
Figure 26G:
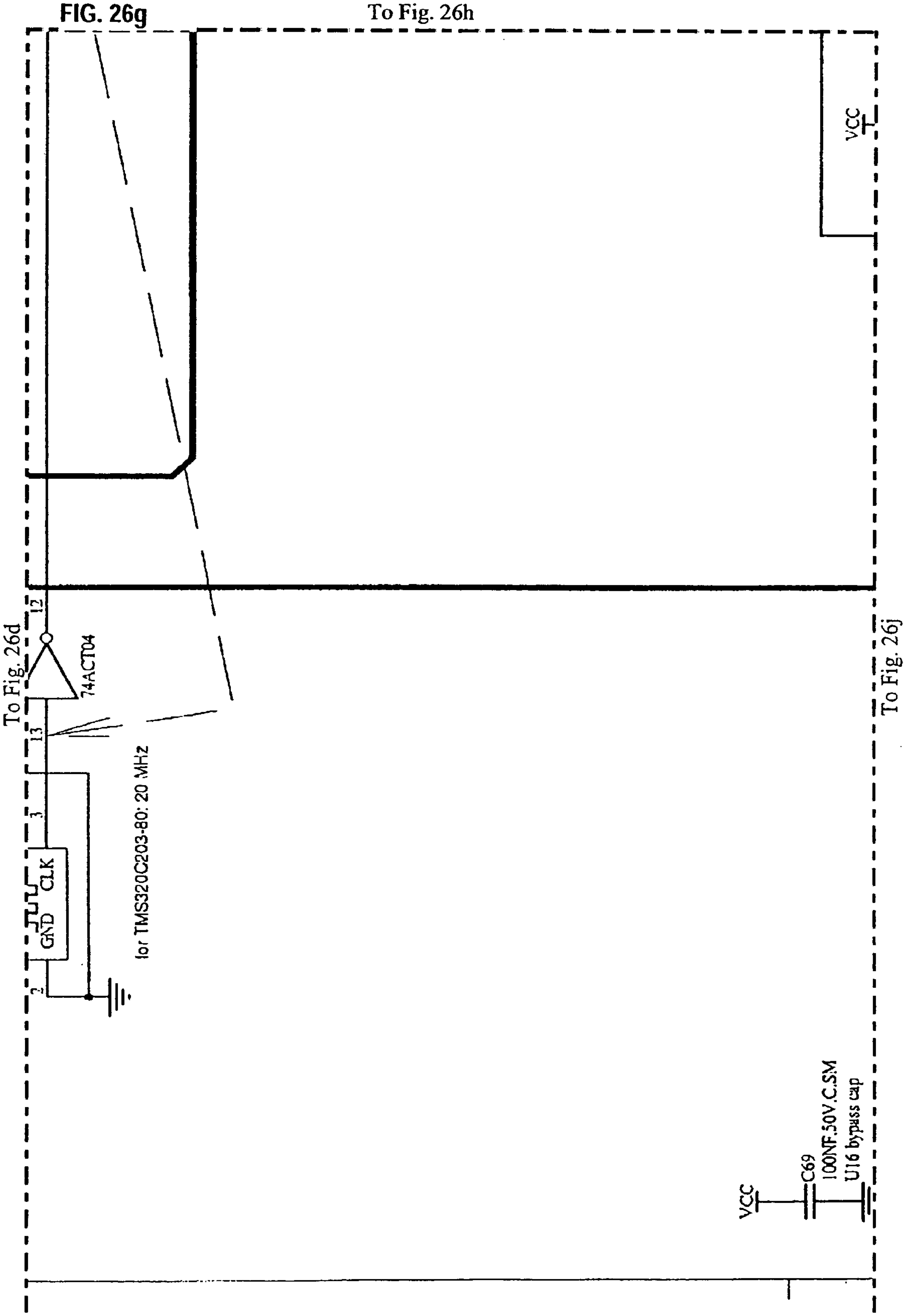
Figure 26H:
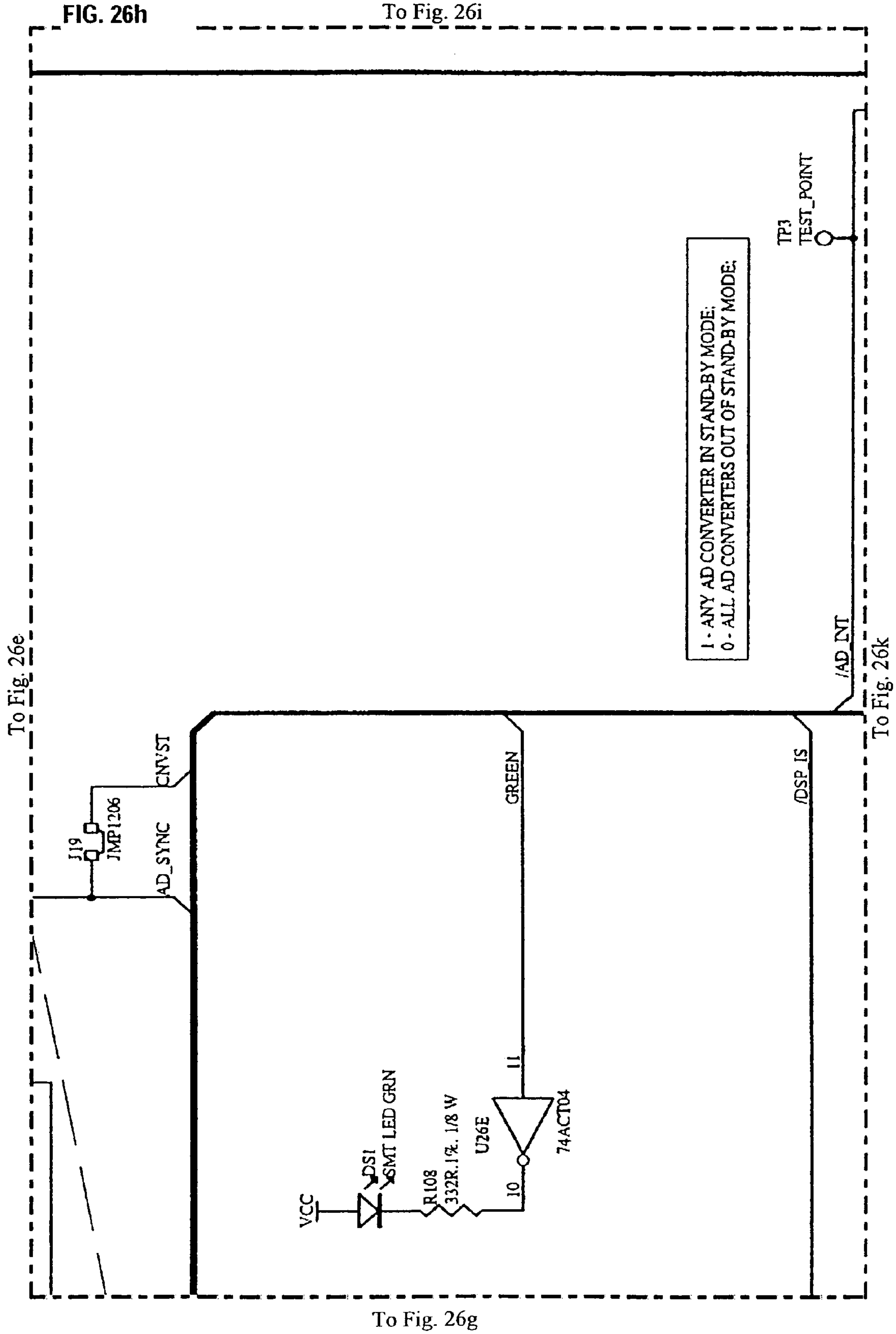
Figure 26I:
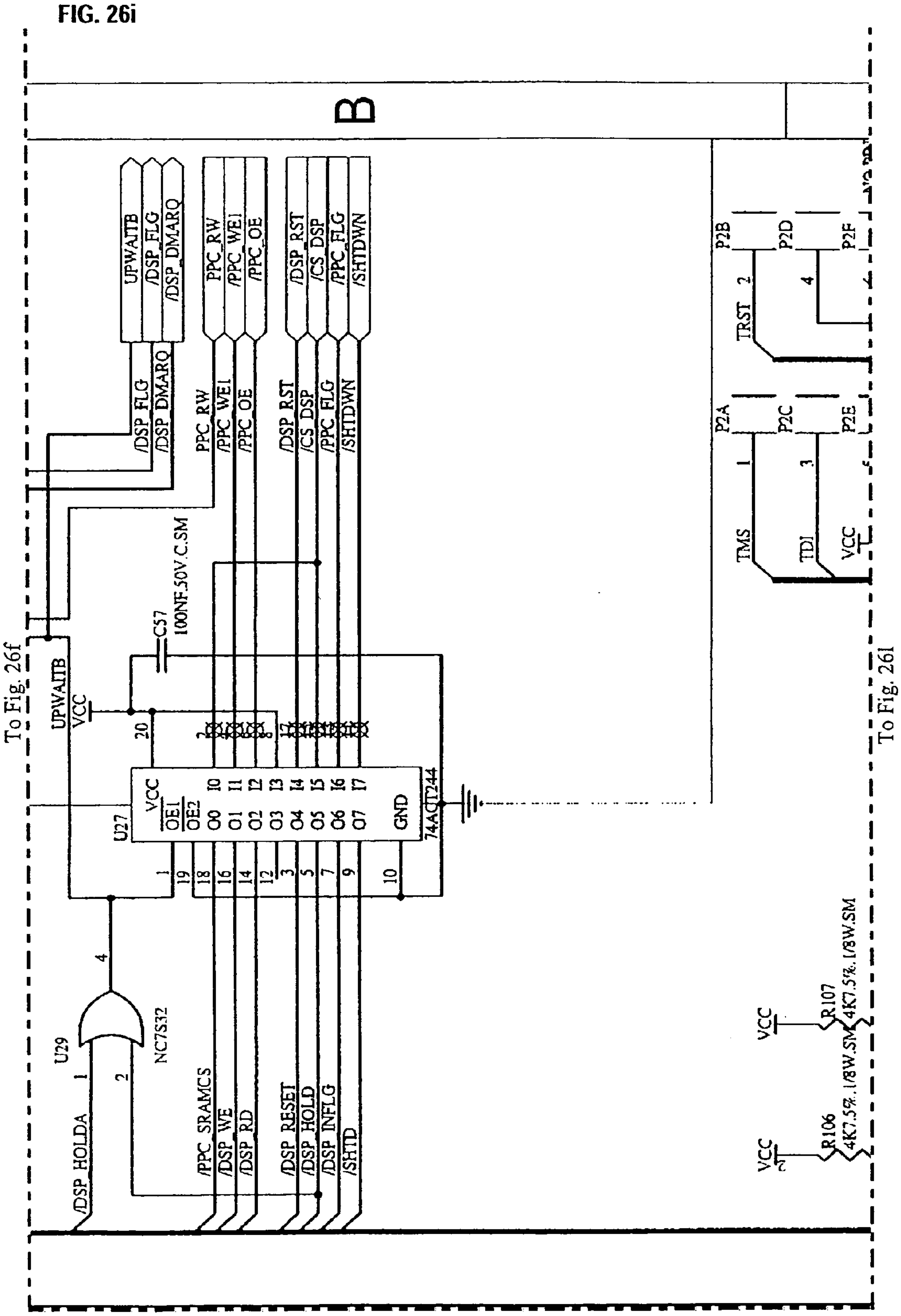
Figure 26J:
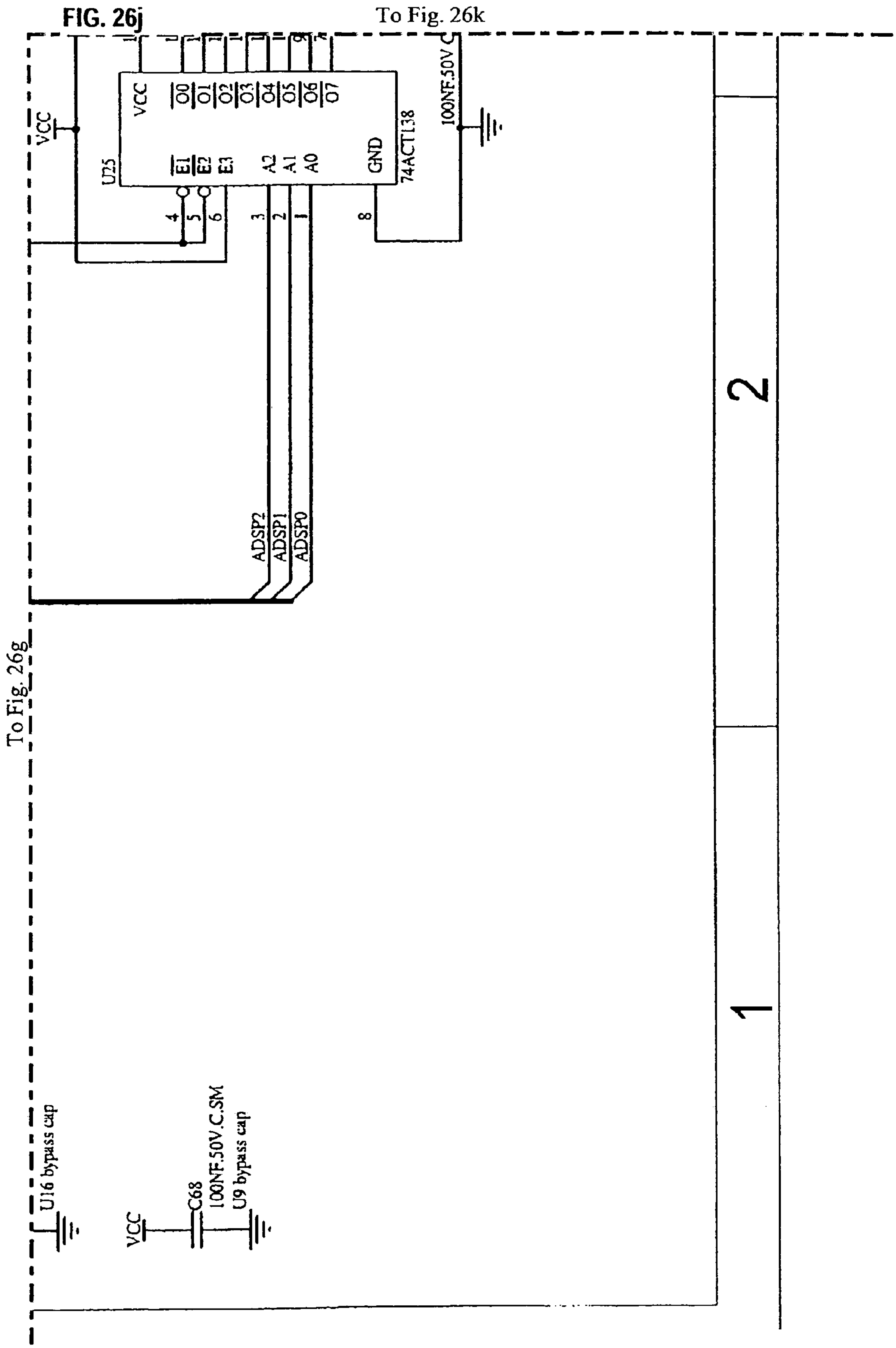
Figure 26K:
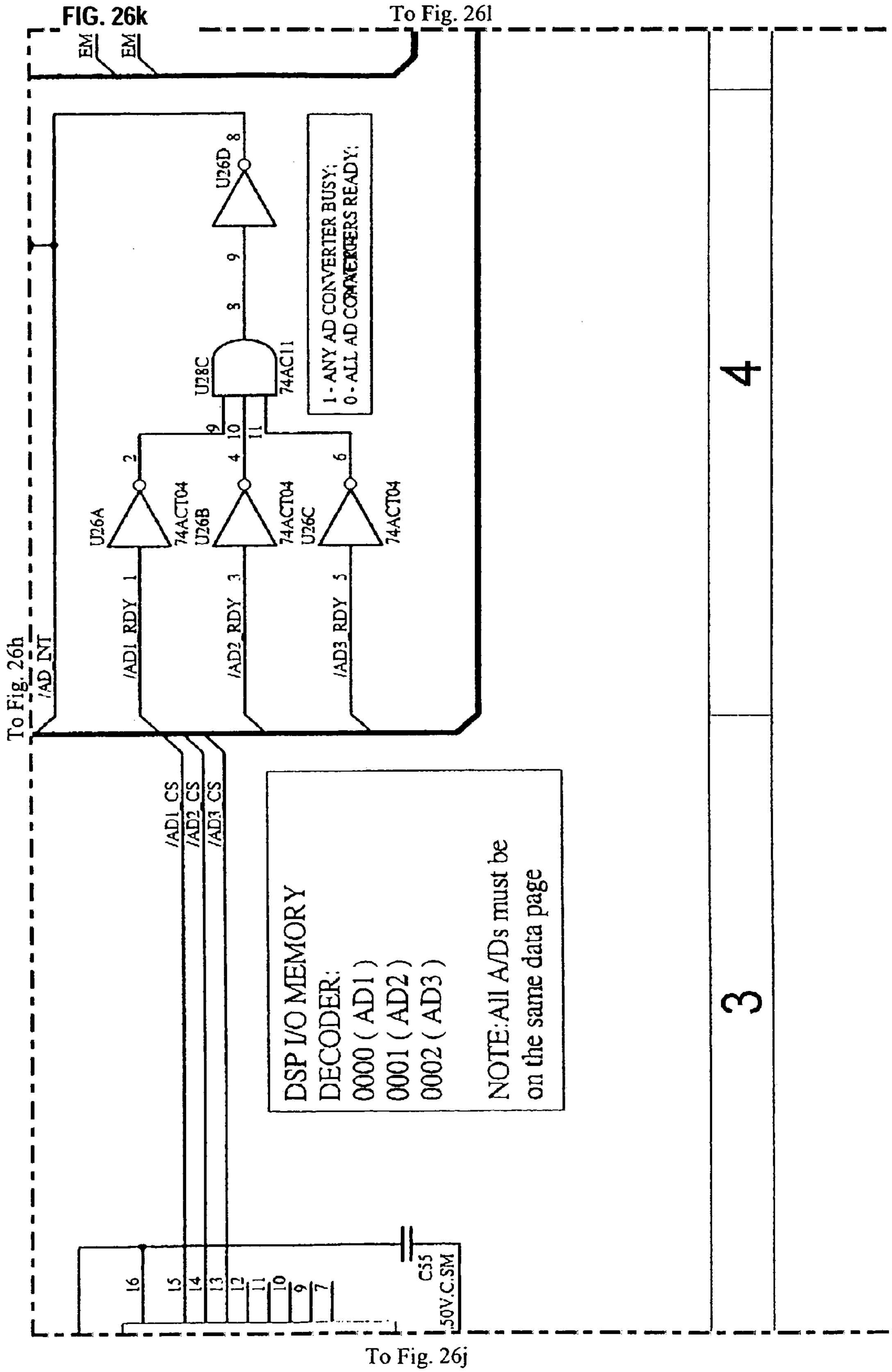
Figure 26I:
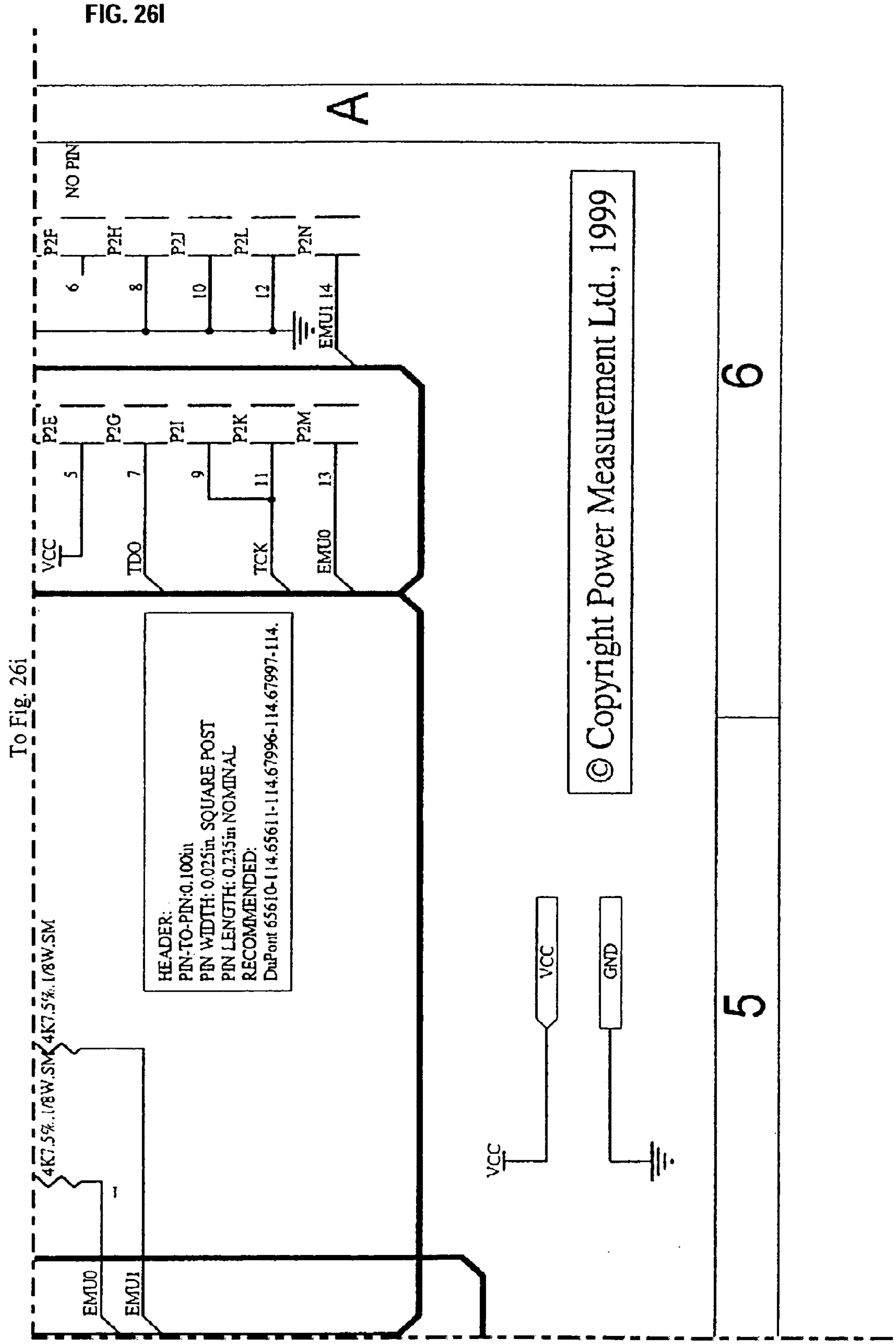
Figure 27A:
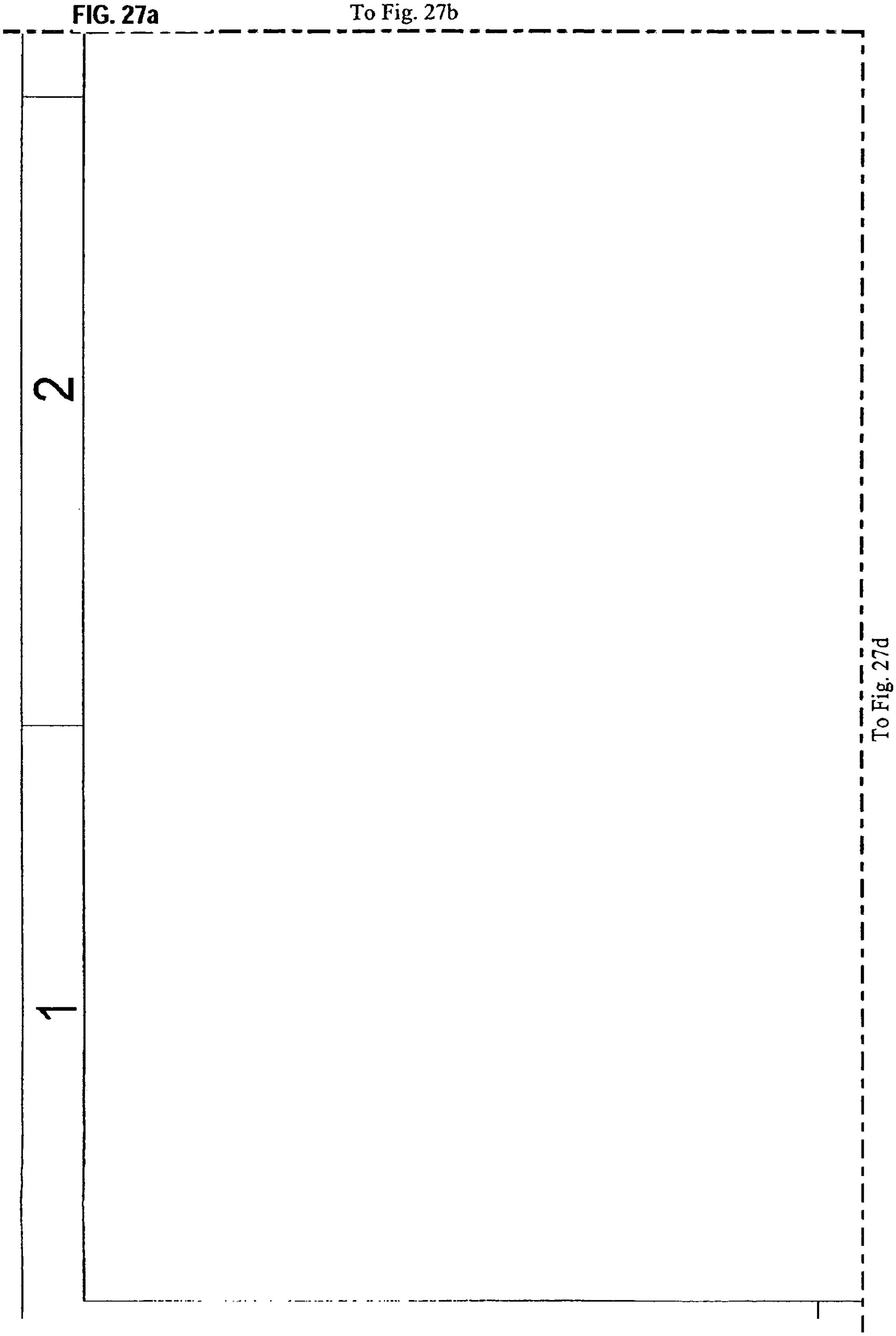
Figure 27B:
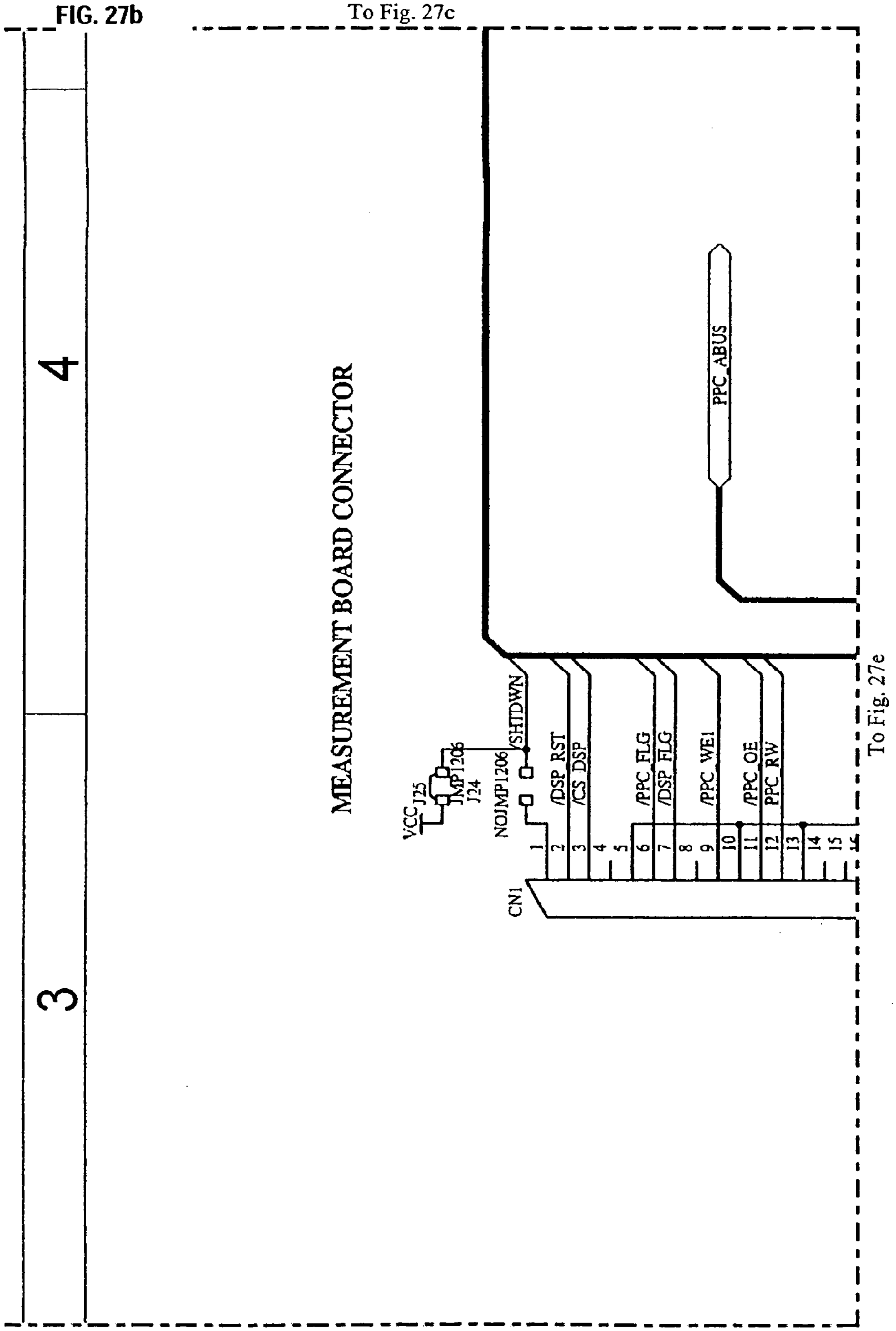
Figure 27C:
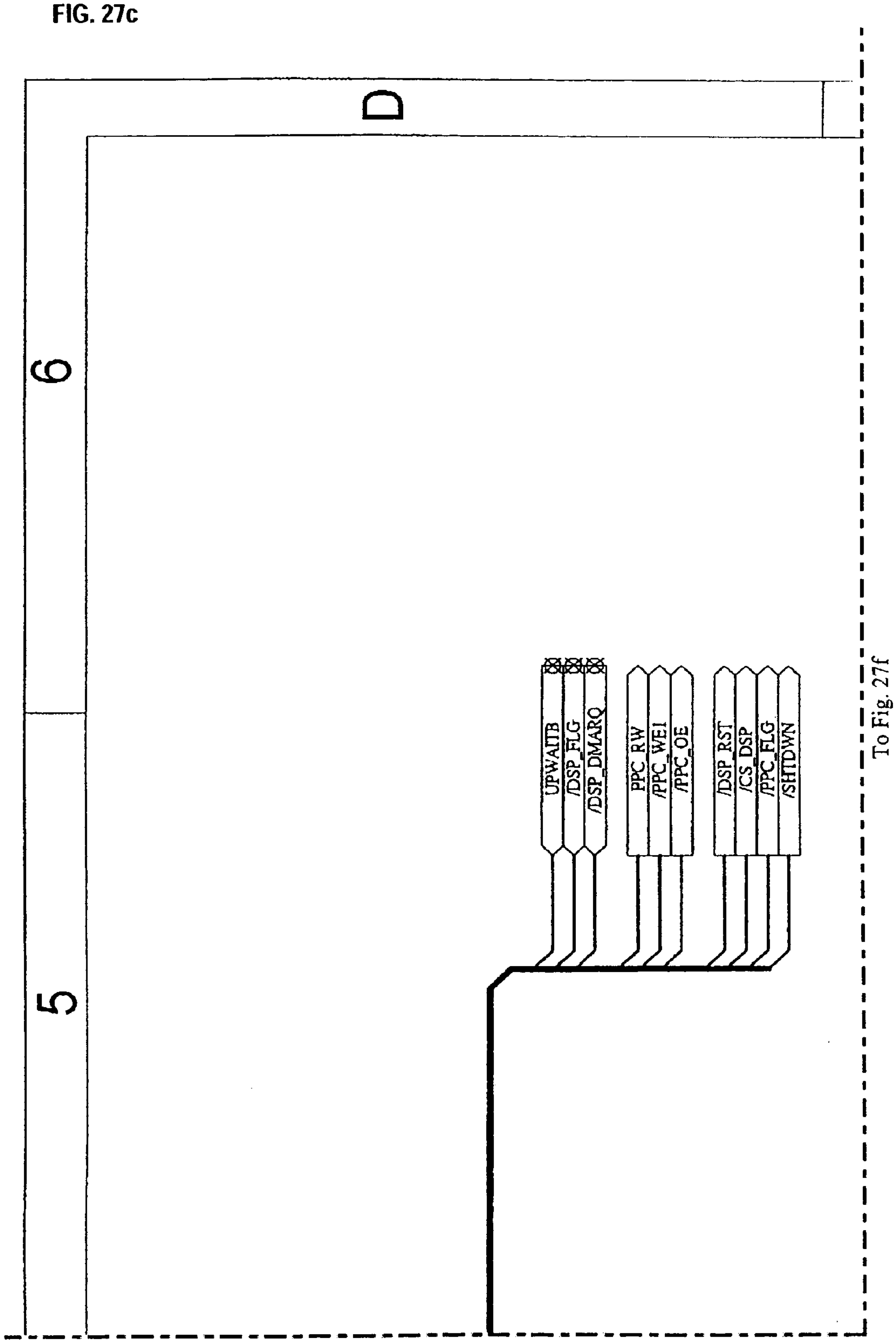
Figure 27D:
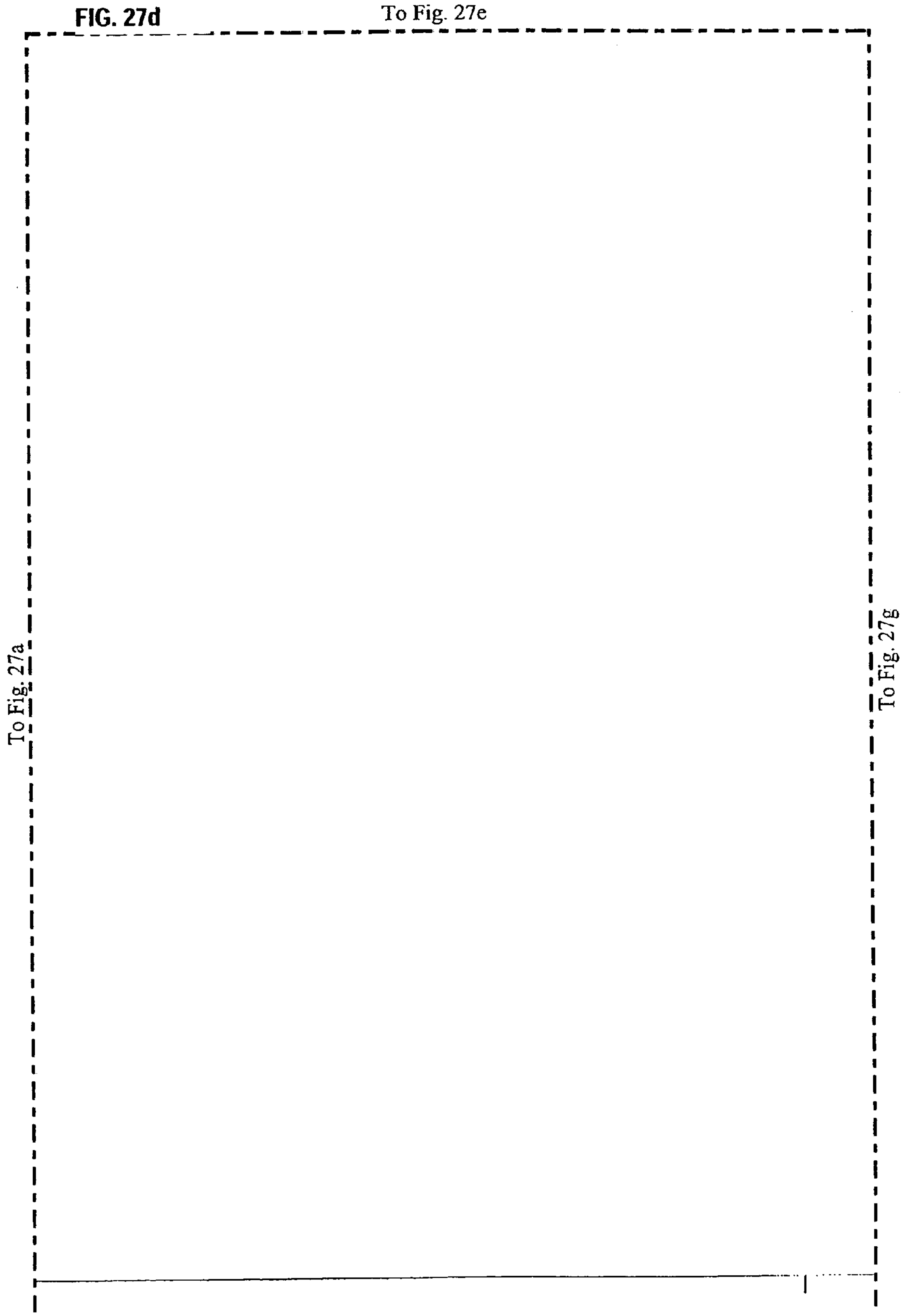
Figure 27E:
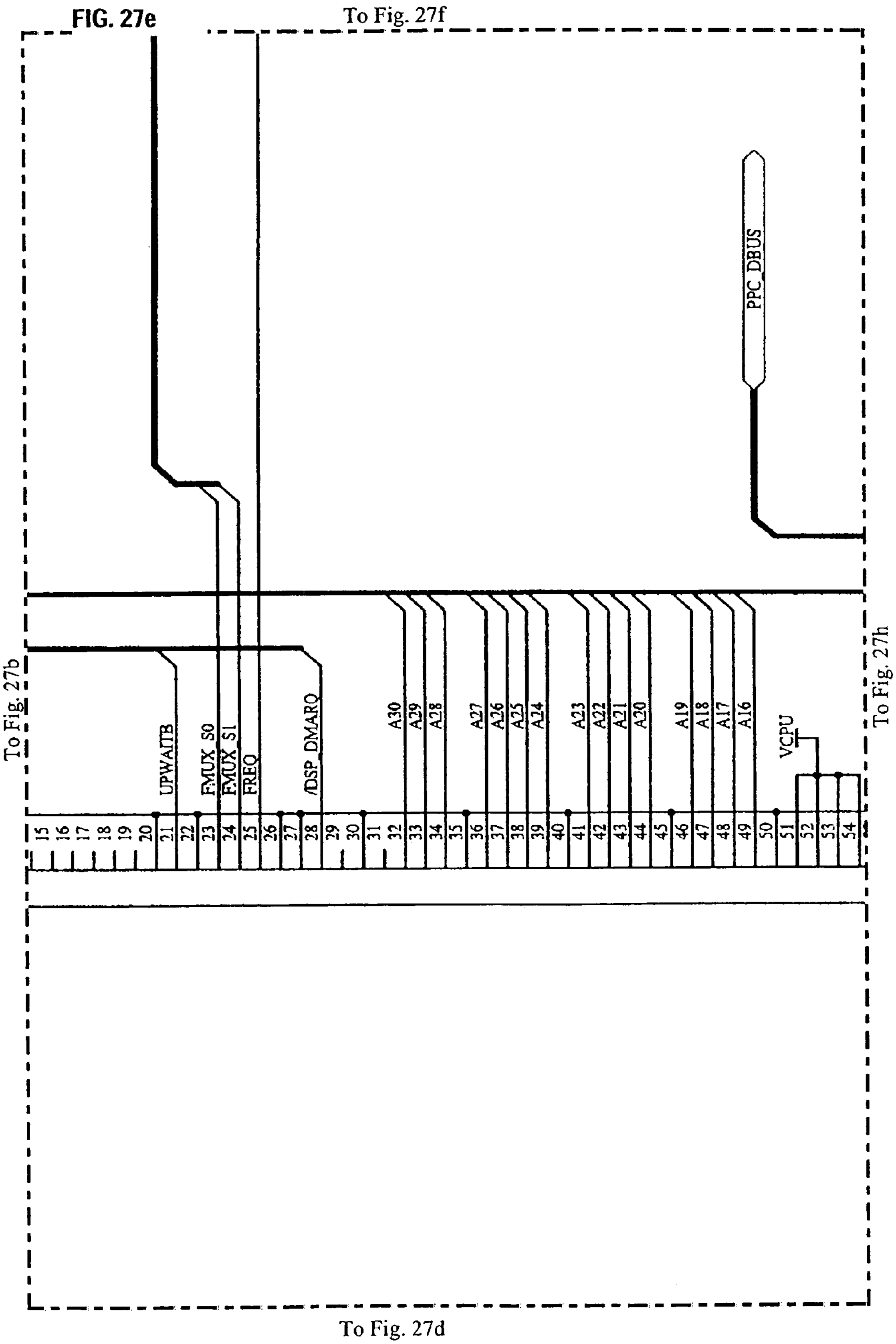
Figure 27F:
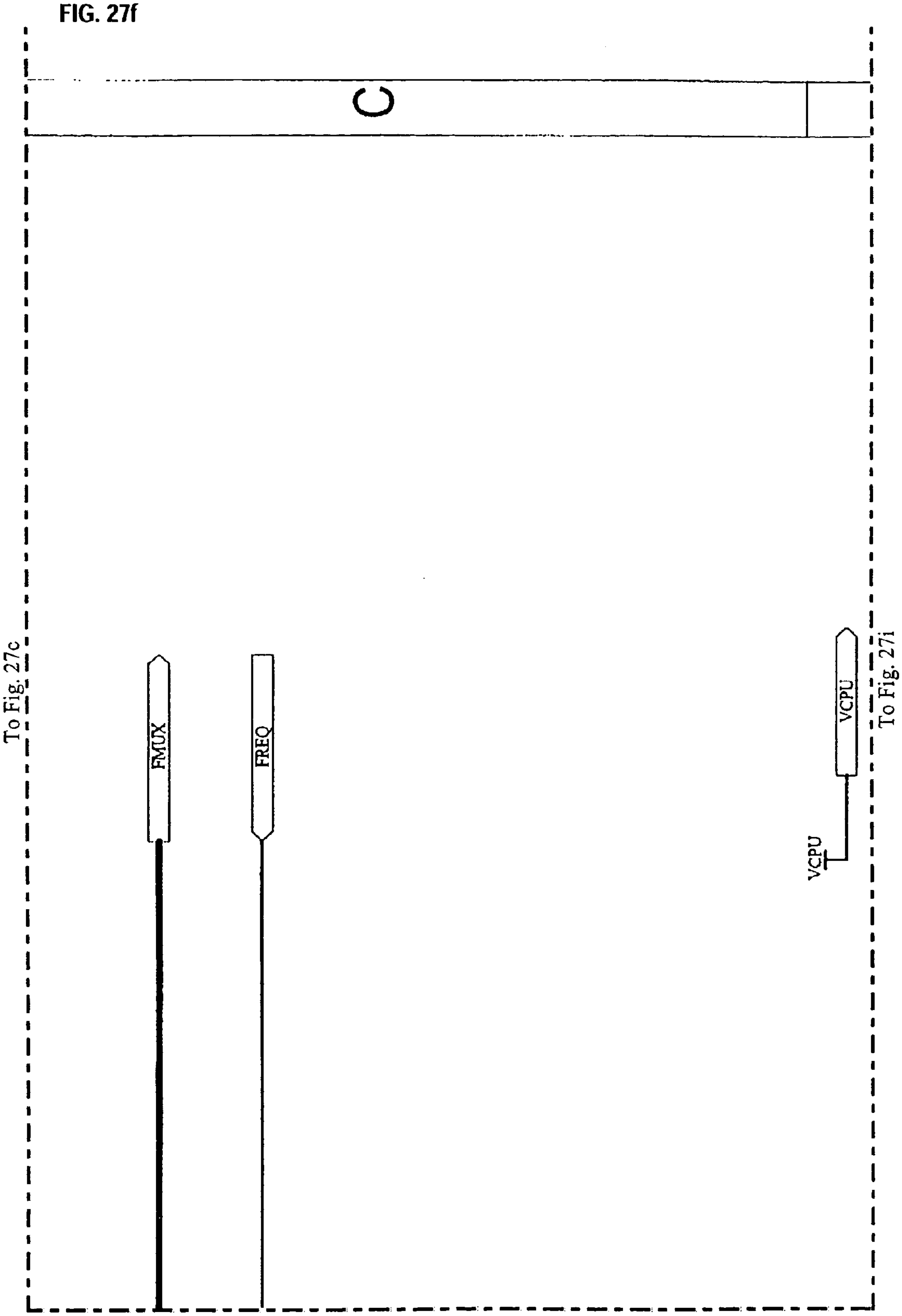
Figure 27G:
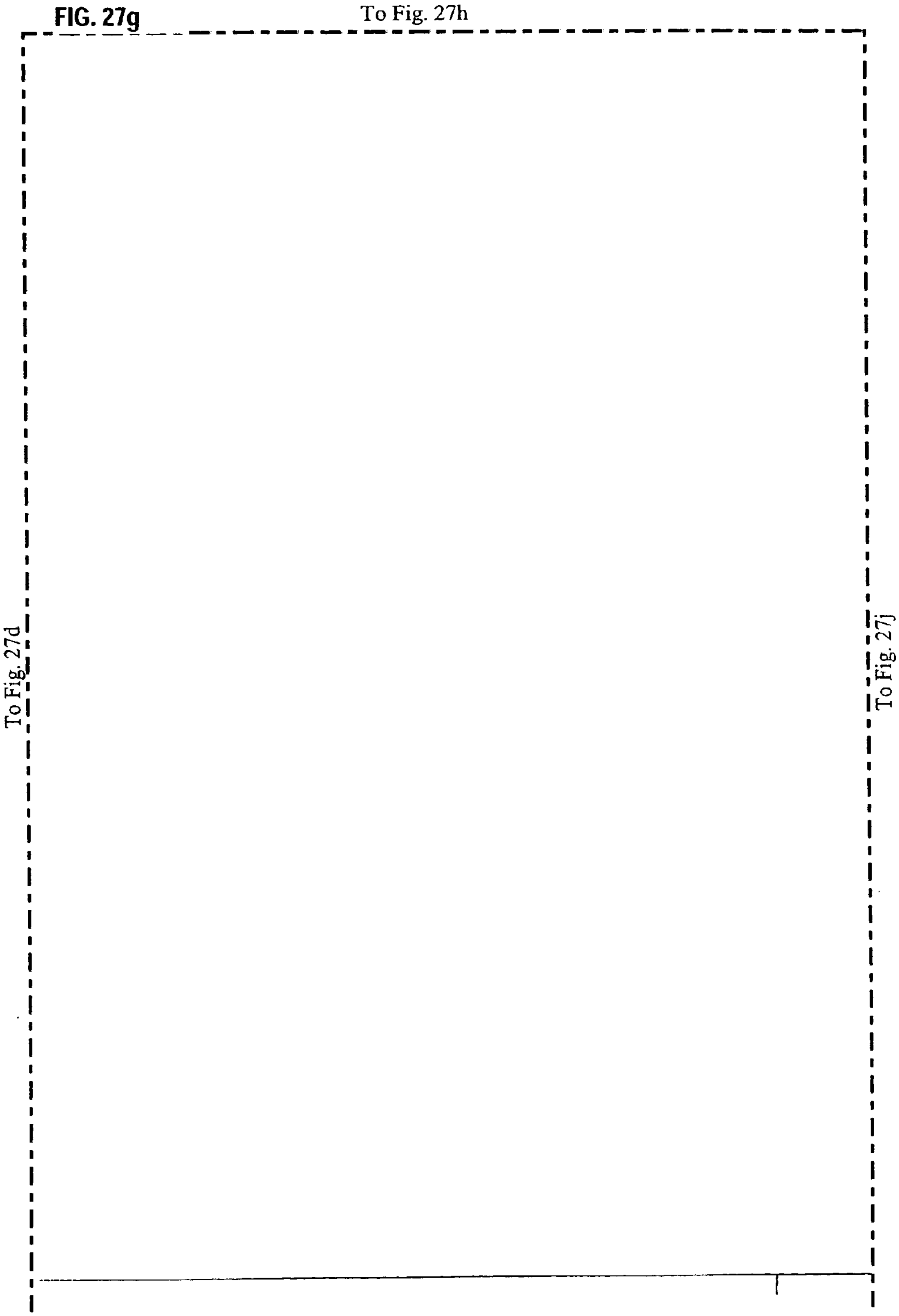
Figure 27H:
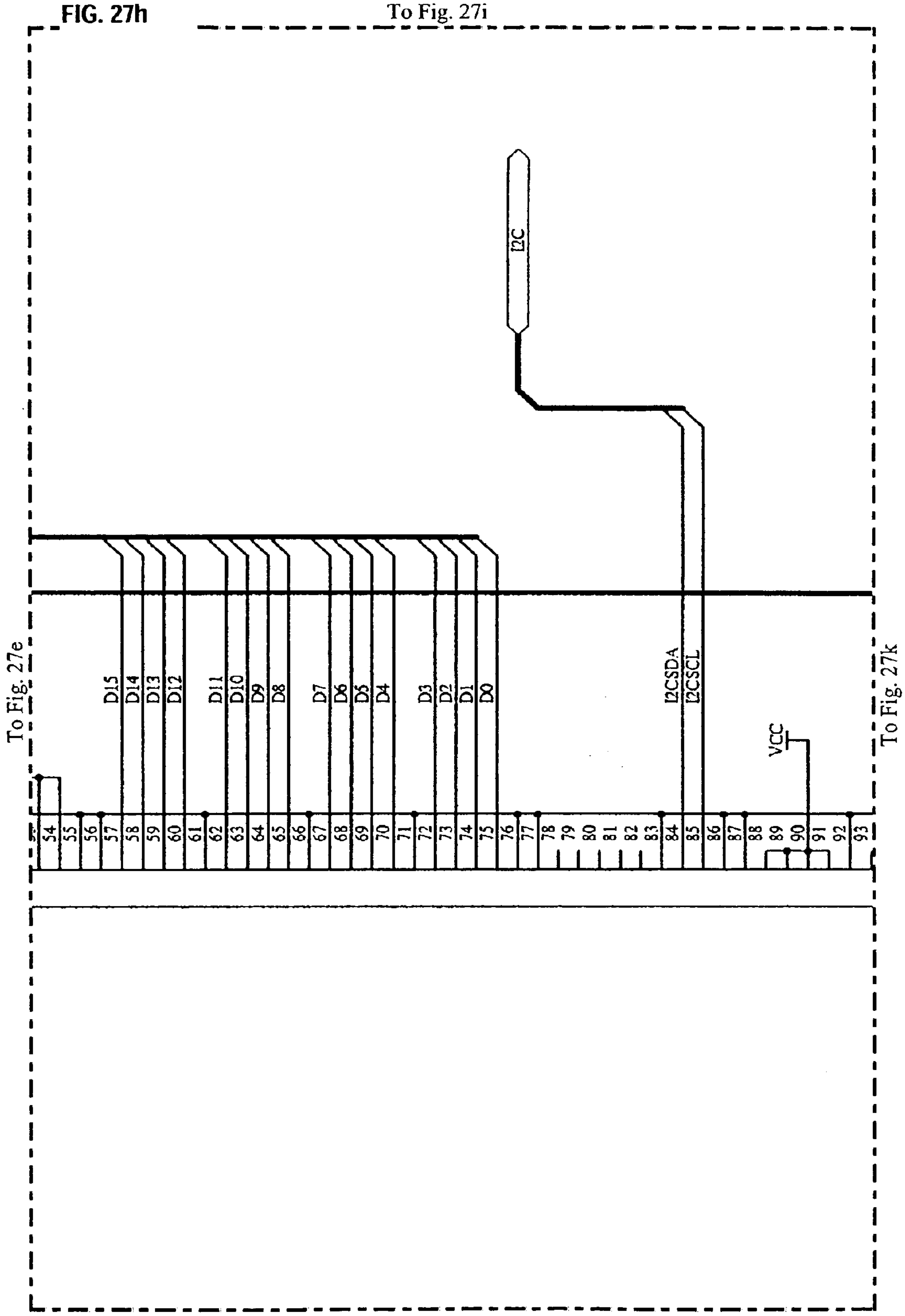
Figure 27I:
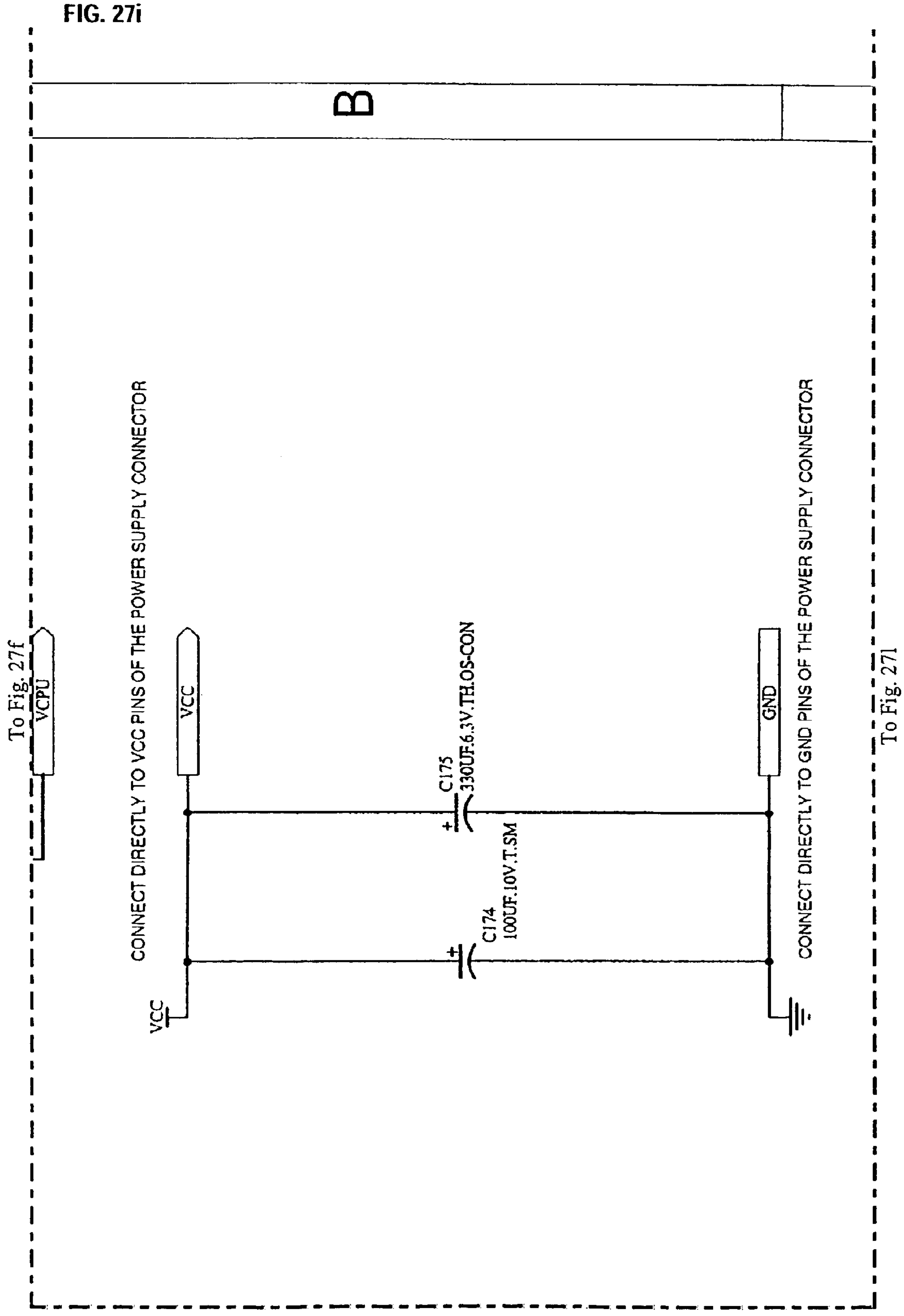
Figure 27J:
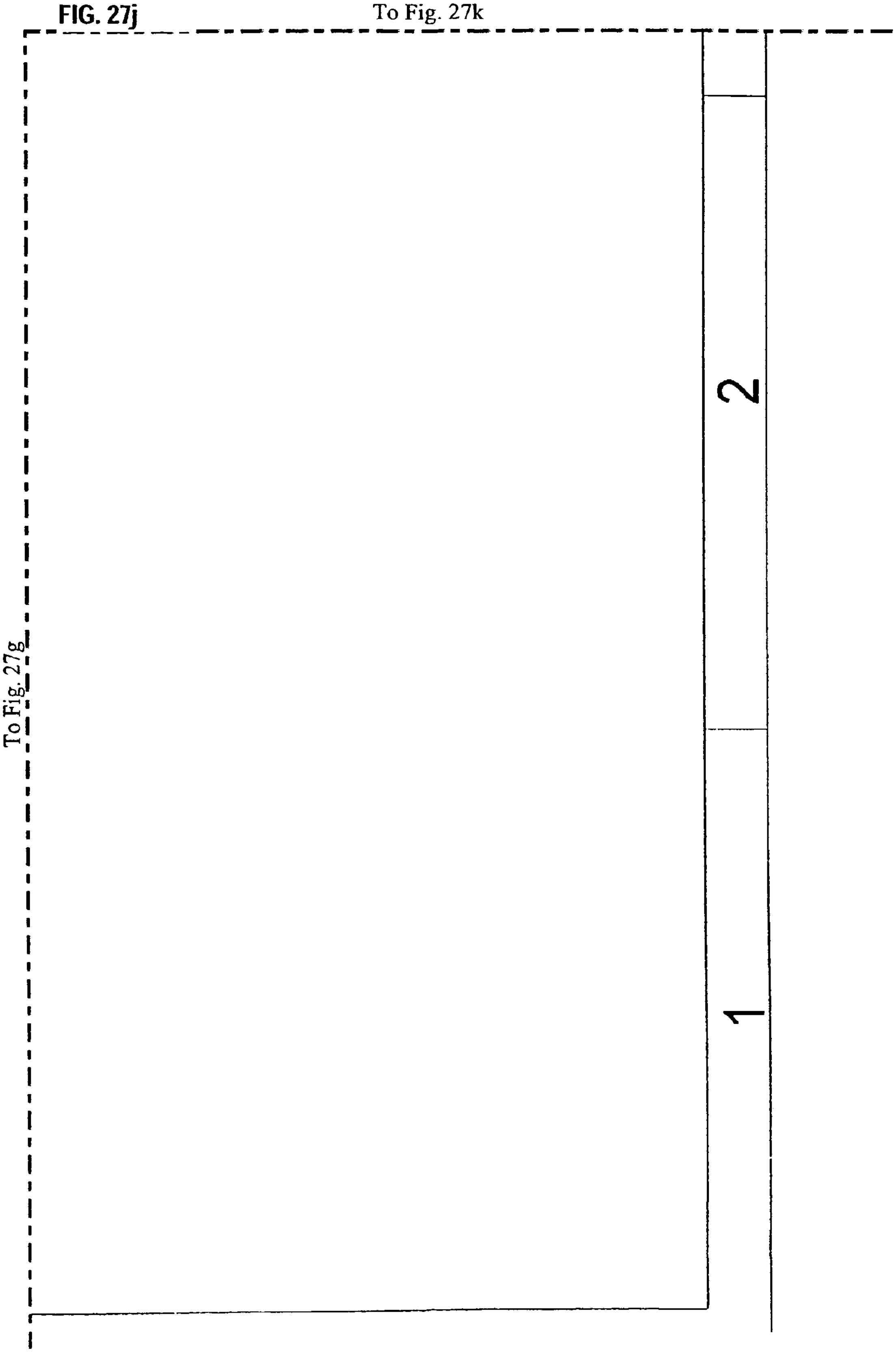
Figure 27K:
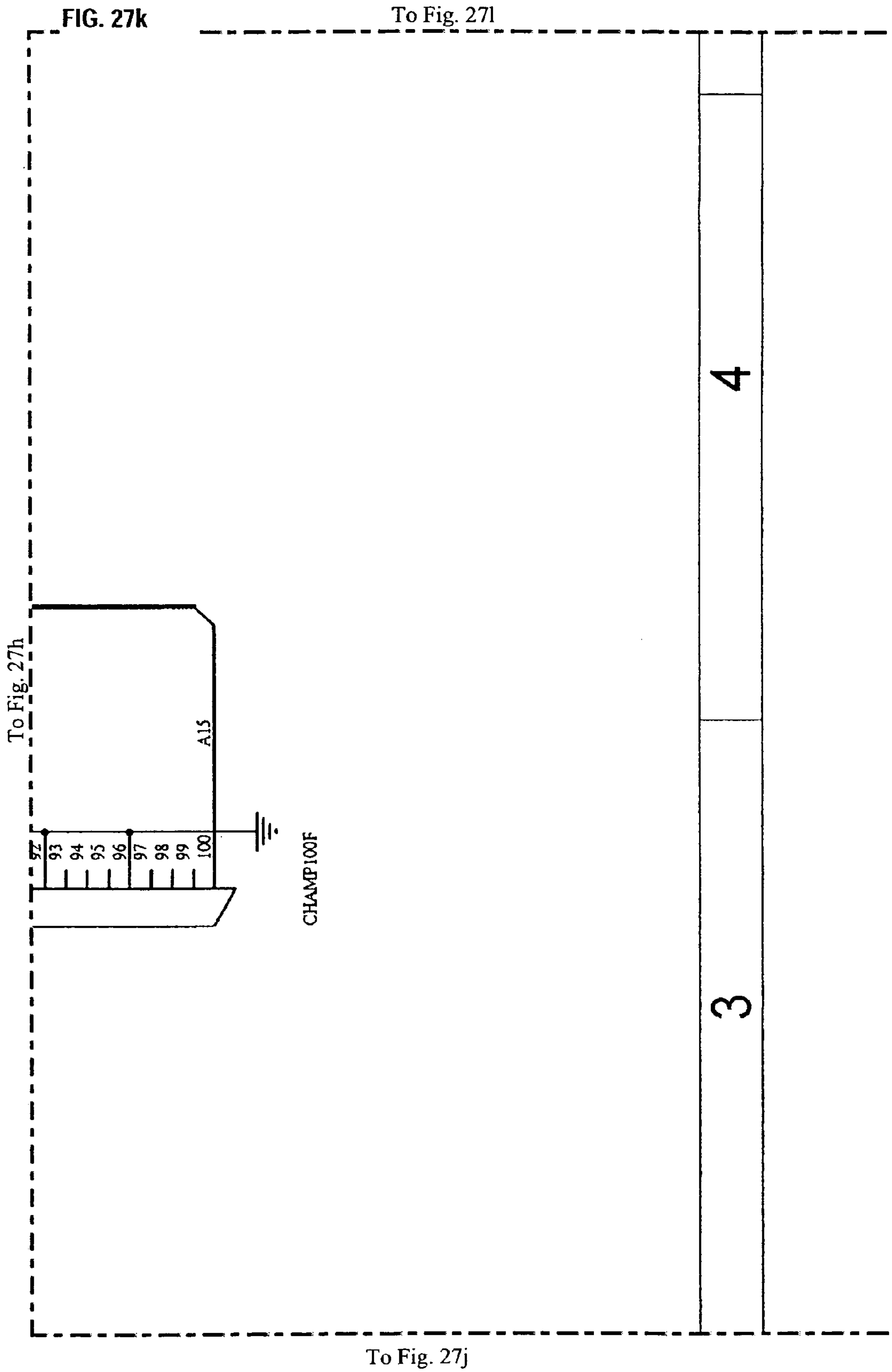
Figure 27L:
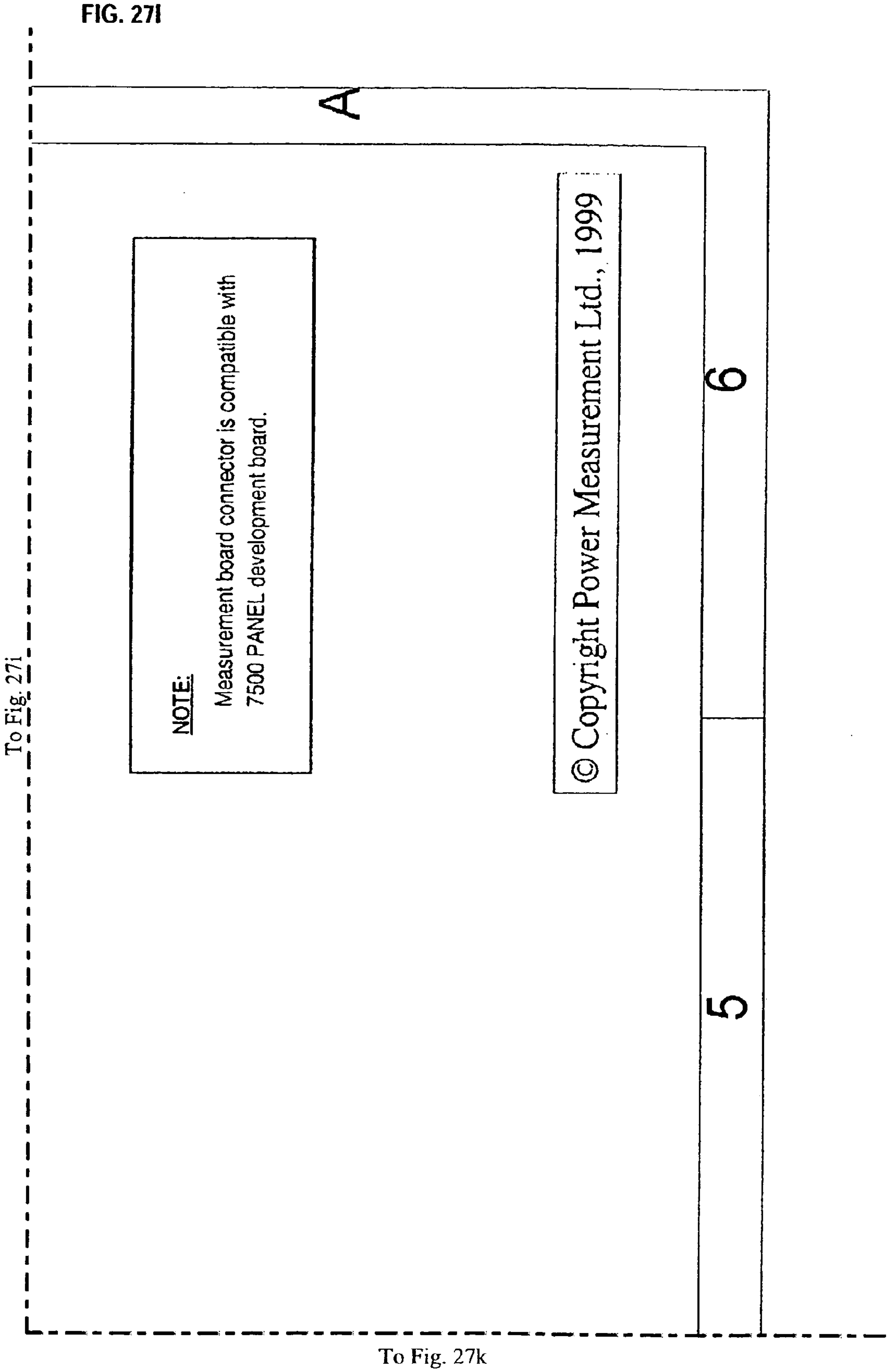
Figure 28A:
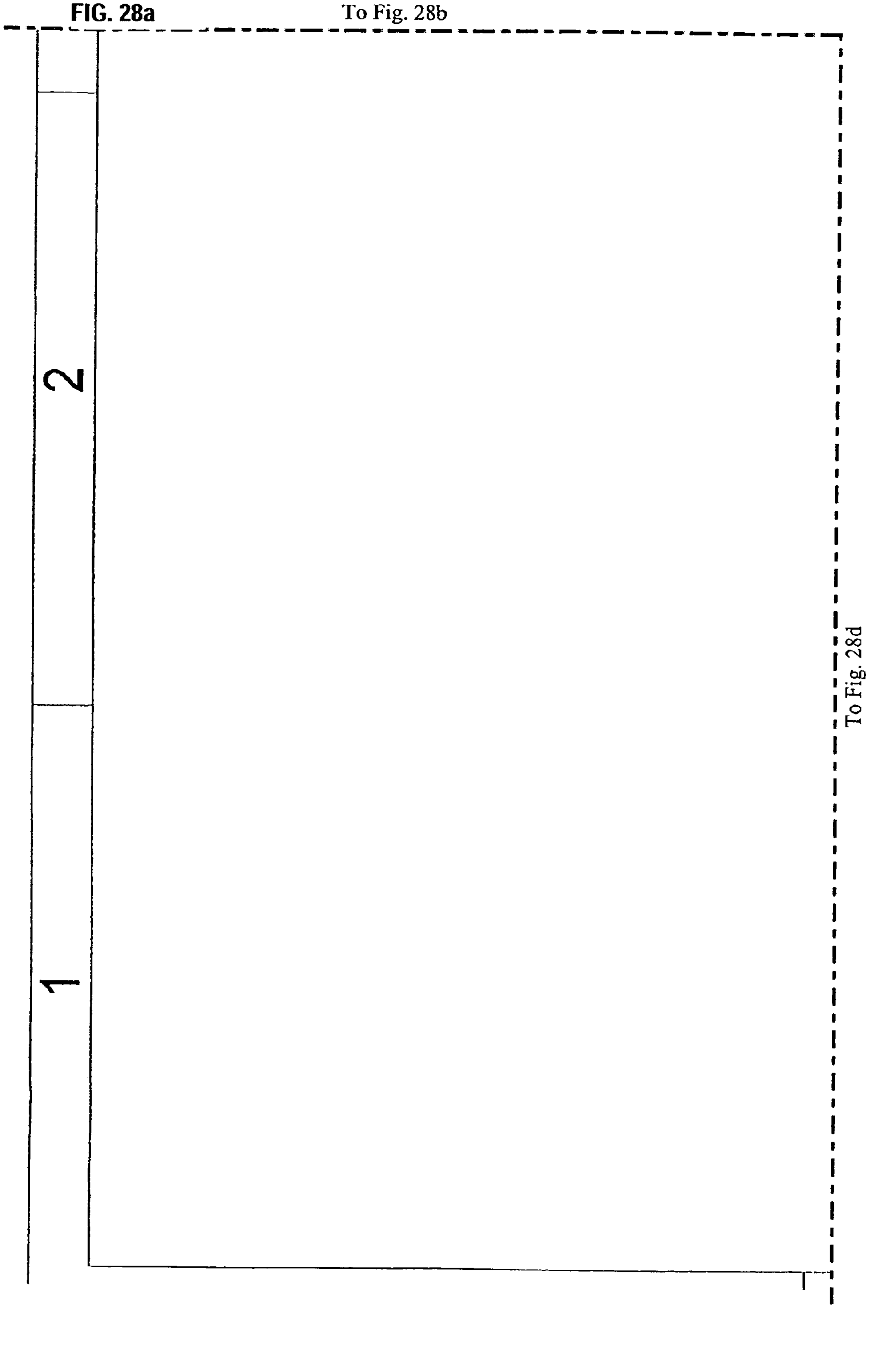
FIGS. 28A–32L depict schematic diagrams of an exemplary backplane board of one preferred embodiment.
Figure 28B:
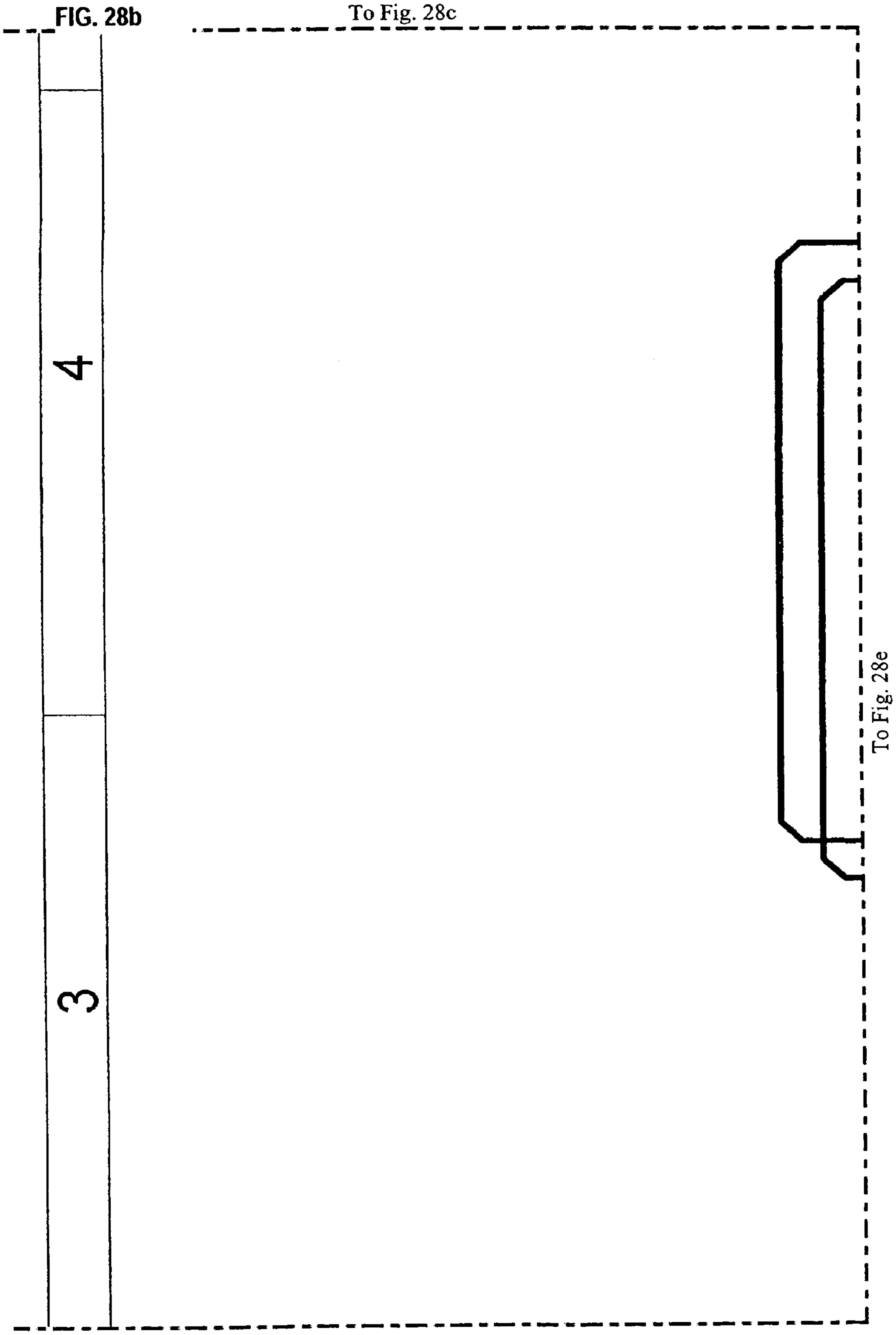
Figure 28C:
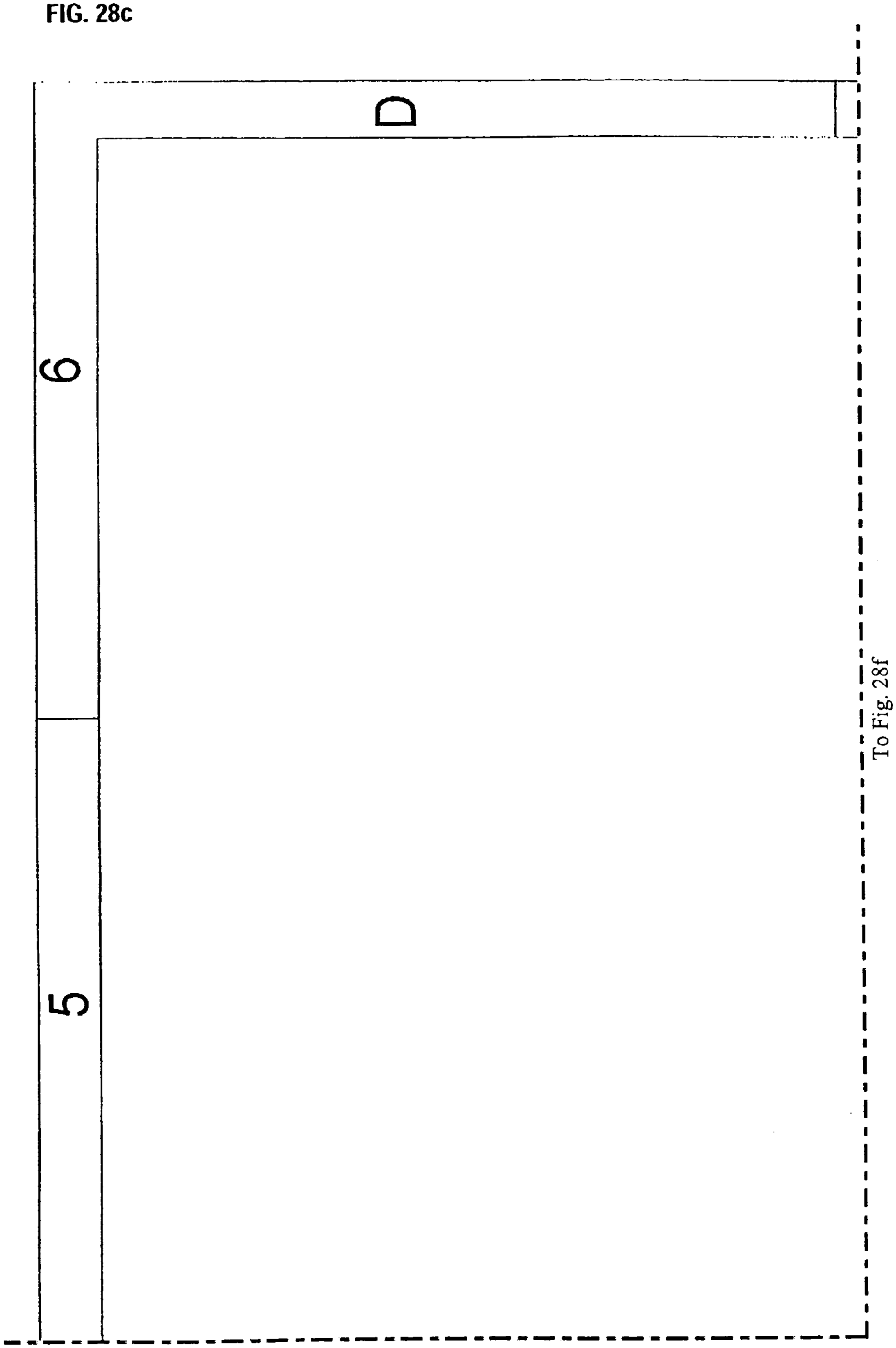
Figure 28D:
Figure 28E:
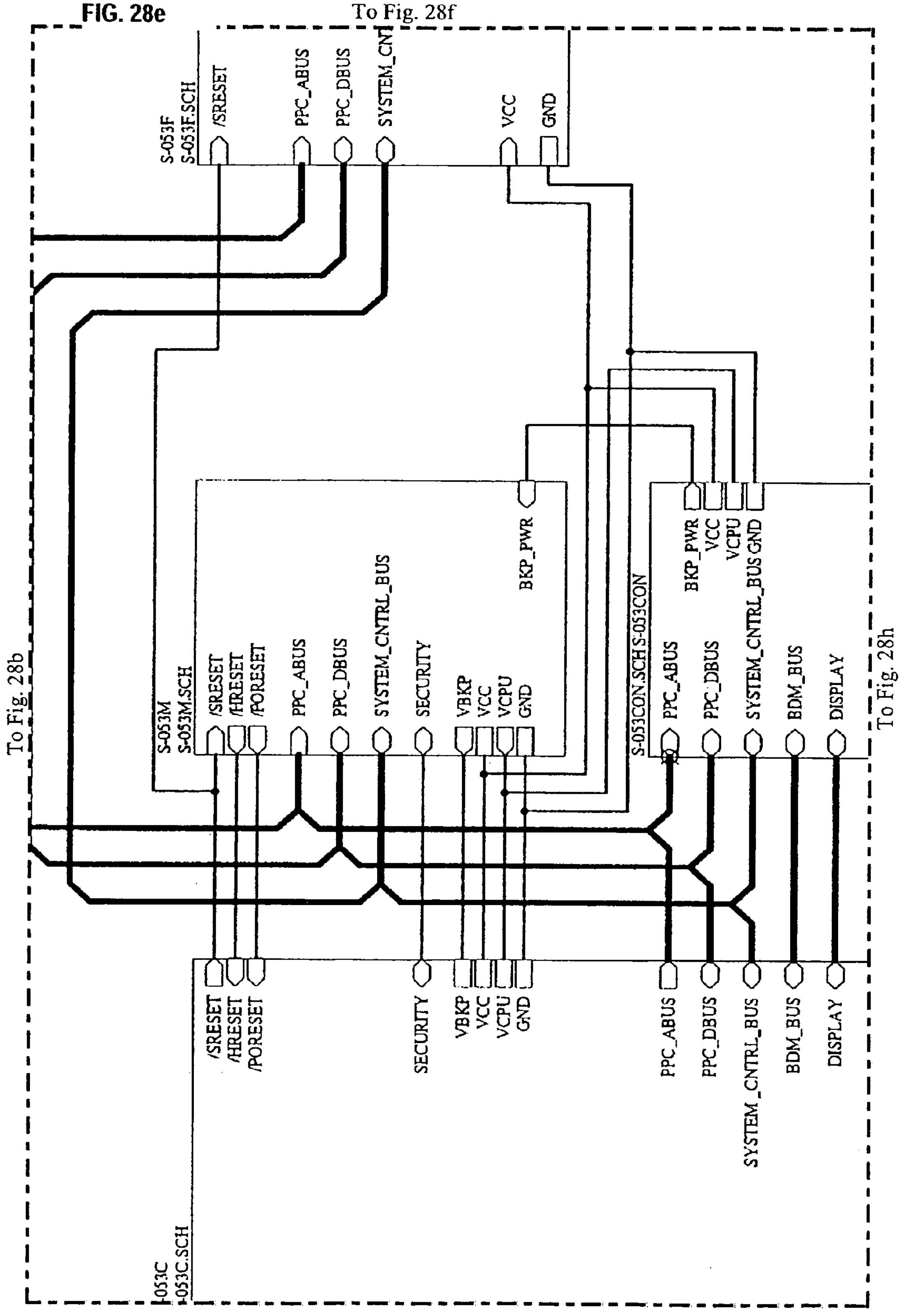
Figure 28F:
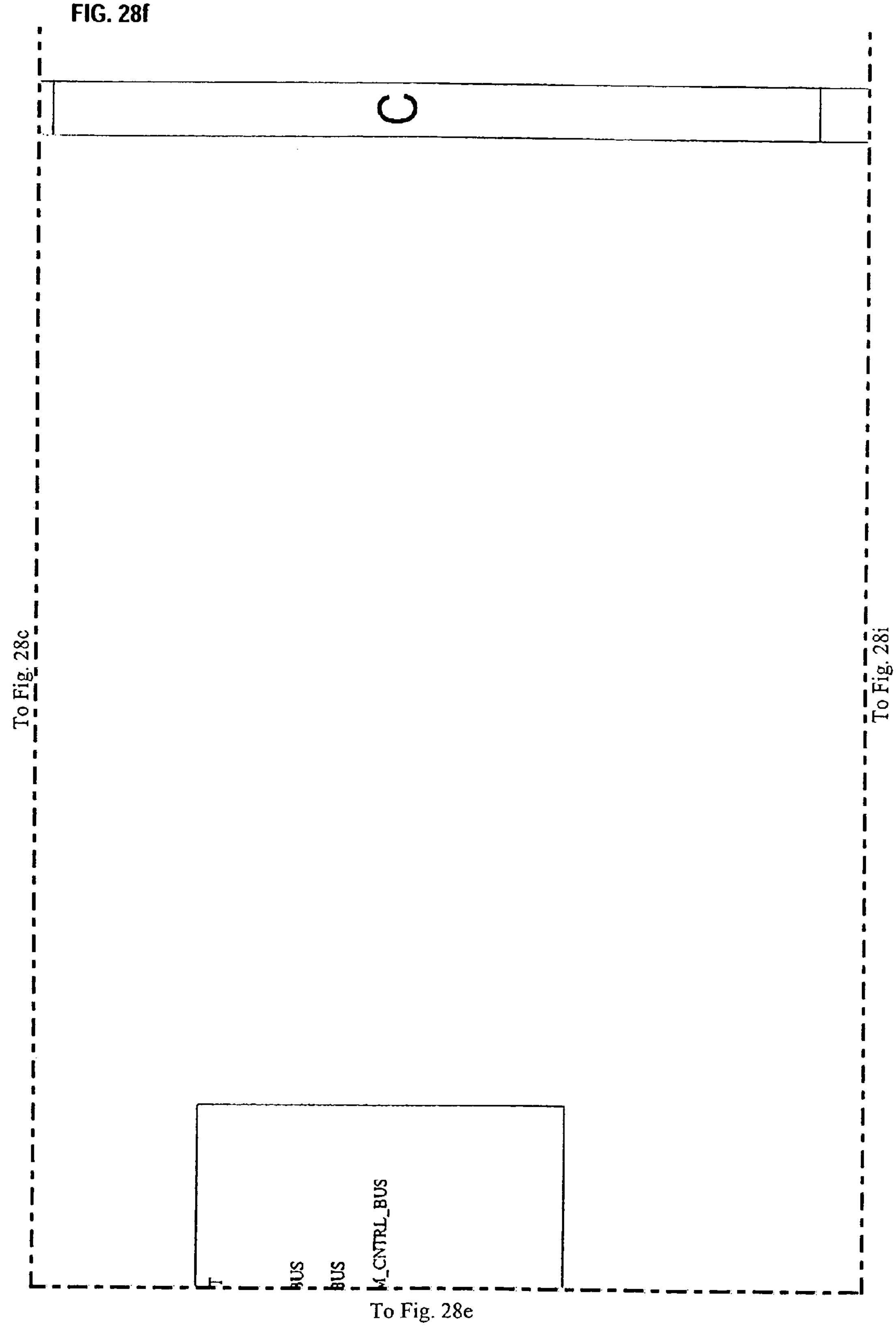
Figure 28G:
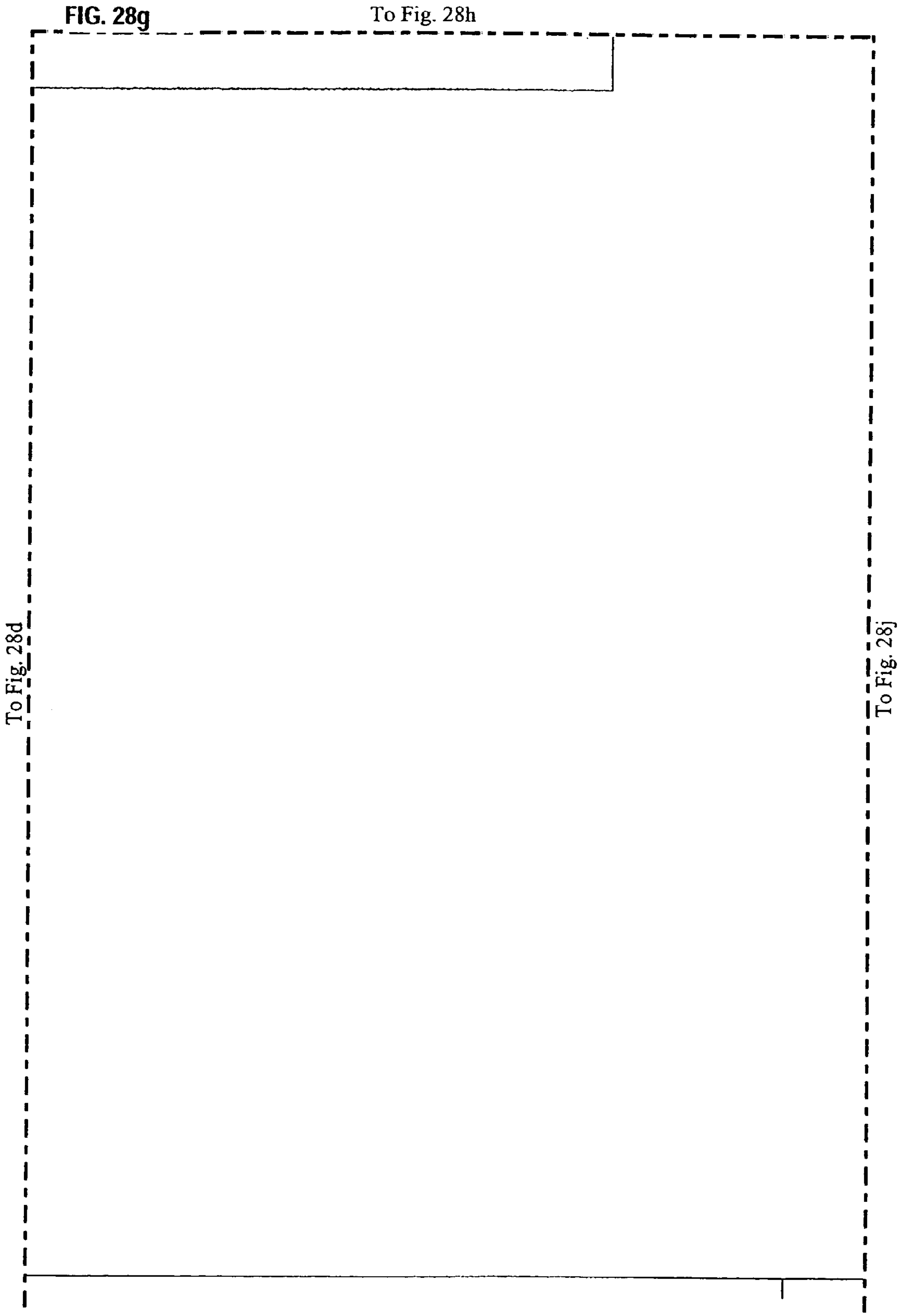
Figure 28H:
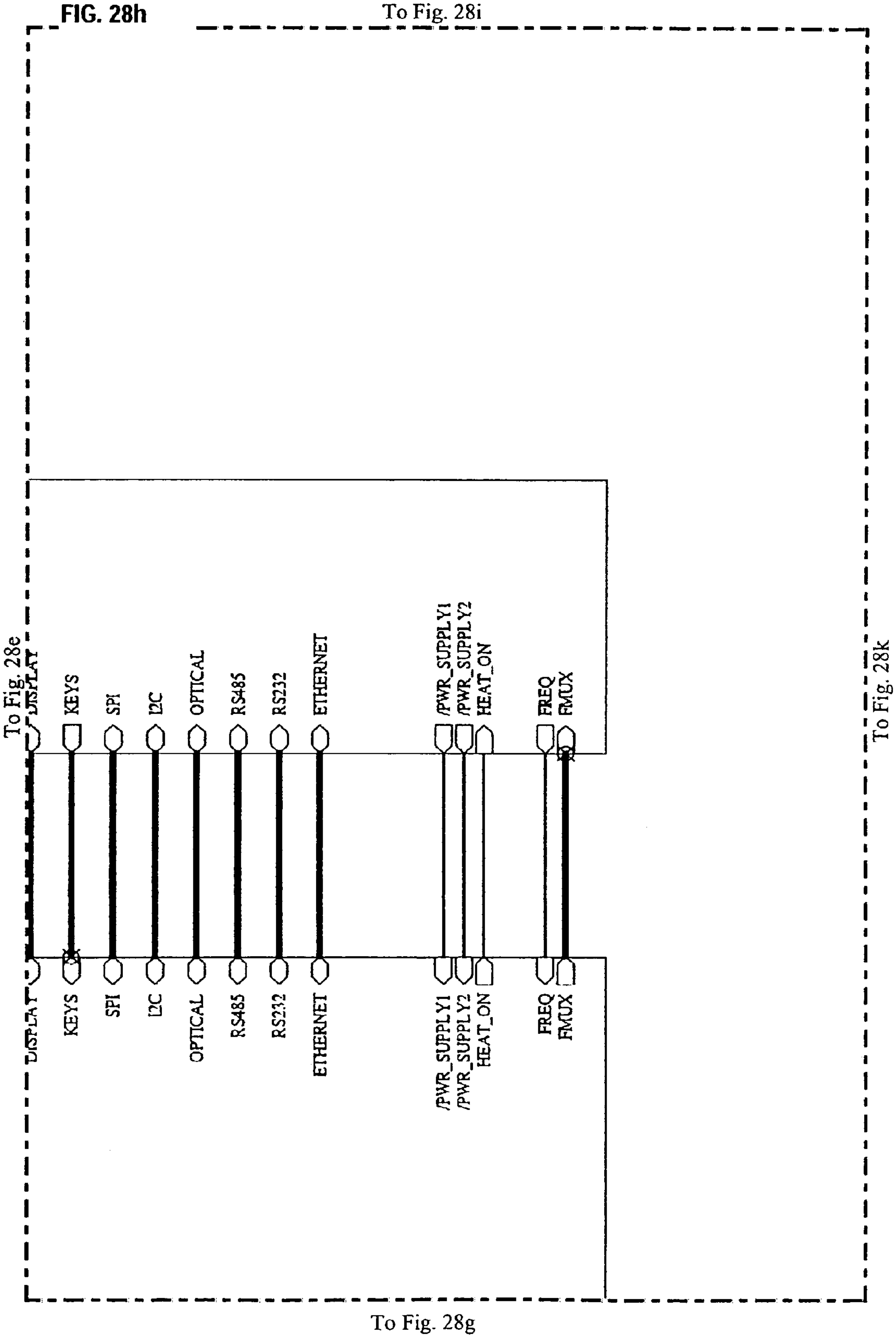
Figure 28I:
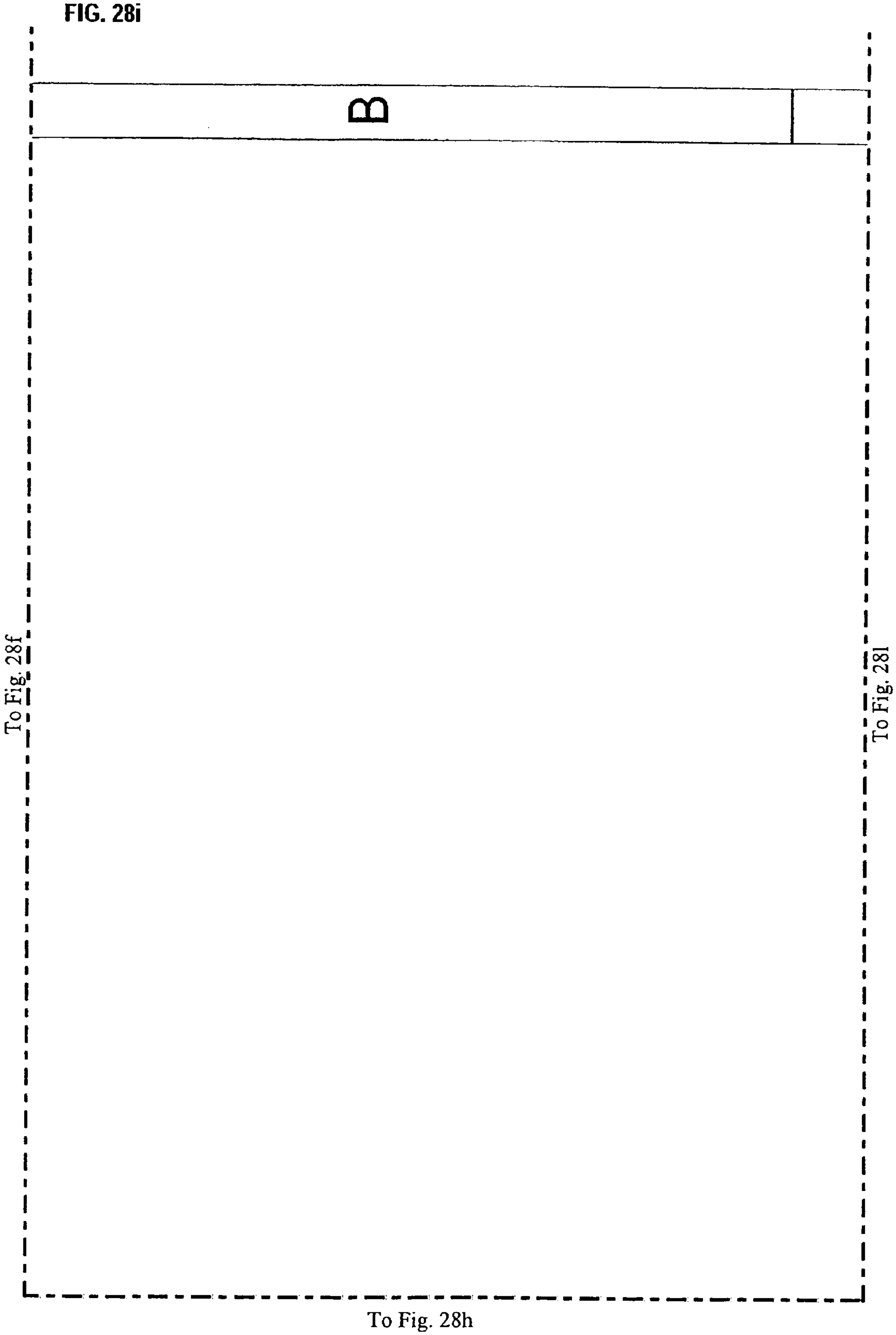
Figure 28J:
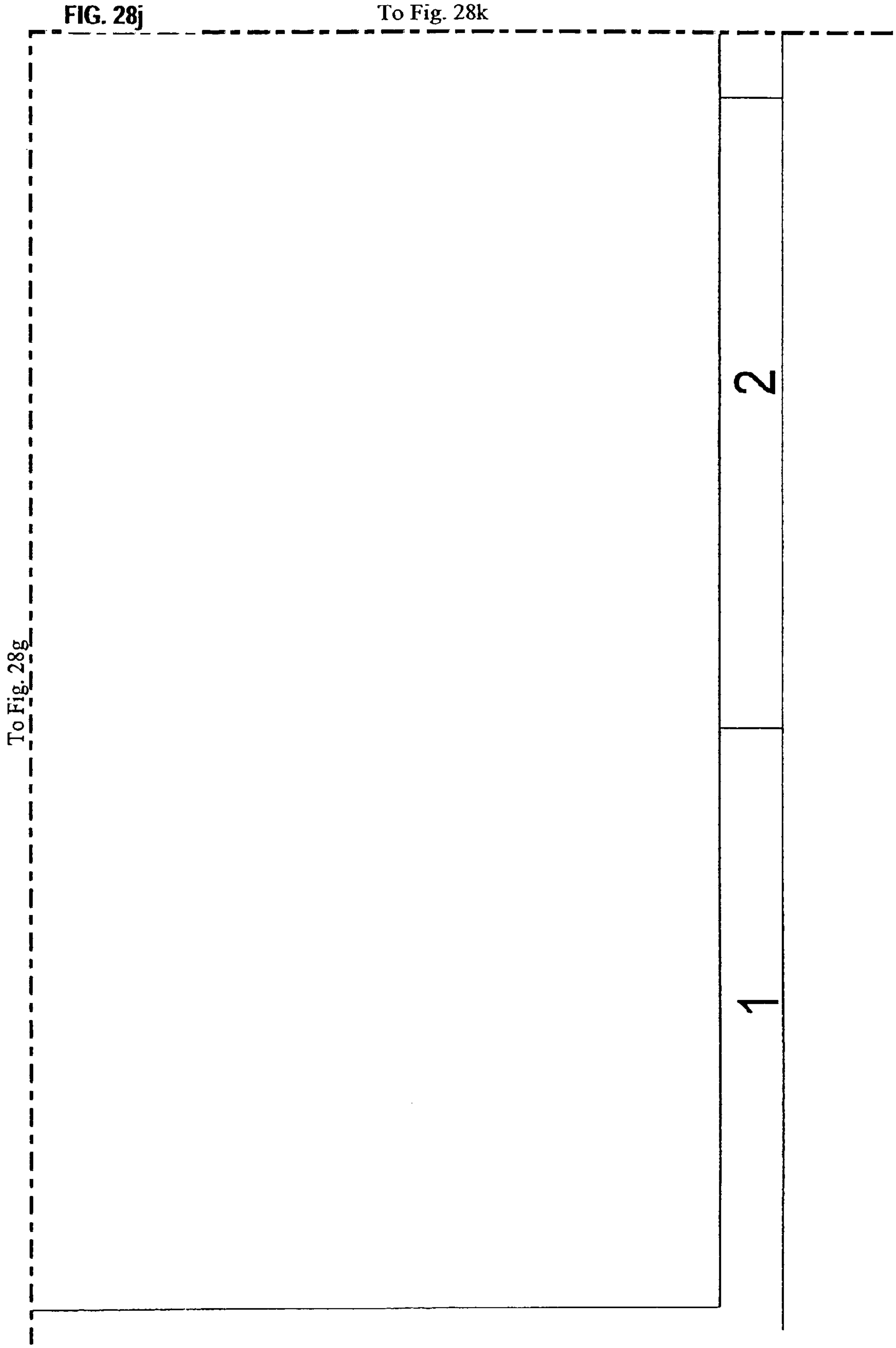
Figure 28K:
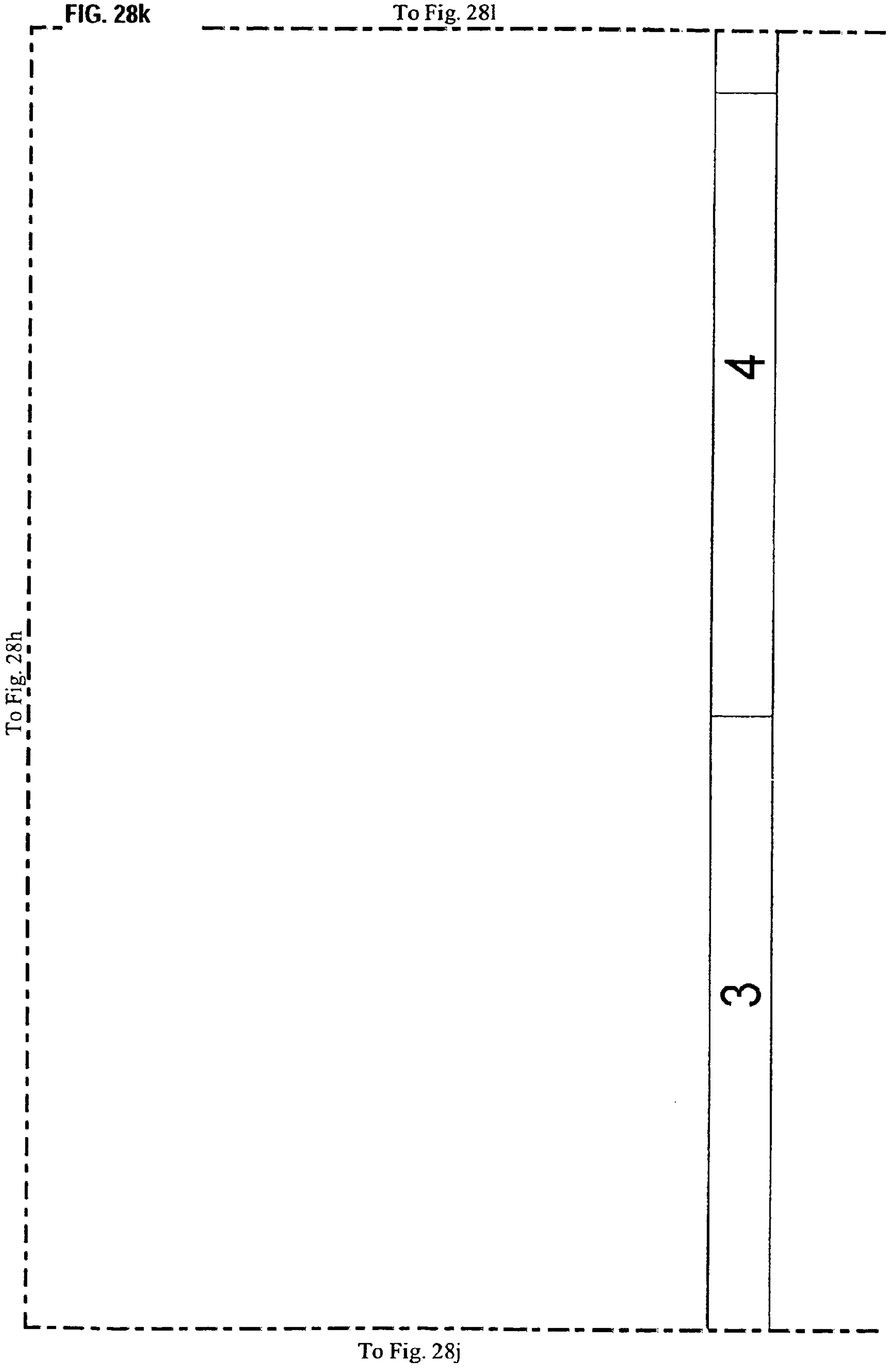
Figure 28L:
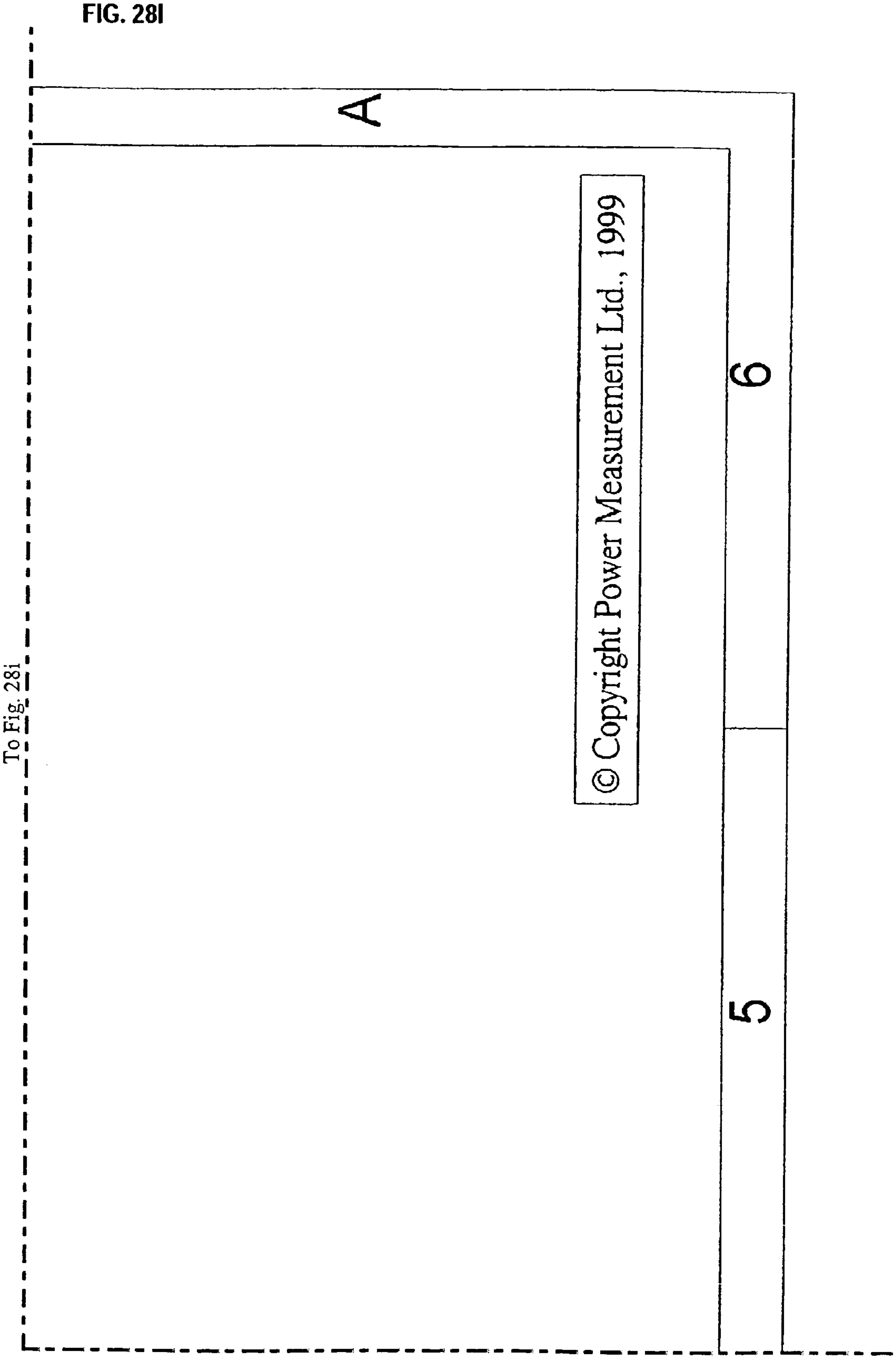
Figure 29A:
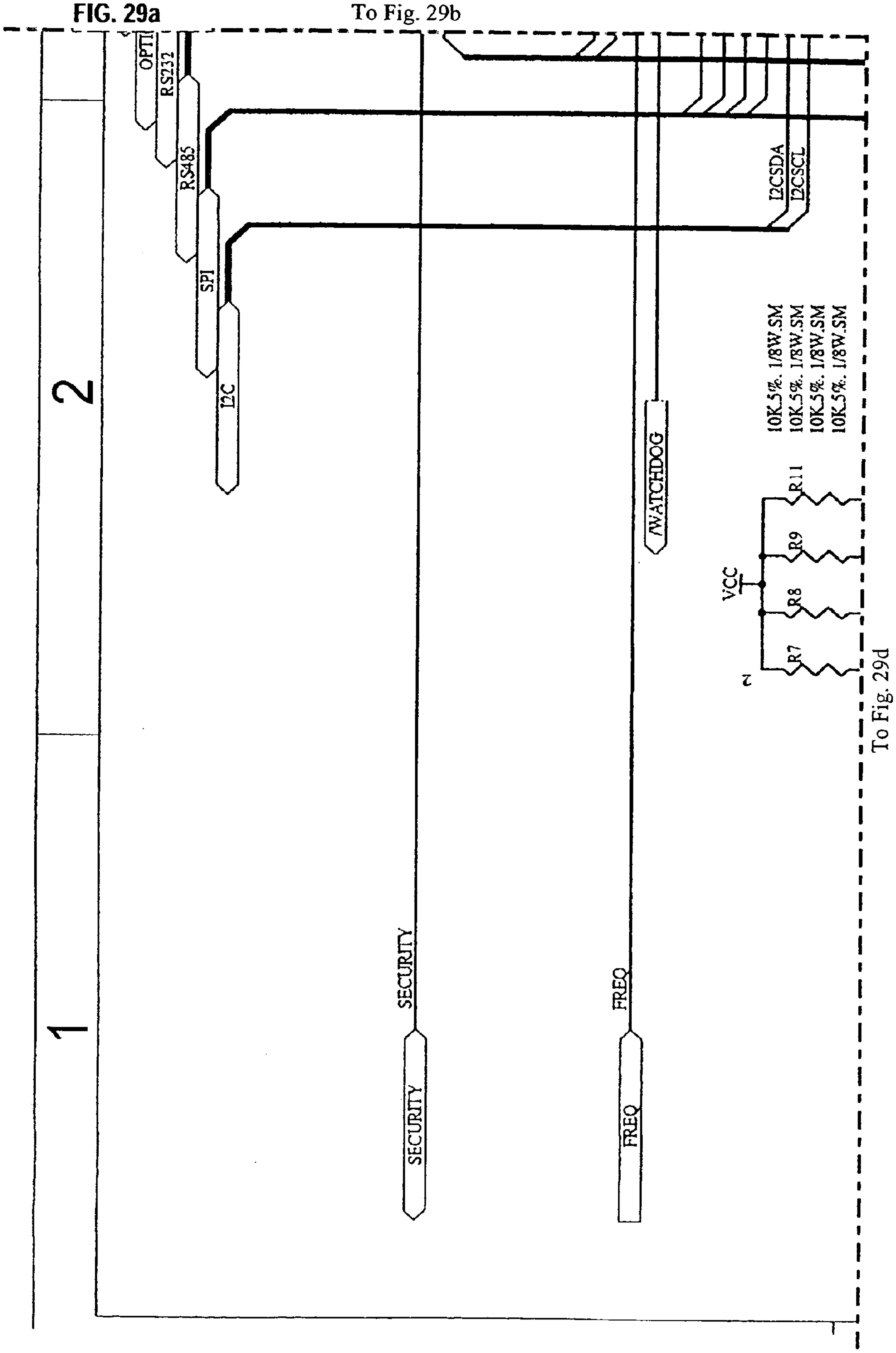
Figure 29B:
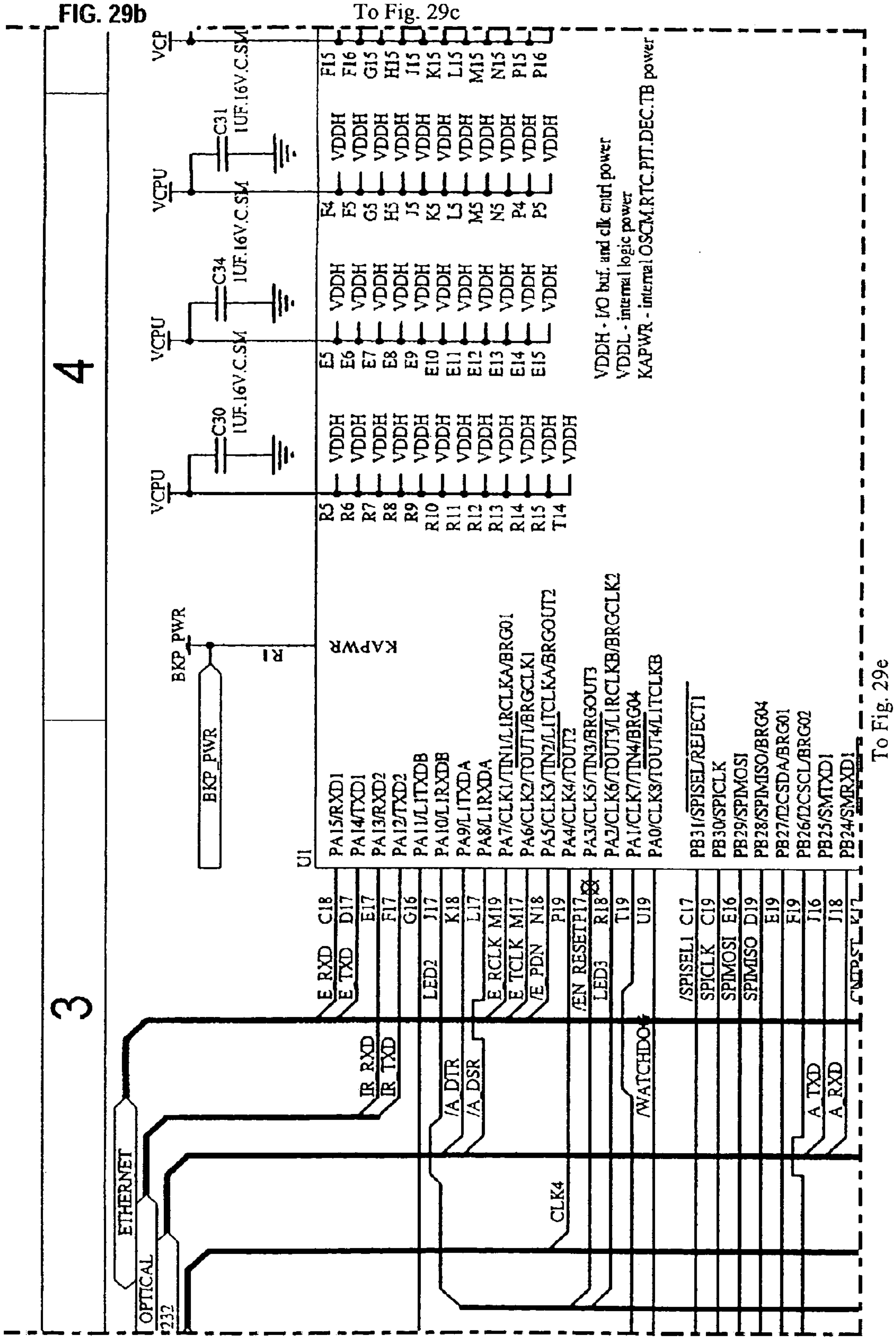
Figure 29C:
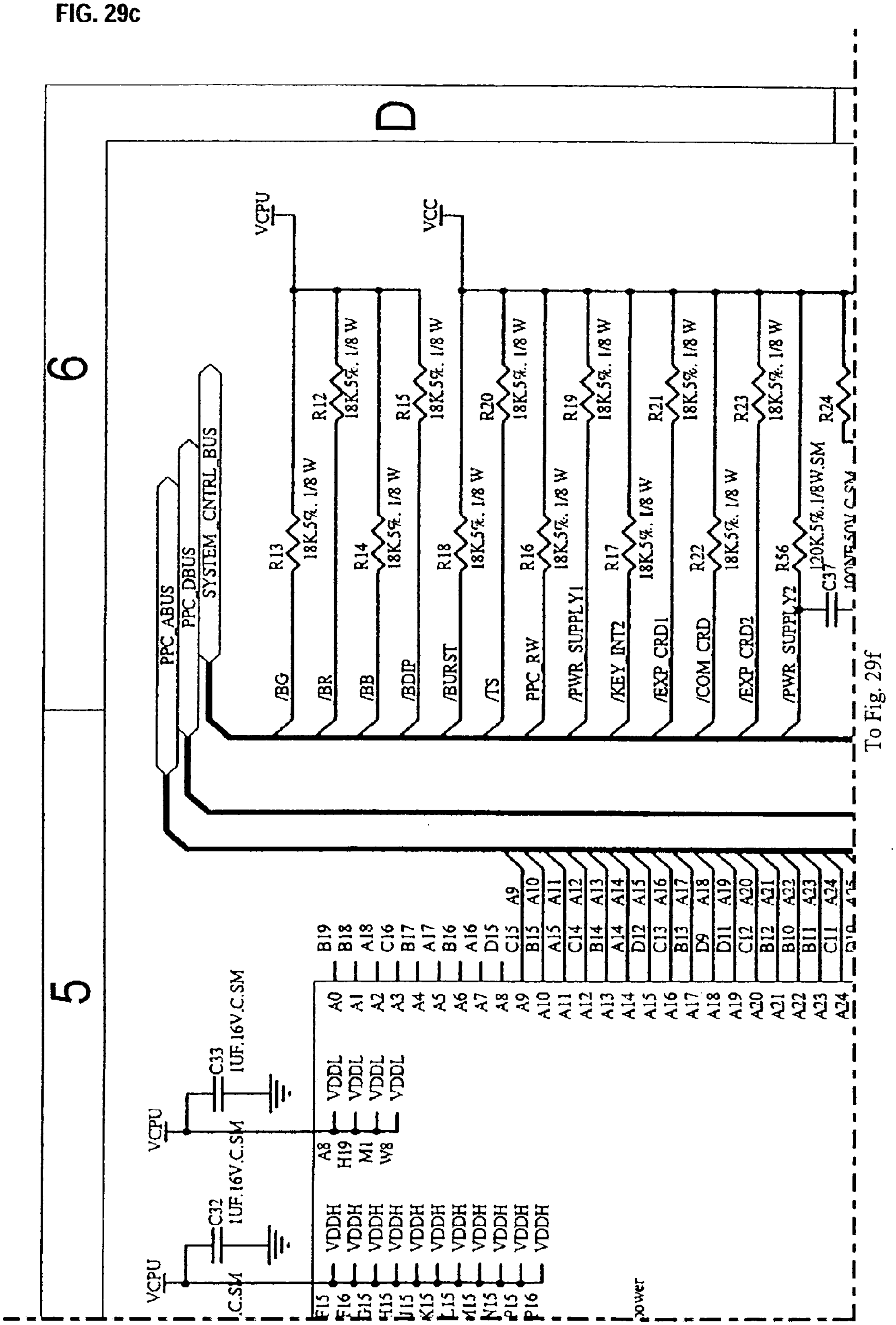
Figure 29D:
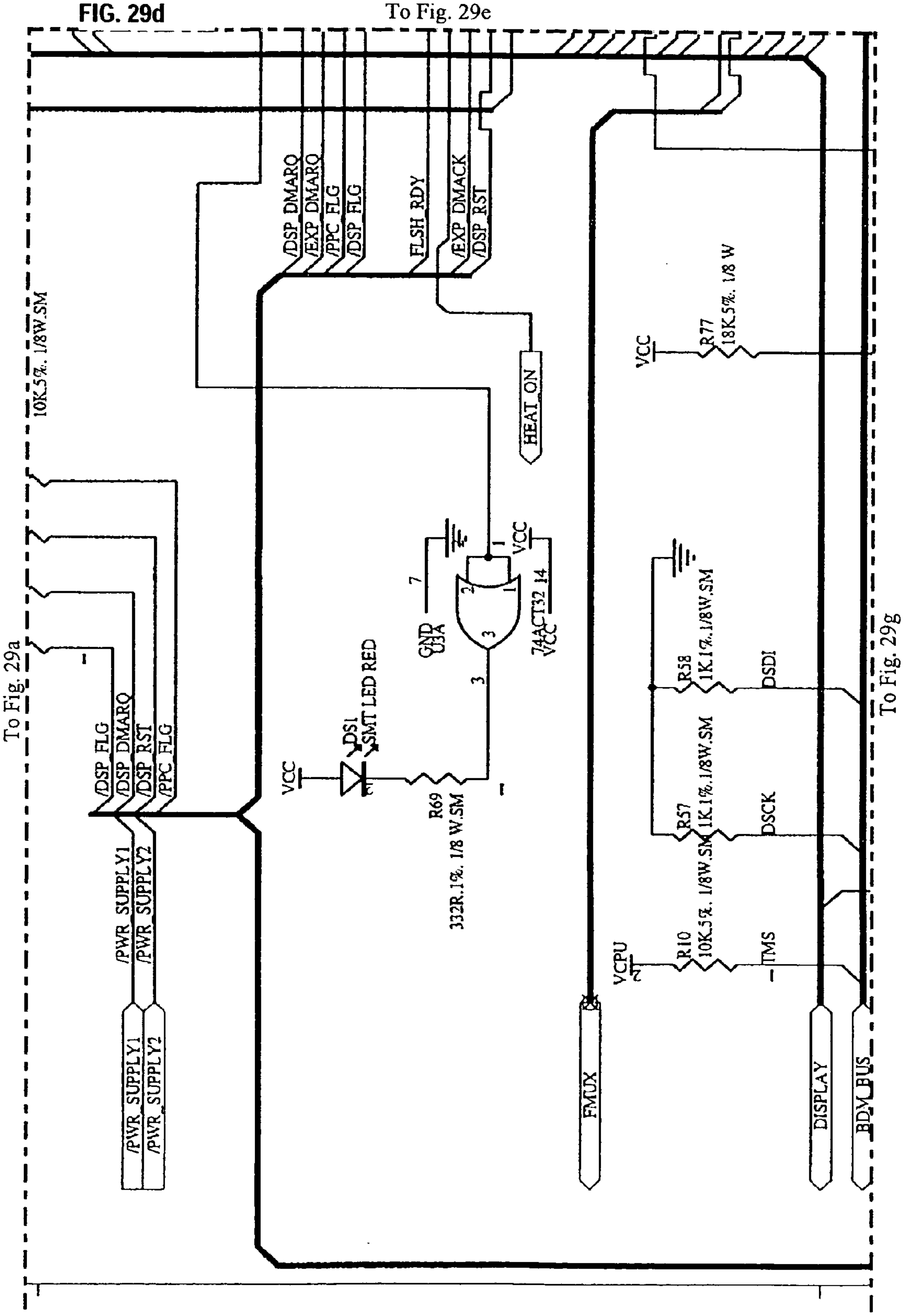
Figure 29E:
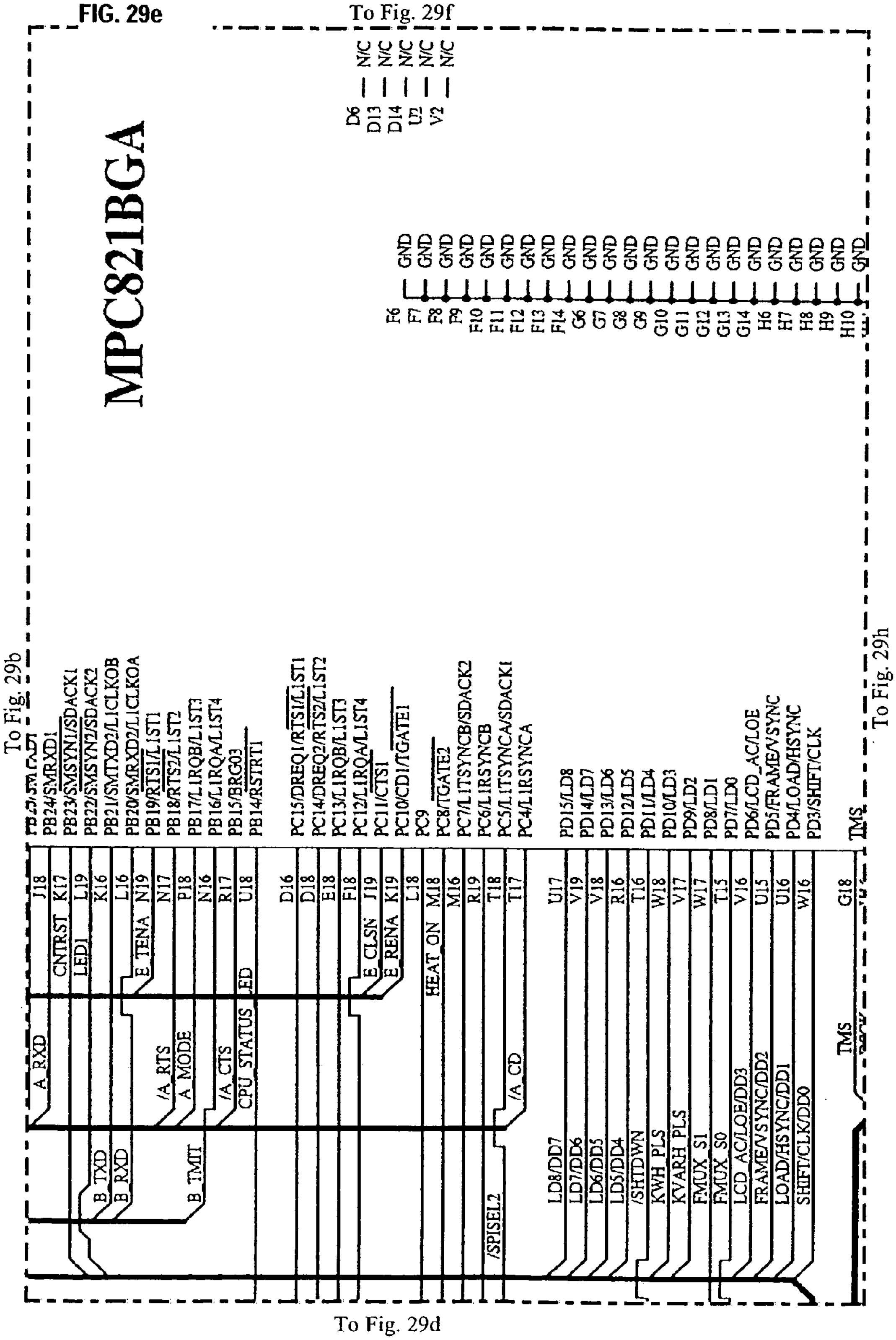
Figure 29F:
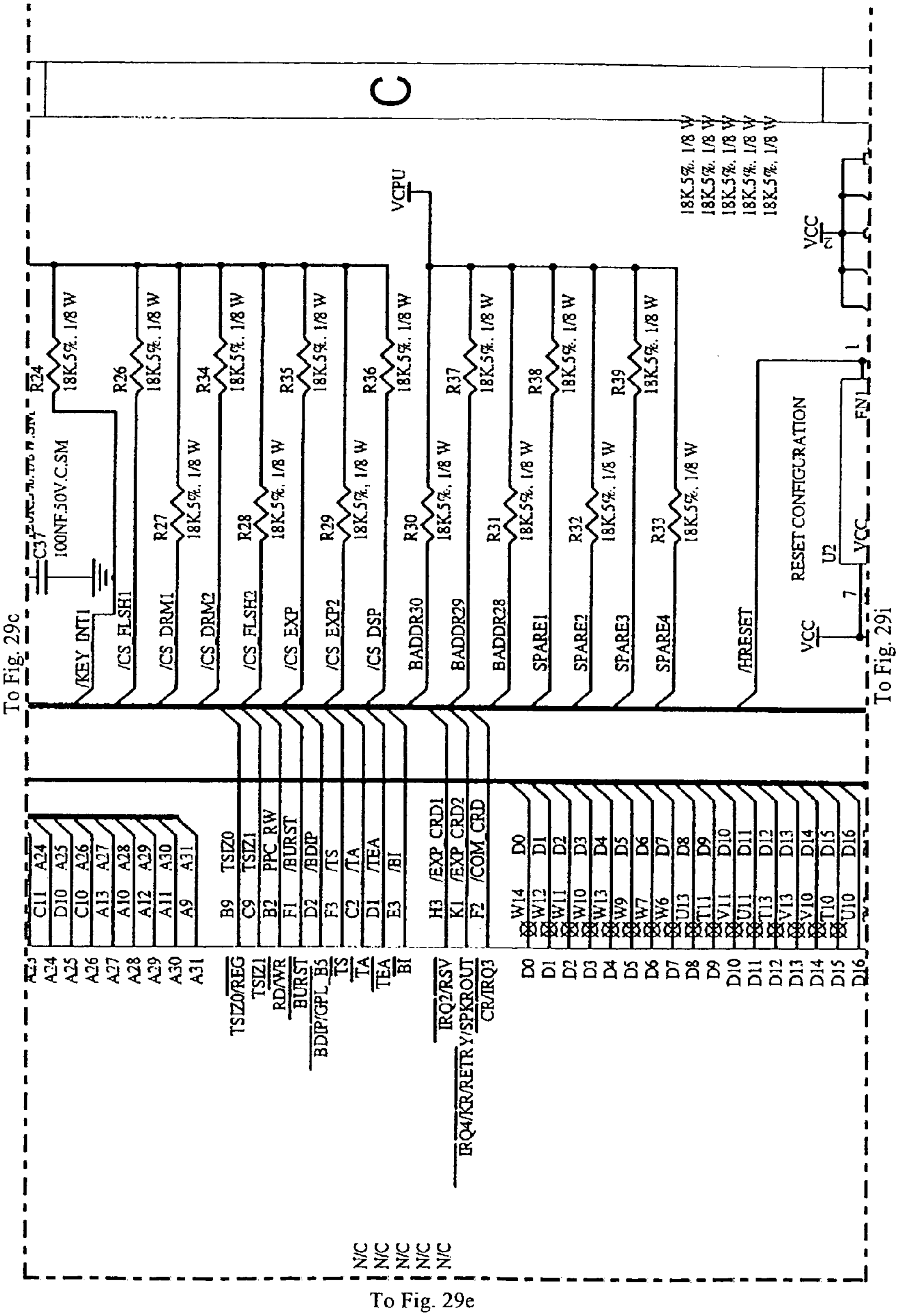
Figure 29G:
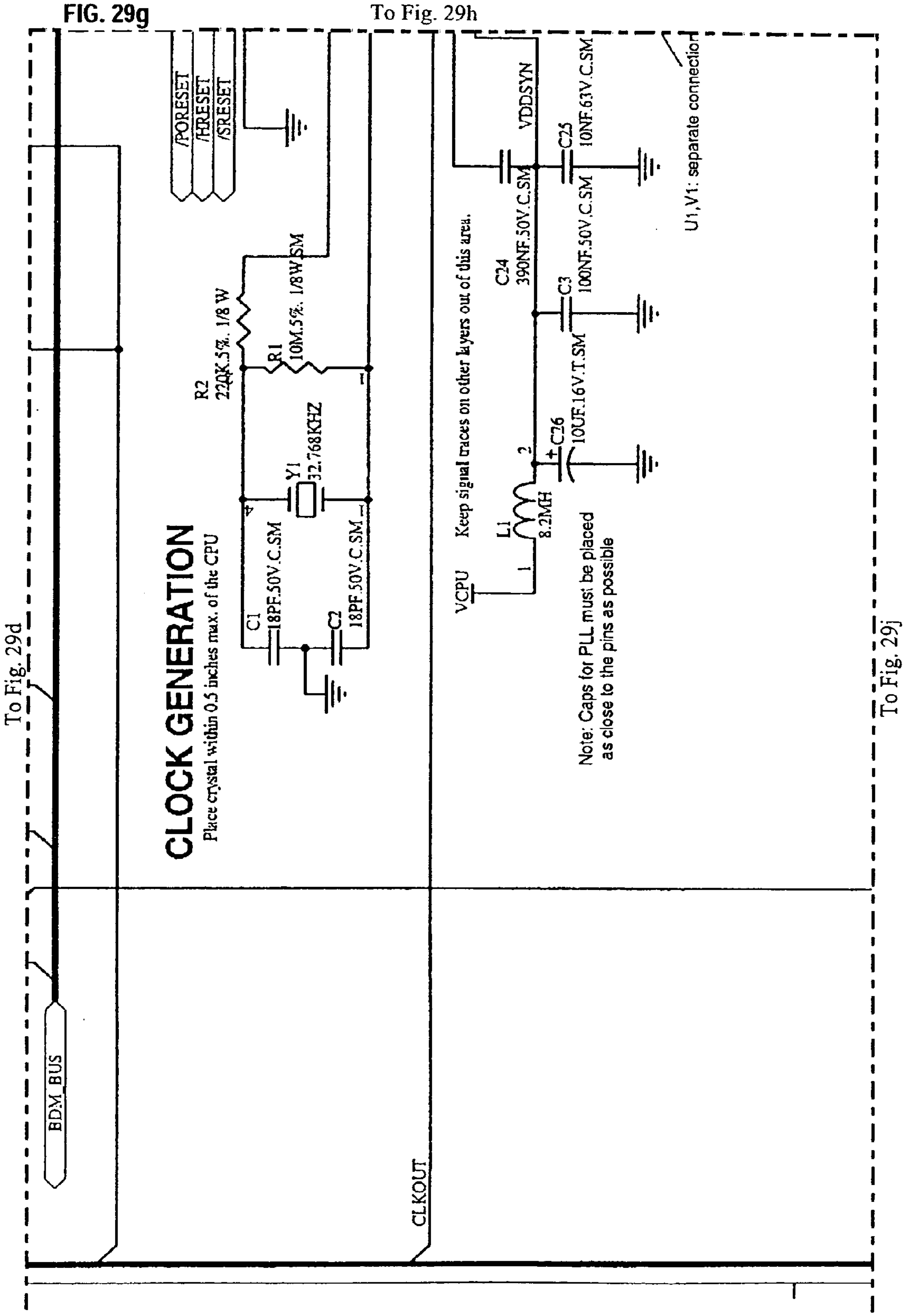
Figure 29H:
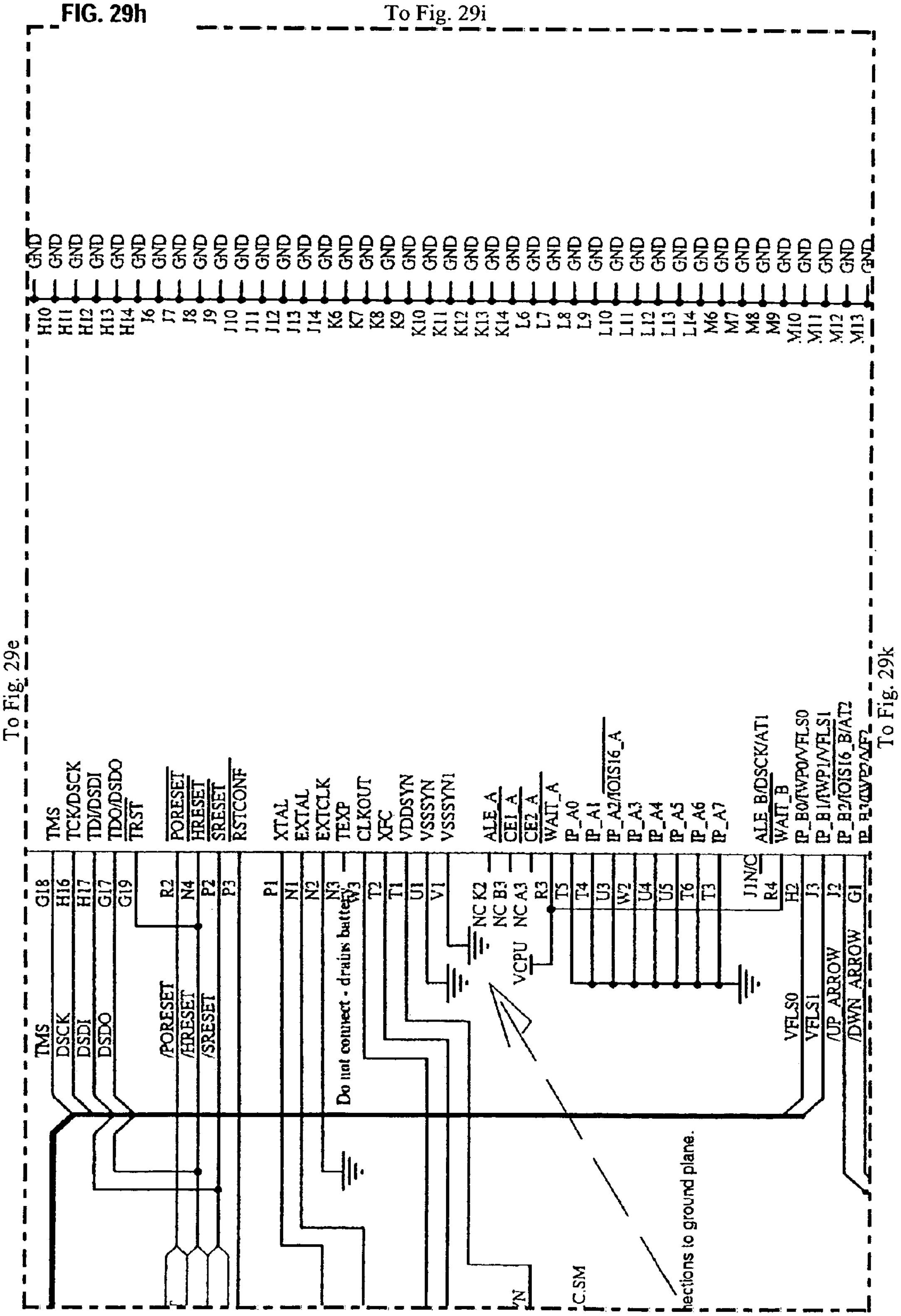
Figure 29I:
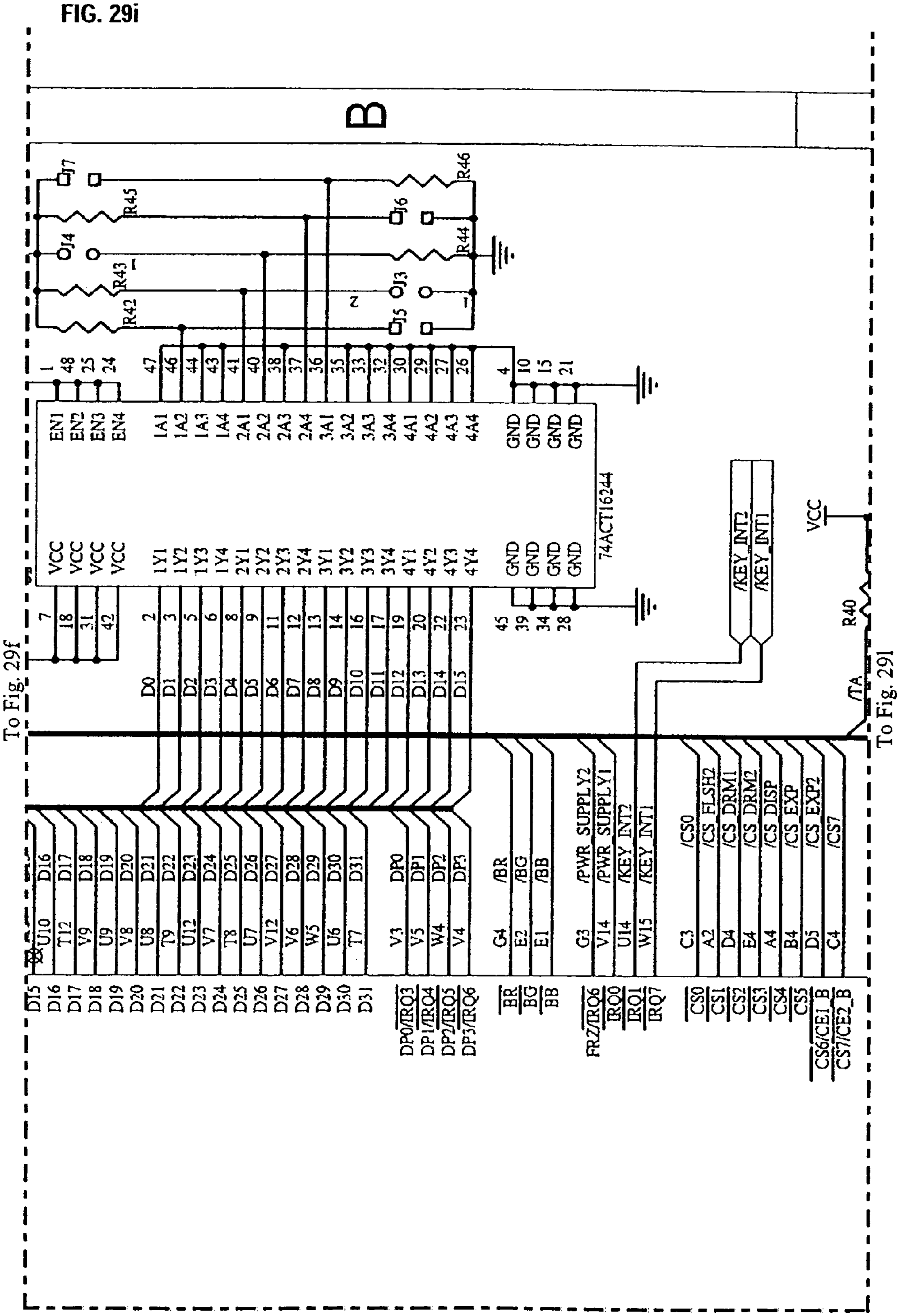
Figure 29J:
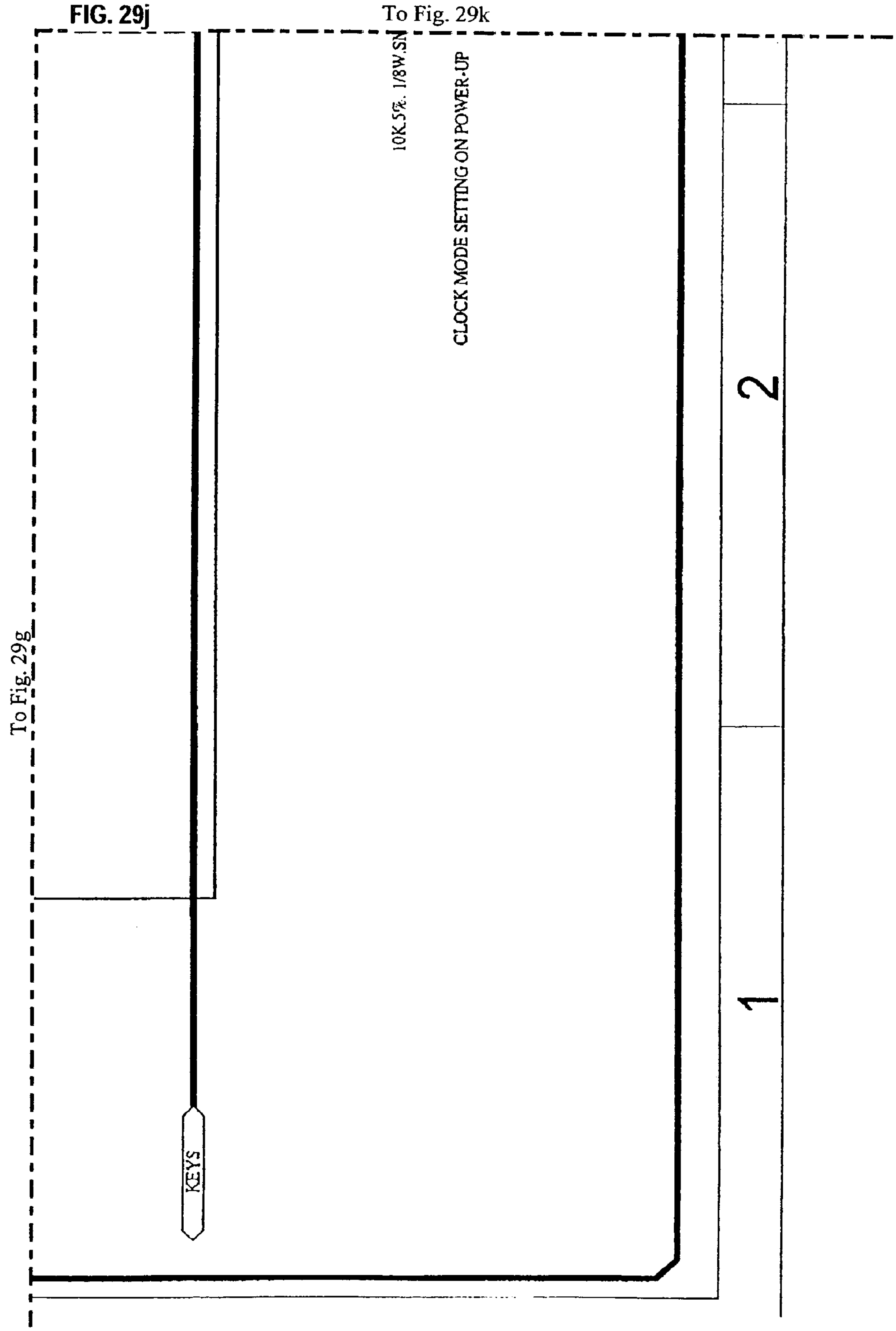
Figure 29K:
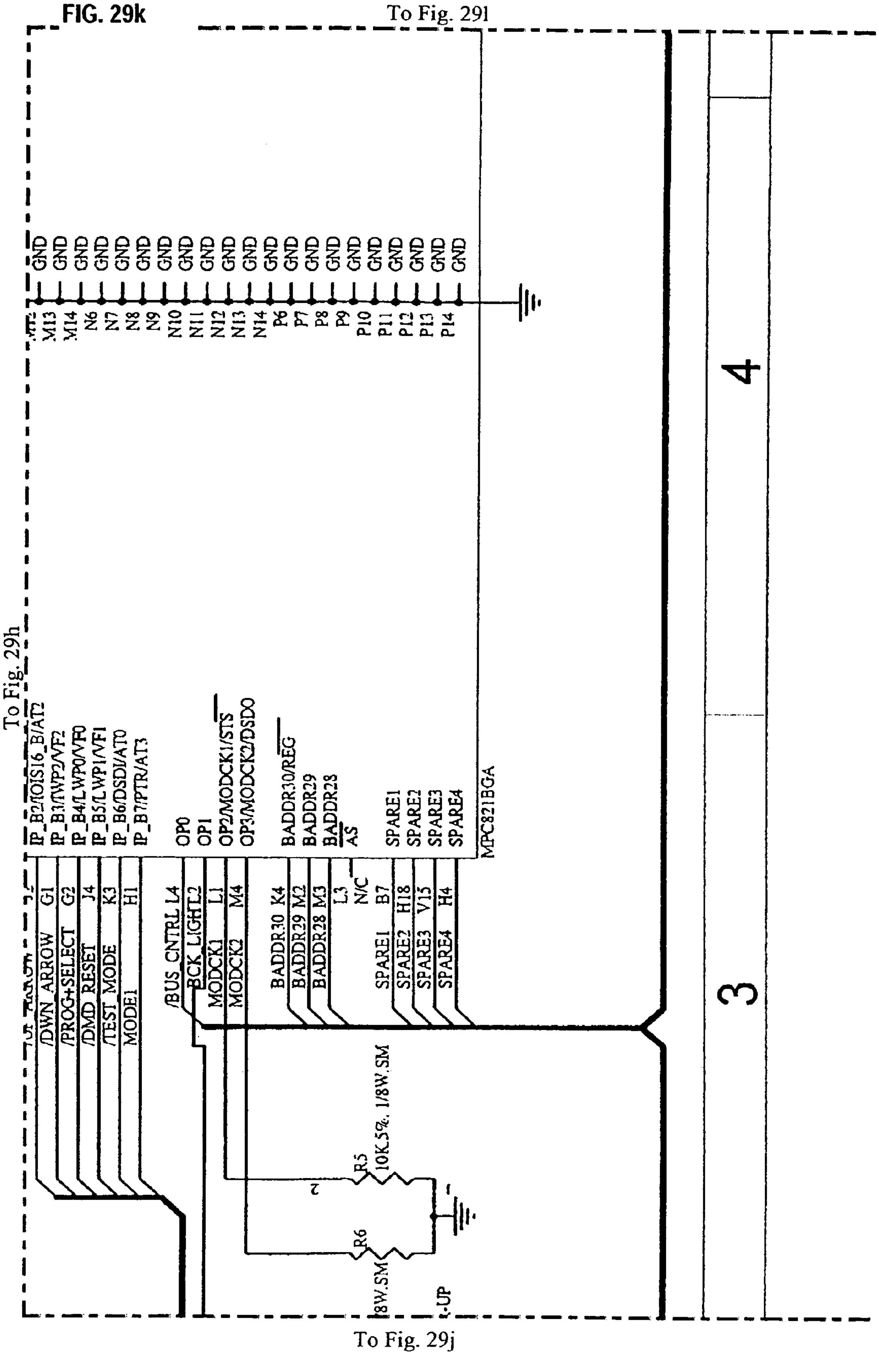
Figure 29I:
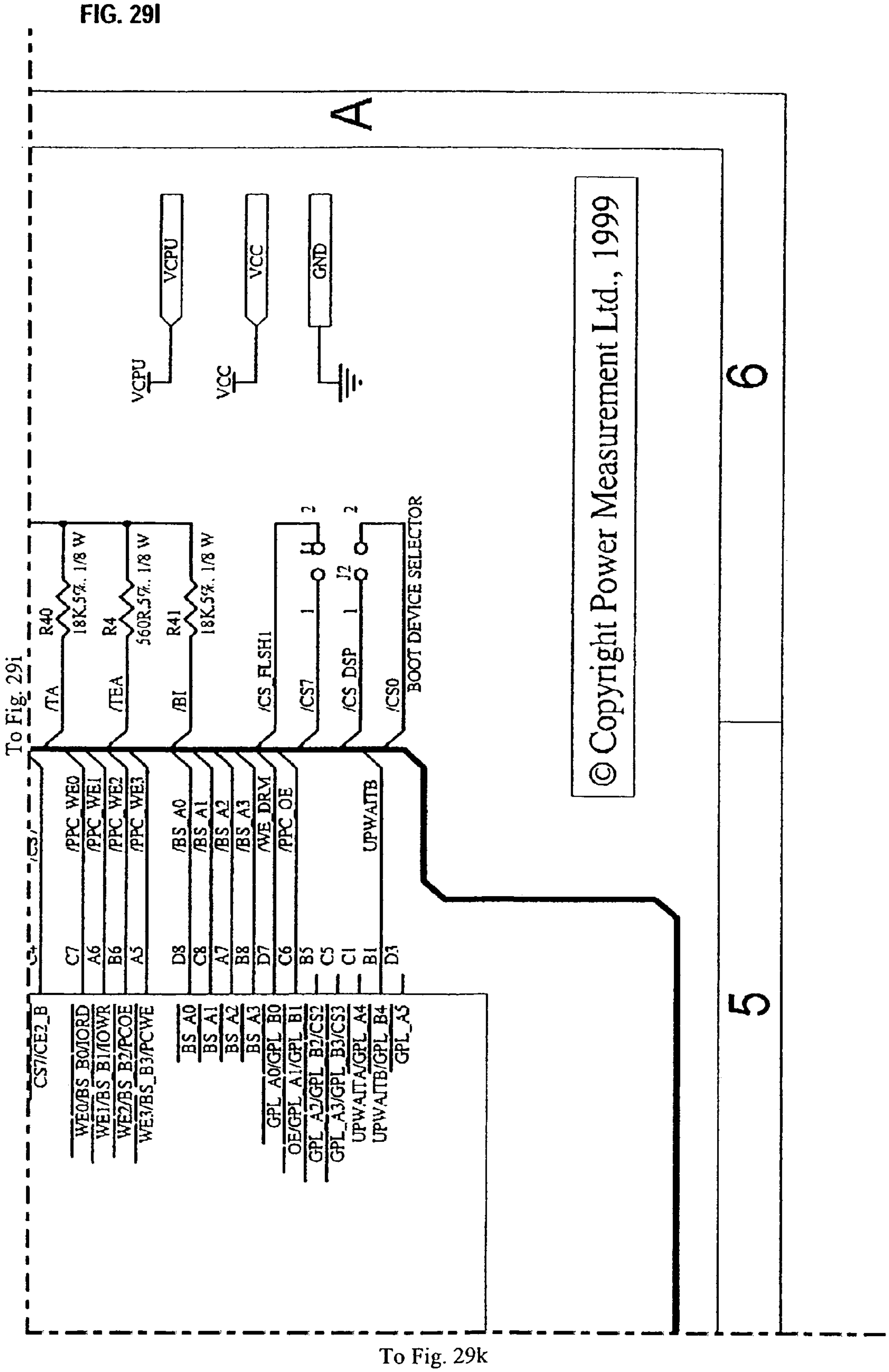
Figure 30A:
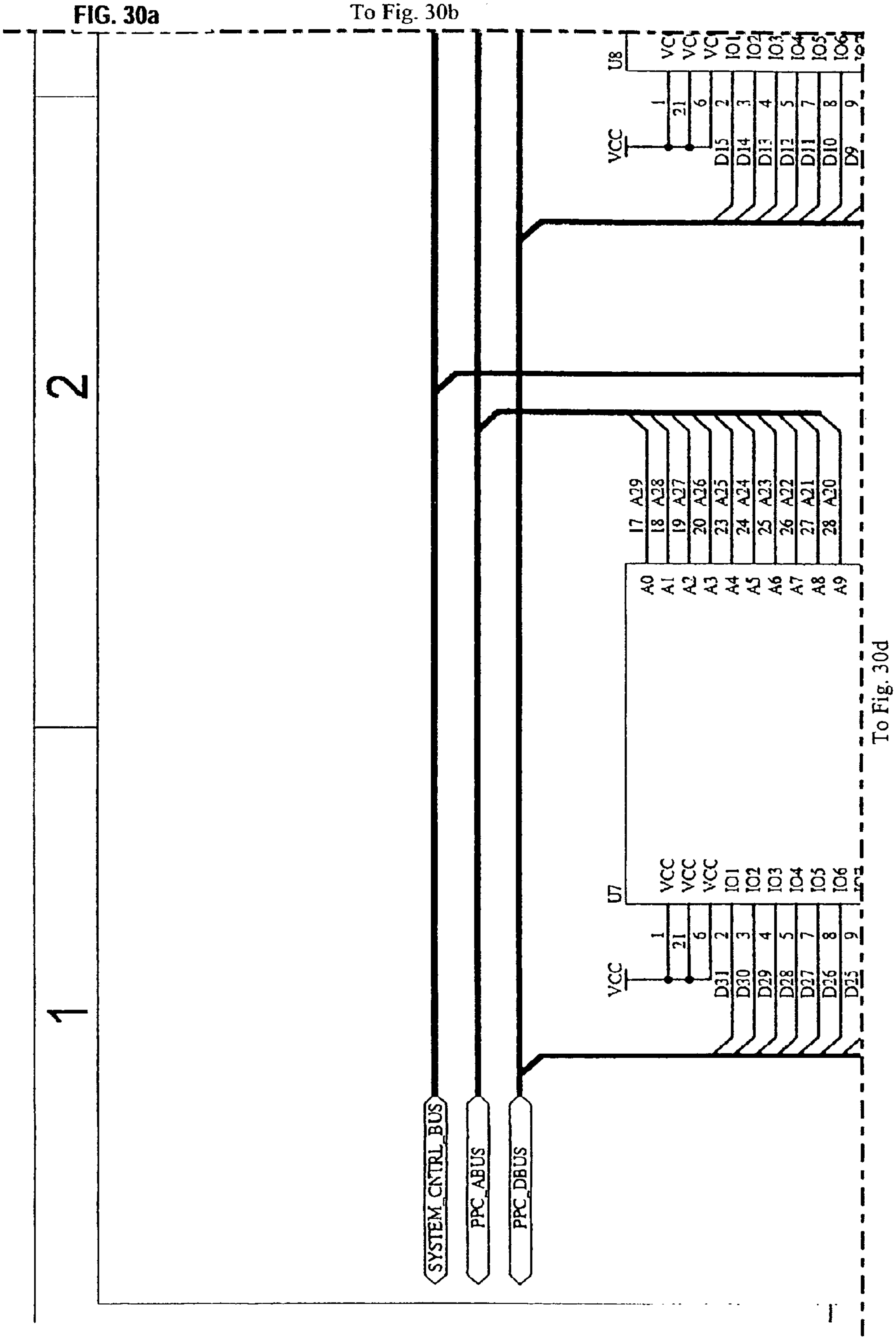
Figure 30B:
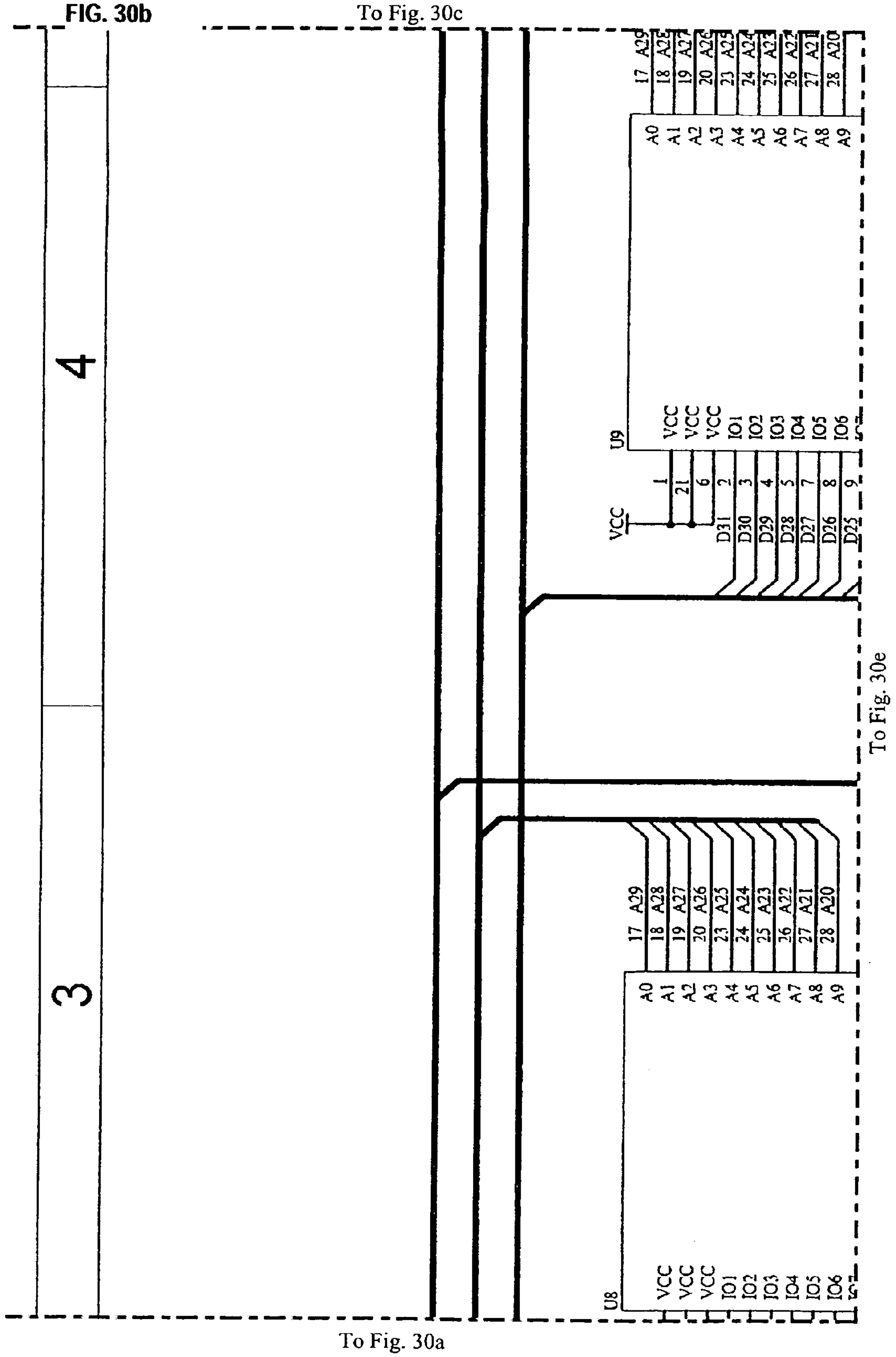
Figure 30C:
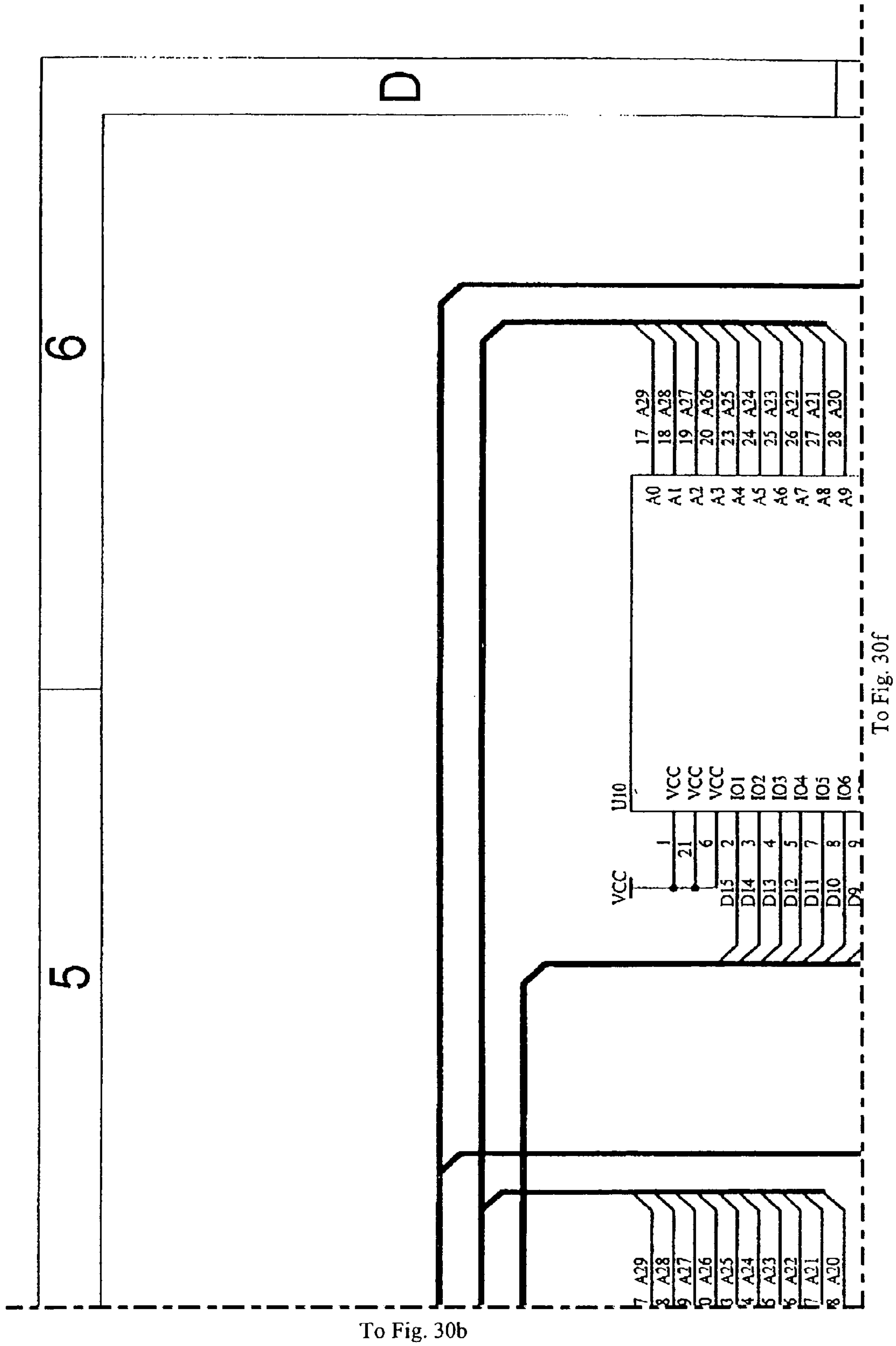
Figure 30D:
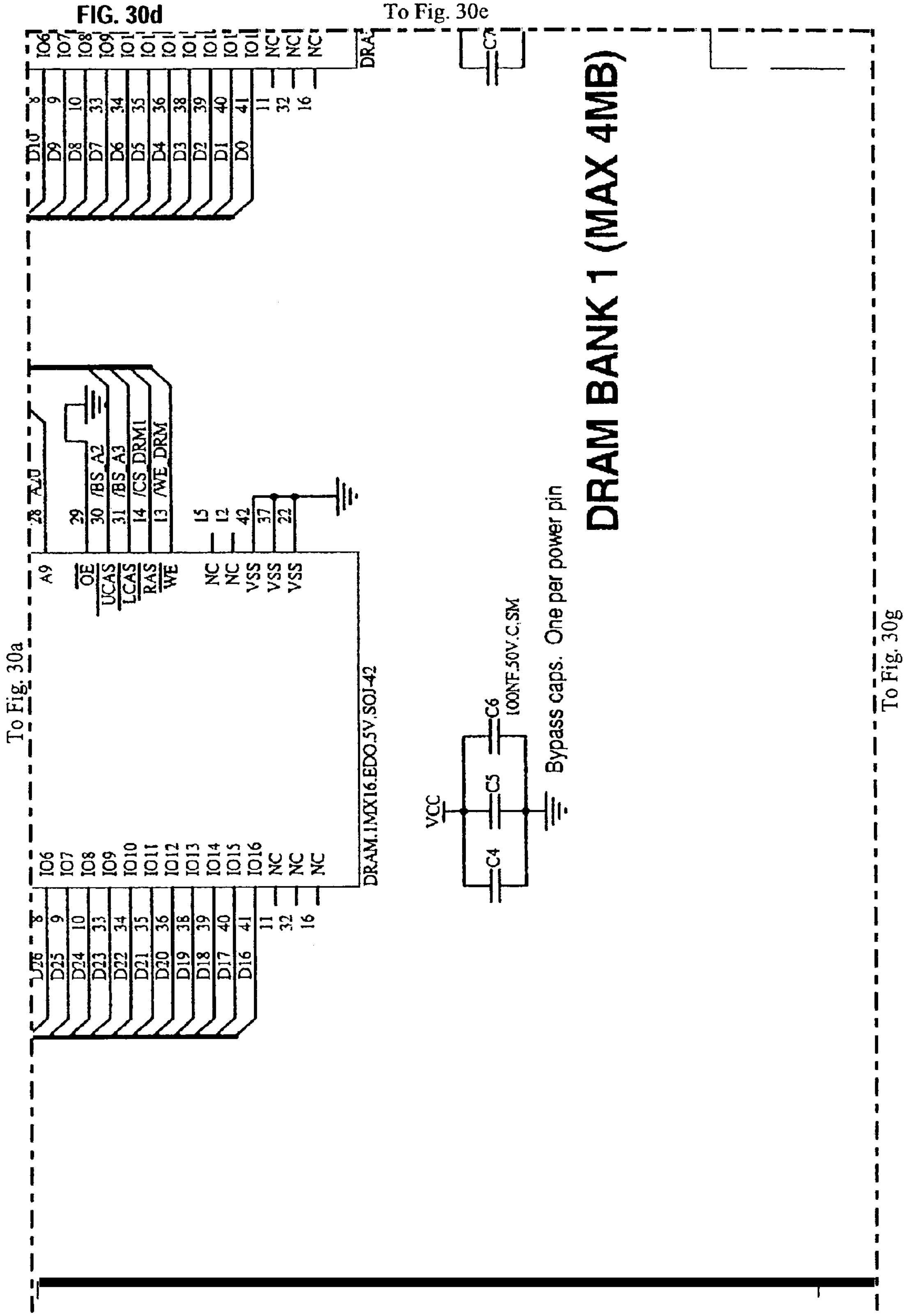
Figure 30E:
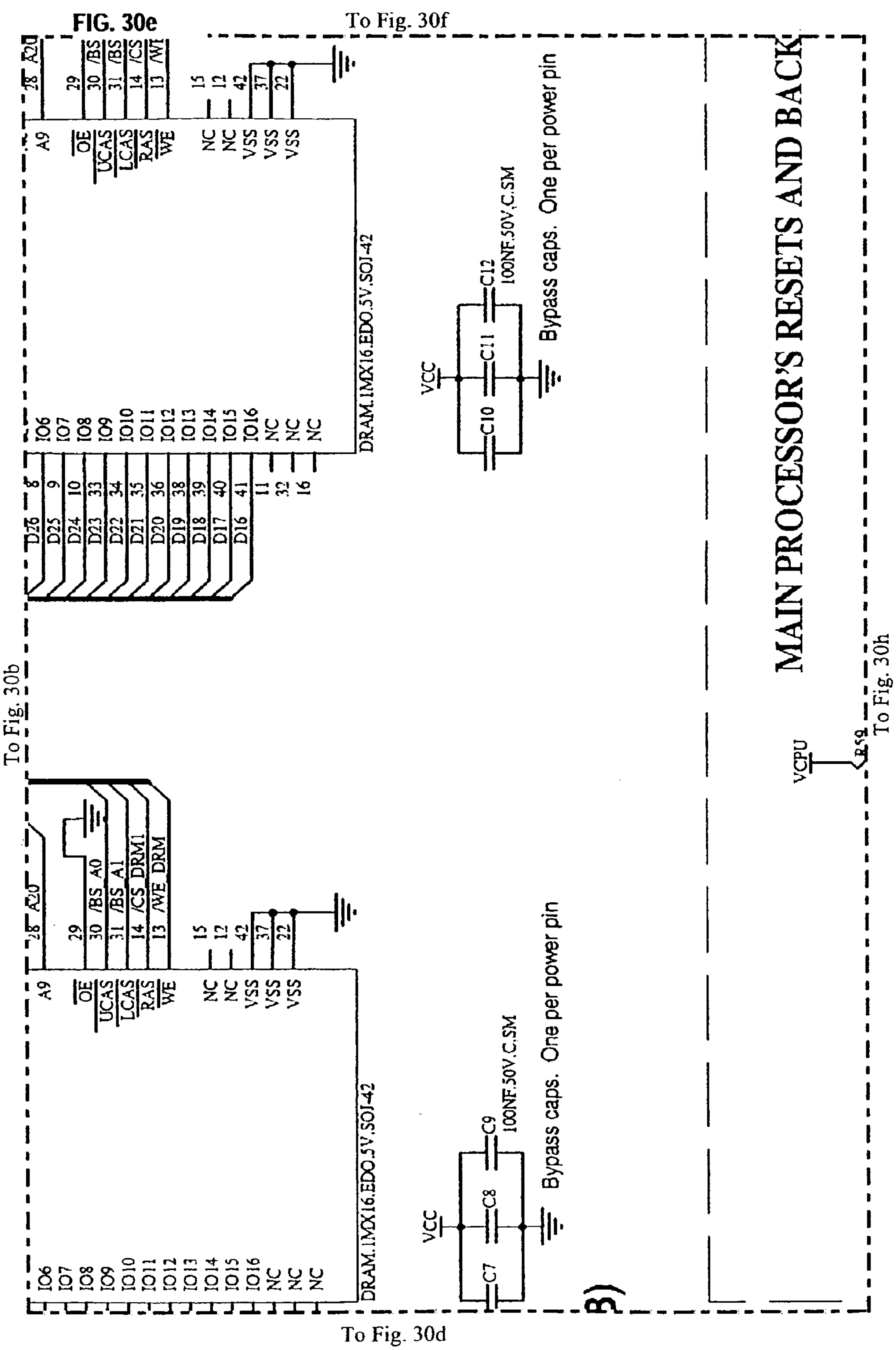
Figure 30F:
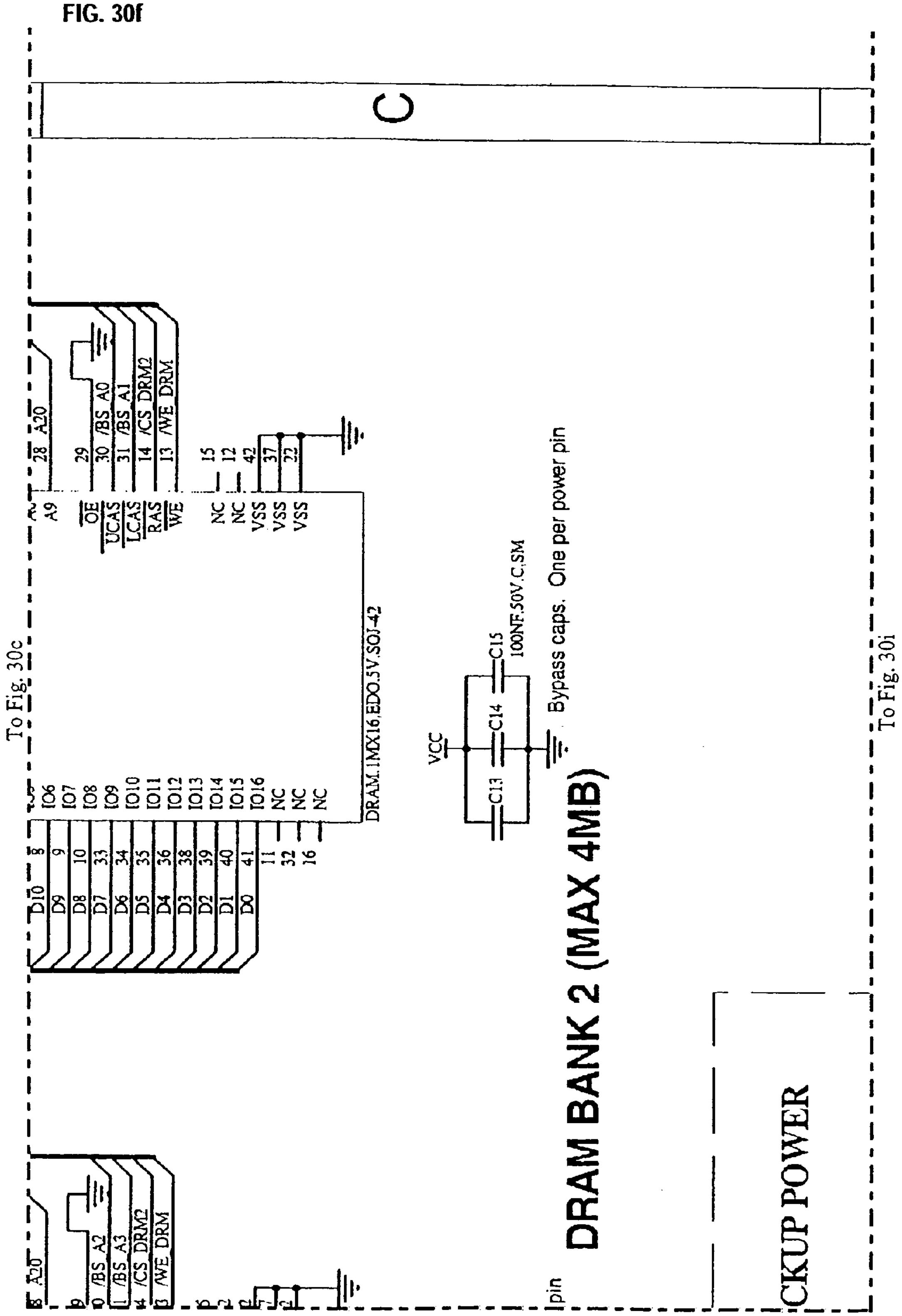
Figure 30G:
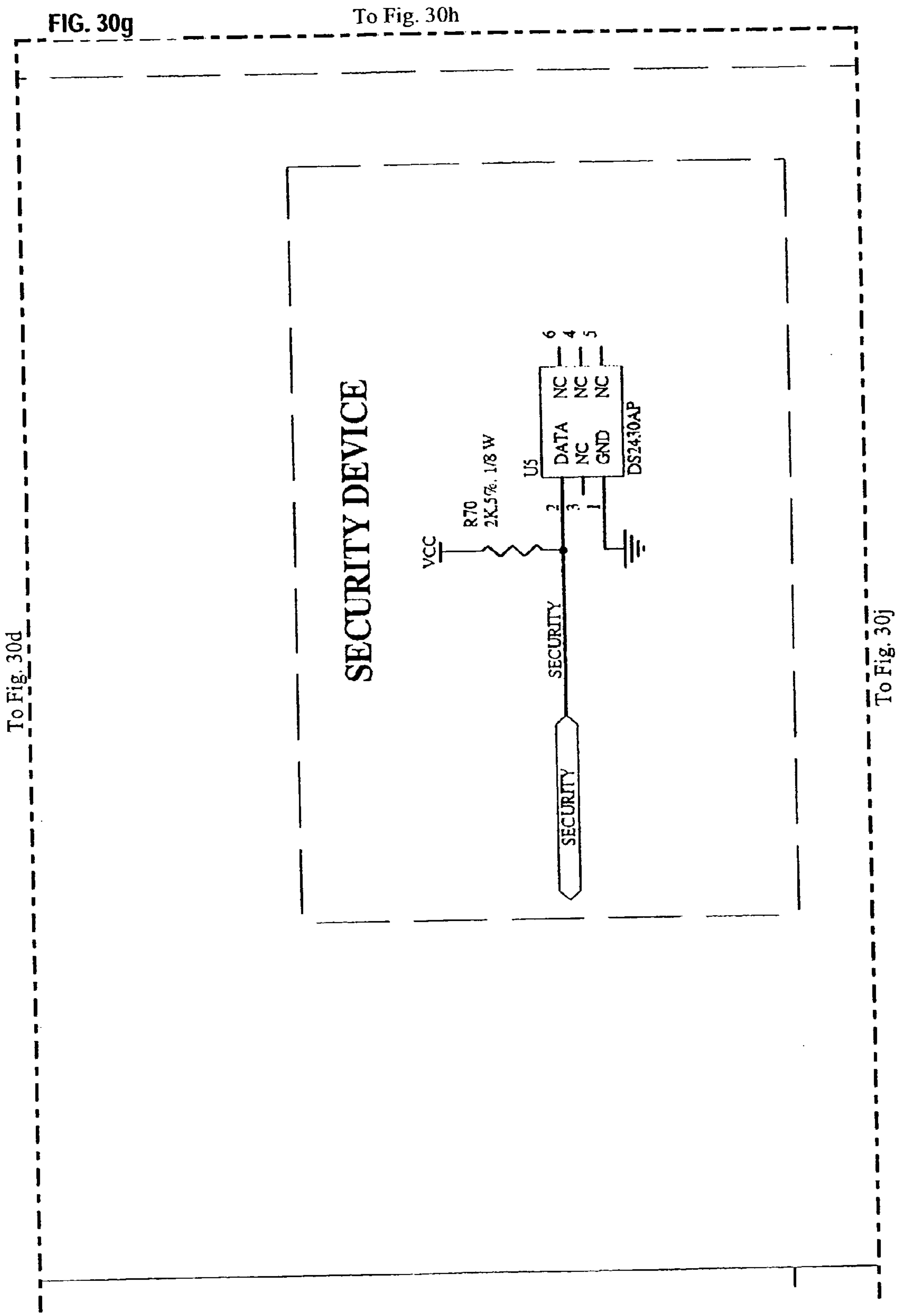
Figure 30H:
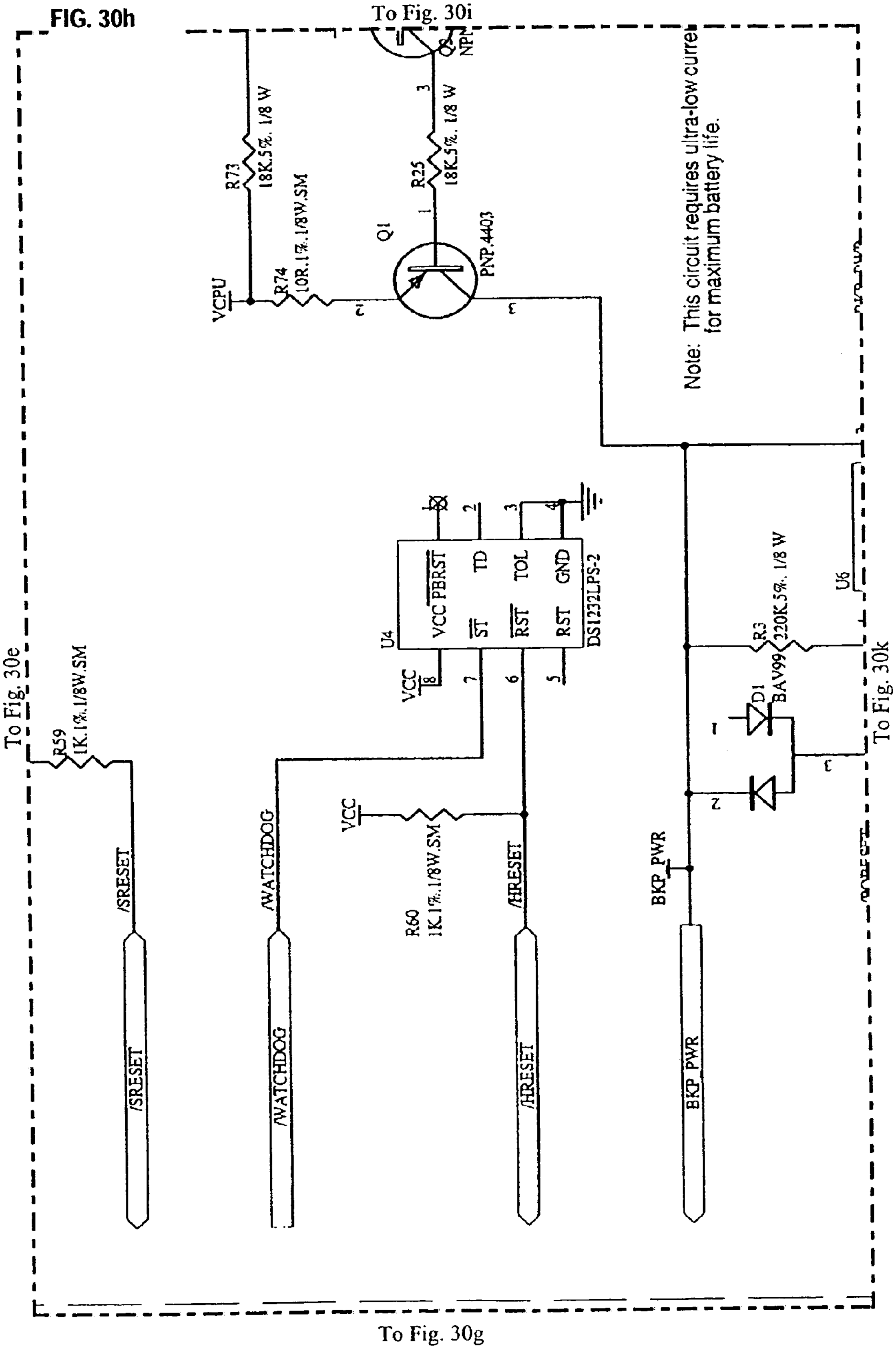
Figure 30I:
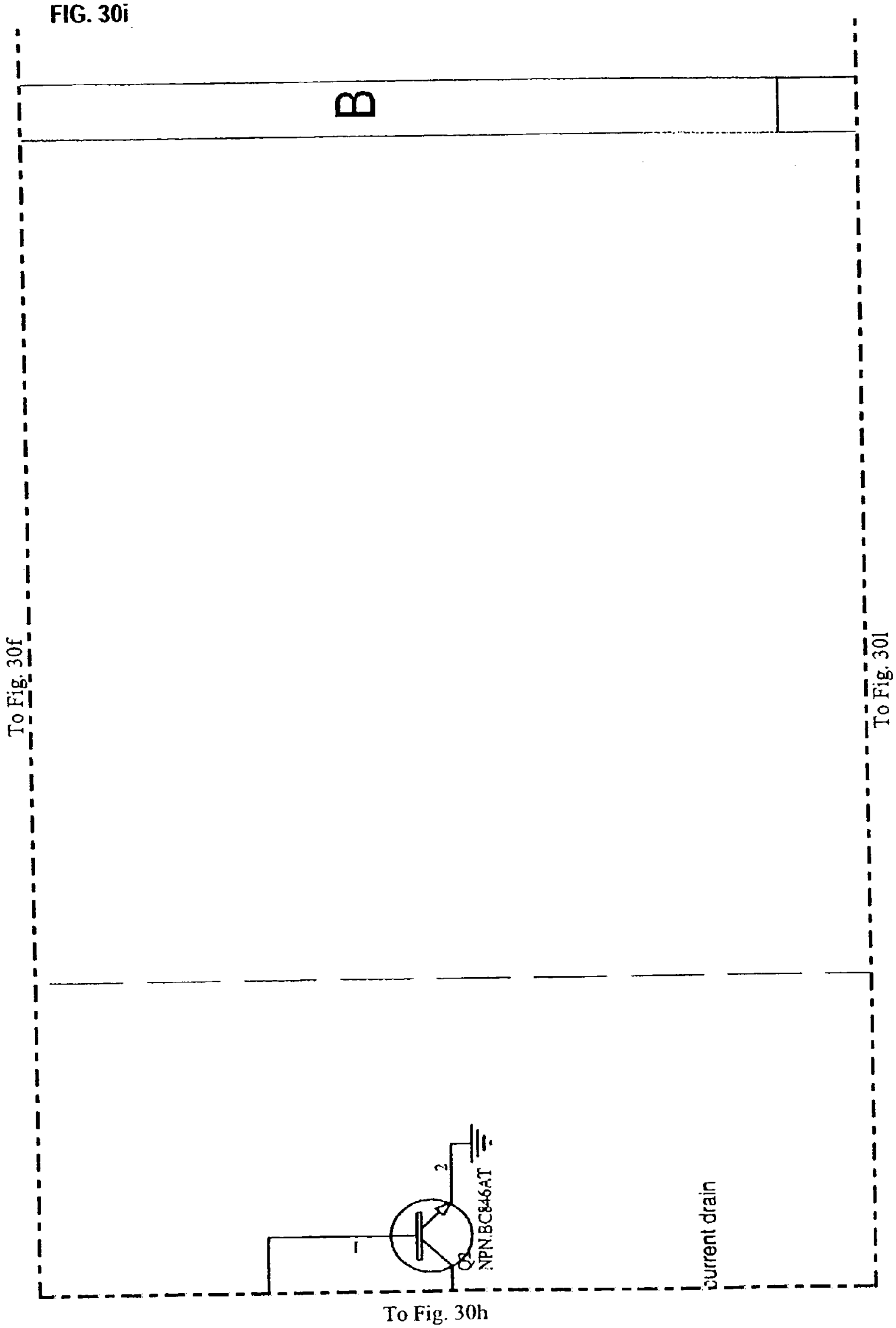
Figure 30J:
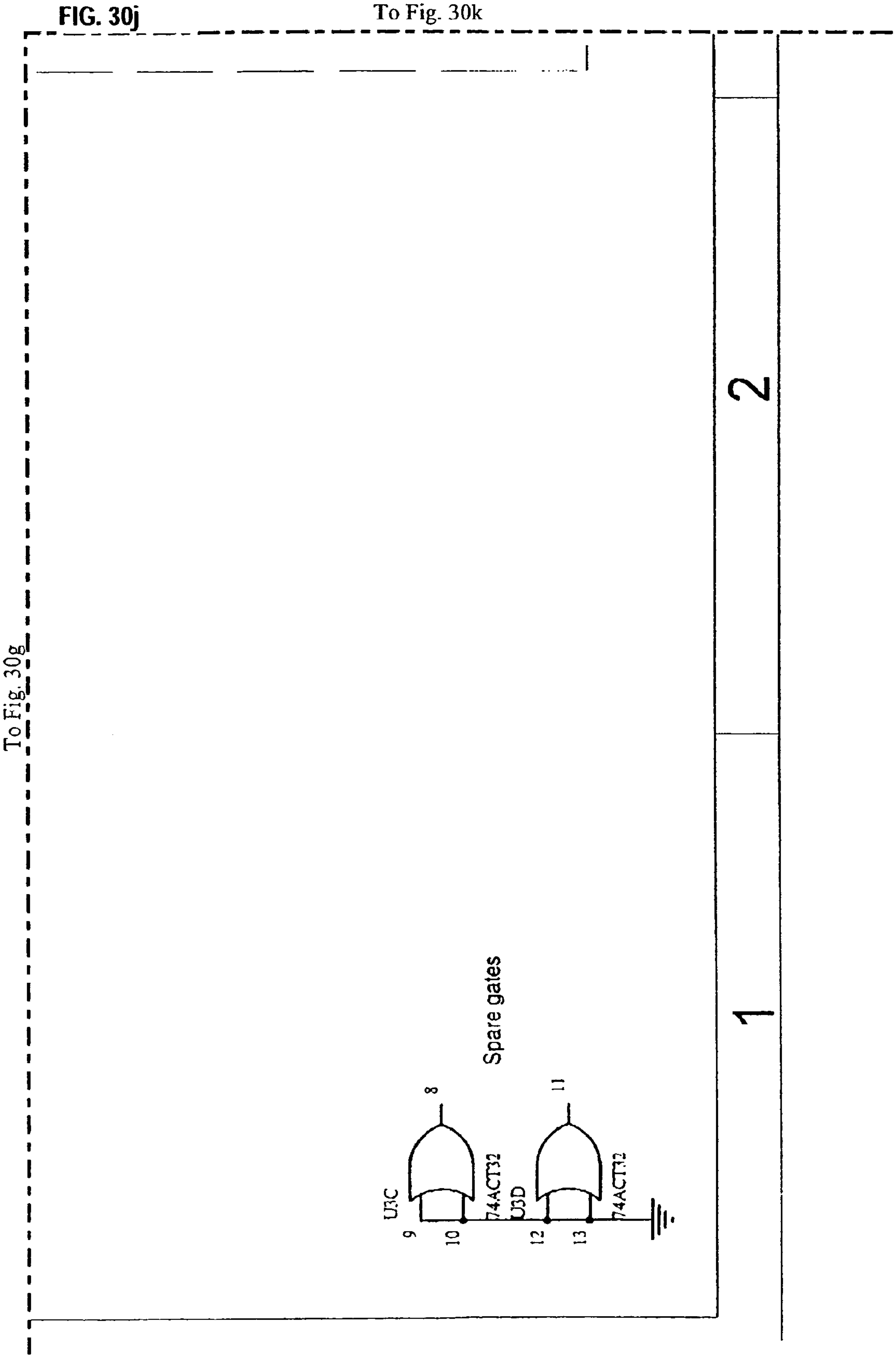
Figure 30K:
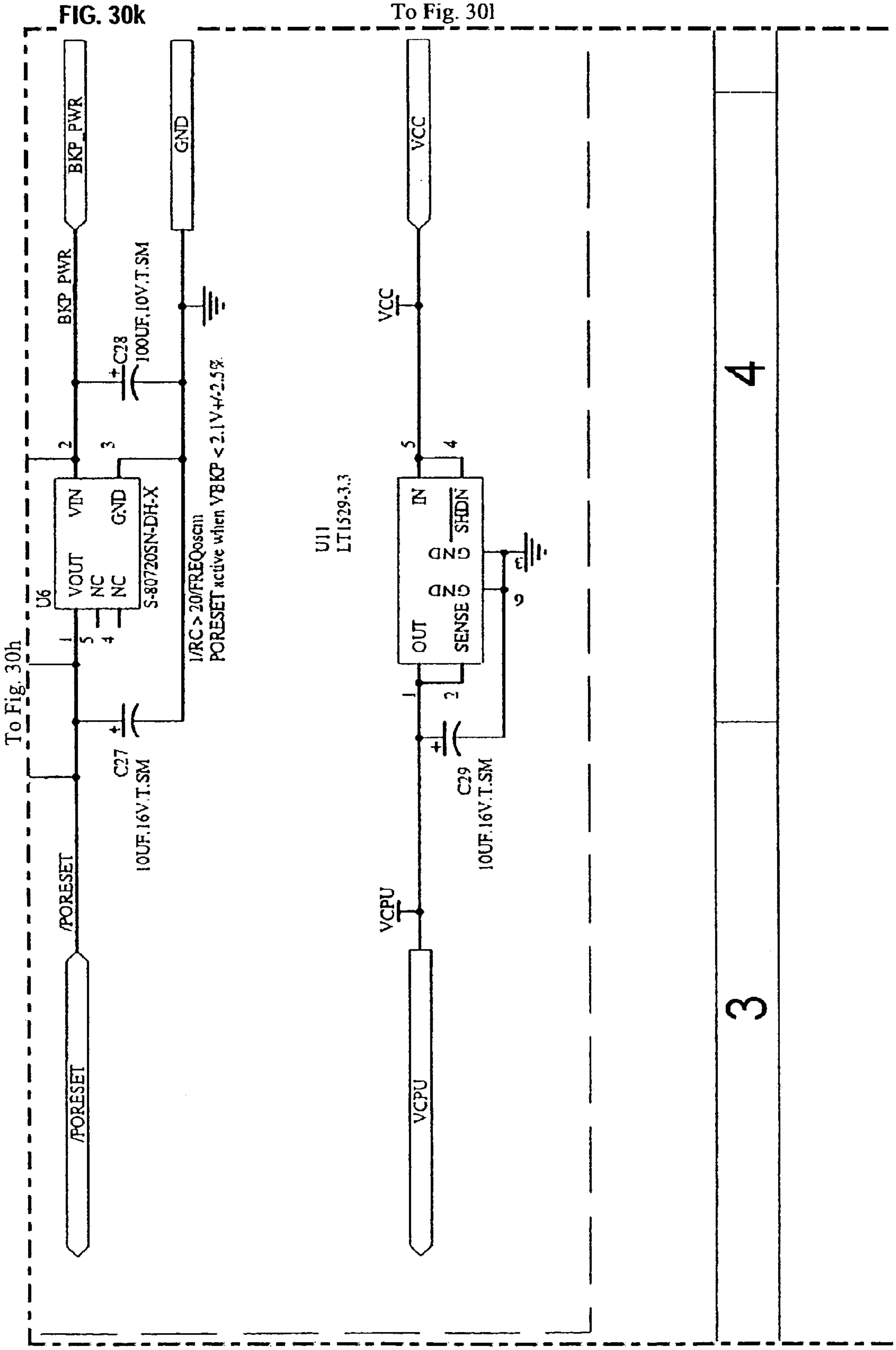
Figure 30L:
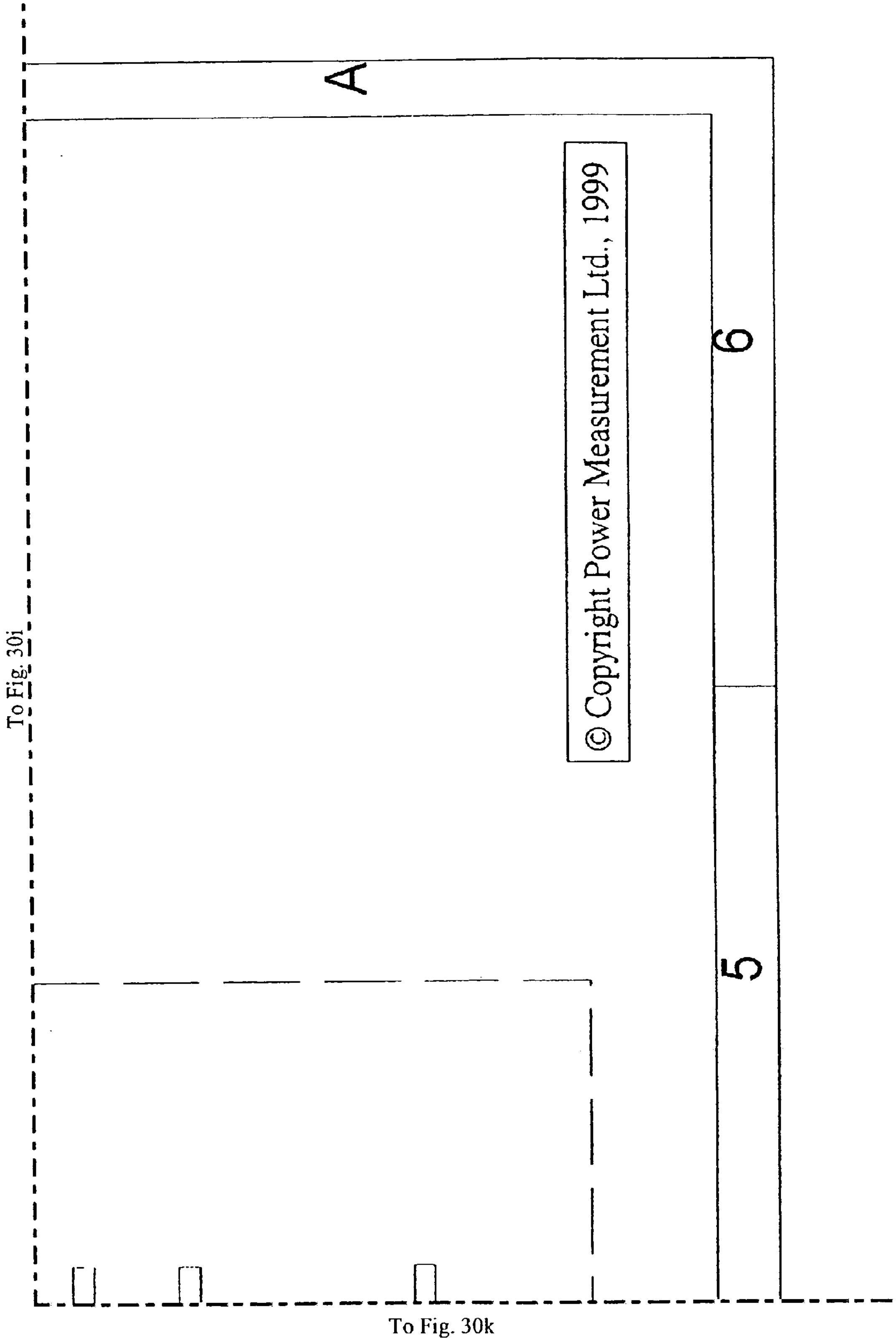
Figure 31A:
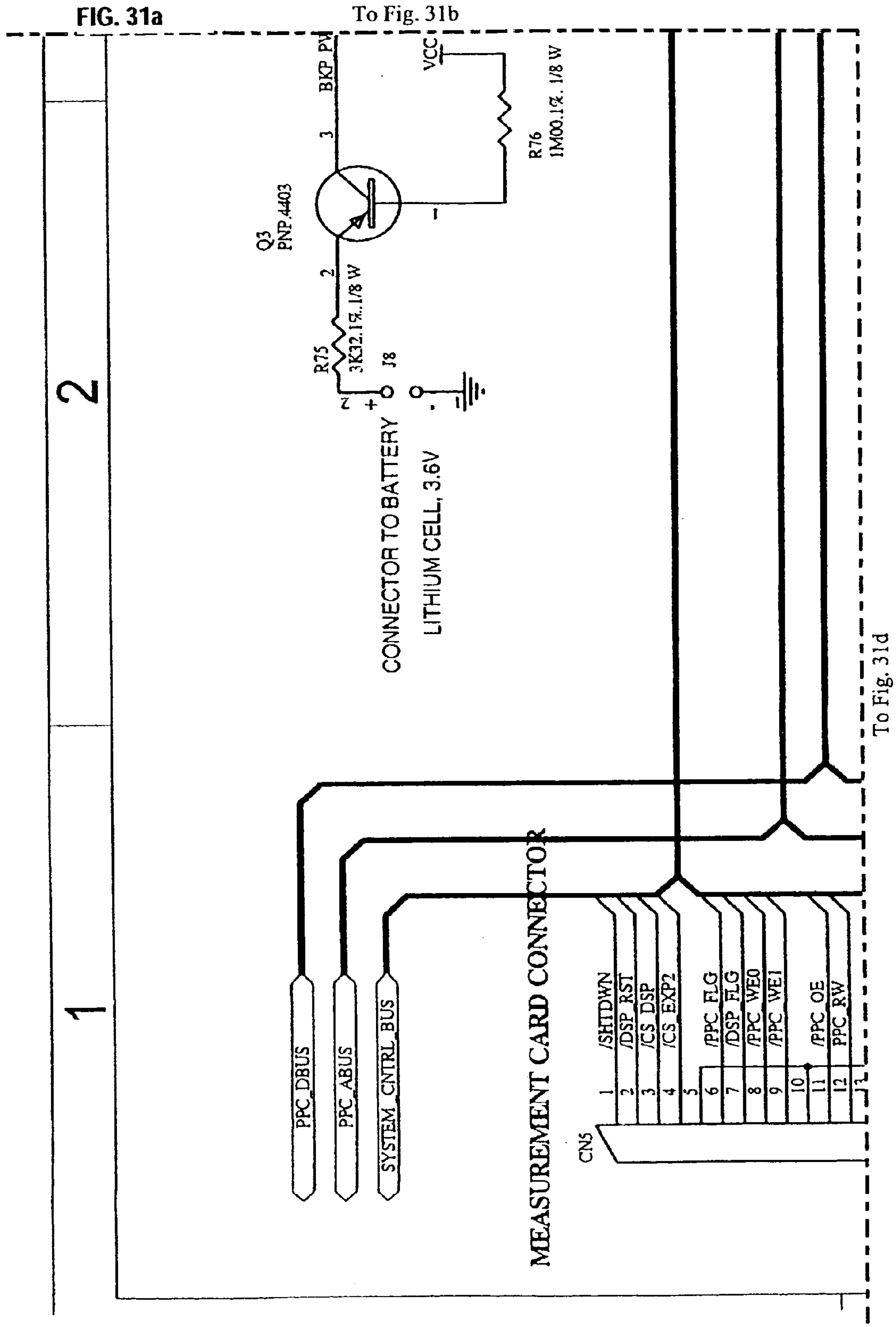
Figure 31B:
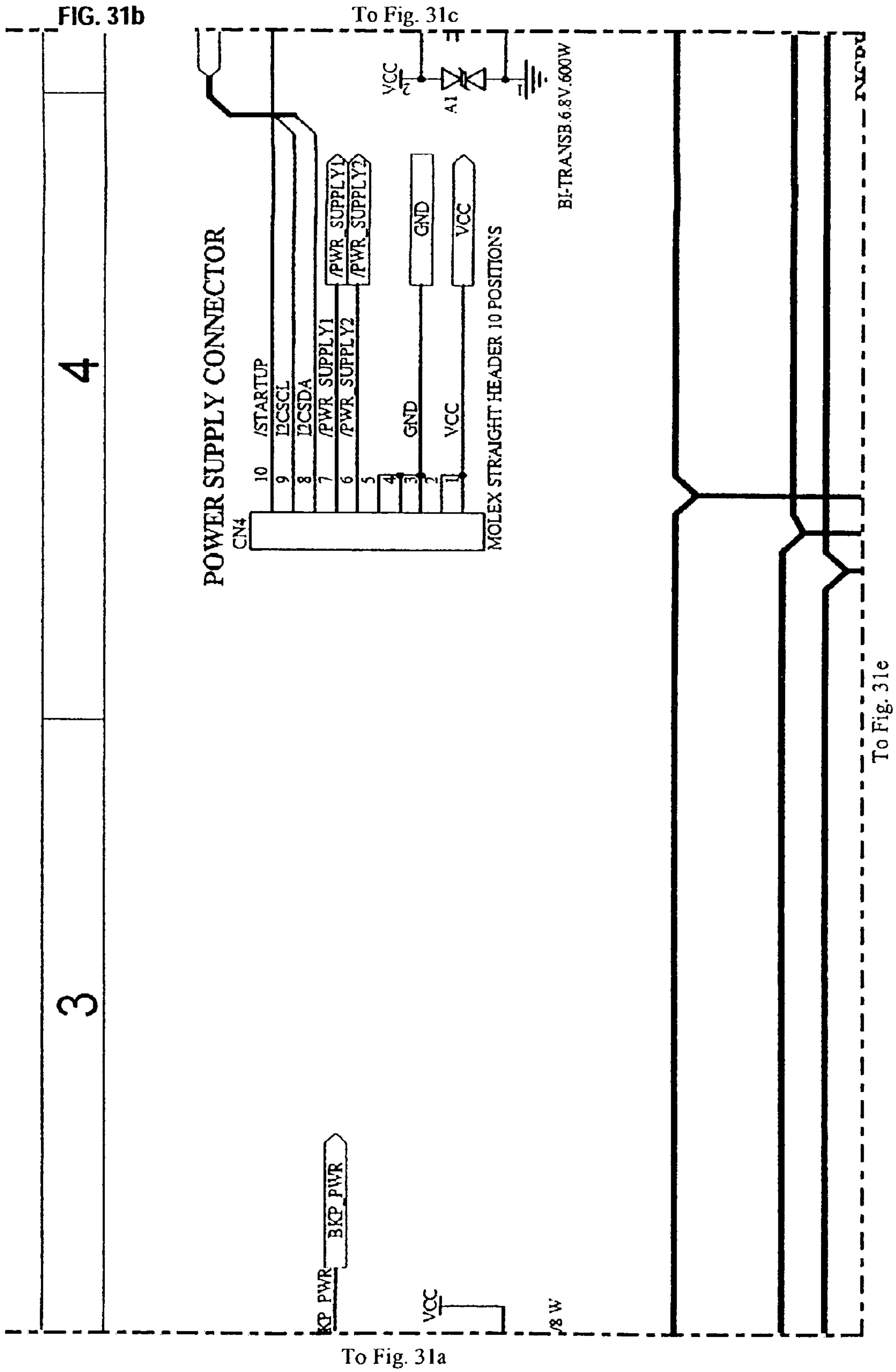
Figure 31C:
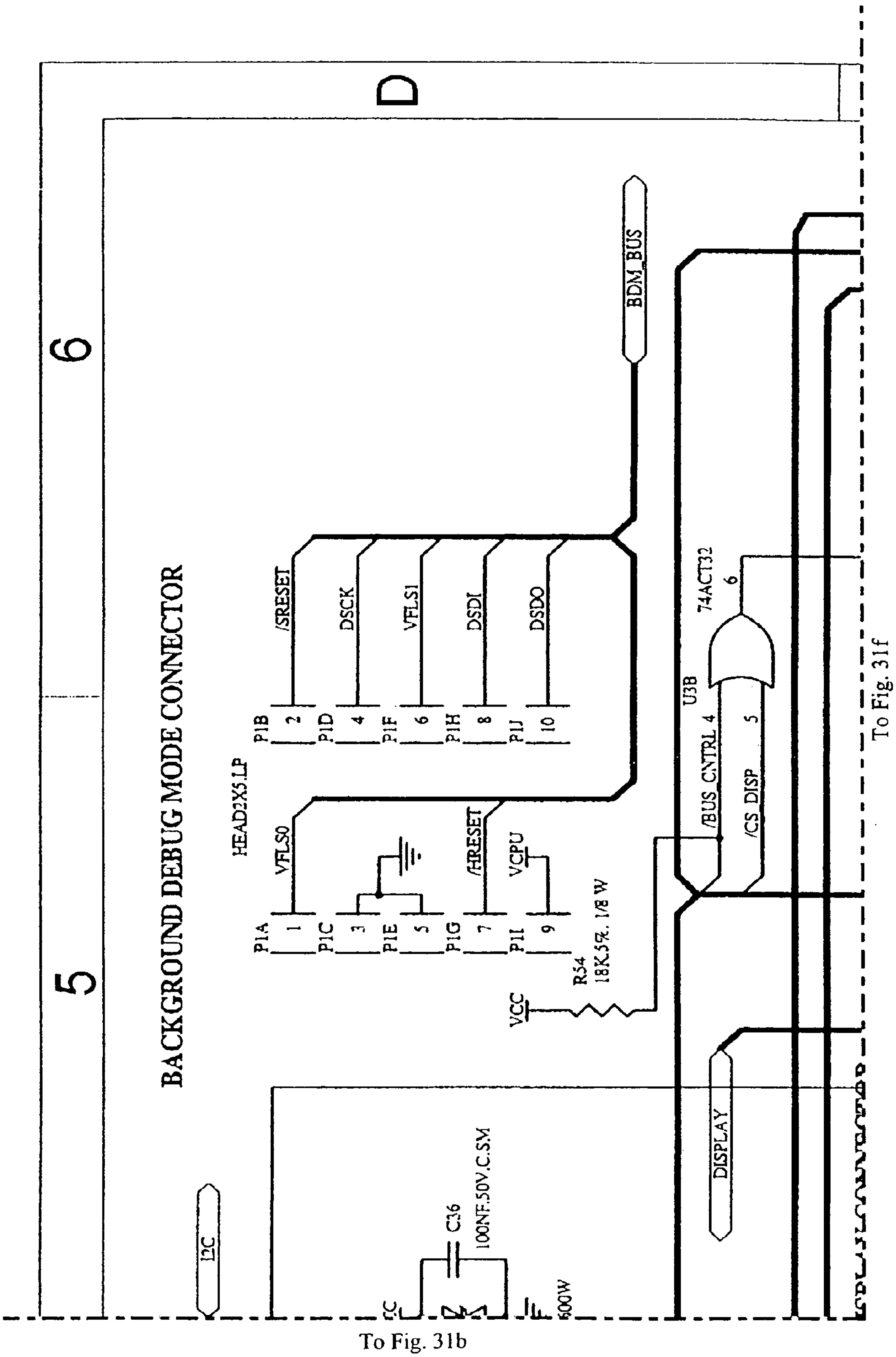
Figure 31D:
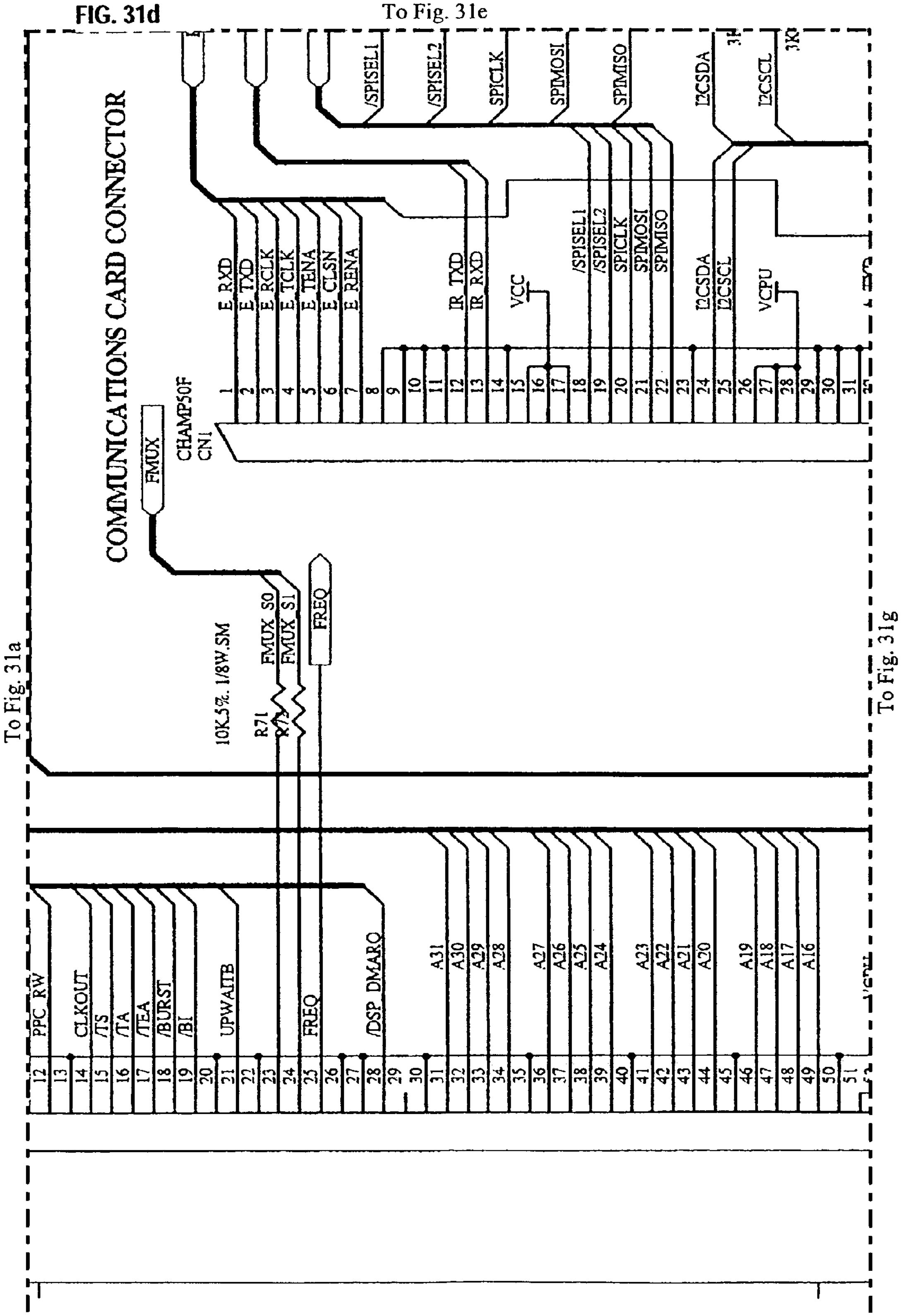
Figure 31E:
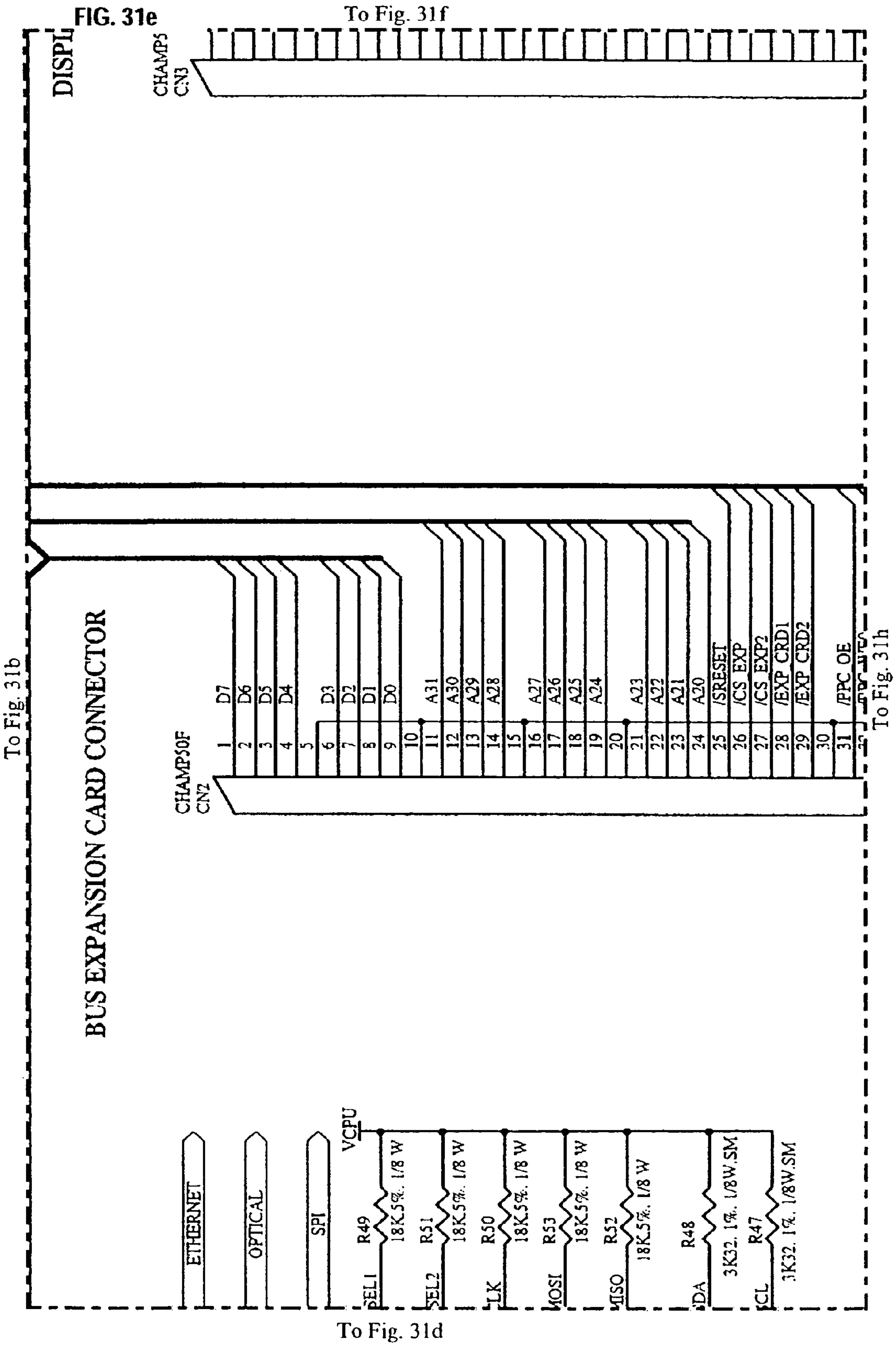
Figure 31F:
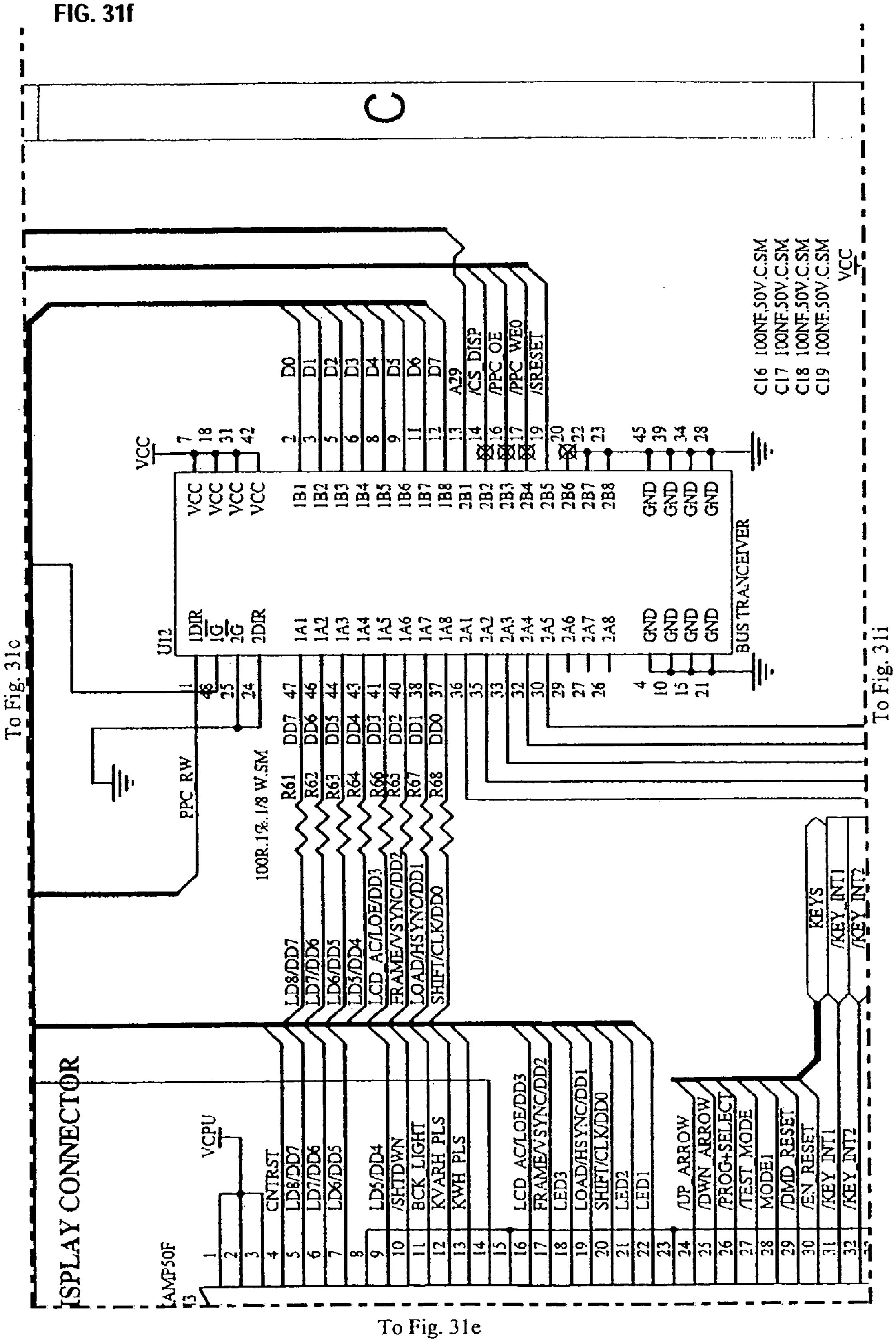
Figure 31G:
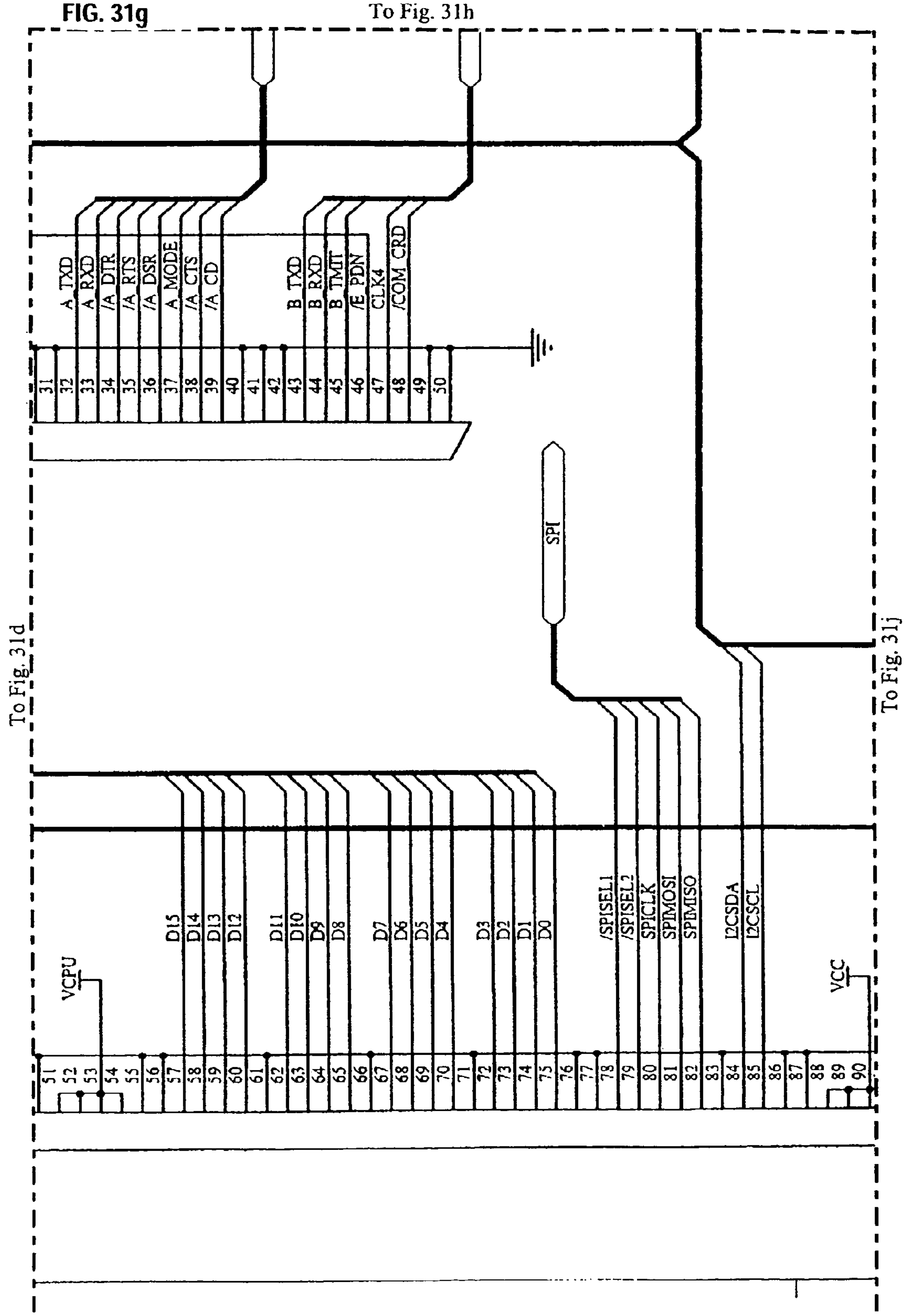
Figure 31H:
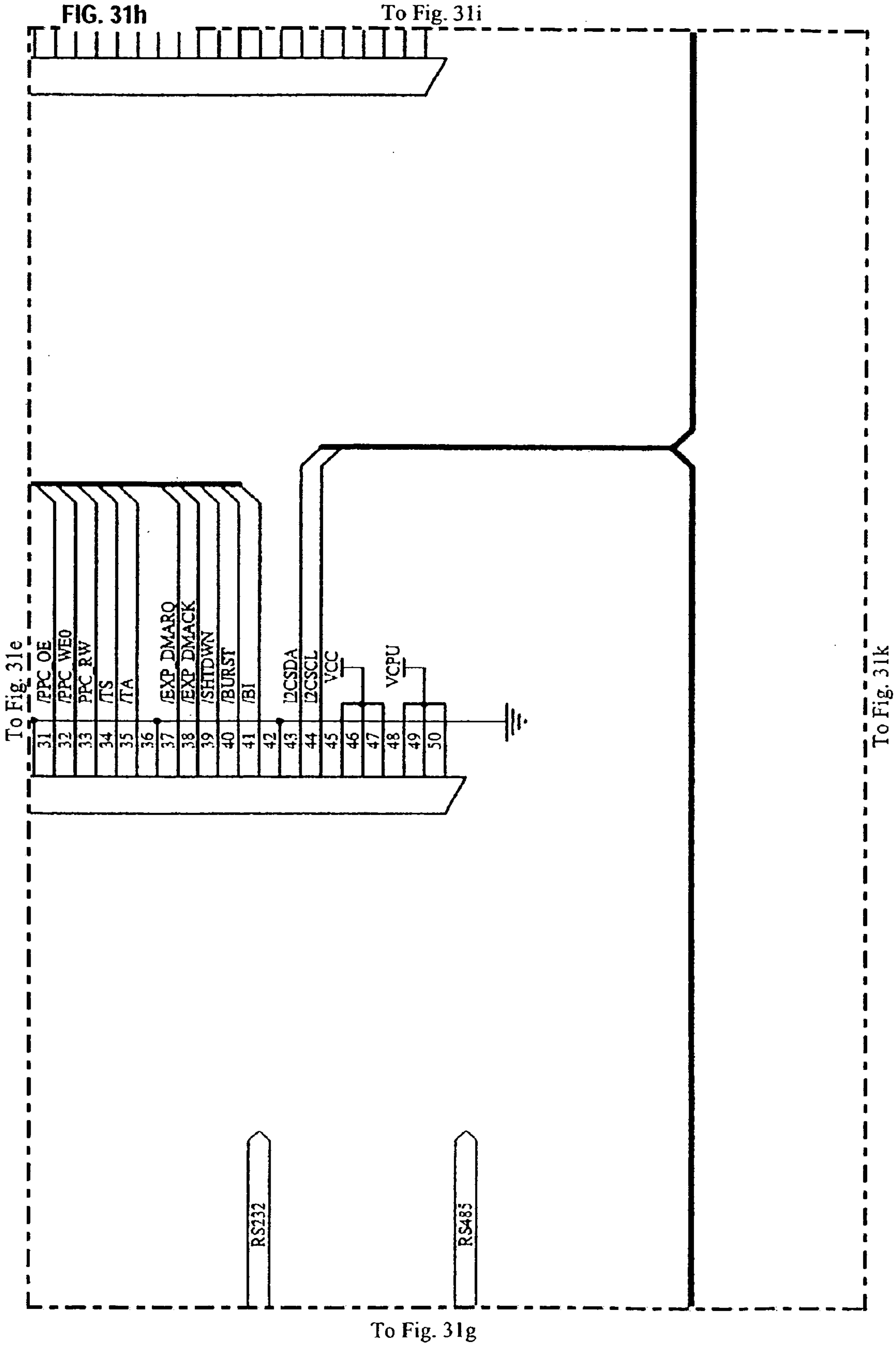
Figure 31I:
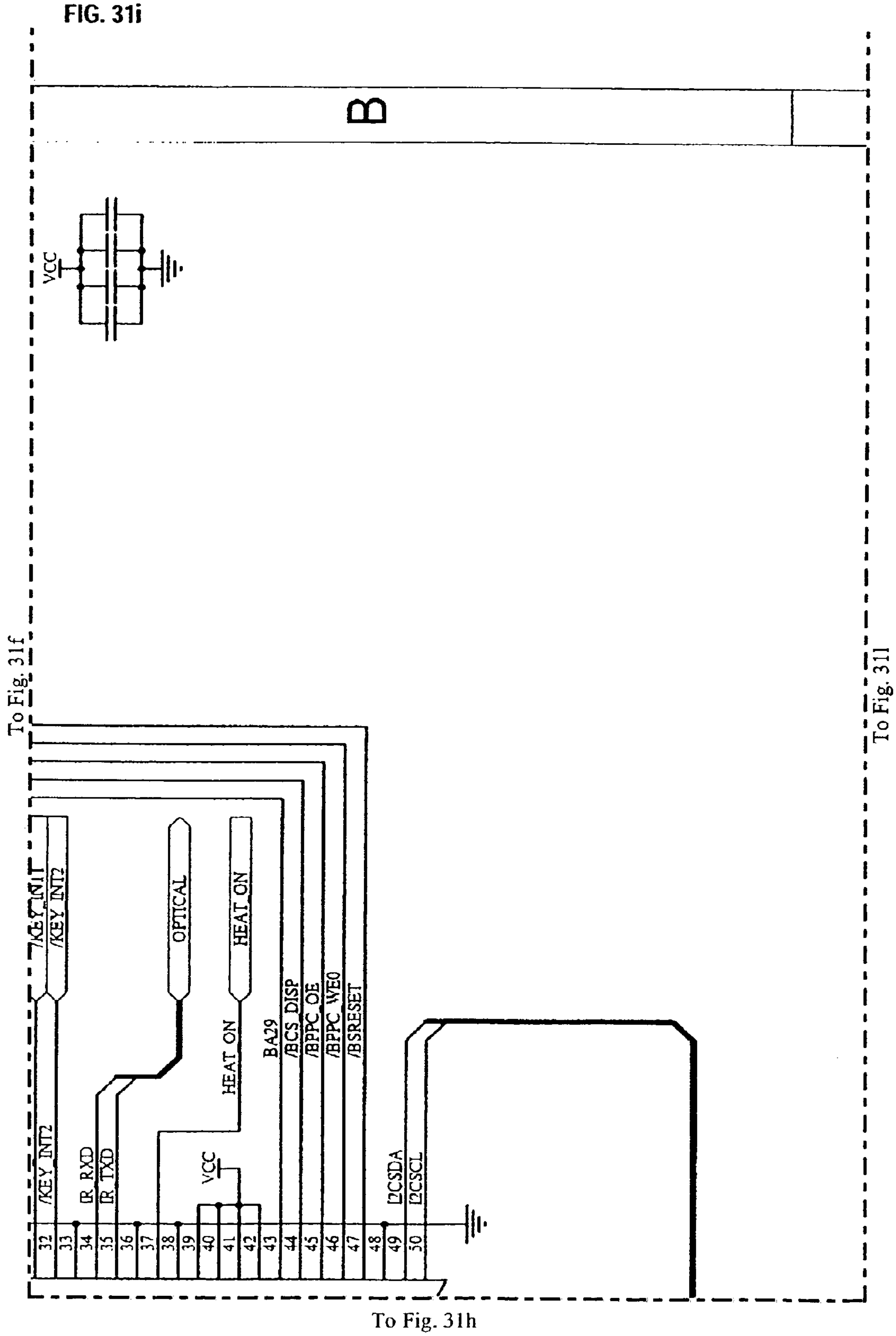
Figure 31J:
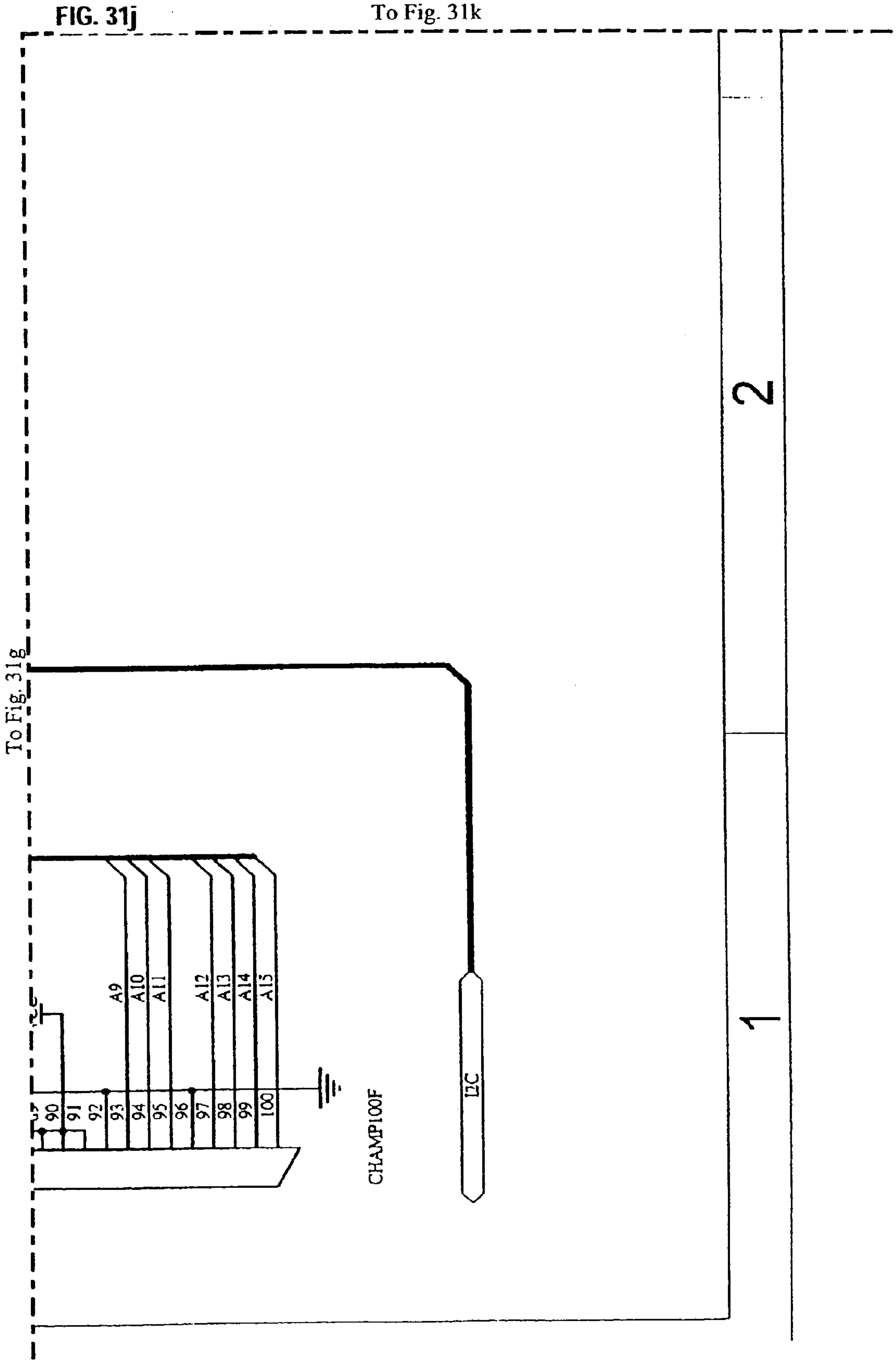
Figure 31K:
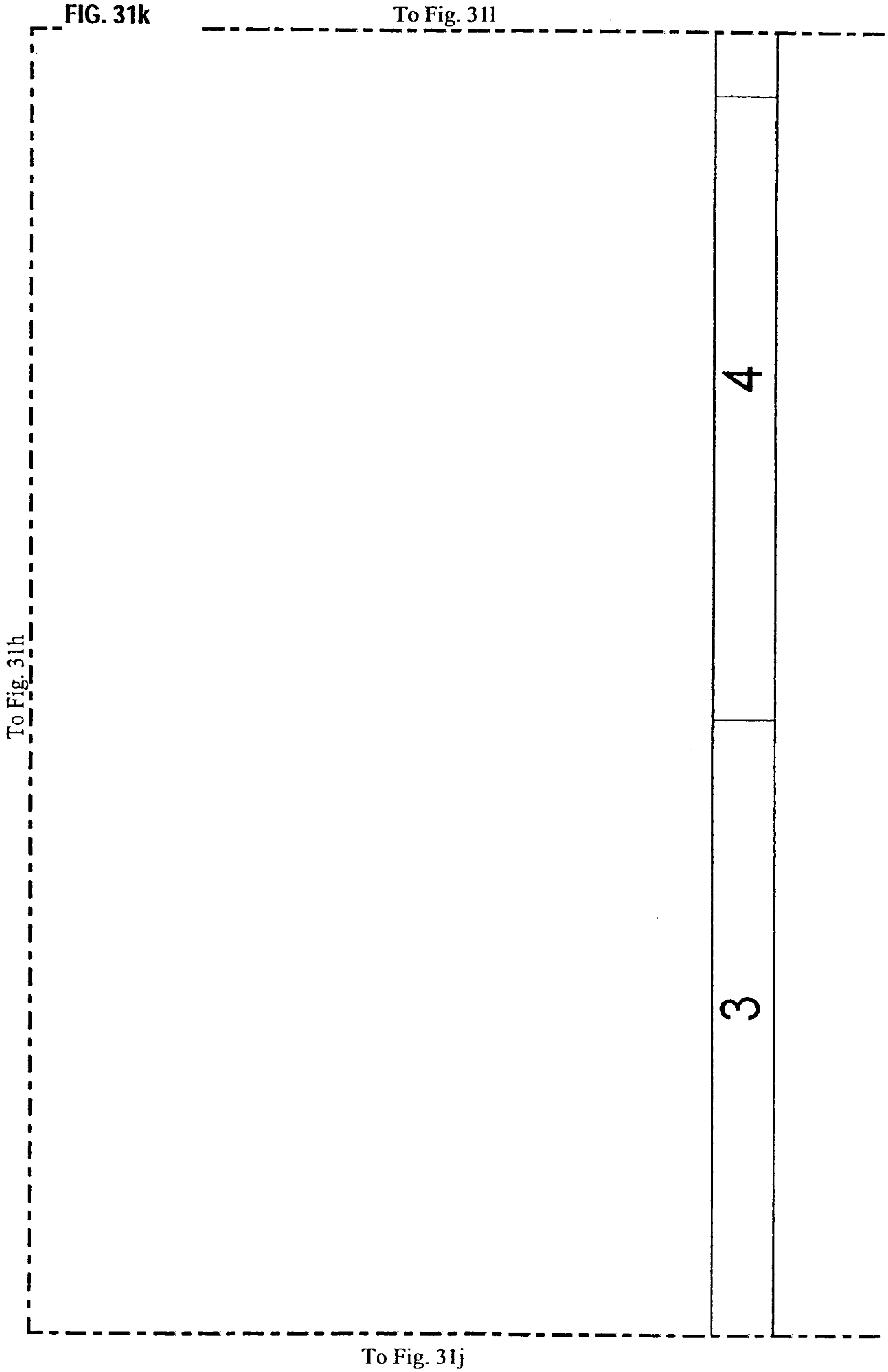
Figure 31L:
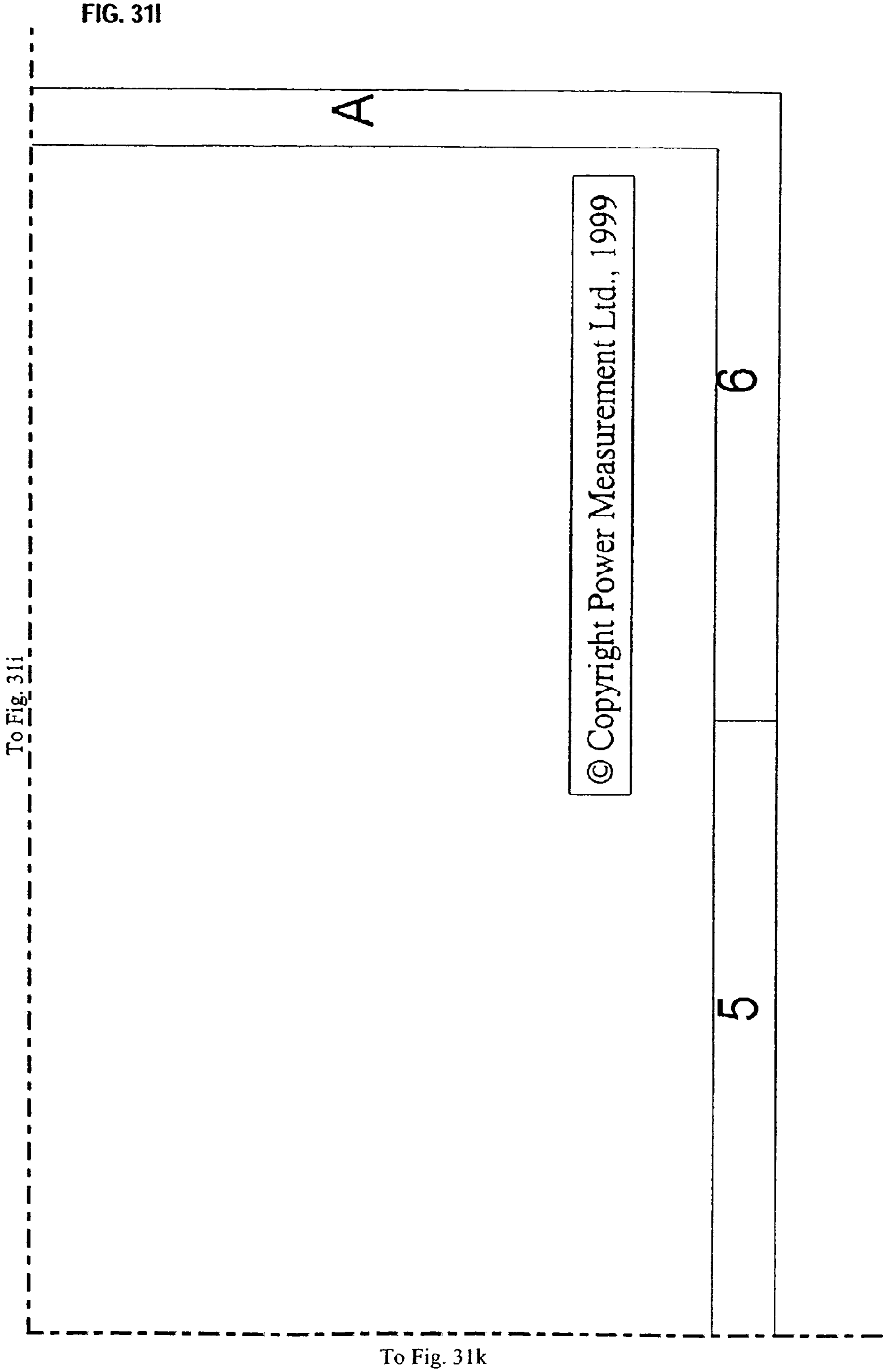
Figure 32A:
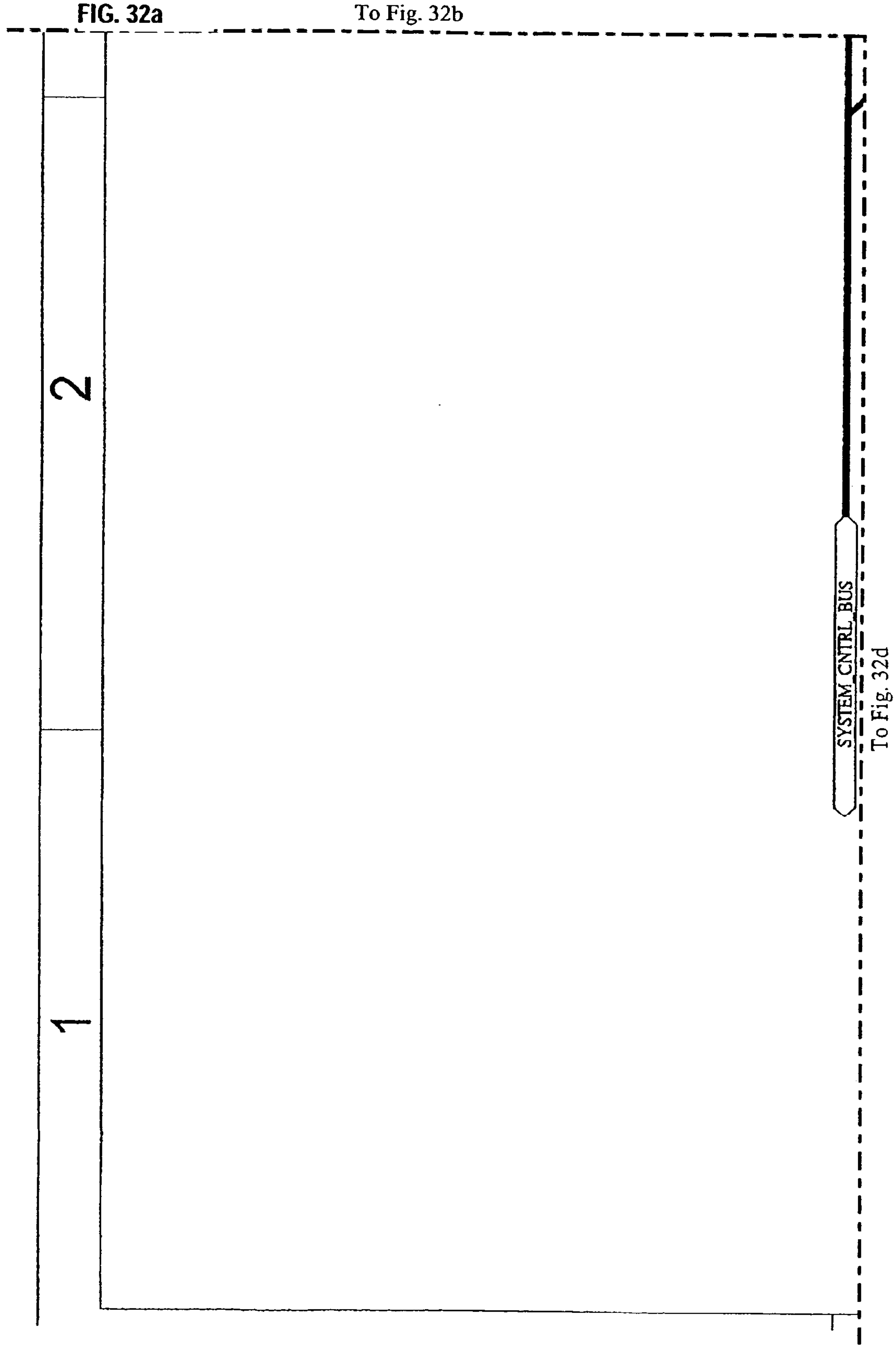
Figure 32B:
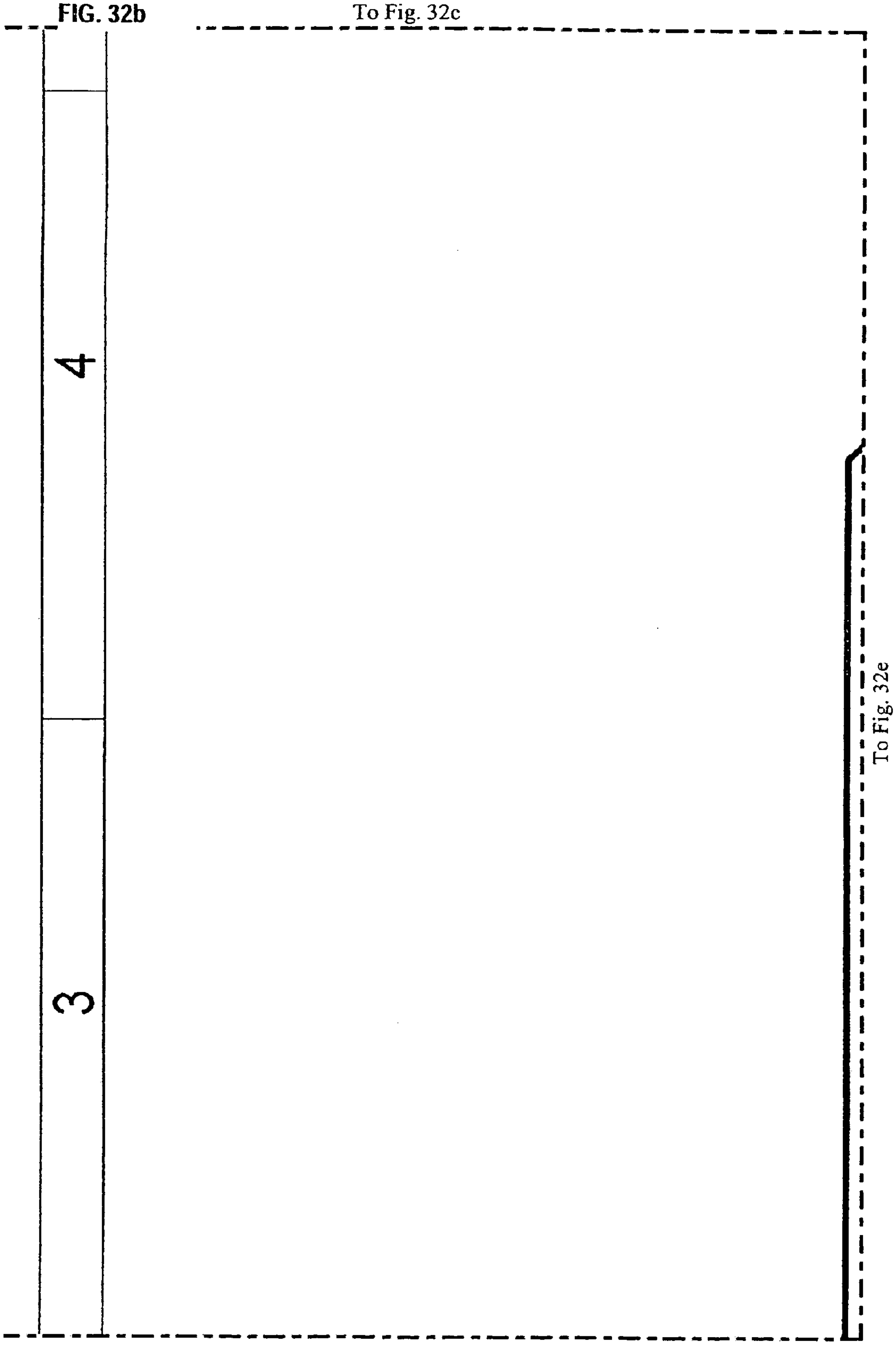
Figure 32C:
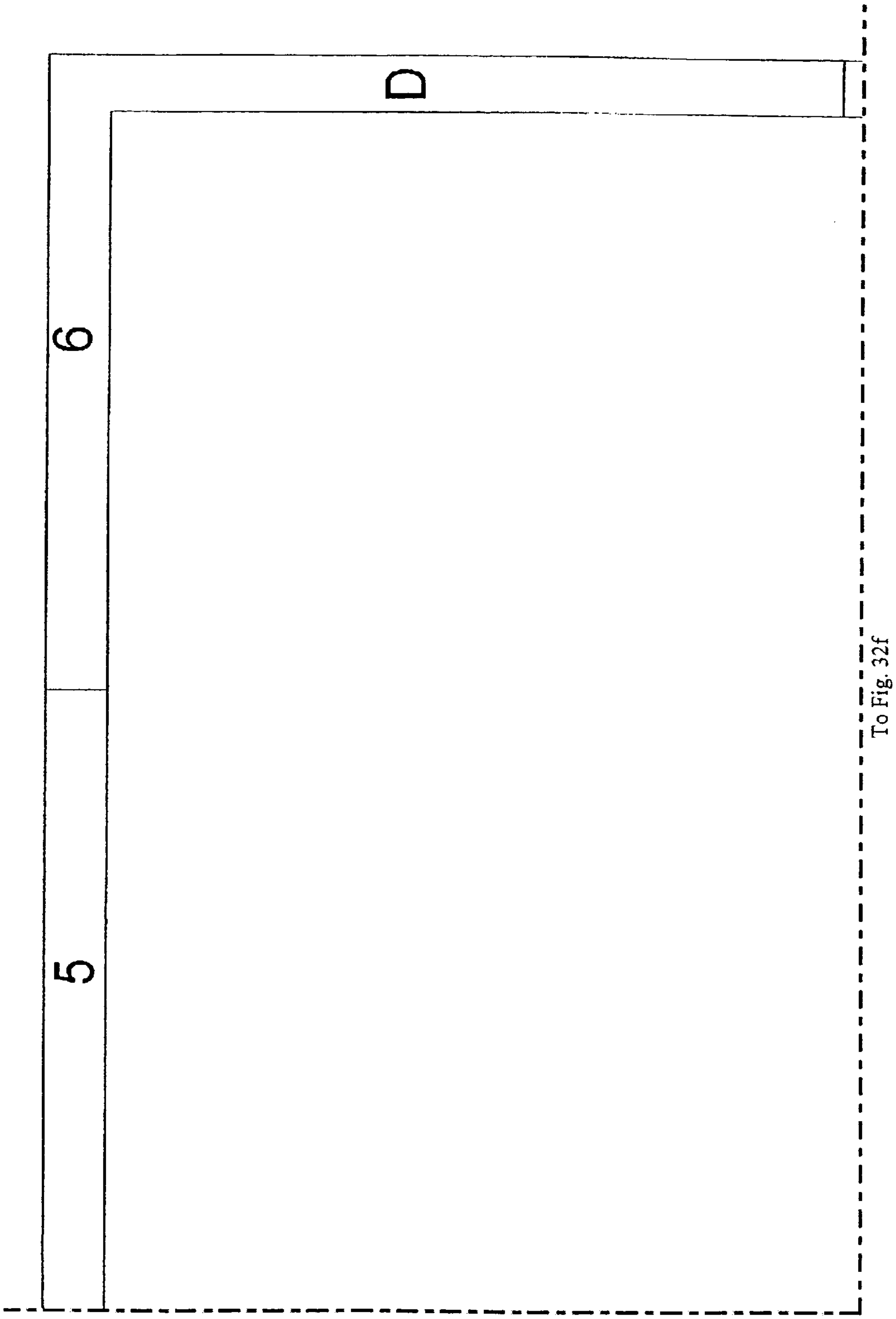
Figure 32D:
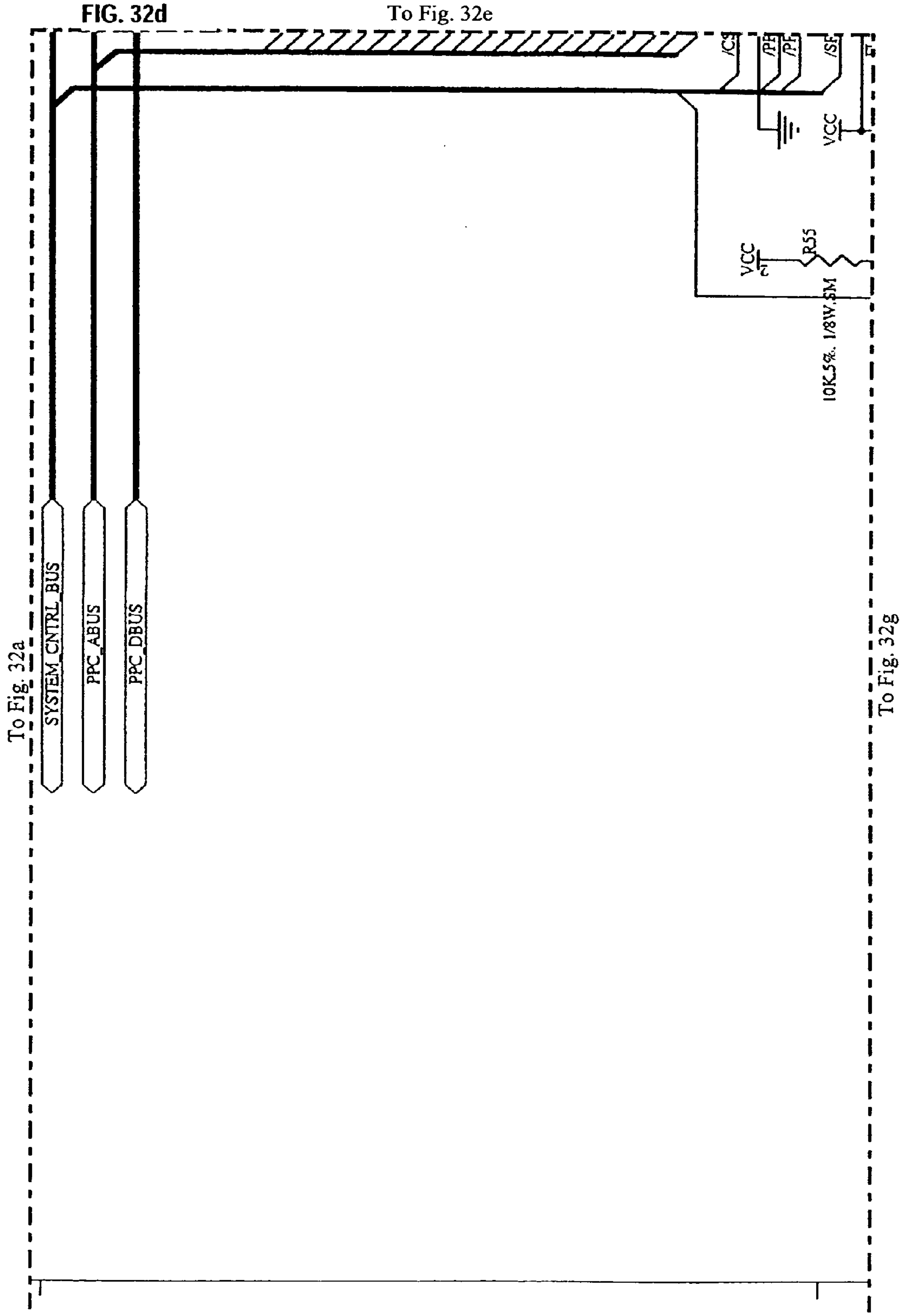
Figure 32E:
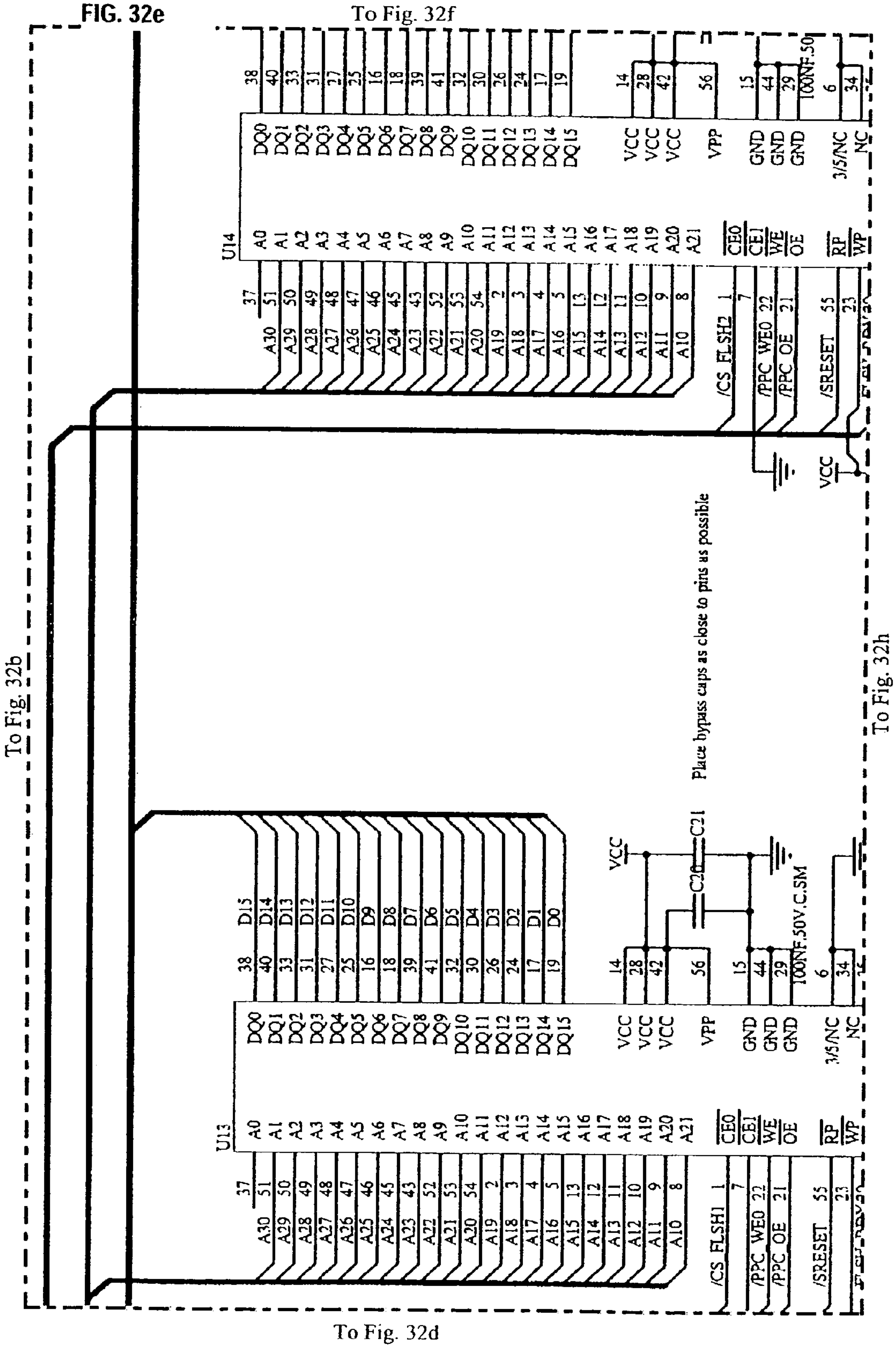
Figure 32F:
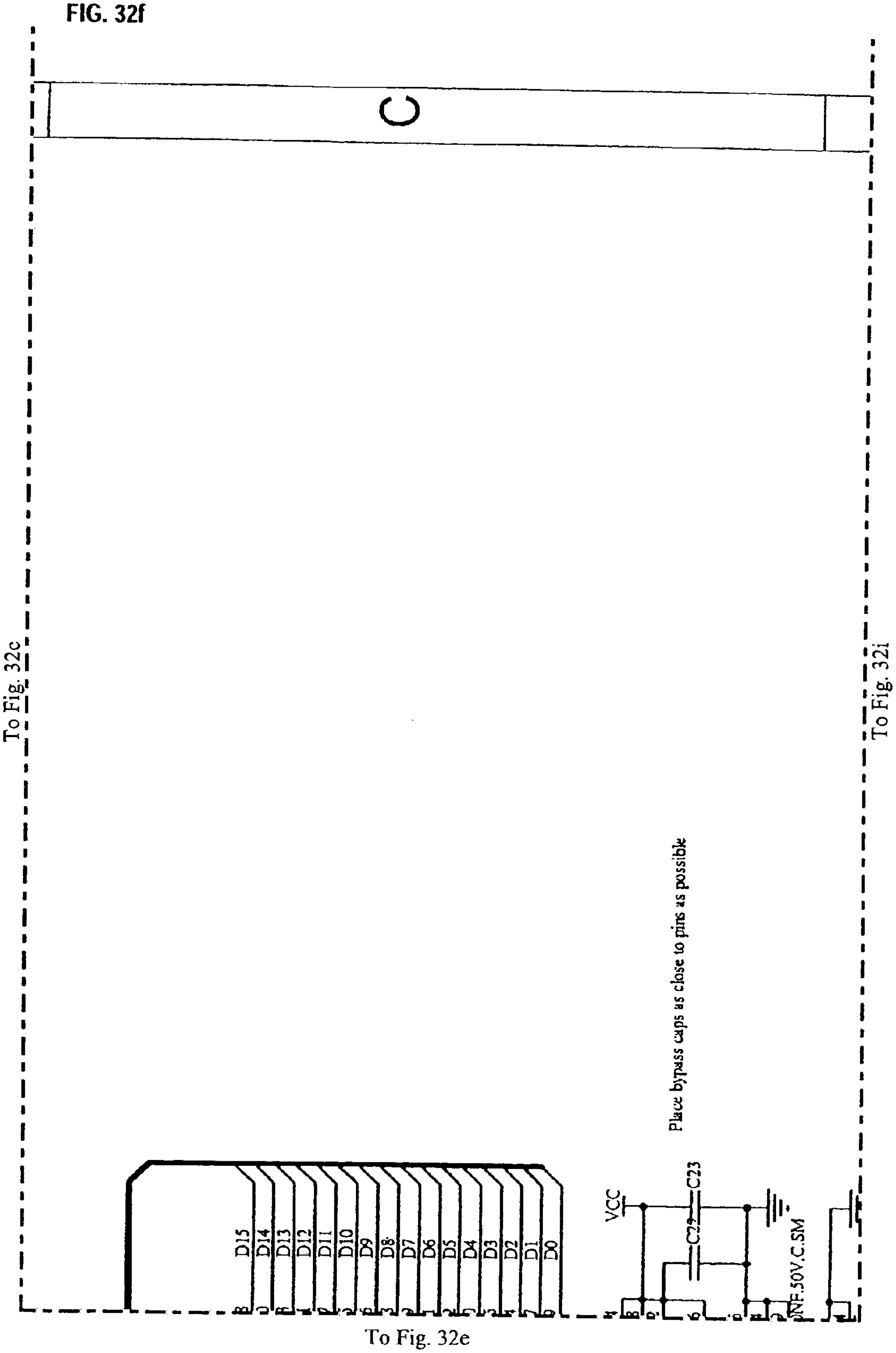
Figure 32G:
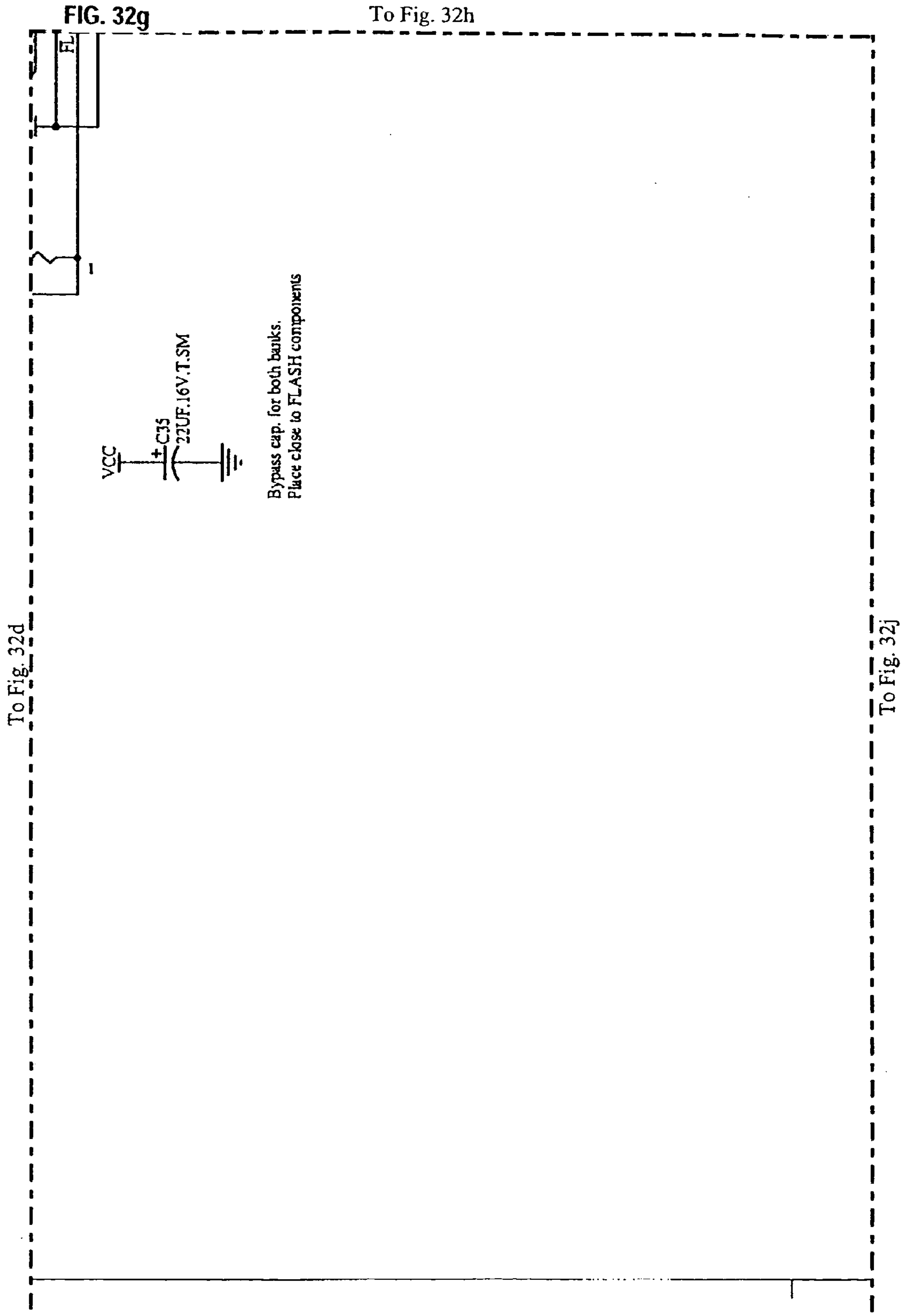
Figure 32H:
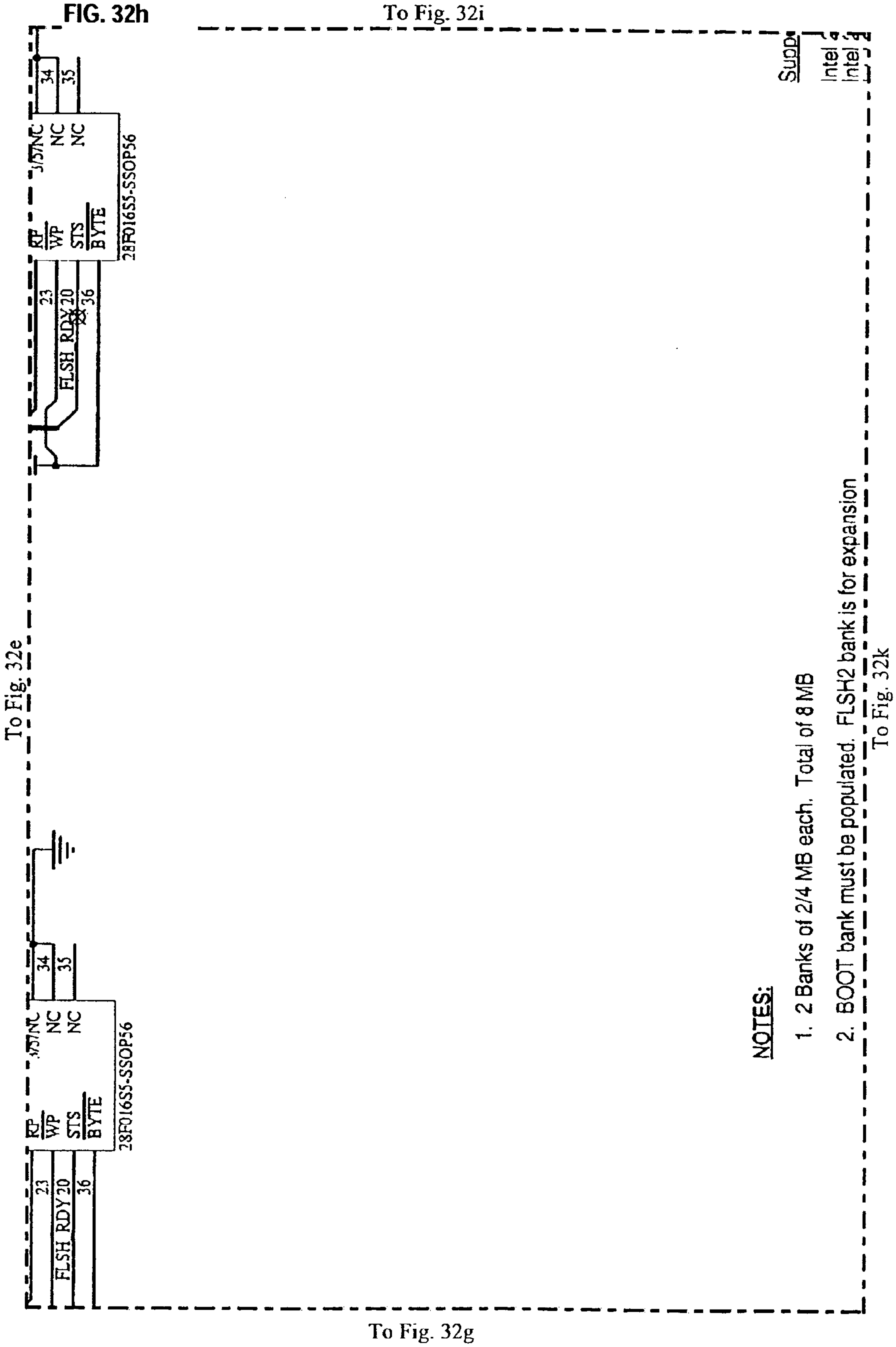
Figure 32I:
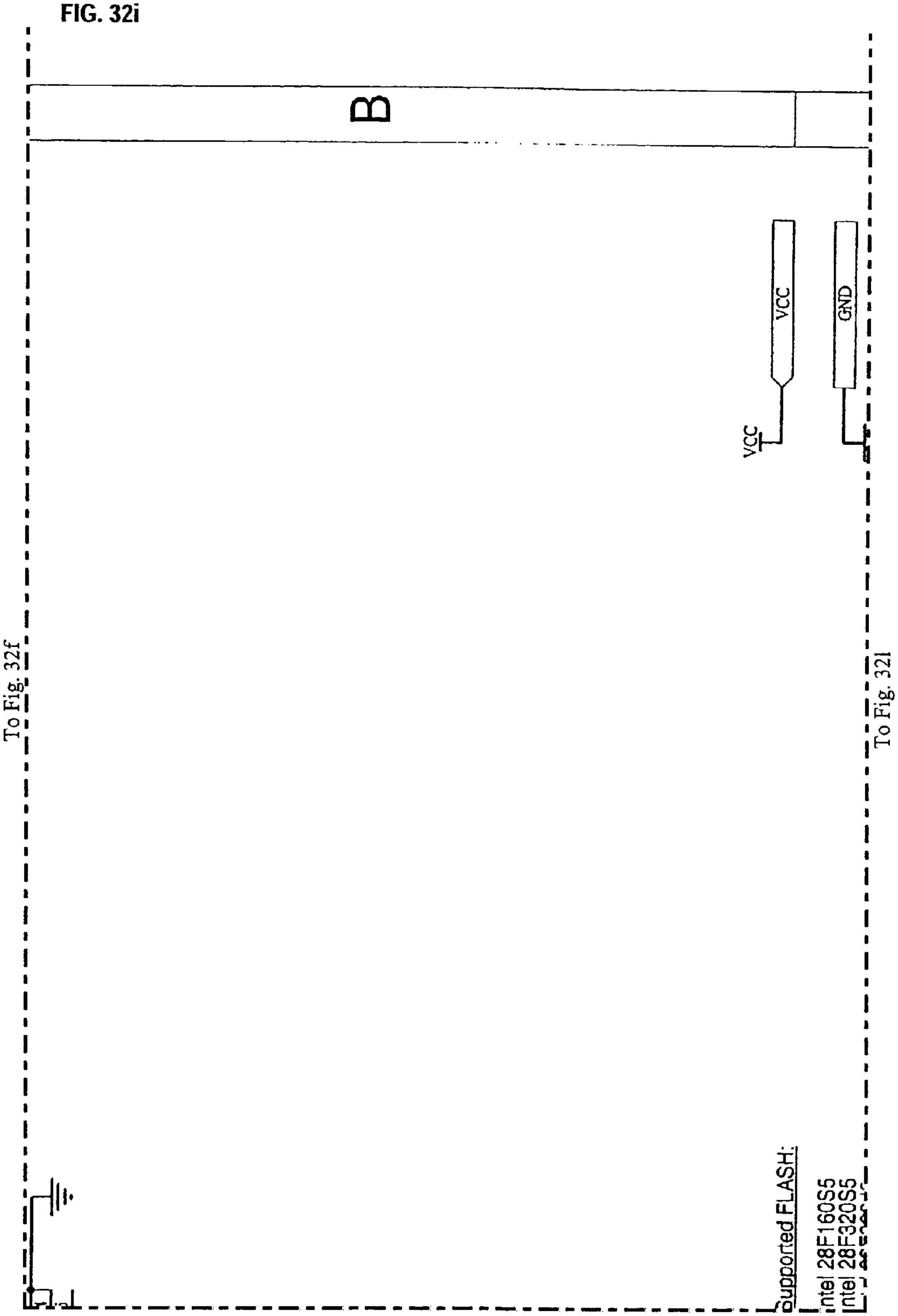
Figure 32J:
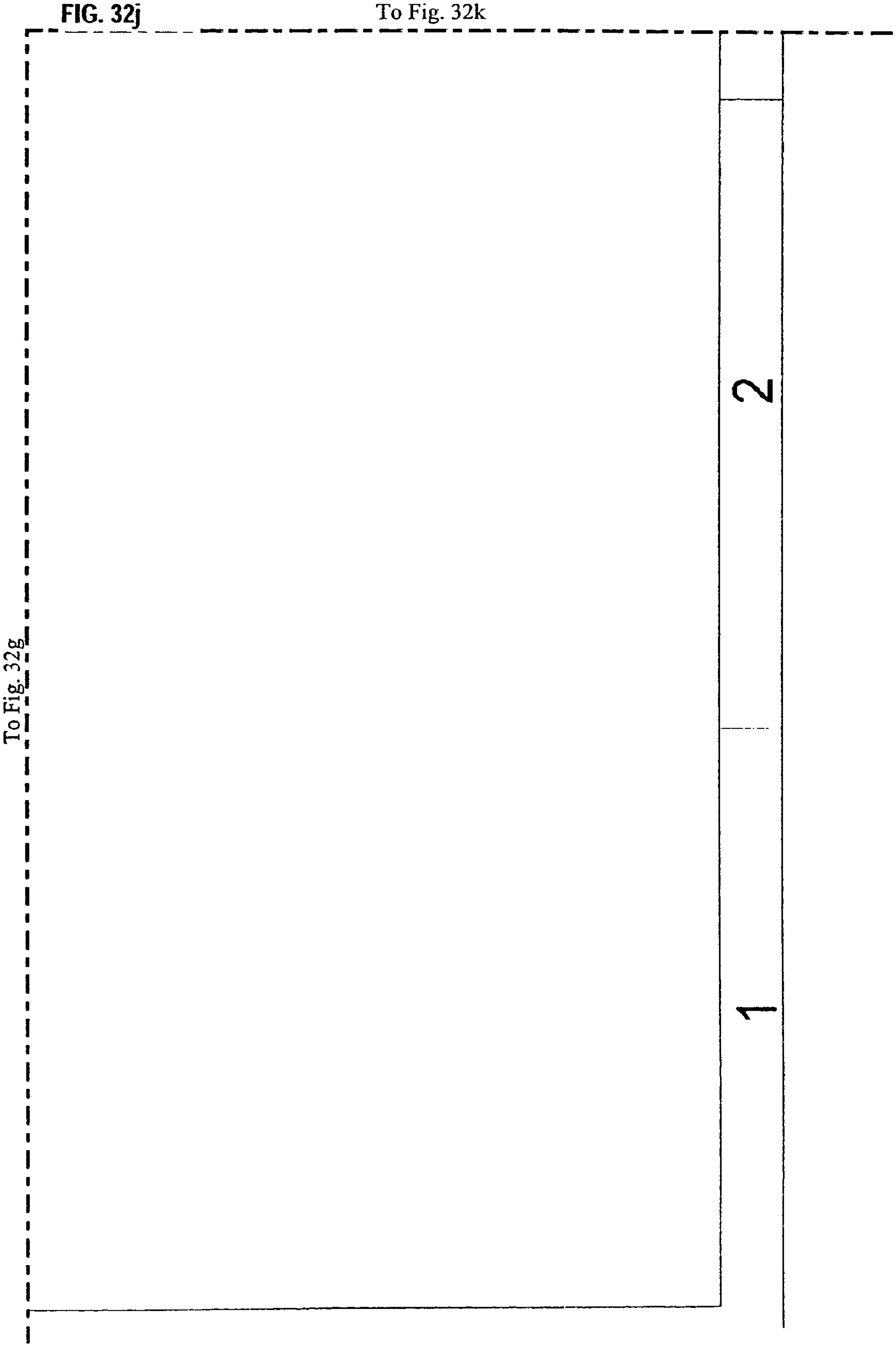
Figure 32K:
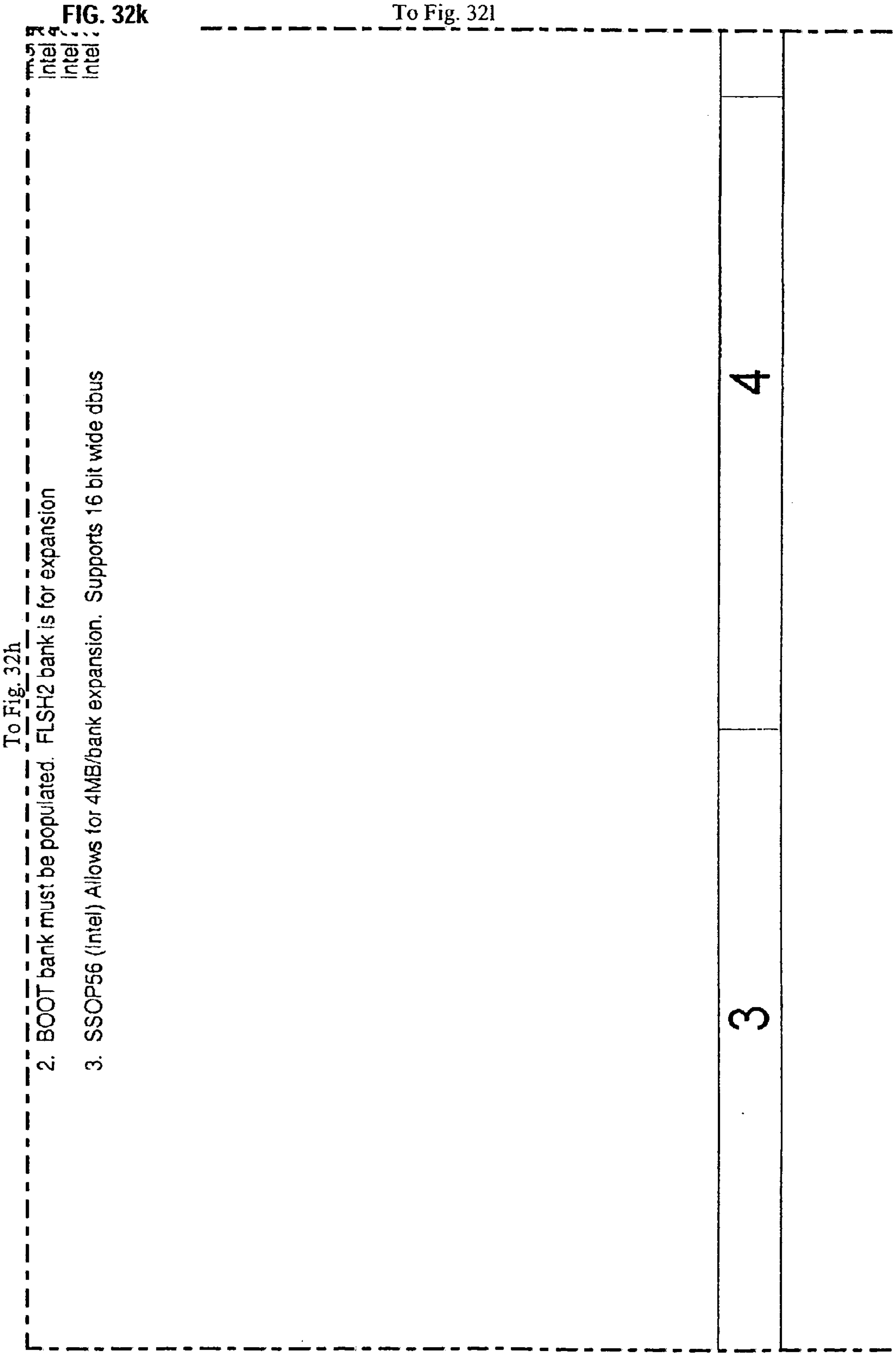
Figure 32L:
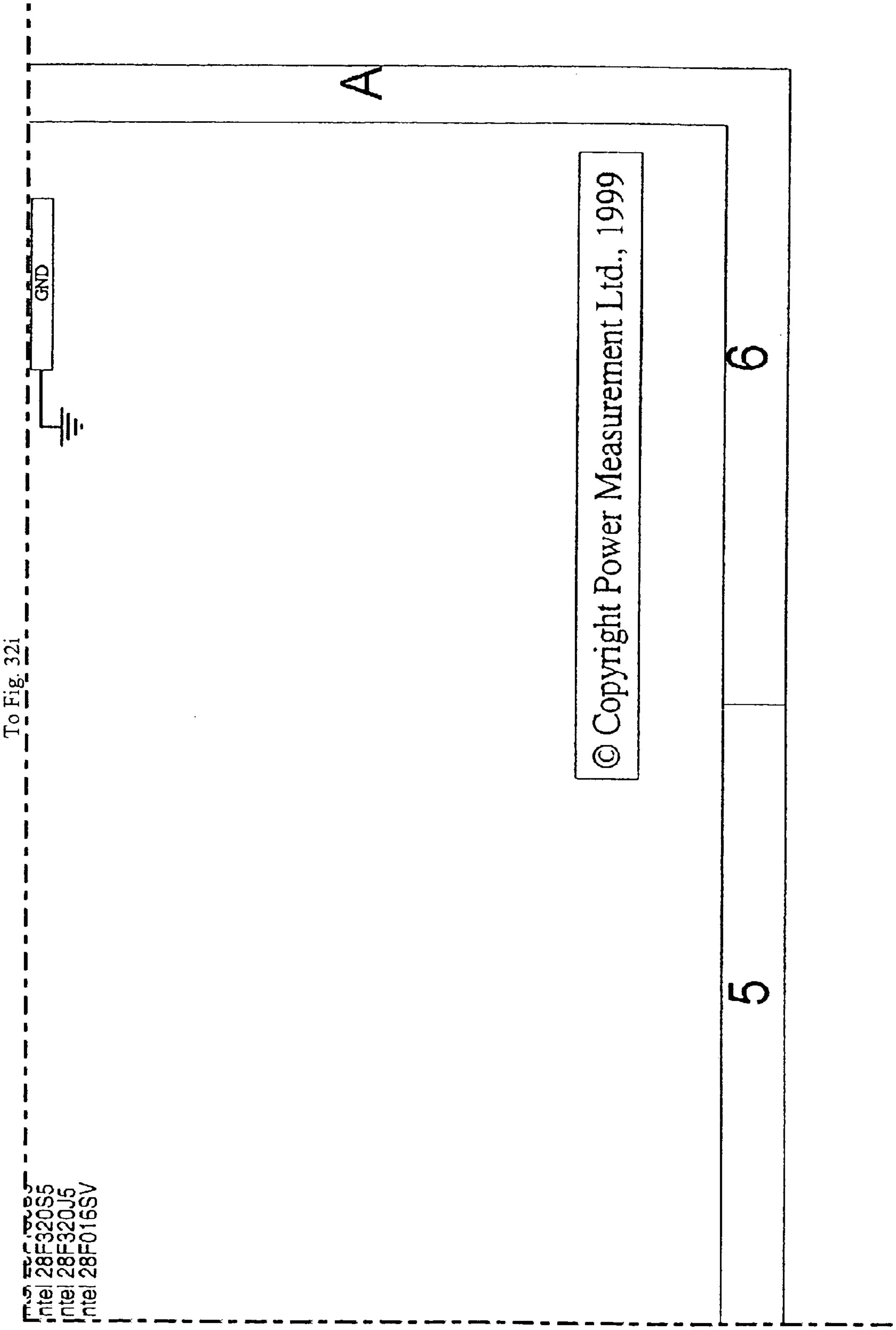
Figure 33A:
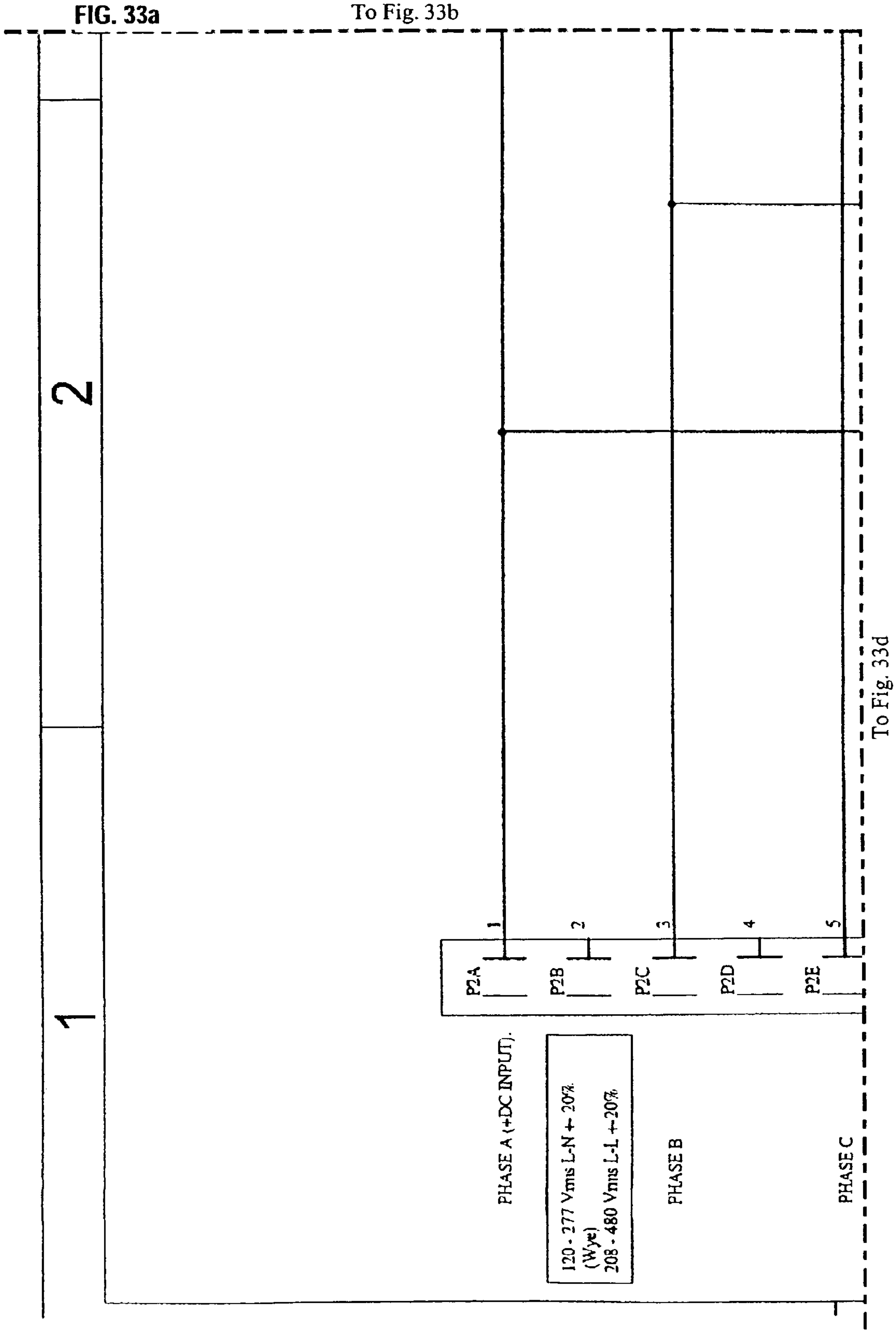
FIGS. 33A–33L depict a schematic diagram of an exemplary power supply filter board of one preferred embodiment.
Figure 33B:
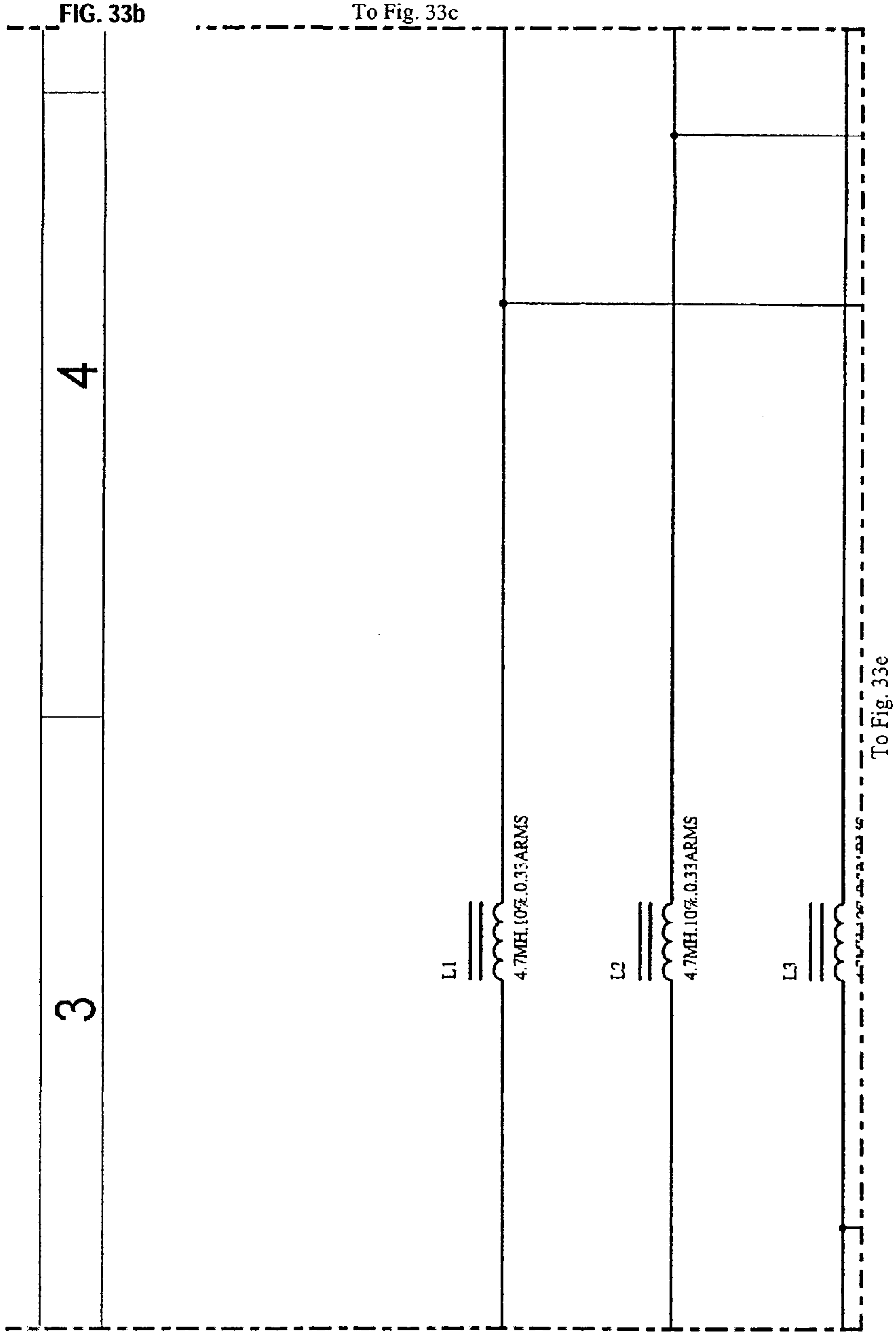
Figure 33C:
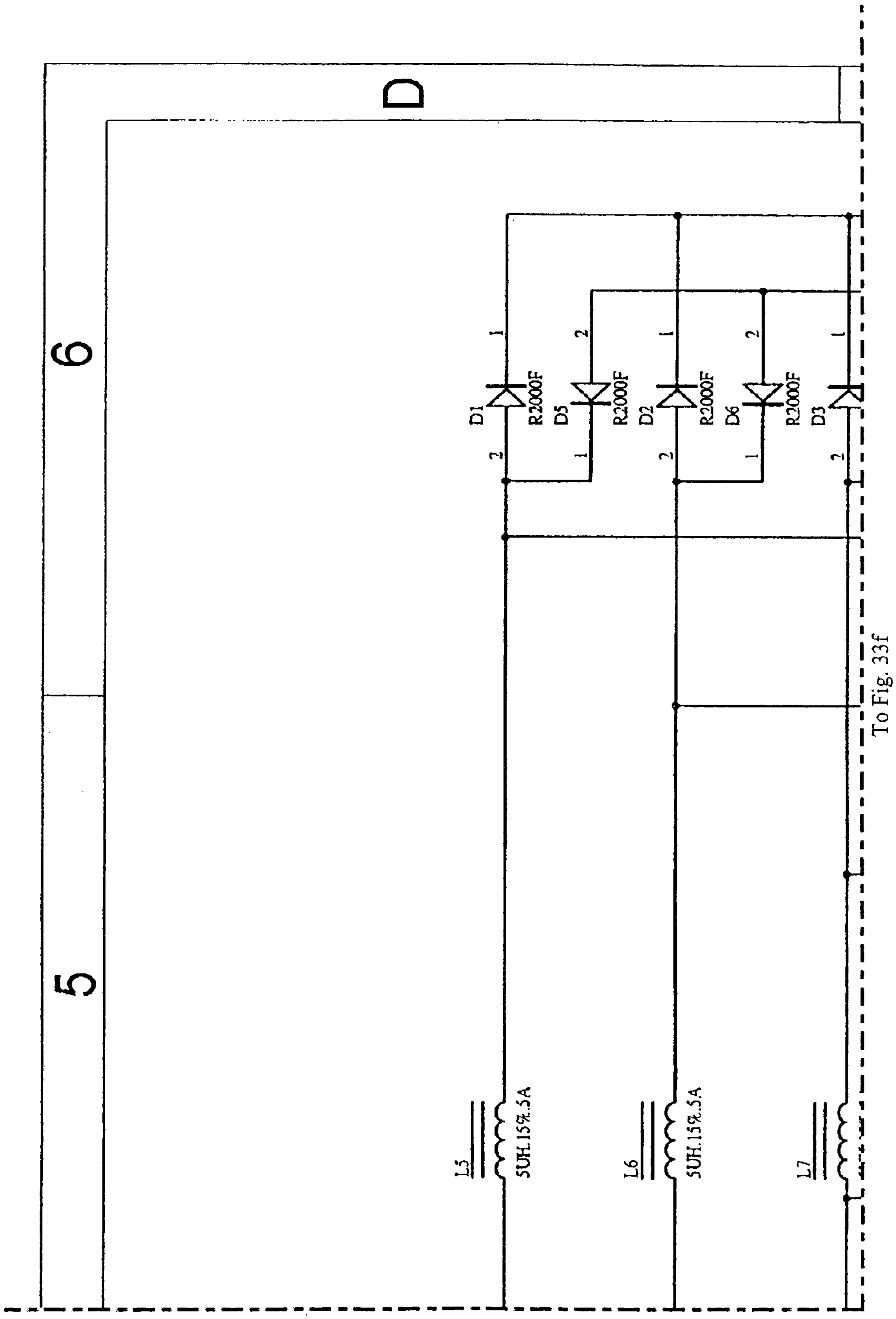
Figure 33D:
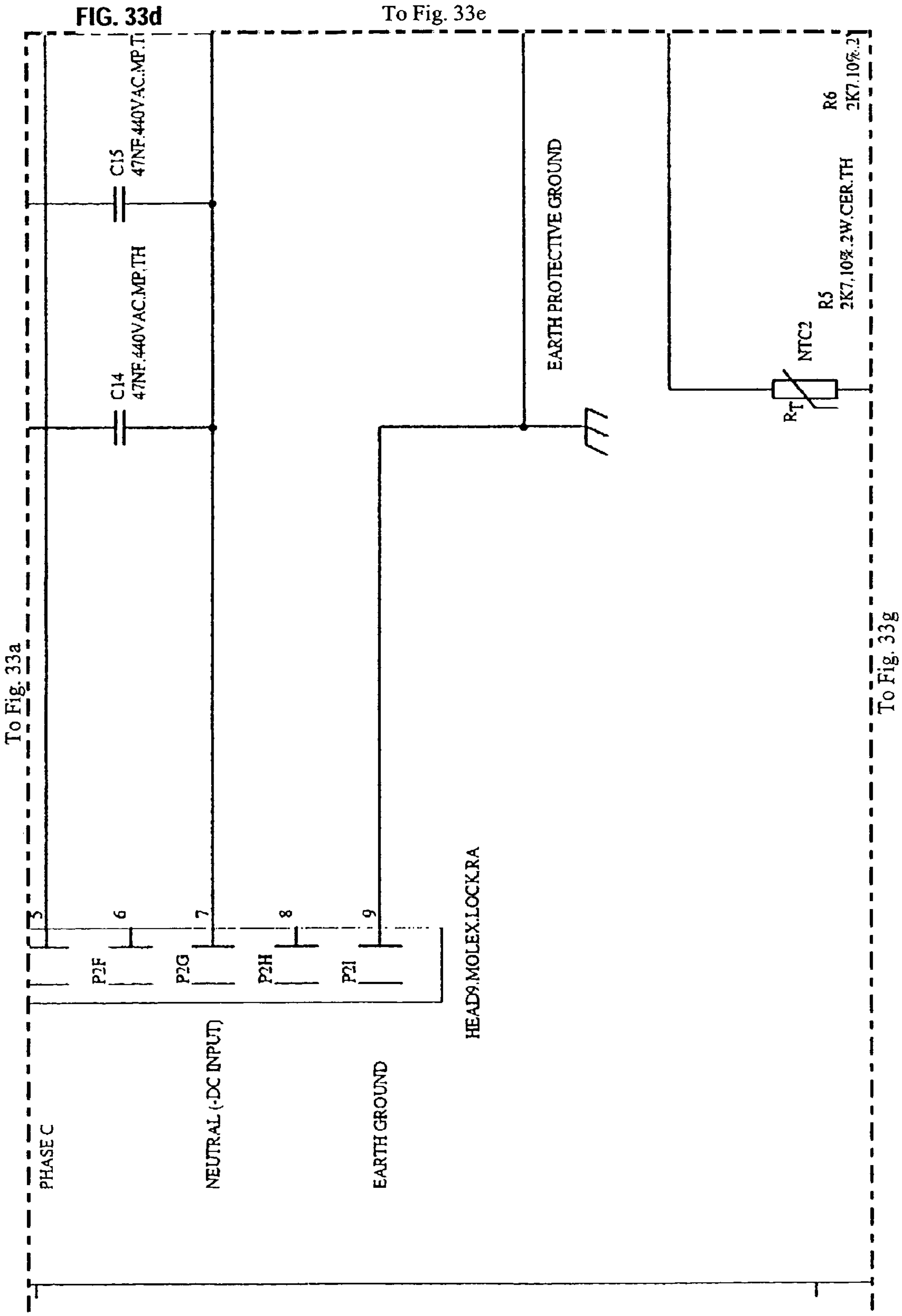
Figure 33E:
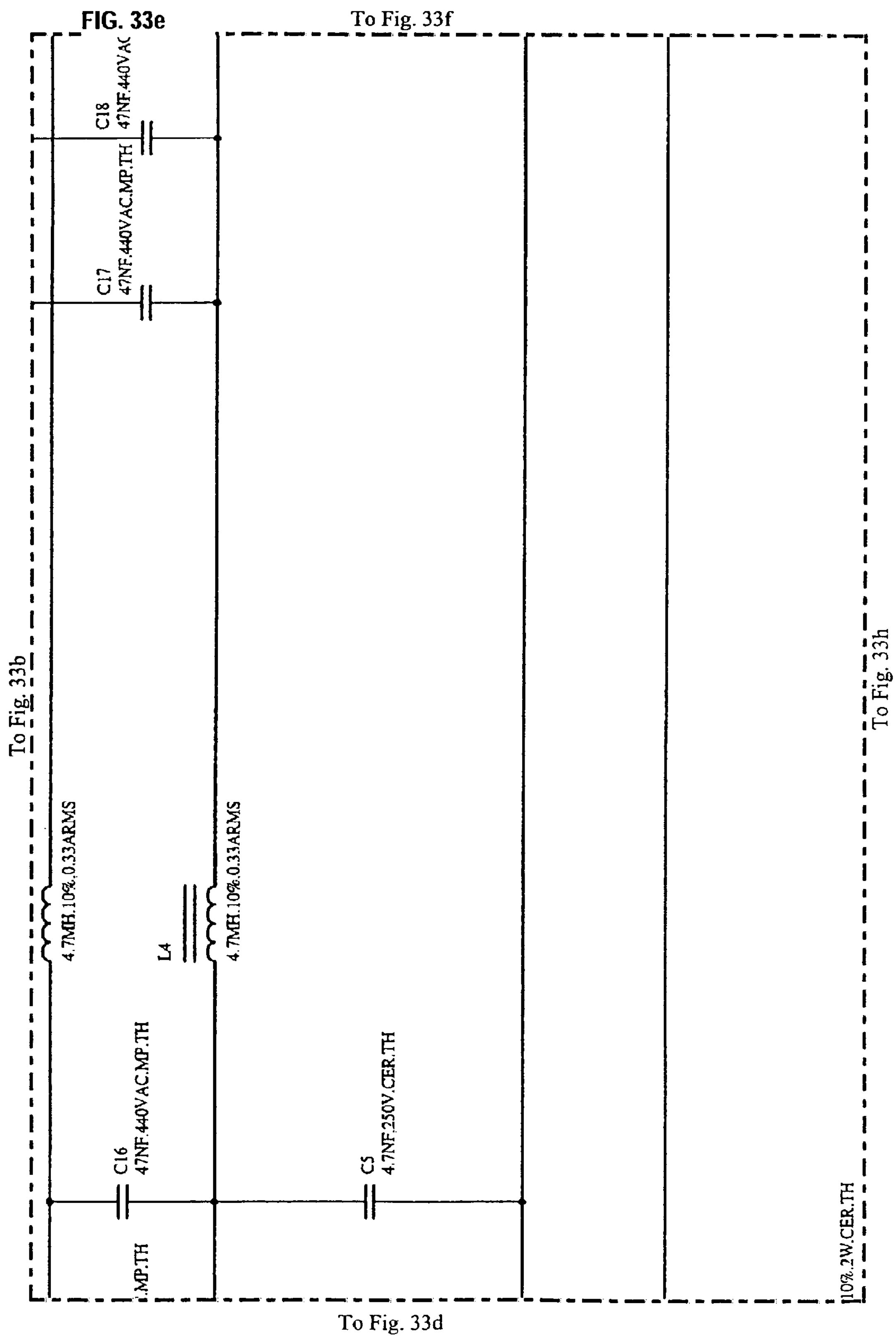
Figure 33F:
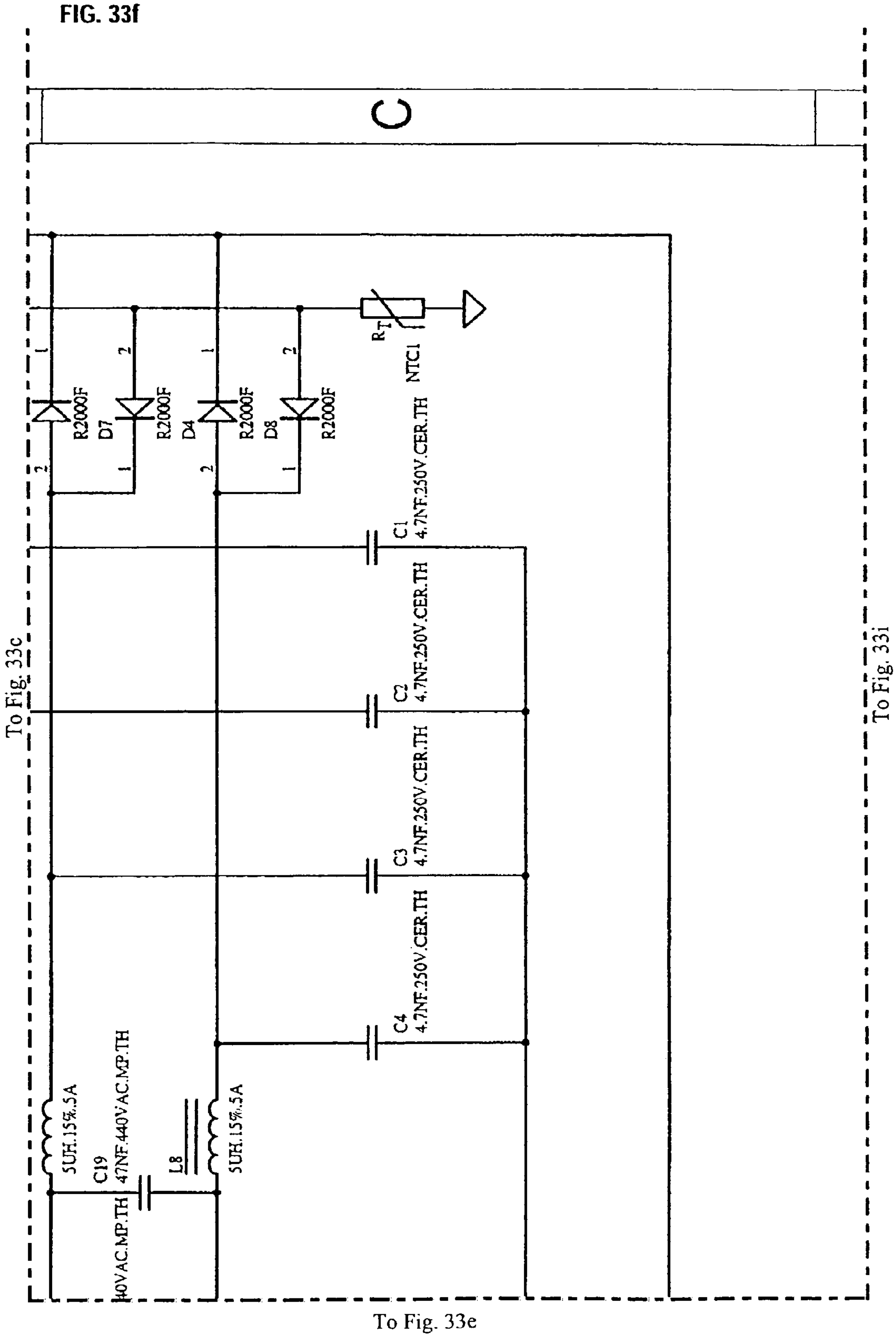
Figure 33G:
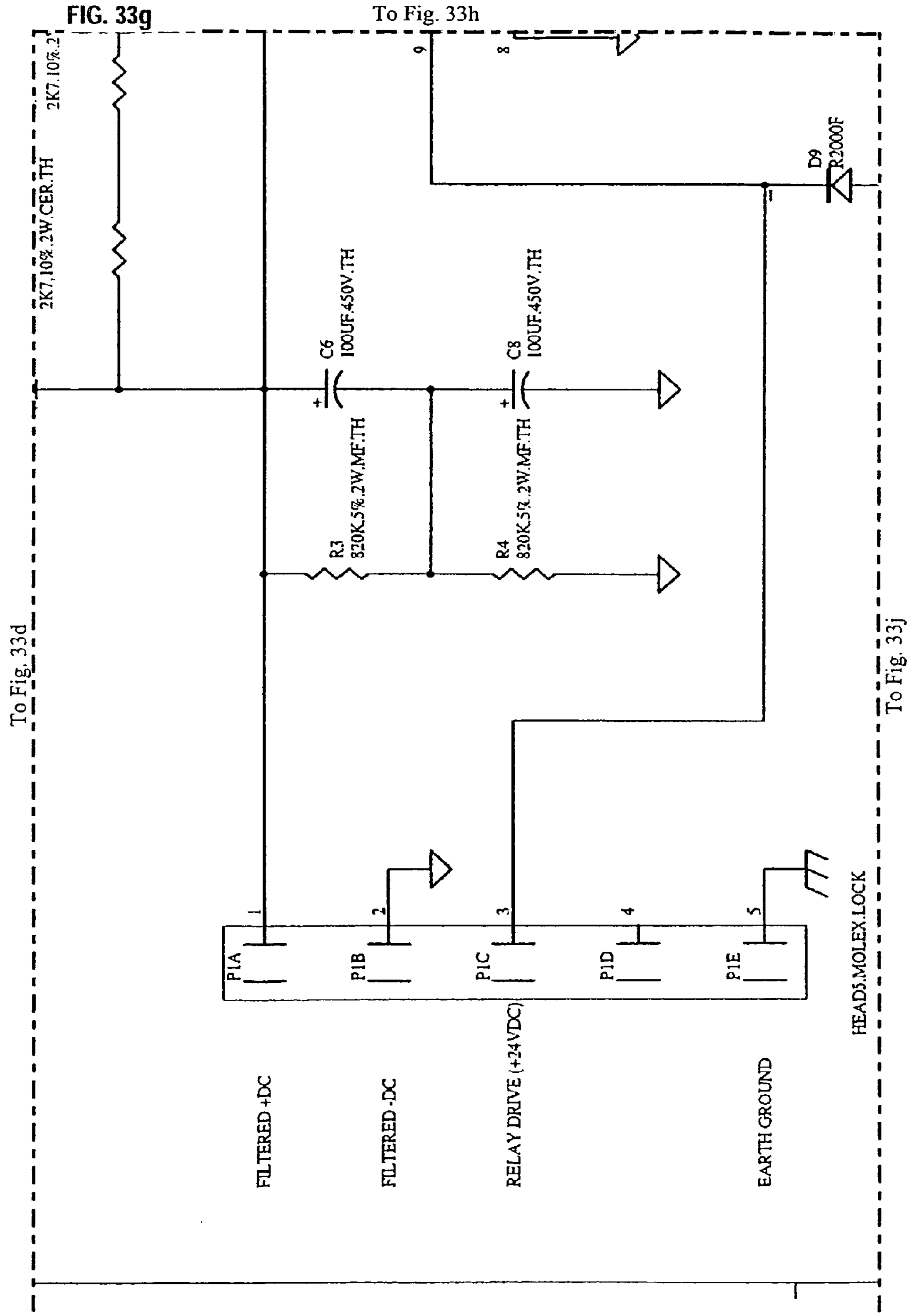
Figure 33H:
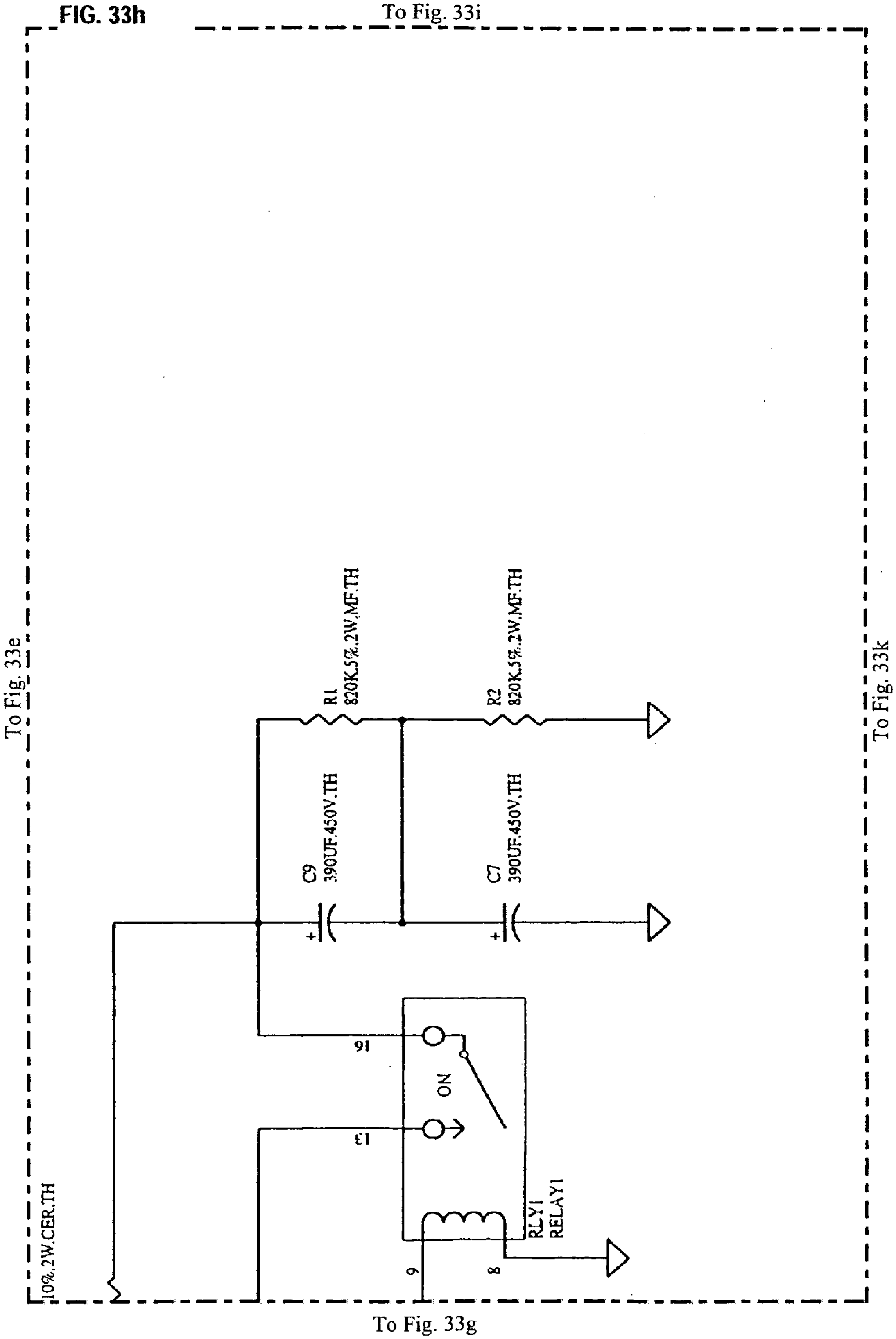
Figure 33I:
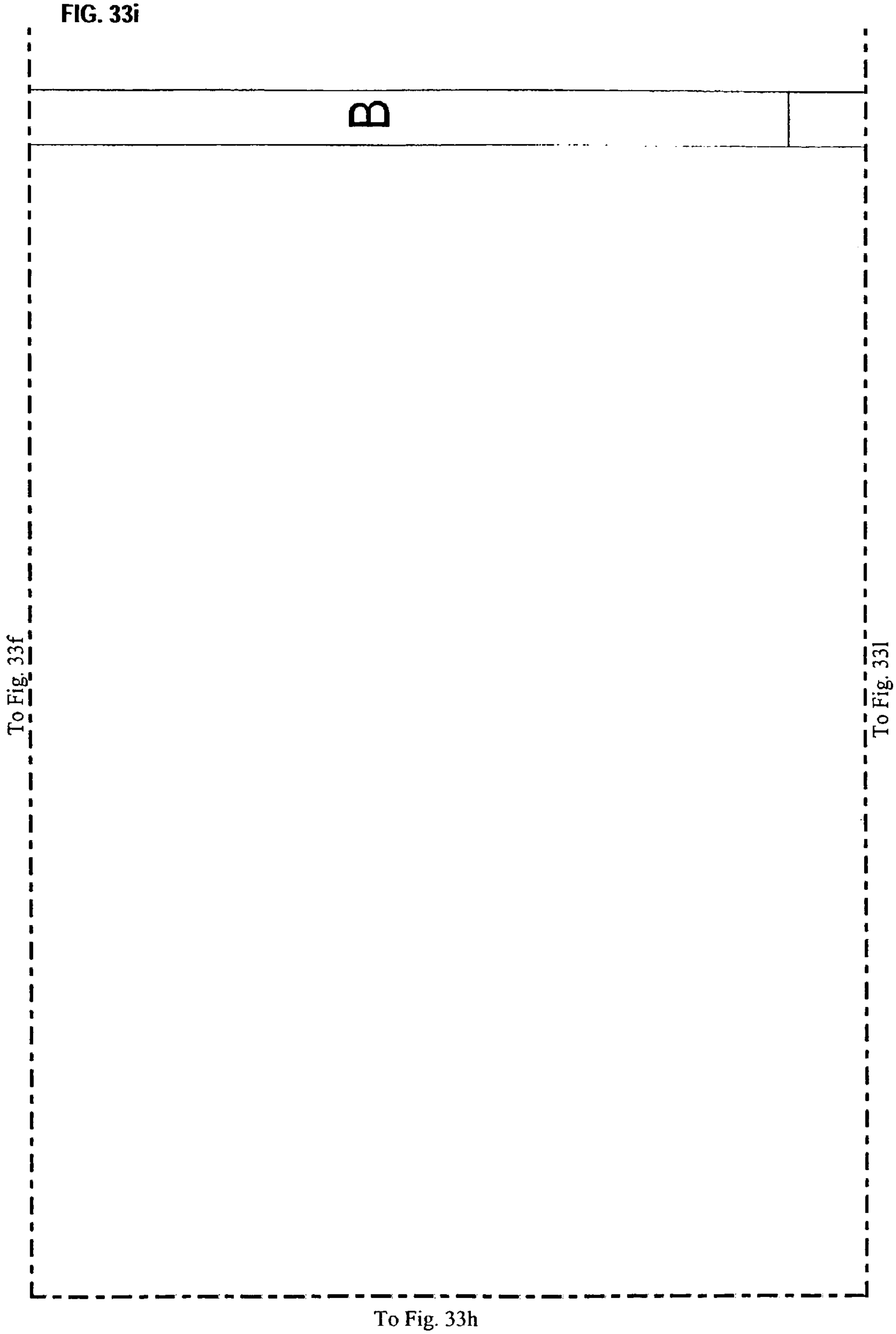
Figure 33J:
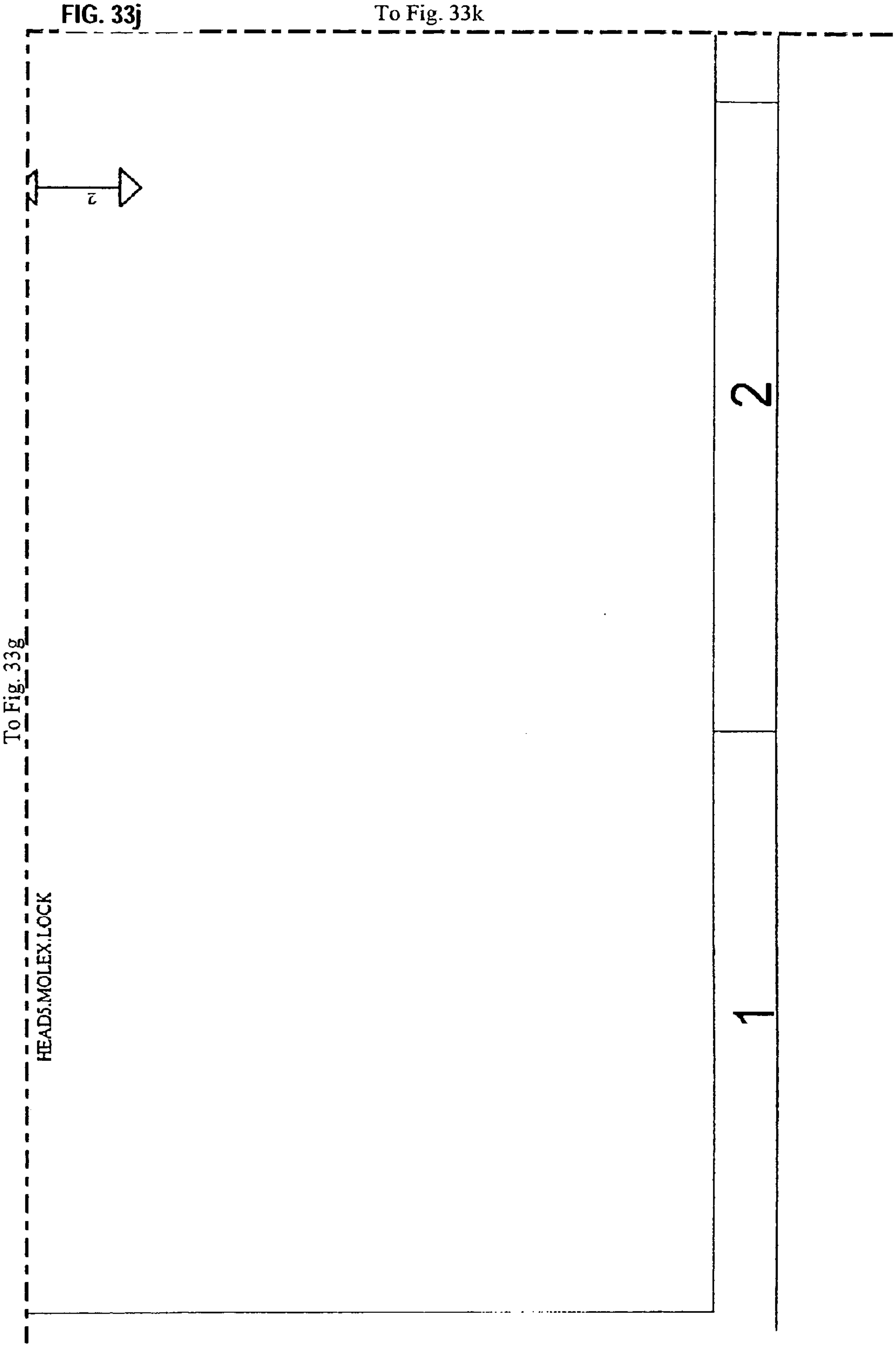
Figure 33K:
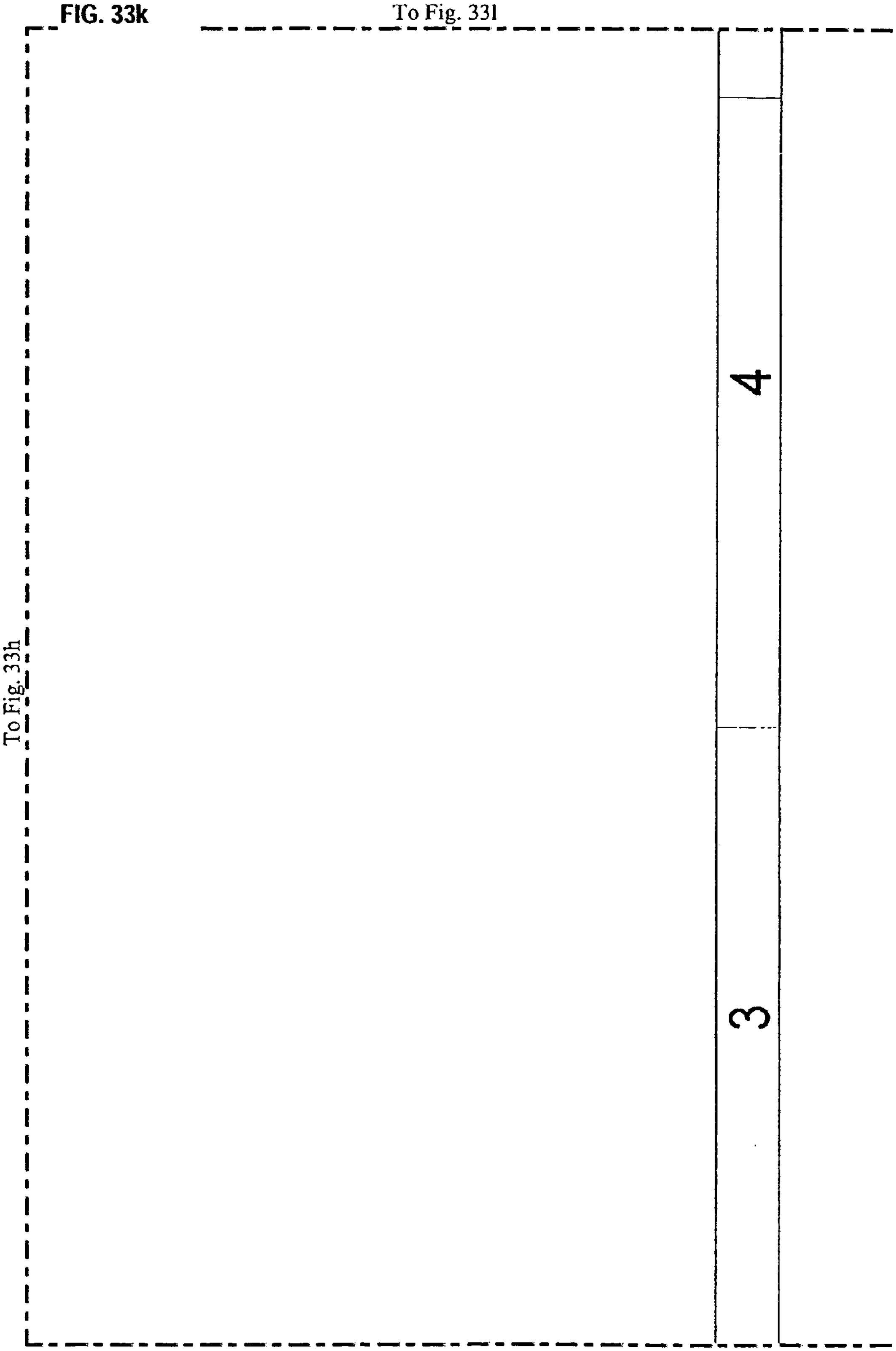
Figure 33L:
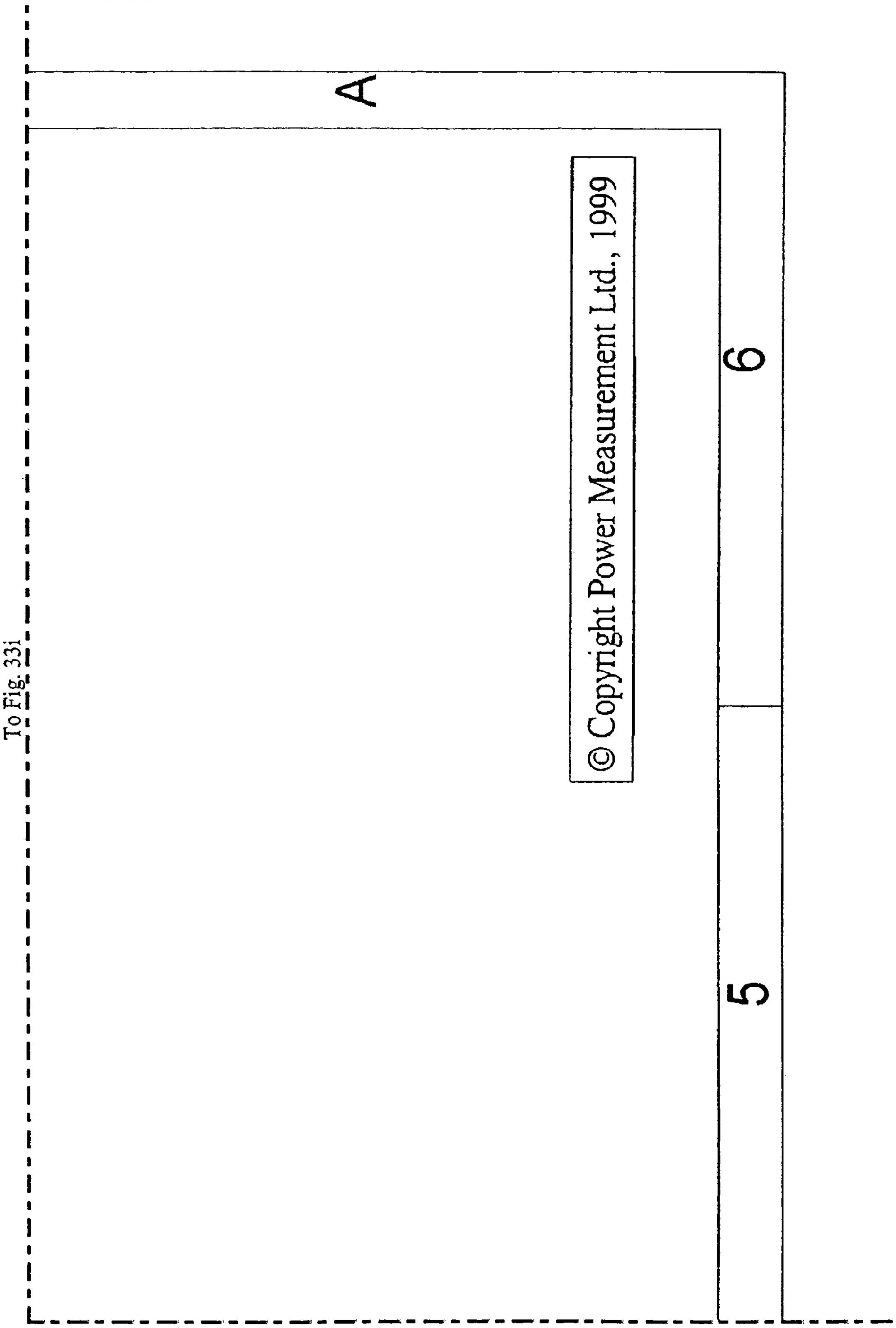
Figure 34A:
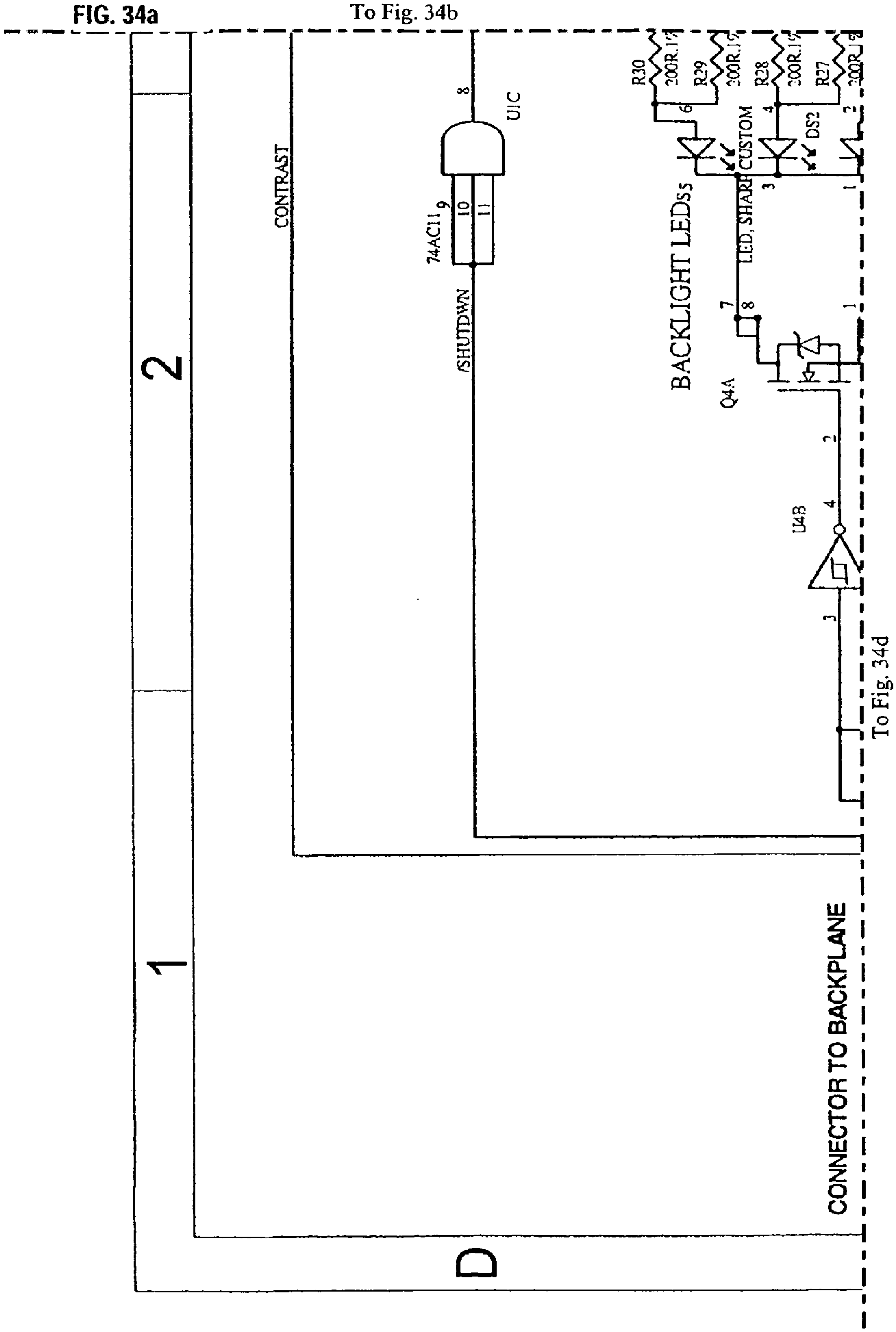
FIGS. 34A–34L depict a schematic diagram of an exemplary display board of one preferred embodiment.
Figure 34B:
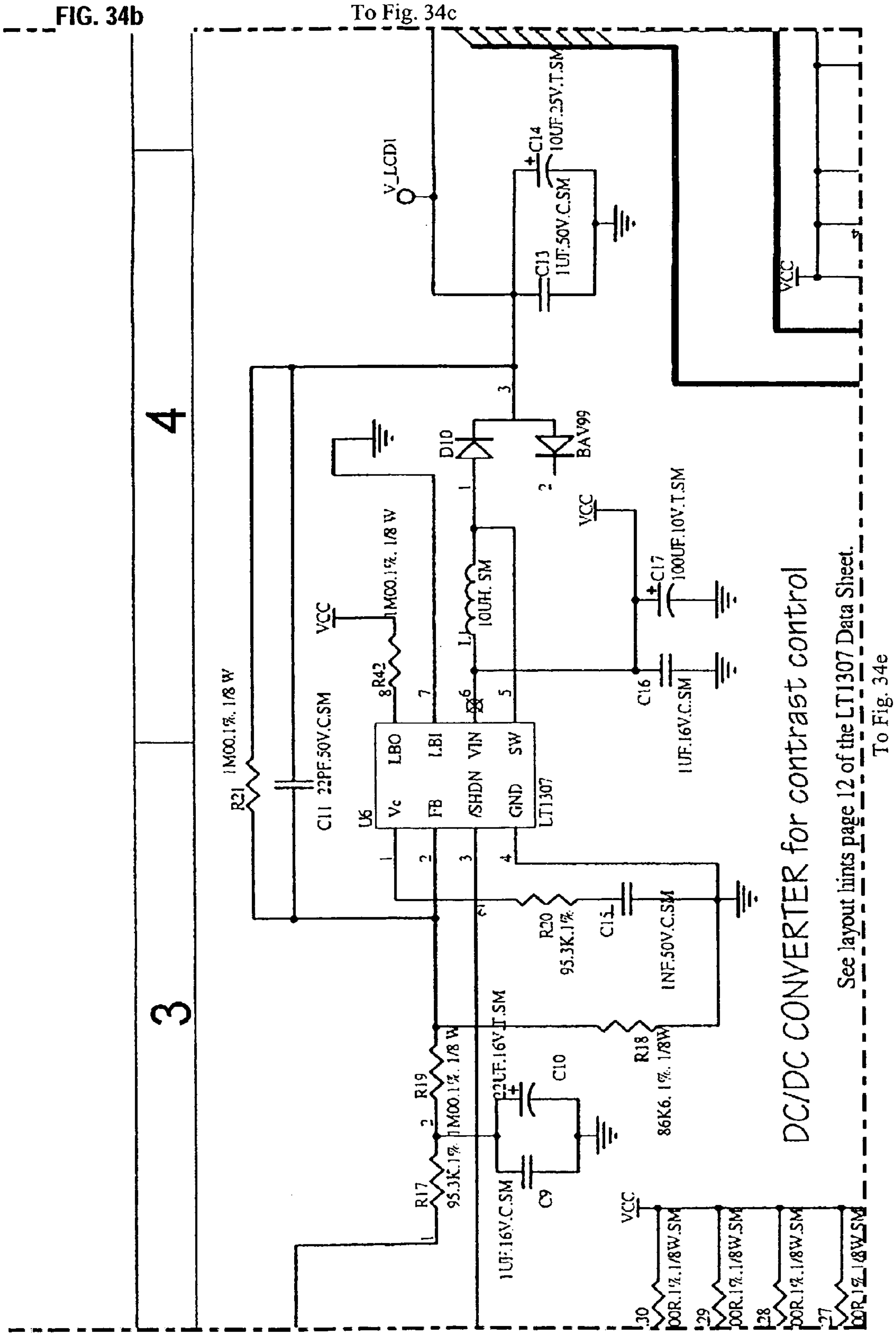
Figure 34C:
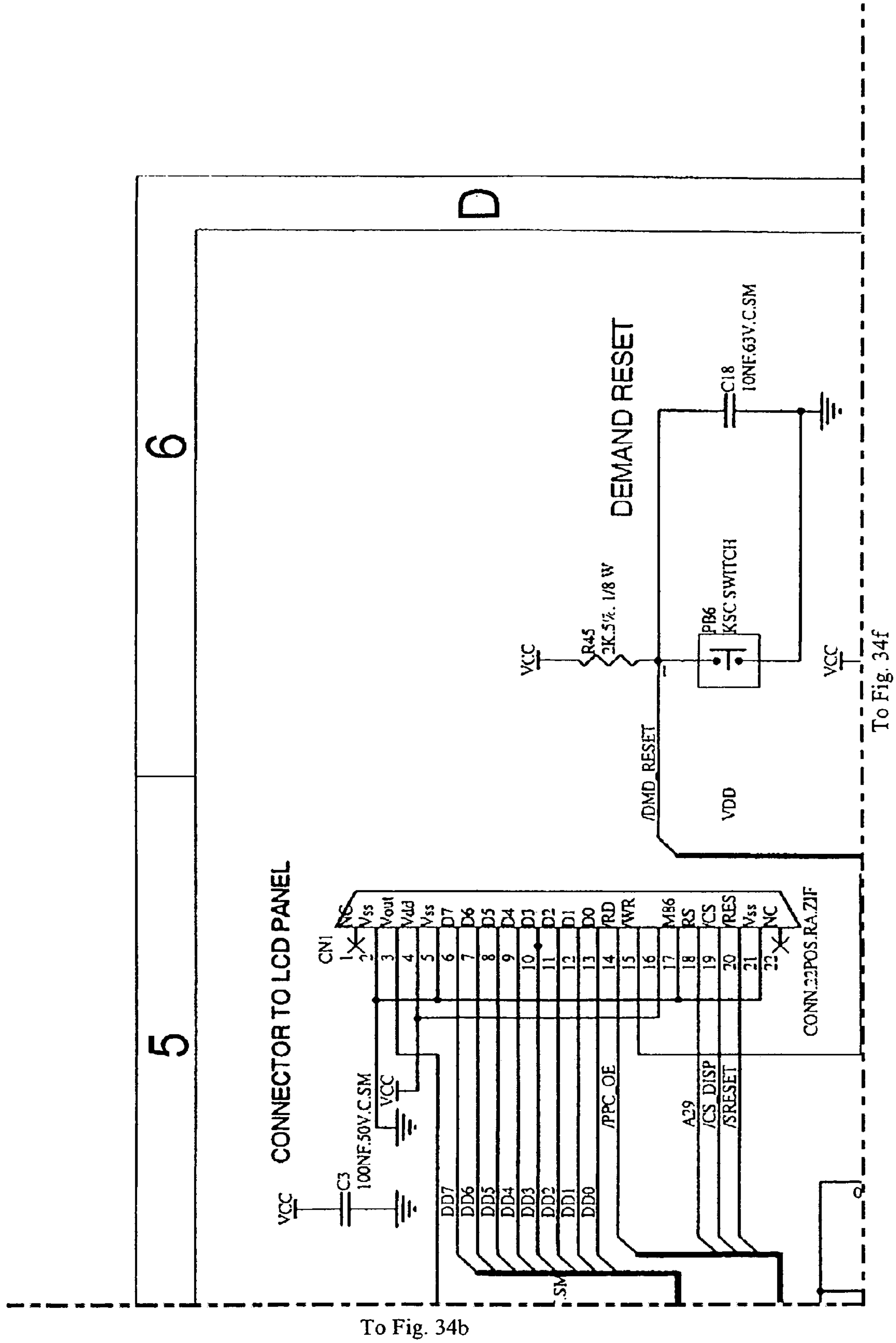
Figure 34D:
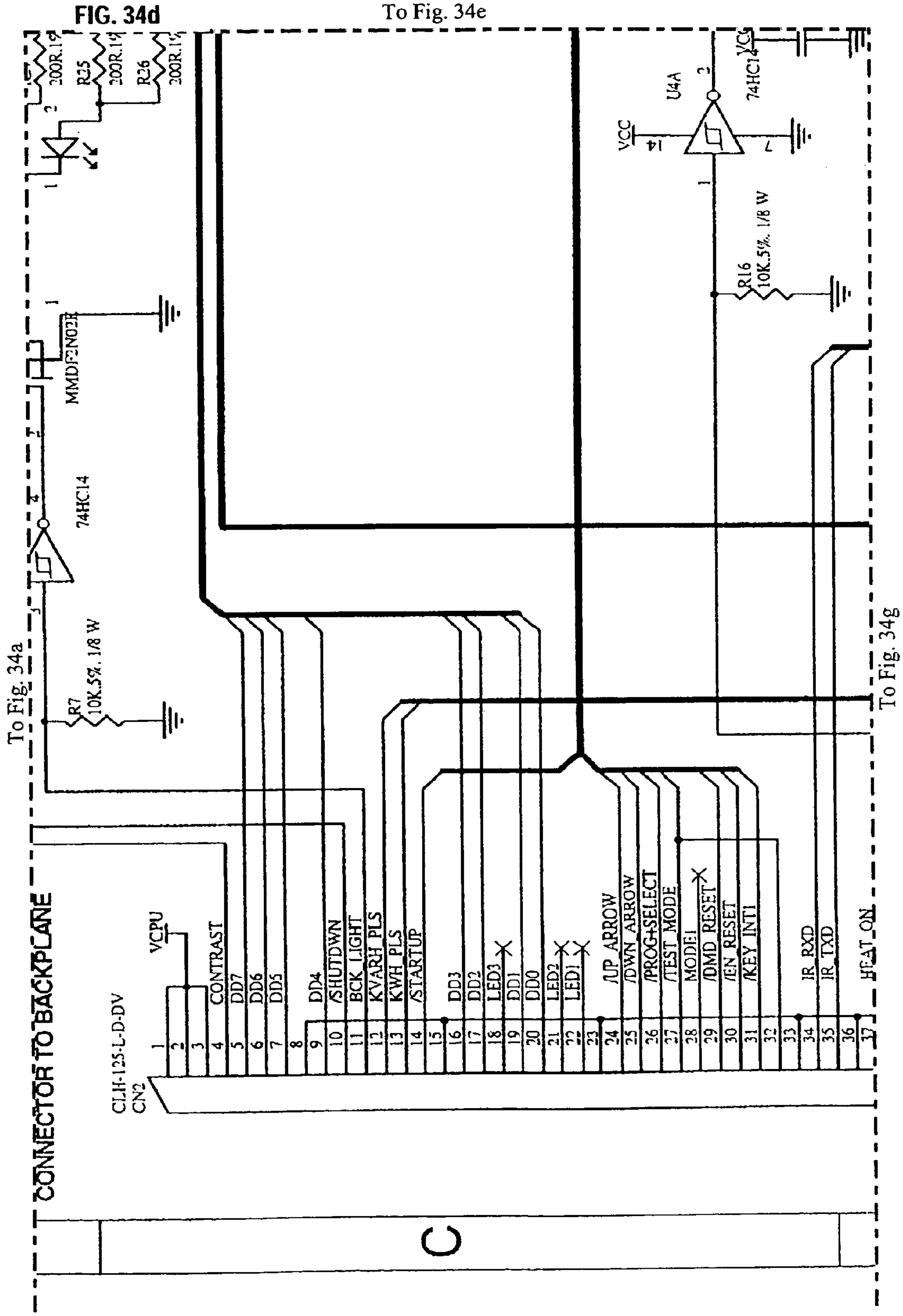
Figure 34E:
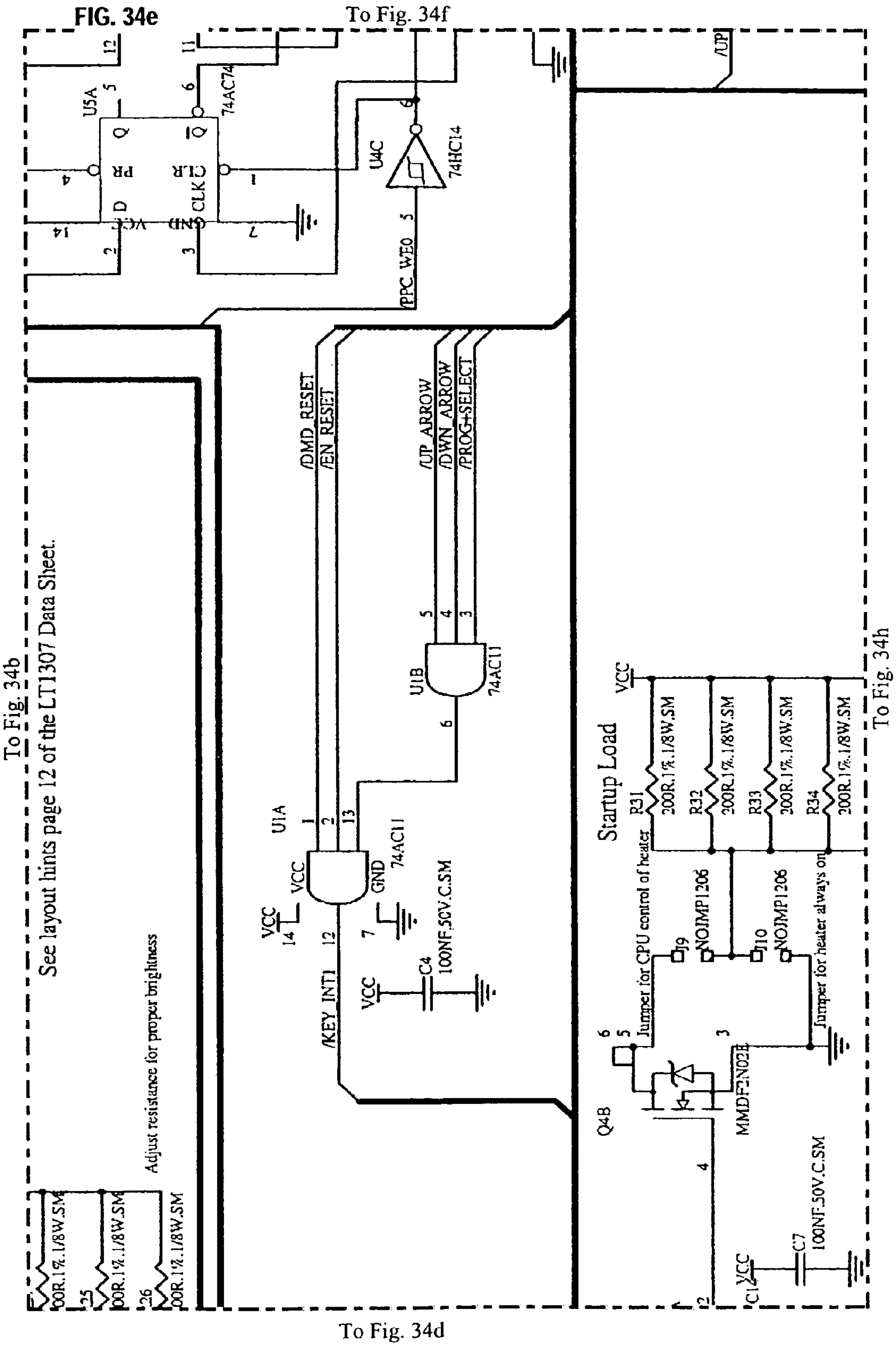
Figure 34F:
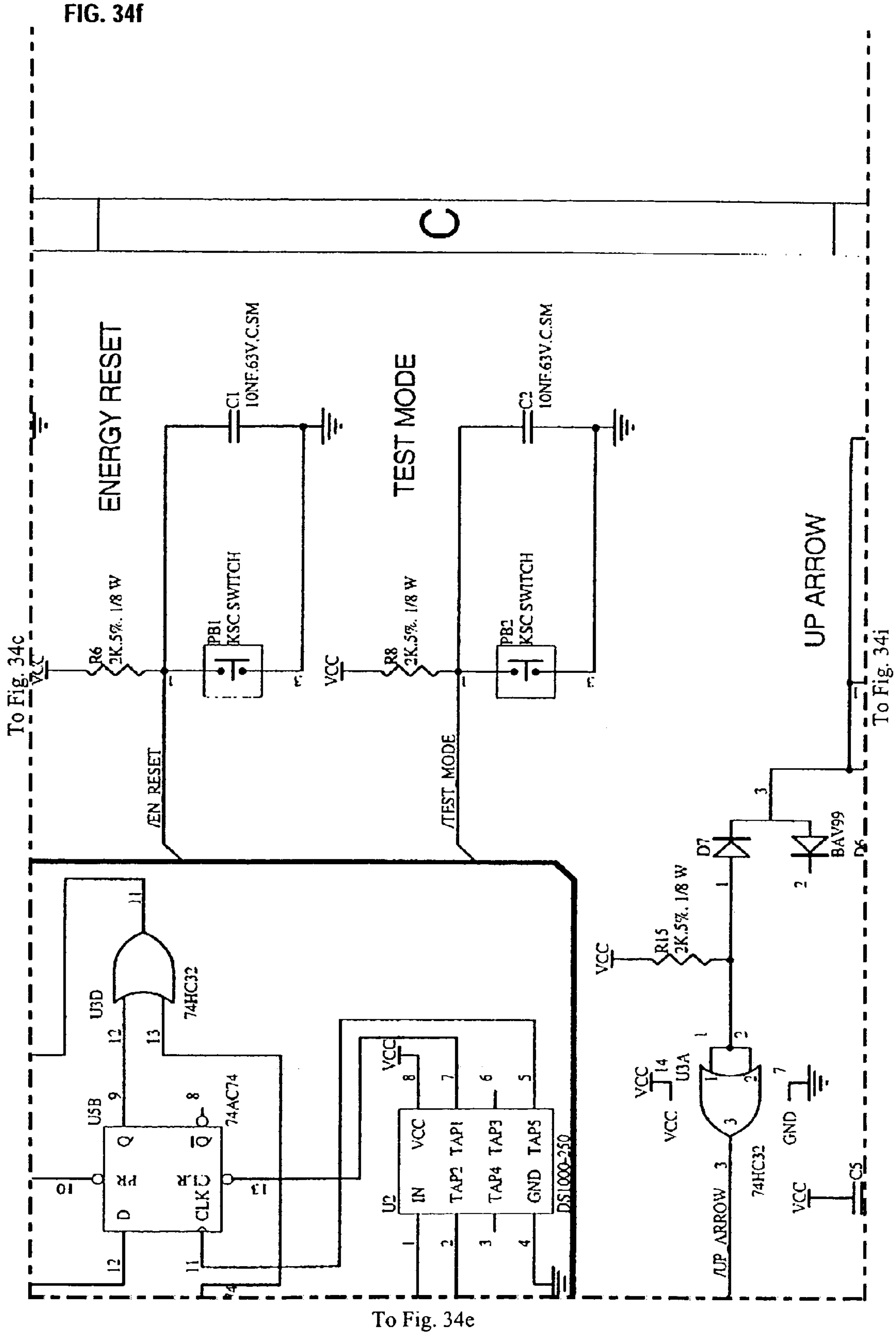
Figure 34G:
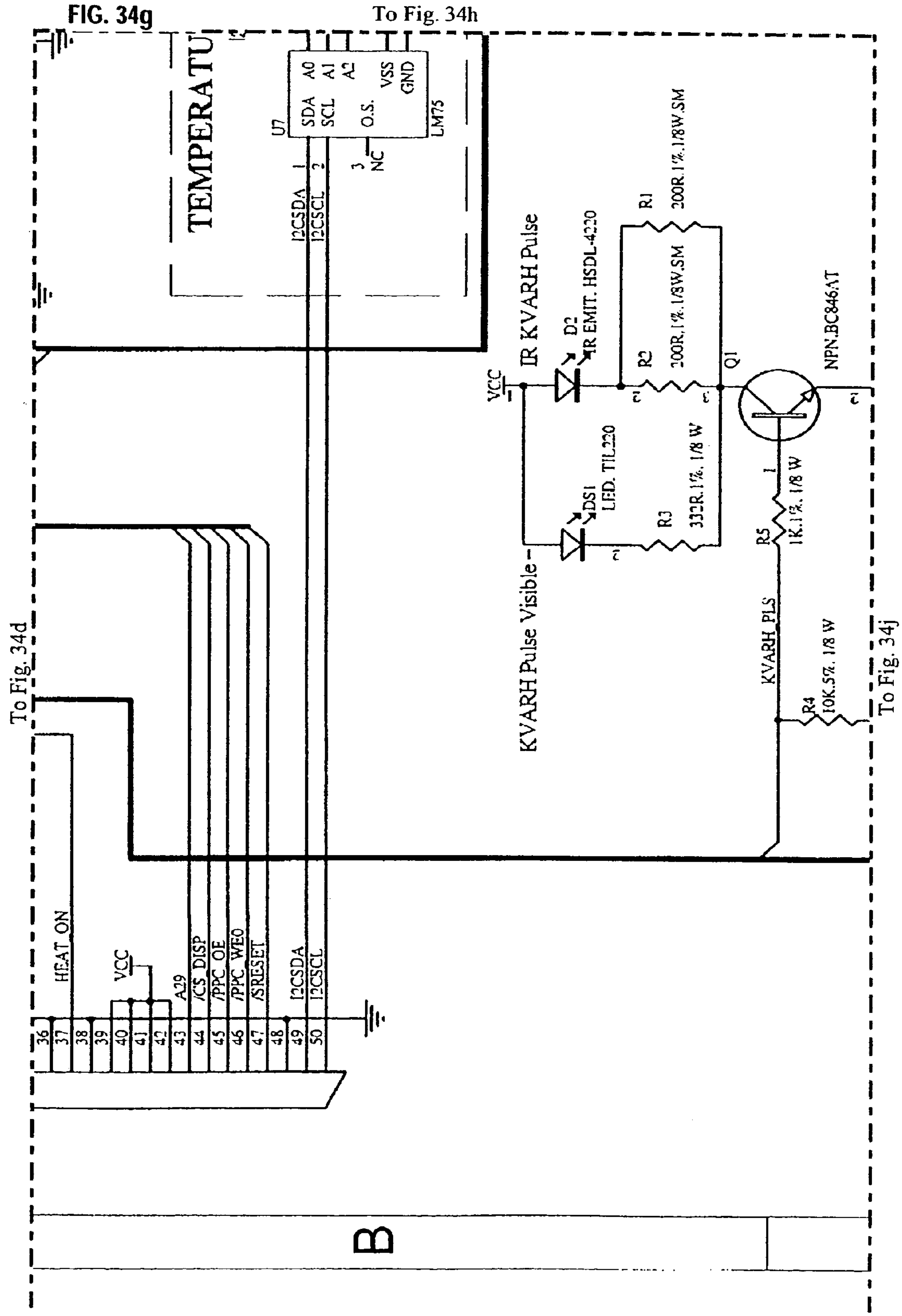
Figure 34H:
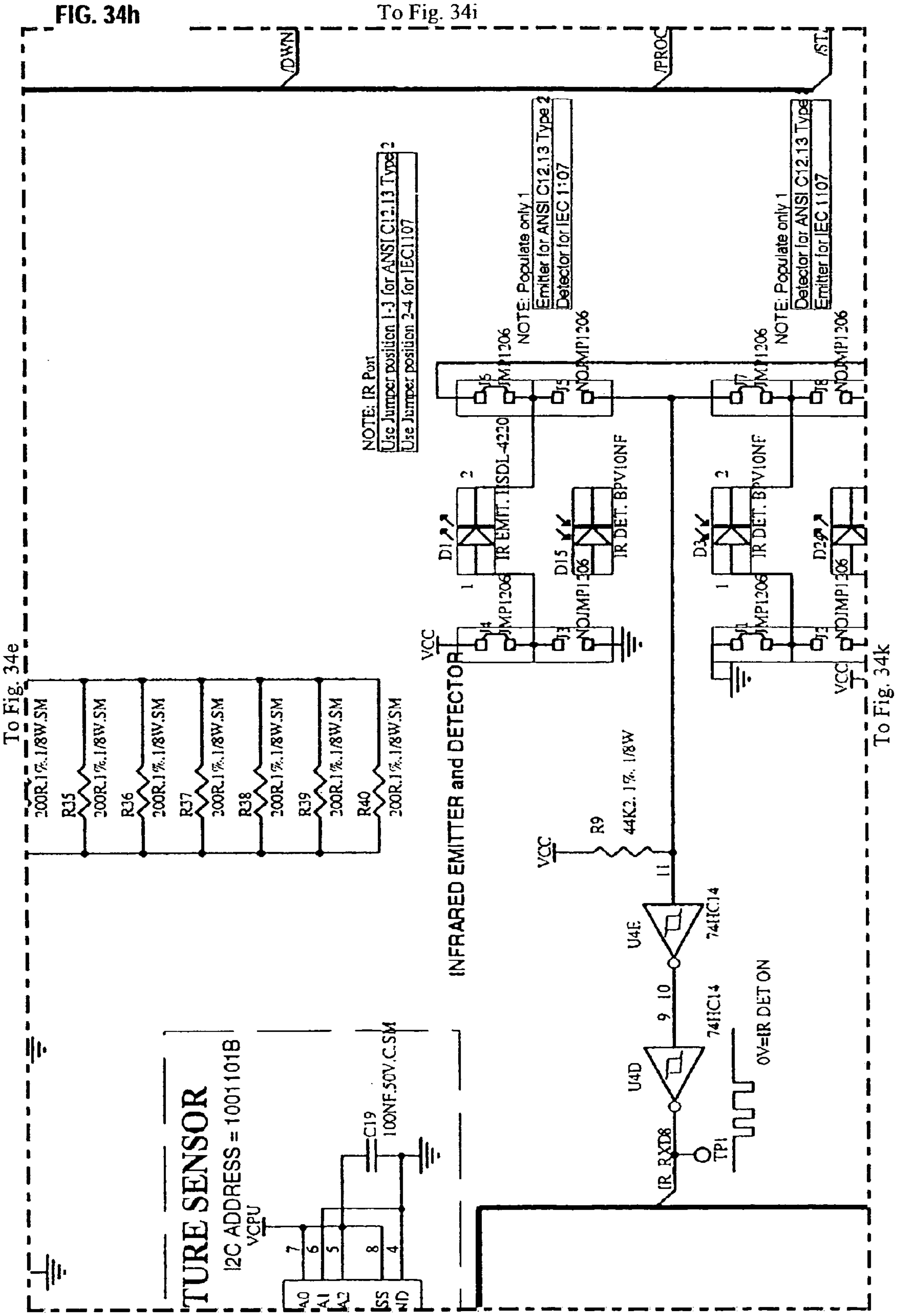
Figure 34I:
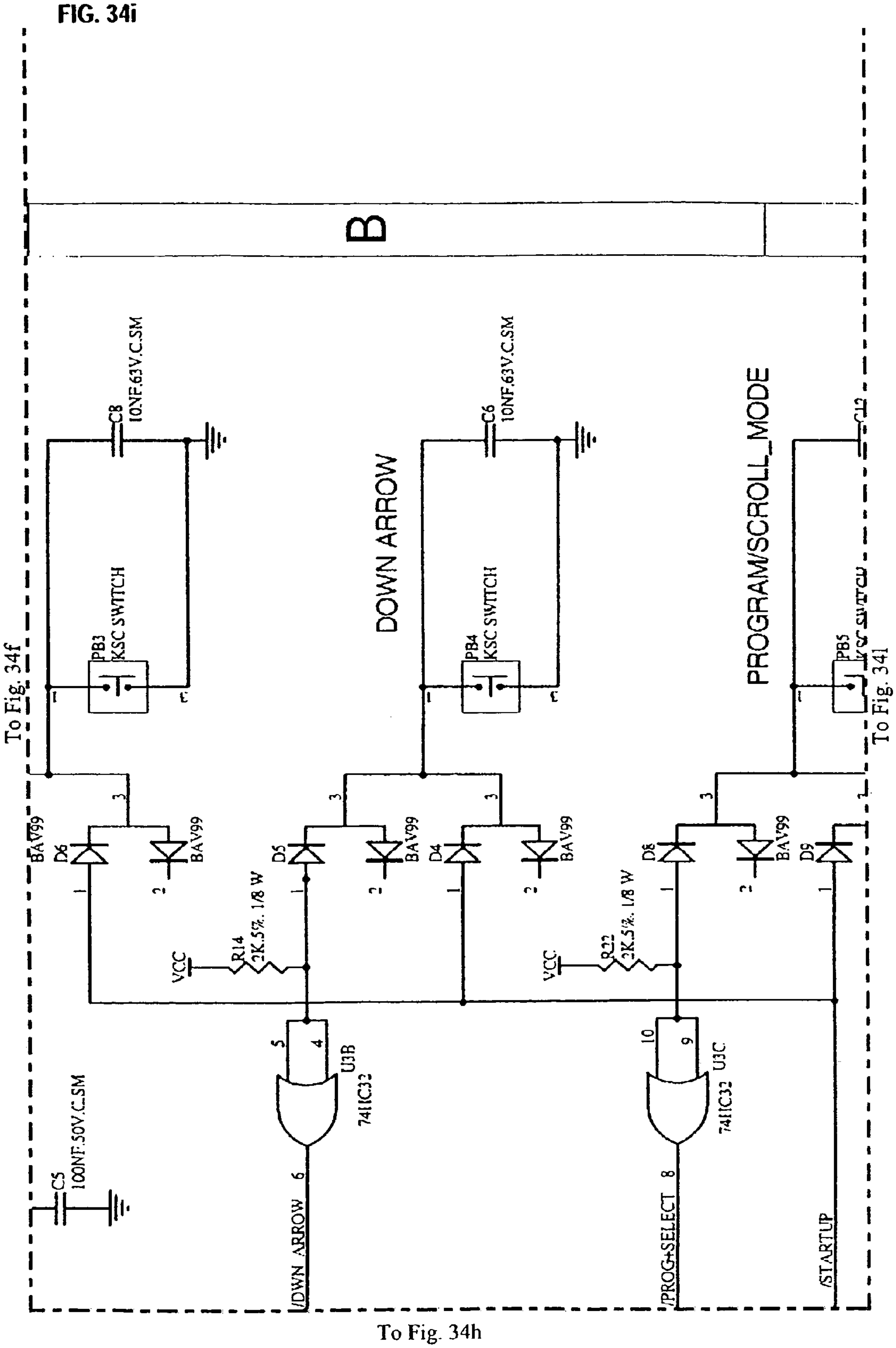
Figure 34J:
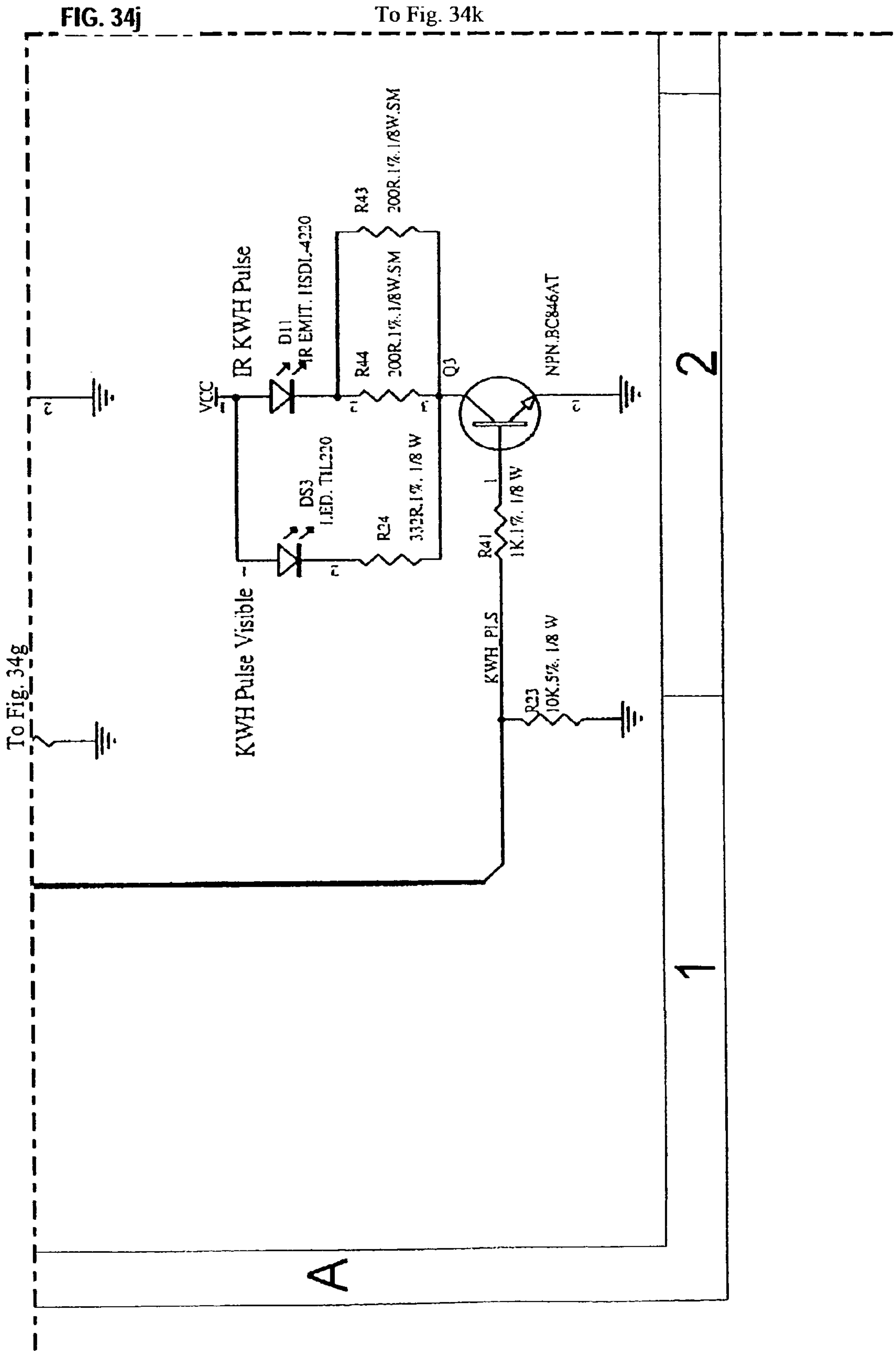
Figure 34K:
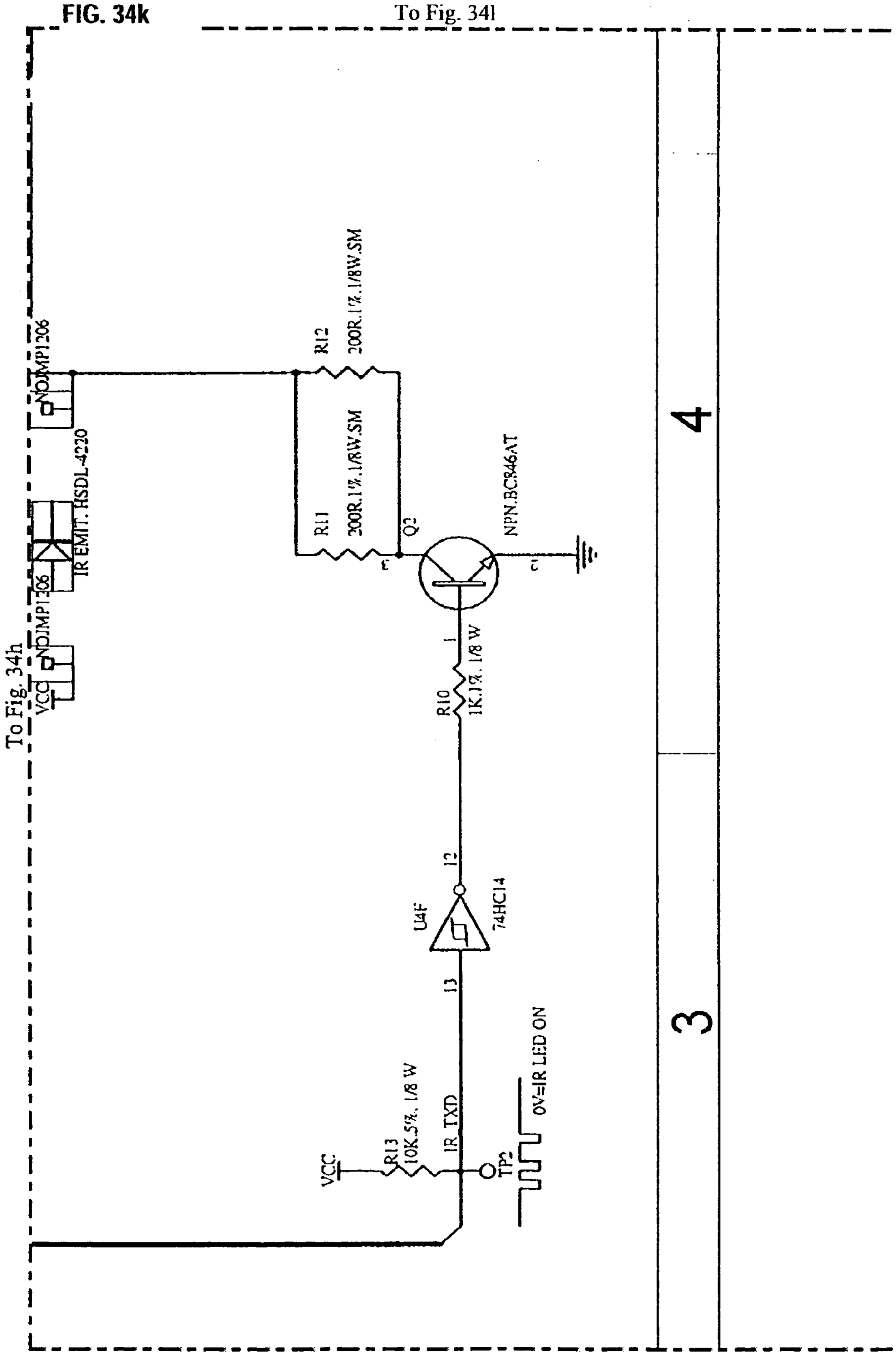
Figure 34L:
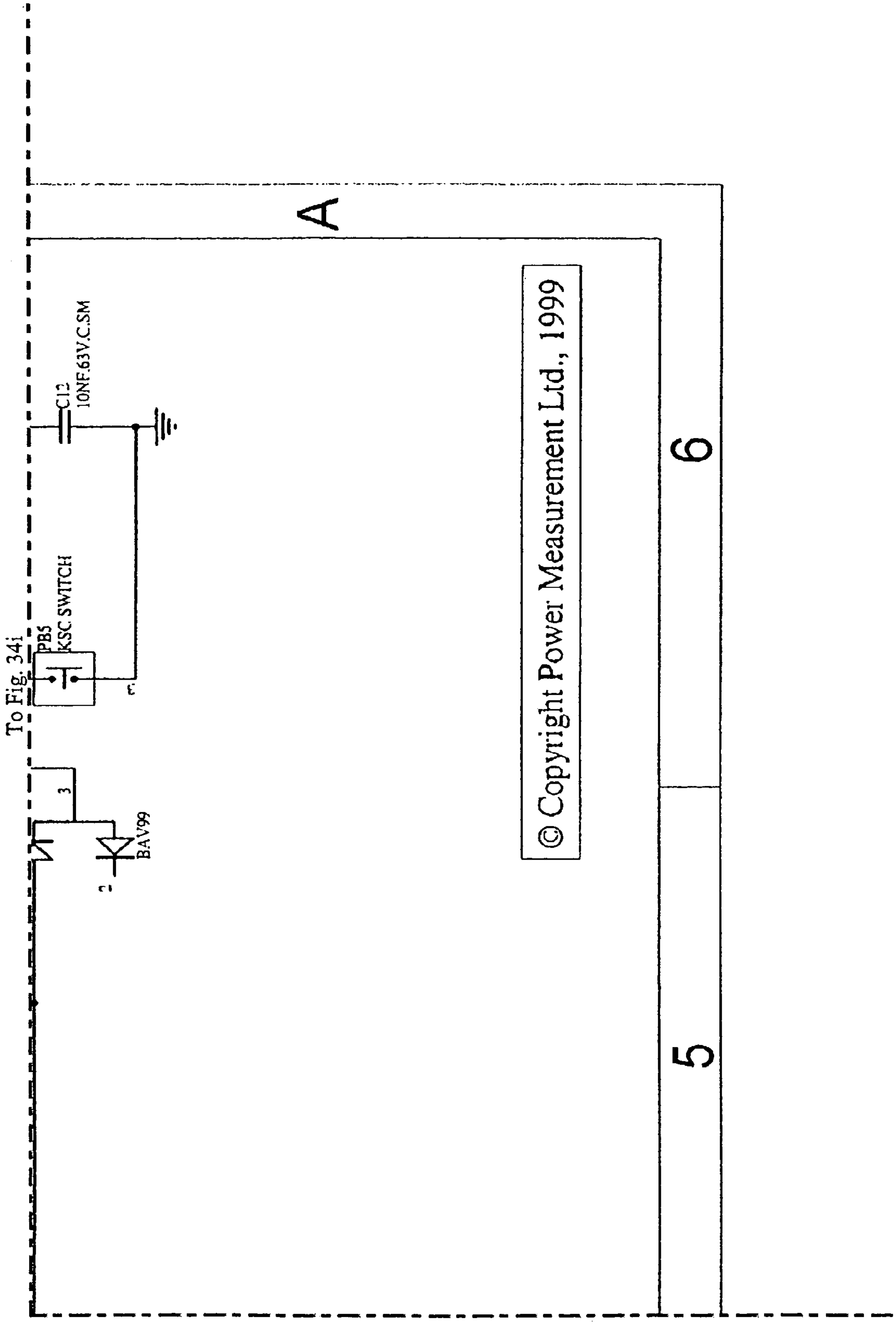
Figure 35A:
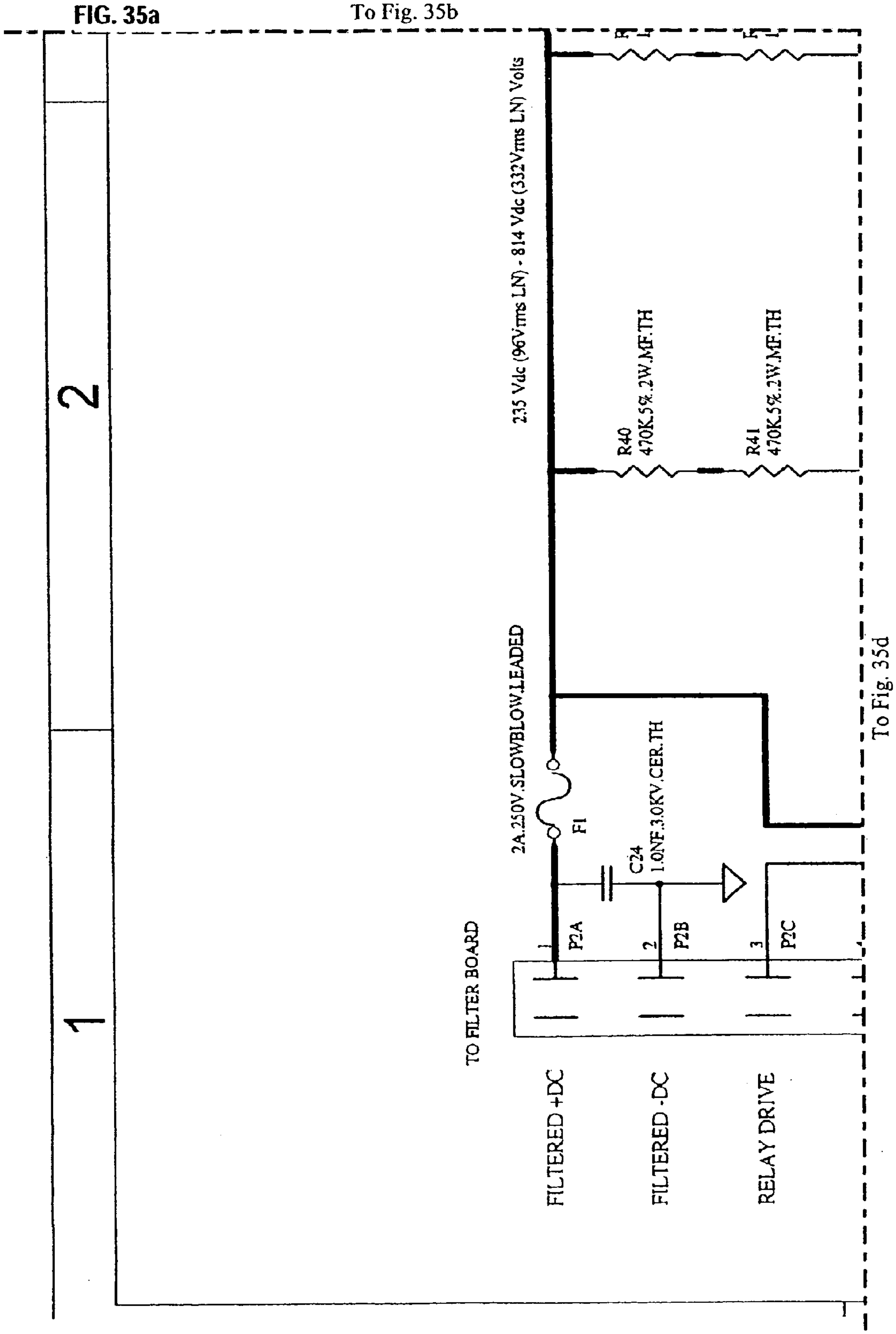
FIGS. 35A–35L depict a schematic diagram of an exemplary power supply regulation board of one preferred embodiment.
Figure 35B:
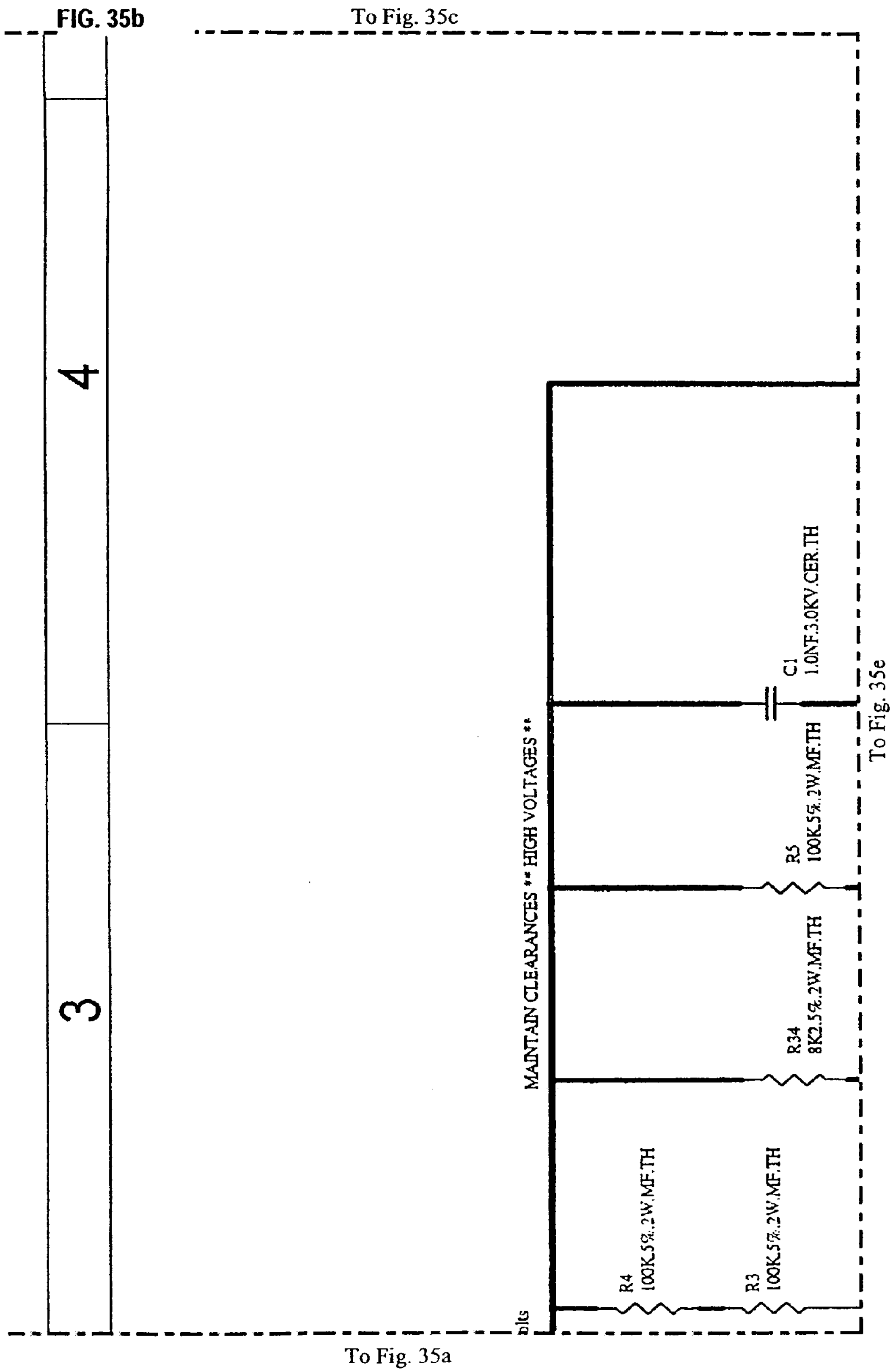
Figure 35C:
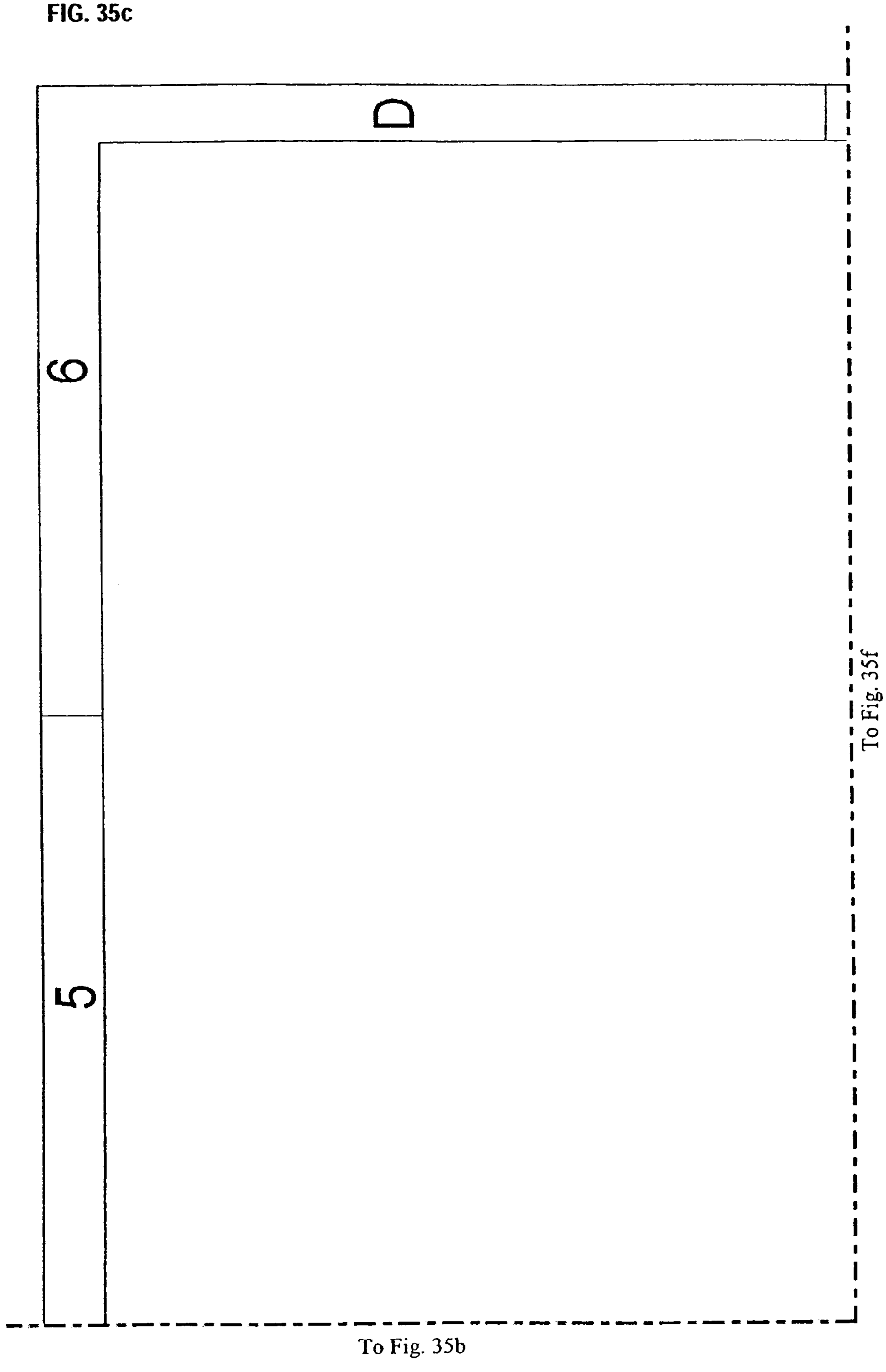
Figure 35D:
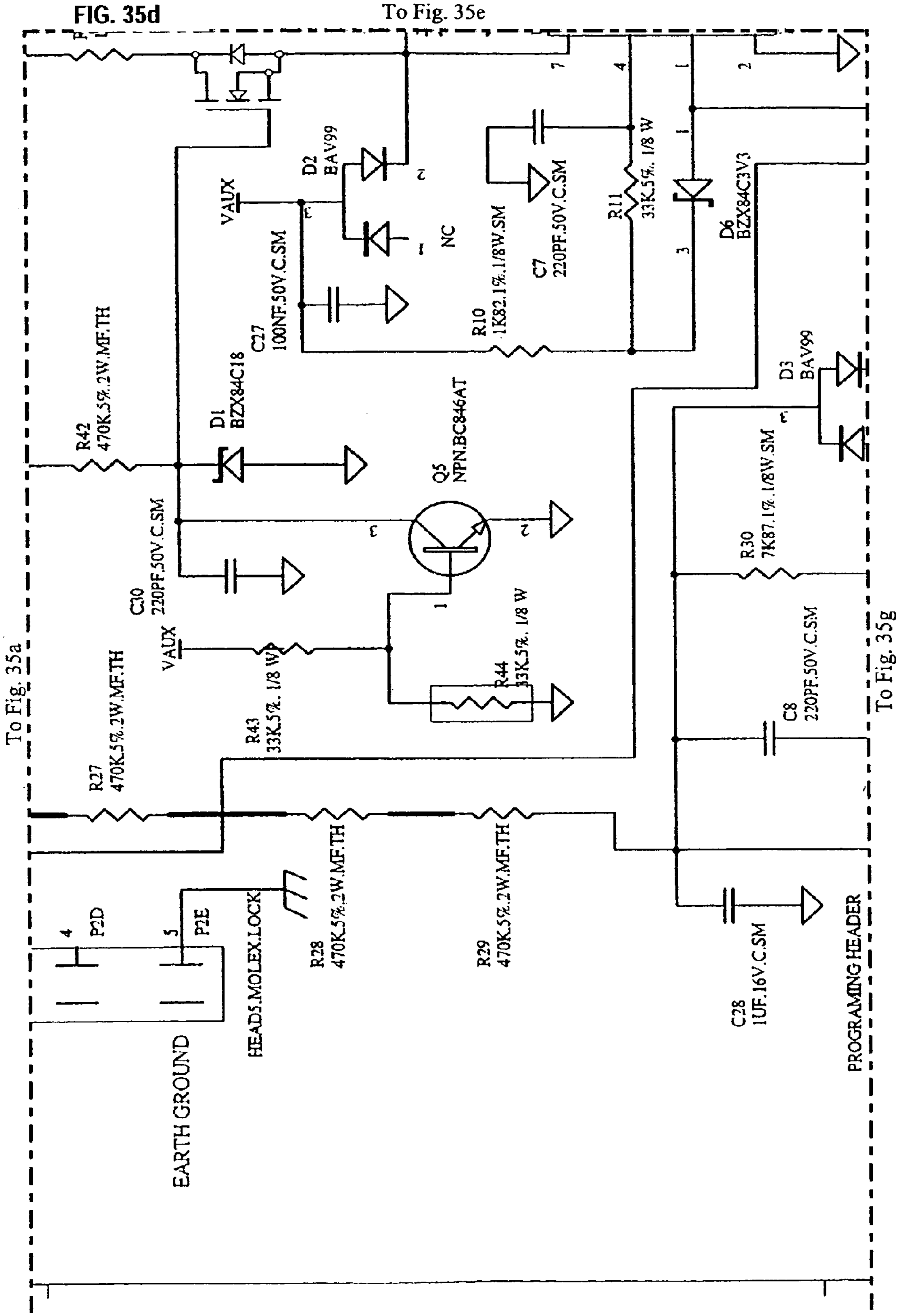
Figure 35E:
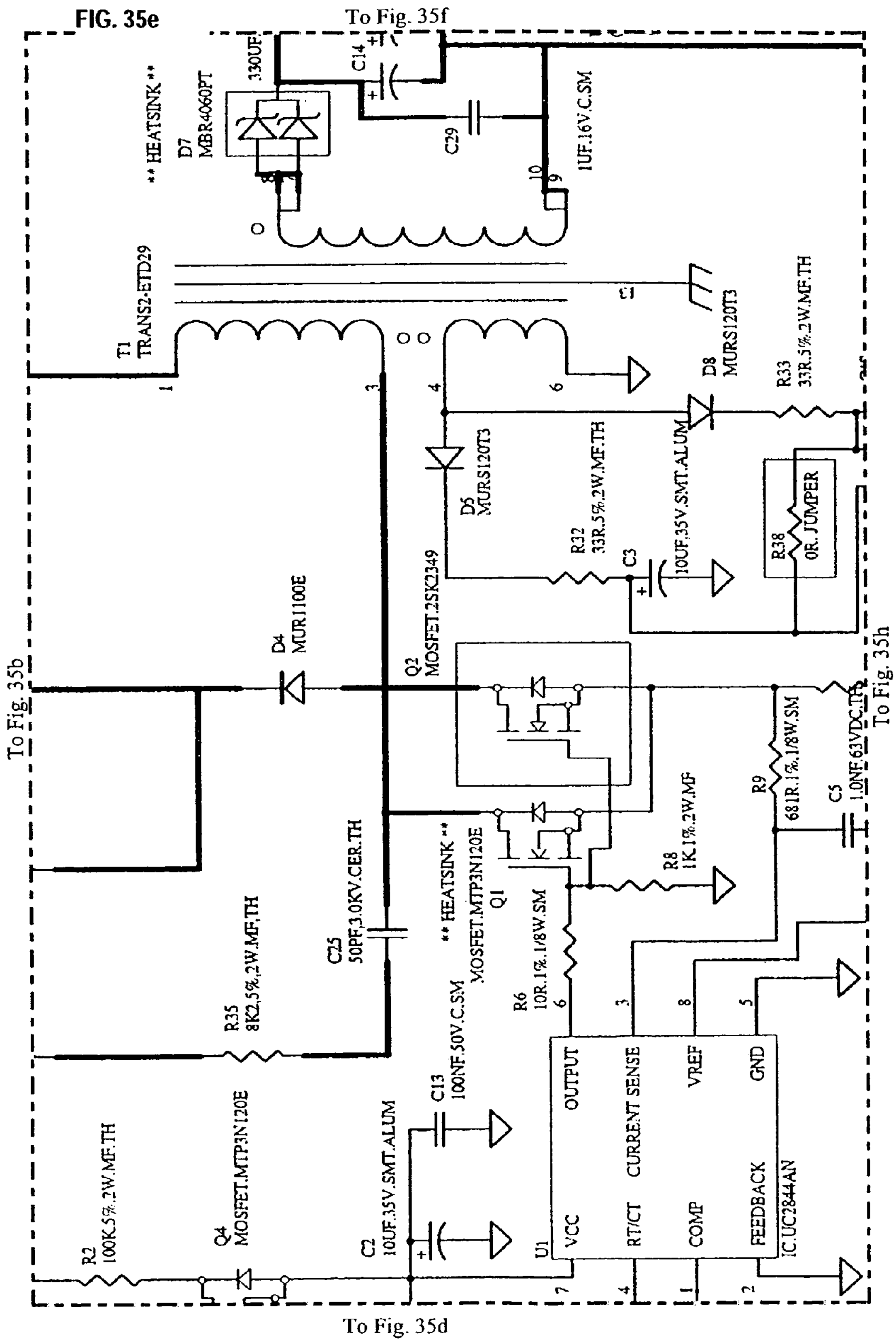
Figure 35F:
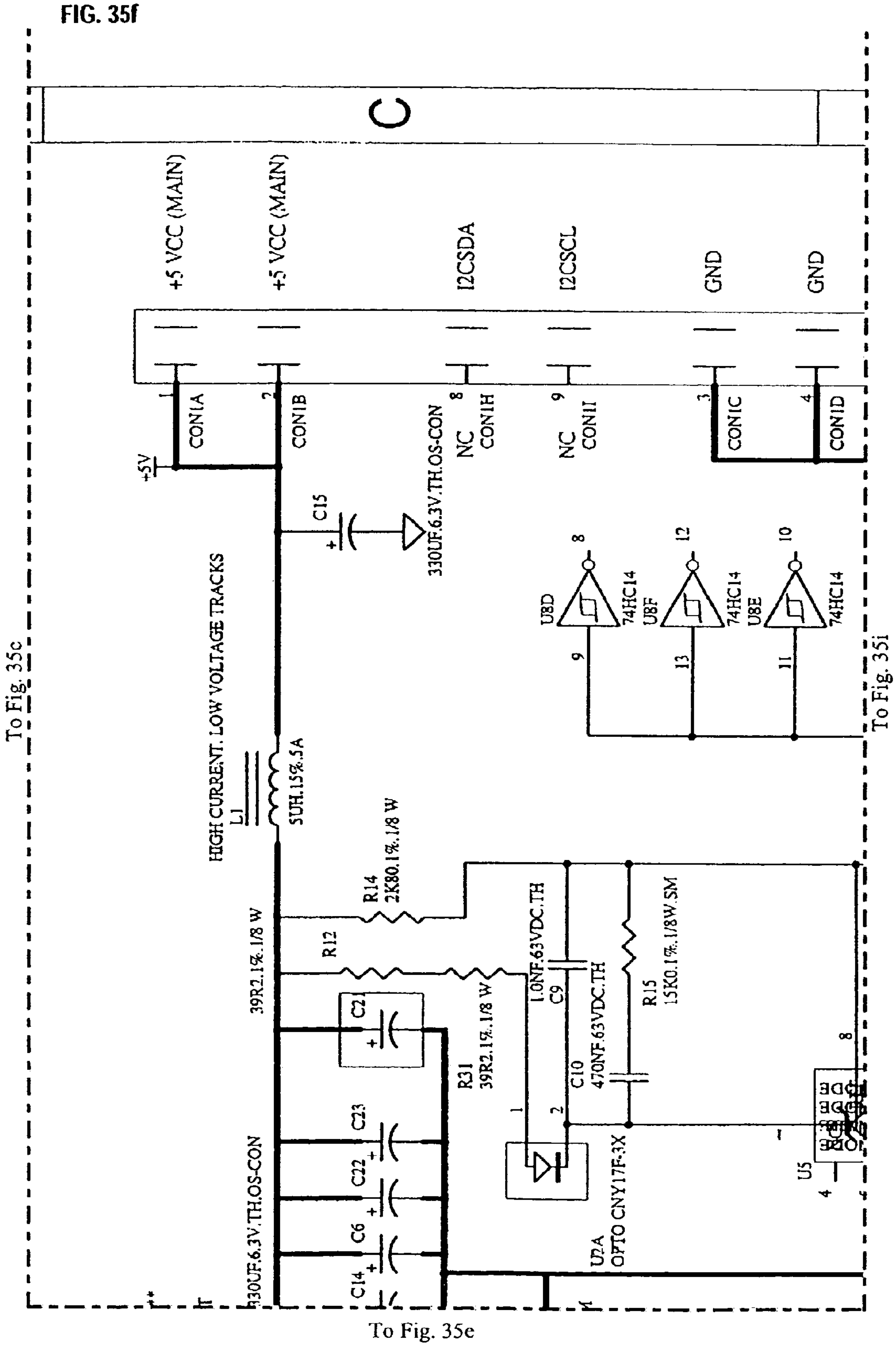
Figure 35G:
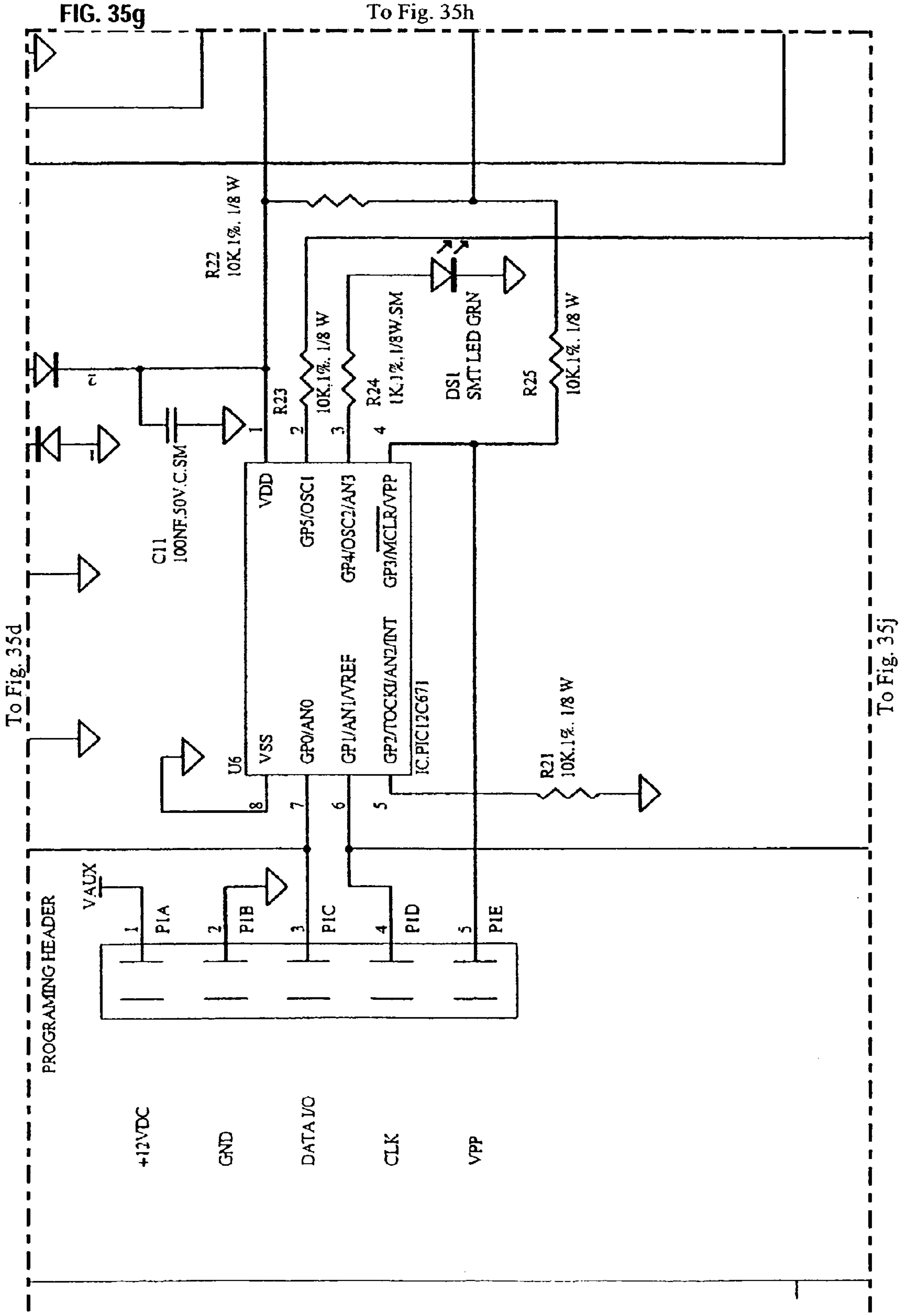
Figure 35H:
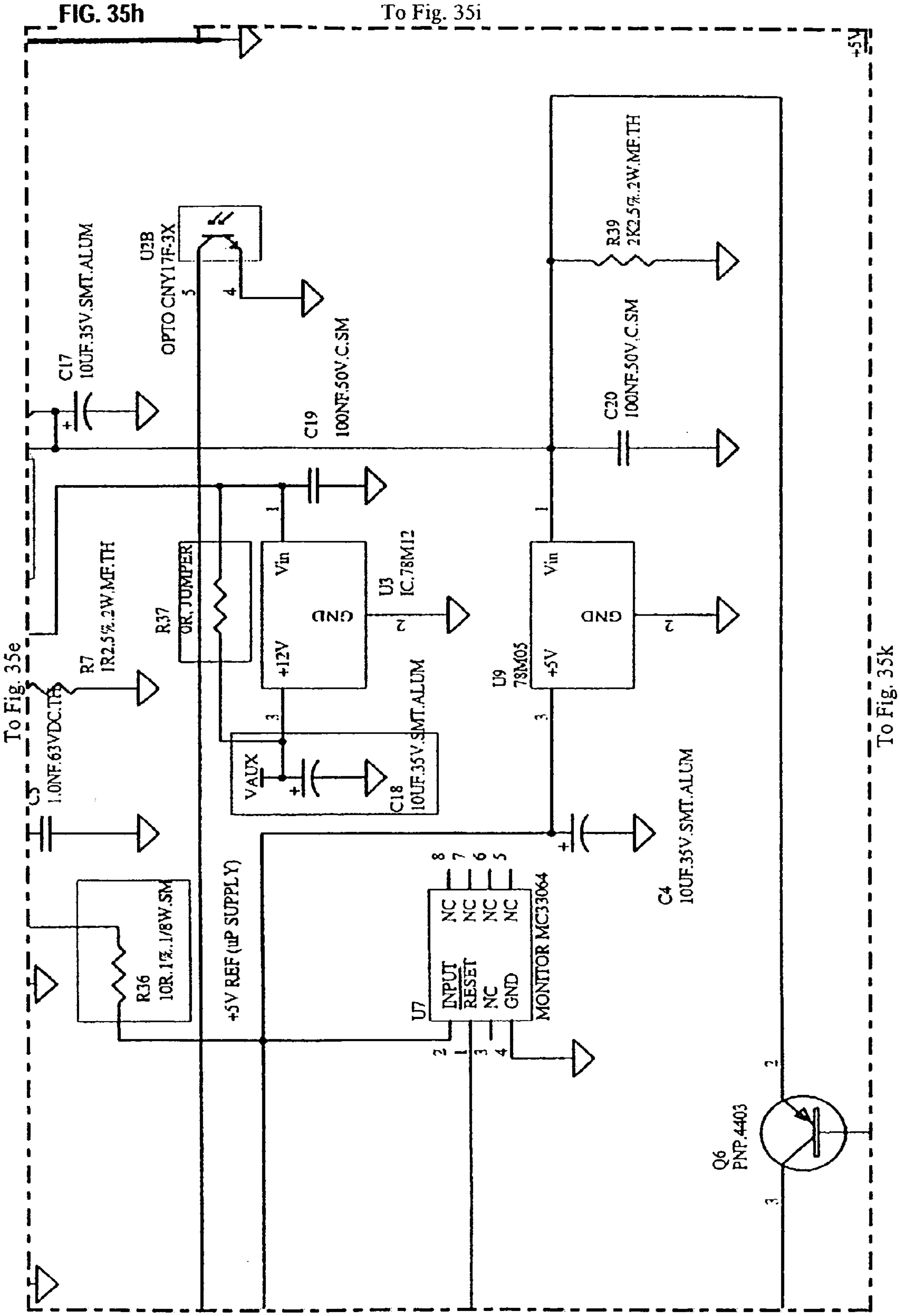
Figure 35I:
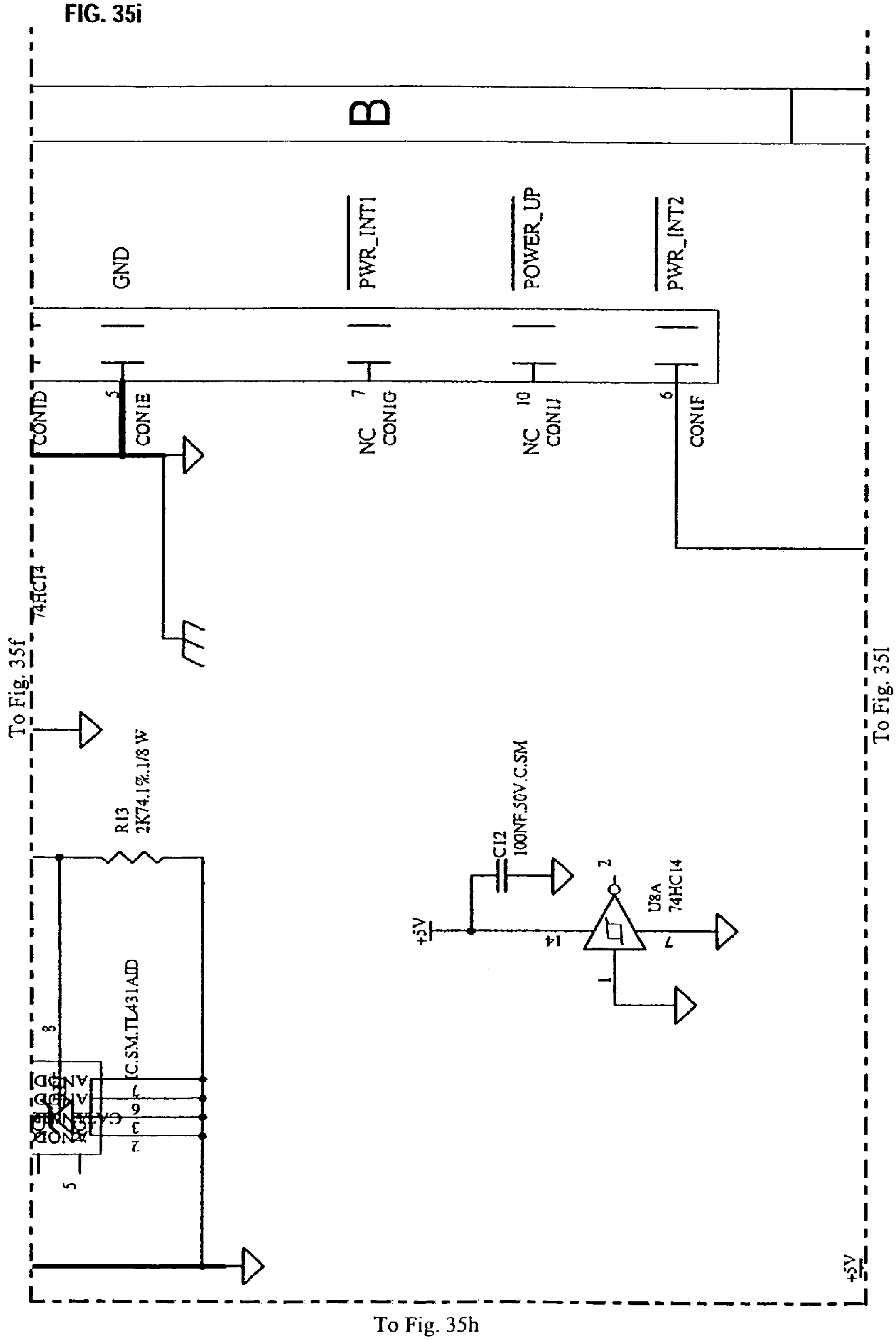
Figure 35J:
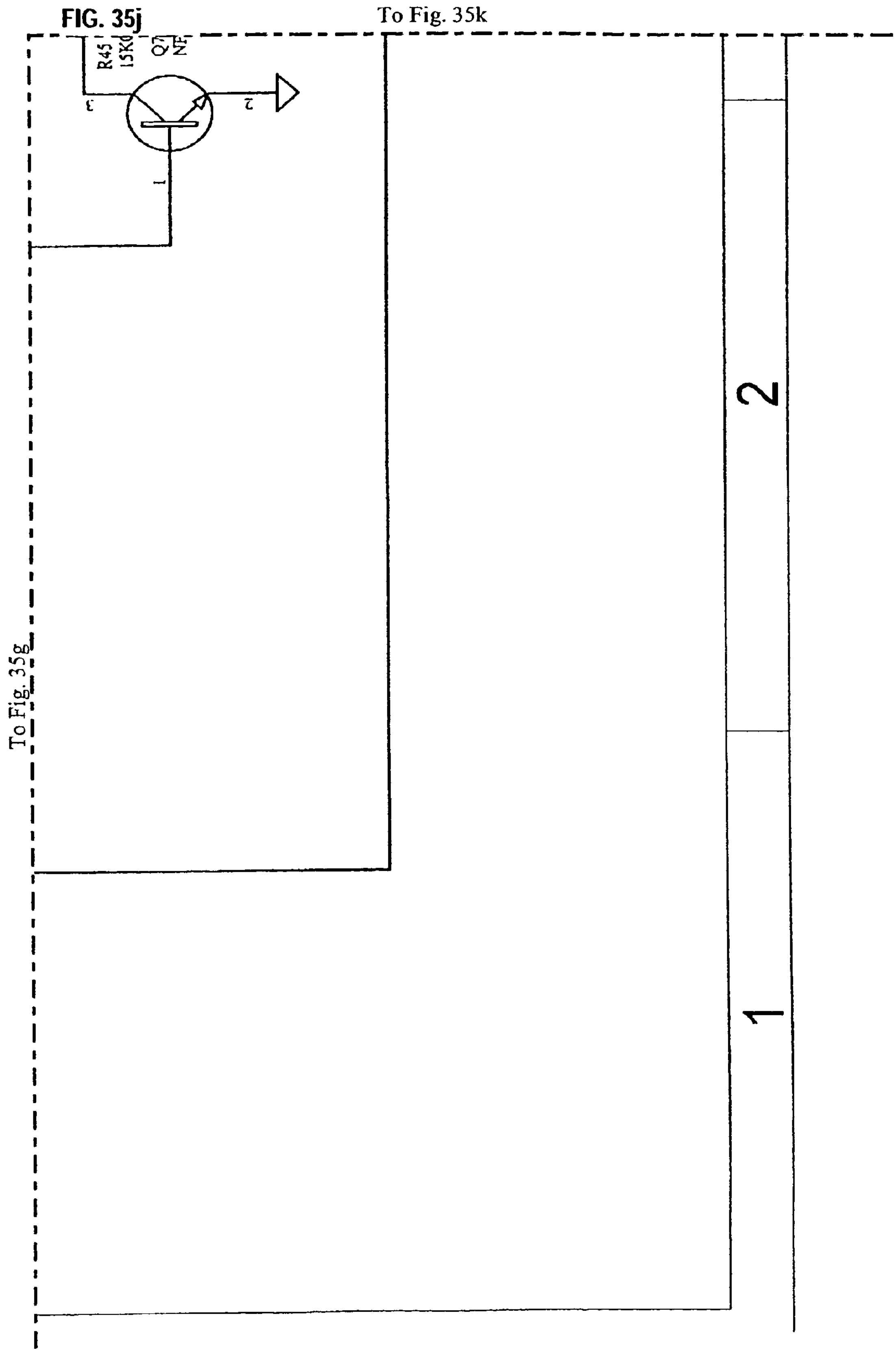
Figure 35K:
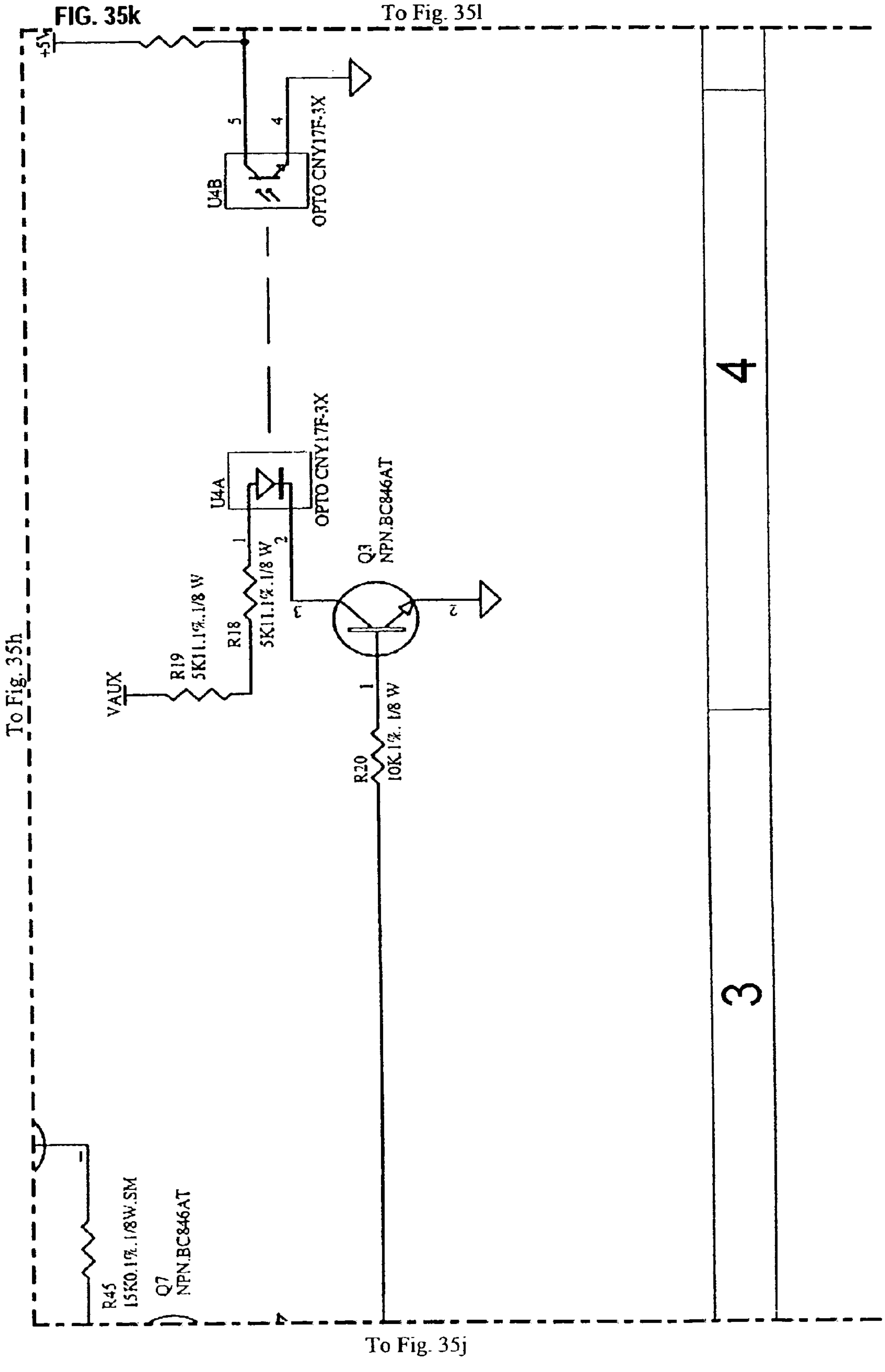
Figure 35L:
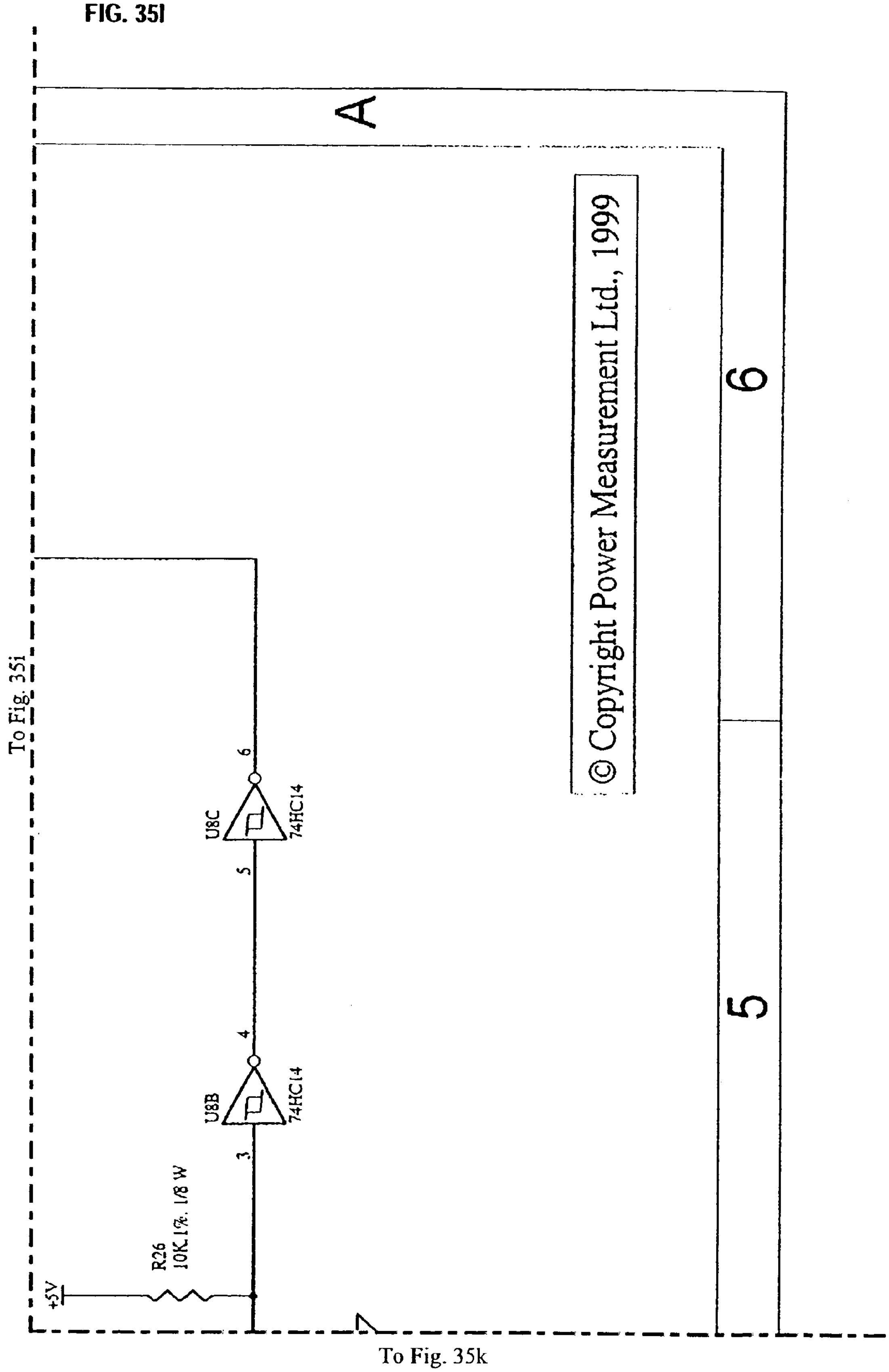
Figure 36A:
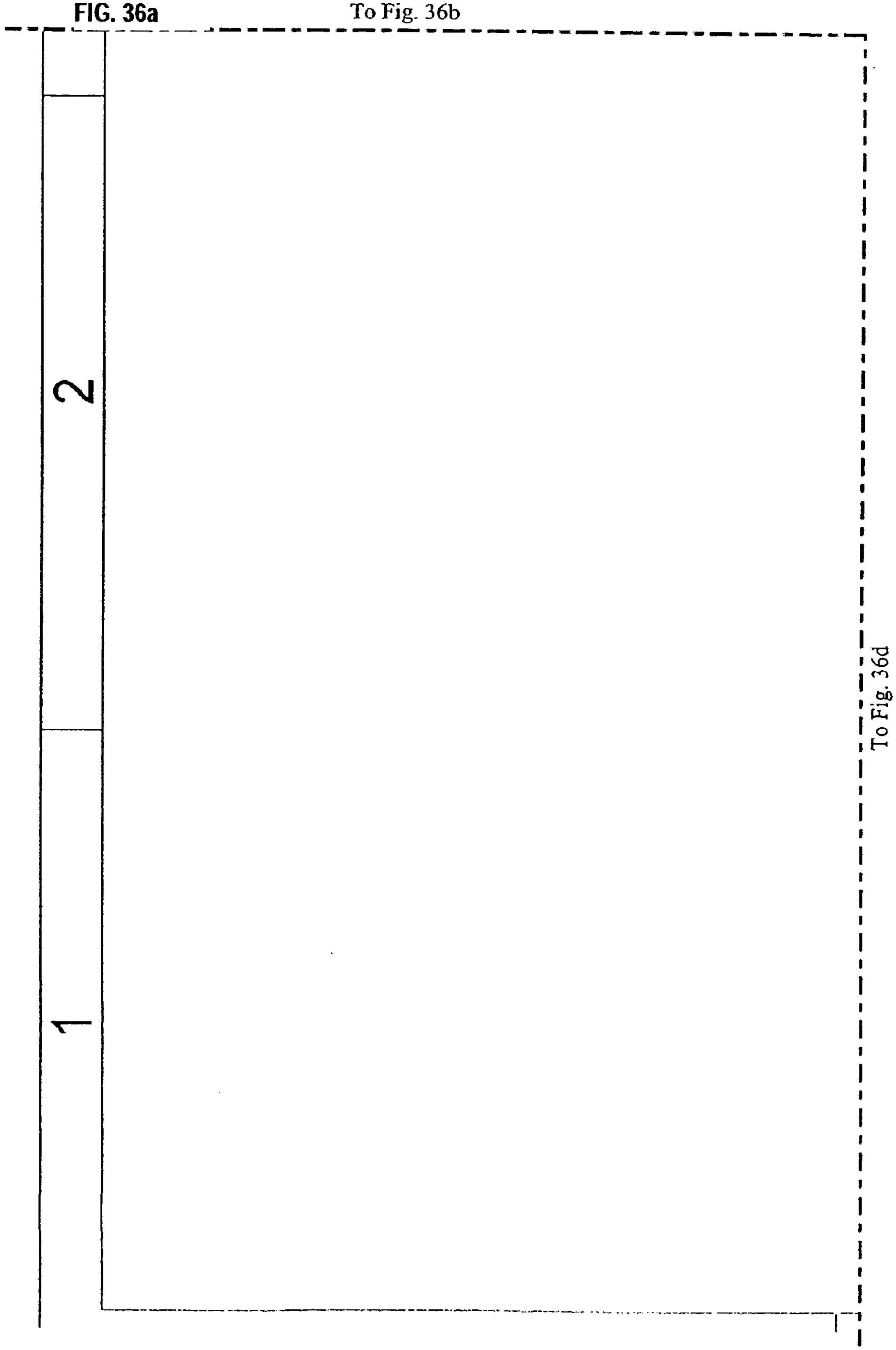
FIGS. 36A–40L depict schematic diagrams of an exemplary communications board of one preferred embodiment.
Figure 36B:
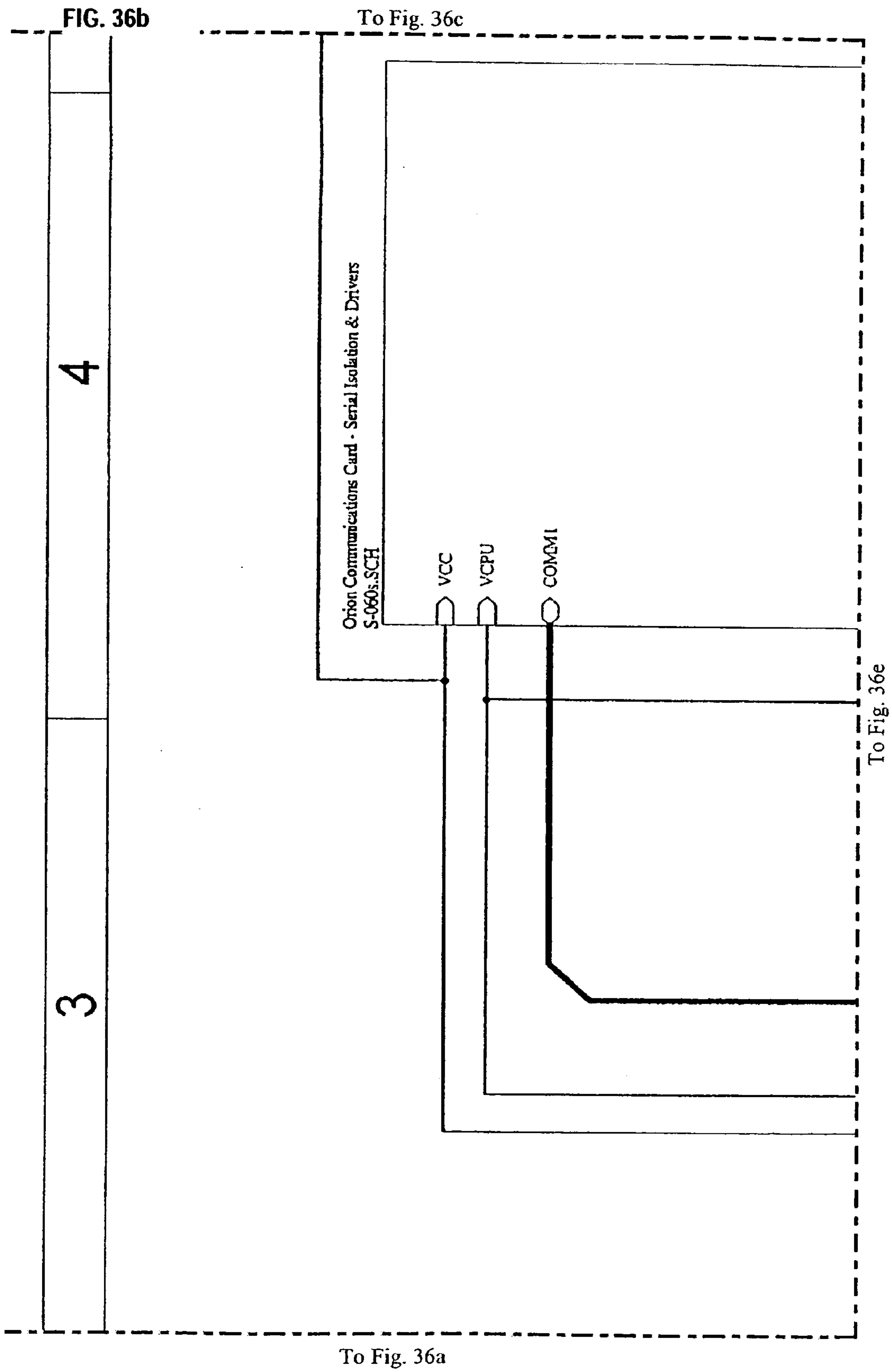
Figure 36C:
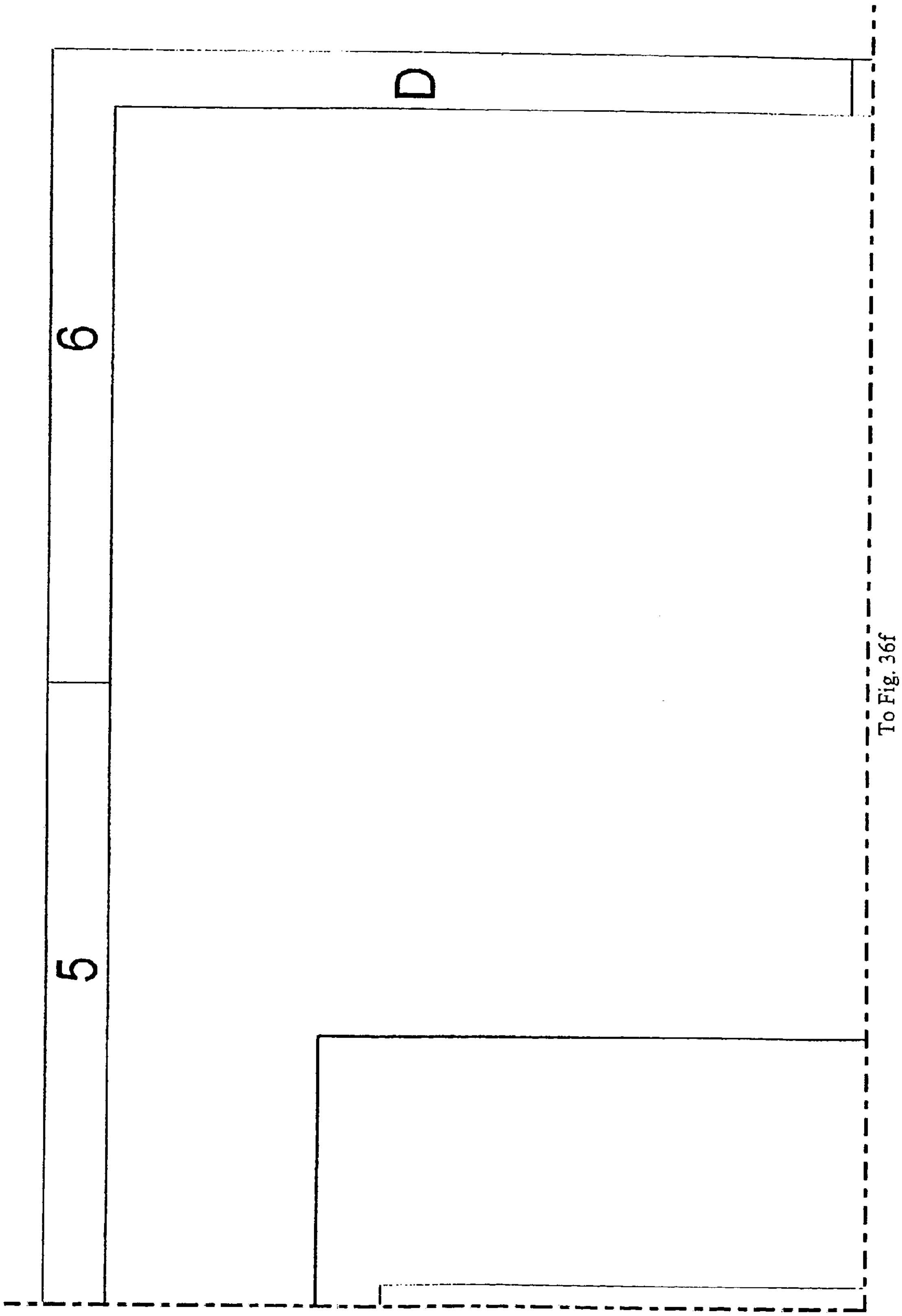
Figure 36D:
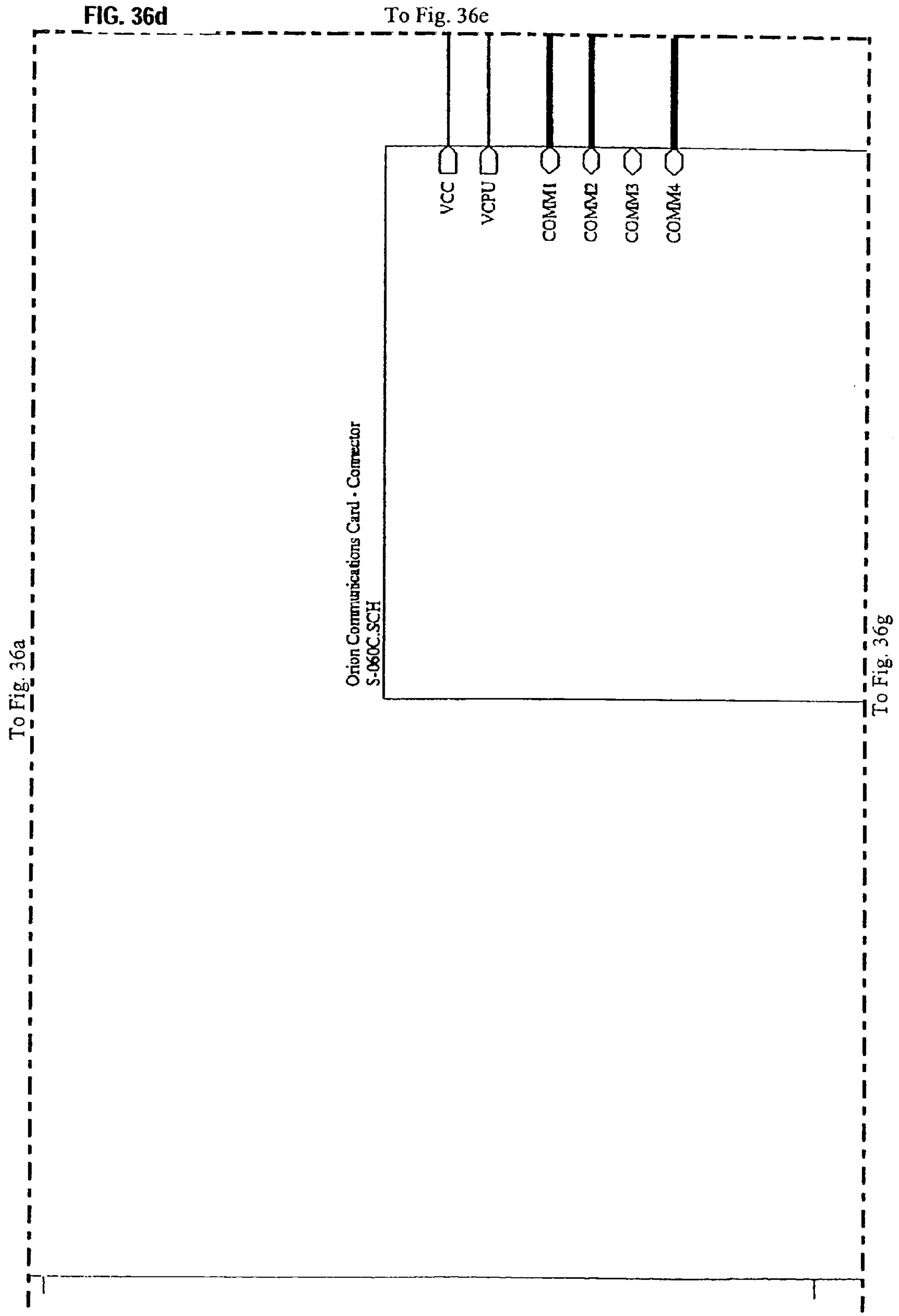
Figure 36E:
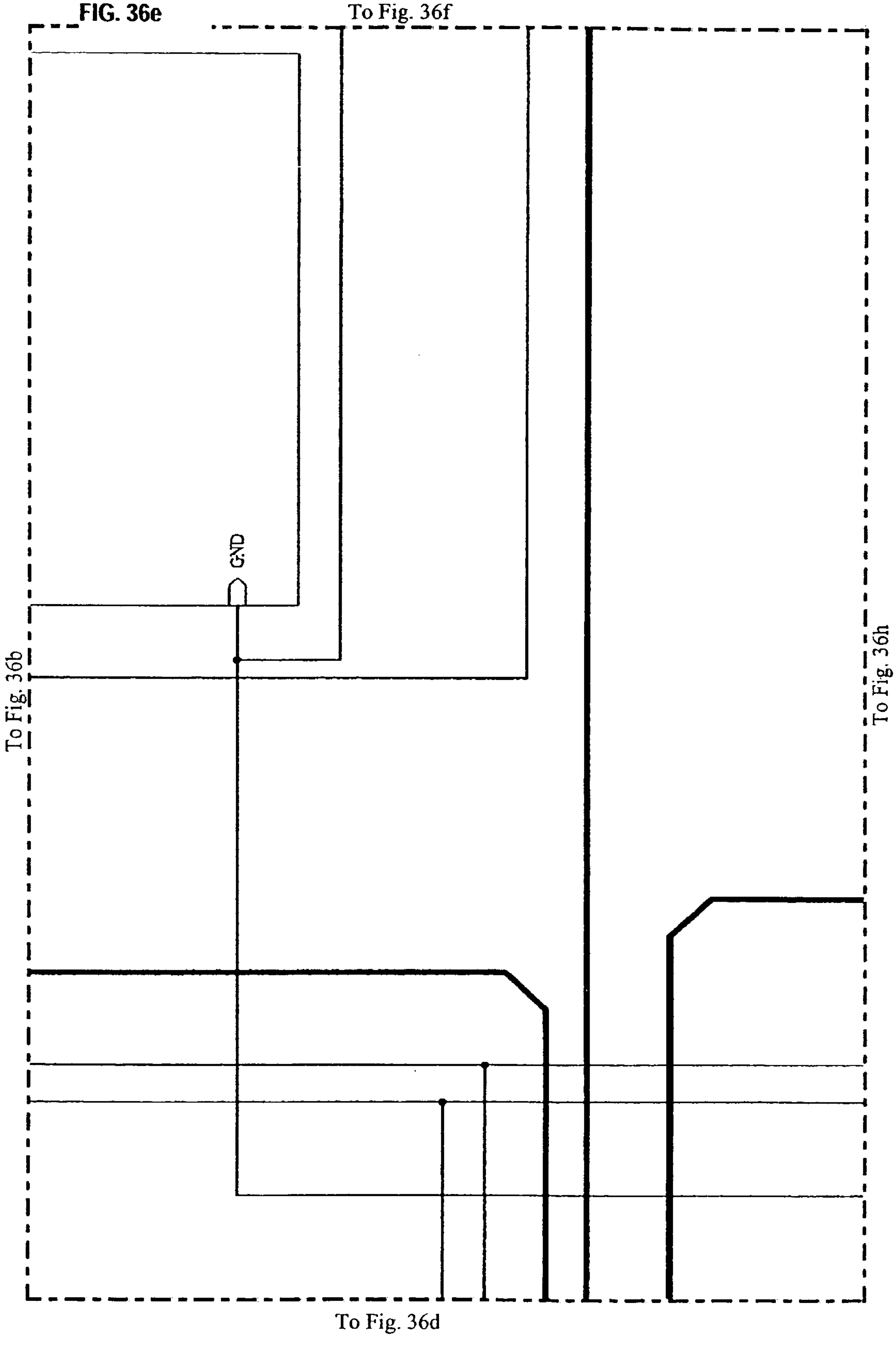
Figure 36F:
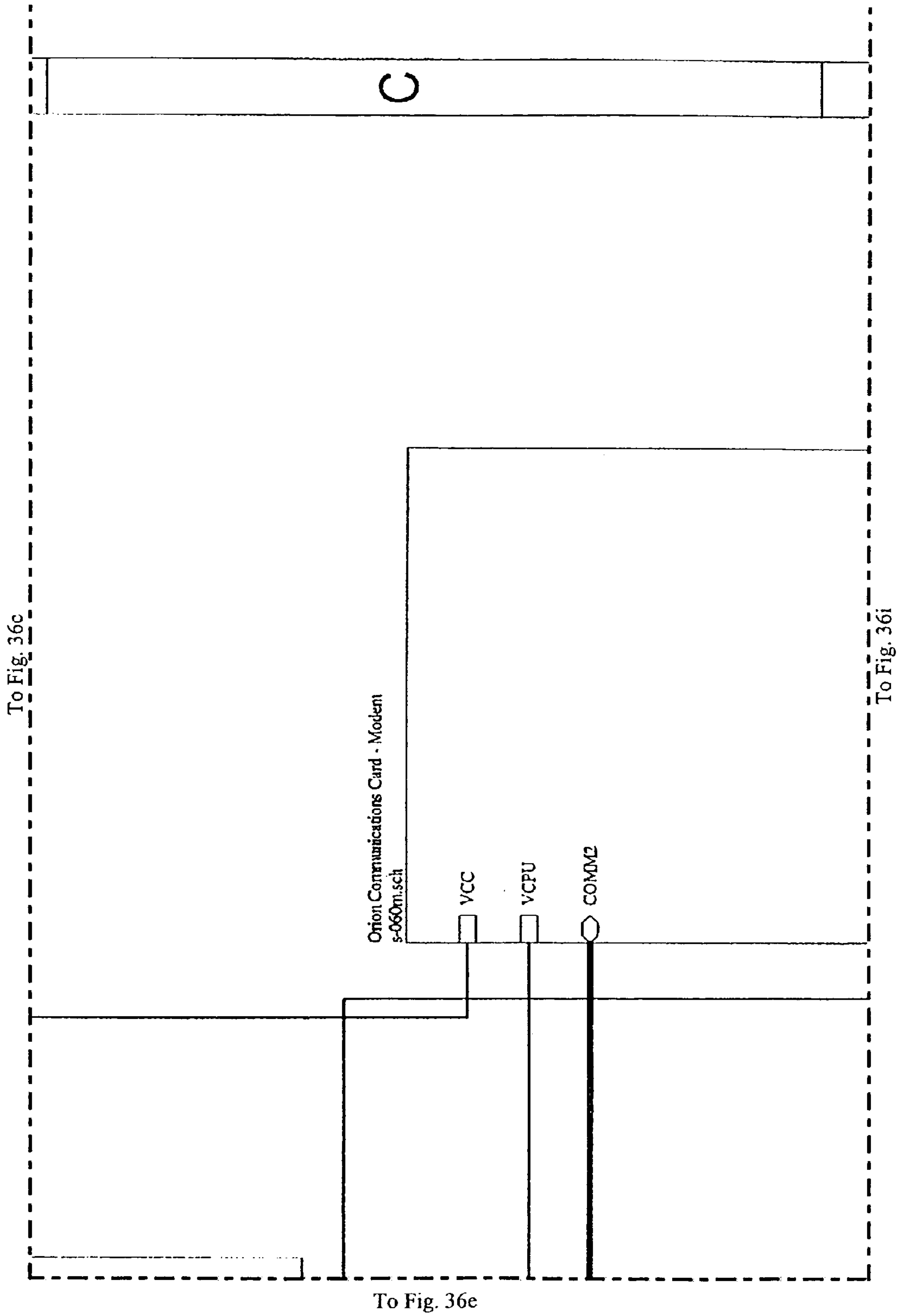
Figure 36G:
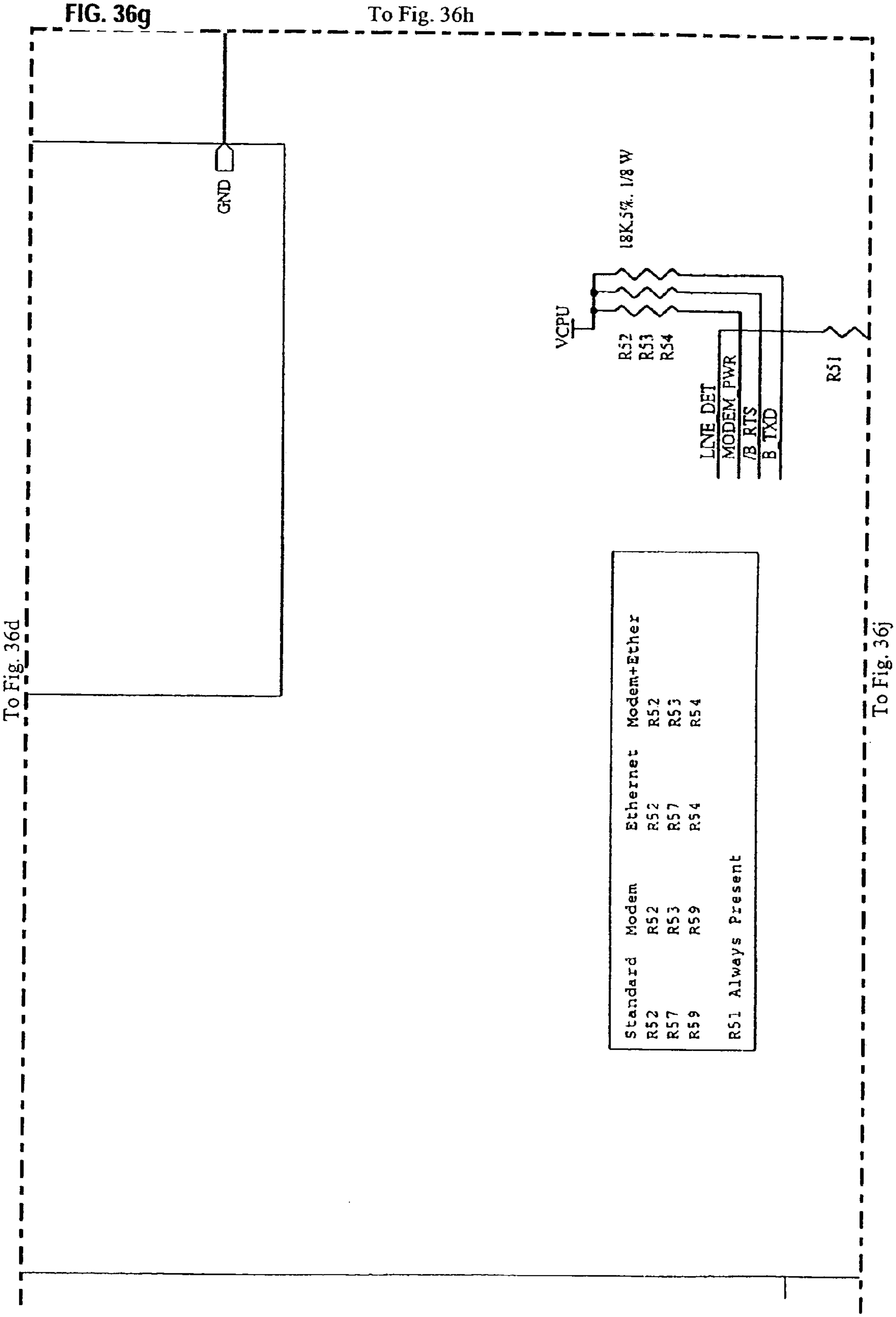
Figure 36H:
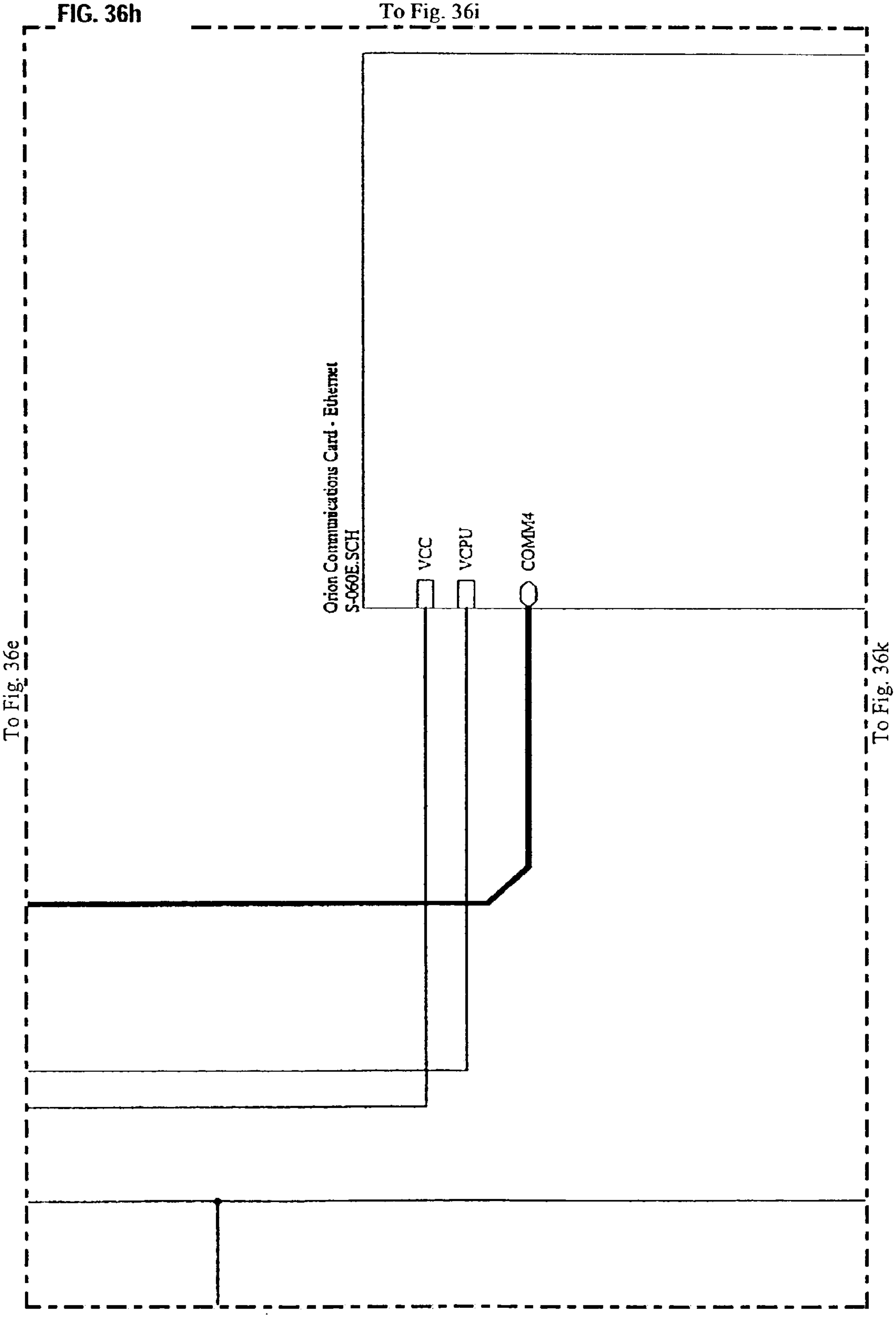
Figure 36I:
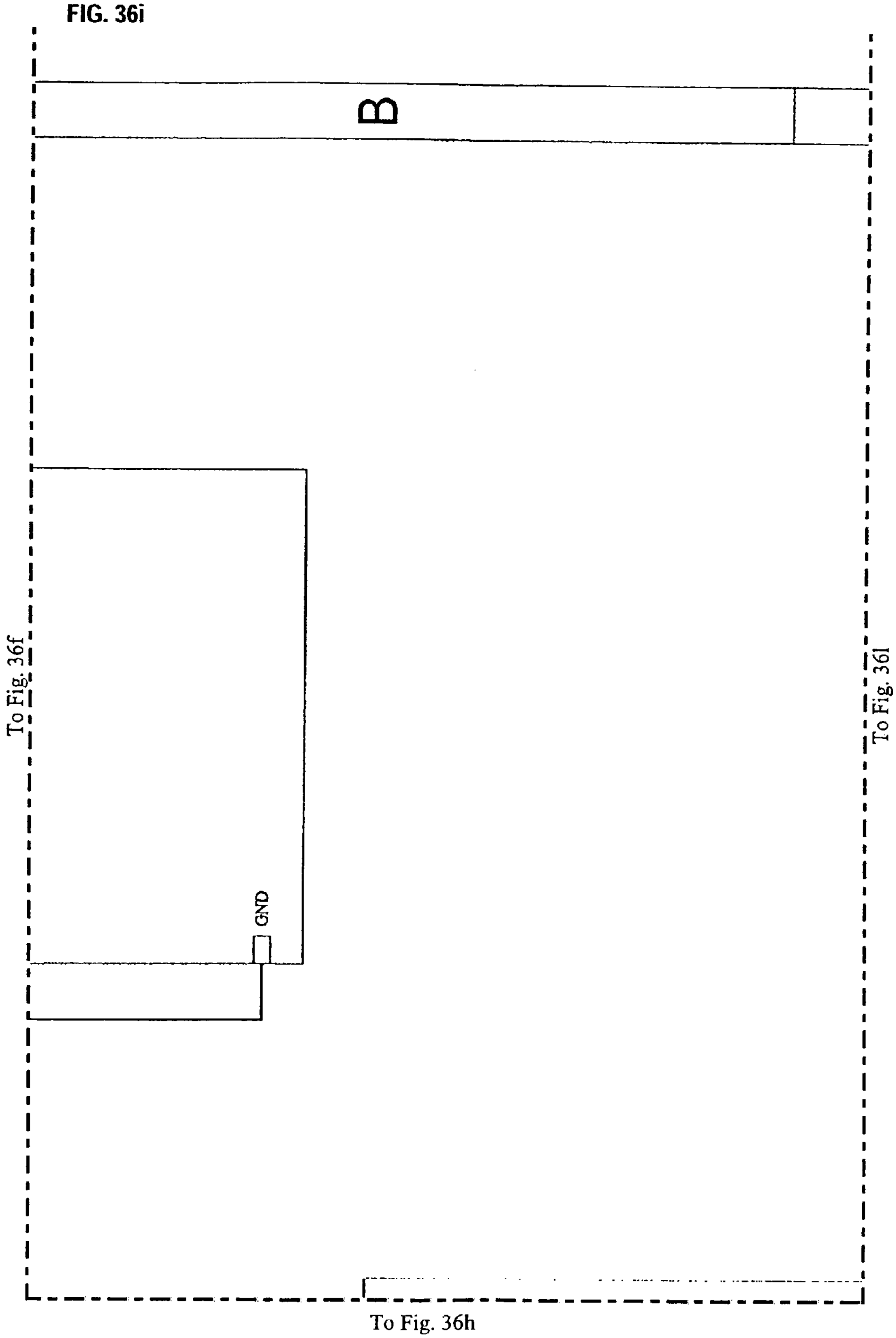
Figure 36J:
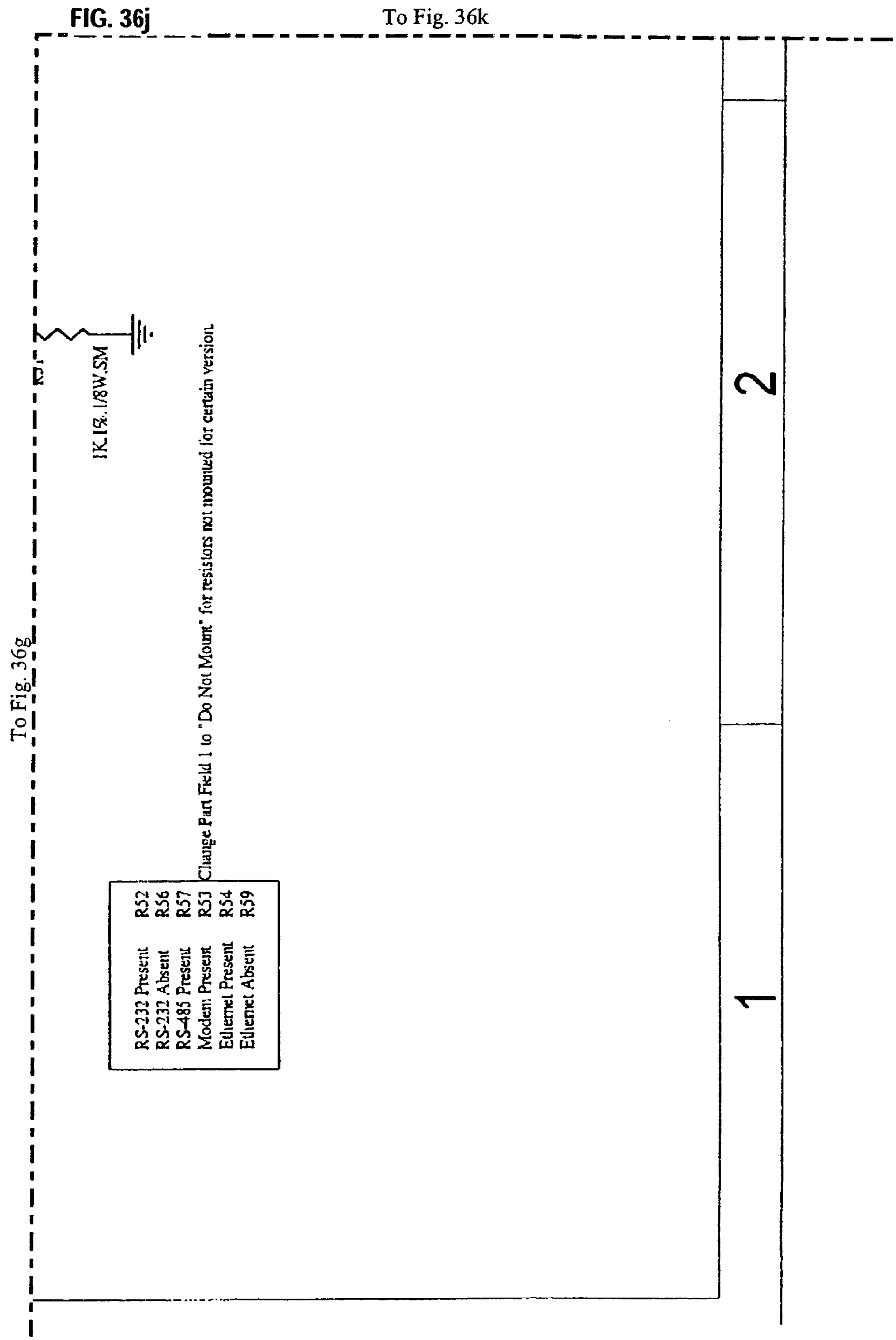
Figure 36K:
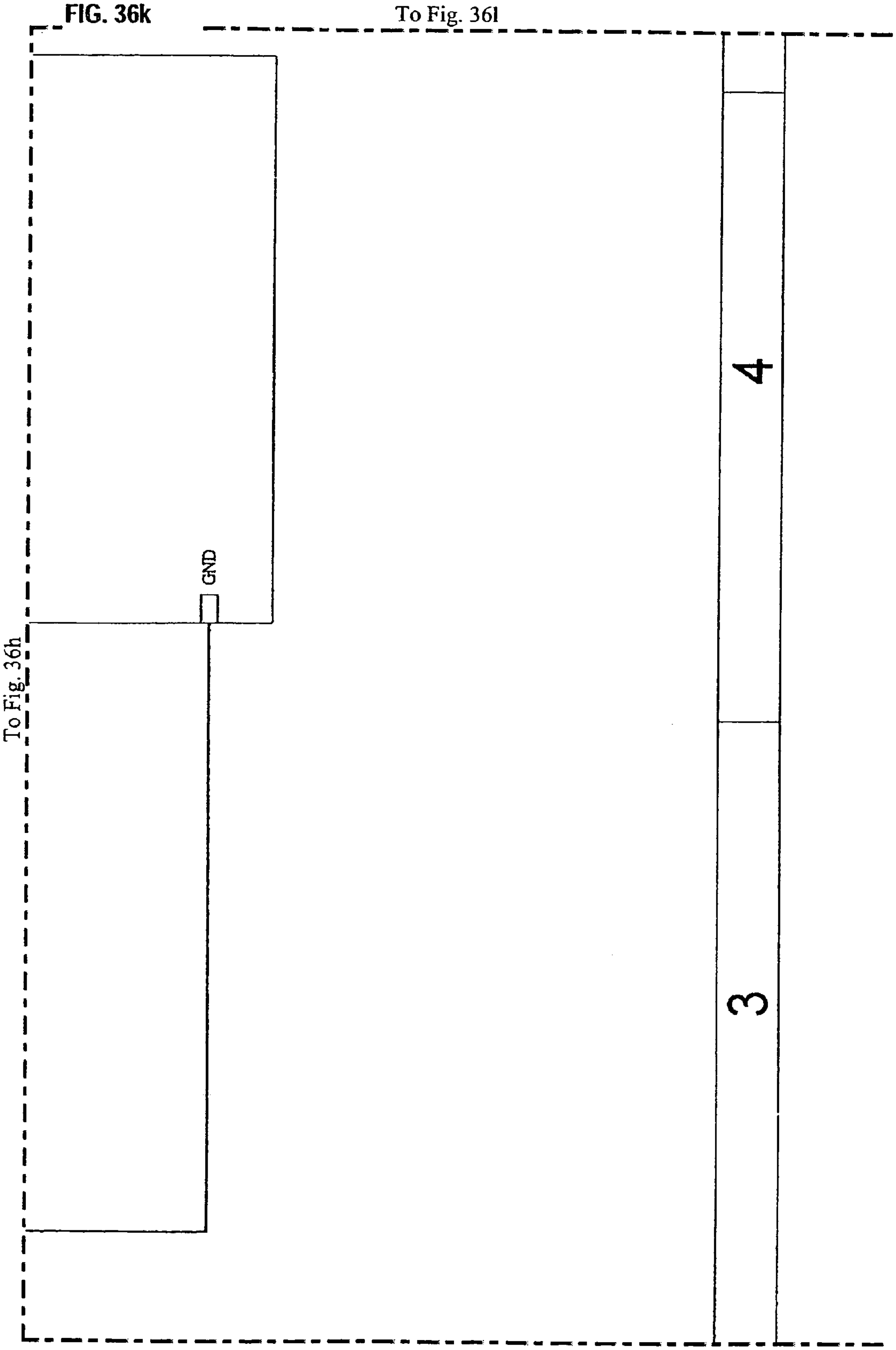
Figure 36L:
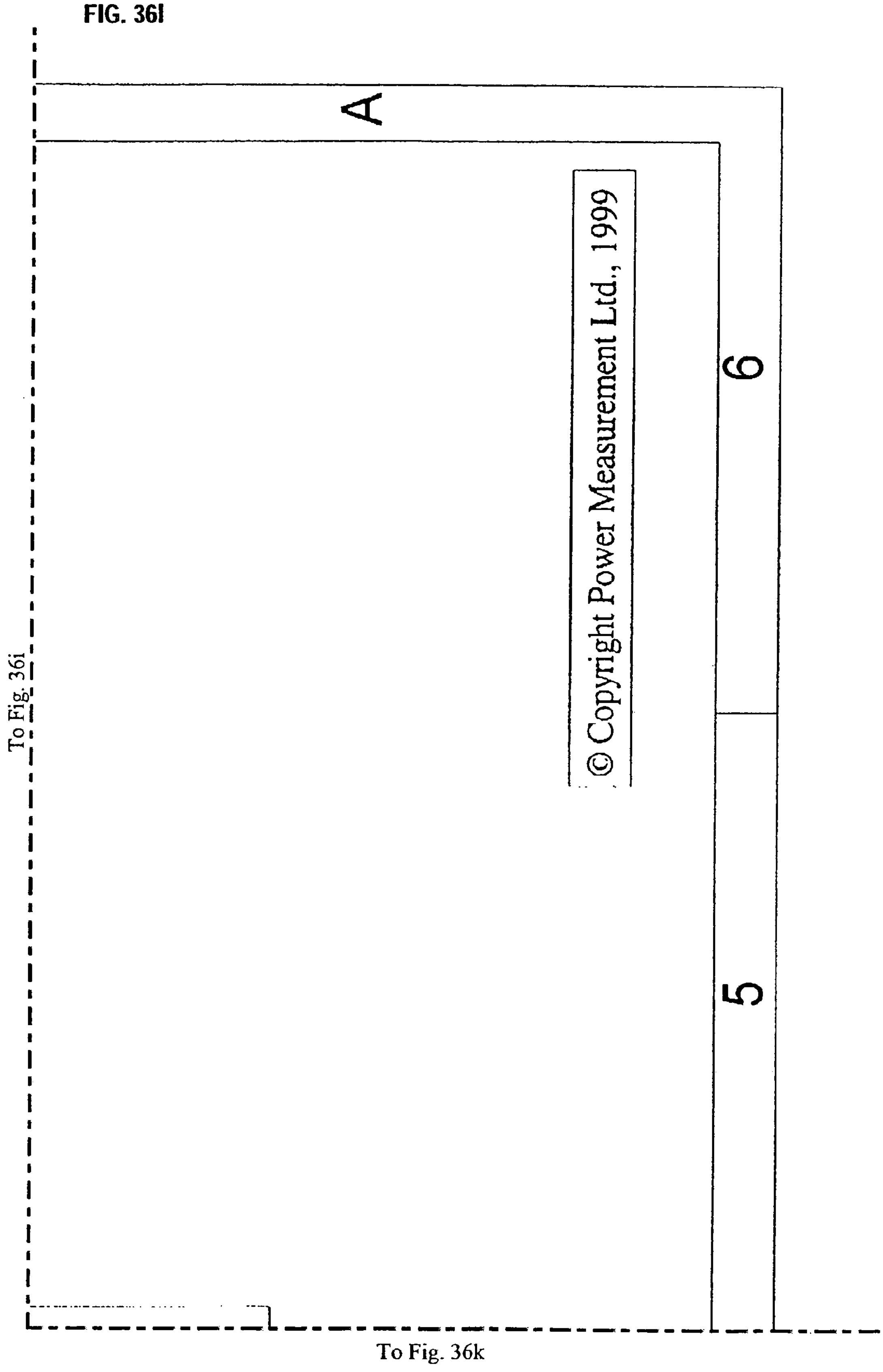
Figure 37A:
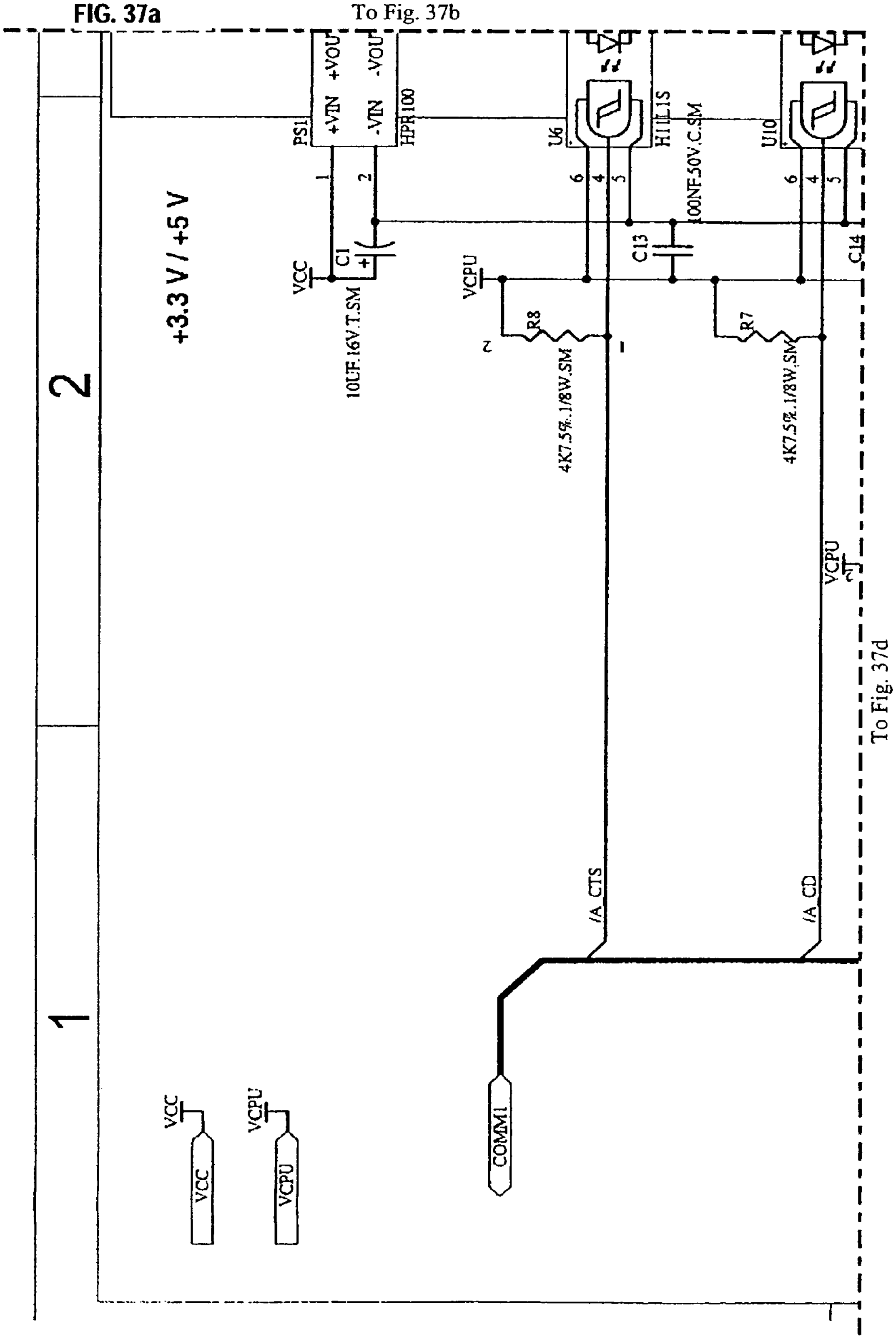
Figure 37B:
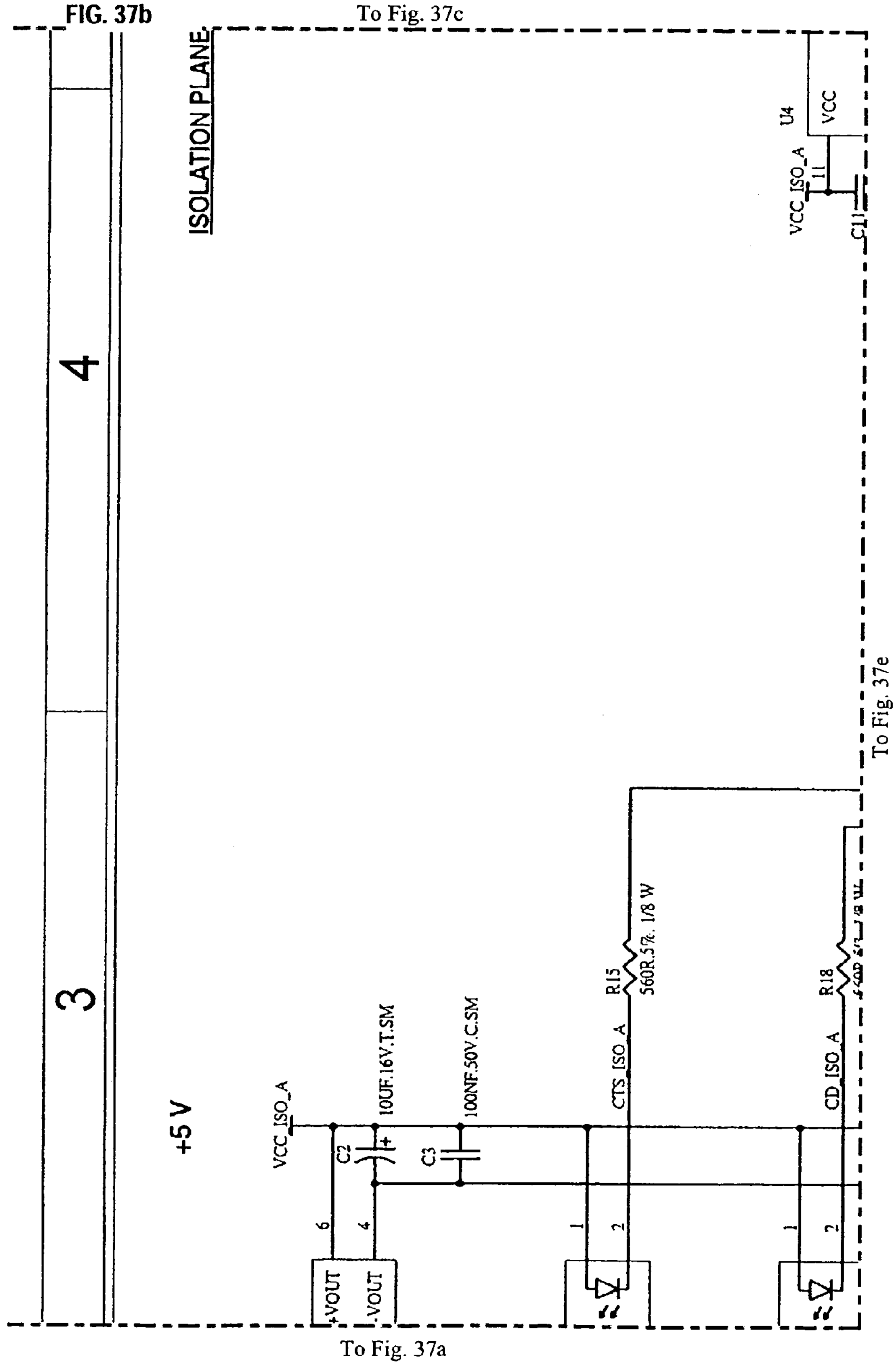
Figure 37C:
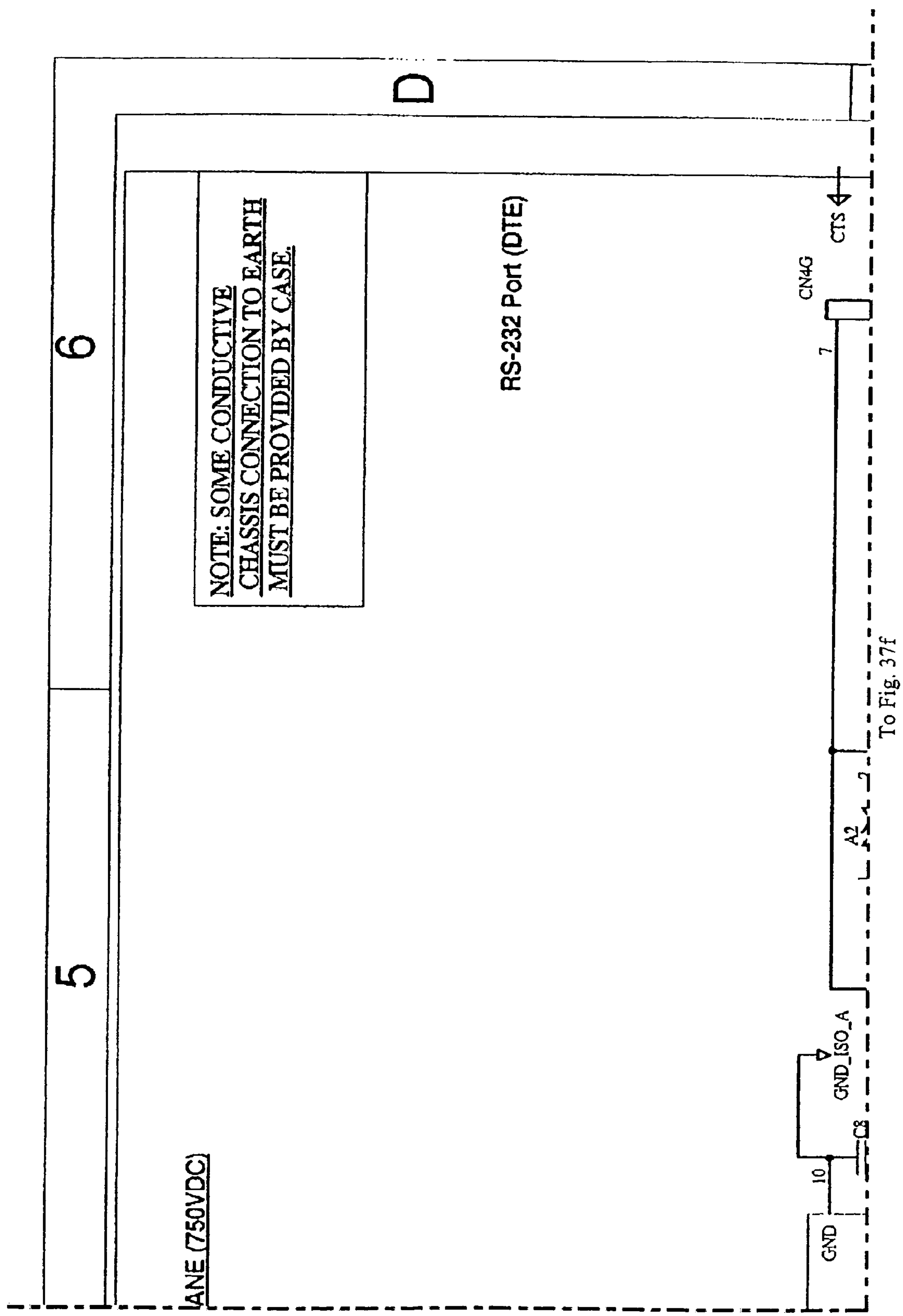
Figure 37D:
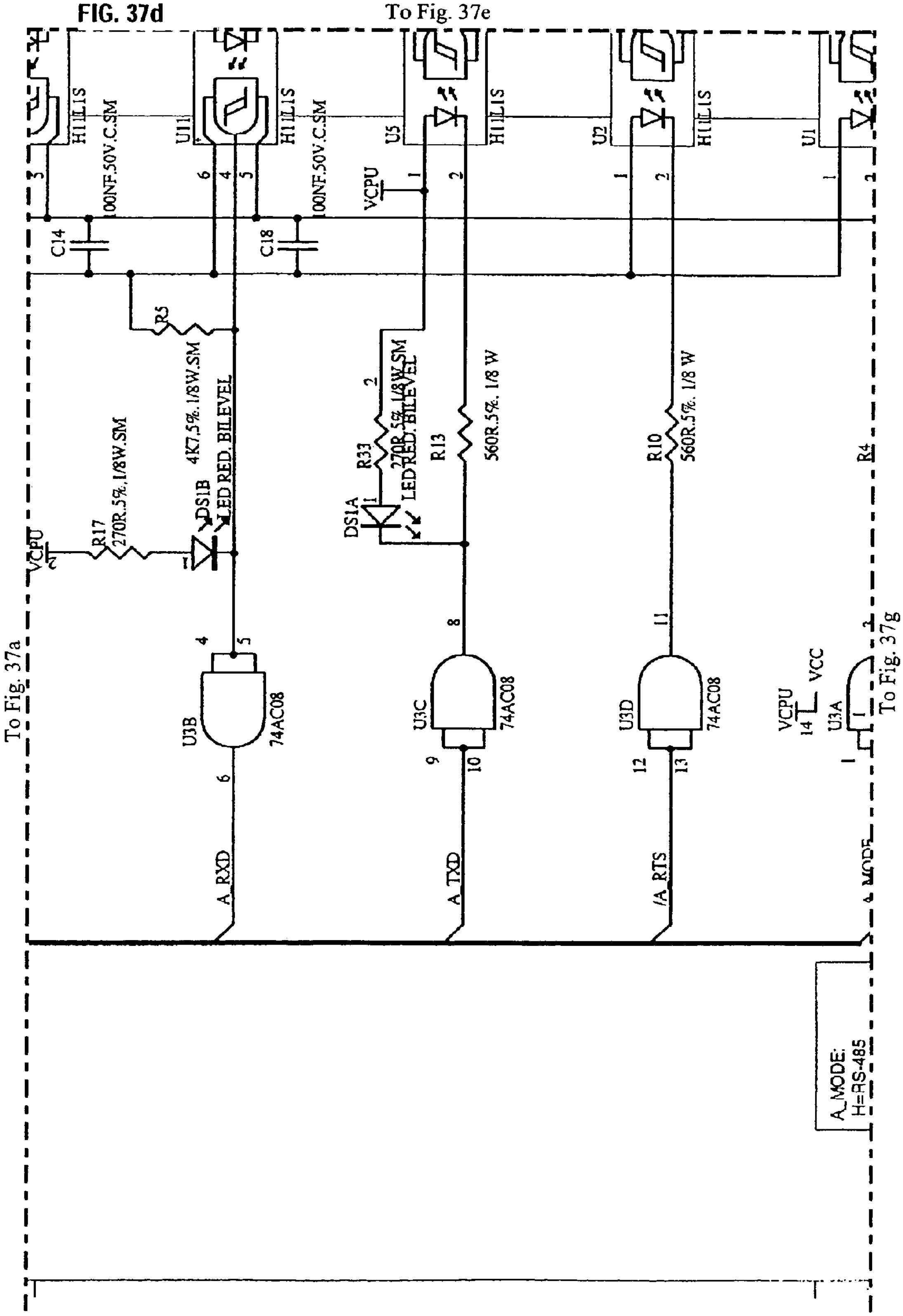
Figure 37E:
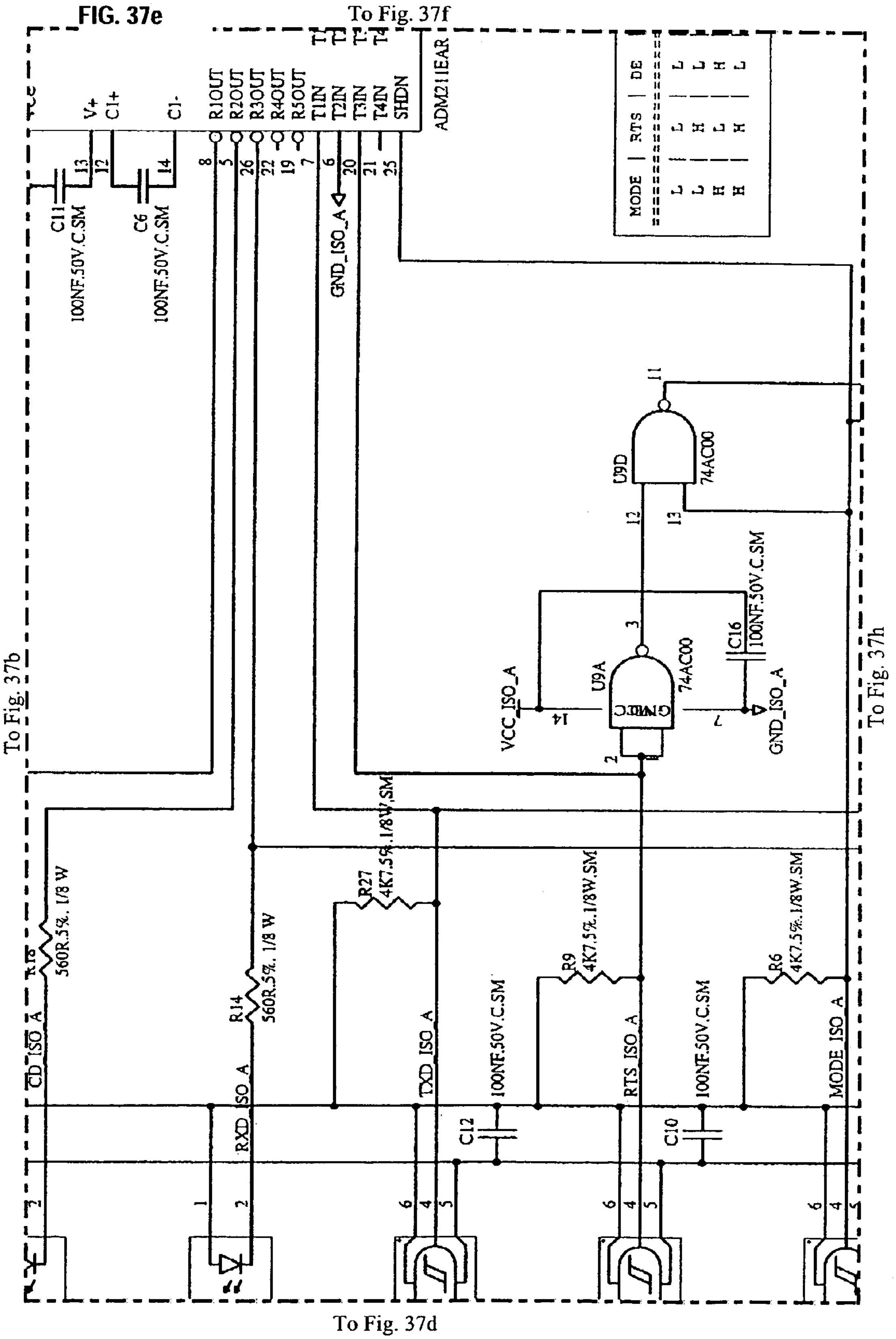
Figure 37F:
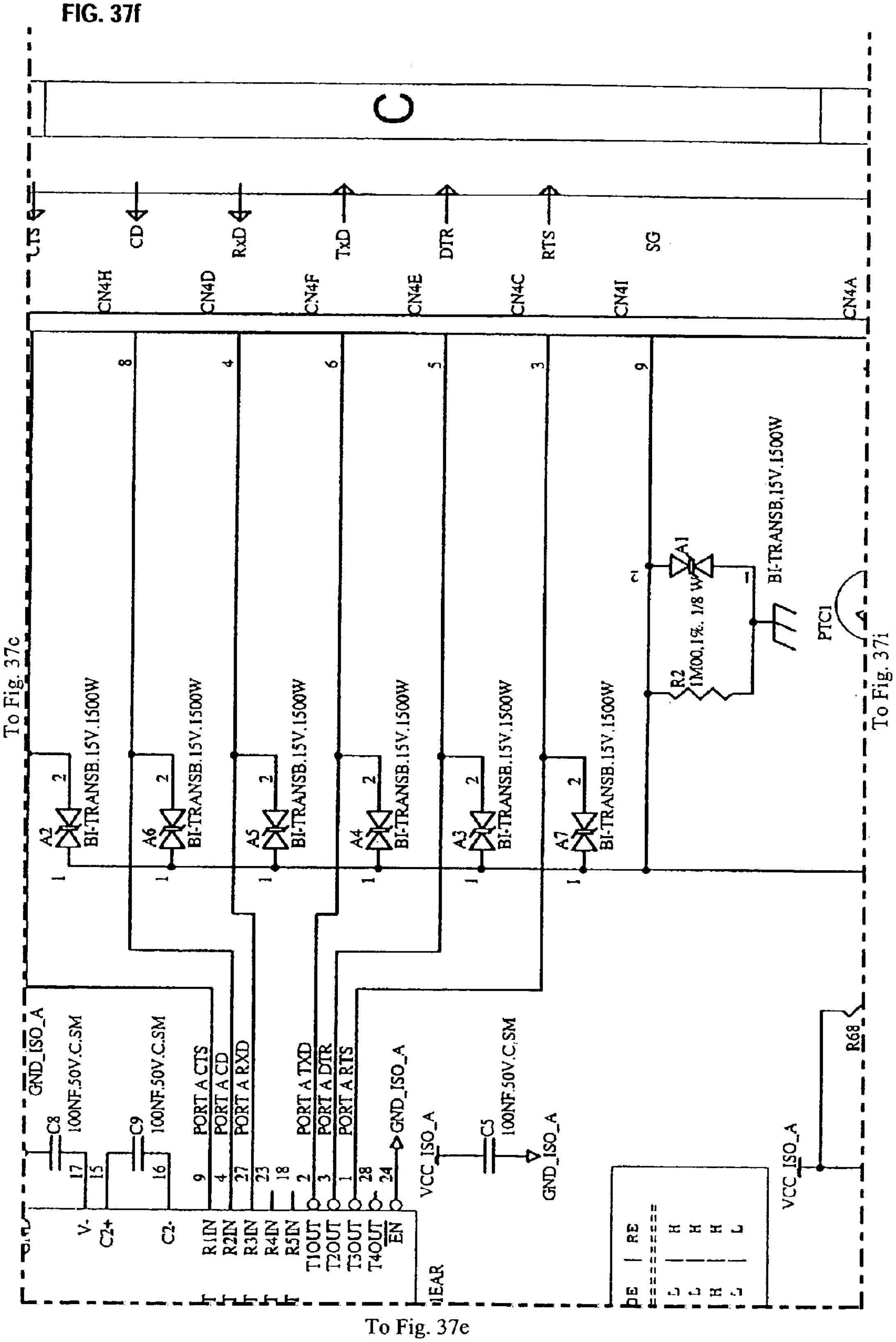
Figure 37G:
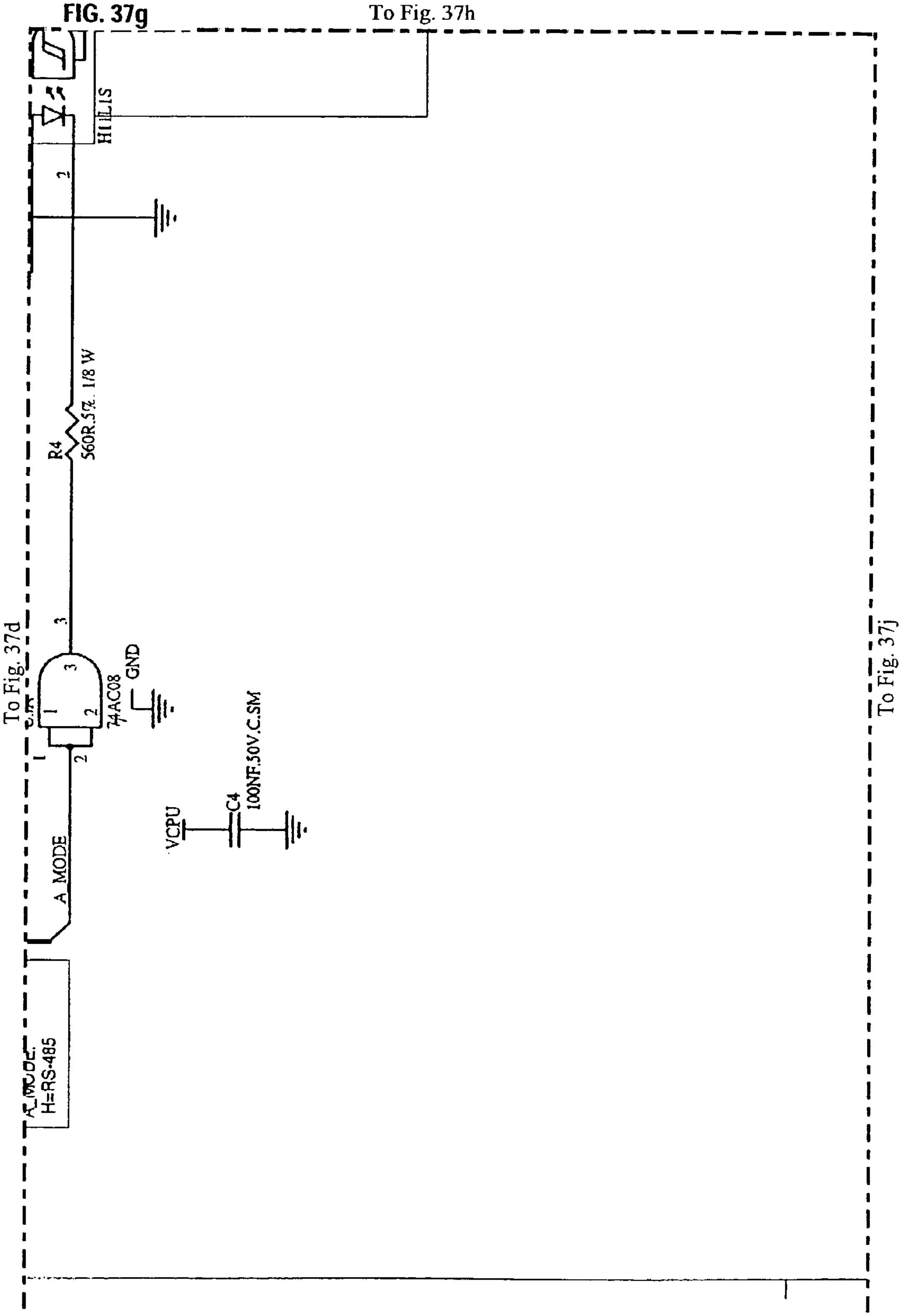
Figure 37H:
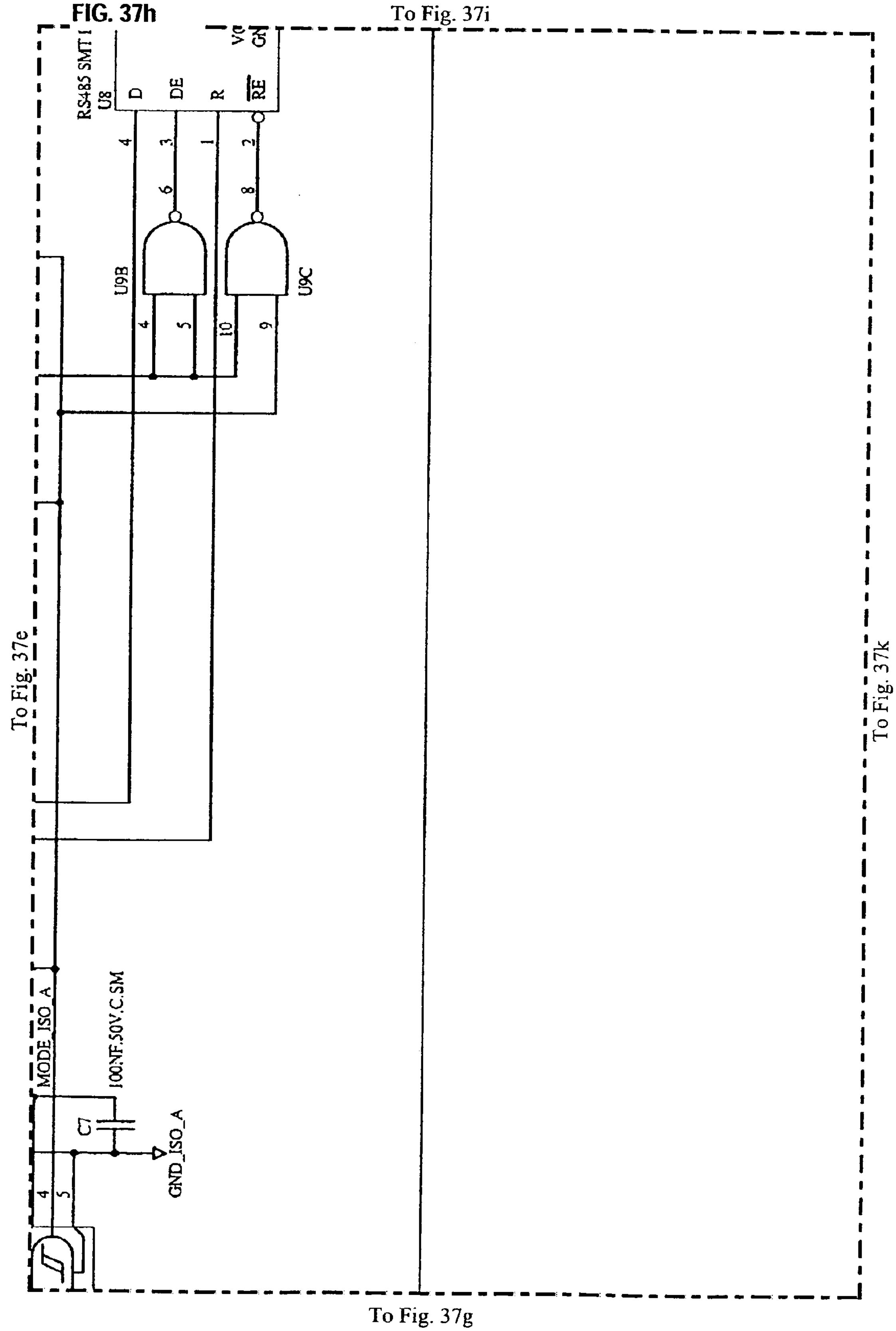
Figure 37I:
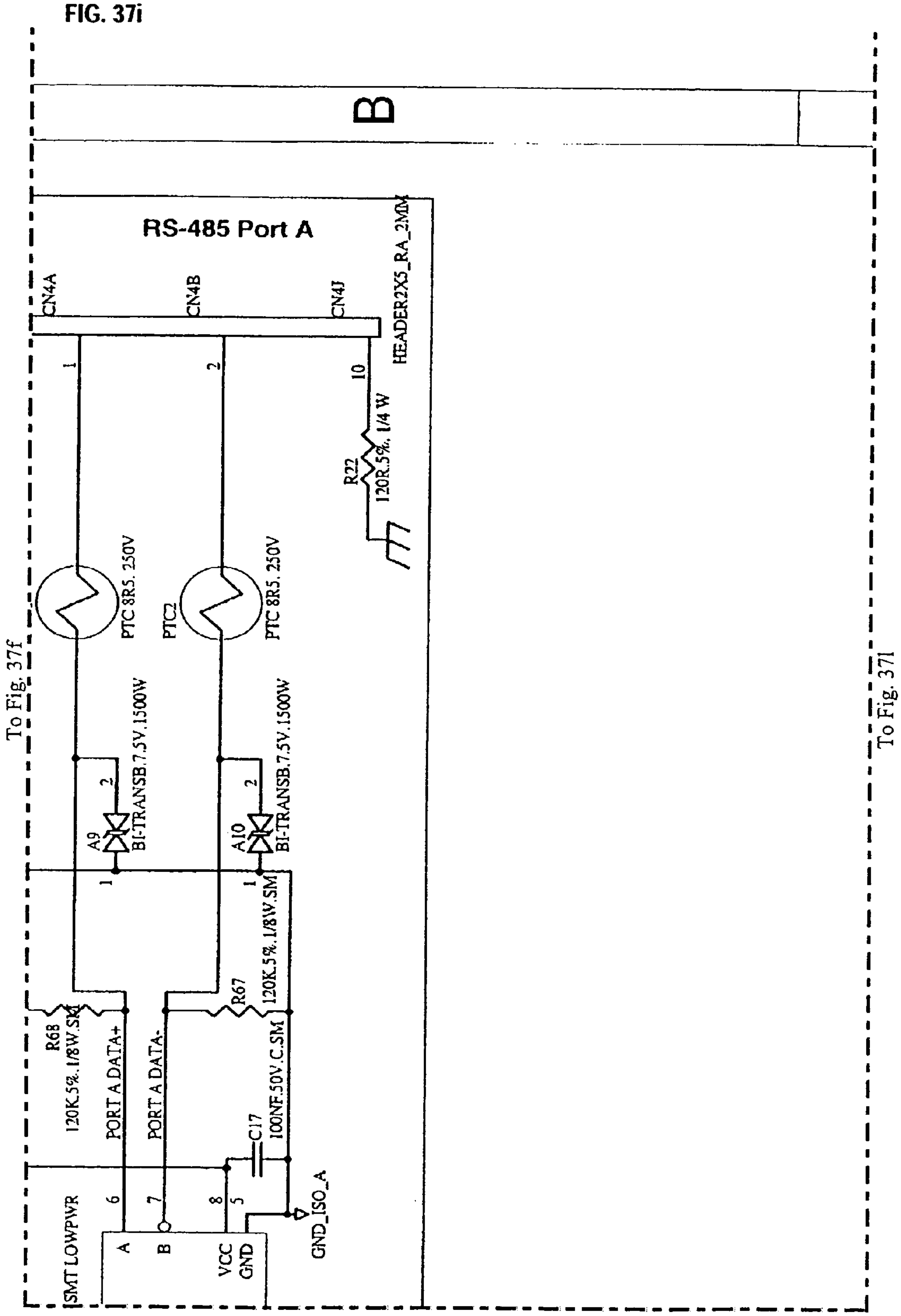
Figure 37J:
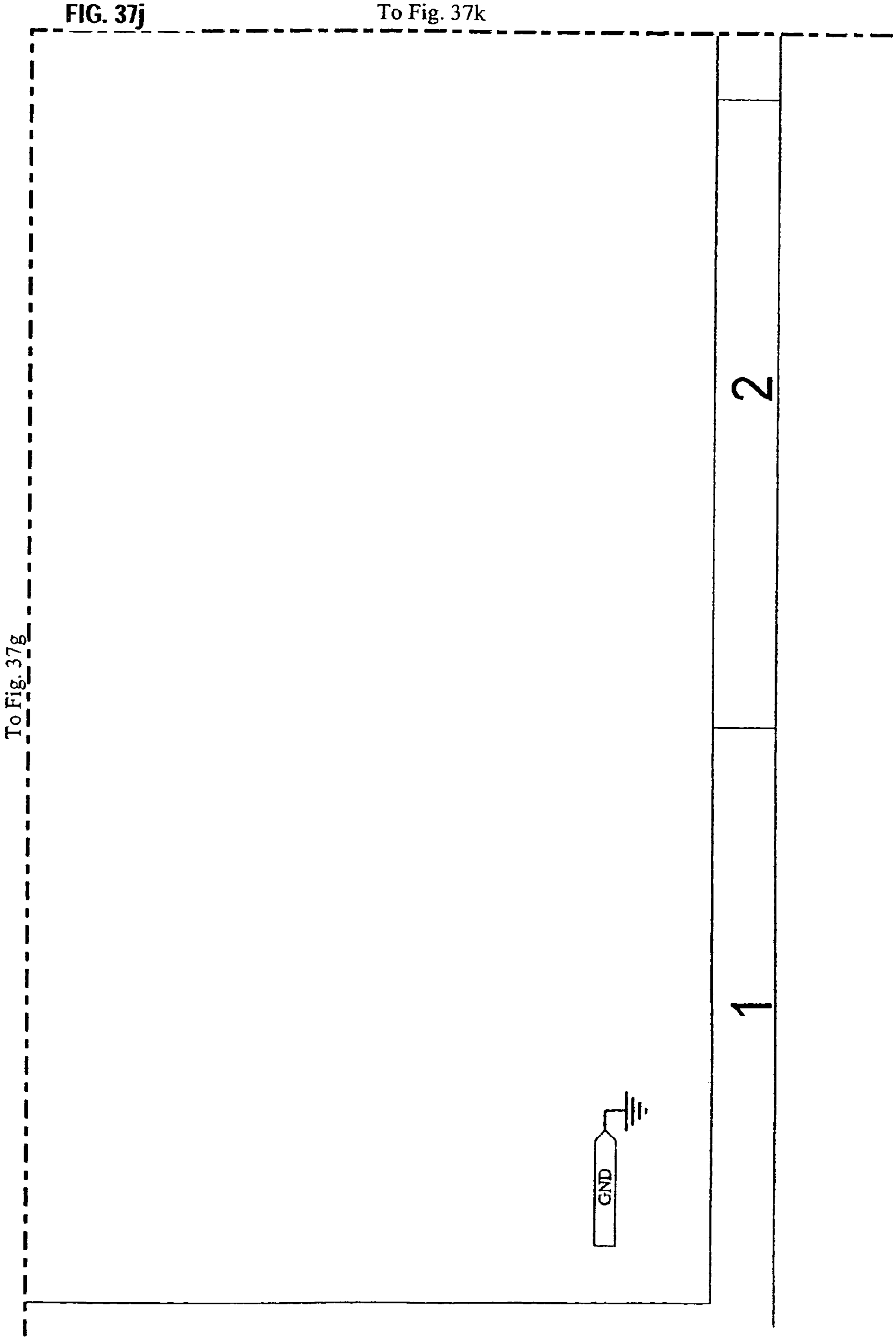
Figure 37K:
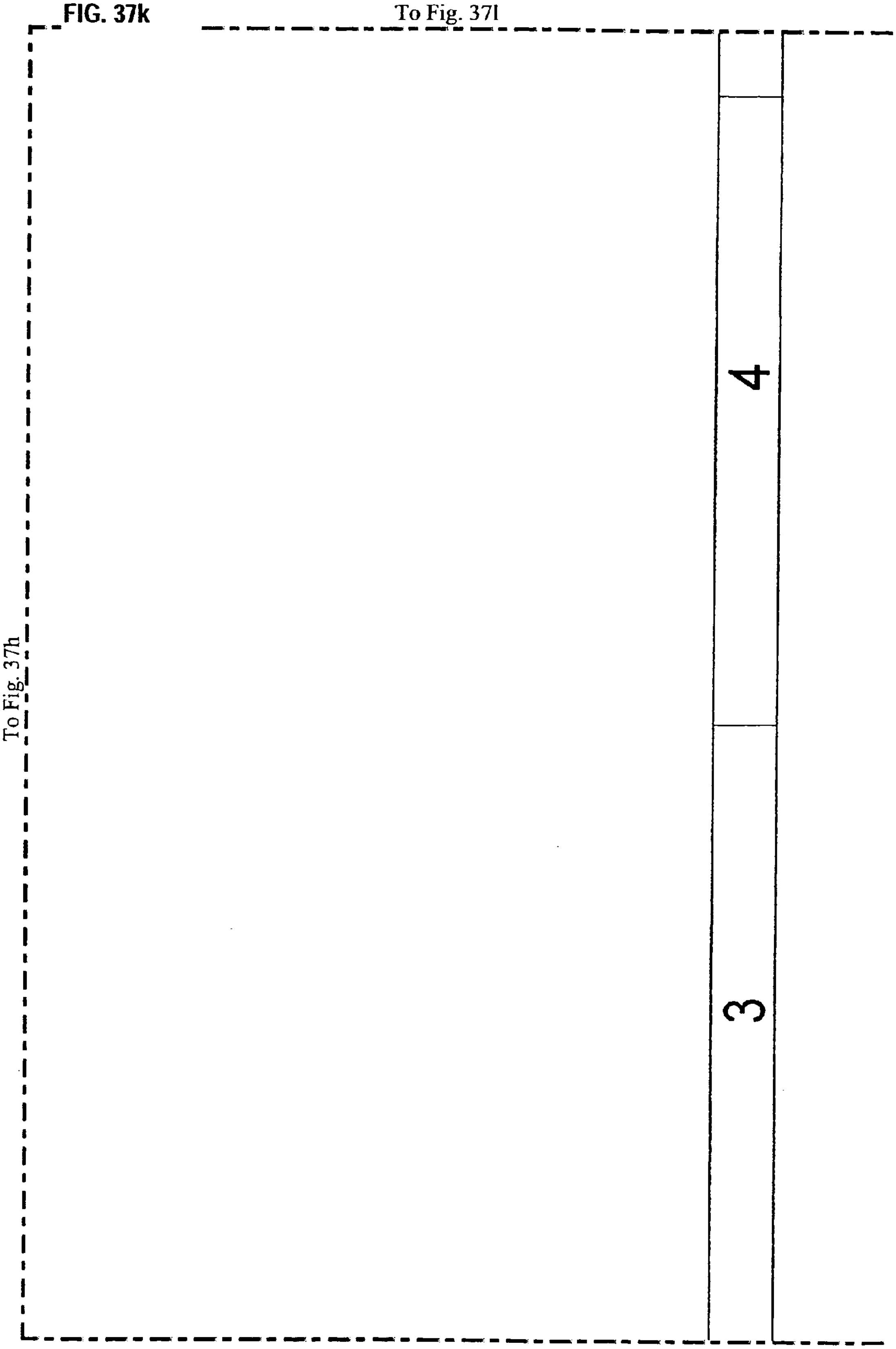
Figure 37L:
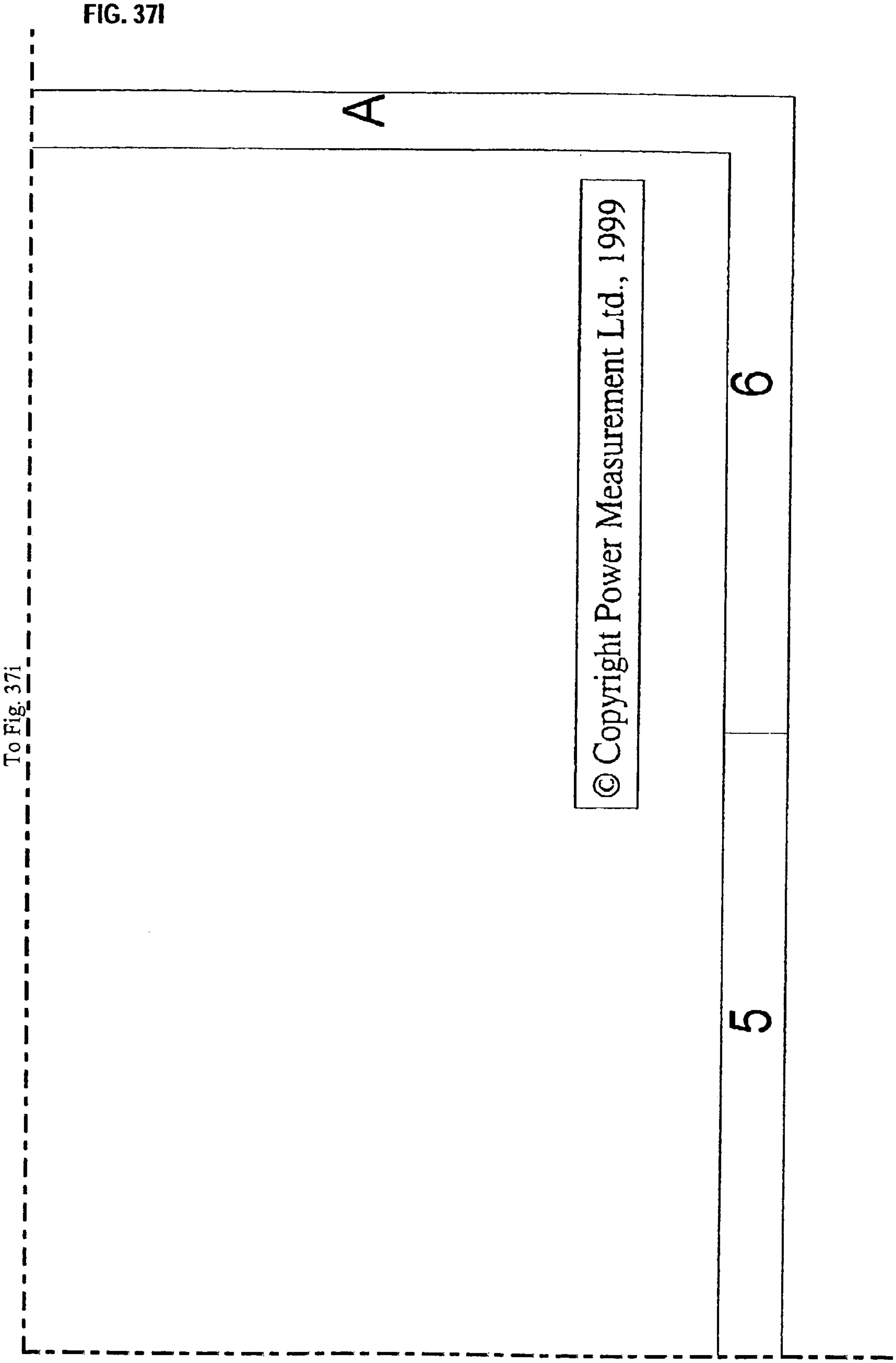
Figure 38A:
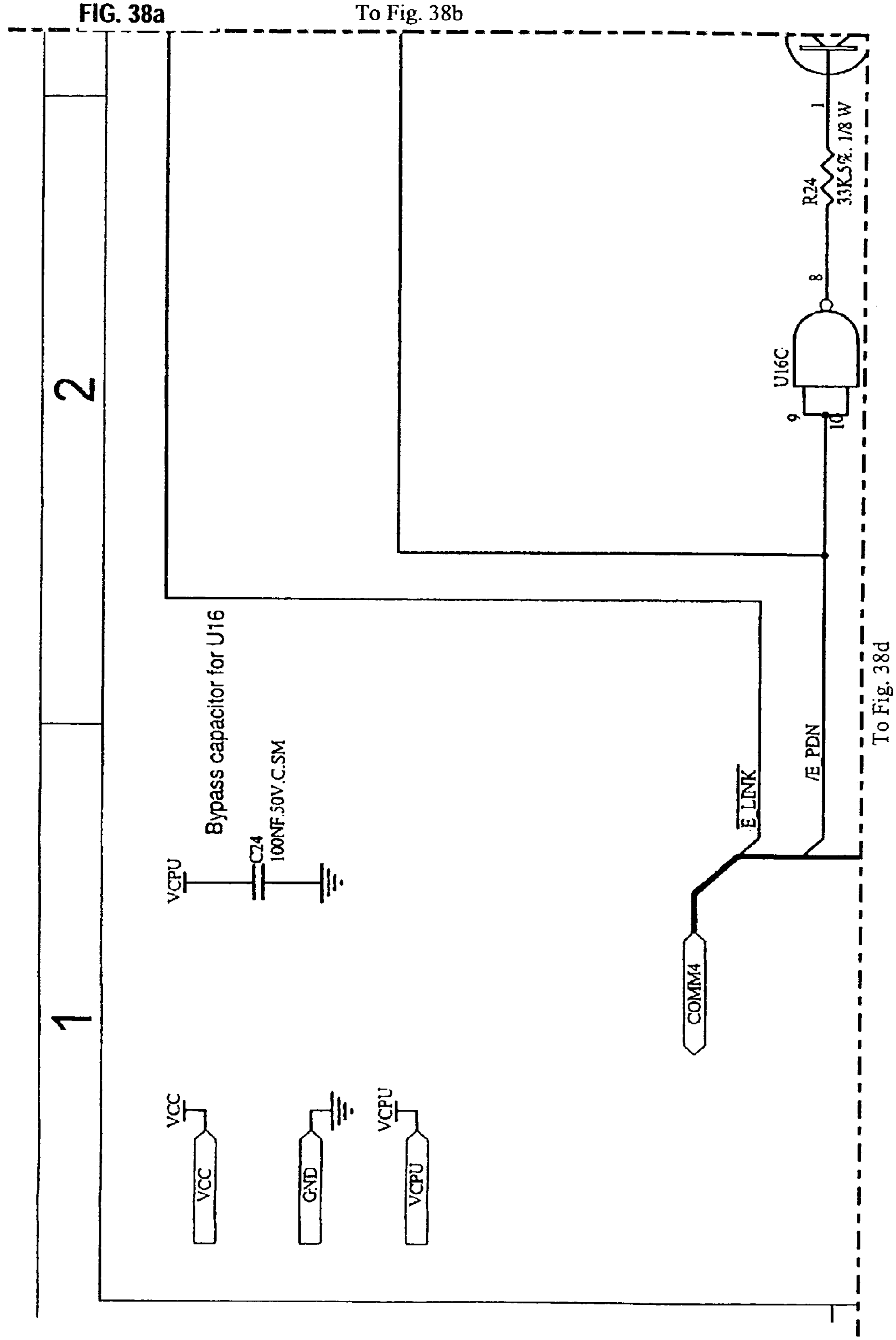
Figure 38B:
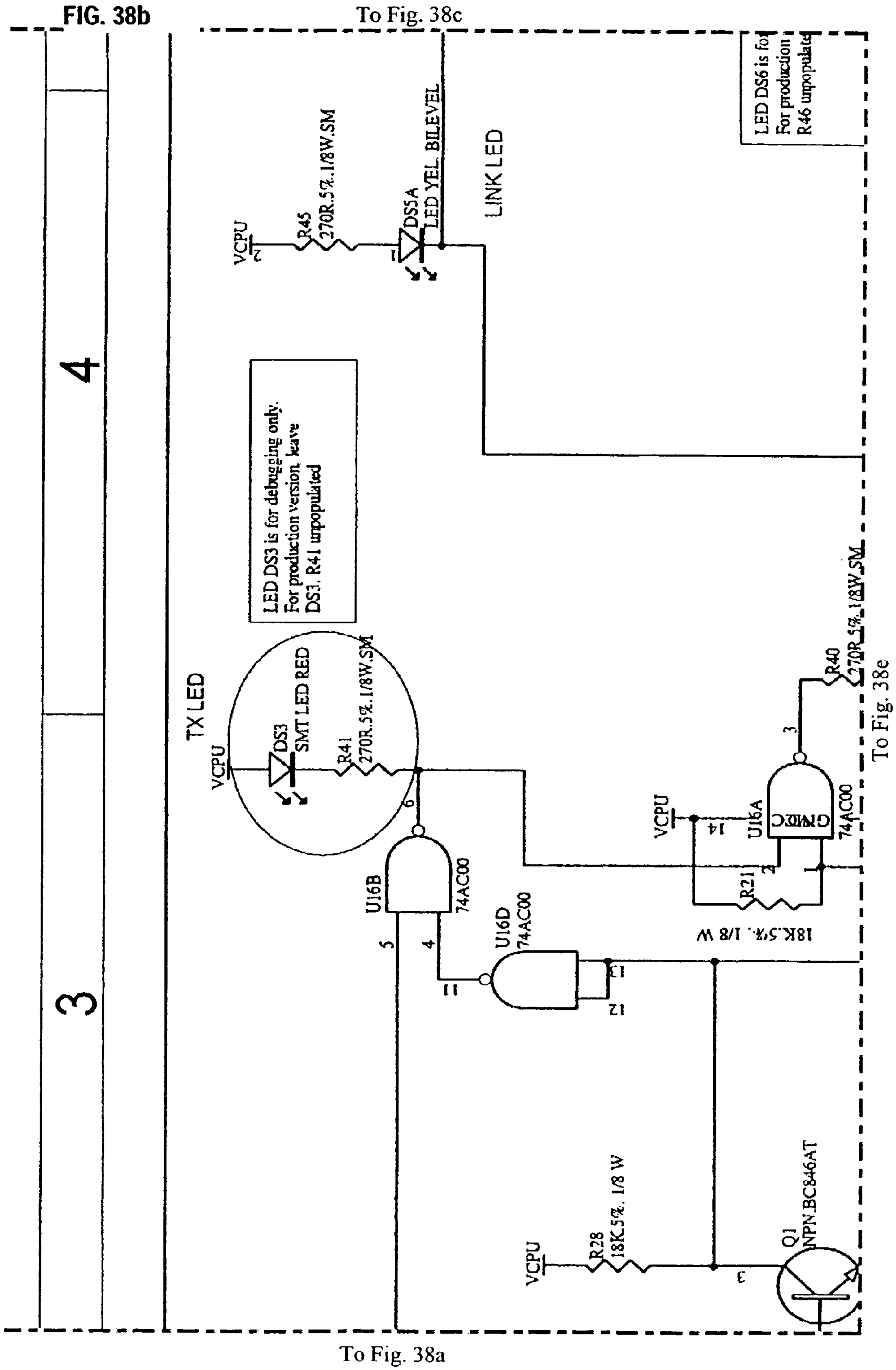
Figure 38C:
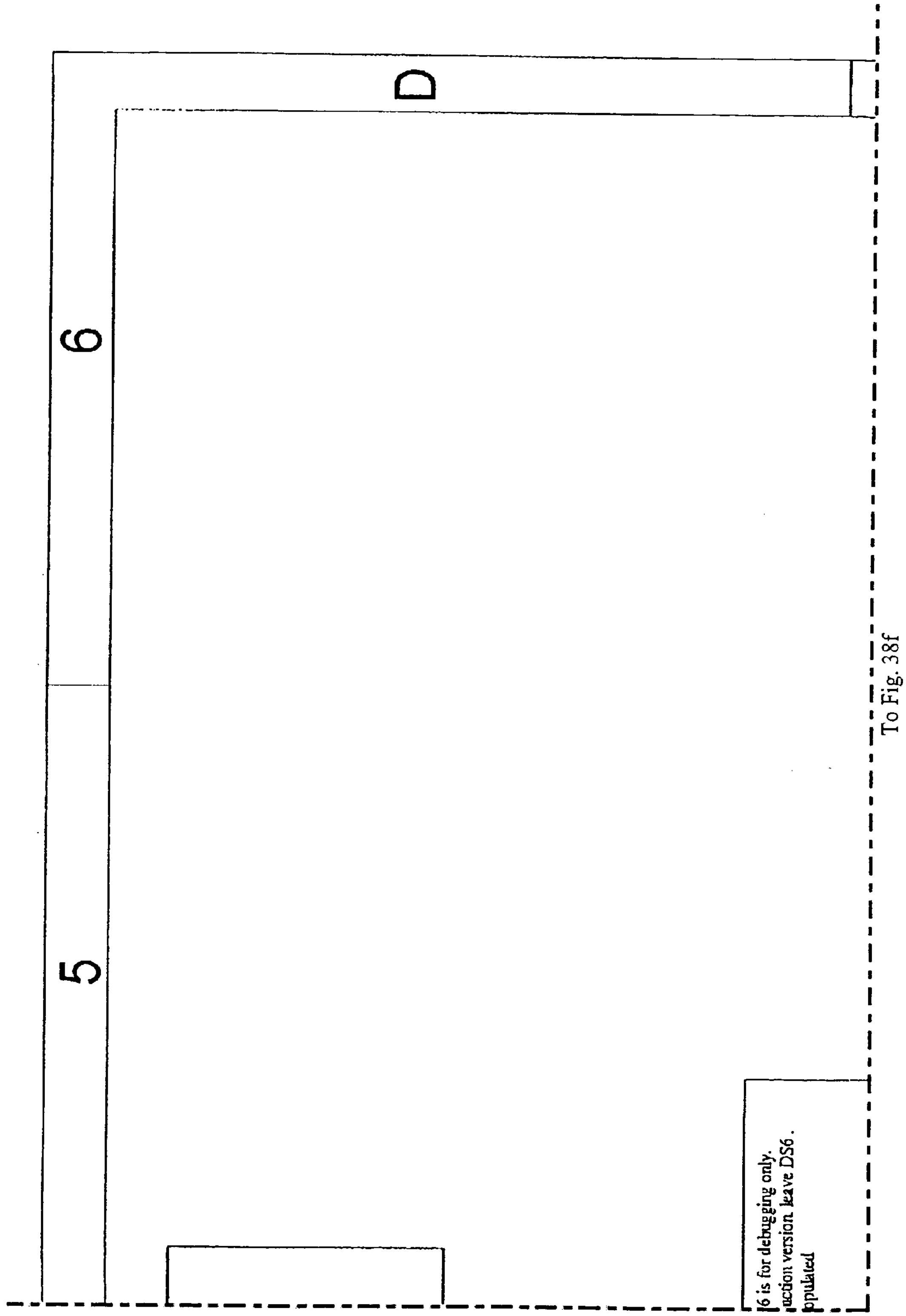
Figure 38D:
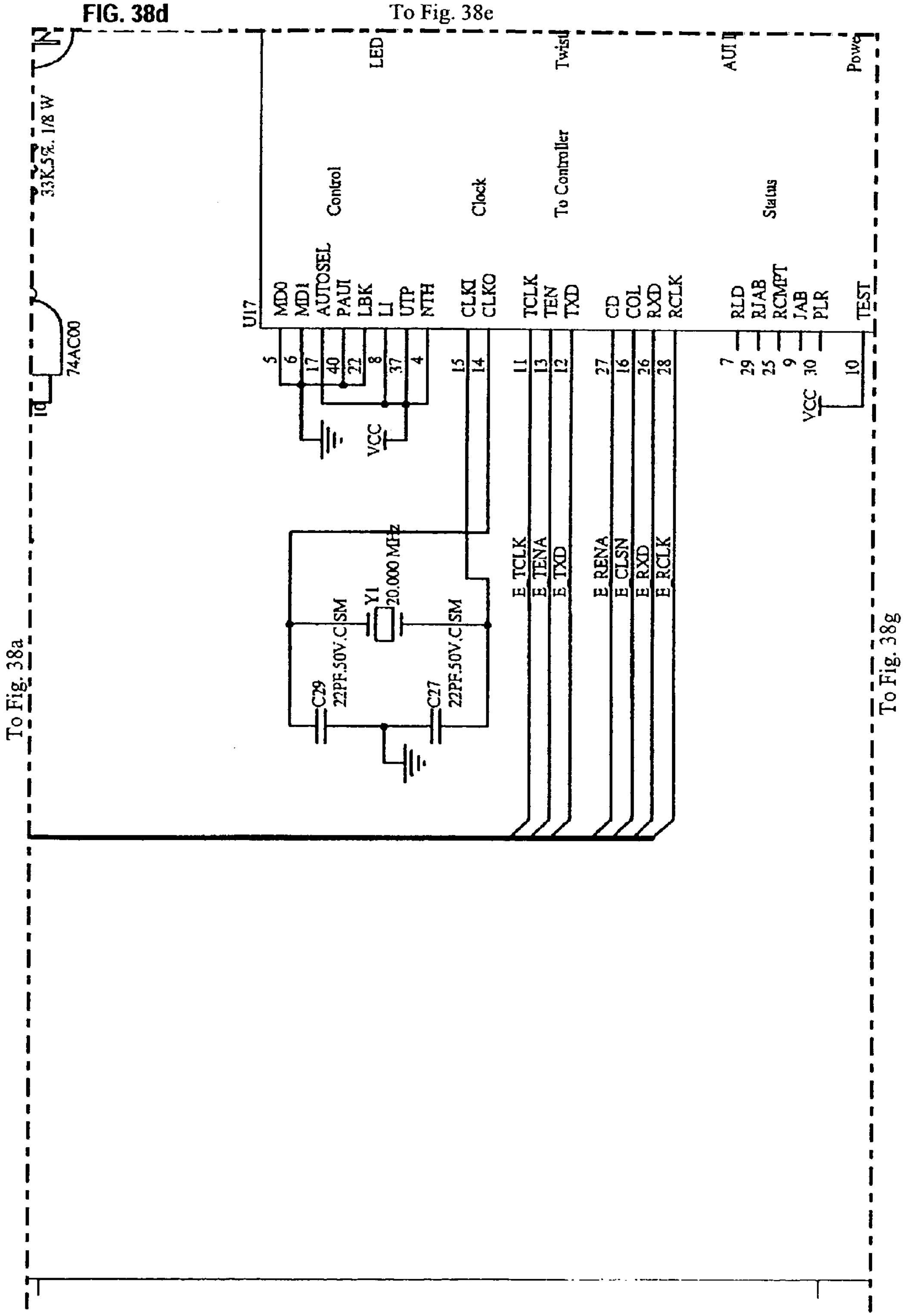
Figure 38E:
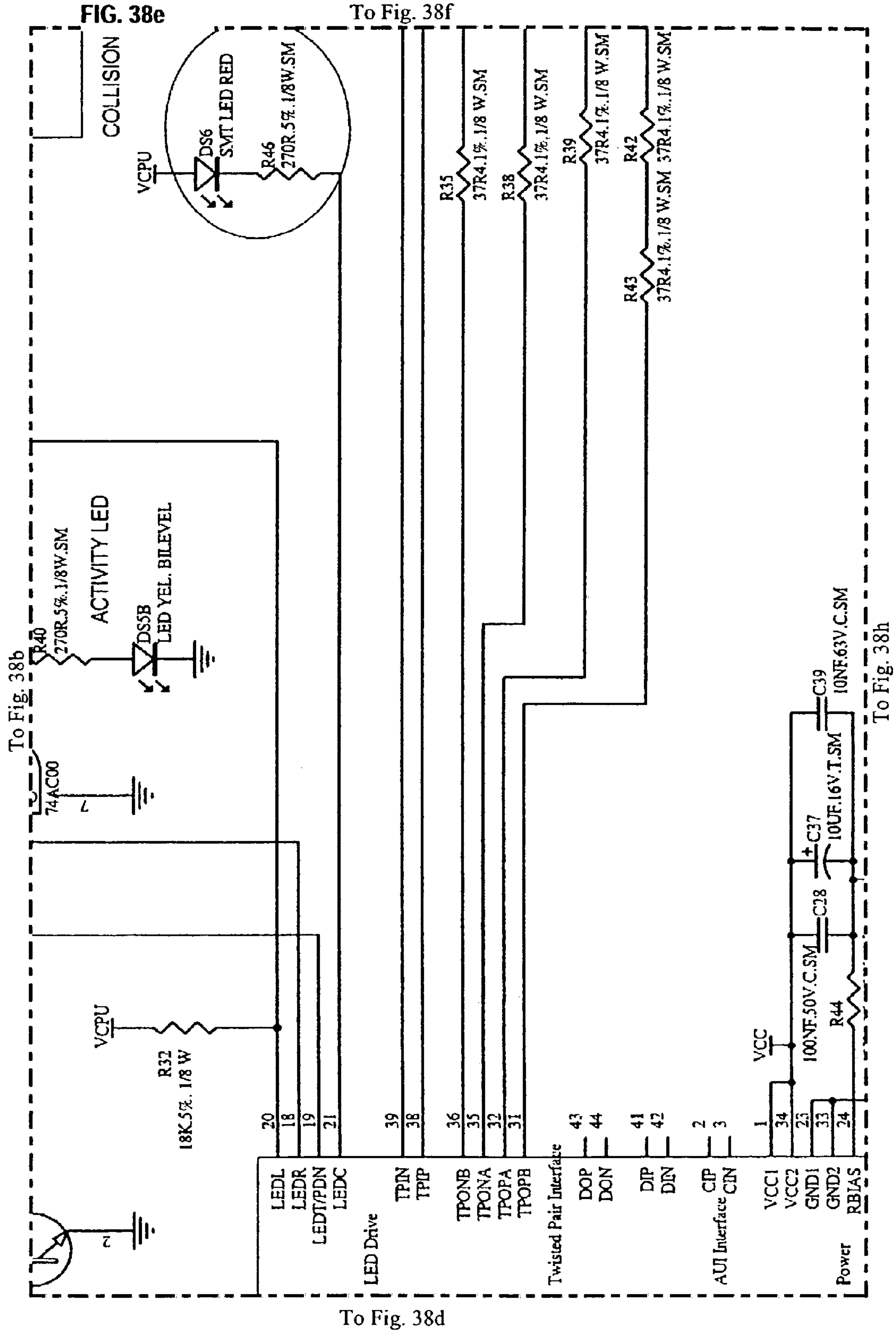
Figure 38F:
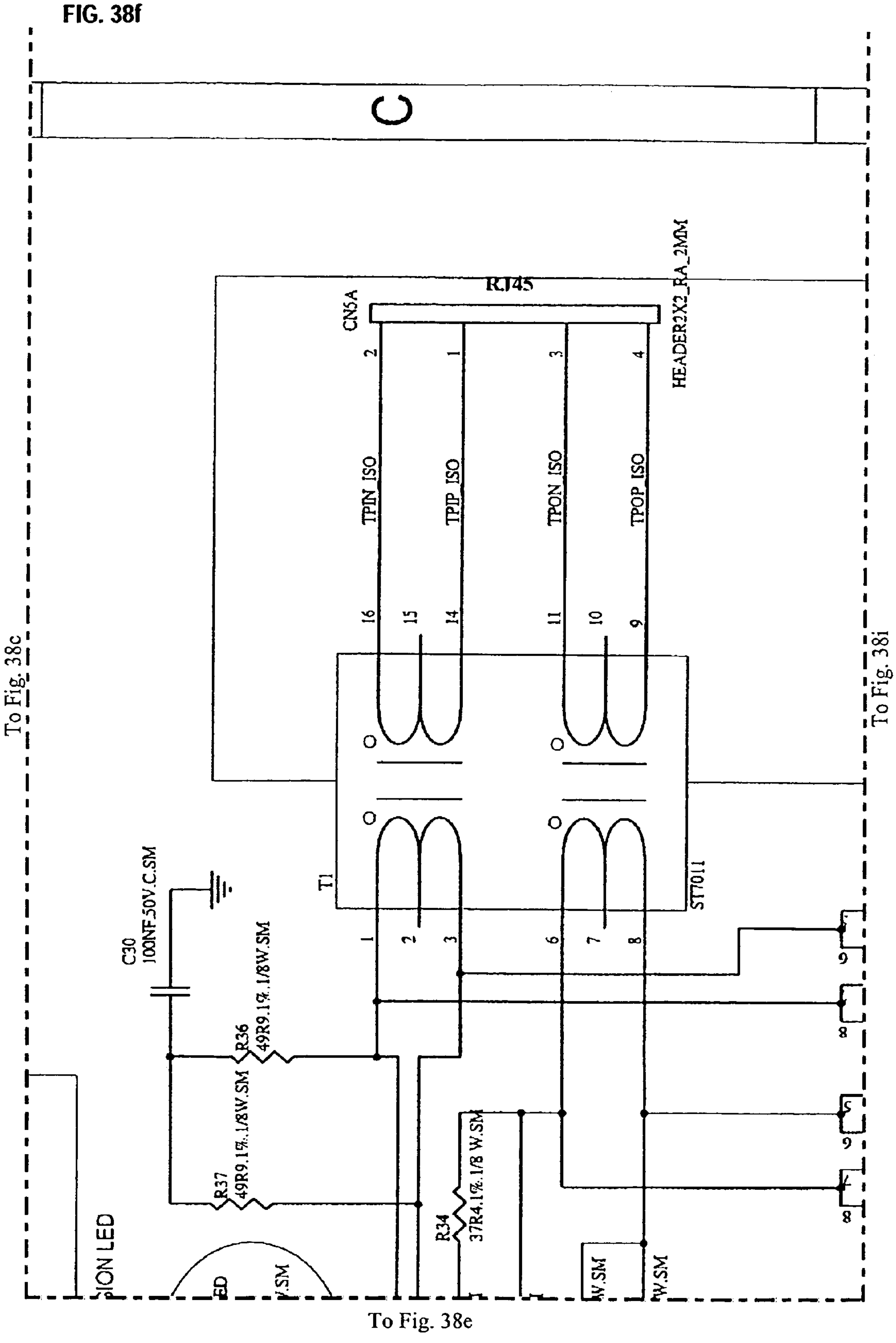
Figure 38G:
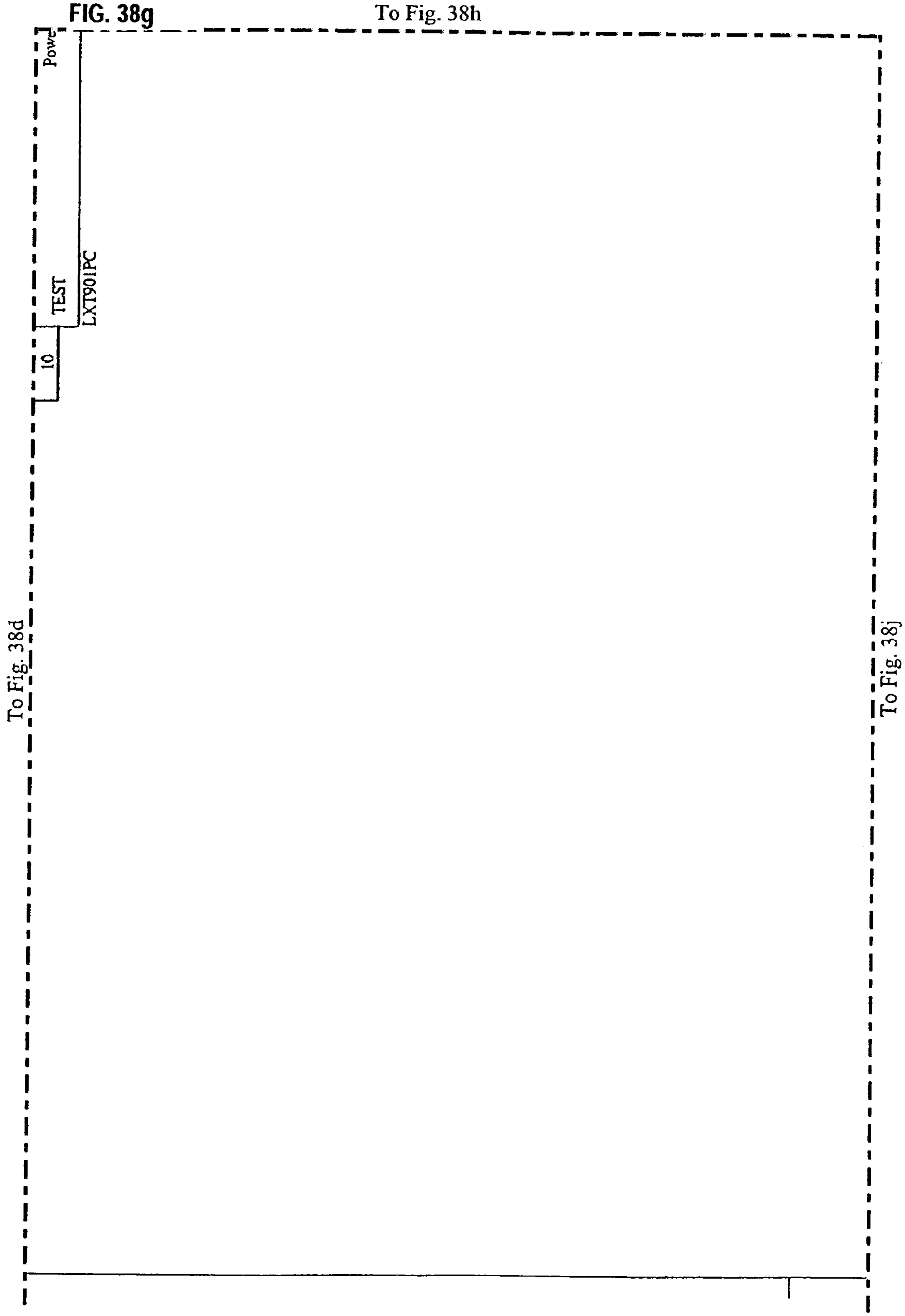
Figure 38H:
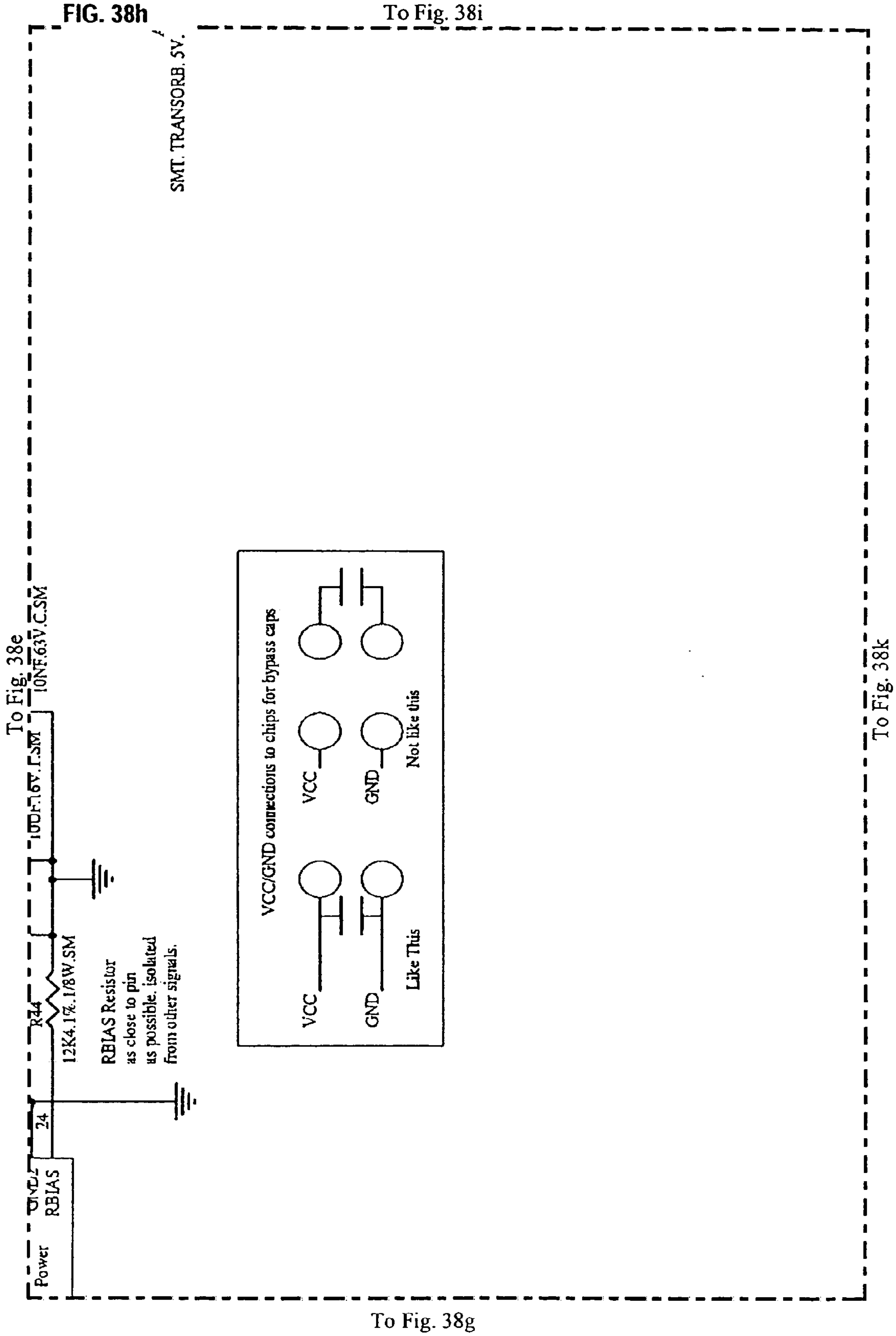
Figure 38I:
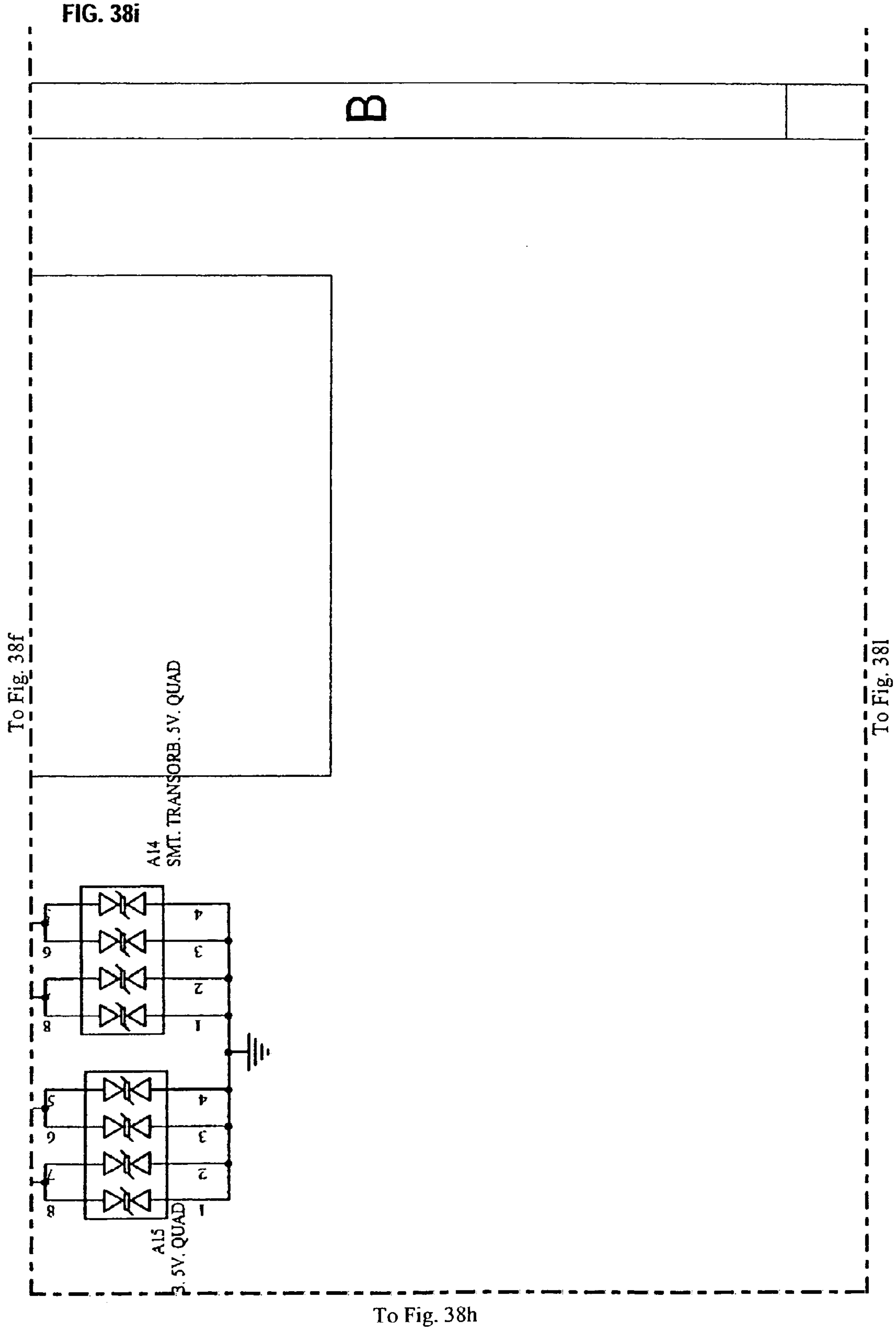
Figure 38J:
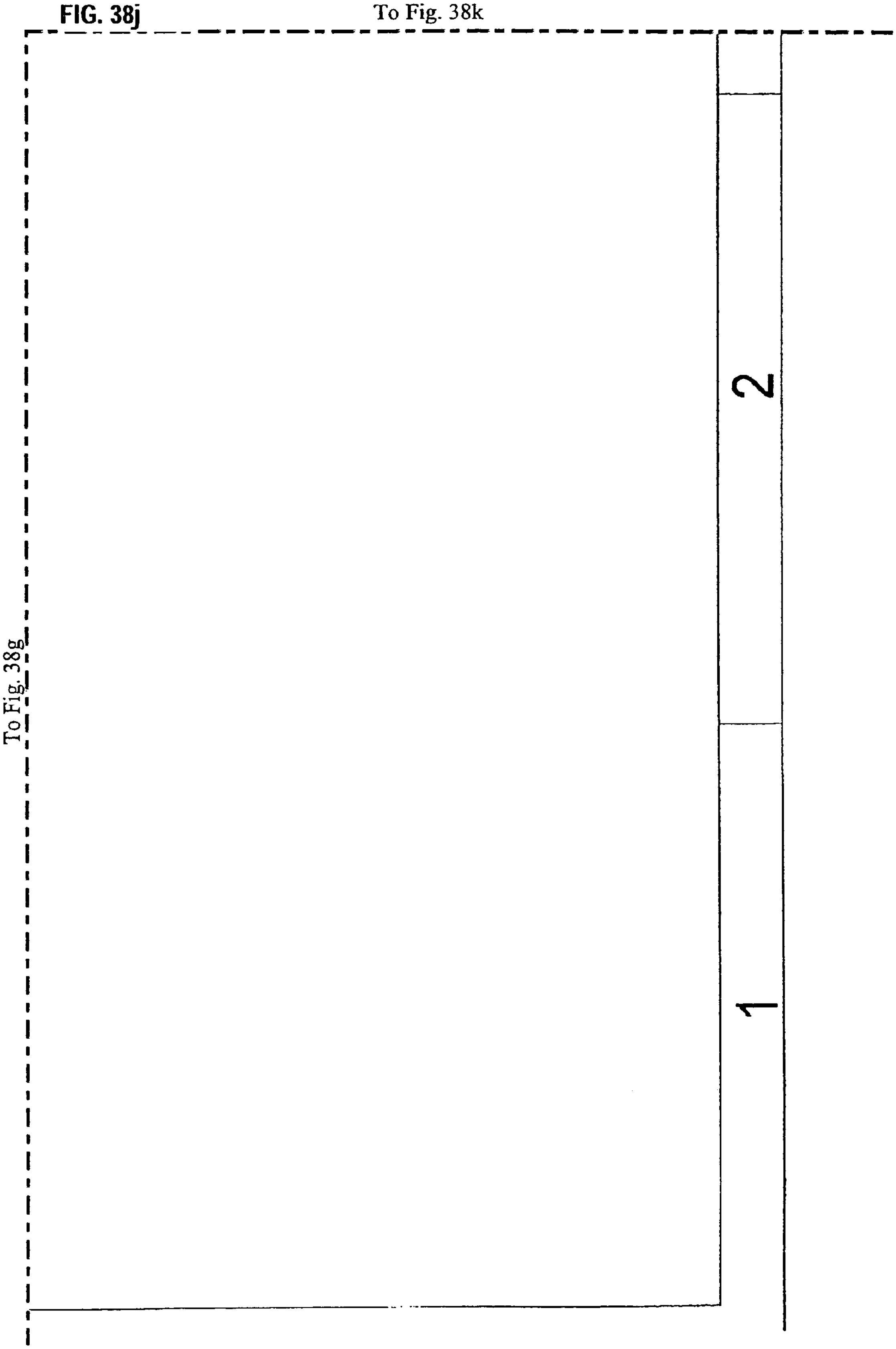
Figure 38K:
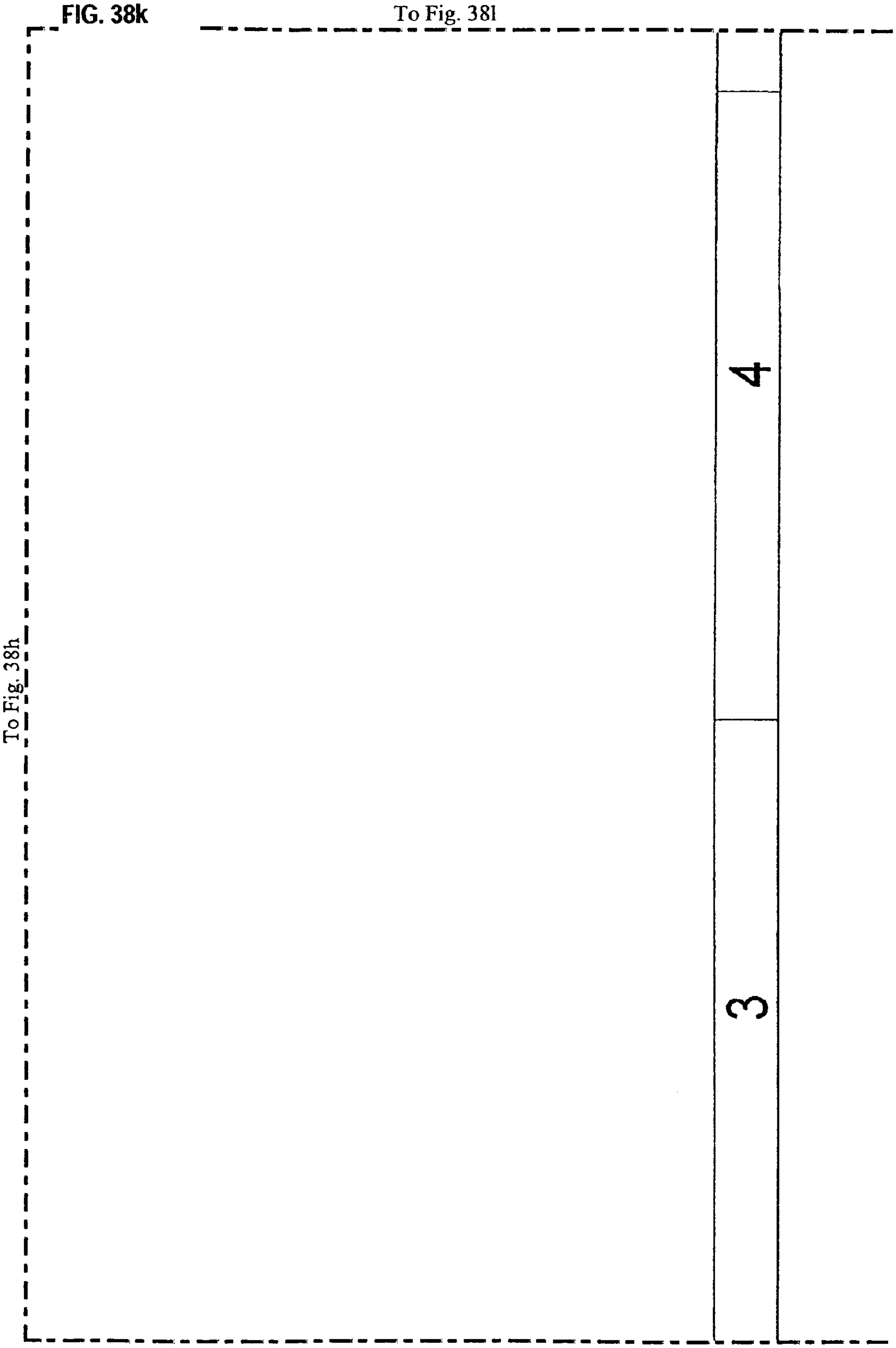
Figure 38L:
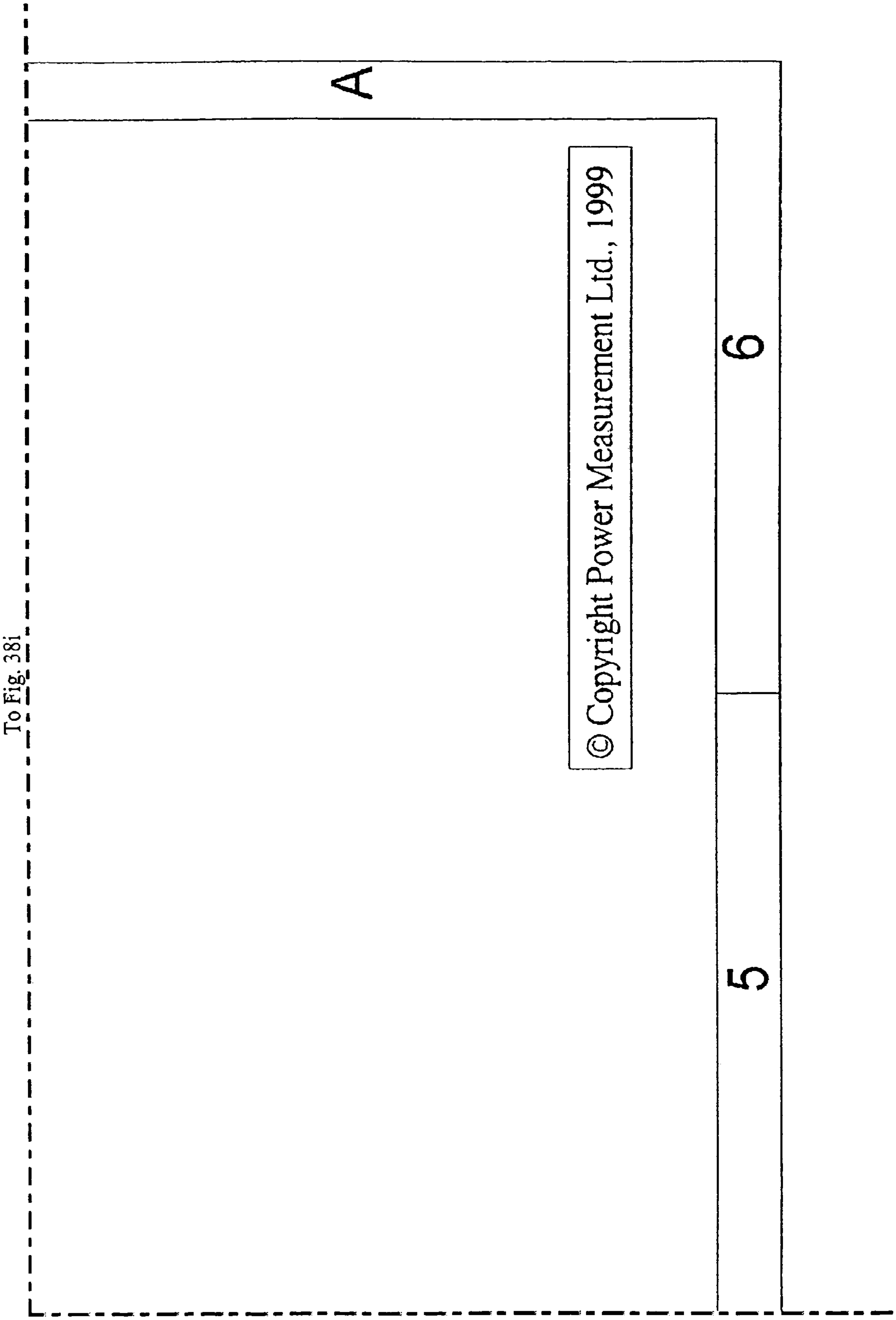
Figure 39A:
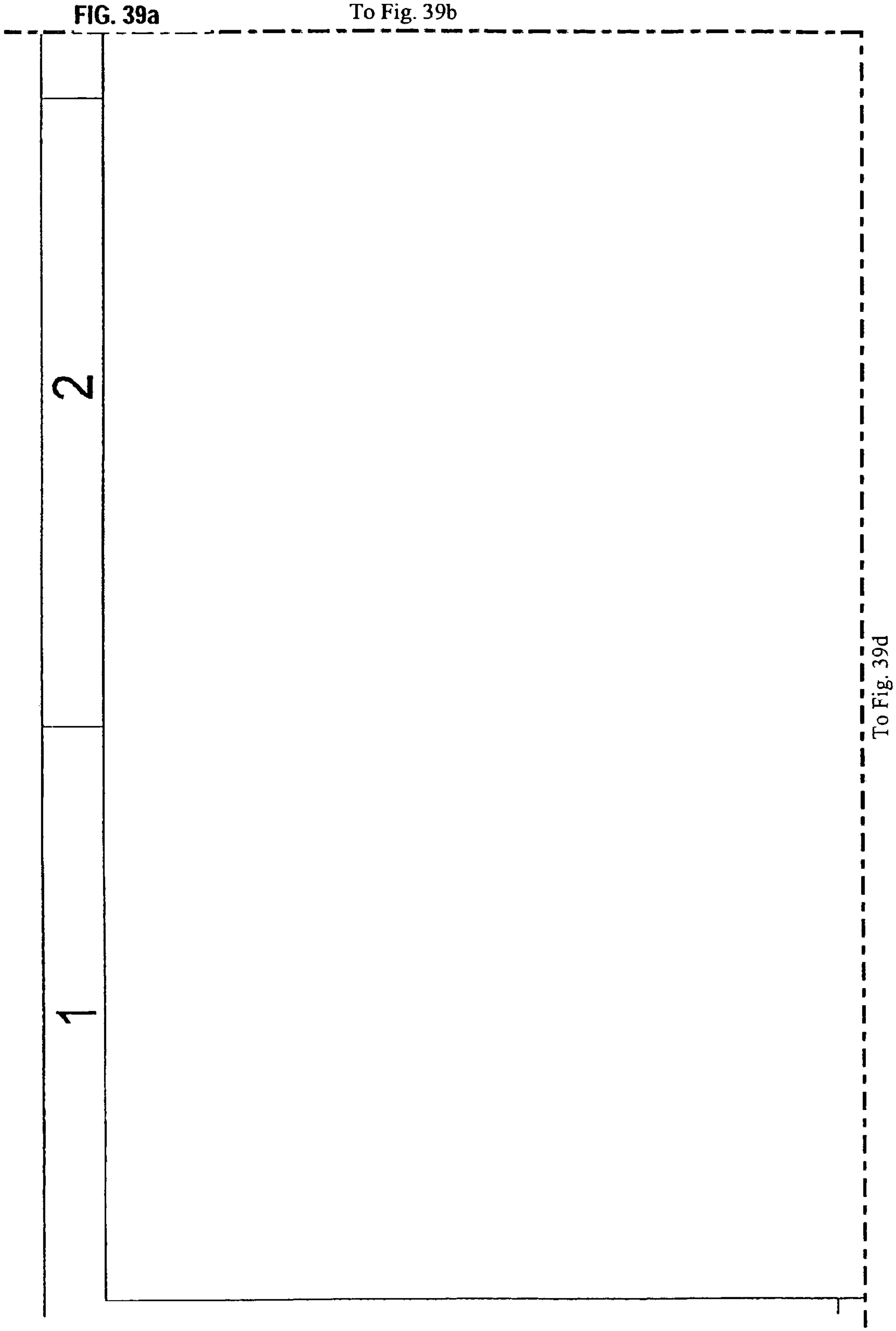
Figure 39B:
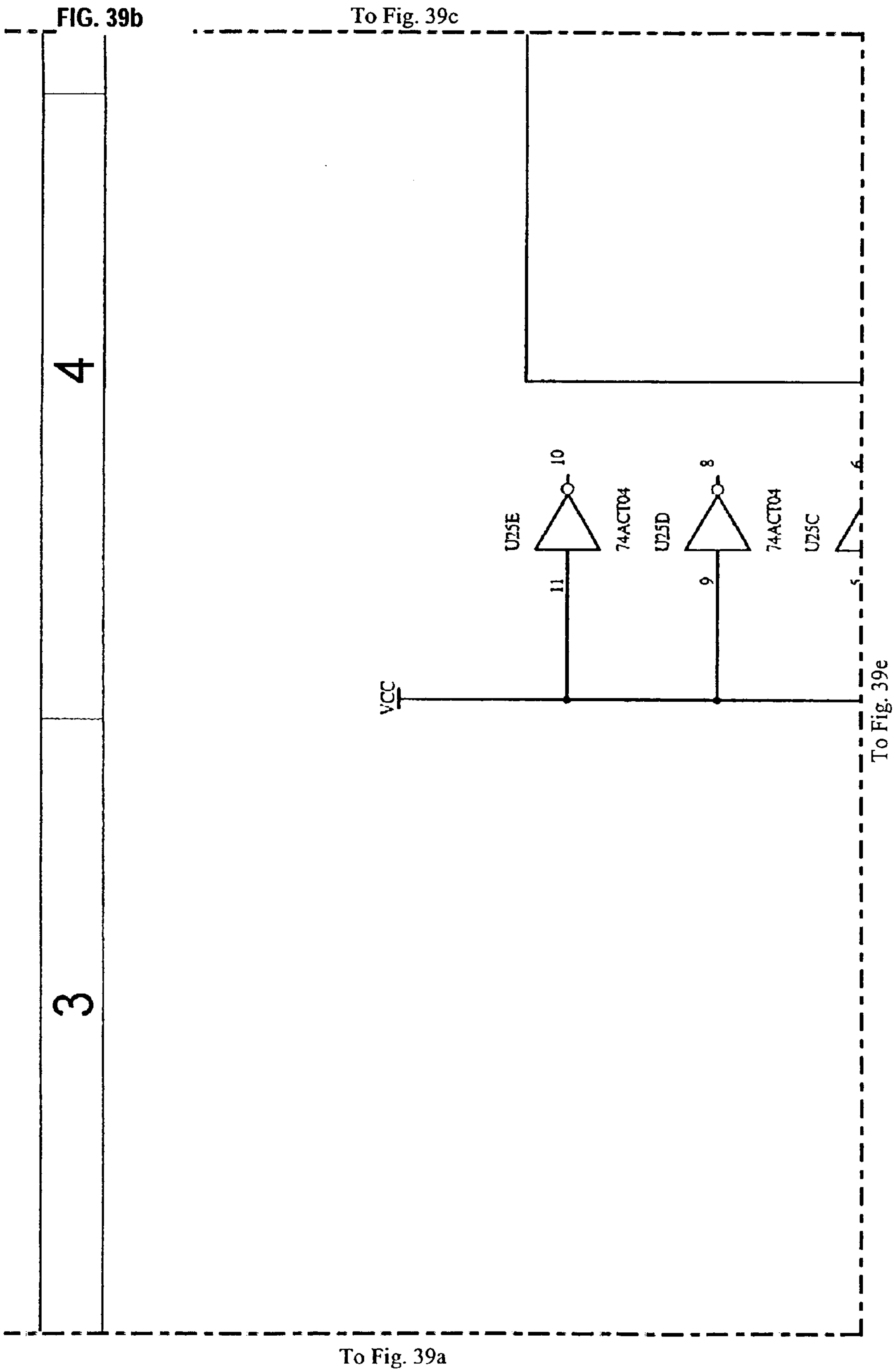
Figure 39C:
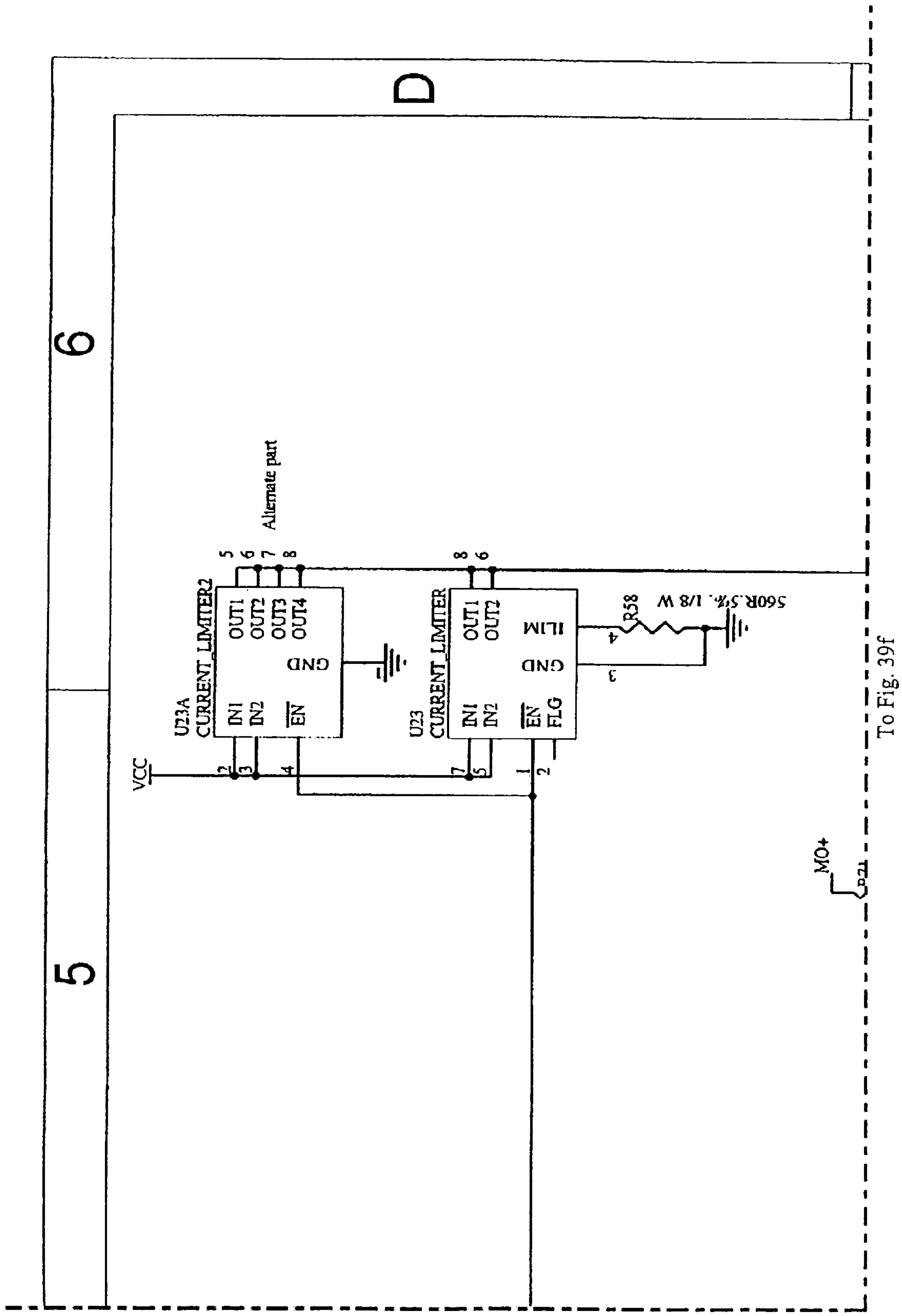
Figure 39D:
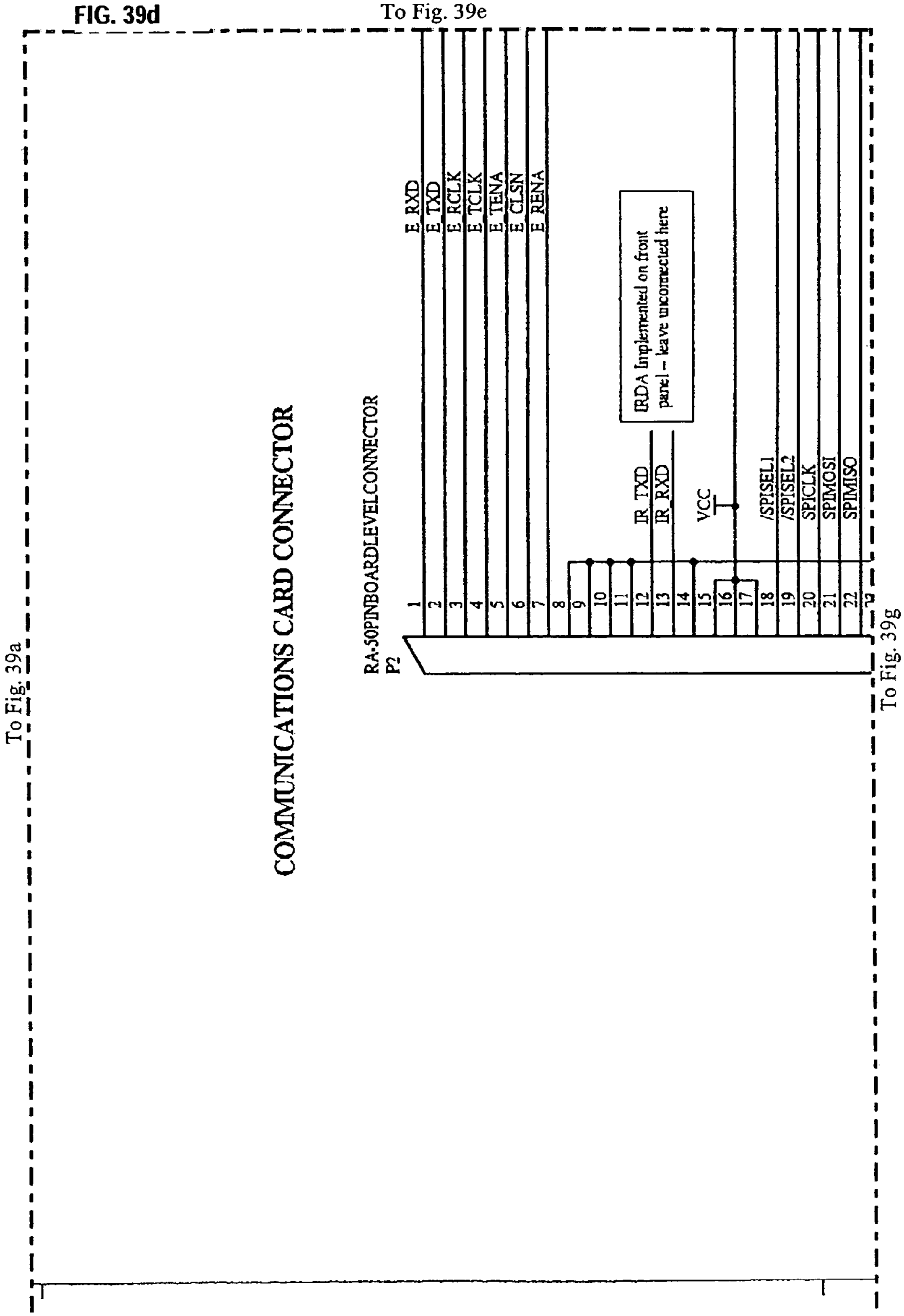
Figure 39E:
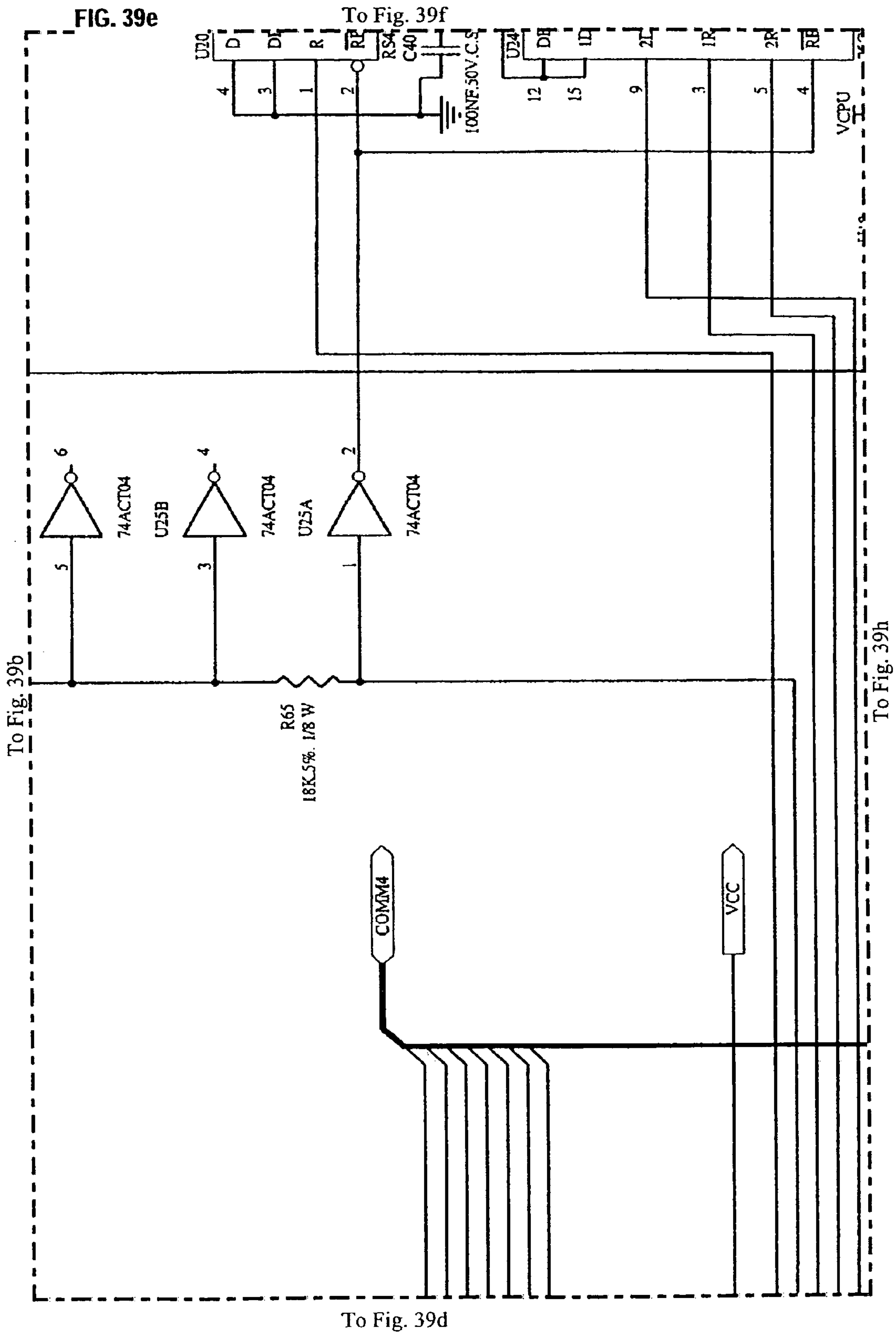
Figure 39F:
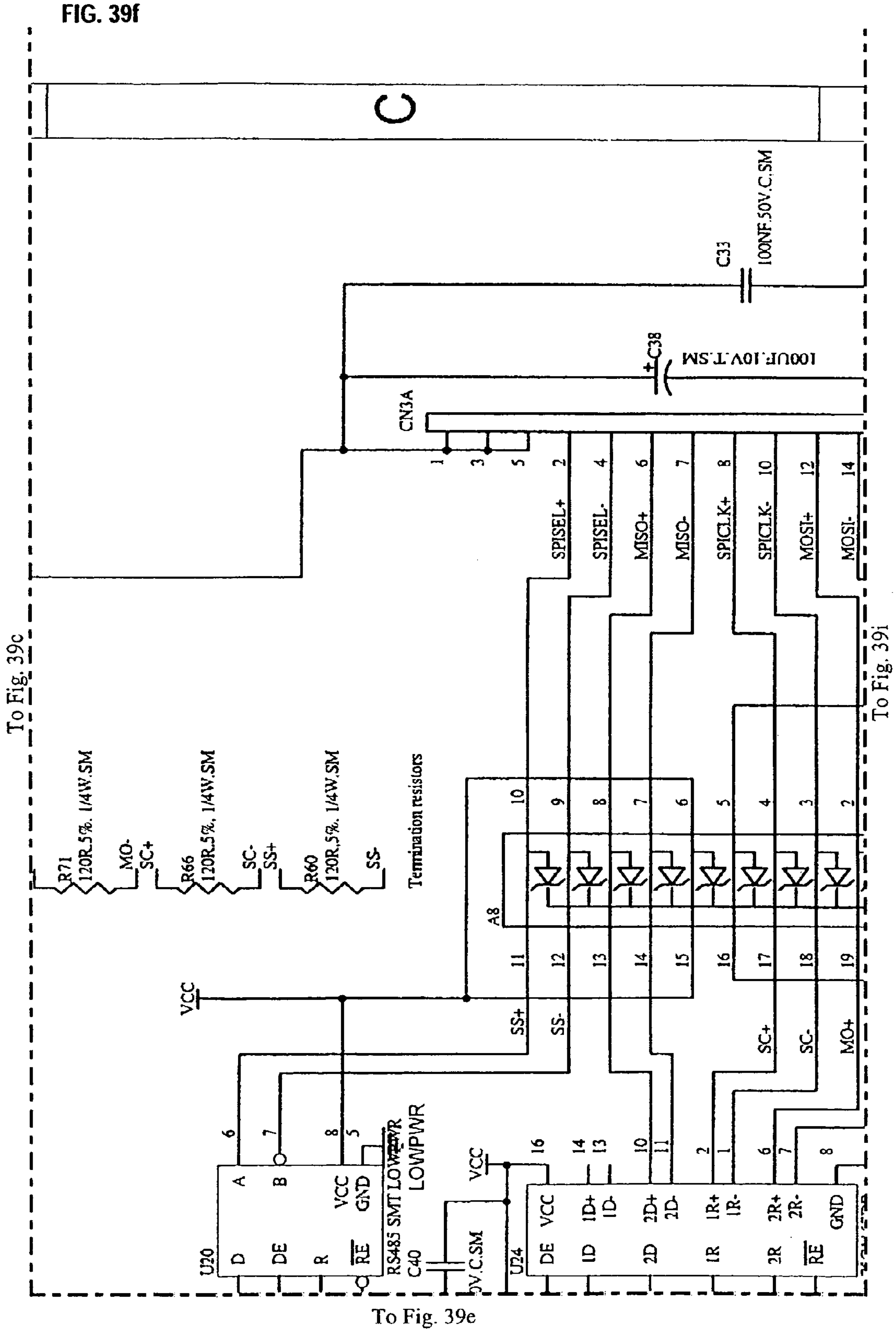
Figure 39G:
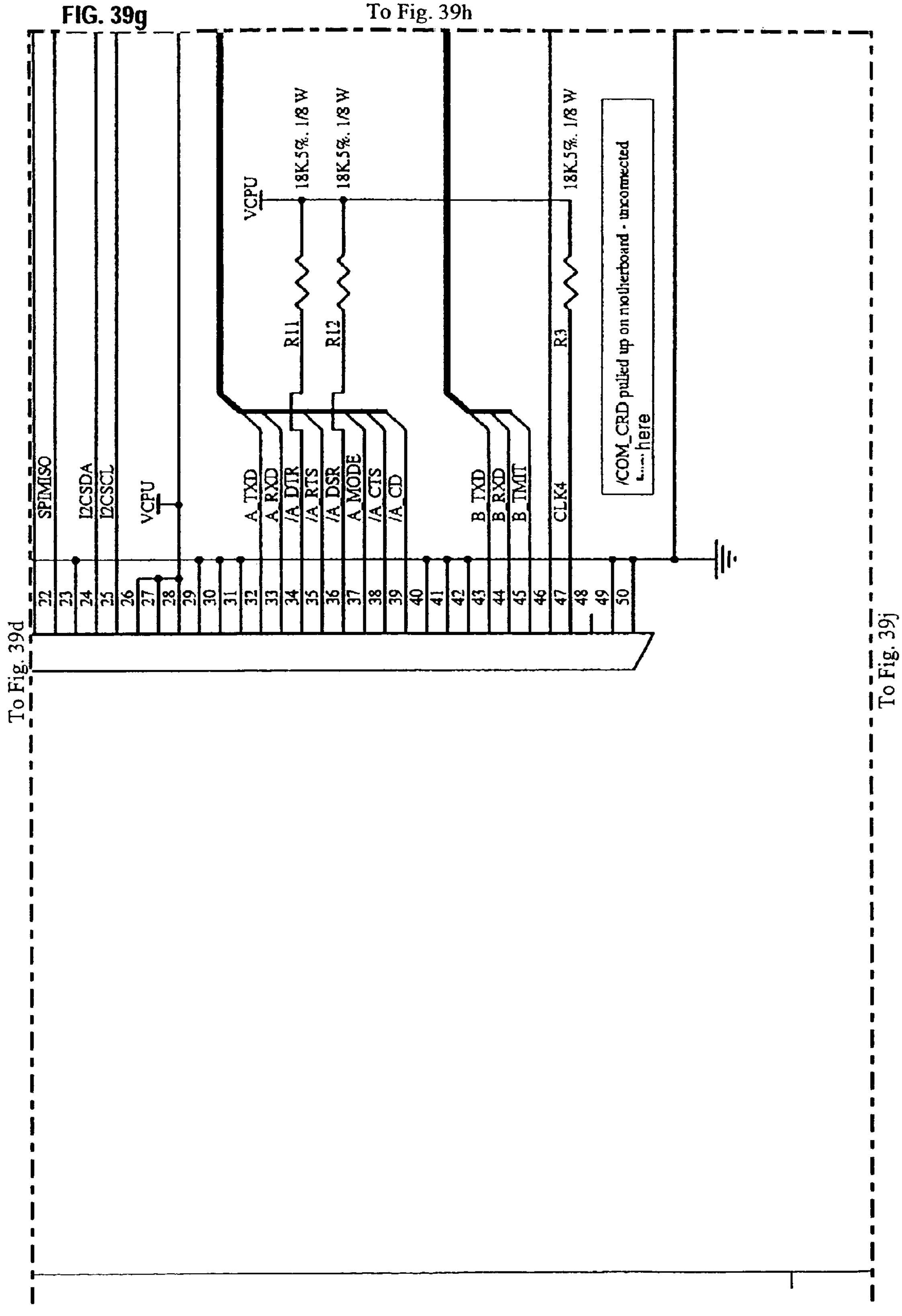
Figure 39H:
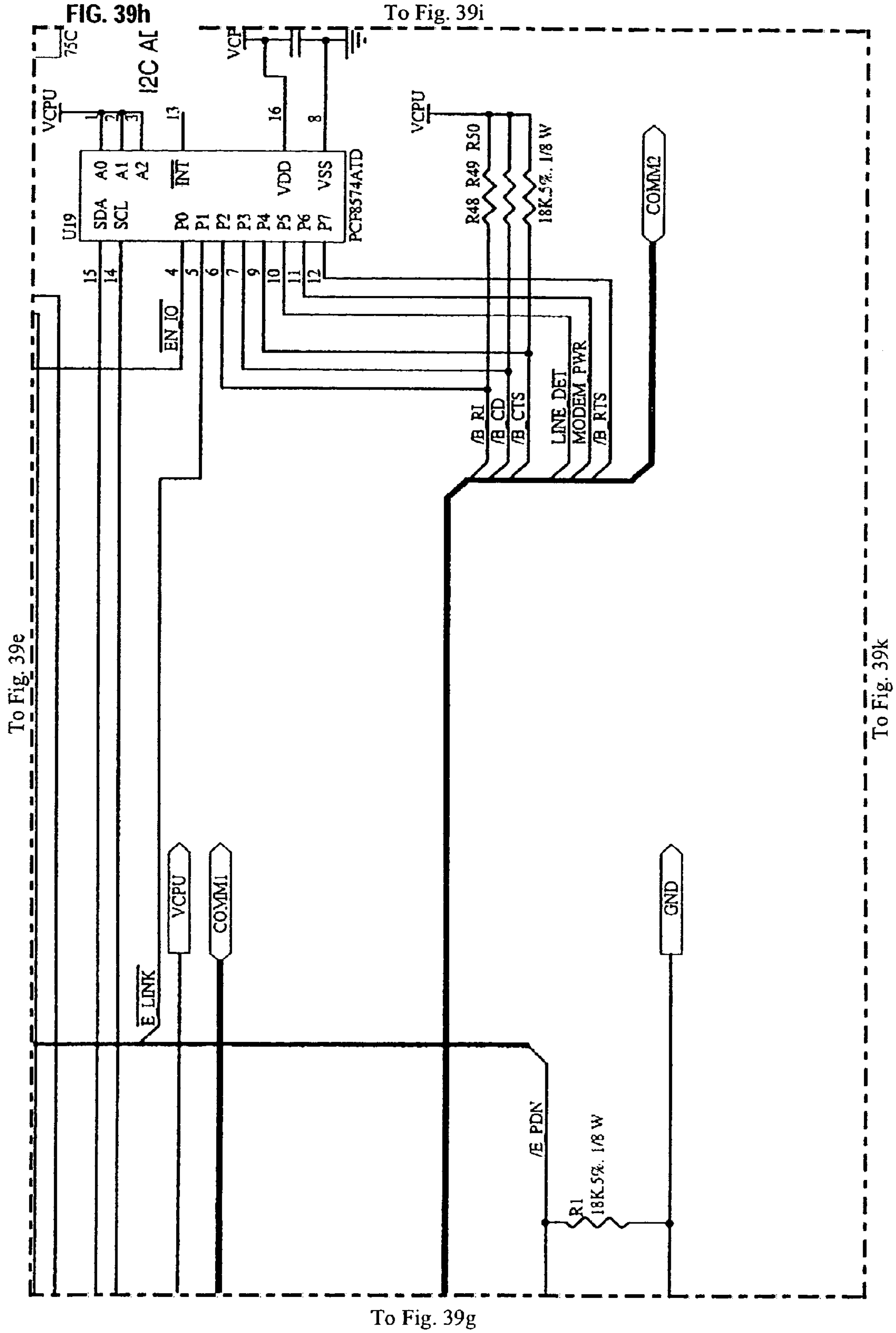
Figure 39I:
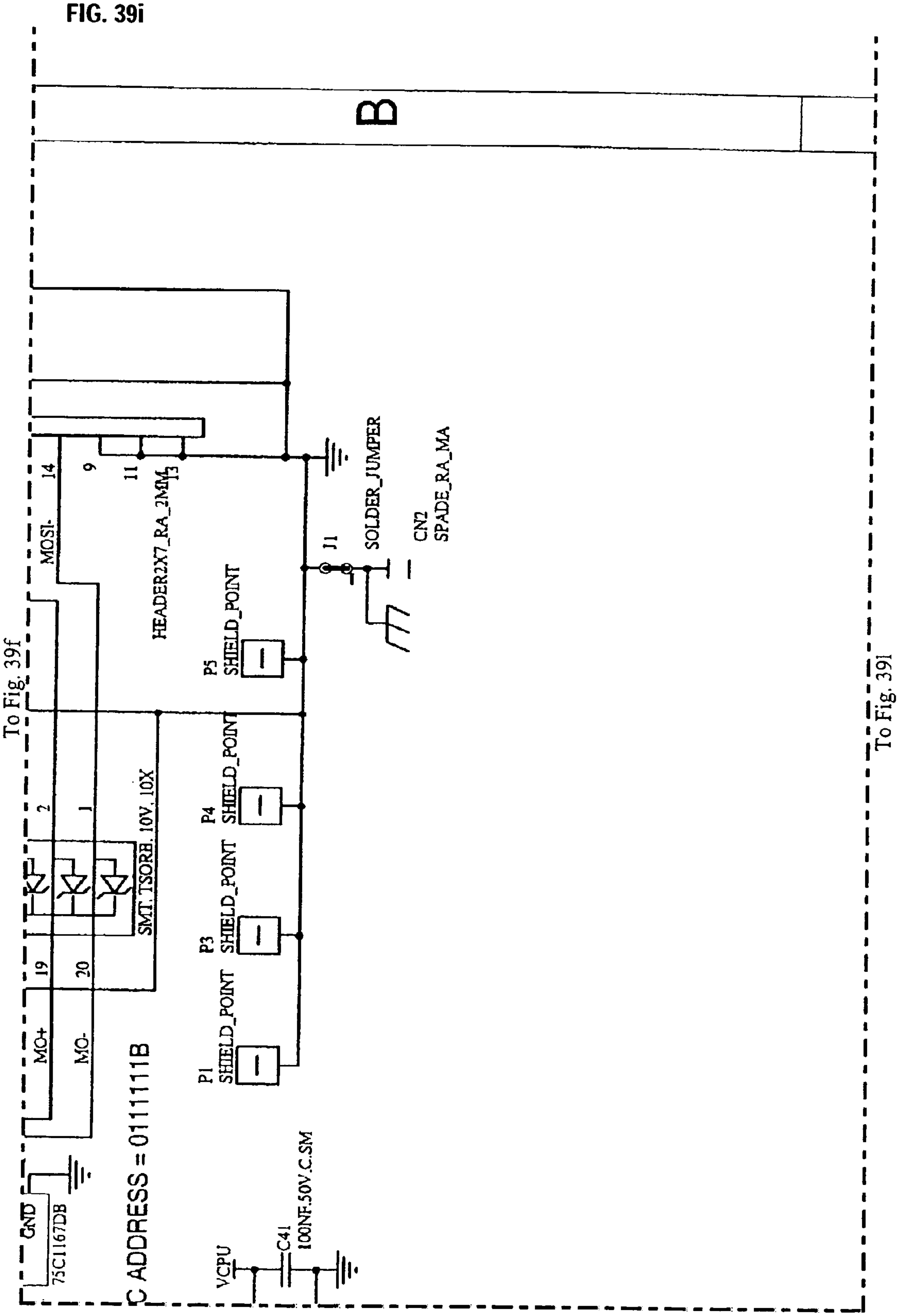
Figure 39J:
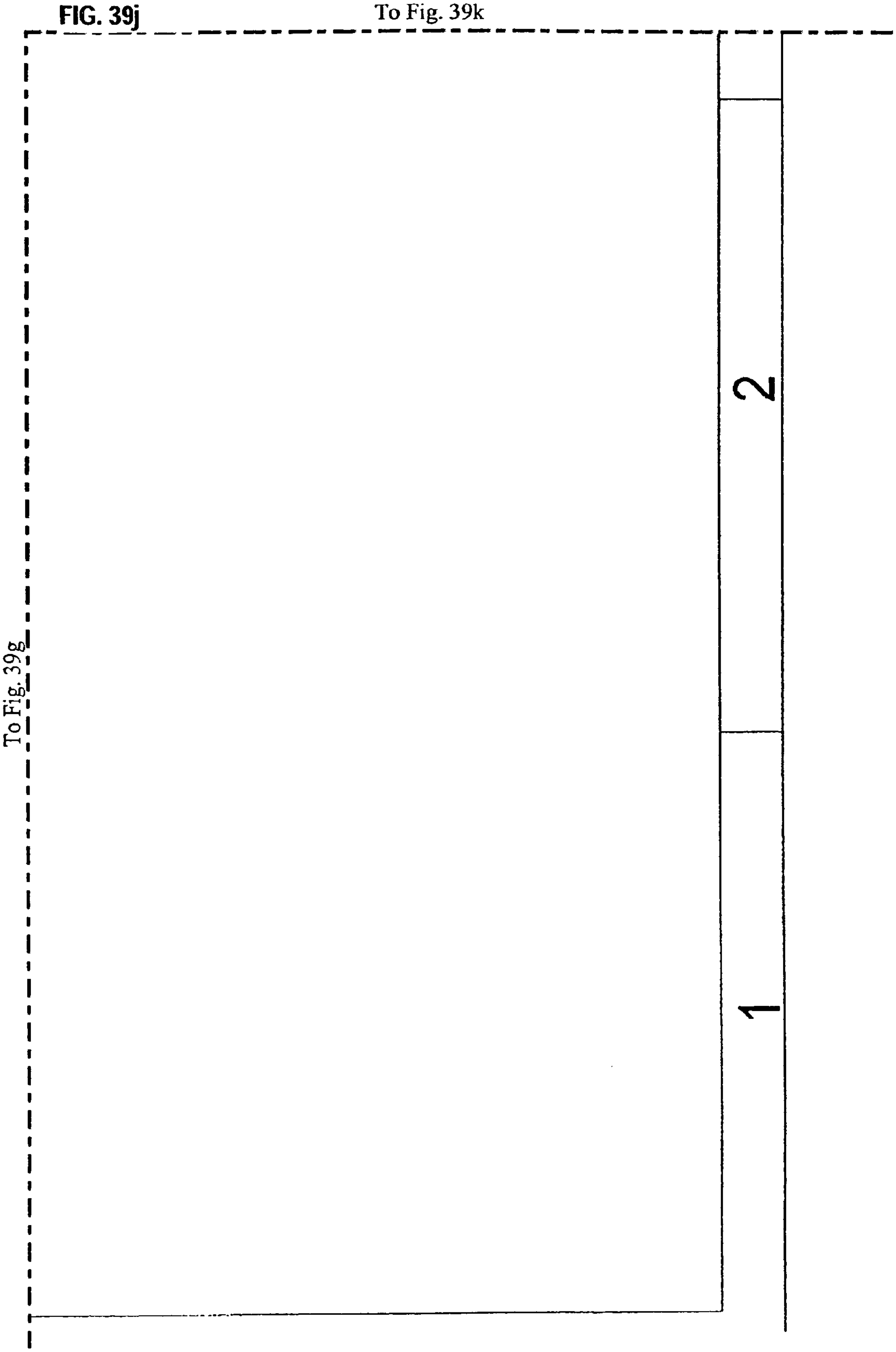
Figure 39K:
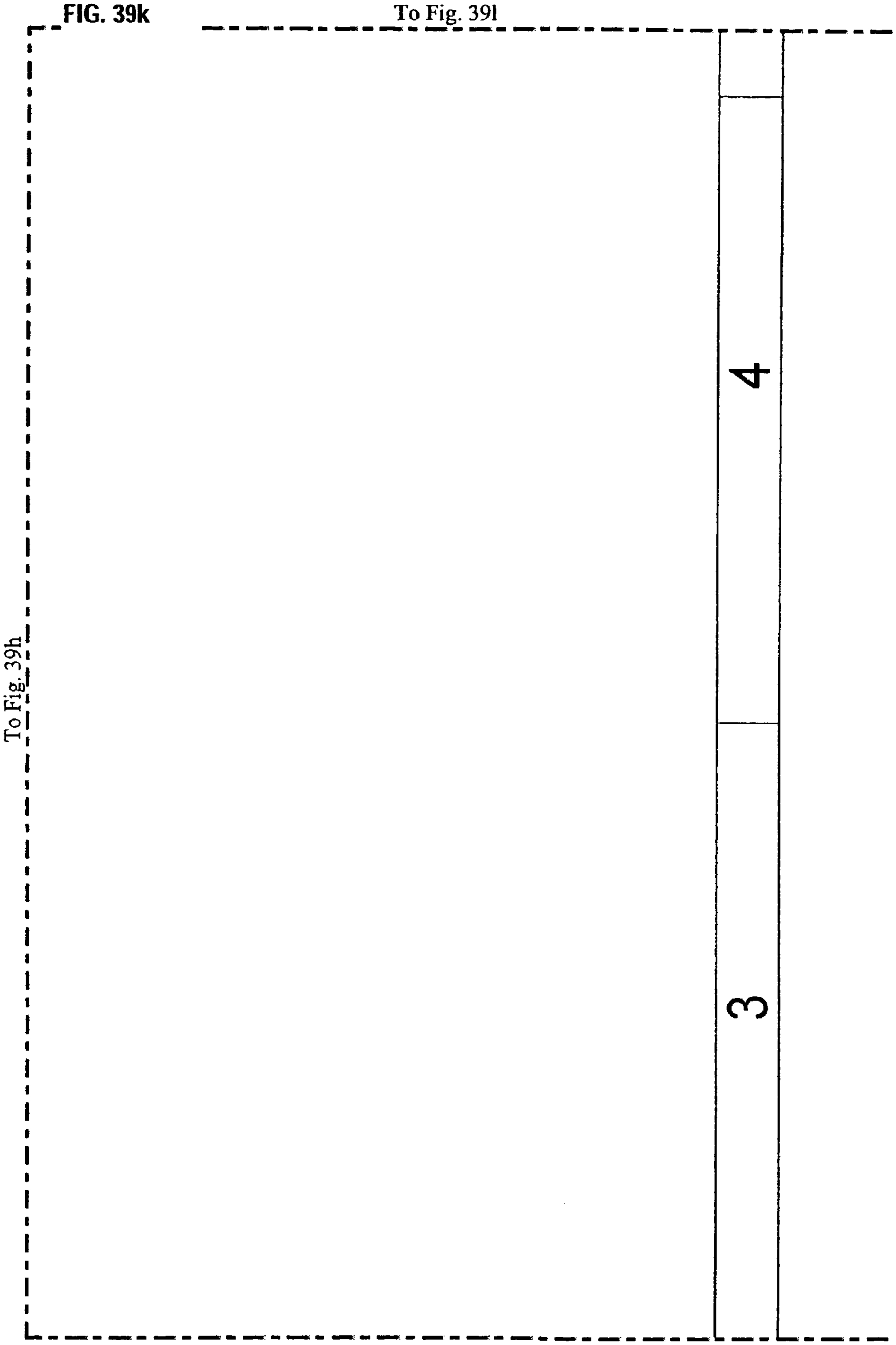
Figure 39L:
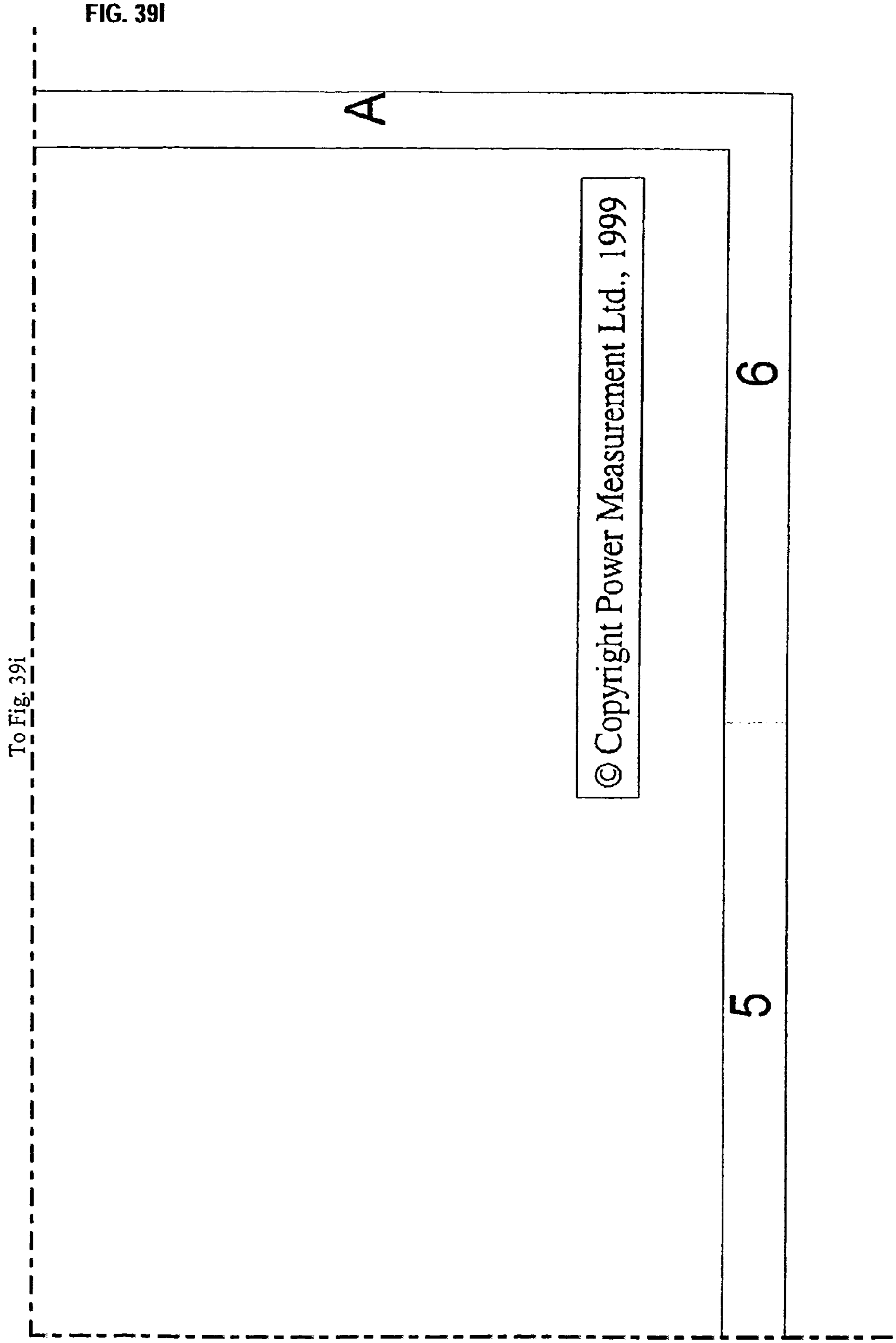
Figure 40A:
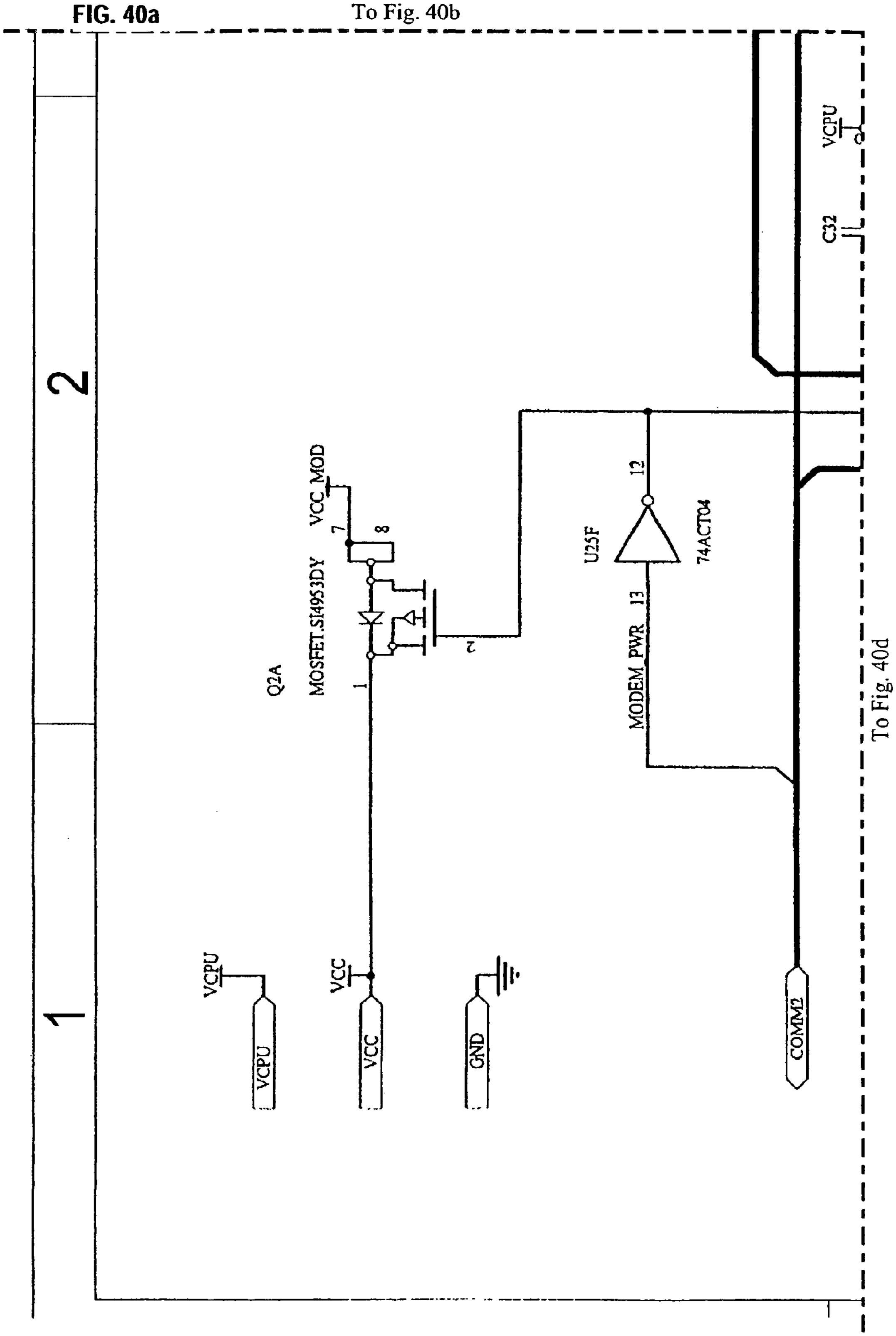
Figure 40B:
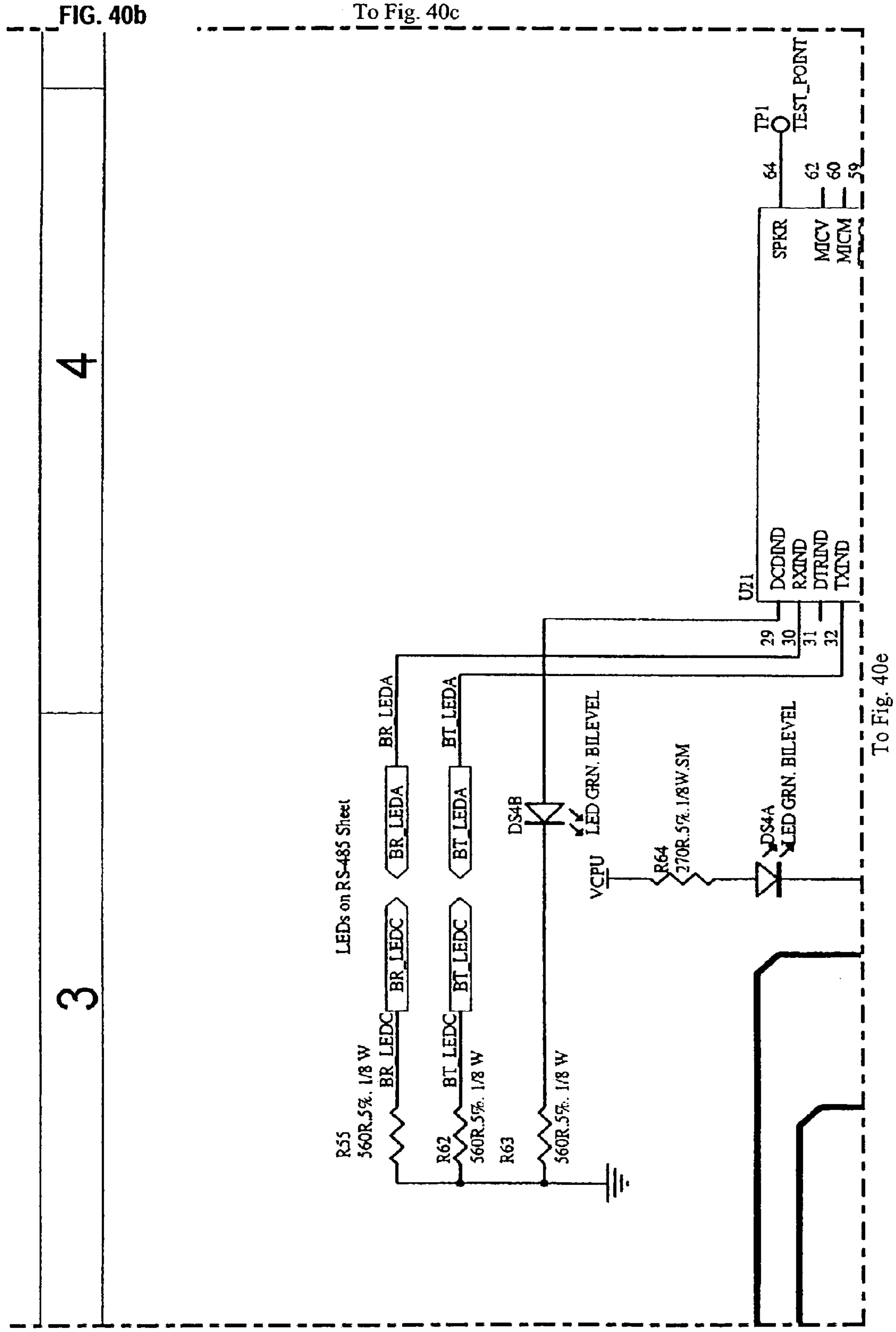
Figure 40C:
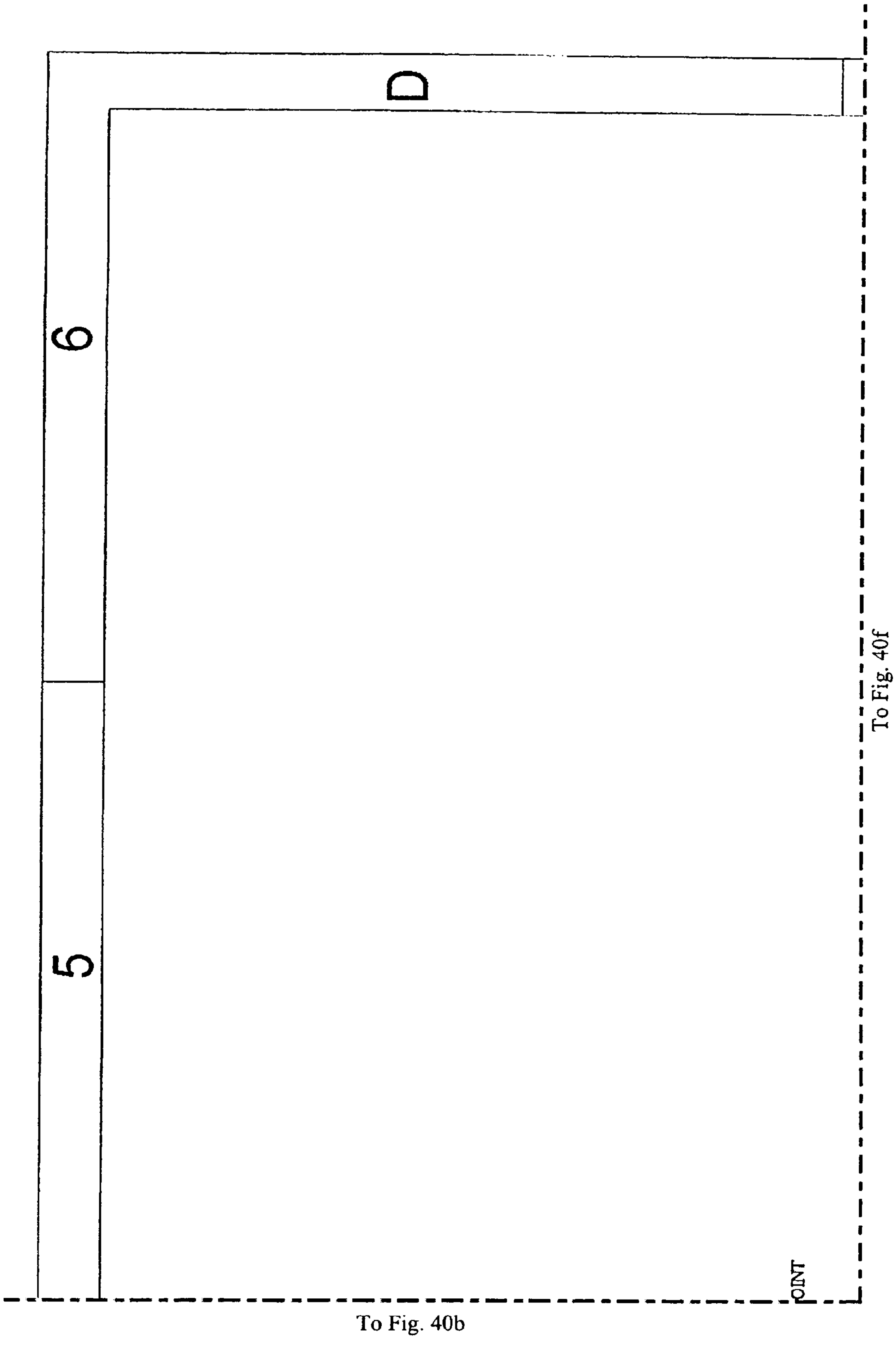
Figure 40D:
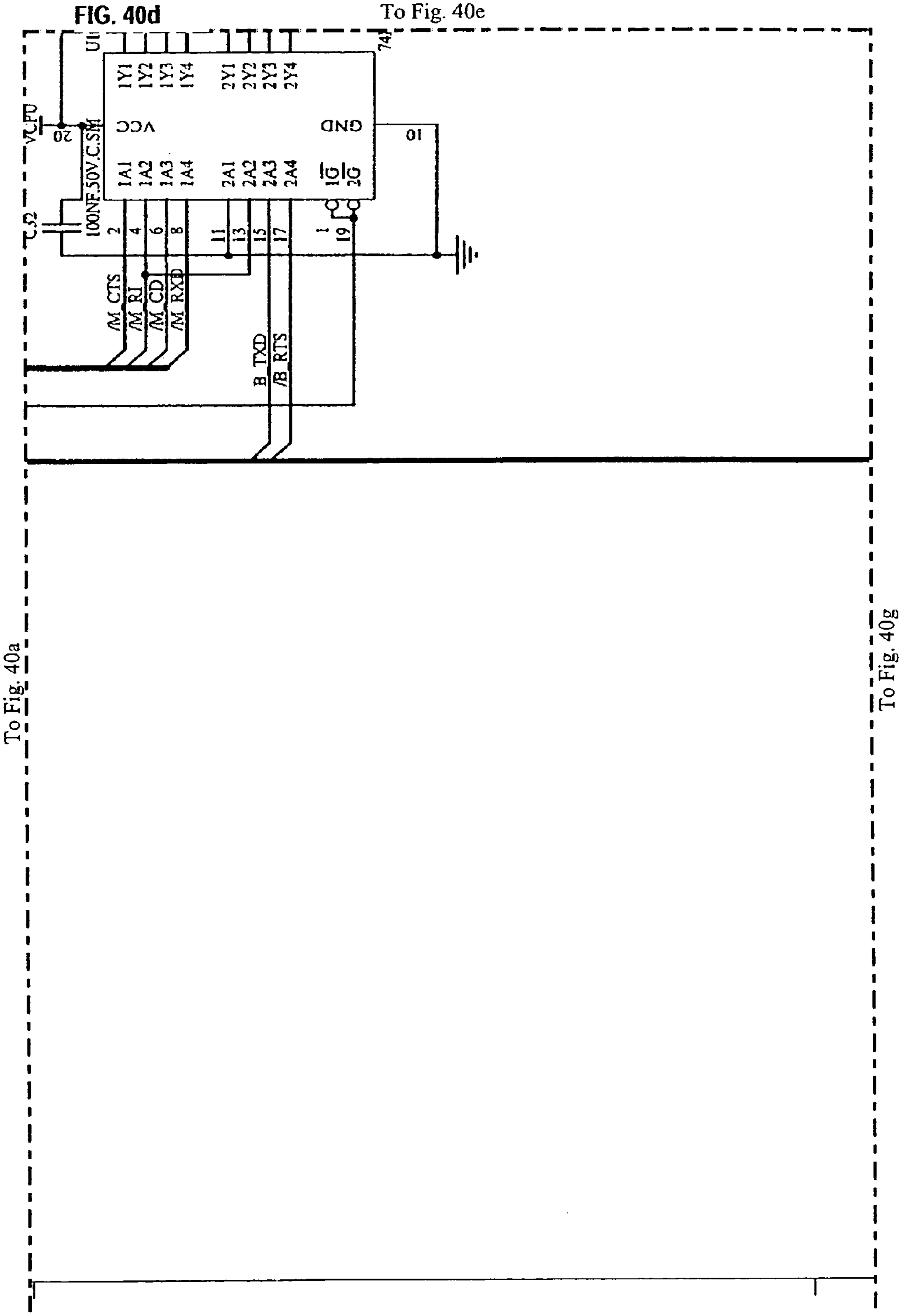
Figure 40E:
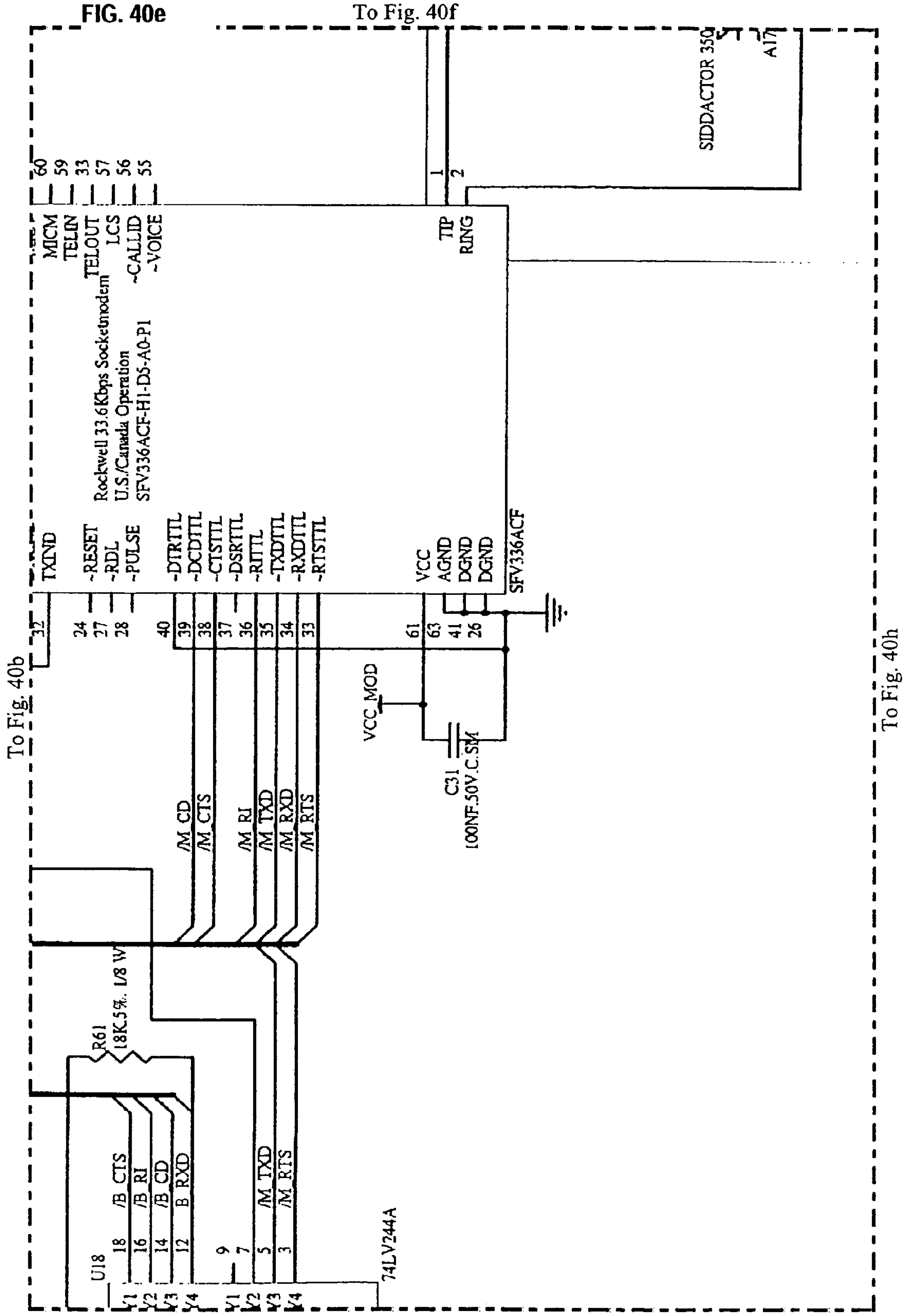
Figure 40F:
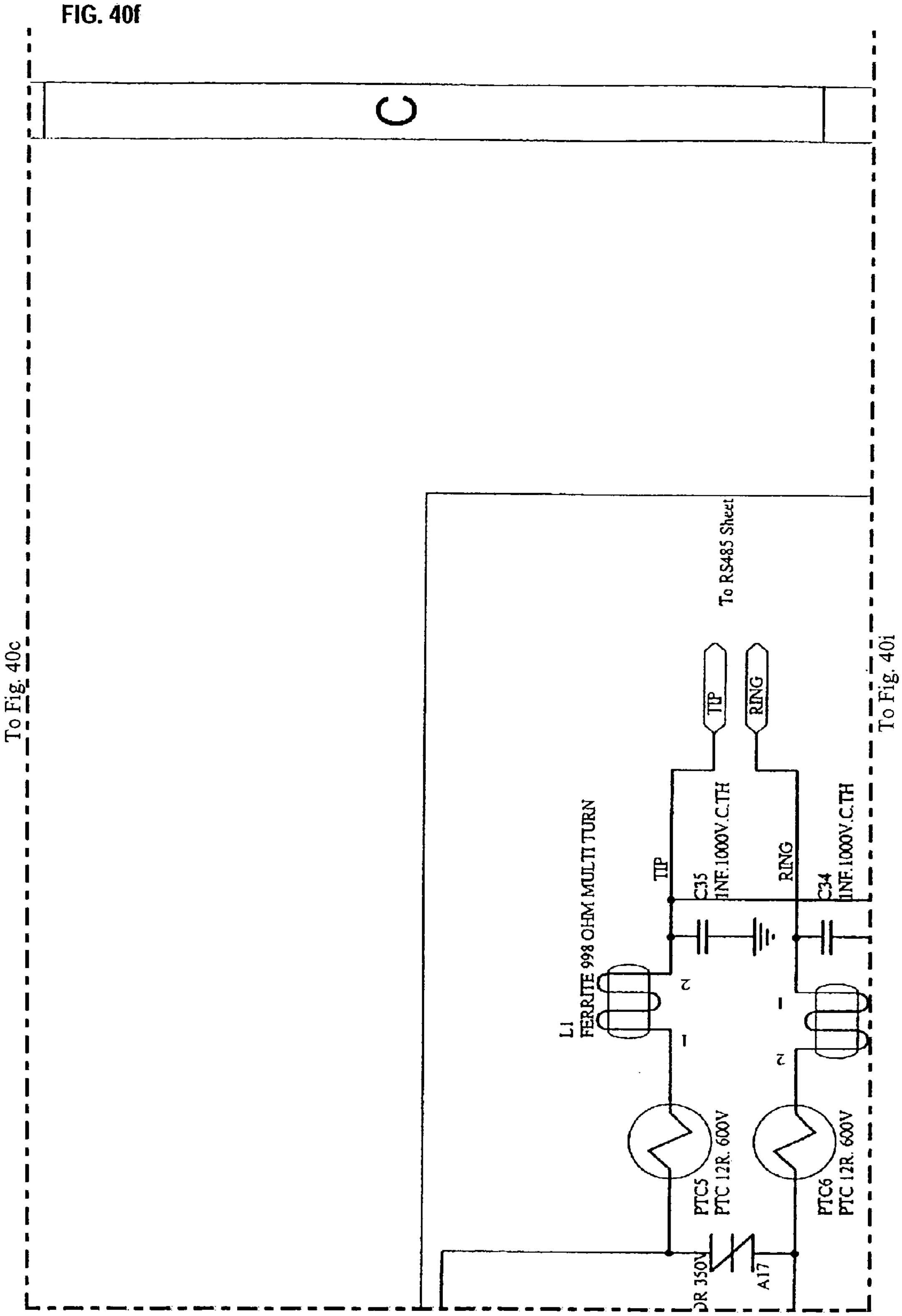
Figure 40G:
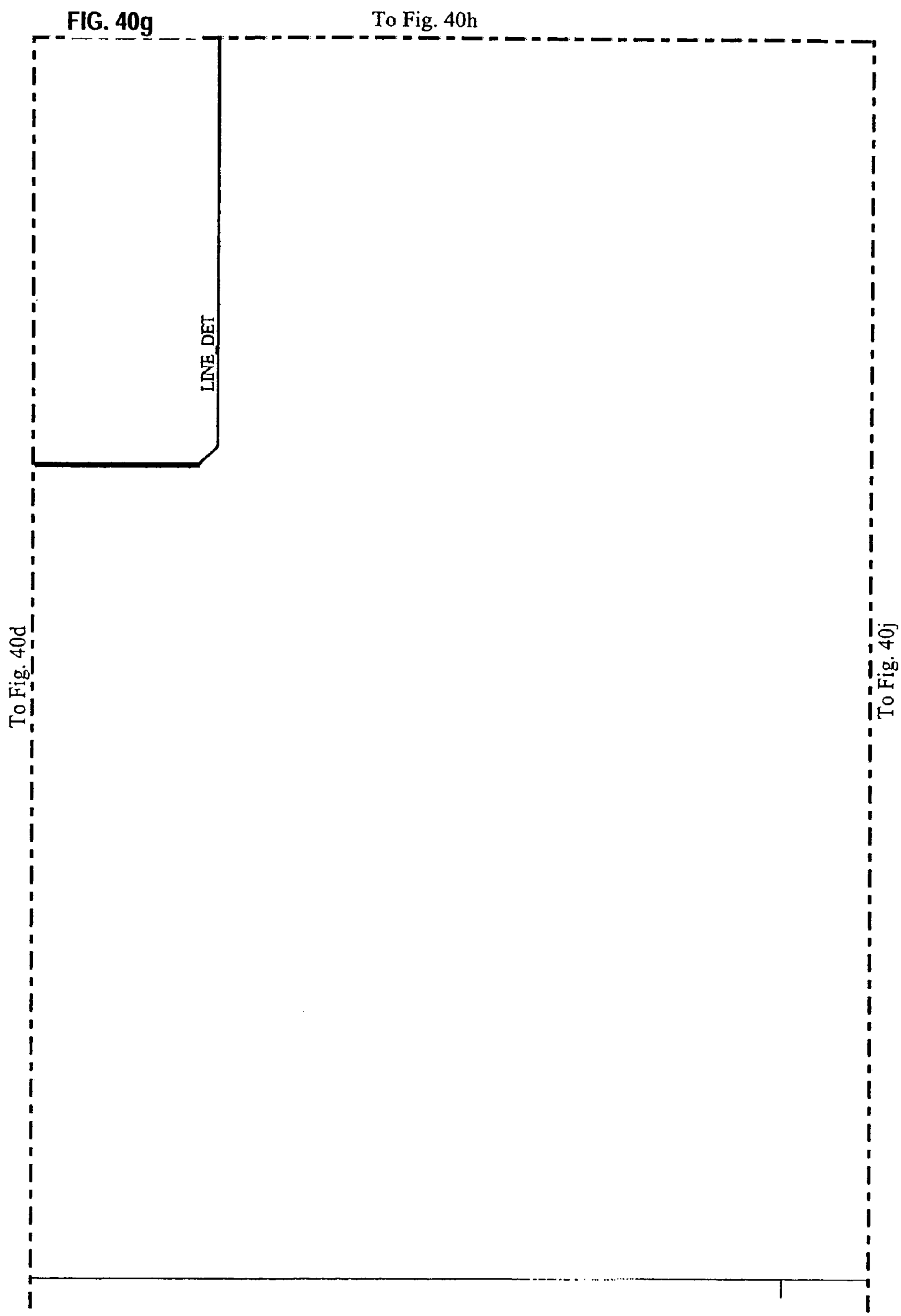
Figure 40H:
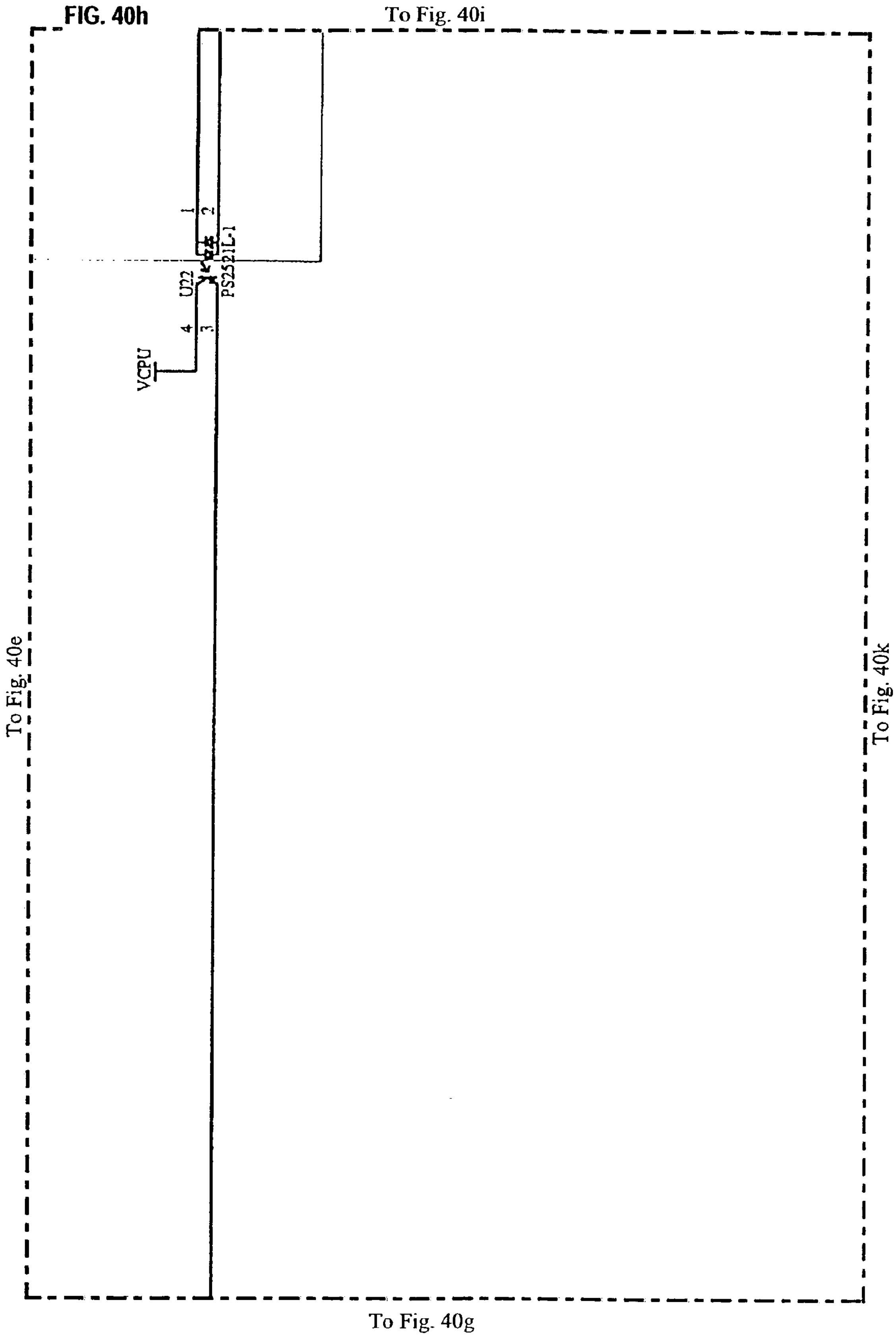
Figure 40I:
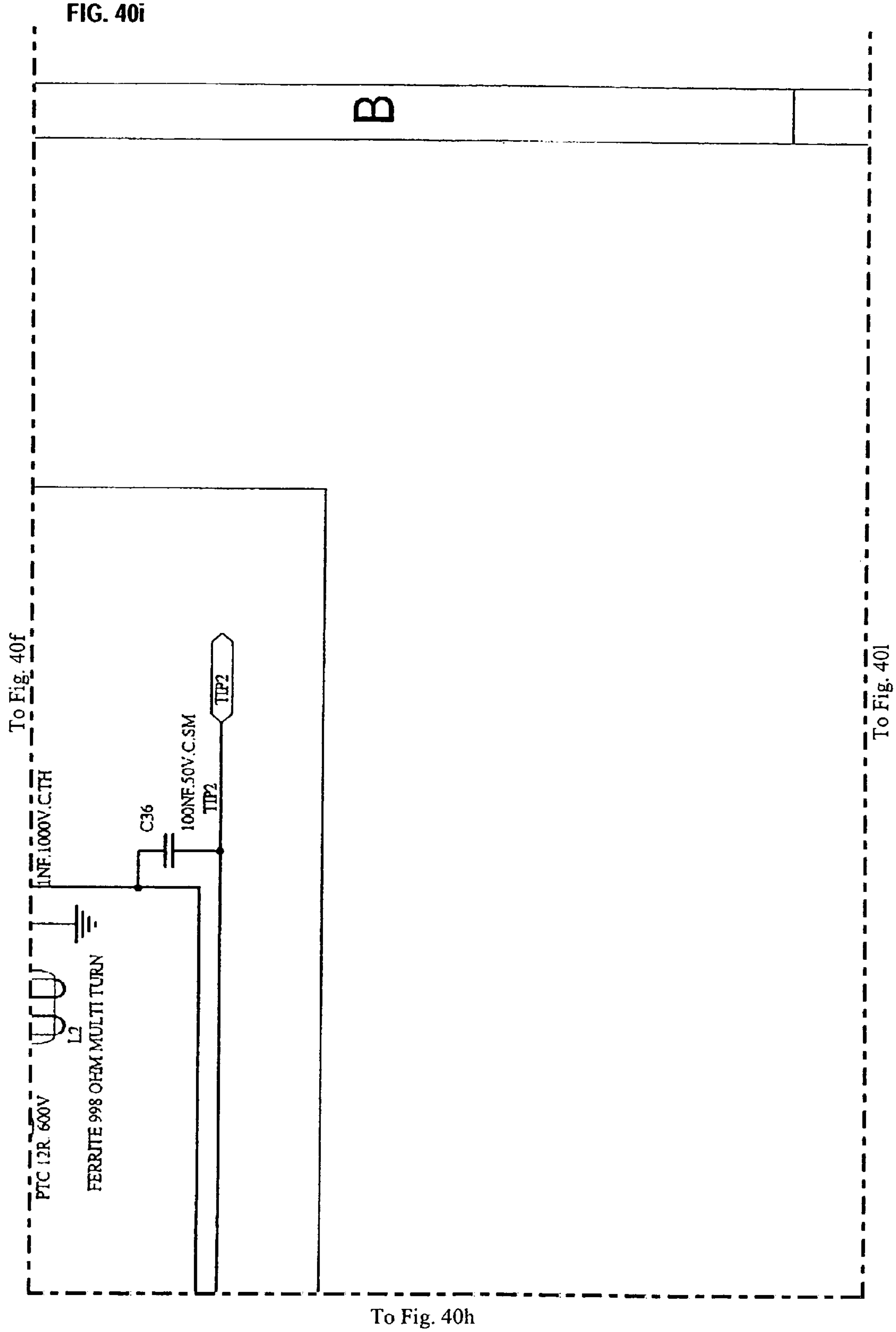
Figure 40J:
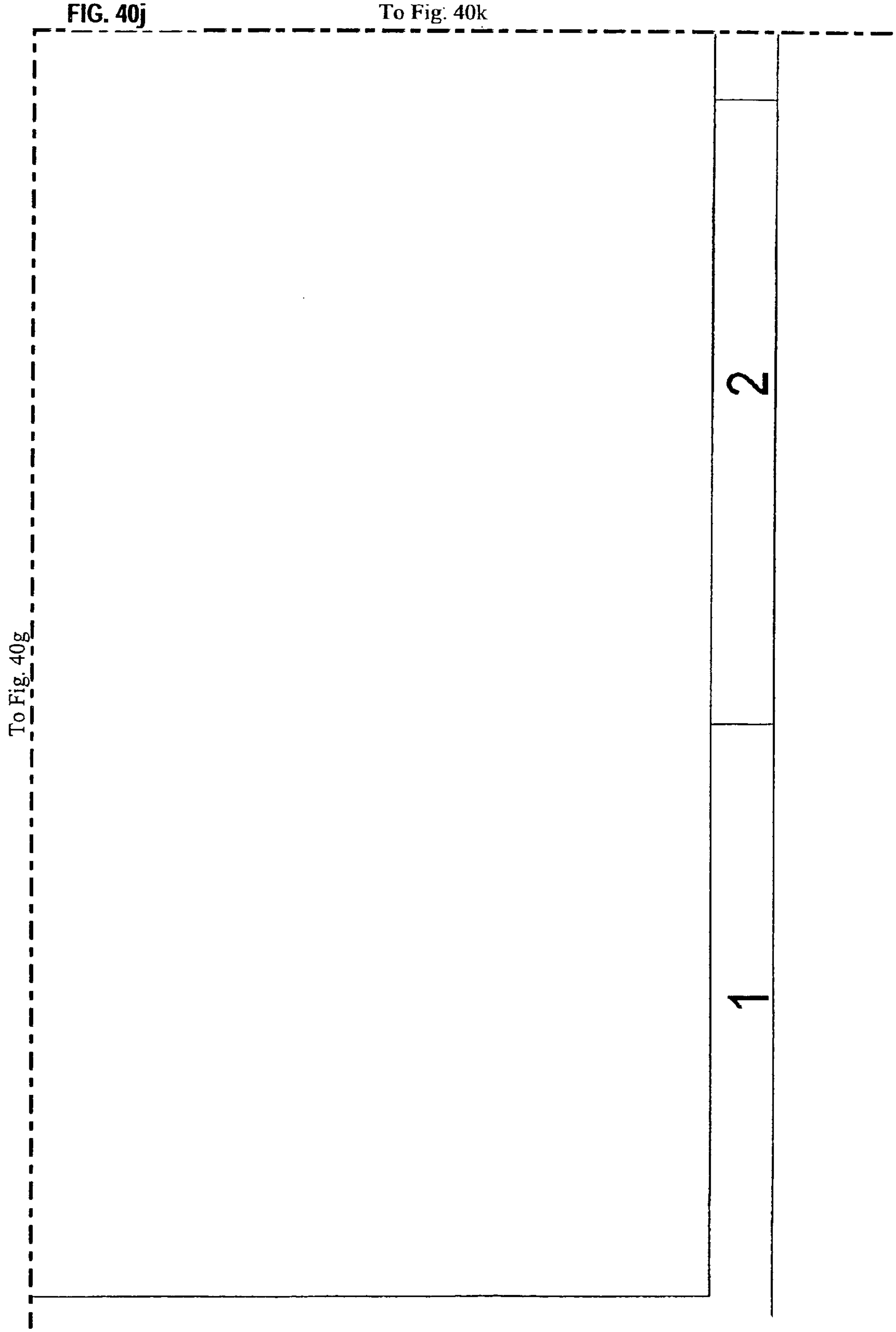
Figure 40K:
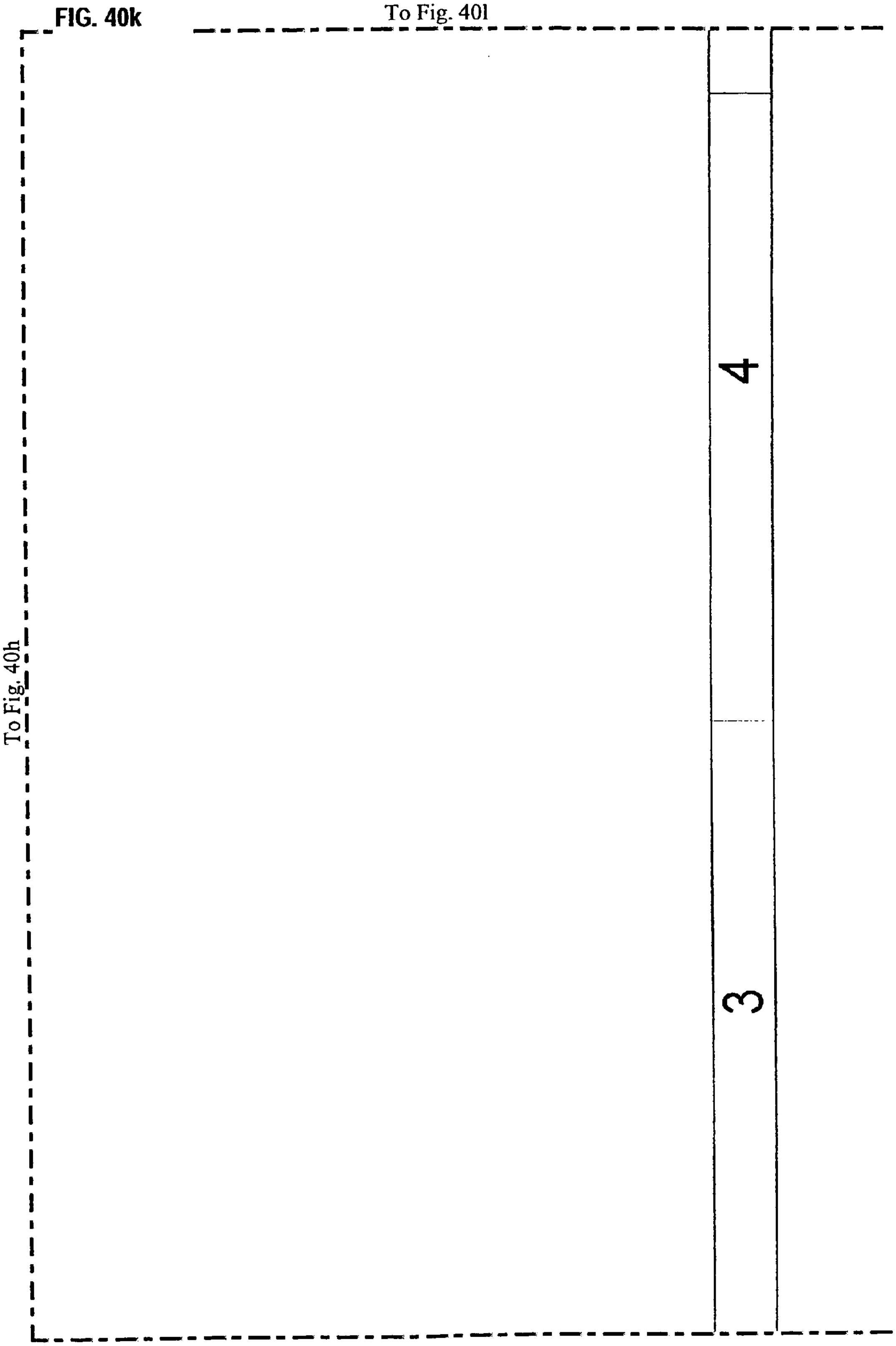
Figure 40L:
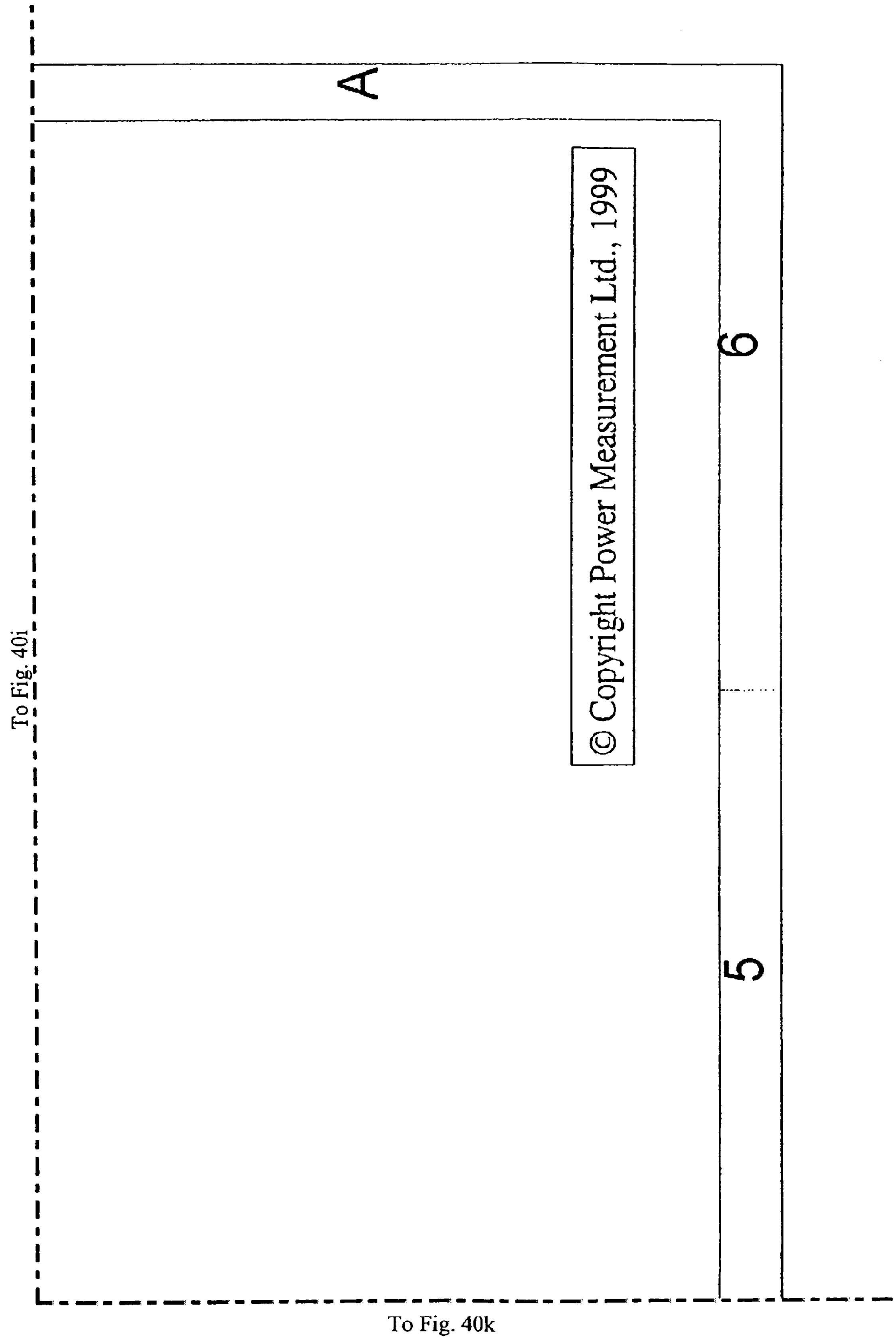

FIG. 19 shows, in block diagram form, a preferred embodiment of some of the electrical components of a revenue meter which can detect and report power quality events. Logically, the preferred embodiment revenue meter is comprised of hardware and software. FIG. 19 shows a typical hardware configuration in block diagram form where the meter is connected to a three phase electric circuit. The meter includes transducers 250, such as CT's and PT's, which sense the current and voltage in each phase of the electric circuit 252 and a power supply 254 which supplies power for the meter electronics. The transducers 250 are also connected to an analog to digital converter (A/D converter) 256 which samples the current and voltage in each phase of the electrical circuit 252.

As used herein, the term A/D converter refers not only to a traditional A/D converter but also to a Time Division Multiplexing ("TDM") based converter, or other converter which converts analog signals to digital signals. TDM is a method of measuring instantaneous power over a wide range of input voltages. TDM is accomplished by taking a snapshot of the waveform of the incoming electrical signal and converting it to a square wave over time using a known algorithm. The area of this square wave is then proportional to the power at the time the snapshot was acquired. The snapshot or sample time is dependent on processor speed. An exemplary implementation of TDM is the Quad4-Plus Electric Meter manufactured by Process Systems, A division of Siemens Power and Transmission & Distribution, LLC, located in Raleigh, N.C. which is described in the CD ROM specification for this product.

The digital output of the analog to digital converter 256 is connected to a digital signal processor 258. The digital signal processor (DSP) 258 is connected to memory 260 and to a microprocessor or CPU 262. The DSP 258 in conjunction with the CPU 262 executes the power quality event detection and reporting algorithms. The CPU 262 is also connected to a user interface 32 which allows users to program the meter or retrieve revenue or power quality data and generally interact with the meter as described in more detail below. It will be appreciated by those skilled in the art that the power quality detection and reporting algorithms can be executed by a variety of hardware configurations, all of which are known in the art.

Graphical User Interface

Figure 14:
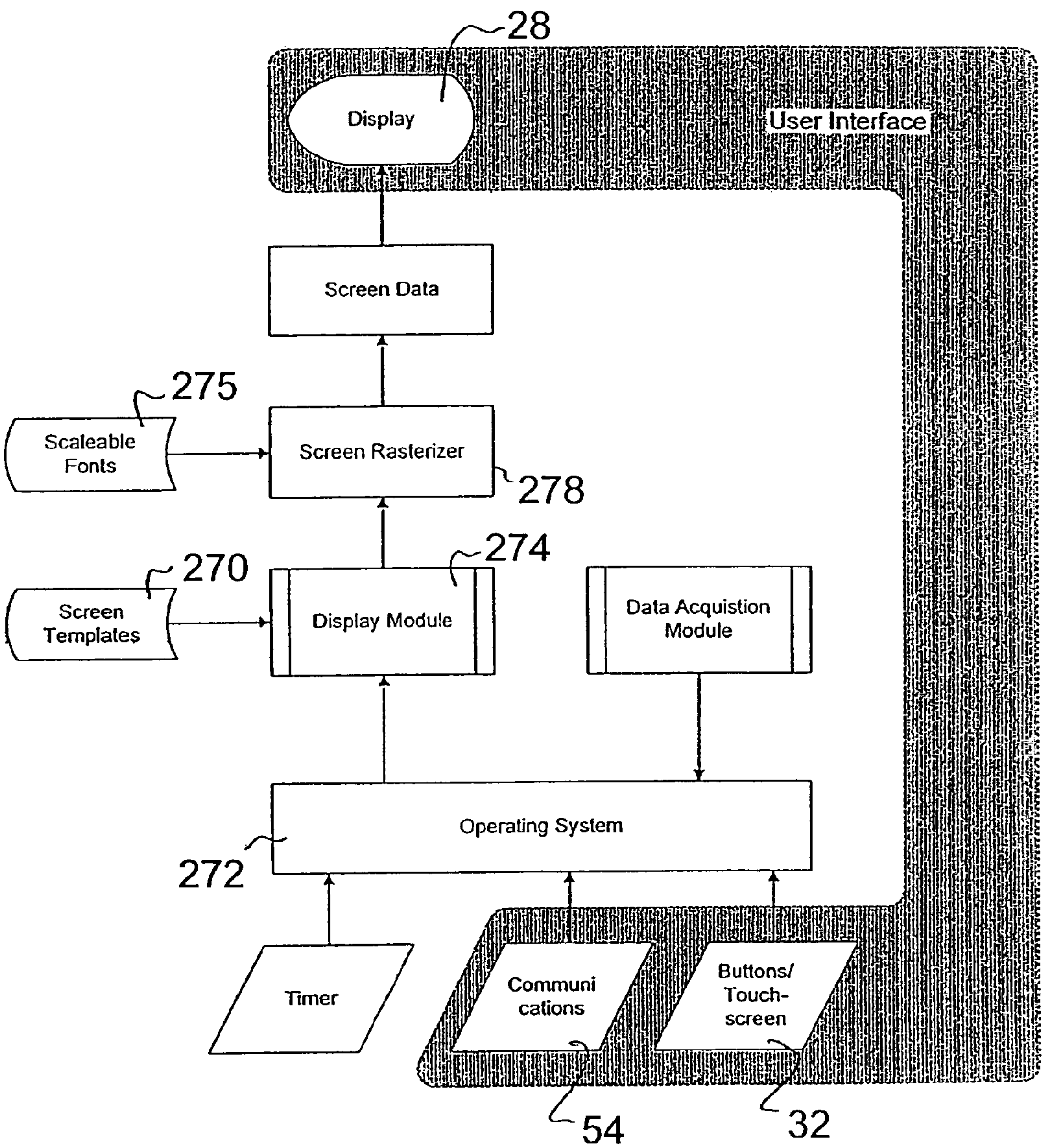
FIG. 14 illustrates a block diagram of a preferred embodiment of the control software used to operate the revenue meter of the present invention.

Referring now to FIG. 14, the user interface of the disclosed embodiments comprises communication ports, including, for example, the communication port, the input device 32 and the display screen 28. The operating system 272 passes display information to the display module 274, depending on input by the user using the input device 32 (i.e., buttons/touch-screen, etc.) or input from the communications port 54. Alternatively, the meter may be configured to automatically scroll through the display modules (i.e., the meter can be configured to scroll through the display modules without user input). The operating system 272 uses templates to generate the appropriate display on the bit addressable output device. The display module 274 calls the screen rasterizer 278, a program that takes display parameters and screen templates 270 to generate a rasterized image of the display screen 28. A rasterized image is a data structure representing the display screen, which can be sent directly to the display 28. The rasterized image is created using a scaleable font generator 275 if the graphical object to be displayed is text, and various draw routines for other graphical objects, such as lines, circles or rectangles, etc. The rasterized image is then sent to the display 28, presenting the required information to the user.

Figure 13:
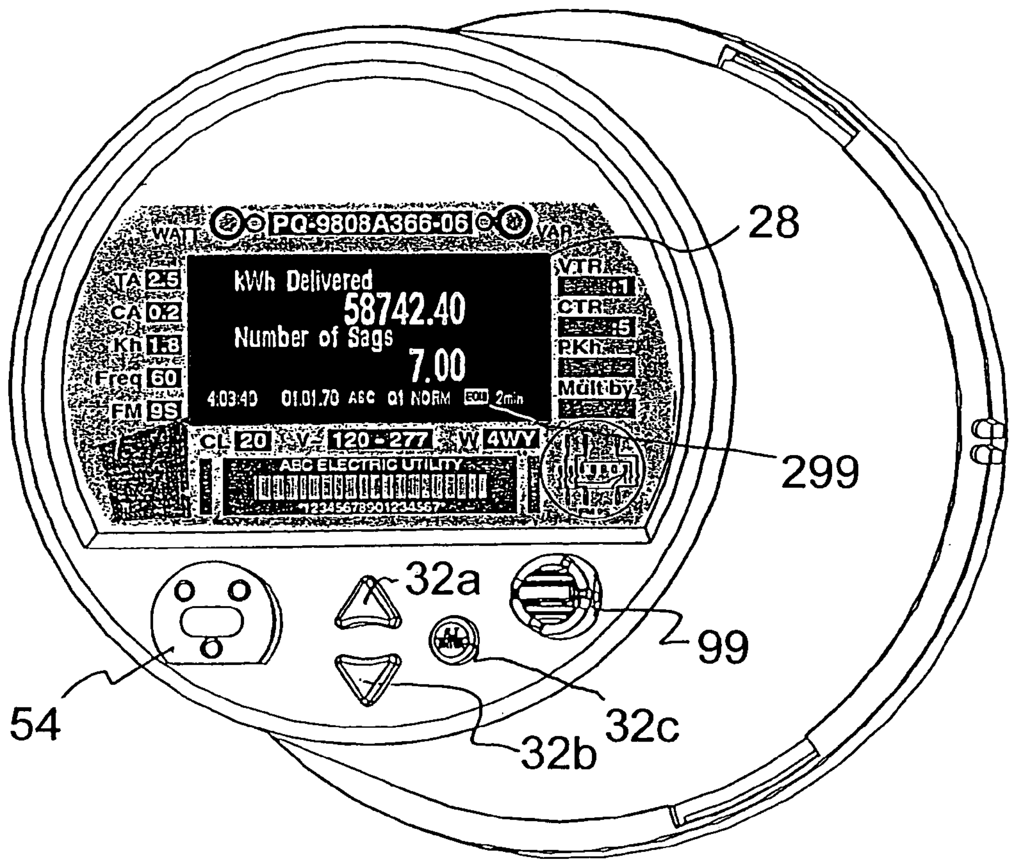
FIG. 13 illustrates a preferred embodiment showing the front panel of the revenue meter of the present invention with a key pad for the GUI.

Referring now to FIG. 13, the revenue meter, represented generally by reference numeral 20, of the disclosed embodiments includes a dot addressable black and white or color display 28 that allows text and graphics to be displayed on the meter's front panel. An input device such as a keypad 32, touch screen (such as a screen 28 implemented as a touch screen), or a mouse or pen input device (or other similar input device) is used to provide user access to the GUI. The input device is able to present information (i.e., the state of the input hardware such as buttons) or messages to a microprocessor, microcontroller or other central control device, which in turn can perform some action depending on the type of input and the current operating mode of the meter 20.

In a preferred embodiment the keypad 32 includes an up arrow button 32*a*, a down arrow button 32*b* and an enter button 32*c*. It will be recognized by those skilled in the art that other suitable buttons may be used. For example, the disclosed embodiments may be implemented using left and right arrow keys, other key arrangements as well as programmable soft keys. The meter 20 is configured to normally scroll through predefined parameters on the screen 28.

In one embodiment, to temporarily freeze the automatic scrolling of the display, the user presses either of the arrow buttons 32*a*, 32*b*. The user may then manually scroll through the display by using the buttons 32*a* and 32*b*. The enter button 32*c* may be used to toggle between various available modes of the meter 20. The modes may include, for example two display modes—a Norm mode and an Alt mode. The enter button 32*c* may also be used to view a setup menu.

The Norm and Alt modes show various real-time measurements and meter properties. In the Norm and Alt modes the meter 20 is in a regular state of operation and is accumulating billable quantities. Generally, the meter 20 cannot be configured in these two modes. The only quantities that may be configured in the Norm or Alt modes are the meter communications parameters, such as the communications port, baud rate, protocol, etc. Both the Norm and Alt modes continuously scroll through various display screens.

In the Norm mode the meter 20 displays on display 28 the values of the kWh delivered and the kWh received; the values of kVARh delivered and kVARh received; the values of kVAh delivered and received; the maximum delivered kW and a time stamp of when the peak occurred; the maximum received kW and a timestamp of when the peak occurred; a count of the number of Demand Resets executed as well as a timestamp of the latest Peak Demand Reset; and a test screen where a black screen showing all segments (all pixels on) indicates a properly functioning display.

In the Alt mode the meter 20 displays nameplate information; demand nameplate information; an event log; phasor diagrams; instantaneous voltages' instantaneous current, instantaneous power; instantaneous demand; voltage harmonics; and current harmonics.

The meter 20 also is programmed with a Test mode. The meter 20 may only be configured and calibrated when it is in the Test mode. To enter the Test mode, the user must press a Test mode button 98 that is hidden beneath a plastic outer cover 24 of the meter 20. In order to enter into the Test mode, the user must remove existing anti-tamper sealing (revenue sealing). In the Test mode, all billable qualities cease to accumulate (as long as the meter in Test mode). All configuration changes made in Test mode remain when the meter 20 is put back in either Norm or Alt modes. The Test mode operates in a similar fashion to the other meter modes (Alt and Norm modes) except that in the Test mode the user is allowed to modify the configuration that affects billable quantities. For example, the CT or PT calibration constants can be modified. Also, in Test mode, the meter is programmed to use separate energy accumulation registers. This makes it possible to calibrate the meter without affecting billable quantities.

Alternatively, user input can also be received by the unit via the communications ports: a front panel optical port or various other communications ports including ethernet, RS232, RS485 or other suitable ports. The communication ports or optical port may be used to input time/date communications parameters, such as ethernet IP members, calibration parameters and setup parameters. The input information can be used to show various display screens to the user, presenting the user with the appropriate information on the dot addressable display 28.

User input, measurement parameters from the data acquisition module and internal meter parameters are fed to the operating system running on the central processing unit.

Figure 16:
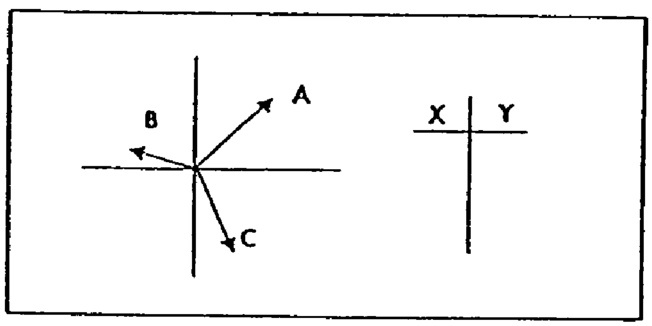
FIG. 16 illustrates a phasor diagram display which may be displayed on the screen of the revenue meter of the present invention.

Preferably, the GUI of the revenue meter 20 is programmable. The programmable GUI allows a meter 20 to be customized to a particular application, presenting the user only with information required by the user. The GUI can be programmed using the keypad 32, or other suitable input device, or through one of the communication ports. If a user requires information through the GUI that is presently not available in the revenue meter 20, the GUI can be reprogrammed to provide this information. Preferably, any parameter can be part of any number of display screens and can be shown in different formats, be it numerical, as a bar, through a point on a chart or as an angle or length of a vector. Such a vector diagram is illustrated in FIG. 16. In the preferred embodiment, a parameter can be present on a display screen in more than one format (see discussion of graphical progress indicator below). A series of parameters can be shown as a graph or other graphical representation such as a scatter diagram or pie chart.

The graphical nature of the user interface allows sophisticated information to be presented to the user. This can include vector diagrams, bar graphs, graphical progress indicators, trend graphs, waveform graphs and histograms.

Figure 15:
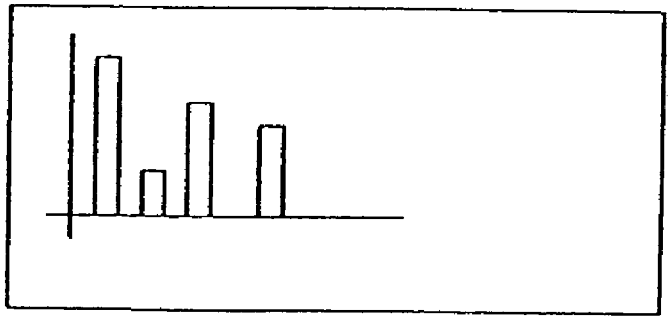
FIG. 15 illustrates a histogram display which may be displayed on the screen of the revenue meter of the present invention.

Referring now to FIG. 15, an example of a histogram display which may be displayed on the screen 28 of the meter 20 is illustrated. The histogram displays harmonics content in histogram format. Harmonics may be displayed, for example, from the fundamental to the 63rd harmonic.

Another type of graphical display which may be displayed on the screen 28 is illustrated in FIG. 16. FIG. 16 illustrates a vector diagram which provides phase information in vector diagram format. As illustrated, the vector diagrams may be accompanied with tables. Preferably, in the case where the phase vector is too small to be represented graphically, it is only shown as a table entry.

Figure 17:
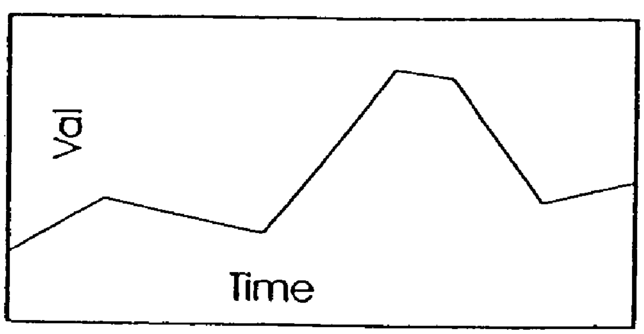
FIG. 17 illustrates a trend display which may be displayed on the screen of the revenue meter of the present invention.

FIG. 17 illustrates another type of graphical display of the sensed electrical parameters which may be displayed on the screen 28. FIG. 17 illustrates a trend display which provides information regarding the values of measurements or calculations over a predetermined number of seconds or other period of time.

Numerical information which may be provided on the screen includes, for example, event log and nameplate displays. These displays may show, for example, textual information organized in a tabular format. The nameplate display shows owner, meter, and power system details. The event log display provides alert of recent, high priority events logged on the meter's data recorder.

Various screens may be provided as preprogrammed screens which include alphanumeric information. For example a screen may provide real-time information that shows various real-time parameters of the power system. This screen may be configured by defining a link to a minimum/maximum (min/max) parameter. Thus, the display would show the min/max values for line-to-line and line-to-neutral voltages, voltage unbalance, phase currents, power values (kVA, kVAR, and kW), frequency and power factor. The screen may also be configured by defining links to the meter's event log and various historical data logs.

Another screen may include energy and demand information showing the real-time sliding window demand for kW, kVA, and kVAR, and the real-time energy values kWh net, kVARh net and kVAh. Peak demand may be displayed on this screen for kW, kVAR and kVA. The screen may also be configured to define a link to a demand profile trend.

Yet another screen may include power quality information showing voltage disturbance and harmonics details. The voltage disturbance display may provide information regarding sag/swell and transient events. The display may show a sequence-of-events log and a set of curves representing the withstand capabilities of computers in terms of the magnitude and duration of the voltage disturbance, known as a CBEMA plot. Preferably in this display a trigger is included for manual waveform recording and control objects are provided for enabling/disabling power quality event recording. The screen preferably also shows harmonics measurement information which provides information regarding total harmonic distortion for each phase of voltage and current. The display may also show harmonics min/max and harmonics trending graphs.

Preferably, a set points display provides set points to monitor kW demand, over current and voltage unbalance levels. The meter preferably announces warnings if any of the values exceed specified upper limits.

Since the meter 20 is completely self contained, this information can be shown without the use of an external display device such as a laptop computer. Preferably, information, which can be accessed through the front panel display screen 28, is also accessible through the meter's communications ports, and therefore may also be displayed on a terminal/computer connected to one of the communication ports.

Preferably, the GUI is programmed using screen templates to provide scaleable fonts and scaleable graphical display objects such as lines, vectors, circles, pie charts, graphs or bar-graphs. This allows for customization of display screens with various numbers of lines, font sizes and graphical objects.

Preferably, a graphical progress indicator 299 is used to show the current time of an interval graphically and in text form on the dot addressable display. The time can be either time to completion or time elapsed. In addition, the graphical progress indicator can also indicate the end of a time interval. This gives the user instant graphical feedback about the status of various processes or completion of time intervals such as demand progress. One implementation of the graphical progress indicator presents the user with a bar that fills up as time goes on and the end of the interval approaches. Once the interval is complete, the bar is completely full and a graphical symbol (for example the text "EOI") can be superimposed on the bar. At the same time as the bar is shown on the screen, a numeric value for the time remaining or the time elapsed can also be shown on the screen.

Voltage and current phase relationship can be presented to the user as vector diagrams on the dot addressable display 28. A vector is a graphical object that consists of a line whose length is somehow related to the value of a parameter (usually the length is proportional to the value) and is drawn on the dot-addressable display at an angle given by another parameter. The same screen that shows the vector can, if the user so desires, also show the actual text based numeric values corresponding the length and angle of the vector. By showing the vector of the currents and voltages present on the inputs of the revenue meter, the user gets immediate, easy to comprehend, feedback about voltage and current magnitude, and relative phase angles, which in turn provide instant system diagnosis information showing missing phases or phases connected improperly.

The user may also use the keypad 32 or other suitable input devices to navigate through a hierarchic menu system for meter configuration or GUI customization. In the preferred embodiment, the meter 20 is provided with a default set of display screens and hierarchic interface menus, which can be re-programmed through the user interface itself or through the communications ports.

The information to be displayed on the display screen, consists of graphical objects such as scalable text, lines, circles rectangles, charts, etc. For each screen, a template is provided which in turn provides information on how the screen is laid out. Preferably, the template provides information on the appearance and location of the graphical objects.

The hierarchic menu system is activated by some input key combination, for example by holding the enter key for an extended period of time.

The hierarchic menu system can be implemented using a scrollable menu system with a simple up key 32*a*, down key 32*b* and enter key 32*c*, i.e. the three-key interface used to navigate a set of menu choices. The up/down buttons 32*a*, 32*b* select the previous/next items in a list. The list is shown as a text list with the current item in the list highlighted in some fashion, either by inverting or changing the colors in some way or surrounding the highlighted item using a rectangle. When the enter input is activated using the enter button 32*c*, the highlighted input is selected and the appropriate function is performed: either a new menu list is selected, a single item is selected (such as yes/no) or the user is presented with a changeable parameter. If the parameter is numeric, the up and down keys 32*a*, 32*b* will increment or decrement it. If the parameter has numerous numeric fields, holding the up or down arrow buttons 32*a*, 32*b* will activate the next/previous numeric field. Just pressing the up/down buttons 32*a*, 32*b* will then once again increment/decrement the numeric entry. Hitting the enter button 32*c* will accept the input value and perform the appropriate action, such as checking/asking for the password and/or confirmation.

Preferably, when the meter 20 is in display mode, the up/down buttons 32*a*, 32*b* select either the next or previous display screen in a programmable list of display screens. If no direct user input is provided, the meter will automatically proceed to the next display screen after a preset programmable interval.

Other user interface functions can be implemented using various different combinations of the inputs. For example, the contrast change mode can be activated by simultaneously activating the up/down arrow keys 32*a*, 32*b*.

The revenue meter 20 of the disclosed embodiments provides several key advantages over prior art revenue meters. The GUI of the disclosed embodiments provides a method to present the user with information not available on traditional meters. The user interface is self-contained in the socket based revenue meter.

In a preferred embodiment the keypad 32 includes an up arrow button 52*a* a down arrow button 52*b* and the enter button 53. It will be recognized by those skilled in the art that other suitable buttons may be used. For example, the disclosed embodiments may be implemented using left and right arrow keys, other key arrangements as well as programmable soft keys. The revenue meter 20, 34, 42 is configured to normally scroll through predefined parameters on the screen 28. In one embodiment, to temporarily freeze the automatic scrolling of the display, the user presses either of the arrow buttons 52*a*, 52*b*. The user may then manually scroll through the display by using the buttons 52*a* and 52*b*. The enter button 53 may be used to toggle between various available modes of the revenue meter 20, 34, 42. The modes may include, for example, two display modes—a Norm mode and an Alt mode. The enter button 53 may also be used to view a setup menu.

In addition, the GUI is programmable to allow the revenue meter 20, 34, 42 to be customized via the keypad 32 to a particular application, presenting the user only with information required by the user. The GUI can be programmed using the keypad 32, or other suitable input device, or through one of the communication ports, described below.

In addition, the user may also use the keypad 32 or other suitable input device to navigate through a hierarchic menu system for meter configuration or GUI 199 customization. In the preferred embodiment, the meter 20, 34, 42 is provided with a default set of display screens and hierarchic interface menus, which can be re-programmed through the user interface itself or through the communications ports. The information to be displayed on the display screen, consists of graphical objects such as scalable text 198, lines 197, circles 196, rectangles 195, charts 194, etc. For each screen, a template is provided which in turn provides information on how the screen is laid out. Preferably, the template provides information on the appearance and location of the graphical objects.

The hierarchic menu system is activated by some input key combination, for example by holding the enter button 53 for an extended period of time. The hierarchic menu system can be implemented using a scrollable menu system with a simple up key 52*a*, down key 52*b* and enter button 53, i.e. the three-key interface used to navigate a set of menu choices. The up/down buttons 52*a*, 52*b* select the previous/next items in a list. The list is shown as a text list with the current item in the list highlighted in some fashion, either by inverting or changing the colors in some way or surrounding the highlighted item using a rectangle. When the enter input is activated using the enter button 53, the highlighted input is selected and the appropriate function is performed: either a new menu list is selected, a single item is selected (such as yes/no) or the user is presented with a changeable parameter. If the parameter is numeric, the up and down keys 52*a*, 52*b* will increment it. If the parameter has numerous numeric fields, holding the up or down arrow buttons 52*a*, 52*b* will activate the next/previous numeric field. Just pressing the up/down buttons 52*a*, 52*b* will then once again increment/decrement the numeric entry. Hitting the enter button 53 will accept the input value and perform the appropriate action, such as checking/asking for the password and/or confirmation.

Preferably, when the revenue meter 20, 34, 42 is in display mode, the up/down buttons 52*a*, 52*b* select either the next or previous display screen in a programmable list of display screens. If no direct user input is provided, the meter will automatically proceed to the next display screen after a preset programmable interval.

Other user interface functions can be implemented using various different combinations of the inputs. For example, the contrast change mode can be activated by simultaneously activating the up/down arrow keys 52*a*, 52*b*.

Referring to FIGS. 4B and 5A–5C, to provide a watertight interface between the keypad 32 and the cover 24, a backside of the top portion 33 of the cover 24 includes sealing walls 58. Infrared light pipes 59 are also included on the backside of the top portion 33 of the cover 24. As described, the keypad 32 of the revenue meter 20, 34, 42 utilizes an elastomer keypad. The sealing walls 58 sealingly engage the elastomer keypad 32. The keypad 32 includes at least one button, e.g., scroll buttons 52, with a plunger 64, and a web 66 portion which allows the plunger to move in a direction generally perpendicular to the keypad 32.

To protectively seal the revenue meter 20, 34, 42 from outside elements, such as rain, a compression plate 68 compresses the elastomer keypad 32 to the sealing walls 58. The compression plate 68 preferably is screwed to the cover 24 via bosses 70. It can be appreciated, however, that other fasteners, such as rivets and snap features within the plastic, can be used to attach the compression plate 68 to the cover 24. The sealing walls 58 and the compression plate 68 compress the keypad 32 to form a seal around each key 52 on the keypad 32. The sealing bosses 70 pass through corresponding holes 71 in the keypad 32 (seen best in FIGS. 5B and 5C) to be in direct contact with the compression plate 68. Thus, a seal that meets ANSI specifications is formed between the keypad 32 and the sealing walls 58. It can be appreciated that the keypad can be replaced with a weather proof touch screen or membrane switch mounted on the cover to eliminate the need for sealing ribs and a compression plate. It can also be appreciated that the keypad can be welded or molded directly into the cover to eliminate the need for a compression plate.

Figure 6A:
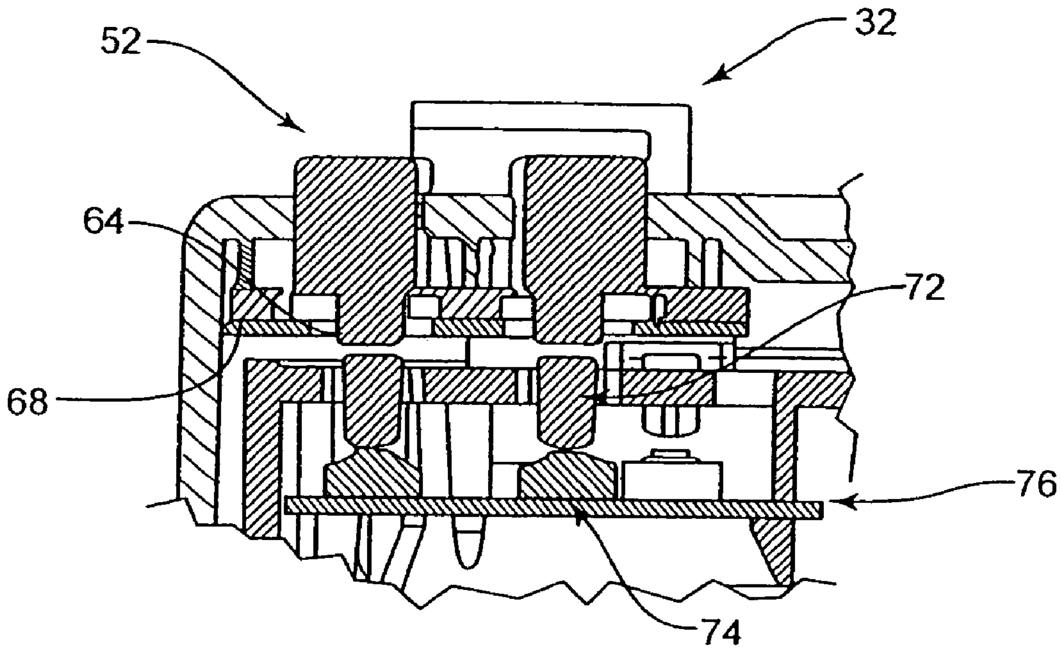
FIG. 6A shows a partial cross-sectional view of the scroll button mechanism according to a preferred embodiment of the present invention.
Figure 6B:
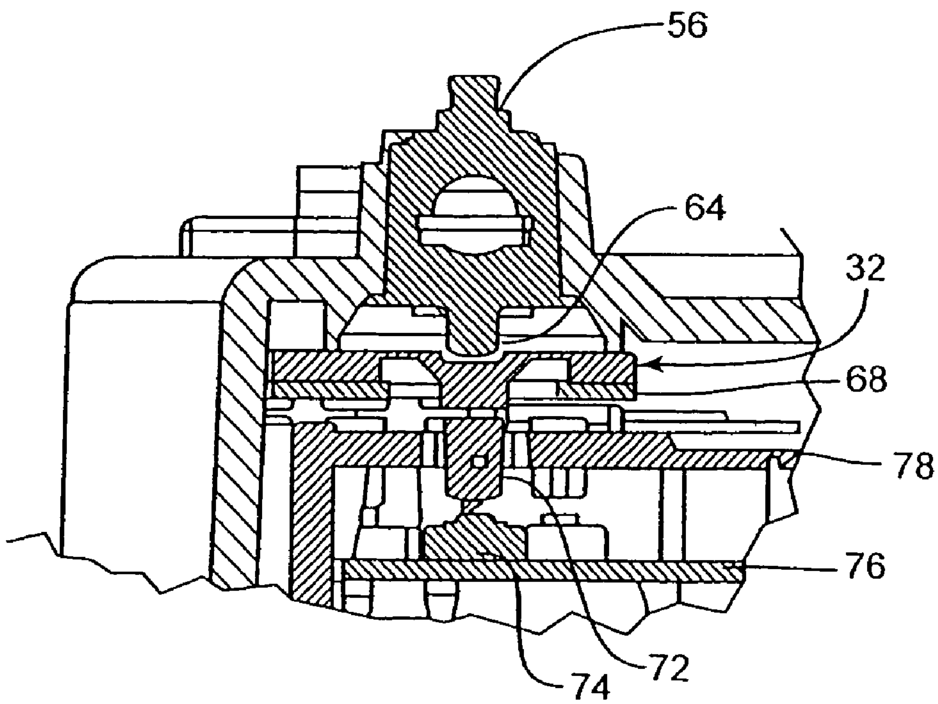
FIG. 6B shows a partial cross-sectional view of a demand reset key button mechanism according to a preferred embodiment of the present invention.
Figure 7A:
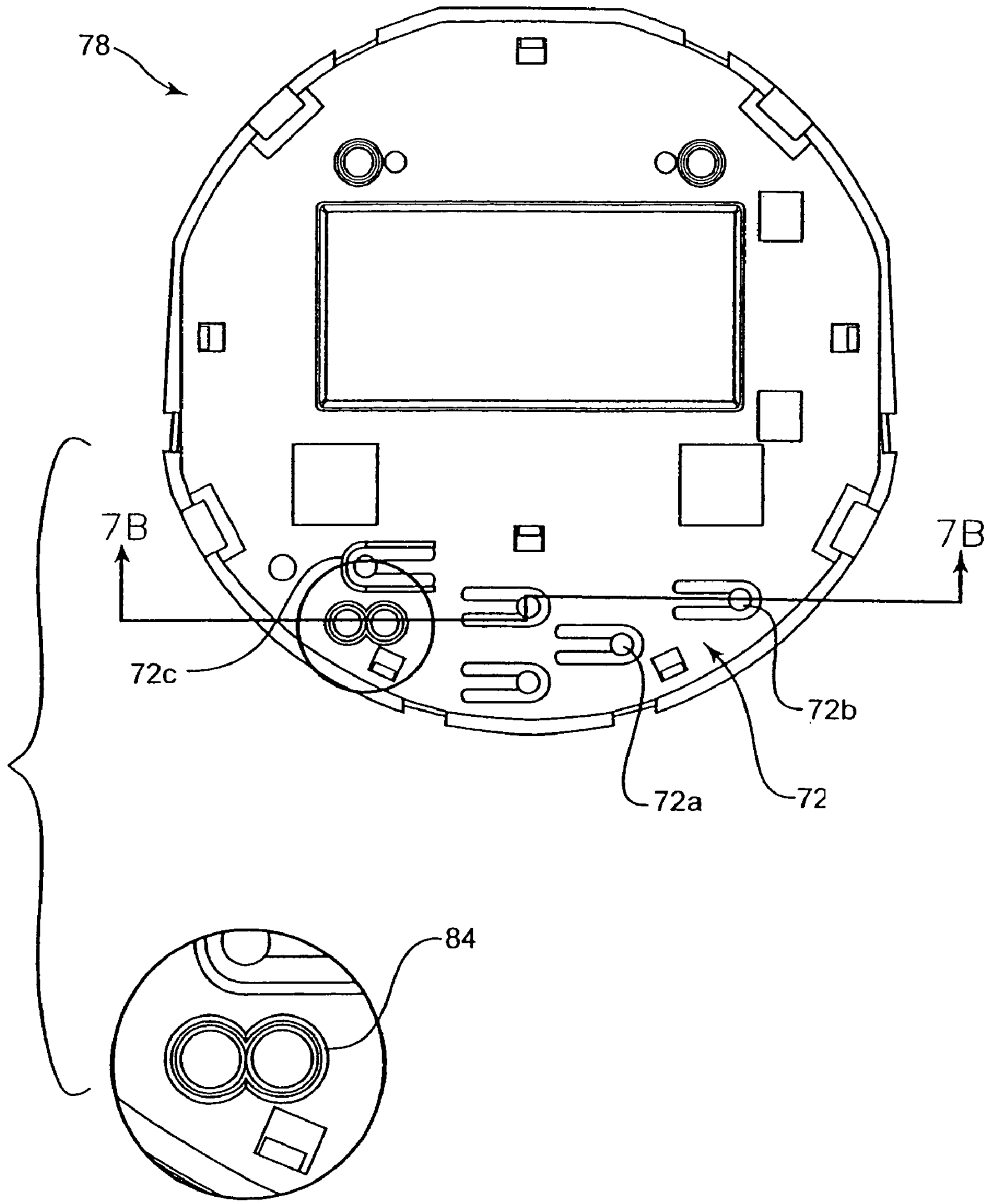
FIG. 7A shows a top view of a bezel according to a preferred embodiment of the present invention.
Figure 7B:
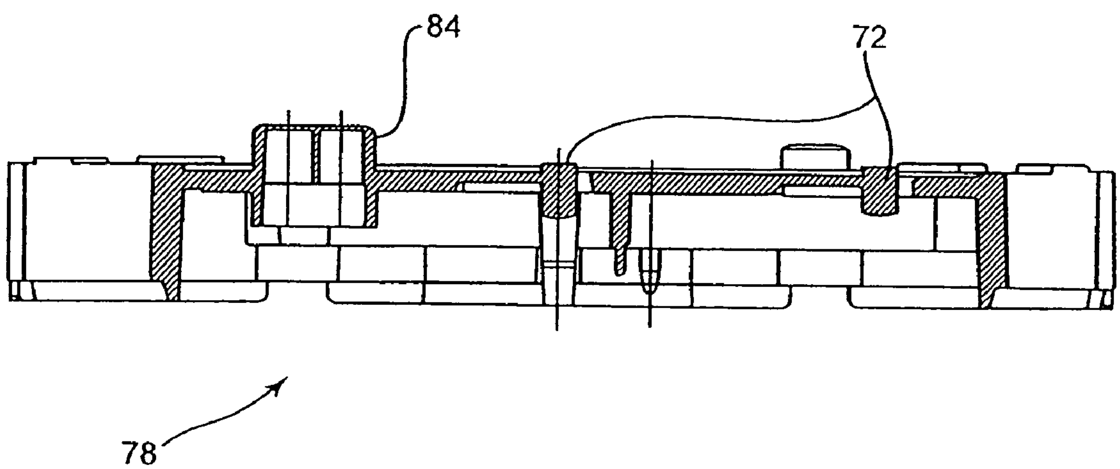
FIG. 7B depicts a cross-sectional view along line 7B—7B of the bezel shown in FIG. 7A.
Figure 7C:
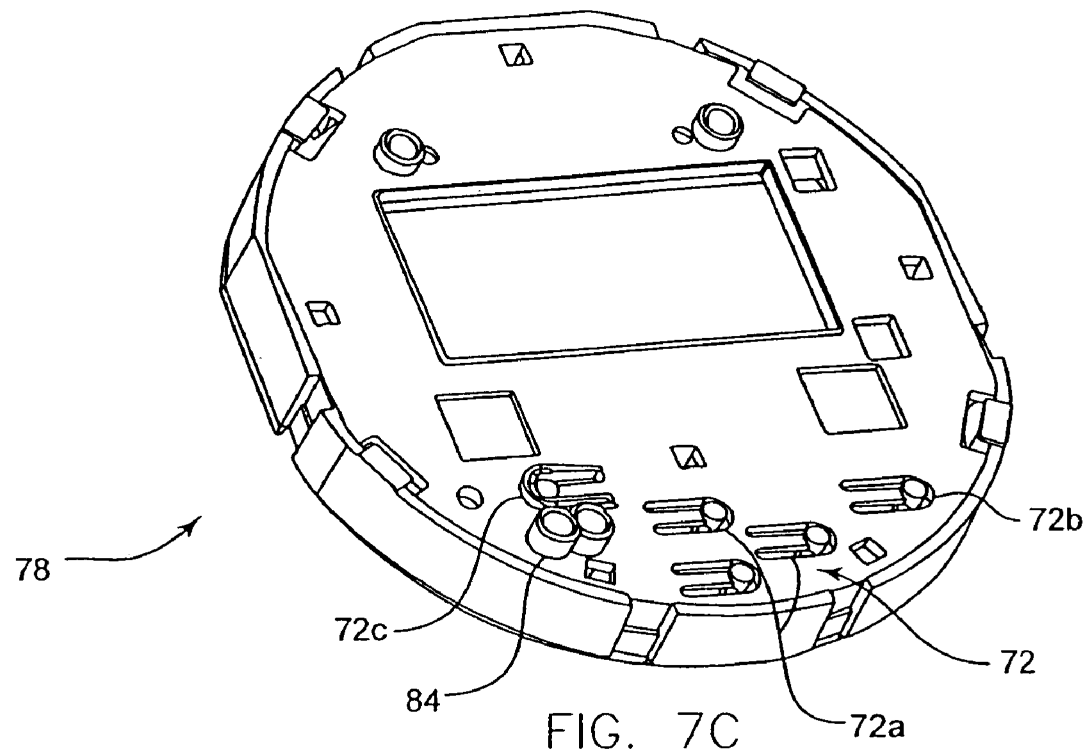
FIG. 7C shows a top perspective view of the bezel shown in FIG. 7A.
Figure 7D:
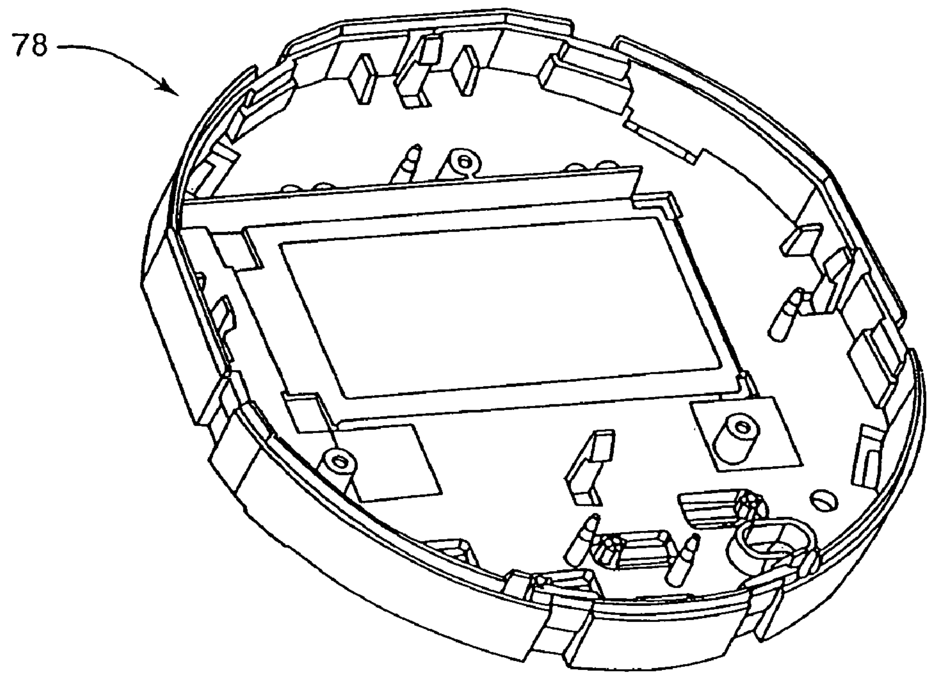
FIG. 7D depicts a bottom perspective view of the bezel shown in FIG. 7A.

Referring to FIGS. 6A and 6B, to mechanically connect the keypad 32 to the revenue meter 26, intermediate actuators 72 transfer the keypad's motion to micro switches 74 mounted on a printed circuit board 76. Referring also to FIGS. 7A–7D, according to a preferred embodiment, the intermediate actuators 72 are contained within bezel 78. The intermediate actuators 72 include intermediate key actuators 72*a*, an intermediate reset demand actuator 72*b*, and an intermediate test mode actuator 72*c* which is accessible only when the cover 24 is removed. Thus, unlike known demand reset keys which include multiple parts, including a spring, fasteners and lever arms, the bezel 78 of the disclosed embodiments allows for a one piece demand reset key.

When the user depresses keys 52, the web 66 (shown best in FIG. 5A) allows the plunger 64 to interact with the intermediate actuators 72 located on the bezel 78, which in turn contact the micro switch 74. Preferably, the micro switch 74 has spring back like qualities so that, after it is depressed, it rebounds to aid in the return the plunger 64 to a default position. Preferably, the web 66 and the intermediate actuators 72 have spring back qualities that also aid in the return of the plunger 64 to the default position. It can be appreciated that the intermediate actuators 72 may be eliminated when the micro switch 74 is mounted to directly contact the plunger 64.

For the keypad 32 to properly function, the keys 52 and the demand reset button 99 must properly align to the intermediate actuators 72 of the bezel 78. In addition, infrared emitters (not shown) located within the infrared locating member 54 must align to the infrared light pipes 59. Referring to FIG. 3, the Switchboard revenue meter 42 experiences similar alignment problems of the keypad 32 to the intermediate actuators 72.

Figure 8:
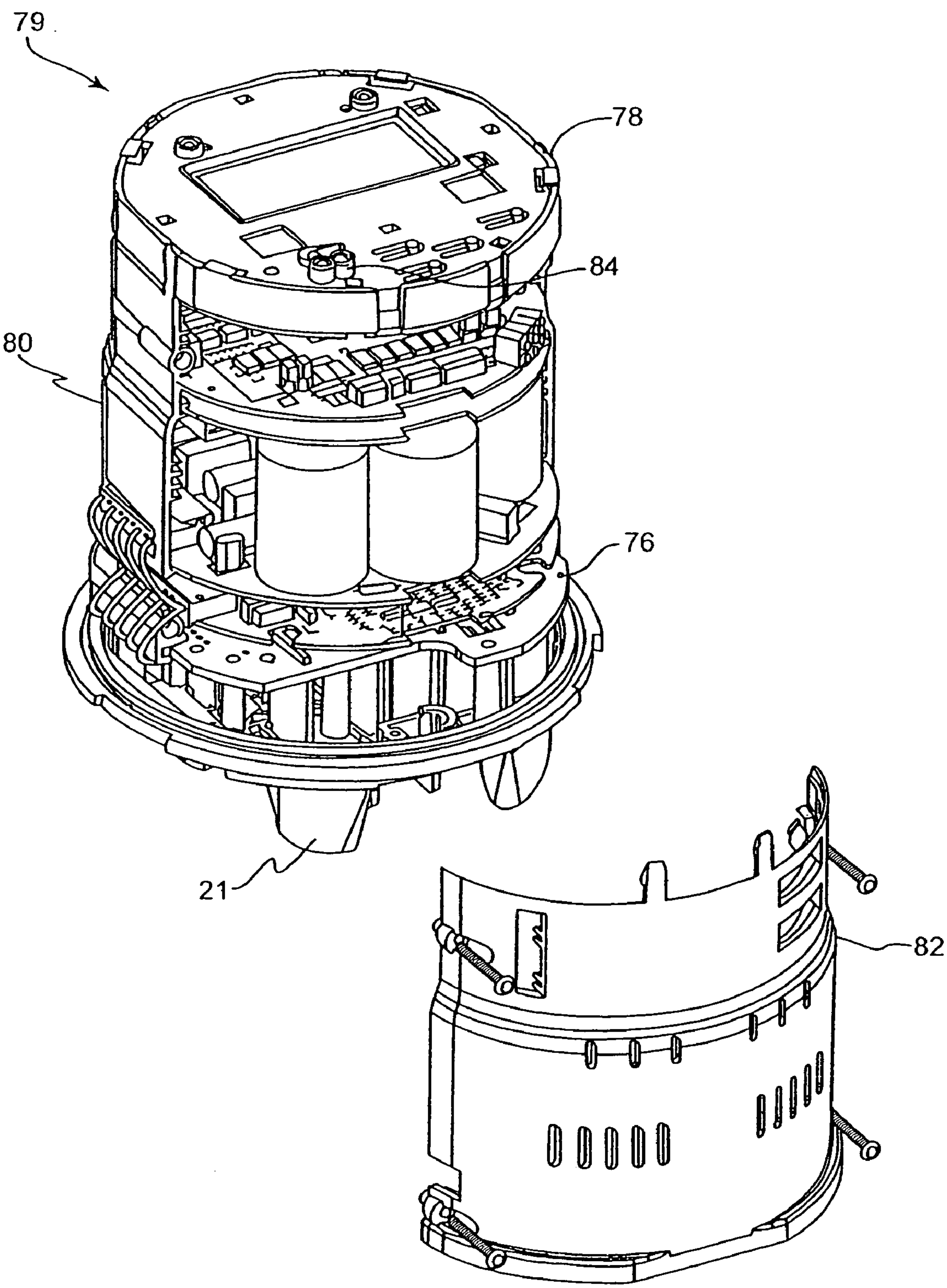
FIG. 8 shows a partially assembled S-base meter depicted in FIGS. 1 and 2, without the cover.

Referring to FIGS. 1 and 2, alignment is more difficult for the S-Base revenue meter 20 and the A-base revenue meter 34, since both the revenue meters 20, 34 and the corresponding covers 24 have a generally cylindrical shape. Referring to FIG. 8, to make alignment even more difficult, the internal structure 79 of the revenue meters 20, 34 may lean and twist after it is assembled. The revenue meter 20, 34 includes a skeleton 80 which accommodates the base 21, the printed circuit board 76, and the bezel 78. In addition, a backdoor 82 attaches to the skeleton 80 to enclose the electronics 26 of the revenue meters 20, 34. Due to tolerances in the manufactured parts and the assembly process, the assembled internal structure 79 may affect the alignment of the keypad 32 to the intermediate actuators 72.

Figure 9:
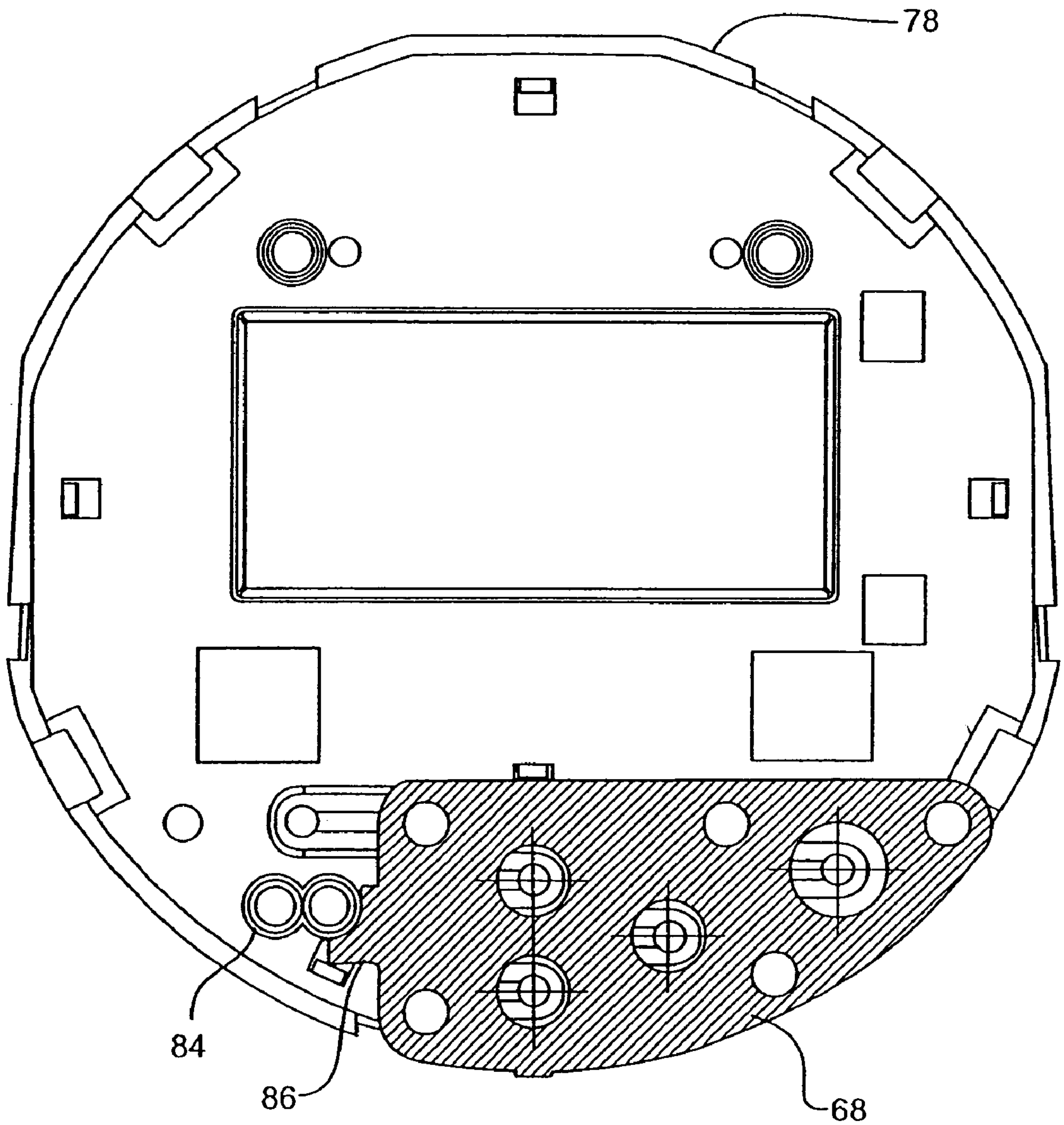
FIG. 9 depicts the bezel shown in FIGS. 7A–7D, with a compression plate abutting infrared bosses to align to the cover according to a preferred embodiment of the present invention.

Referring to FIG. 9, to align the keypad 32 to the intermediate actuators 72, the disclosed embodiments utilize infrared bosses 84 on the bezel 78 to align the infrared light pipes 59, and a locating portion 86 of the compression plate 68. When assembling the cover 24 to the internal structure 79, the cover is twisted until the base 21 stops the cover 24. The locating portion 86 of the compression plate 68 abuts the infrared bosses 84 to align the internal structure 79 of the revenue meter as the cover 24 is twisted. Thus, when assembling the cover 24, as the location portion 86 of the compression plate 68 abuts the infrared bosses 84, the internal structure 79 twists to align the keypad plungers 64 with the intermediate actuators 72 and to line up the infrared light pipes 59 to the infrared bosses 84. Of course other methods for aligning the internal structure 79 could be used such as including a post on the cover 24.

Figure 10:
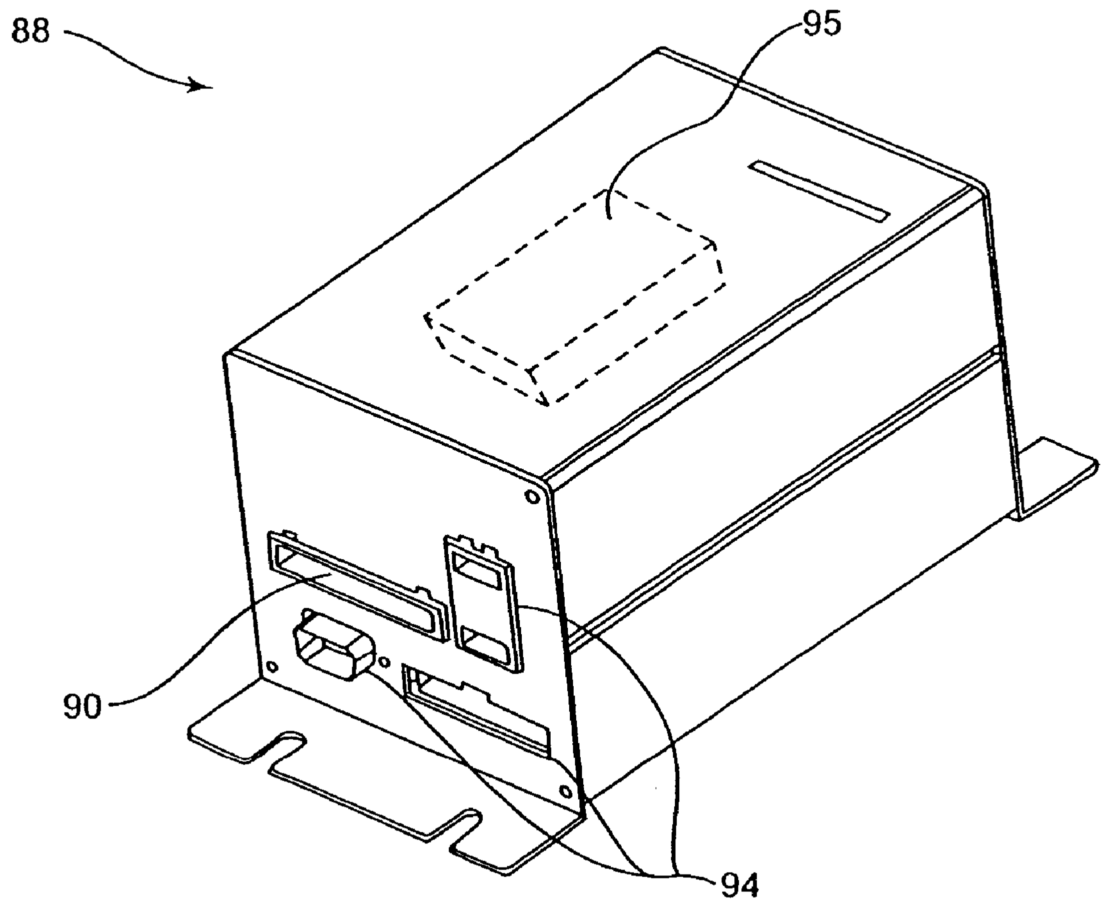
FIG. 10 depicts a front perspective view of an exemplary external enclosure of the I/O and communications device according to a preferred embodiment of the present invention.

Referring to FIG. 10, in addition to the above described keypad for a revenue meter, the present revenue meter 20, 34, 42 includes an external I/O and communications device 88. The I/O and communications device is physically separated from the meter enclosure to improve interfacing capabilities of the revenue meter, as described below. The I/O and communications device 88 includes an I/O and communications connector 90 which accommodates connection to the revenue meter 20, 34, 42 via an interface link 92, shown in FIG. 11. The interface link 92 is preferably located in the base 21 of the meter 20, 34, 42 or at the end of a section of cable 93 protruding from the meter 20, 34, 42. The cable 93 also contains power for the I/O and communications device 88.

In a preferred embodiment, analog and digital signals are transported via a serial link bus terminating in a twenty-four pin connector. Artisans will appreciate that the cable 93 can include a copper or fiber optic interface, or the equivalent, and that pin connectors of differing sizes can be used. Moreover, the I/O and communications device 88 includes alternate connectors 94 to accommodate other connection to the revenue meter, such as a modem and ethernet connections, e.g., RS 232 and RS 485 connections.

The interface link 92 allows for simplified connection of the revenue meter 20, 34, 42 to the I/O and communications device 88. Labeled connectors 90, 94 on the I/O and communications device allow for easy wiring. Plugability of the I/O and communications device to the socket based revenue meter 20, 34, 42 greatly simplifies servicing and replacing of the meter. The meter is removed without having to unscrew or unclamp any communications and I/O connections. In addition, the I/O and communication device 88 eliminates the necessity of locating individual conductors out of a bundle of wires. Connector 90 on the I/O and communication device 88 allows the installer to plug the interface link 92 into the I/O communication device 88 to hook up all wires to the desired I/O and communications ports at once.

In a preferred embodiment, a dedicated microprocessor 95 located inside the I/O and communication device 88 processes I/O and communication data and passes the data to and from the revenue meter 20, 34, 42 via the interface link 92. The interface link 92 connects to the microprocessor via known circuitry. The microprocessor 95 helps to reduce the load on the meter's processor. In addition, the microprocessor 95 allows for I/O and communications that are expandable and not limited to the number of conductors leaving the revenue meter. An exemplary microprocessor is model number PIC16C67 which is manufactured by Microchip Technology, located in Chandler, Ariz. Of course, other microprocessors can be used.

Data flow between the revenue meter 20, 34, 42 and the I/O and communications device 88 is controlled with data packets. Known techniques, such as RS 422, are used to serially send and receive the data packets to the revenue meter 20, 34, 42. In a preferred embodiment, the speed of the interface is 625 kilobits per second (kbps), but other rates are possible. The following description shows exemplary packets that are utilized to transmit between the revenue meter 20, 34, 42 and the external I/O and communications device 88. For the sake of simplicity, the packet transmission is described with reference to only one external I/O and communications device 88. It should be appreciated, however, that the protocol described herein supports one or more external I/O and communications devices 88.

Packets

The first external I/O and communications device 88 is the master on the bus, and thus initiates all data transfers. In a preferred embodiment, the interface is full-duplex, therefore data flows in both directions at once. The I/O and communications device 88 reports its input states while the revenue meter 20 transmits output states. Preferably, all data packets are error checked using a cyclic redundancy check. If a transmission error is detected, no retry is attempted, the packet is ignored and the states are updated on the next transaction.

Preferably, all packets are fixed length, therefore, the processor receiving the packet always knows where the end of the packet should be. In the following packet descriptions, an 'x' indicates four bits, for example, that are set to indicate a value in the corresponding packet. Artisans will appreciate that the number of bits per packet can be increased to produce a nearly infinite combination of packet values.

Input Packet Structure

In a preferred embodiment, an input packet is transmitted from the I/O and communications device 88 to the revenue meter 20. The packet indicates the state of the various inputs within the I/O and communications device 88.

Config Packet Structure

The revenue meter 20 is able to power cycle the master external I/O device. When the master I/O and communications device 88 first powers up, it is responsible for transmitting the CONFIG packet for the master and any attached slave I/O and communications devices. The master I/O and communications device must continue transmitting the CONFIG packet(s) until each CONFIG packet is acknowledged.

| Module# | Type 1 | . . . | Type 16 | CRC |
|---|---|---|---|---|
| 1000000yXX | XXXX | XXXX | XXXX | XXXX |

Module#—The external I/O and communications device number that contains the configuration (XX). Based on the packet structure, up to 256 devices are possible. 'y' indicates whether the I/O and communications device is present. For example, present=1 and absent=0. Absent packets are only transmitted when the I/O and communications device is removed from a powered system. Since the I/O and communications device 88 cannot initiate the transmission of a CONFIG packet when power is removed, the revenue meter is responsible for detecting that the master I/O and communications device is removed.

| Module# | A/D | Mask | Data | Time1 | . . . | Time16 | Pckt Time | CRC |
|---|---|---|---|---|---|---|---|---|
| 00000010XX | XXXX | XXXX | XXXX | XXXX | XXXX | XXXX | XXXX | XXXX |

Module# - The I/O and communications device number (xx) that reports the inputs. Based on the packet structure, up to 256 I/O and communications devices are possible.
Pckt Time - A free running timer value (xxxx) when the transmission of the packet began. In a preferred embodiment, one count occurs per 3.2 us.
A/D - 16 bits that indicate whether the, up to, 16 inputs on the device are analog or digital. For example, analog = 1 or digital = 0.
Mask - 16 bits that indicate whether the, up to, 16 inputs on the device have changed since last update. For example, yes = 1 and no = 0.
Data - 16 bits that indicate the digital value of the, up to, 16 inputs on the device.
Time Y - The free running timer value, preferably 3.2 microseconds per count, when the digital input value was recorded if the corresponding A/D bit is 0. Or, the 16 bit analog value of the input if corresponding A/D bit = 1.
CRC - The packet CRC.

Output Packet Structure

In a preferred embodiment, an output packet is transmitted from the revenue meter 20. The output packet contains the output state that the meter wants to appear on the revenue meter's outputs.

| Module# | Data | Analog1 | . . . | Analog16 | CRC |
|---|---|---|---|---|---|
| 00000010XX | XXXX | XXXX | XXXX | XXXX | XXXX |

Module# - The I/O and communications device number (xx) that is to receive the outputs. Based on the packet size, up to 256 I/O and communications devices are possible.
Data - 16 bits indicating the digital value of the, up to, 16 digital outputs on the device. Each individual bit is ignored by the destination if the output is analog.
Analog Z - A 16 bit analog output value for analog output Z. This field is ignored if the output is digital.
CRC - The packet CRC.

Type X—16 bits indicating the type of input or output of a particular port on the I/O and communications device 88. For example:

| Type | Point |
|---|---|
| 0x0 | FormA Digital Output |
| 0x1 | FormC Digital Output |
| 0x80 | DC Digital Input |

CRC—The packet CRC.

ConfigAck Packet Structure

A CONFIGACK packet is used by the revenue meter to acknowledge that the CONFIG packet has been received. The master I/O and communications device transmits the CONFIG packet at least twice for each I/O and communications device present in order to receive an acknowledgement since the revenue meter cannot initiate a transfer and data is received from the meter while it is being transmitted by the I/O and communications device.

| Module# | Pad | Pad | CRC |
|---|---|---|---|
| 10000010XX | | | XXXX |

Module# - The I/O and communications device number (XX) acknowledged by the revenue meter.
Pad—Padding for future use.
CRC—The packet CRC.

Flow Diagram

Figure 12A:
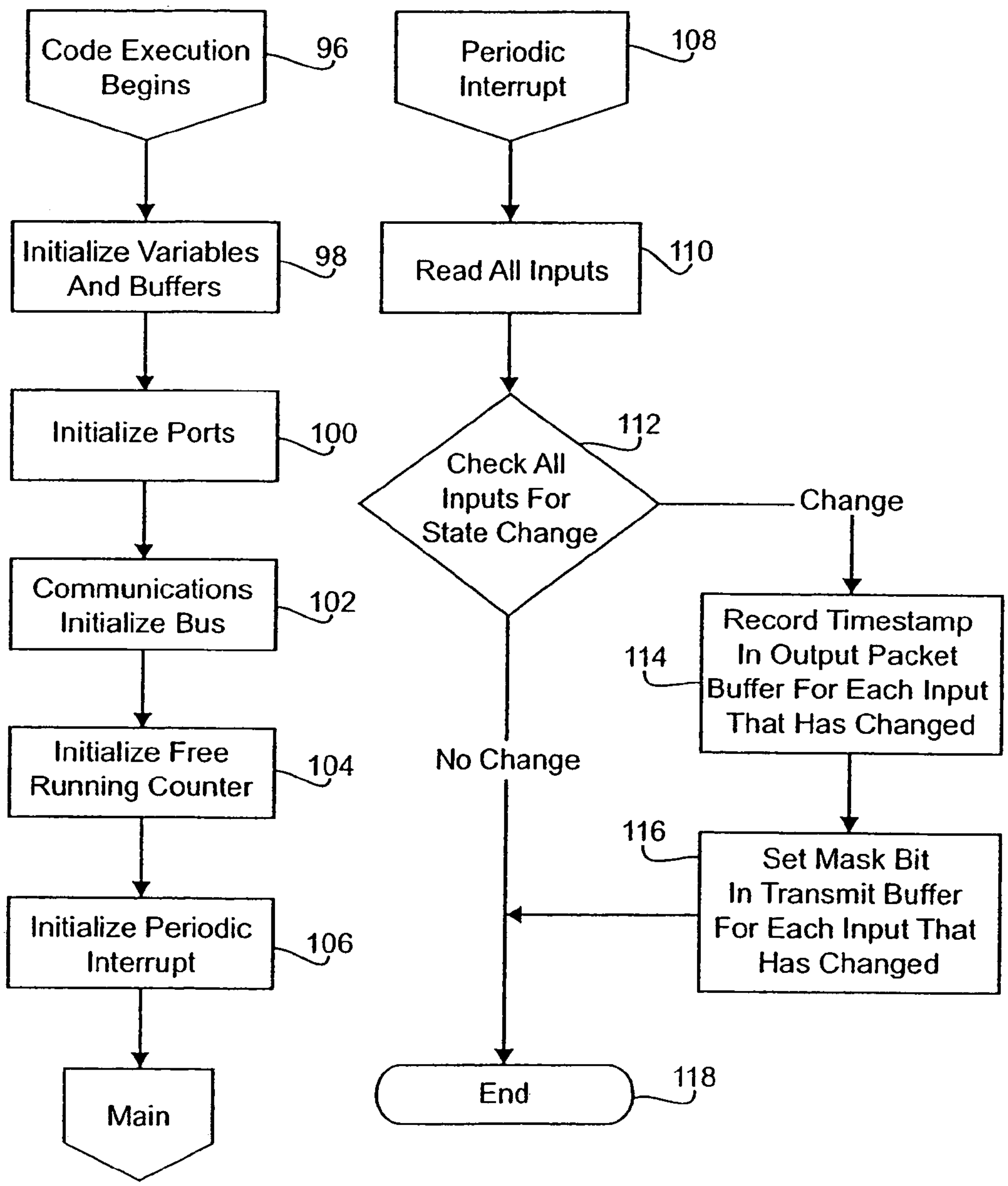
FIGS. 12A–12D show a flow chart representing serial communication and operations between the revenue meter and the I/O communications device according to a preferred embodiment of the present invention.

Referring to FIG. 12A, a flow chart is shown to describe a preferred operation of the I/O and communications device 88. After the revenue meter 20, 34, 42 is powered on, preferably a firmware or software initialize routine begins (block 96). The initialize routine initializes variables and buffers that contain counting and input state information (block 98). For example, variables are used to determine a next input to be read.

Figure 12B:
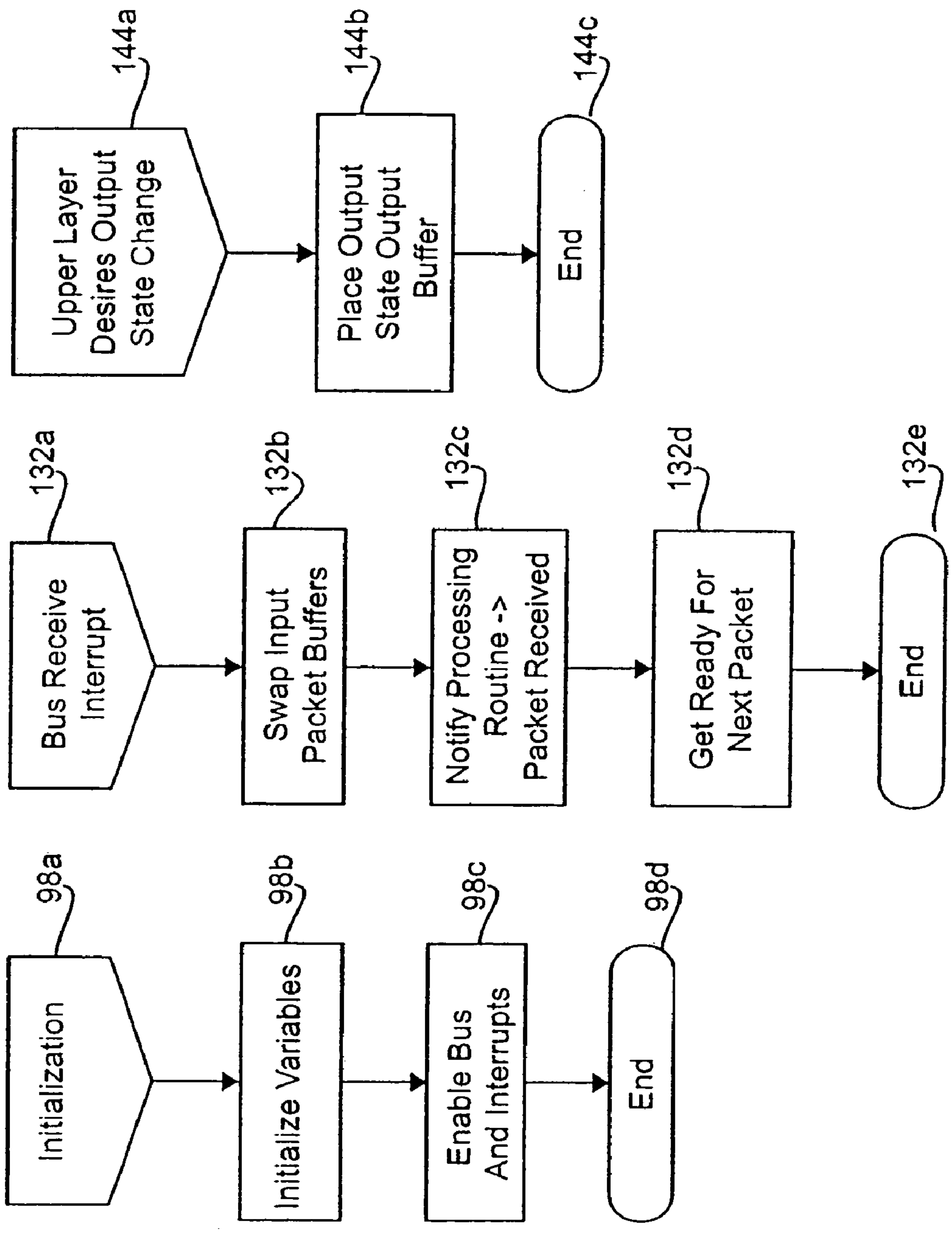

Referring also to FIG. 12B, upon the revenue meter's initialization a routine is called, for example, an initialization subroutine. When the initialization subroutine is called (block 98*a*), variables used by the bus interface routines are initialized (block 98*b*) and the bus subsystems and interrupts are enabled (block 98*c*). Thereafter, the initialization subroutine terminates (block 98*d*).

Referring to FIG. 12A, the initialize routine initializes I/O ports, e.g., configures pins as either input or output pins (block 100). The I/O ports are used, for example, to control a state of a load, e.g., generator, to turn the load either on or off. In addition, the routine initializes a link utilized to communicate with the revenue meter 20, 34, 42 by setting the speed and format of the data to be transmitted (block 102). For example, the routine configures control registers included in the microprocessor 95 that control the data's speed and format.

Moreover, the routine initializes a free running counter (block 104) and a periodic interrupt (block 106). In a preferred embodiment, an interrupt interrupts the microprocessor 95 every 819.2 microseconds, although other rates are possible. When the periodic interrupt occurs, a main routine is interrupted and execution continues in a periodic interrupt subroutine (block 108). After the occurrence of a periodic interrupt, the microprocessor 95 reads all digital input ports (block 110) and checks the input ports against the their state during the previous execution of the periodic interrupt subroutine (block 112). Each input is checked, and if an input has changed, a timestamp is recorded, e.g., a current value of a free running counter is stored in a corresponding location in the transmit buffer for that input (block 114).

It is desirable to timestamp the transition time of an input on the external I/O device 88 based on the time in the revenue meter 20, 34, 42 since the microprocessors in the revenue meter and external I/O and communications device are not time synchronized. The external I/O and communications device 88 preferably scans inputs every 819.2 microseconds. When the I/O and communications device 88 sees a transition on an input, it stores the free running counter in the input packet. This free running counter ideally increments every 3.2 microseconds. When the external I/O device is transmitting the input packet to the meter, just before transmitting the last four bytes of the packet, for example, it inserts the current free running counter into the 3rd and 4th last bytes. This ensures that the free running counter value inserted into the packet is as close as possible to the value it would be at the end of packet transmission. When the revenue meter 20, 34, 42 receives the packet, it calculates the time of transition of any of the inputs with the following formula:

$$t_t = t_n - (f_{pck} - f_{tr} + f_{inh}) * FT$$

where:

$t_t$=the time of transition.

$t_n$=the time on the meter at the time the packet is received.

$f_{pck}$=the free running counter at the time the packet is transmitted.

$f_{tr}$=the free running counter value when the input was scanned and seen to have transitioned.

$f_{inh}$=the inherent typical number of free running counts from the time that the $f_{pck}$ is recorded on the I/O and communications device and the packet is received on the revenue meter.

FT=the conversion factor between free running counts and normal time, e.g., 3.2 microseconds/count.

Therefore, the only variability left in the calculation of transition time is the variability of $f_{inh}$ and the accuracy that the revenue meter can timestamp the communications bus receive interrupt.

After the timestamp information is recorded, an appropriate mask bit is set in the transmit buffer indicating that the input has changed (block 116). These values are transferred for processing by the revenue meter 20, 34, 42. Thereafter, or if the input had not changed, execution of the periodic interrupt service routine terminates (block 118).

Figure 12C:
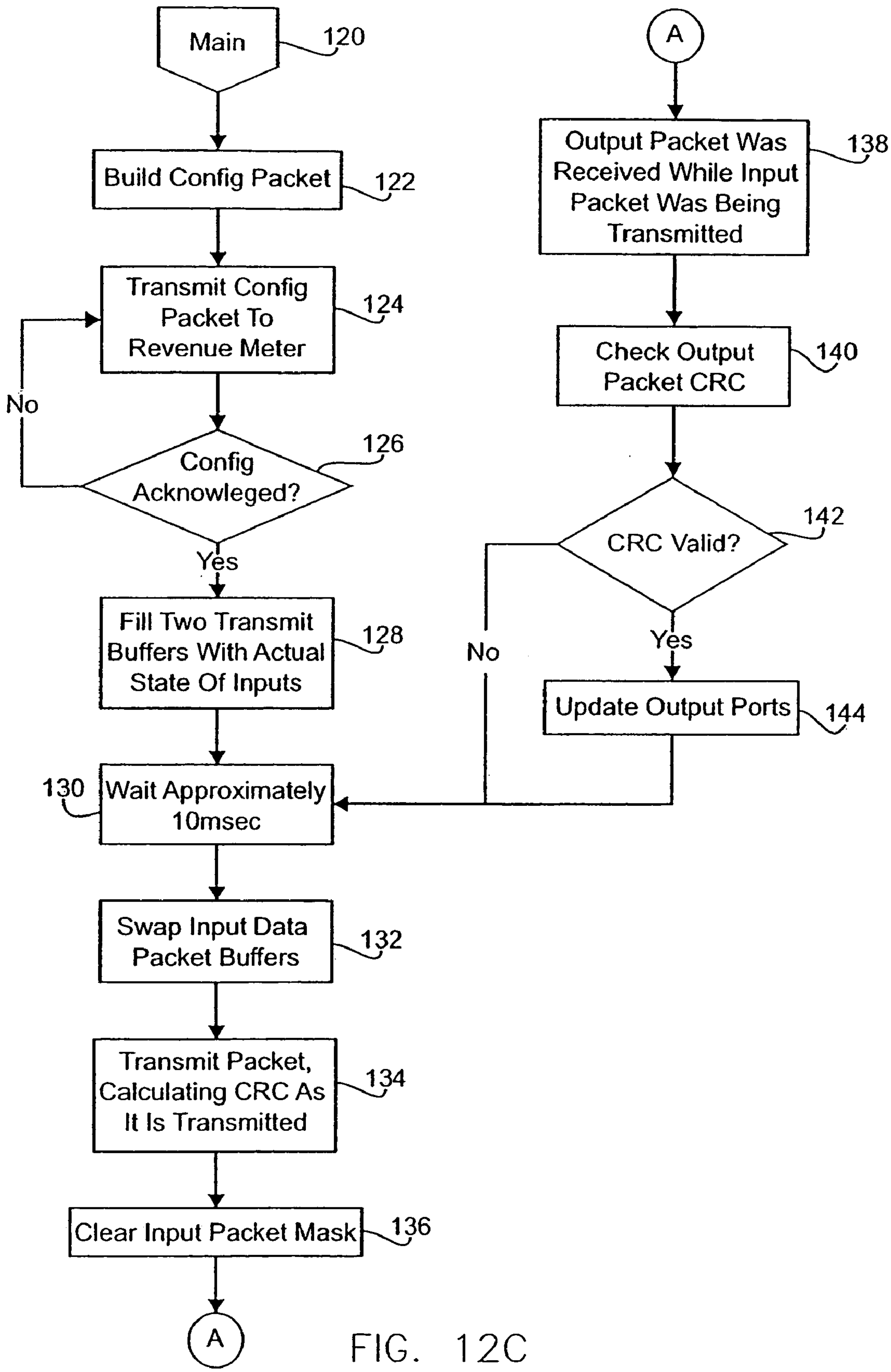

Referring to FIG. 12C, once initialization is complete, code execution continues at a main routine (block 120). First, the CONFIG packet is built, as described above, to indicate the configuration of the external I/O device (block 122). The CONFIG packet is continually transmitted to the revenue meter 20, 34, 42 (block 124) until the revenue meter 20, 34, 42 acknowledges the CONFIG packet (block 126). Preferably, code on the microprocessor double buffers the digital input states. Thereafter, the two input packets are initialized with the actual input states (block 128).

The I/O and communications device 88 waits approximately 10 milliseconds (block 130). This delay, coupled with the time to execute the remaining blocks in the main routine, ensures that the I/O and communications device 88 transmits and receives a packet to and from the revenue meter 20, 34, 42 approximately every 13 milliseconds. While other rates are possible, this rate ensures quick update without overloading the meter. The use of the 13 millisecond delay may be varied depending on a processing power of the revenue meter 20, 34, 42, and how often input states are likely to change. The delay is utilized to reduce the flow of data packets that the revenue meter 20, 34, 42 is required to process.

A first input data packet buffer and a second input data packet buffer are swapped to ensure that the main routine is transmitting input states from the first buffer while the periodic interrupt routine stores input states in the second buffer (block 132). When the revenue meter's microprocessor receives a packet, it executes a bus interrupt service subroutine (block 132*a*). This bus interrupt service subroutine swaps the input packet buffers (block 132*b*) so that the next data received does not overwrite the current data before being processed. The bus interrupt service routine then notifies the main routine (block 146) that a packet has been received (block 132*c*) and prepares to receive the next packet (block 132*d*). Thereafter, the bus interrupt service routine terminates (block 132*e*).

Referring to FIG. 12C, the input data packet is transmitted to the revenue meter 20, 34, 42 (block 134). The CRC for the packet is calculated as the packet is being transmitted so that the Pckt Time element in the packet is as close as possible to the actual value of the free running counter at the end of the packet (block 134). If the CRC was calculated before the packet began transmission, the Pckt Time element of the packet would be offset by the time required to calculate the CRC and transmit the packet. In addition, the Mask in the transmitted packet is cleared so that the second buffer can be used by the interrupt routine the next time the buffers are swapped (block 136).

While the input data packet is being transmitted, an output data packet is being received since the bus is full duplex (block 138). The output data packet's CRC is checked (block 140). If the CRC is valid (block 142), the output ports on the microprocessor 95 are updated (block 144), and another 10 milliseconds elapse before the main routine continues (block 130). Referring also to FIG. 12B, when the main routine requests a state change in the external I/O and communications device (block 144*a*), a "place output state" subroutine places the output state into the output buffer (block 144*b*) and the "place output state subroutine" then terminates (block 144*c*). If the CRC is invalid, however, execution continues without updating the output ports.

Figure 12D:
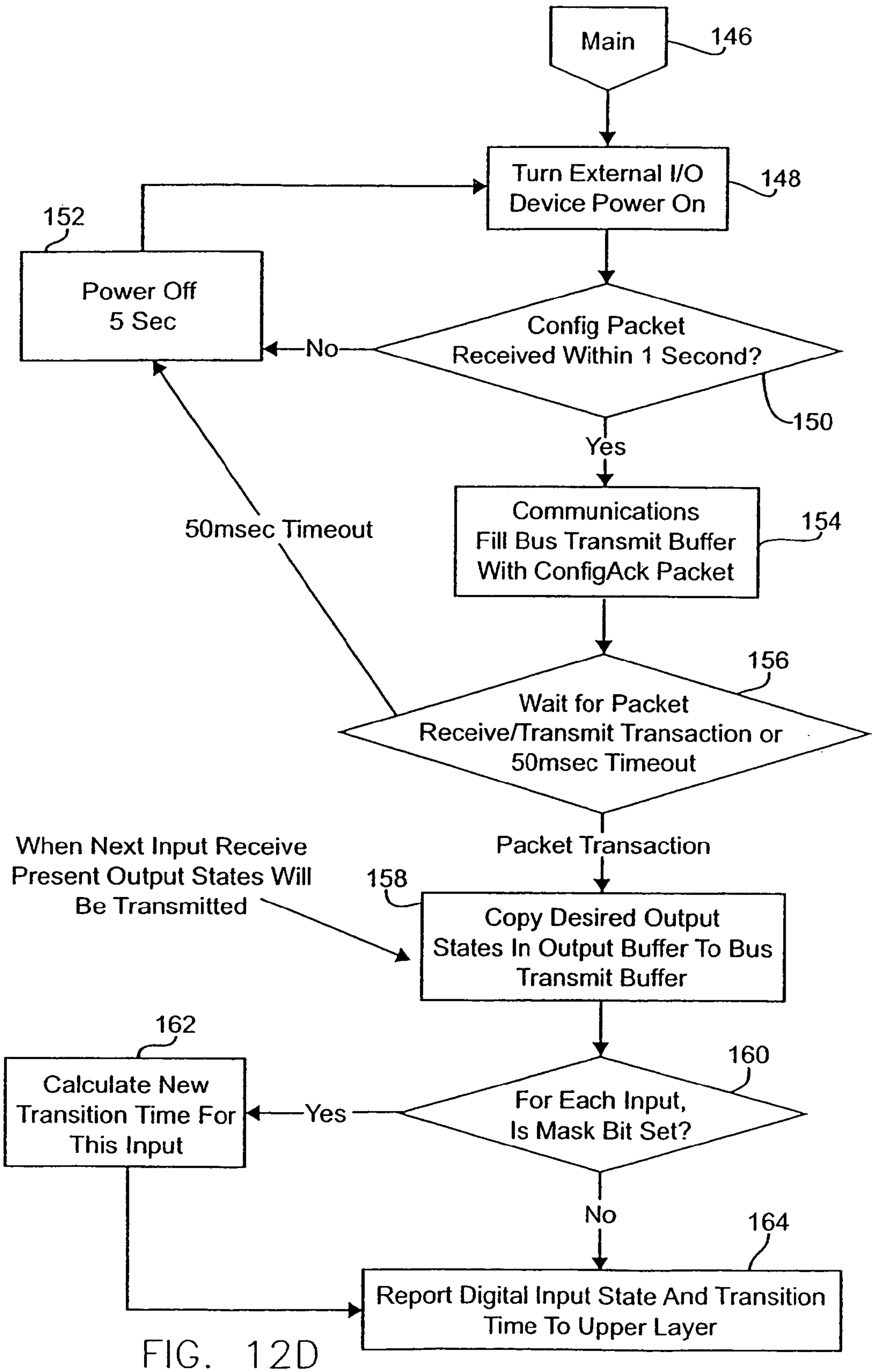

Referring to FIG. 12D, a processing routine is called for processing input states from the I/O and communications device 88 and sending output states to the I/O and communications device (block 146). The processing routine activates power to the external I/O and communications device 88 (block 148). The power switching is accomplished, for example, using a TPS2011A Power Distribution Switch, manufactured by Texas Instruments, located in Dallas, Tex., configured in a manner known in the art. Of course other switches can be used. If a valid CONFIG packet is received from the external I/O and communications device 88 within, for example, a predetermined time period (block 150) execution continues. In other words, execution of the processing routine continues if the bus interrupt subroutine notifies the processing routine of an incoming bus packet that is a valid CONFIG packet (see FIG. 12B, block 132*c*). In a preferred embodiment, the predetermined time period is one second.

If no valid CONFIG packet is received within one second, the external I/O and communications device 88 is turned off for a predetermined turn off period (block 152) and then turned back on (block 148). In a preferred embodiment, the predetermined turn off period is five seconds. Of course, the one and five second predetermined times may be modified to suit the situation. The I/O and communication device 88 is power cycled to ensure that the I/O and communications device 88 starts code execution from a known state. Turing the I/O and communications device 88 off for five seconds ensures that the I/O and communications device 88 is in communication with the revenue meter 20, 34, 42 fairly quickly after a user plugs in the I/O and communications device 88.

Once a valid CONFIG packet has been received, the revenue meter 20, 34, 42 fills the outgoing bus transmit buffer with a CONFIGACK packet (block 154). The CONFIGACK packet is transmitted to the external I/O and communications device 88 when the next packet is received from the external I/O and communications device 88. Thereafter, the revenue meter 20, 34, 48 waits for a valid receive/transmit packet operation to complete or for timeout to occur (block 156). In a preferred embodiment, the a duration of the timeout is 50 milliseconds. If a 50 millisecond timeout occurs, the I/O and communications device 88 is either faulty or has been removed since the I/O and communications device 88 transmits packets approximately every 13 milliseconds.

If the timeout occurs, execution continues as though the I/O and communications device 88 is absent (block 152). If a packet is received, the output states are copied from the revenue meter 20, 34, 42 into the bus transmit buffer for transmission the next time the I/O and communications device 88 initiates a packet transaction (block 158). An output state changes when, for example, a user uses the keypad 32 described above to change a fan state from on to off, and off to on, and a set point module overrange can be triggered within the revenue meter 20, 34, 42 to shut down a load. As the microprocessor 95 receives data packets containing the output states, the data packets are processed to acquire the output state information, and the output states are set (block 144). The output state is utilized by relay hardware, for example, to turn a load on or off.

Thereafter, the revenue meter 20, 34, 48 checks the received packet mask for inputs that have changed since the last transaction (block 160). For each input that has changed state, the meter calculates the transition time (block 162), as described above. In either case, the revenue meter 20, 34, 42 reports the input states and transition times to an upper layer of the code responsible for reporting input states to structures which are internally utilized or reported to the user (block 164), and waits for the next packet (block 156).

From the foregoing description, it should be understood that improved revenue meter interfaces have been shown and described which have many desirable attributes and advantages. The revenue meter of the disclosed embodiments provides easily accessible and easy to use interfaces that include a front panel keypad, interactive display, and I/O and communications connections. The keypad allows a user to interact with the meter without requiring a breach to a security seal. In addition, the interface provides an external I/O and communications interface that is expandable and not limited to the number of conductors leaving the revenue meter.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A revenue meter operative to measure the delivery of electrical energy from an energy supplier to a consumer through an electric circuit, the revenue meter comprising:

bayonet terminals disposed on said meter mateable with matching jaws of a detachable meter mounting device;

a base coupled with said bayonet terminals;

a cover operative to be coupled with said base and operative to be sealed to said detachable meter mounting device to prevent physical access to said revenue meter, said base and said cover forming an enclosure;

at least one current sensor operative to be coupled with said electric circuit and operative to sense current in said electric circuit and generate a signal indicative thereof;

a microprocessor coupled with said current sensor and operative to receive said signal and generate a data signal therefrom;

a fiber optic communications link coupled with said microprocessor and further extending through said enclosure;

where said fiber optic communications link is configured to be full-duplex and transmit a power signal.

2. The revenue meter according to claim 1 wherein said fiber optic communications link being operative to communicate said data signal.

3. The revenue meter according to claim 1 comprising a graphical display coupled to said microprocessor.

4. The revenue meter according to claim 1 further comprising a keypad coupled to said microprocessor.

5. The revenue meter according to claim 1 wherein said fiber optic communications link is operative to transmit said data signal.

6. The revenue meter according to claim 1 wherein said fiber optic communications link is coupled to an interface box.

7. The revenue meter according to claim 1 wherein said data signal comprises a data value indicative of time.

8. The revenue meter according to claim 1 wherein said data signal comprises a data value indicative of an input/output state.

9. The revenue meter according to claim 1 wherein said data signal comprises a cyclic redundancy check value.

10. A revenue meter for measuring the delivery of electrical energy from an energy supplier to a consumer through an electric circuit, the revenue meter comprising:

bayonet terminals disposed on said revenue meter mateable with matching jaws of a detachable meter mounting device;

a base coupled with said bayonet terminals;

a cover operative to be coupled with said base and operative to be sealed to said detachable meter mounting device to prevent physical access to internal components of said revenue meter, said base and said cover forming an enclosure;

at least one sensor operative to be coupled with said electric circuit and operative to sense at least one of current and voltage in said electric circuit and generate a energy signal indicative thereof;

a microprocessor coupled with said sensor and operative to receive said energy signal and generate a data signal therefrom; and a fiber optic communications interface having a first end and a second end, said first end disposed internal to said enclosure and said second end disposed external to said enclosure;

where said fiber optic communications interface is configured to be full-duplex and transmit a power signal.

11. The revenue meter according to claim 10 wherein said fiber optic communications interface further operative to communicate said data signal.

12. The revenue meter according to claim 10 wherein said second end of said fiber optic communications interface further coupled to a digital network.

13. The revenue meter according to claim 10 comprising a graphical display coupled to said microprocessor.

14. The revenue meter according to claim 10 further comprising a keypad coupled to said microprocessor.

15. The revenue meter according to claim 10 wherein said fiber optic communications interface is operative to transmit said data signal.

16. The revenue meter according to claim 10 wherein said fiber optic communications interface is coupled to an interface box.

17. The revenue meter according to claim 10 wherein said data signal comprises a data value indicative of time.

18. The revenue meter according to claim 10 wherein said data signal comprises a data value indicative of an input/output state.

19. The revenue meter according to claim 10 wherein said data signal comprises a cyclic redundancy check value.

20. A revenue meter for measuring the delivery of electrical energy from an energy supplier to a consumer through an electric circuit, the revenue meter comprising:

a display;

metering logic;

a base, said base comprising terminals for coupling said revenue meter with said electric circuit;

a cover operative to enclose said metering logic and said display, said cover further operative to prevent physical access to said metering logic, further wherein said base and said cover are operative to be sealed to prevent removal of said cover from said base;

at least one current transducer operative to be coupled with said electric circuit and operative to sense current in said electric circuit and generate a energy signal indicative thereof;

at least one voltage transducer operative to be coupled with said electric circuit and operative to sense voltage in said electric circuit and generate a energy signal indicative thereof;

a microprocessor coupled with said current transducer and operative to receive said energy signal and generate a data signal therefrom; and a fiber optic communications interface coupled with said metering logic;

where said fiber optic communications interface is configured to be full-duplex and transmit a power signal.

21. The revenue meter according to claim 20 wherein said fiber optic communications interface is disposed on said base.

22. The revenue meter according to claim 20 wherein said base and said cover form an enclosure, and said fiber optic communications interface is disposed within said enclosure.

23. The revenue meter according to claim 20 wherein said base and said revenue meter cover form an enclosure, said fiber optic communications interface having a first end and a second end, said first end disposed internal to said enclosure and said second end disposed external to said enclosure.

24. The revenue meter according to claim 20, said fiber optic communications interface further operative to be coupled with a digital network.

25. The revenue meter according to claim 20 further comprising a graphical display coupled to said microprocessor.

26. The revenue meter according to claim 20 further comprising a keypad coupled to said microprocessor.

27. The revenue meter according to claim 20 wherein said fiber optic communications interface is operative to transmit said data signal.

28. The revenue meter according to claim 20 wherein said data signal comprises a data value indicative of time.

* * * * *

US007158050C1

(12) EX PARTE REEXAMINATION CERTIFICATE (7681st)

United States Patent

Lightbody et al.

(10) Number: US 7,158,050 C1
(45) Certificate Issued: Aug. 10, 2010

(54) REVENUE METER WITH FIBER CONNECTION

(75) Inventors: Simon H. Lightbody, British Columbia (CA); Peter C. Cowan, British Columbia (CA); David W. Giles, British Columbia (CA); Rene T. Jonker, British Columbia (CA); Markus F. Hirschbold, British Columbia (CA)

(73) Assignee: Power Measurement Ltd., Saanichton, British Columbia (CA)

Reexamination Request:
No. 90/009,029, Feb. 8, 2008

Reexamination Certificate for:
Patent No.: 7,158,050
Issued: Jan. 2, 2007
Appl. No.: 10/860,227
Filed: Jun. 2, 2004

Related U.S. Application Data

(63) Continuation of application No. 09/370,696, filed on Aug. 9, 1999, now Pat. No. 6,825,776.

(51) Int. Cl.
*G08B 23/00* (2006.01)

(52) U.S. Cl. ...................... 340/870.02; 361/659; 702/57

(58) Field of Classification Search ........................ None
See application file for complete search history.

(56) References Cited

U.S. PATENT DOCUMENTS 3,780,433 A 12/1973 Lynch
3,796,953 A 3/1974 Zisa et al.
4,050,621 A 9/1977 Bouley
4,072,385 A 2/1978 Wallner
4,092,592 A 5/1978 Milkovic
4,301,543 A 11/1981 Palmer
4,458,307 A 7/1984 McAnlis
4,839,819 A 6/1989 Begin et al.
4,843,311 A 6/1989 Rozman et al.
4,851,614 A 7/1989 Duncan, Jr.
5,017,860 A 5/1991 Germer et al.
5,207,595 A 5/1993 Learmont et al.
5,248,967 A 9/1993 Daneshfar
5,293,115 A 3/1994 Swanson
5,301,122 A 4/1994 Halpern
5,418,752 A 5/1995 Harari
5,459,459 A 10/1995 Lee, Jr.
5,528,507 A 6/1996 McNamara et al.
5,548,527 A 8/1996 Hemminger
5,555,508 A 9/1996 Munday
5,696,501 A 12/1997 Ouellette
5,704,535 A 1/1998 Thompson, Sr.
5,742,512 A 4/1998 Edge et al.
5,764,155 A 6/1998 Kertesz
5,768,148 A 6/1998 Murphy
5,933,092 A 8/1999 Ouellette
6,008,711 A 12/1999 Bolam
6,018,700 A 1/2000 Edel (Continued)

OTHER PUBLICATIONS

Clark, "Printed Circuit Engineering: Optimizing for Manufacturability," 1989, pp. 34–35,38–40,163.

Judd et al., "Soldering in Electronics Assembly," 1$^{st}$ Edition, 1992, pp. 1–20.

Internet Technology Aids Plant Operations, Power Engineering (Aug. 1998).

Motorola Preliminary Information Application Brief, "Electronic Energy Meter with Powerline Modem On DSP56F80x," undated, 2 pages.

Series 5500 Infonode® User's Guide; Dranetz–BMI, Revision D, 1992, 2002, 2004, pp. i–A12.

*Primary Examiner*—Tuan H Nguyen

(57) ABSTRACT

A revenue meter includes electronics for measuring the delivery of electrical energy from an energy supplier to a consumer through an electric circuit, a display and a cover. The electronics includes at least transducers, an analog to digital converter and logic. A meter cover encloses the revenue meter. Communications of data to and from the revenue meter may be done via a fiber optic communications link.

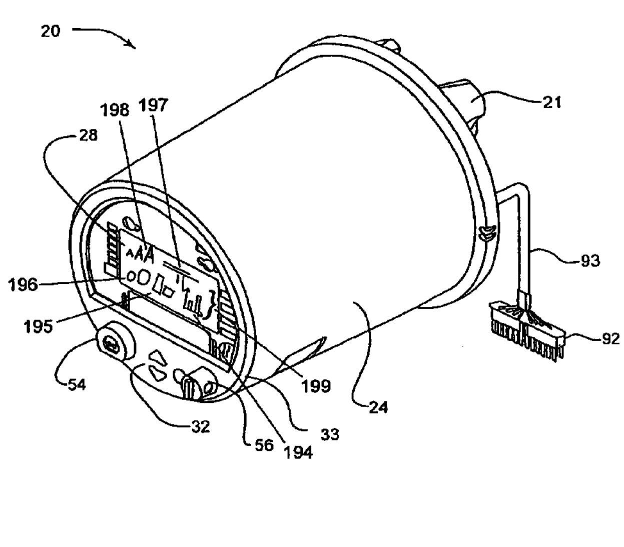

U.S. PATENT DOCUMENTS

| | | | |
|---|---|---|---|
| 6,124,806 | A | 9/2000 | Cunningham |
| 6,186,842 | B1 | 2/2001 | Hirschbold et al. |
| 6,219,656 | B1 | 4/2001 | Cain |
| 6,316,932 | B1 | 11/2001 | Horan et al. |
| 6,327,541 | B1 | 12/2001 | Pitchford et al. |
| 6,367,023 | B2 | 4/2002 | Kling |
| 6,429,785 | B1 | 8/2002 | Griffin et al. |
| 6,459,175 | B1 | 10/2002 | Potega |
| 6,459,997 | B1 | 10/2002 | Andersen |
| 6,486,652 | B1 | 11/2002 | Ouellette |
| 6,519,509 | B1 | 2/2003 | Nierlich |
| 6,615,147 | B1 | 9/2003 | Jonker et al. |
| 6,618,709 | B1 | 9/2003 | Sneeringer |
| 6,895,189 | B1 | 5/2005 | Bedrosian |
| 6,983,211 | B2 | 1/2006 | Macfarlene et al. |
| 2002/0082748 | A1 | 6/2002 | Enga |

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 10, and 20 are determined to be patentable as amended.

Claims 2-9, 11-19, and 21-28, dependent on an amended claim, are determined to be patentable.

1. A revenue meter operative to measure the delivery of electrical energy from an energy supplier to a consumer through an electric circuit, the revenue meter comprising:

bayonet terminals disposed on said meter mateable with matching jaws of a detachable meter mounting device;

a base coupled with said bayonet terminals;

a cover operative to be coupled with said base and operative to be sealed to said detachable meter mounting device to prevent physical access to said revenue meter, said base and said cover forming an enclosure;

at least one current sensor operative to be coupled with said electric circuit and operative to sense current in said electric circuit and generate a signal indicative thereof;

a microprocessor coupled with said current sensor and operative to receive said signal and generate a data signal therefrom;

a fiber optic communications link coupled with said microprocessor and further extending through said enclosure;

where said fiber optic communications link is configured to be full-duplex [and] *, the microprocessor being further operative to, via the fiber communications link,* transmit [a power] *the data* signal *from the revenue meter while simultaneously receiving input data transmitted to the revenue meter.*

10. A revenue meter for measuring the delivery of electrical energy from an energy supplier to a consumer through an electric circuit, the revenue meter comprising:

bayonet terminals disposed on said revenue meter mateable with matching jaws of a detachable meter mounting device;

a base coupled with said bayonet terminals;

a cover operative to be coupled with said base and operative to be sealed to said detachable meter mounting device to prevent physical access to internal components of said revenue meter, said base and said cover forming an enclosure;

at least one sensor operative to be coupled with said electric circuit and operative to sense at least one of current and voltage in said electric circuit and generate a energy signal indicative thereof;

a microprocessor coupled with said sensor and operative to receive said energy signal and generate a data signal therefrom; and a fiber optic communications interface having a first end and a second end, said first end disposed internal to said enclosure and said second end disposed external to said enclosure;

where said fiber optic communications interface is configured to be full-duplex [and] *, the microprocessor being further operative to, via the fiber communications interface,* transmit [a power] *the data* signal *from the revenue meter while simultaneously receiving input data transmitted to the revenue meter.*

20. A revenue meter for measuring the delivery of electrical energy from an energy supplier to a consumer through an electric circuit, the revenue meter comprising:

a display;

metering logic;

a base, said base comprising terminals for coupling said revenue meter with said electric circuit;

a cover operative to enclose said metering logic and said display, said cover further operative to prevent physical access to said metering logic, further wherein said base and said cover are operative to be sealed to prevent removal of said cover from said base;

at least one current transducer operative to be coupled with said electric circuit and operative to sense current in said electric circuit and generate a energy signal indicative thereof;

at least one voltage transducer operative to be coupled with said electric circuit and operative to sense voltage in said electric circuit and generate a energy signal indicative thereof;

a microprocessor coupled with said current transducer and operative to receive said energy signal and generate a data signal therefrom; and a fiber optic communications interface coupled with said metering logic;

where said fiber optic communications interface is configured to be full-duplex [and] *, the microprocessor being further operative to, via the fiber communications interface,* transmit [a power] *the data* signal *from the revenue meter while simultaneously receiving input data transmitted to the revenue meter.*

* * * * *